US012389789B2

(12) United States Patent
Hwang et al.

(10) Patent No.: US 12,389,789 B2
(45) Date of Patent: Aug. 12, 2025

(54) ORGANIC LIGHT EMITTING DEVICE

(71) Applicant: LG Chem, Ltd., Seoul (KR)

(72) Inventors: Minho Hwang, Daejeon (KR); Jiyoung Lee, Daejeon (KR); Ho Gyu Lee, Daejeon (KR); Seog Jae Seo, Daejeon (KR); Kwanghyun Kim, Daejeon (KR); Jaesoon Bae, Daejeon (KR); Jaechol Lee, Daejeon (KR); Jiyeon Shin, Daejeon (KR); Keunsoo Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 927 days.

(21) Appl. No.: 17/614,848

(22) PCT Filed: Aug. 12, 2020

(86) PCT No.: PCT/KR2020/010651
§ 371 (c)(1),
(2) Date: Nov. 29, 2021

(87) PCT Pub. No.: WO2021/040278
PCT Pub. Date: Mar. 4, 2021

(65) Prior Publication Data

US 2022/0238804 A1 Jul. 28, 2022

(30) Foreign Application Priority Data

Aug. 26, 2019 (KR) ........................ 10-2019-0104638
Aug. 5, 2020 (KR) ........................ 10-2020-0097983

(51) Int. Cl.
*H10K 85/10* (2023.01)
*H10K 50/17* (2023.01)
(Continued)

(52) U.S. Cl.
CPC ......... *H10K 85/141* (2023.02); *H10K 85/322* (2023.02); *H10K 85/624* (2023.02);
(Continued)

(58) Field of Classification Search
CPC ............ H10K 85/6572; H10K 85/633; H10K 85/631; H10K 85/626; H10K 85/624;
(Continued)

(56) References Cited

U.S. PATENT DOCUMENTS

2004/0251816 A1 12/2004 Leo et al.
2016/0181535 A1 6/2016 Tsuji et al.
(Continued)

FOREIGN PATENT DOCUMENTS

KR 20000051826 A 8/2000
KR 20160013692 A 2/2016
(Continued)

OTHER PUBLICATIONS

Machine Translation of KR20190136297A (Year: 2019).*
International Search Report for Application No. PCT/KR2020/010651, dated Nov. 26, 2020, 3 pages.

*Primary Examiner* — Jenna N Chandhok
(74) *Attorney, Agent, or Firm* — Lerner David LLP

(57) ABSTRACT

The present disclosure provides an organic light emitting device comprising a hole injection layer including a cured product of a compound represented by the following Chemical Formula 1, and a hole transport layer including a cured product of a polymer containing a repeating unit represented by the following Chemical Formula 2-1 and a repeating unit represented by the following Chemical Formula 2-2:

[Chemical Formula 1]

(Continued)

-continued

[Chemical Formula 2-1]

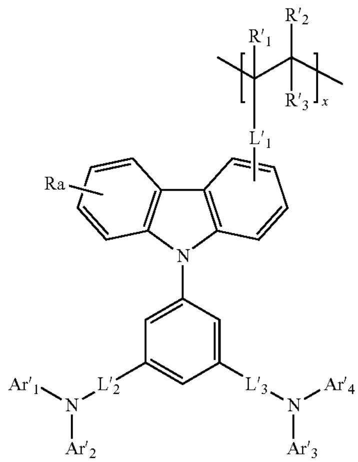

[Chemical Formula 2-2]

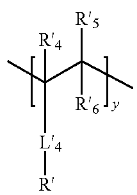

wherein all the variables are described herein.

20 Claims, 1 Drawing Sheet

(51) Int. Cl.
*H10K 85/30* (2023.01)
*H10K 85/60* (2023.01)

(52) U.S. Cl.
CPC ......... *H10K 85/626* (2023.02); *H10K 85/633* (2023.02); *H10K 85/653* (2023.02); *H10K 85/6572* (2023.02); *H10K 50/17* (2023.02)

(58) Field of Classification Search
CPC .... H10K 85/615; H10K 85/322; H10K 85/60; H10K 85/141
See application file for complete search history.

(56) References Cited

U.S. PATENT DOCUMENTS

| | | | | |
|---|---|---|---|---|
| 2016/0225998 | A1 | 8/2016 | Kato et al. | |
| 2018/0212180 | A1 | 7/2018 | Grigg et al. | |
| 2019/0109284 | A1* | 4/2019 | Xia | H10K 85/6572 |
| 2019/0225581 | A1* | 7/2019 | Scheible | H10K 85/633 |
| 2019/0237669 | A1 | 8/2019 | Kang et al. | |
| 2019/0338140 | A1 | 11/2019 | Shin et al. | |
| 2020/0020858 | A1* | 1/2020 | Lee | C09D 7/63 |
| 2020/0020873 | A1 | 1/2020 | Lee et al. | |

FOREIGN PATENT DOCUMENTS

| | | | | | |
|---|---|---|---|---|---|
| KR | 20160074382 | A | | 6/2016 | |
| KR | 20160093531 | A | | 8/2016 | |
| KR | 20180059381 | A | | 6/2018 | |
| KR | 20180099446 | A | | 9/2018 | |
| KR | 20190035513 | A | | 4/2019 | |
| KR | 2019136297 | A | * | 12/2019 | C08F 212/10 |
| KR | 20190136297 | A | | 12/2019 | |
| WO | 2003012890 | A2 | | 2/2003 | |
| WO | 2017031622 | A1 | | 3/2017 | |
| WO | WO-2018097666 | A2 | * | 5/2018 | C07C 25/02 |

* cited by examiner

[FIG. 1]
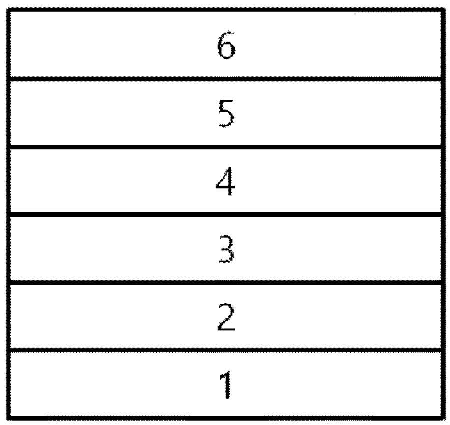
[FIG. 2]
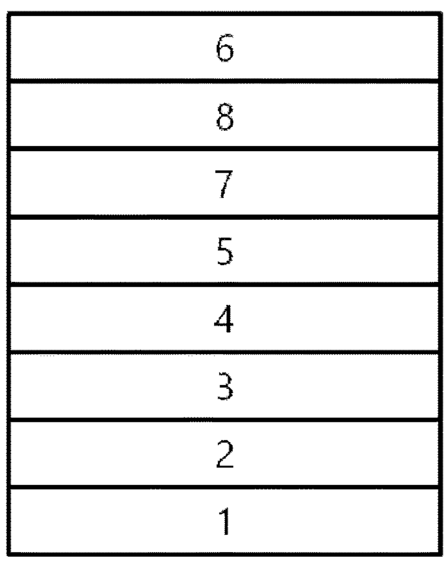

ORGANIC LIGHT EMITTING DEVICE

CROSS-REFERENCE TO RELATED APPLICATION(S)

The present application is a national stage entry under 35 U.S.C. § 371 of International Application No. PCT/KR2020/010651 filed on Aug. 12, 2020, which claims priority from Korean Patent Application No. 10-2019-0104638 filed on Aug. 26, 2019, and Korean Patent Application No. 10-2020-0097983 filed on Aug. 5, 2020, all the disclosures of which are incorporated herein by reference.

TECHNICAL FIELD

The present disclosure relates to an organic light emitting device.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices as described above.

Meanwhile, recently, in order to reduce process costs, an organic light emitting device using a solution process, particularly an inkjet process, has been developed instead of a conventional deposition process. In the initial stage of development, attempts have been made to develop organic light emitting devices by coating all organic light emitting device layers by a solution process, but current technology has limitations. Therefore, only HIL, HTL, and EML are processed in a layer device structure by a solution process, and a hybrid process utilizing traditional deposition processes is being studied as a subsequent process.

In this regard, in the present disclosure, there is provided novel materials for organic light emitting devices that can be used for an organic light emitting device and, at the same time, can be used for a solution process, and an organic light emitting device using the same.

PRIOR ART LITERATURE

Patent Literature (Patent Literature 1) Korean Unexamined Patent Publication No. 10-2000-0051826

DETAILED DESCRIPTION OF THE INVENTION

Technical Problem

It is an object of the present disclosure to provide an organic light emitting device having low driving voltage, high luminous efficiency and excellent lifetime.

Technical Solution

In order to achieve the above object, there is provided an organic light emitting device comprising: an anode, a hole injection layer, a hole transport layer, a light emitting layer, and a cathode, wherein the hole injection layer includes a cured product of a compound represented by the following Chemical Formula 1, and wherein the hole transport layer includes a cured product of a polymer containing a repeating unit represented by the following Chemical Formula 2-1 and a repeating unit represented by the following Chemical Formula 2-2:

[Chemical Formula I]

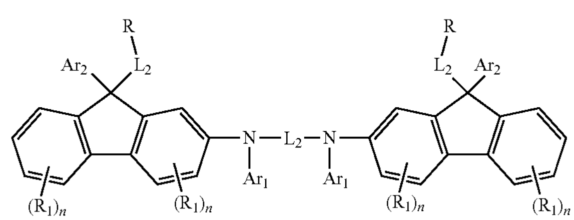

in the Chemical Formula 1, $L_1$ is a substituted or unsubstituted $C_{6-60}$ arylene; or a substituted or unsubstituted $C_{2-60}$ heteroarylene containing one or more heteroatoms selected from the group consisting of N, O and S, $Ar_1$ is each independently a substituted or unsubstituted $C_{6-60}$ aryl, $Ar_2$ is each independently a substituted or unsubstituted $C_{6-60}$ aryl, $L_2$ is each independently a single bond, a substituted or unsubstituted $C_{1-10}$ alkylene, or a substituted or unsubstituted $C_{6-60}$ arylene, $R_1$ is each independently hydrogen, deuterium; halogen; a substituted or unsubstituted $C_{1-60}$ alkyl; a substituted or unsubstituted $C_{1-60}$ alkoxy; a substituted or unsubstituted $C_{6-60}$ aryl; or a substituted or unsubstituted $C_{2-60}$ heteroaryl containing any one or more heteroatoms selected from the group consisting of N, O and S, n is each independently an integer of 0 to 3, R is each independently a photocurable group; or a thermosetting group,

[Chemical Formula 2-1]

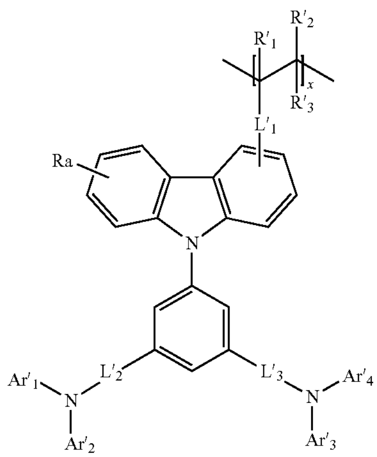

in the Chemical Formula 2-1, $R'_1$ to $R'_3$ are each independently hydrogen or $C_{1-10}$ alkyl, $L'_1$ is a substituted or unsubstituted $C_{6-60}$ arylene; -(substituted or unsubstituted $C_{6-60}$ arylene)-O-(substituted or unsubstituted $C_{6-60}$ arylene)-; -(substituted or unsubstituted $C_{6-60}$ arylene)-(substituted or unsubstituted $C_{1-10}$ alkylene)-(substituted or unsubstituted $C_{6-60}$ arylene)-; -(substituted or unsubstituted $C_{6-60}$ arylene)-O-(substituted or unsubstituted $C_{1-10}$ alkylene)-O—; or -(substituted or unsubstituted $C_{6-60}$ arylene)-(substituted or unsubstituted $C_{1-10}$ alkylene)-O-(substituted or unsubstituted $C_{1-10}$ alkylene)-(substituted or unsubstituted $C_{6-60}$ arylene)-, $L'_2$ and $L'_3$ are each independently a single bond; a substituted or unsubstituted $C_{6-60}$ arylene; or a substituted or unsubstituted $C_{2-60}$ heteroarylene containing any one or more selected from the group consisting of N, O, and S, $Ar'_1$ to $Ar'_4$ are each independently a substituted or unsubstituted $C_{6-60}$ aryl, or a substituted or unsubstituted $C_{2-60}$ heteroaryl containing any one or more selected from the group consisting of N, O and S, or $Ar'_1$ and $Ar'_2$; or $Ar'_3$ and $Ar'_4$ are bonded to each other to form a $C_{6-60}$ aromatic ring; or a $C_{2-60}$ heteroaromatic ring containing any one or more selected from the group consisting of N, O and S, Ra is hydrogen; deuterium; halogen; cyano; nitro; amino; a substituted or unsubstituted $C_{1-60}$ alkyl; a substituted or unsubstituted $C_{3-60}$ cycloalkyl; a substituted or unsubstituted $C_{2-60}$ alkenyl; a substituted or unsubstituted $C_{6-60}$ aryl; or a substituted or unsubstituted $C_{2-60}$ heteroaryl containing any one or more selected from the group consisting of N, O and S, x is a mole fraction of the repeating unit represented by Chemical Formula 2-1 in the polymer,

[Chemical Formula 2-2]

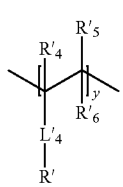

in the Chemical Formula 2-2, $R'_4$ to $R'_6$ are each independently hydrogen or $C_{1-10}$ alkyl, $L'_4$ is a single bond; or a substituted or unsubstituted $C_{6-60}$ arylene, R' is a photocurable group; or a thermosetting group, and y is a mole fraction of the repeating unit represented by Chemical Formula 2-2 in the polymer.

Advantageous Effects

The organic light emitting device according to the present disclosure can prepare a hole injection layer or a hole transport layer by a solution process, and can improve the efficiency, achieve low driving voltage and/or improve lifetime characteristics in the organic light emitting device.

BRIEF DESCRIPTION OF THE DRAWINGS

FIG. 1 shows an example of an organic light emitting device comprising a substrate 1, an anode 2, a hole injection layer 3, a hole transport layer 4, a light emitting layer 5, and a cathode 6.

FIG. 2 shows an example of an organic light emitting device comprising a substrate 1, an anode 2, a hole injection layer 3, a hole transport layer 4, a light emitting layer 5, an electron transport layer 7, an electron injection layer 8, and a cathode 6.

DETAILED DESCRIPTION OF THE EMBODIMENTS

Hereinafter, embodiments of the present disclosure will be described in more detail to facilitate understanding of the invention.

Definition of Terms

As used herein, the notation

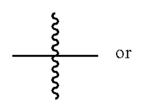

or means a bond linked to another substituent group.

As used herein, the term "substituted or unsubstituted" means being substituted with one or more substituents selected from the group consisting of deuterium; a halogen group; a cyano group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heteroaryl group containing at least one of N, O and S atoms, or being substituted with a substituent to which two or more substituents of the above-exemplified substituents are connected, or being unsubstituted. For example, "a substituent in which two or more substituents are connected" may be a biphenyl group. Namely, a biphenyl group may be an aryl group, or it may also be interpreted as a substituent in which two phenyl groups are connected.

In the present disclosure, the carbon number of a carbonyl group is not particularly limited, but is preferably 1 to 40. Specifically, the carbonyl group may be a group having the following structural formulas but is not limited thereto.

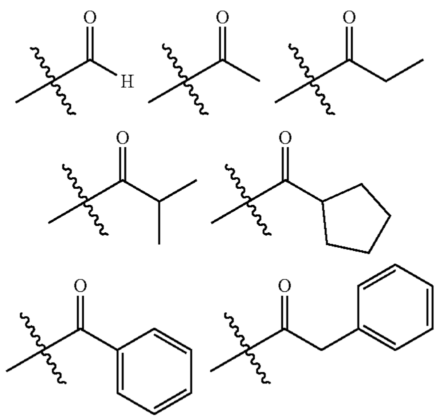

In the present disclosure, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a group having the following structural formulas, but is not limited thereto.

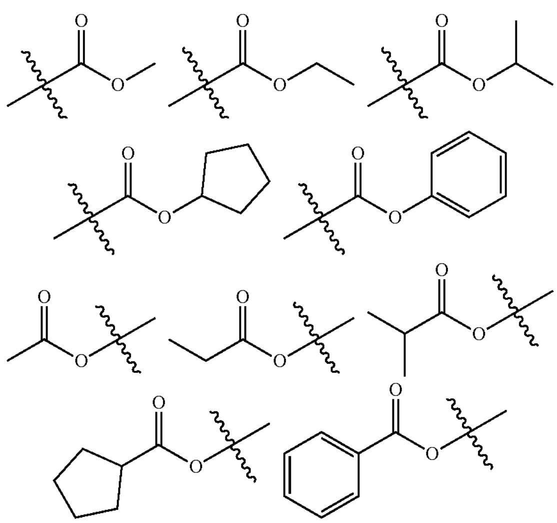

In the present disclosure, the carbon number of an imide group is not particularly limited, but is preferably 1 to 25. Specifically, the imide group may be a group having the following structural formulas, but is not limited thereto.

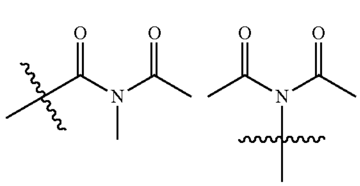

-continued

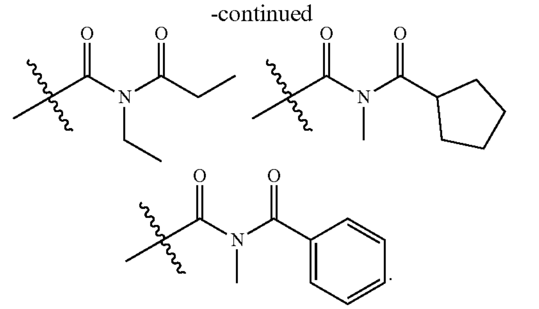

In the present disclosure, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present disclosure, a boron group specifically includes a trimethylboron group, a triethylboron group, a t-butyldimethylboron group, a triphenylboron group, and a phenylboron group, but is not limited thereto.

In the present disclosure, examples of a halogen group include fluorine, chlorine, bromine, or iodine.

In the present disclosure, the alkyl group may be straight-chain or branched-chain, and the carbon number thereof is not particularly limited, but is preferably 1 to 40. According to one embodiment, the carbon number of the alkyl group is 1 to 20. According to another embodiment, the carbon number of the alkyl group is 1 to 10. According to another embodiment, the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present disclosure, the alkenyl group may be straight-chain or branched-chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to still another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present disclosure, a cycloalkyl group is not particularly limited, but the carbon number thereof is preferably 3 to 60. According to one embodiment, the carbon number of the cycloalkyl group is 3 to 30. According to another embodiment, the carbon number of the cycloalkyl group is 3 to 20. According to still another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present disclosure, an aryl group is not particularly limited, but the carbon number thereof is preferably 6 to 60, and it may be a monocyclic aryl group or a polycyclic aryl group. According to one embodiment, the carbon number of the aryl group is 6 to 30. According to one embodiment, the carbon number of the aryl group is 6 to 20. The aryl group may be a phenyl group, a biphenyl group, a terphenyl group or the like as the monocyclic aryl group, but is not limited thereto. The polycyclic aryl group includes a naphthyl group, an anthracenyl group, a phenanthrenyl group, a pyrenyl group, a perylenyl group, a chrysenyl group, or the like, but is not limited thereto.

In the present disclosure, the fluorenyl group may be substituted, and two substituents may be linked with each other to form a spiro structure. In the case where the fluorenyl group is substituted,

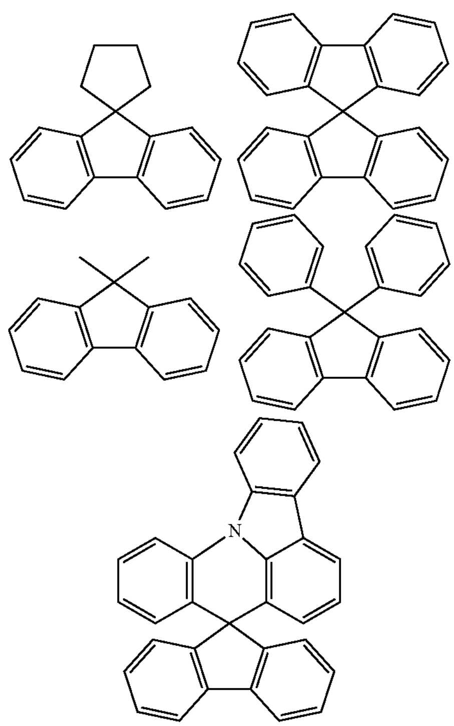

and the like can be formed. However, the structure is not limited thereto.

In the present disclosure, a heteroaryl is a heteroaryl containing one or more of O, N, Si and S as a heteroatom, and the carbon number thereof is not particularly limited, but is preferably 2 to 60. Examples of the heteroaryl include a xanthene group, a thioxanthene group, a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present disclosure, the aryl group in the aralkyl group, the aralkenyl group, the alkylaryl group, the arylamine group and the arylsily group is the same as the aforementioned examples of the aryl group. In the present disclosure, the alkyl group in the aralkyl group, the alkylaryl group and the alkylamine group is the same as the aforementioned examples of the alkyl group. In the present disclosure, the heteroaryl in the heteroarylamine can be applied to the aforementioned description of the heteroaryl. In the present disclosure, the alkenyl group in the aralkenyl group is the same as the aforementioned examples of the alkenyl group. In the present disclosure, the aforementioned description of the aryl group may be applied except that the arylene is a divalent group. In the present disclosure, the aforementioned description of the heteroaryl can be applied except that the heteroarylene is a divalent group. In the present disclosure, the aforementioned description of the aryl group or cycloalkyl group can be applied except that the hydrocarbon ring is not a monovalent group but formed by combining two substituent groups. In the present disclosure, the aforementioned description of the heteroaryl can be applied, except that the heterocycle is not a monovalent group but formed by combining two substituent groups.

In the present disclosure, the term "deuterated" means that at least one available hydrogen (H) in each Chemical Formula is replaced by deuterium (D). In some embodiments, in each Chemical Formula, at least 10% deuterated means that at least 10% of the available hydrogen is replaced by deuterium. In some embodiments, each Chemical Formula is at least 20%, at least 30%, at least 40%, at least 50%, at least 60%, at least 70%, at least 80% deuterated, or at least 90% deuterated.

(Anode and Cathode)

The organic light emitting device according to the present disclosure includes an anode and a cathode.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SNO_2$:Sb; conductive compounds such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

(Hole Injection Layer)

The organic light emitting device according to the present disclosure includes a hole injection layer on the anode, wherein the compound represented by Chemical Formula 1 is used as a material for the hole injection layer, and specifically, a cured product of the compound represented by Chemical Formula 1 is used as a hole injection layer.

In Chemical Formula 1, preferably, $L_1$ is phenylene, biphenyldiyl, terphenyldiyl, phenylnaphthalenediyl, binaphthyldiyl, phenanthrenediyl, spirobifluorenediyl, dimethylfluorenediyl, diphenylfluorenediyl, or tetraphenylfluorenediyl, and the $L_1$ is unsubstituted or substituted with one or two $C_{1-10}$ alkyls.

Preferably, $L_1$ is any one selected from the group consisting of the following:

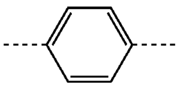
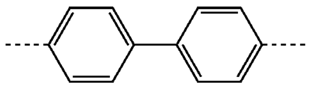
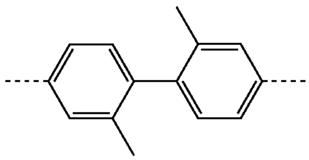
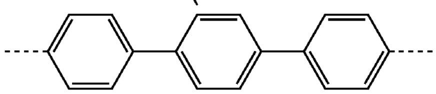
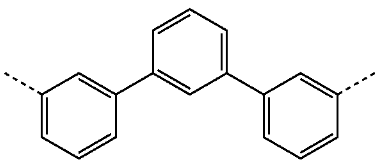
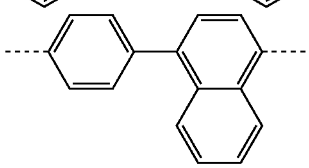
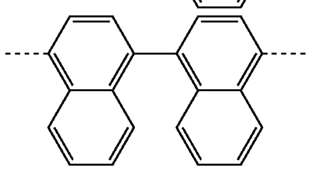
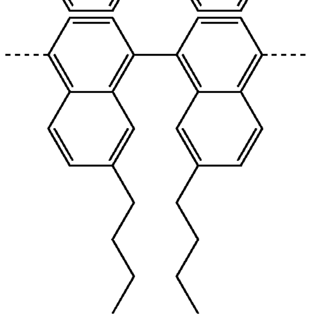
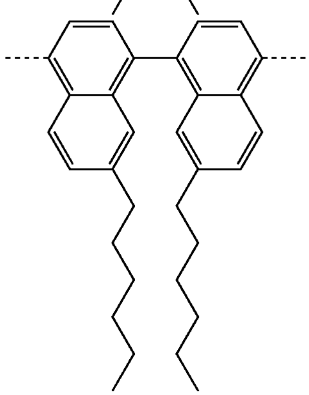

-continued

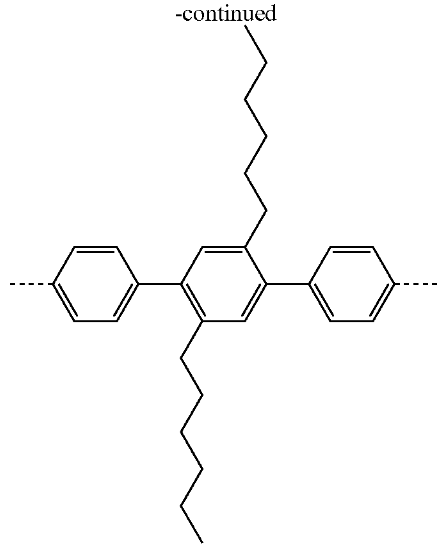
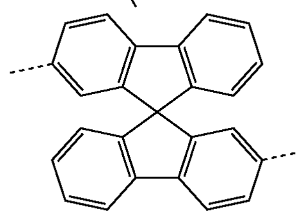
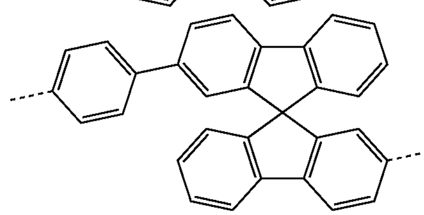
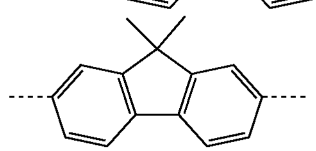
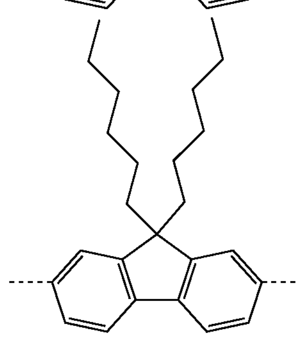
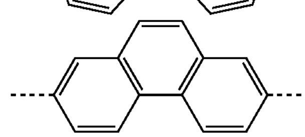
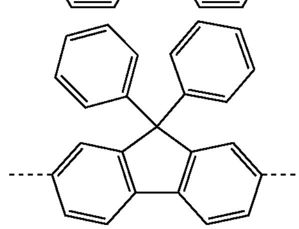

-continued

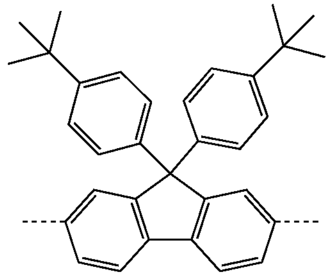

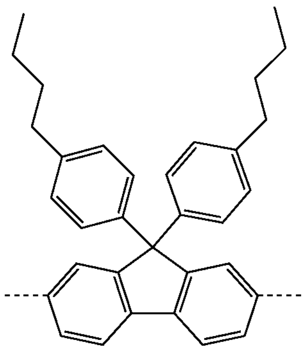

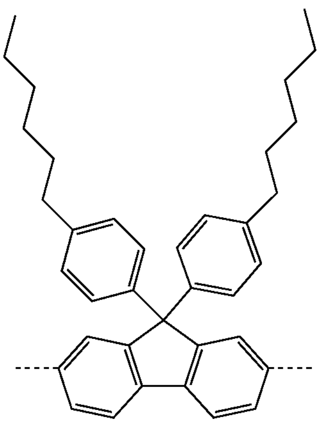

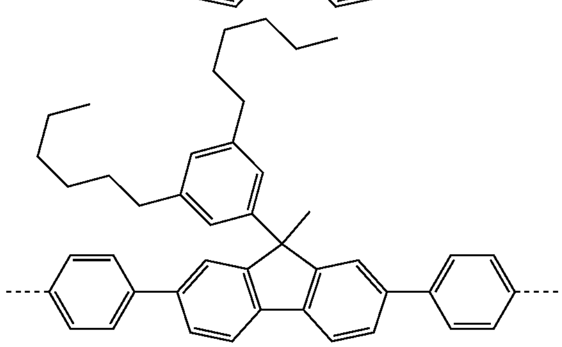

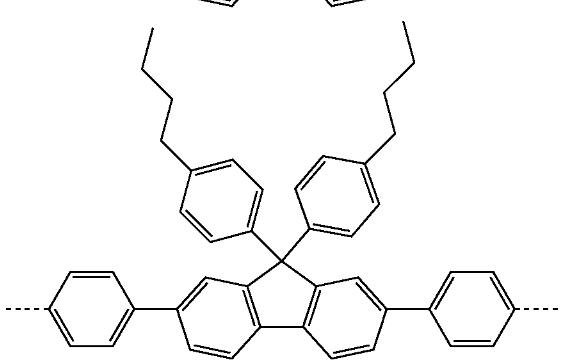

-continued

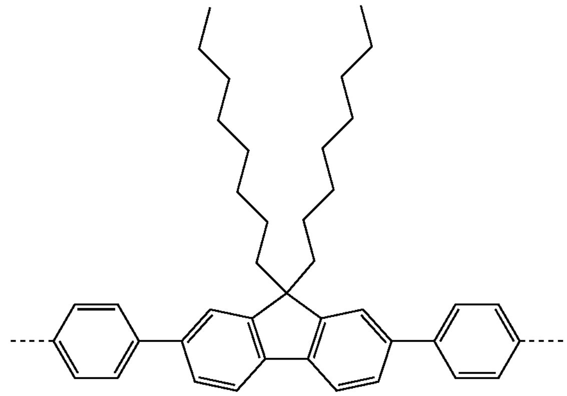

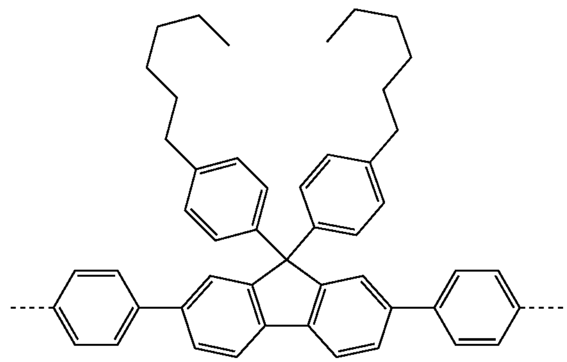

Preferably, $Ar_1$ is each independently phenyl, biphenylyl, naphthyl, phenanthrenyl, or dimethylfluorenyl, and the Ar is unsubstituted or substituted with 1 to 5 deuteriums, or halogen.

Preferably, $Ar_2$ is each independently phenyl, biphenylyl, or naphthyl, and the $Ar_2$ is unsubstituted, or substituted with –R; 1 to 5 deuteriums; 1 or 2 $C_{1-10}$ alkyl; 1 to 5 halogens; $C_{1-10}$ alkoxy; $C_{1-10}$ alkoxy substituted with $C_{1-10}$ alkoxy; $C_{1-10}$ haloalkyl; or phenoxy, and the definition of the R is the same as defined above.

Preferably, $L_2$ is each independently a single bond, butylene, pentylene, hexylene, heptylene, or phenylene.

Preferably, n is 1, and $R_1$ is each independently hydrogen or phenyl.

Preferably, R is $-L_3-R_2$, $L_3$ is a single bond, —O—, —S—, —$CH_2$—, —$CH_2O$—, —$OCH_2$—, —$CH_2OCH_2$—, —N(phenyl)-, or —$O(CH_2)_6$—, and $R_2$ is any one selected from the group consisting of the following:

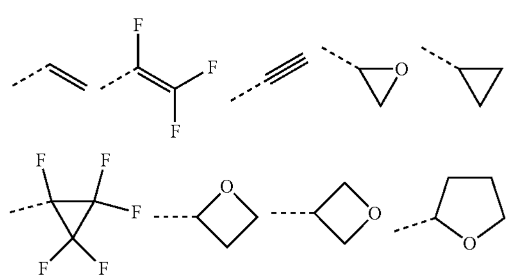

-continued
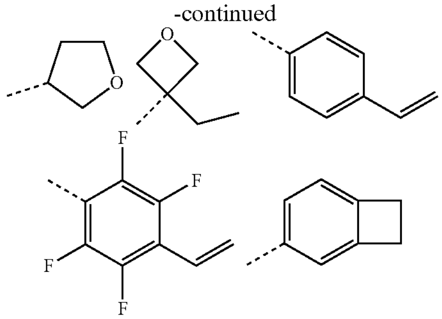
-continued
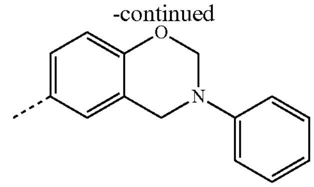
Representative examples of the compound represented by Chemical Formula 1 are as follows:
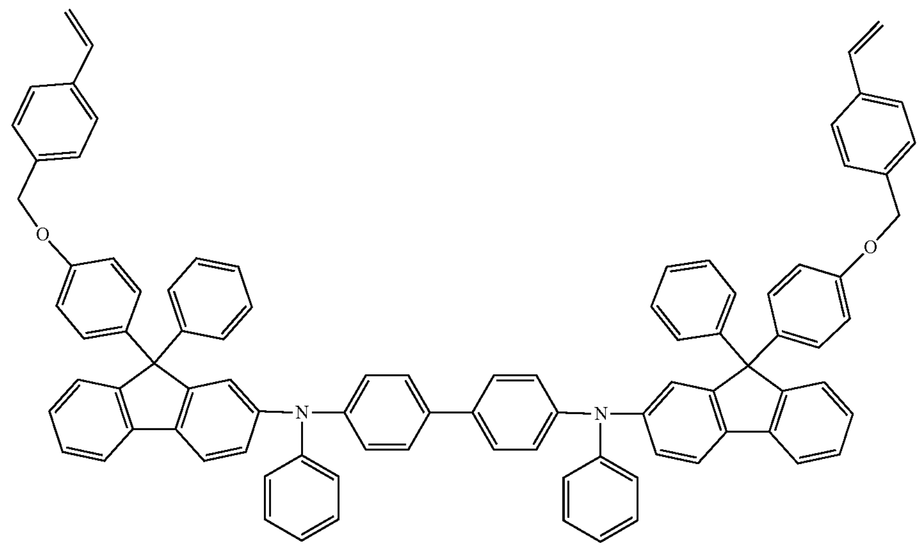
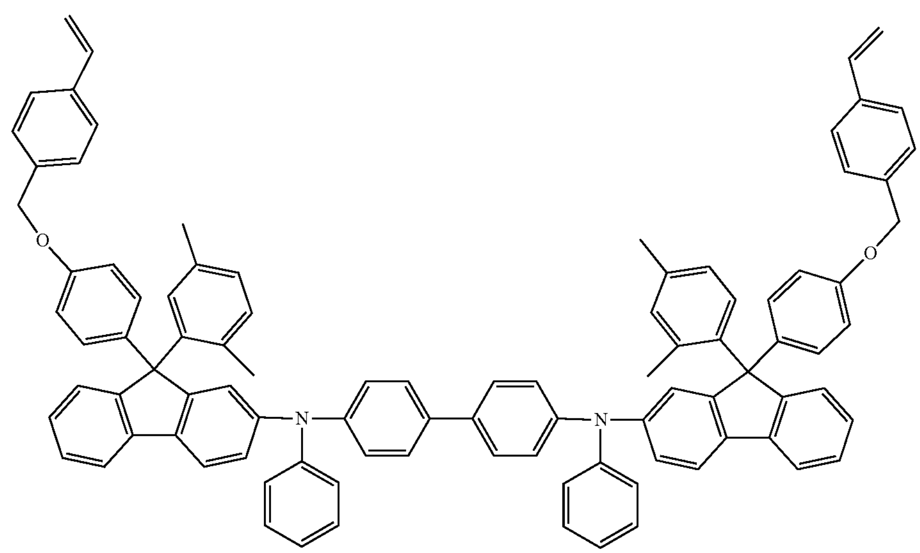

-continued
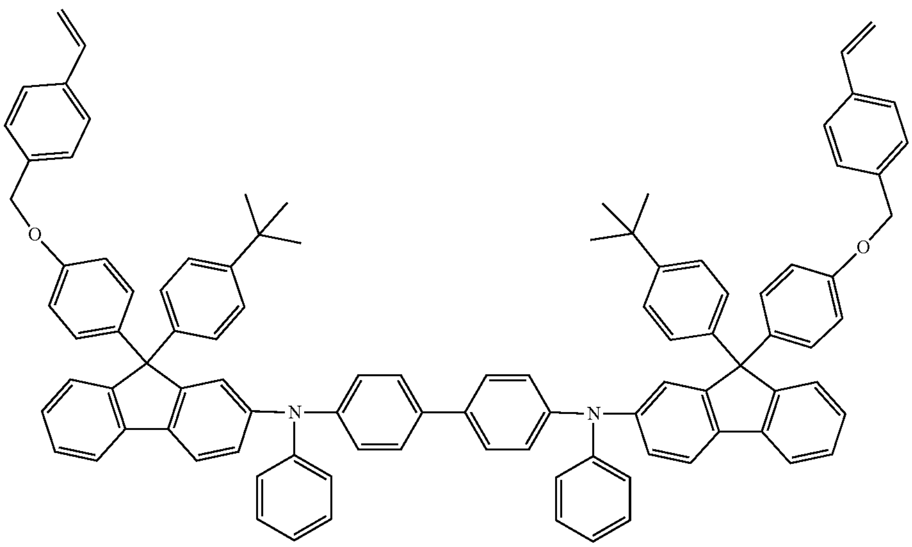
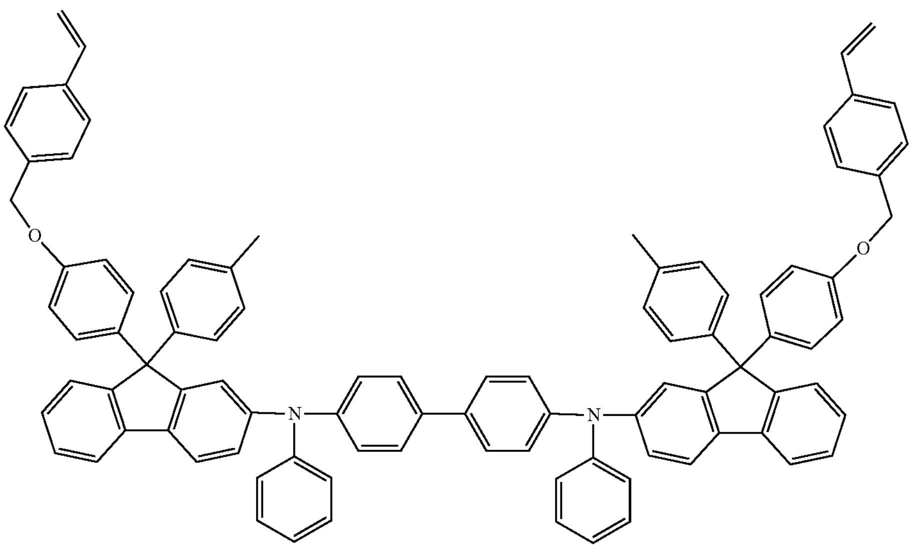
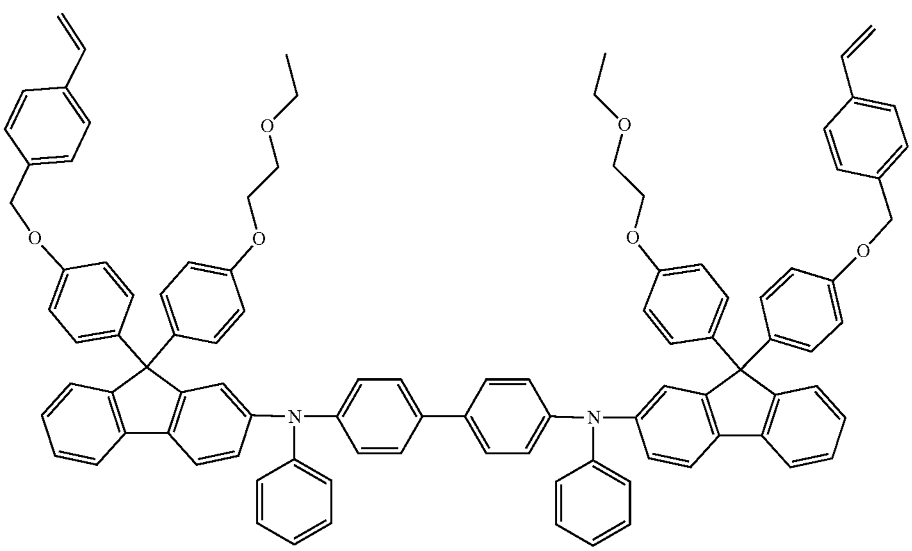

-continued
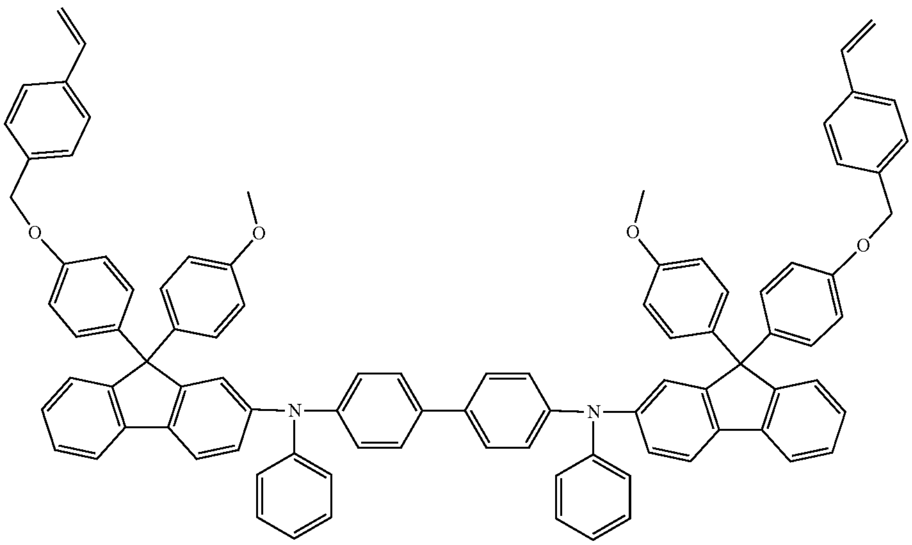
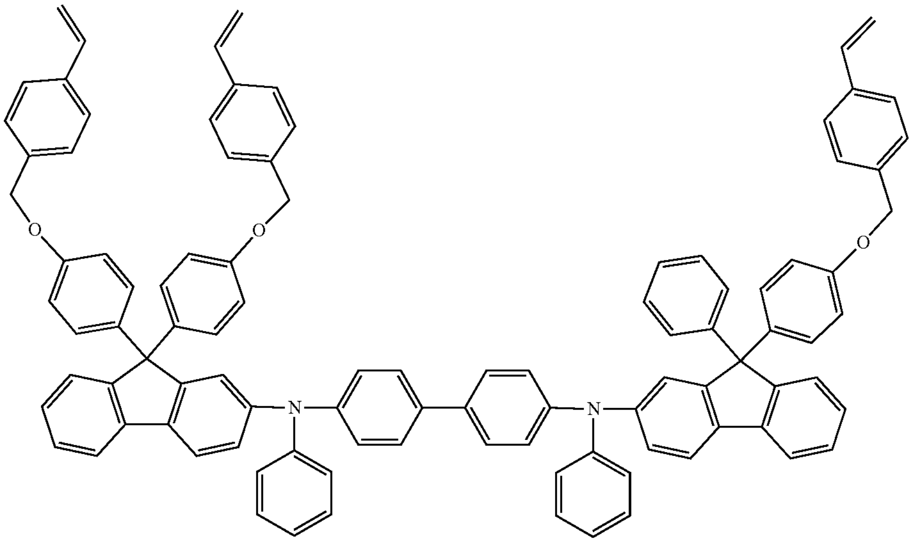
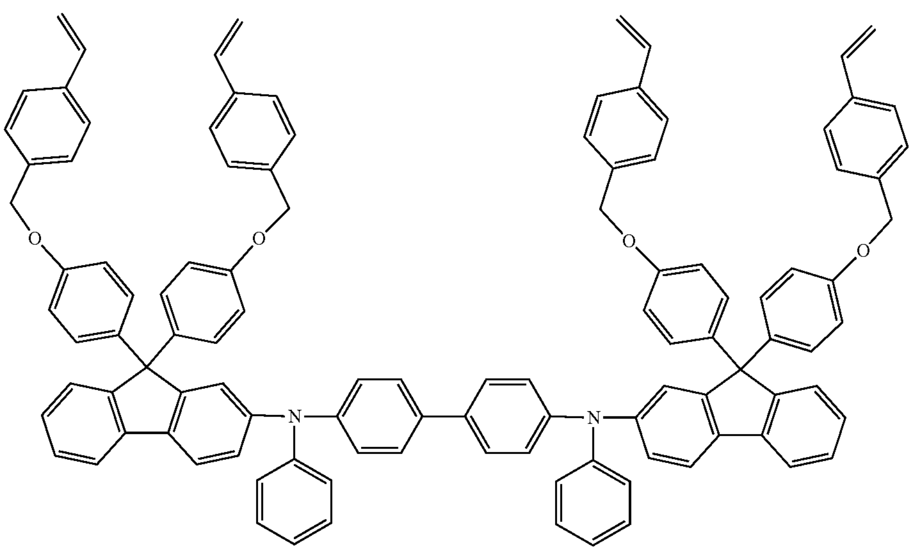

-continued
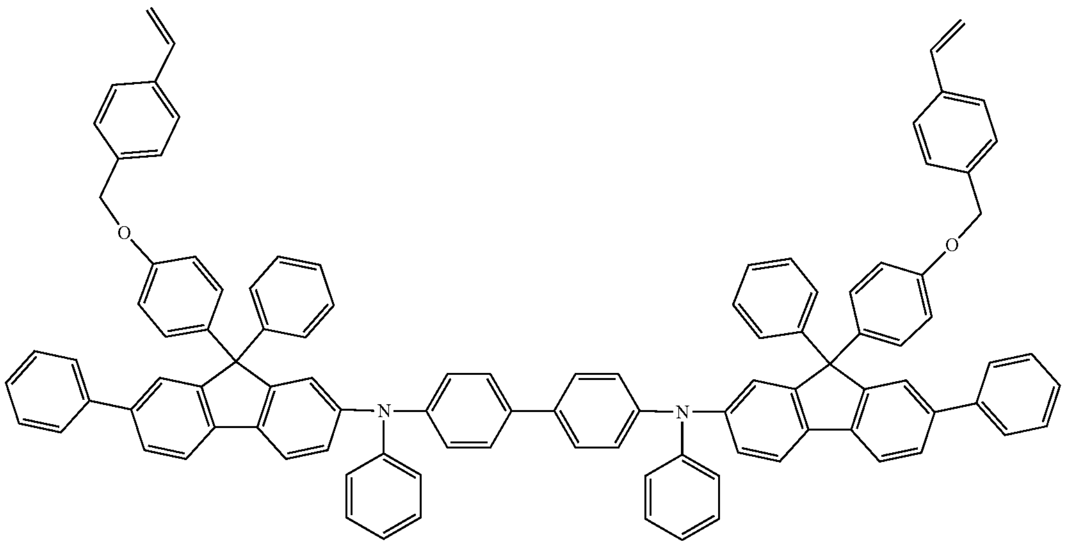
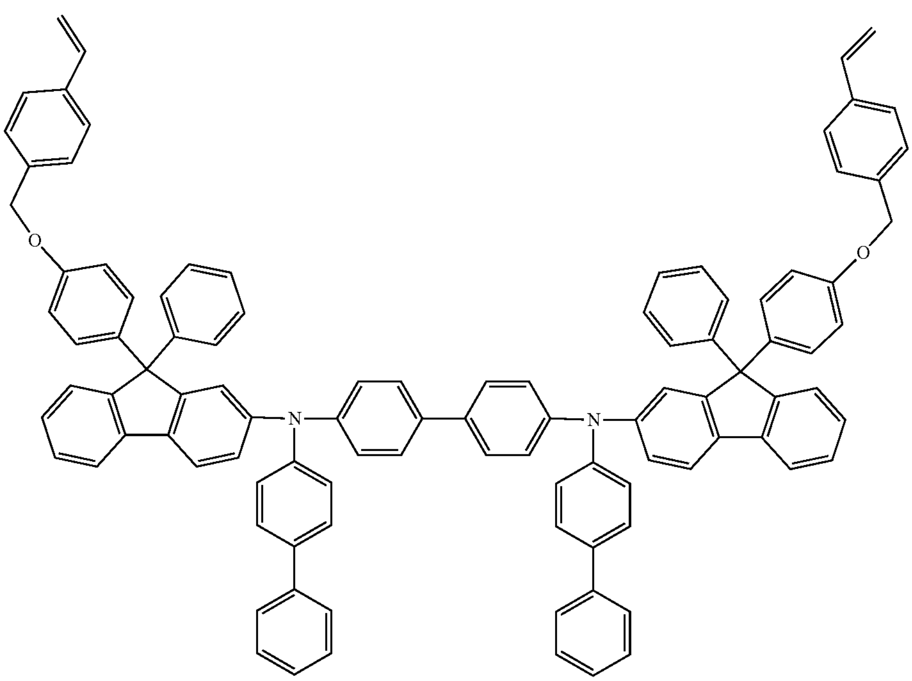

-continued
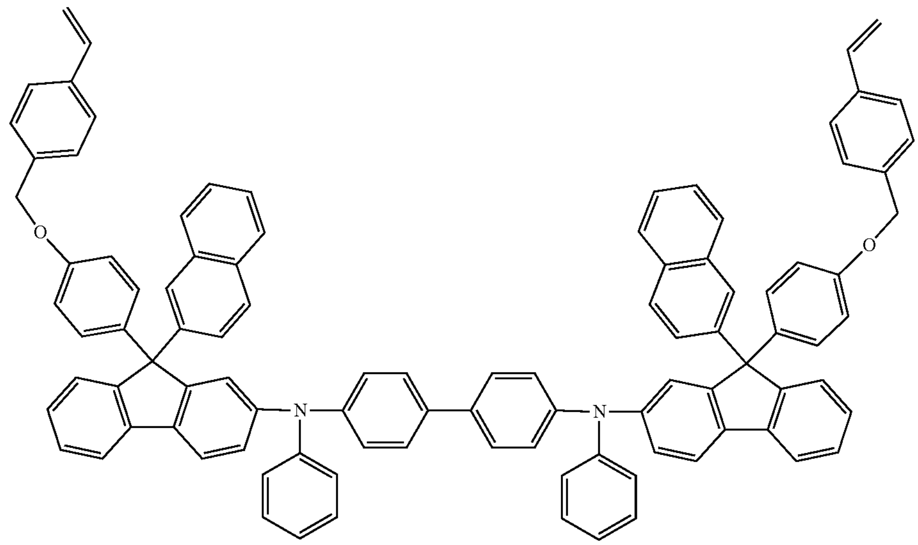
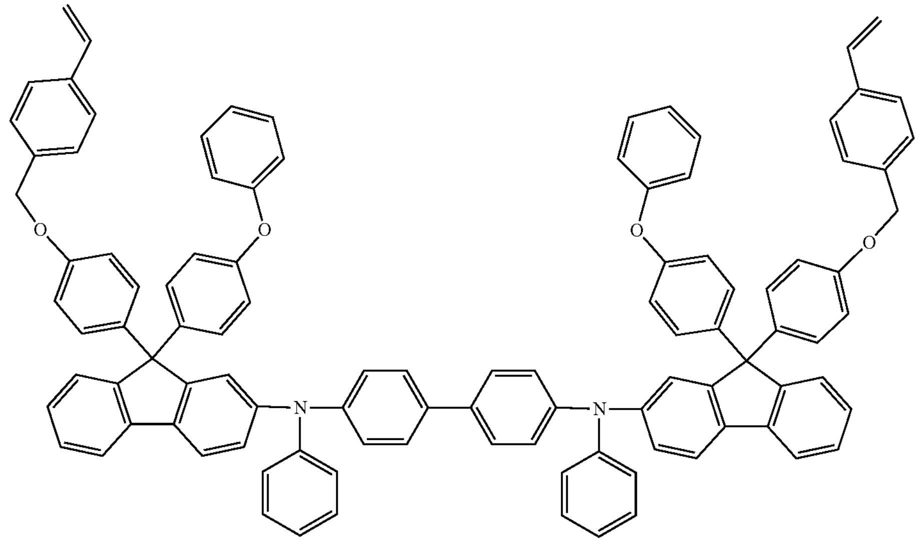
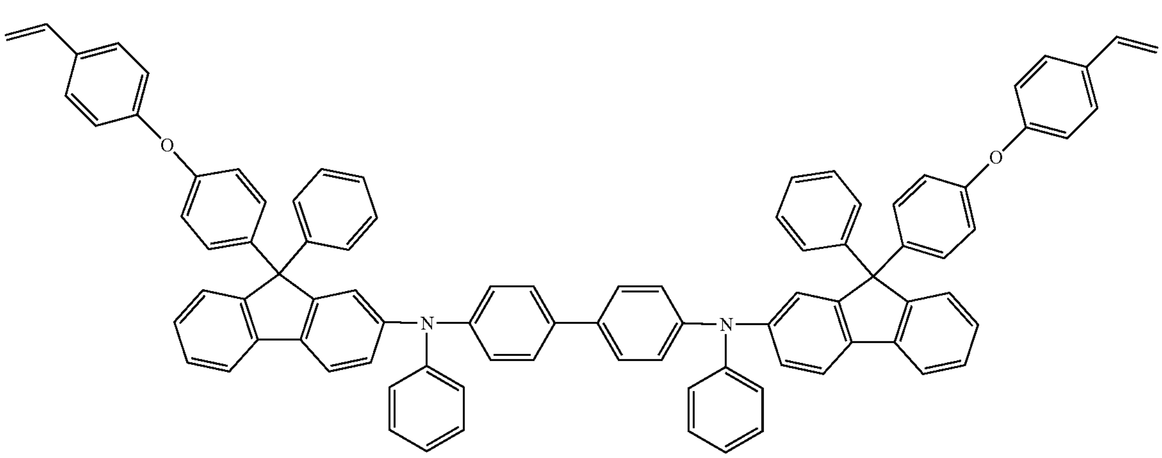

-continued
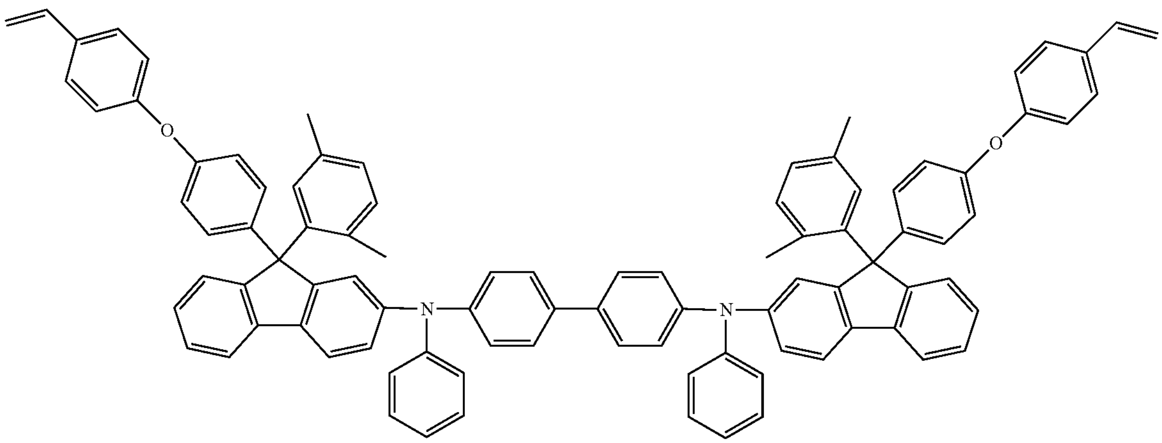
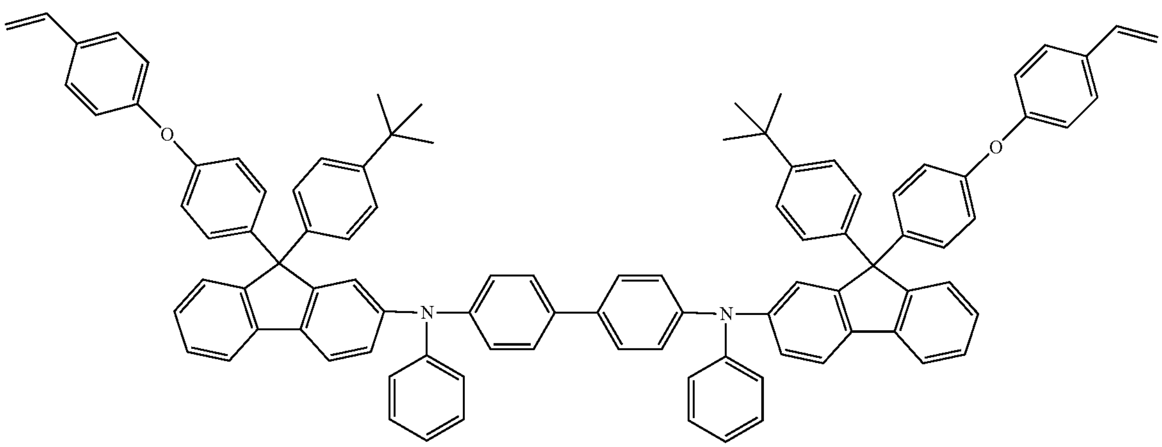
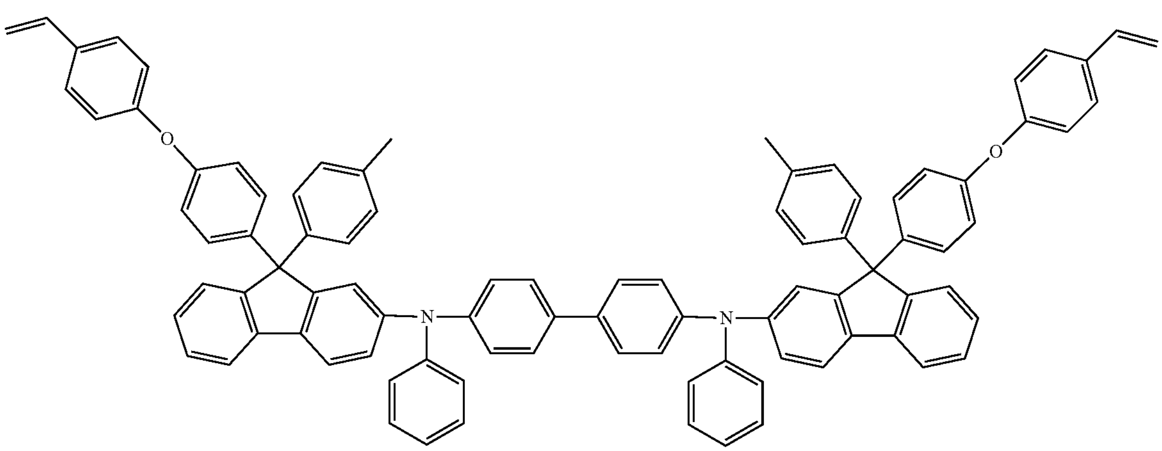

-continued
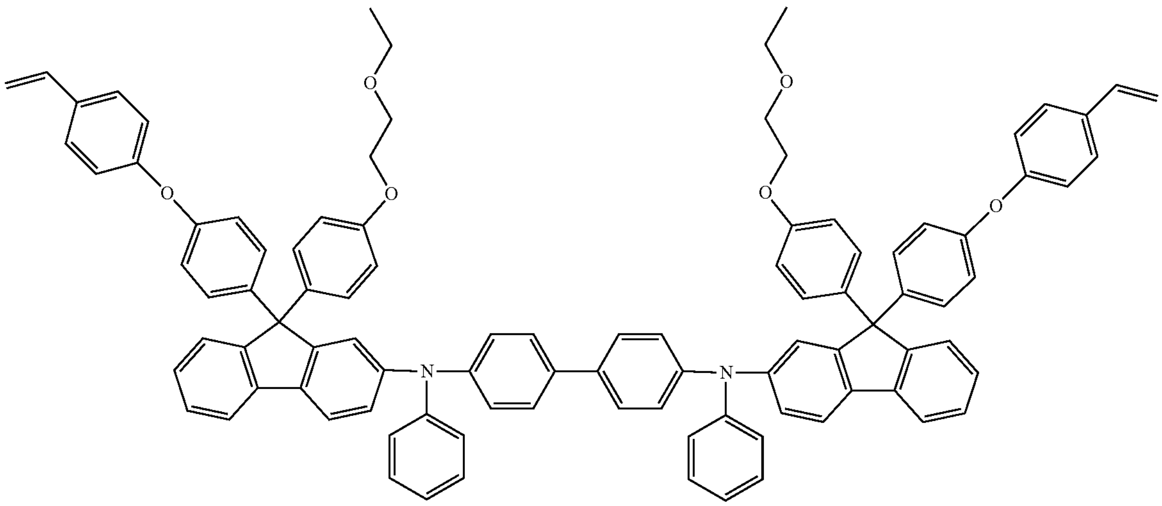
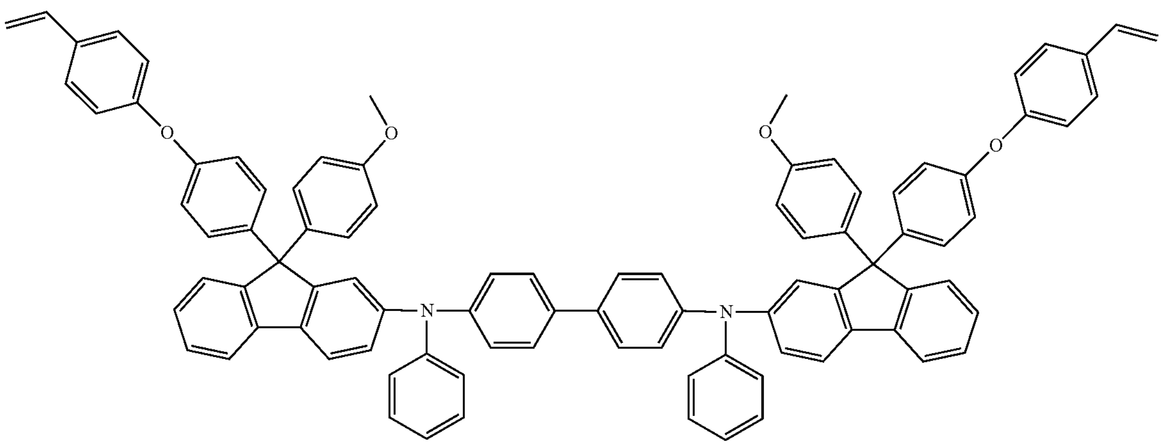
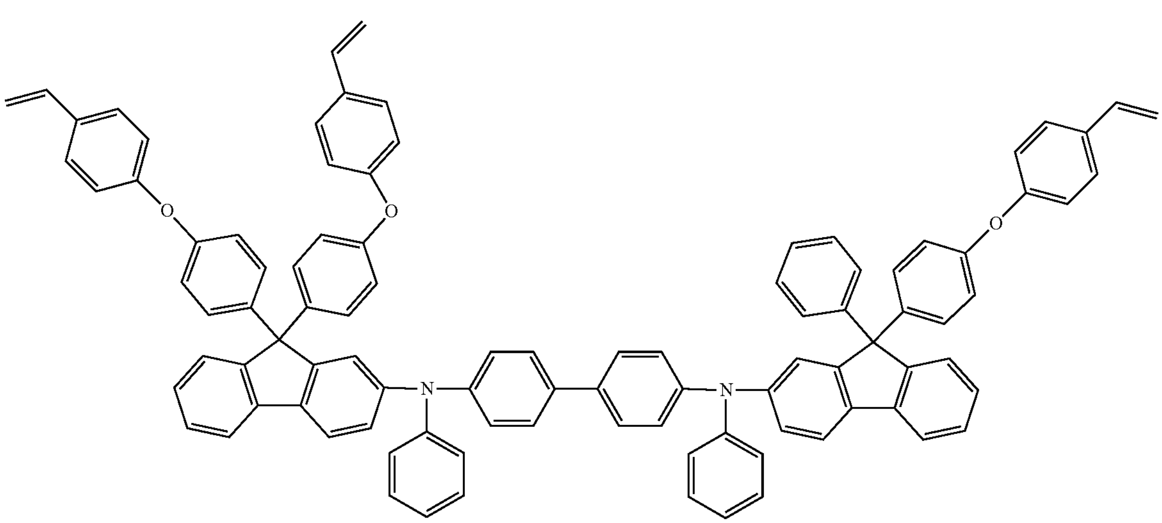

-continued
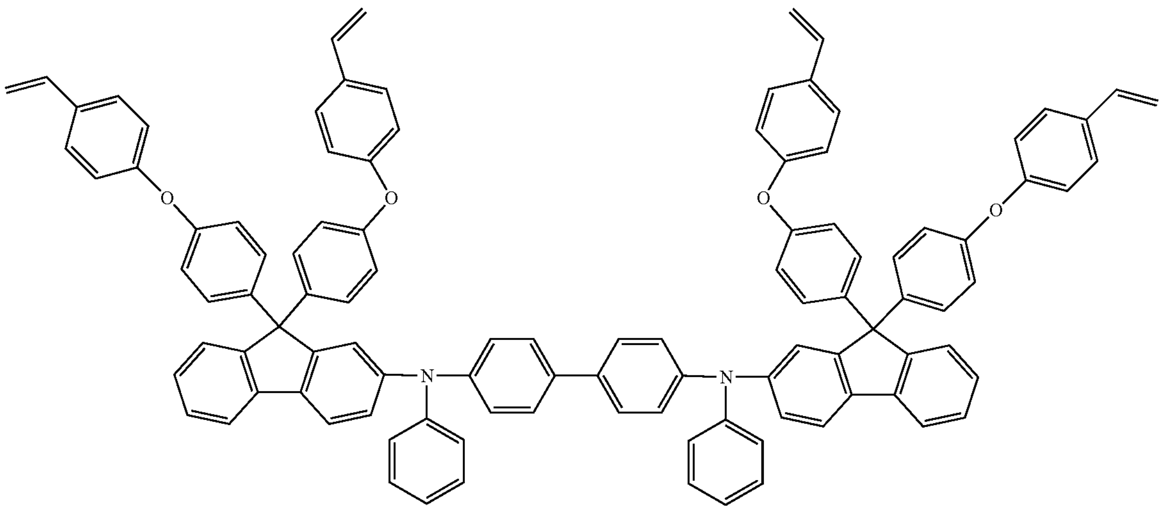
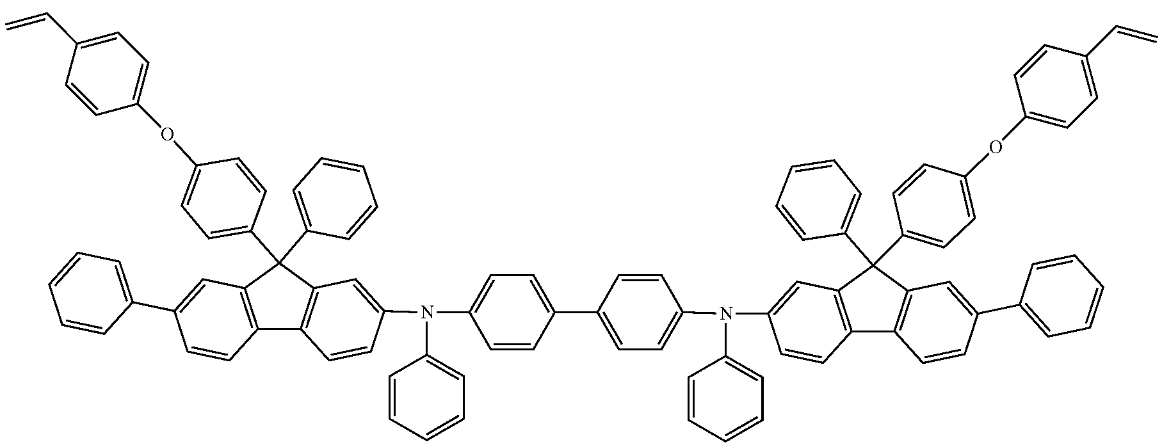
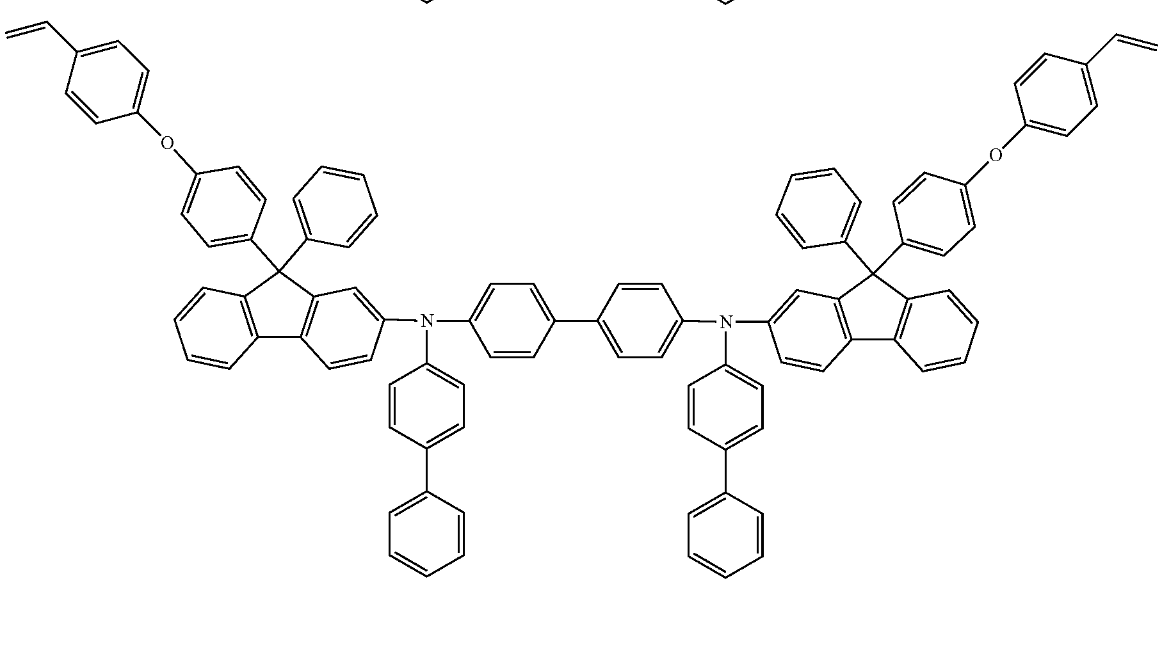

-continued
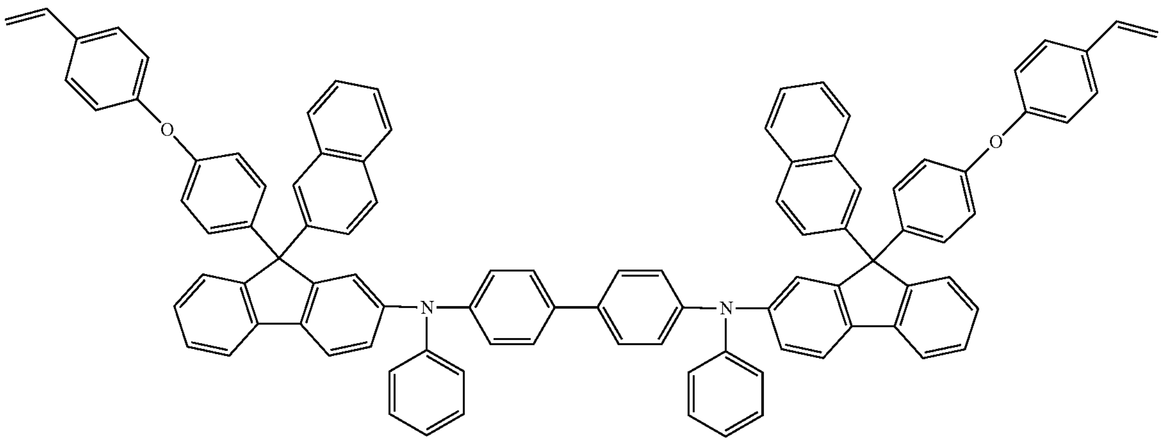
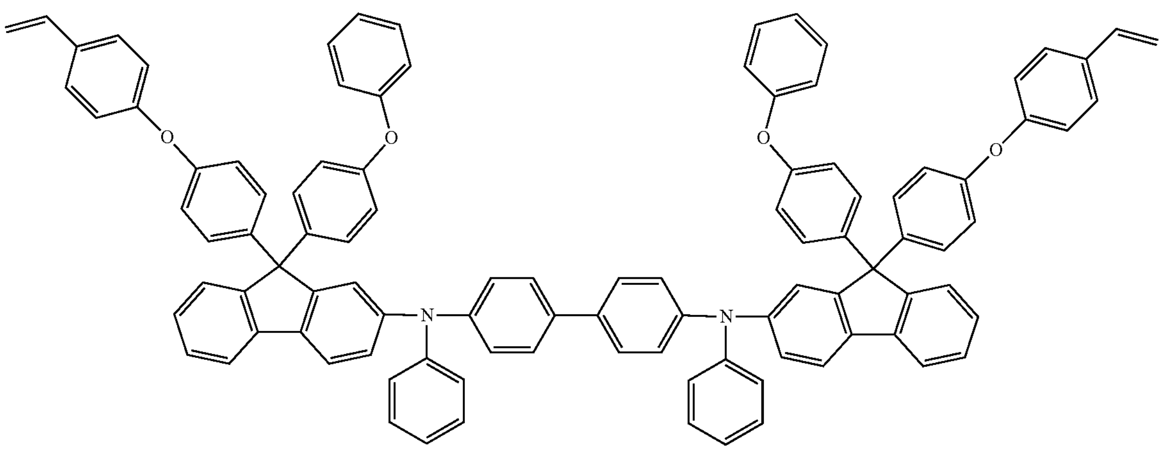
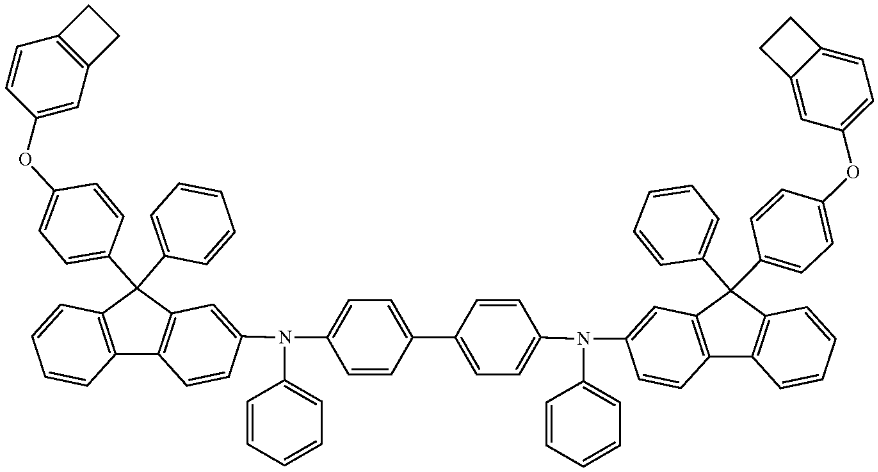

-continued
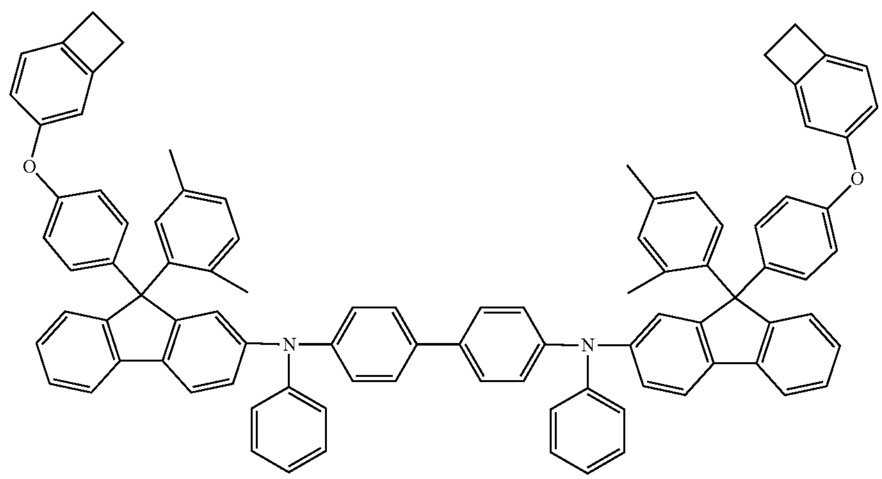
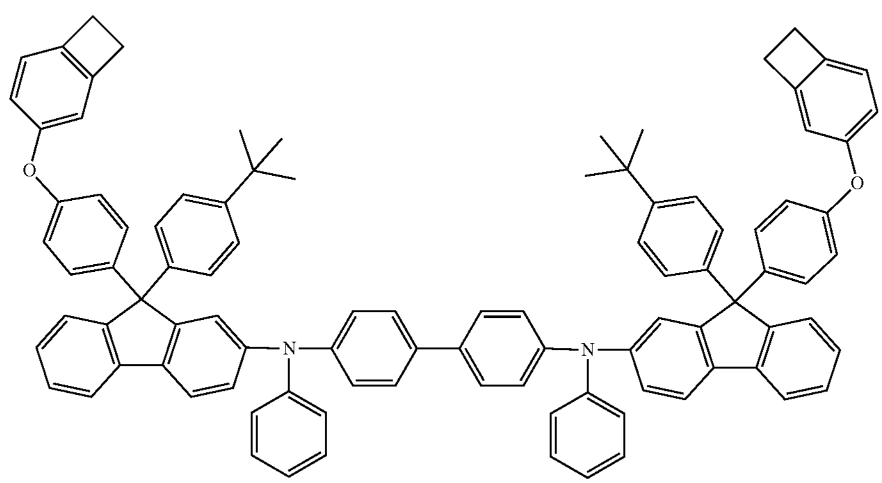
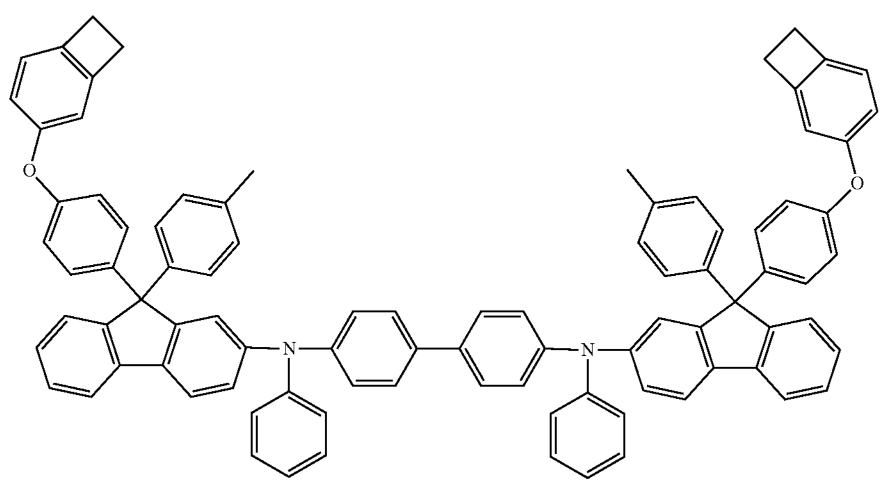

-continued
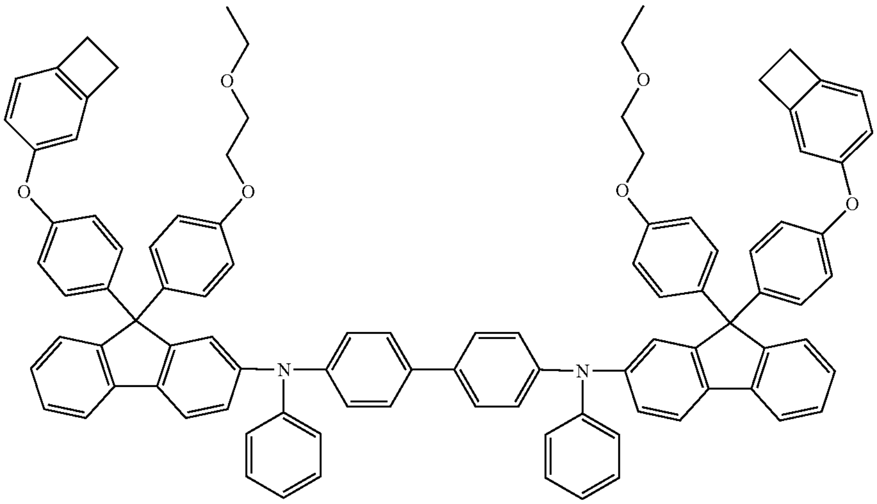
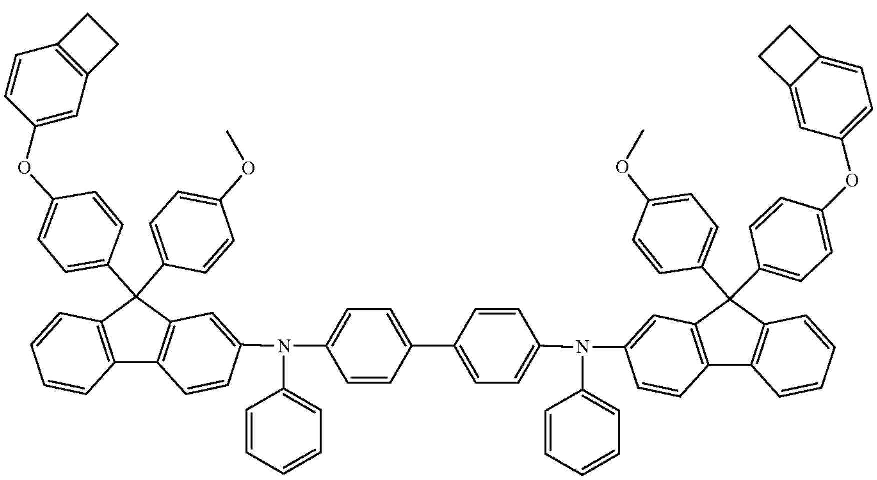
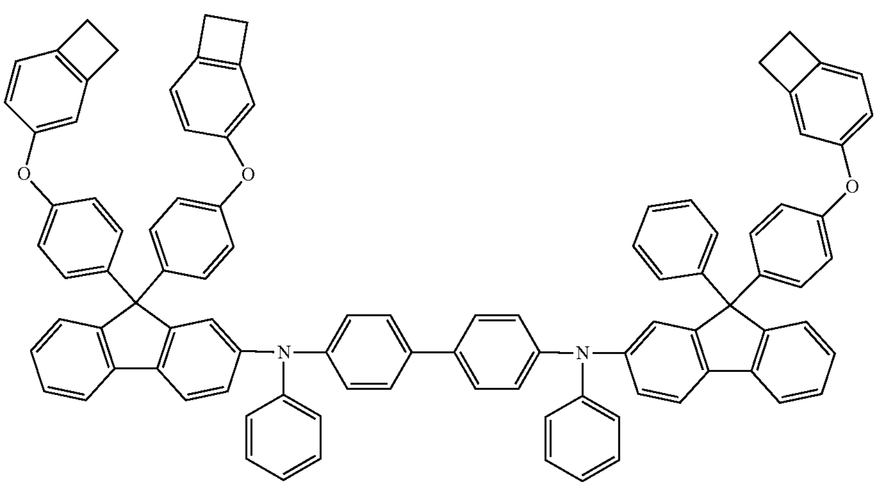

-continued
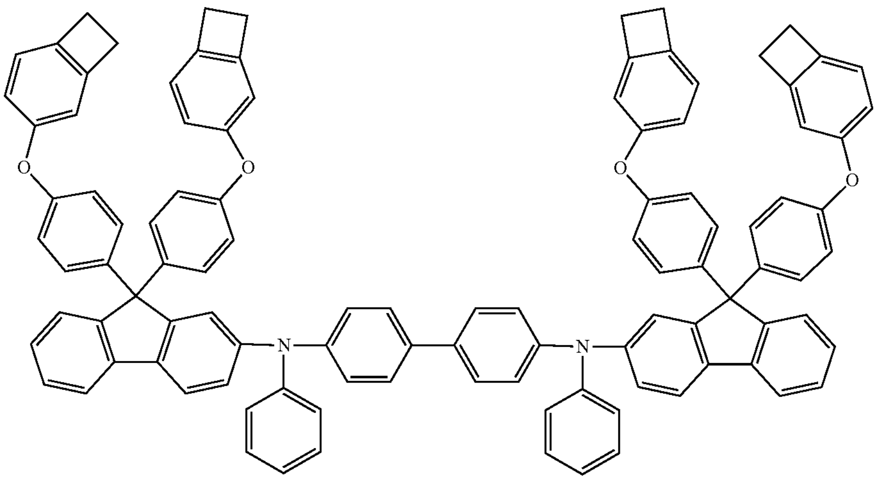
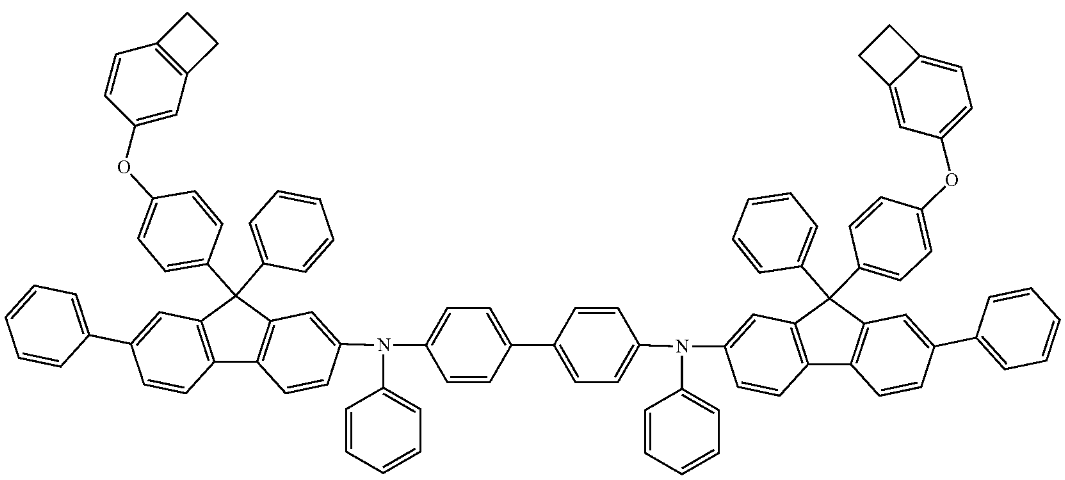
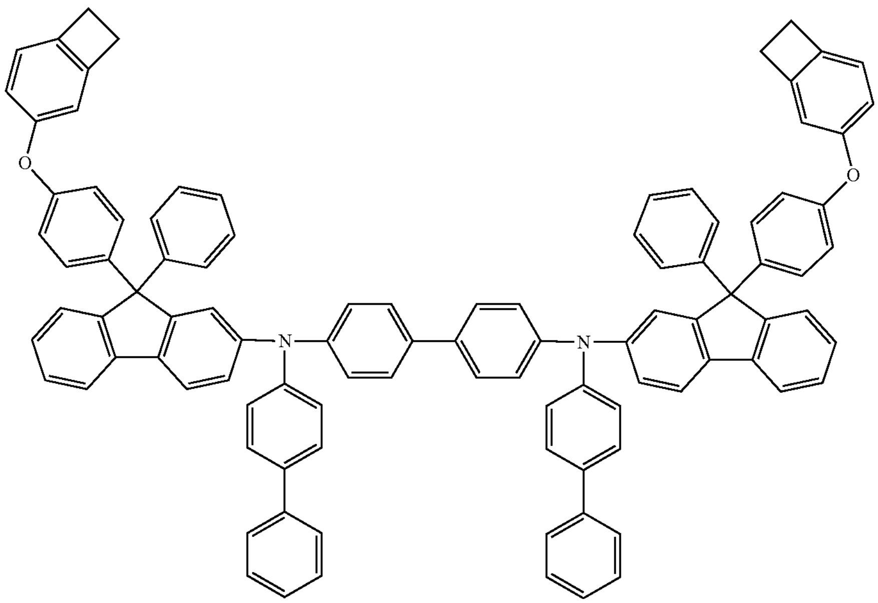

-continued
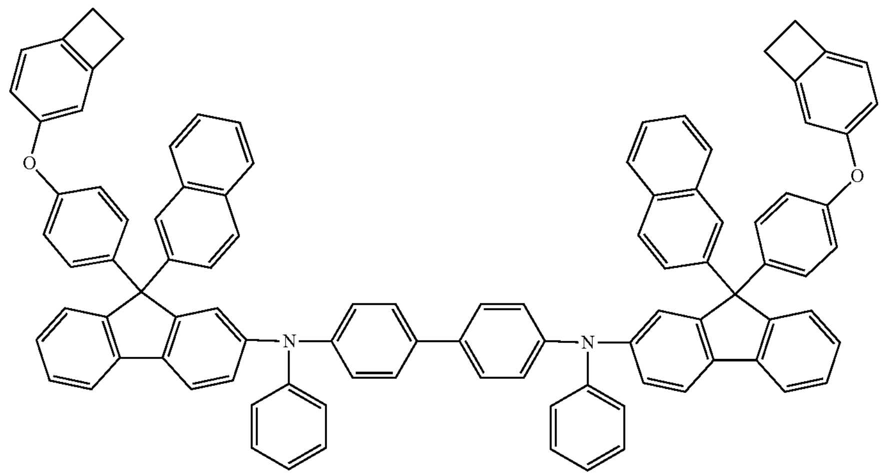
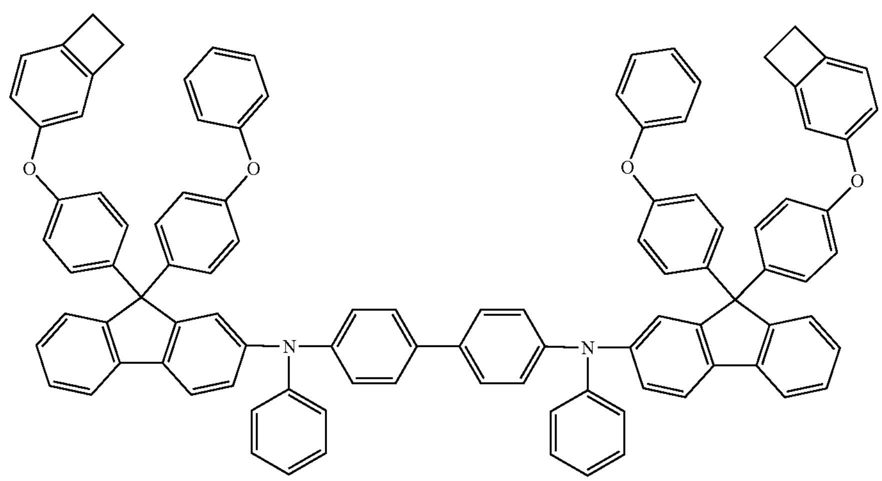
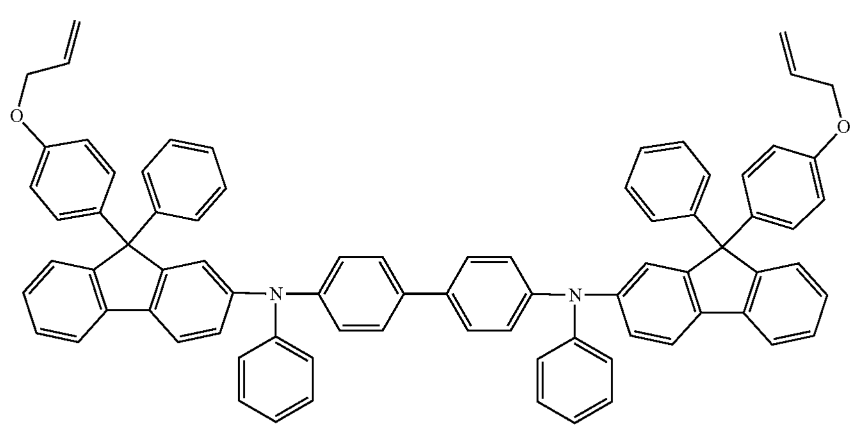

-continued
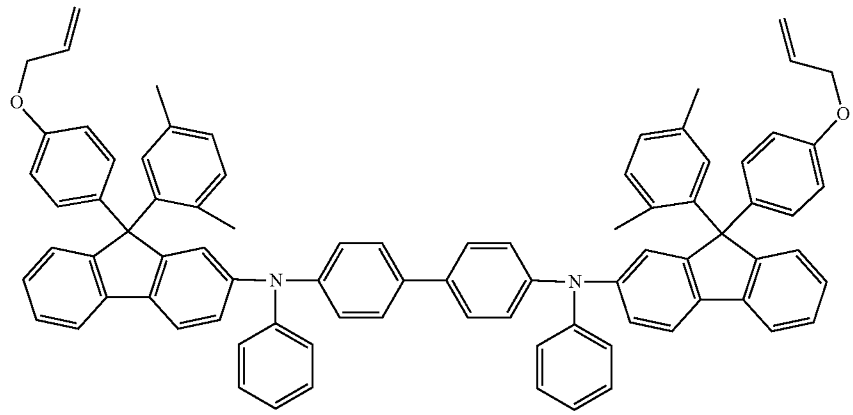
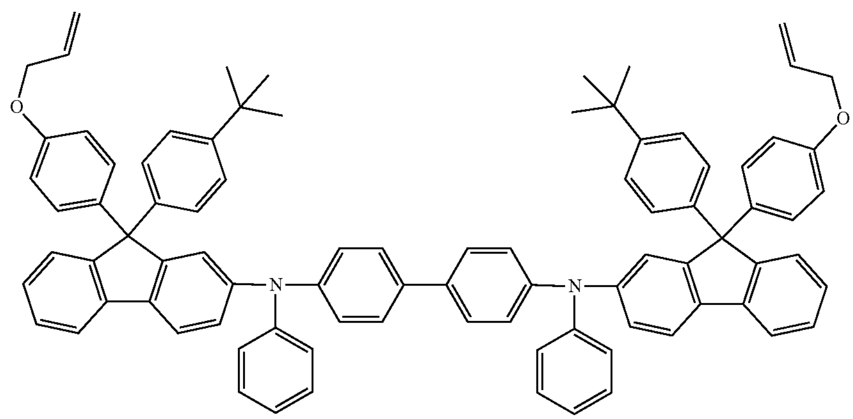
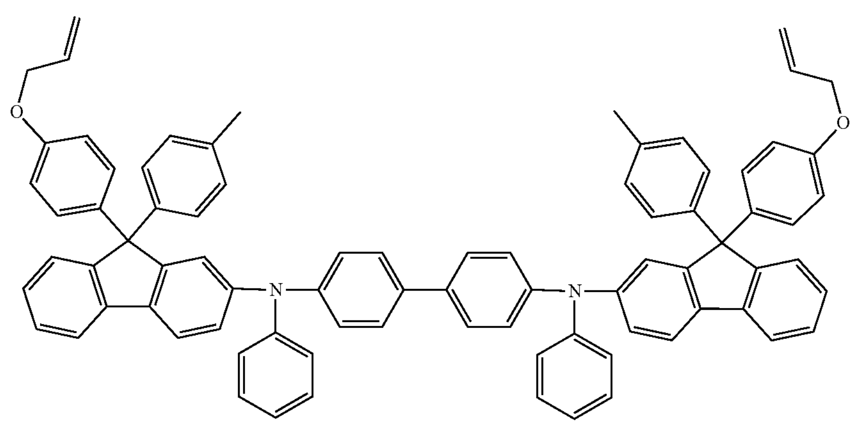

-continued
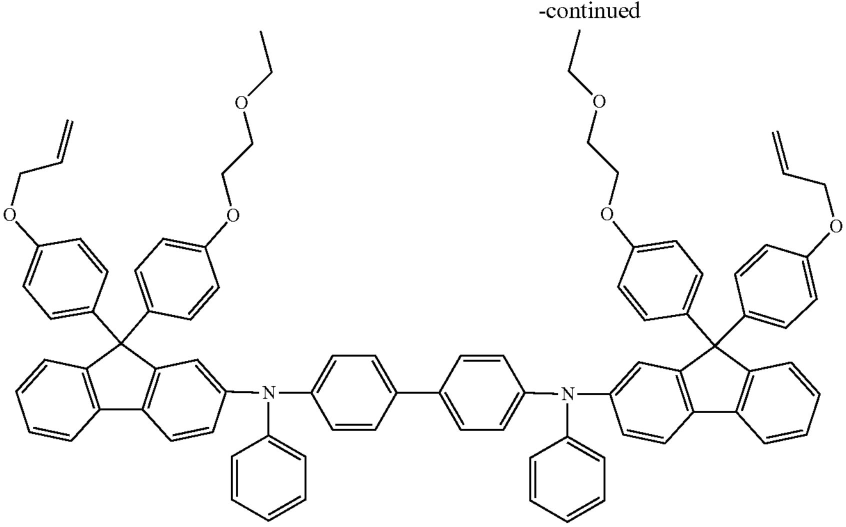
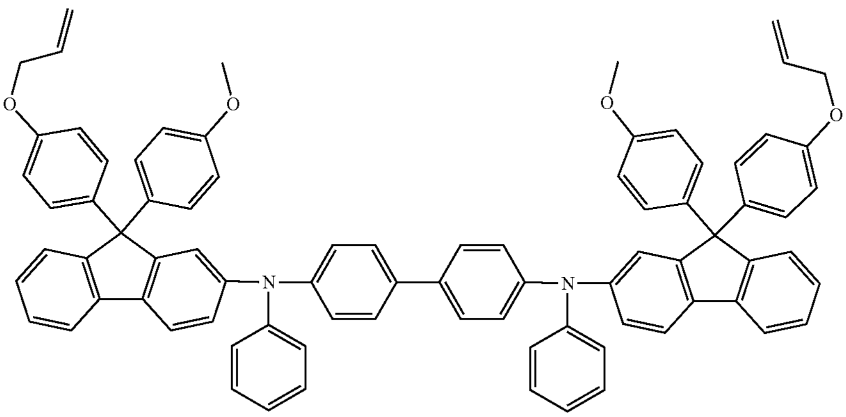
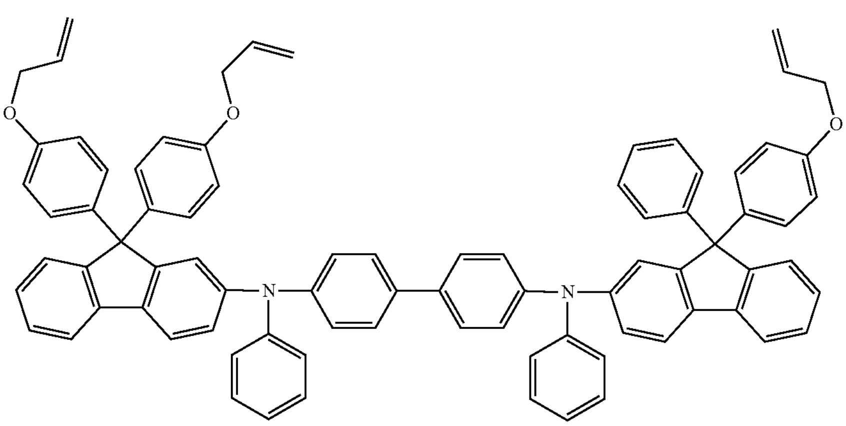

-continued
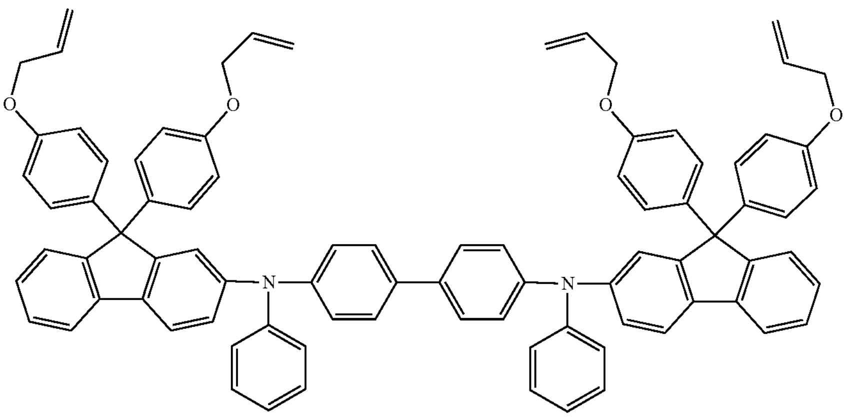
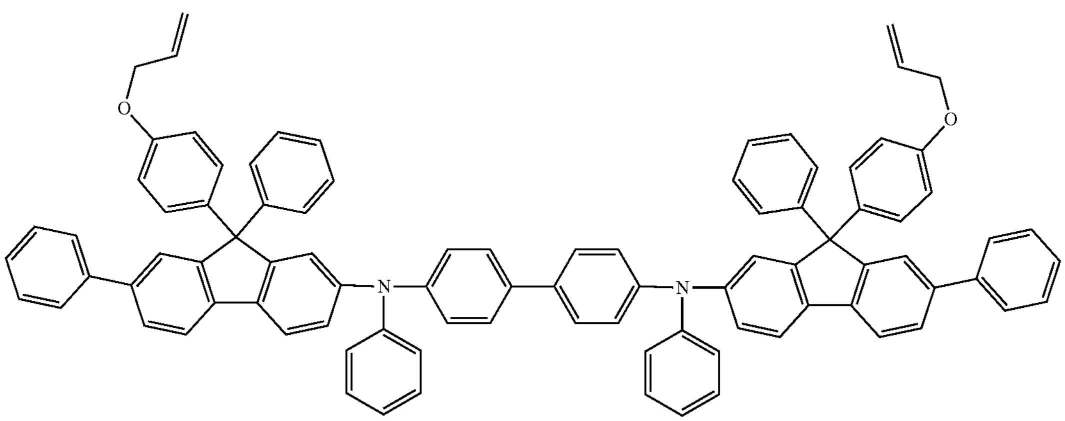
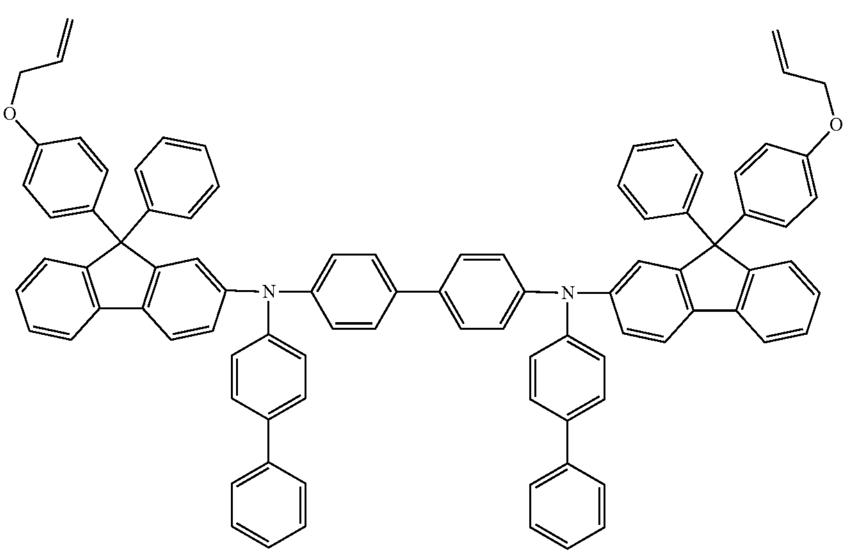

-continued
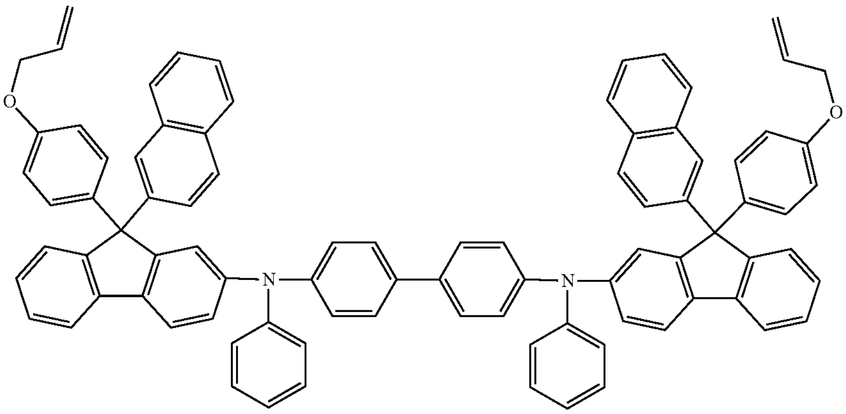
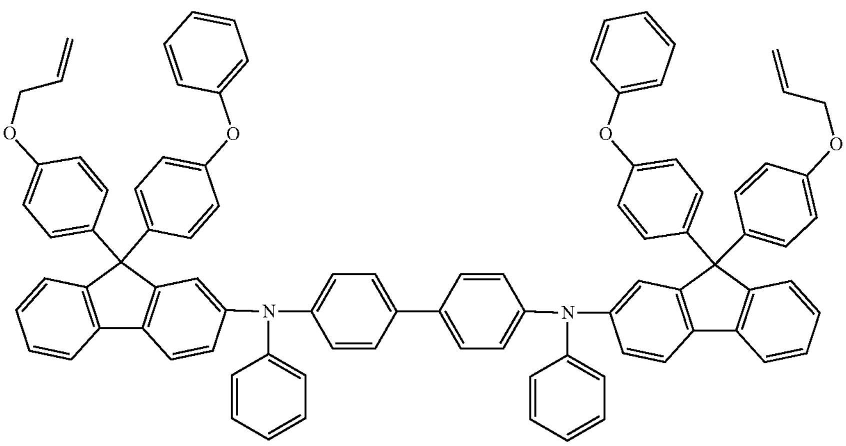
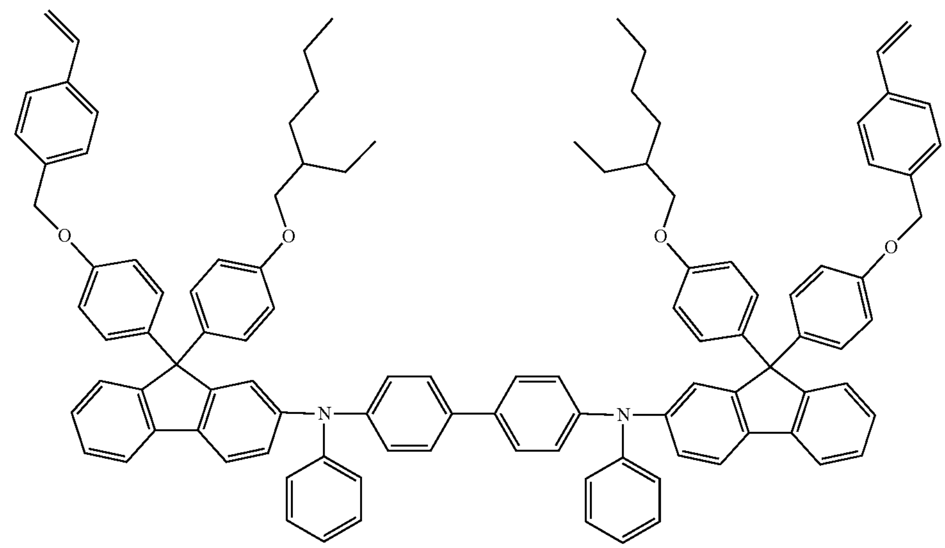

-continued
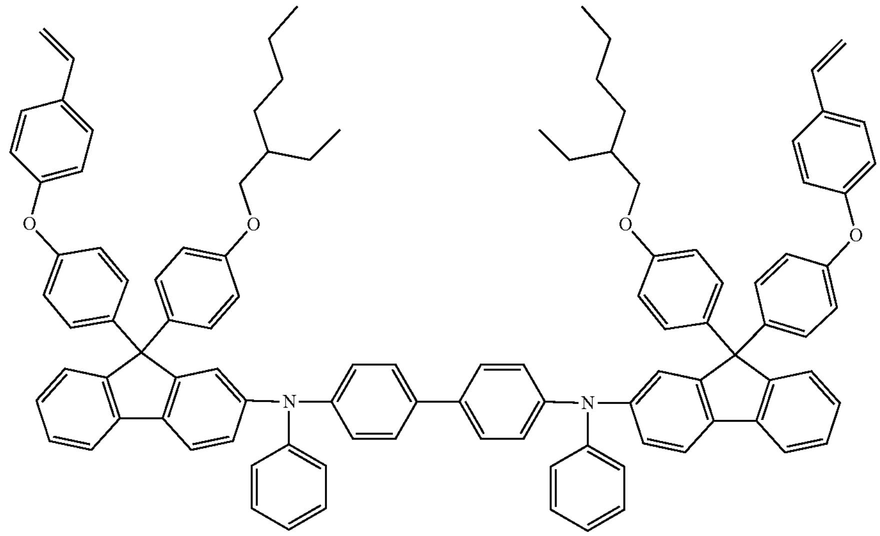
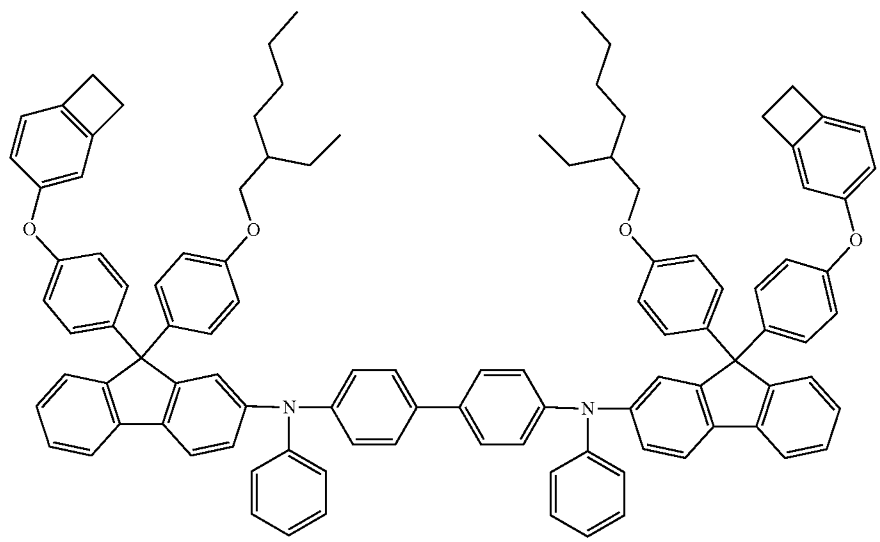
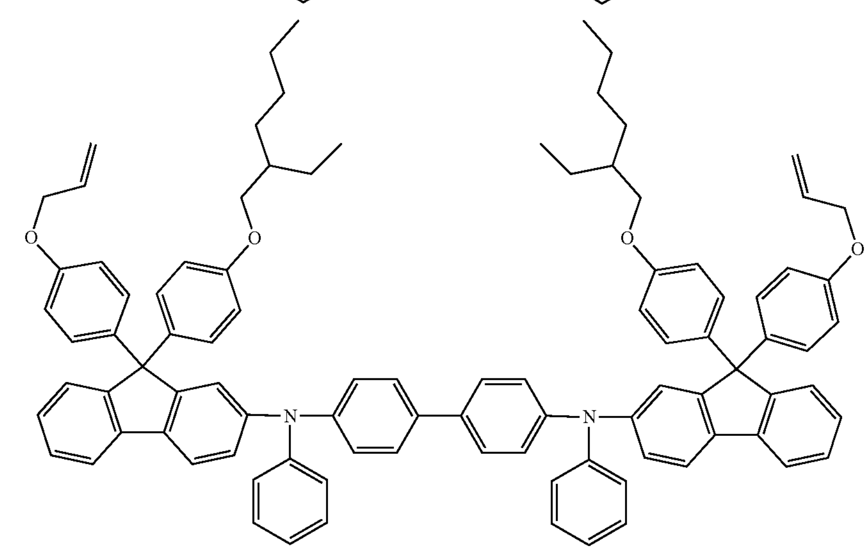

-continued
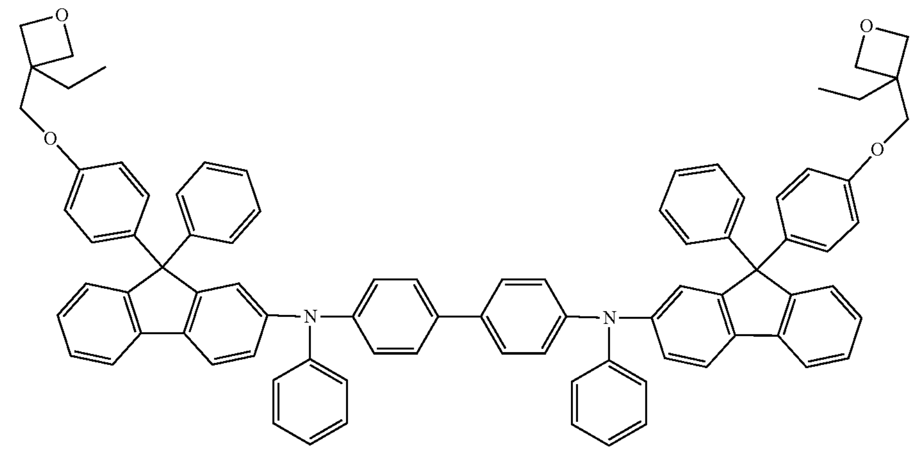
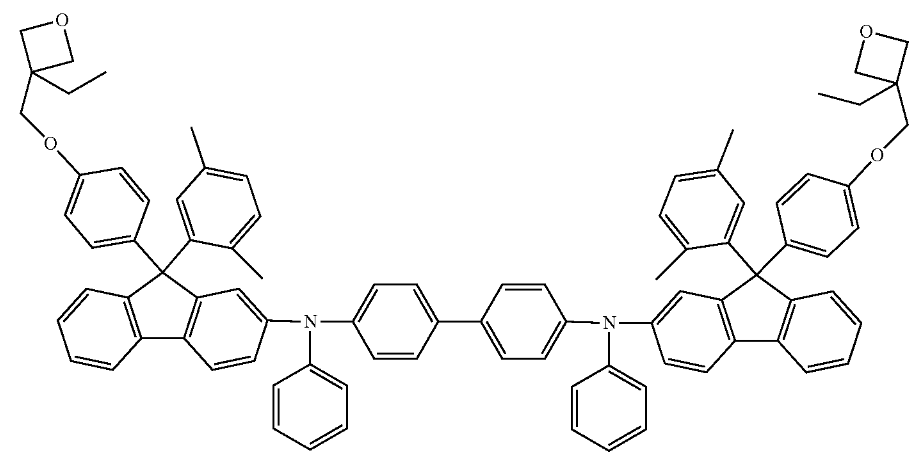
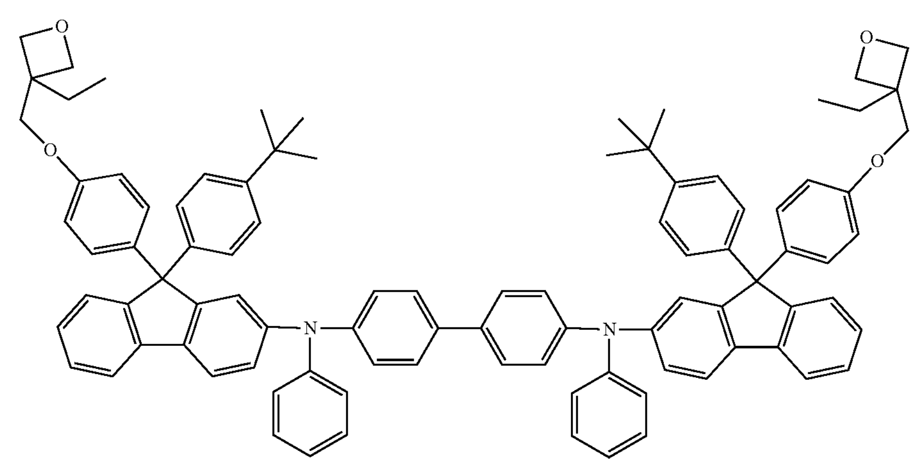

-continued
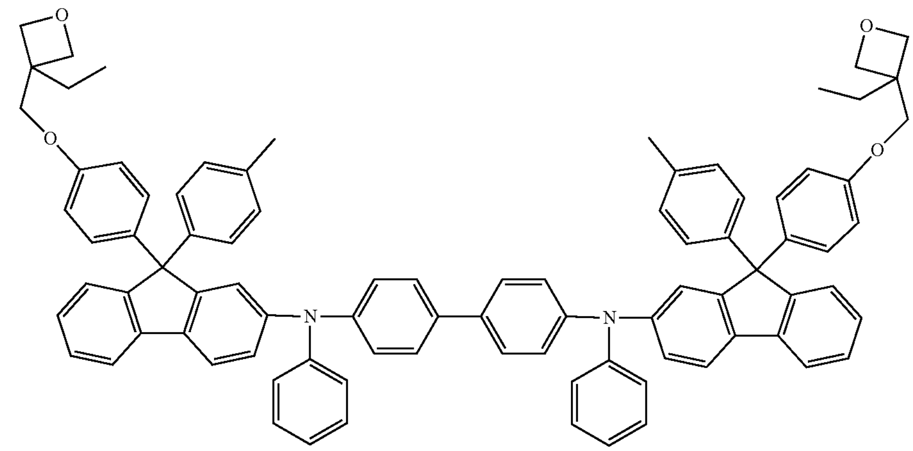
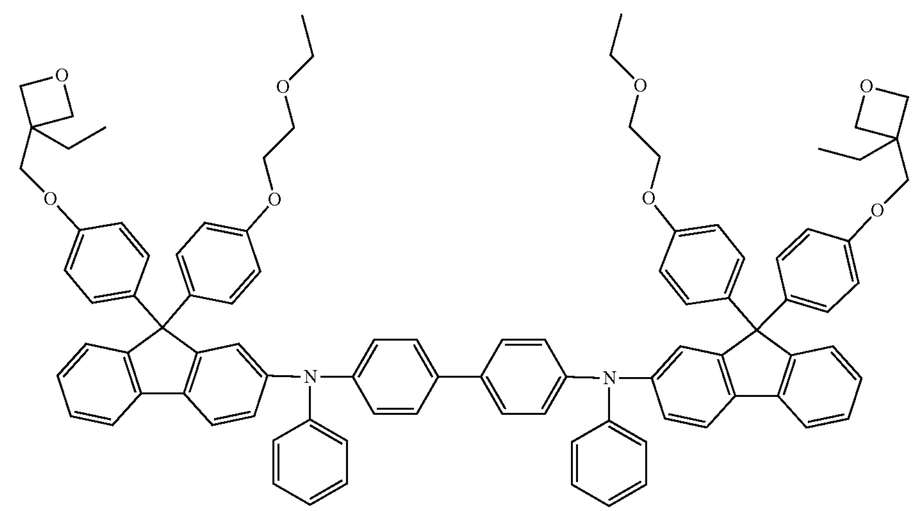
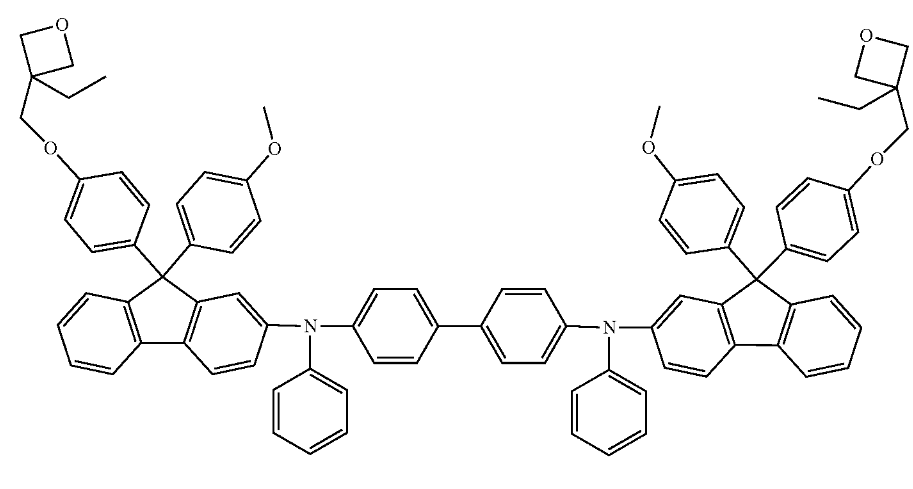

-continued
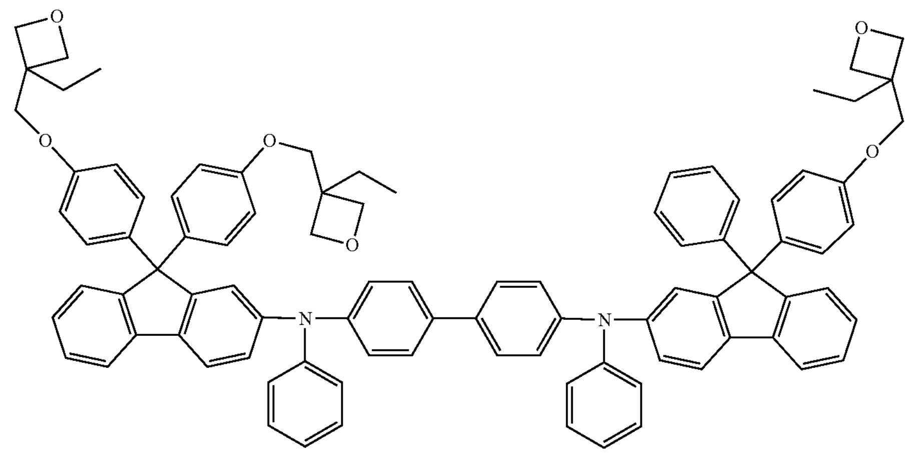
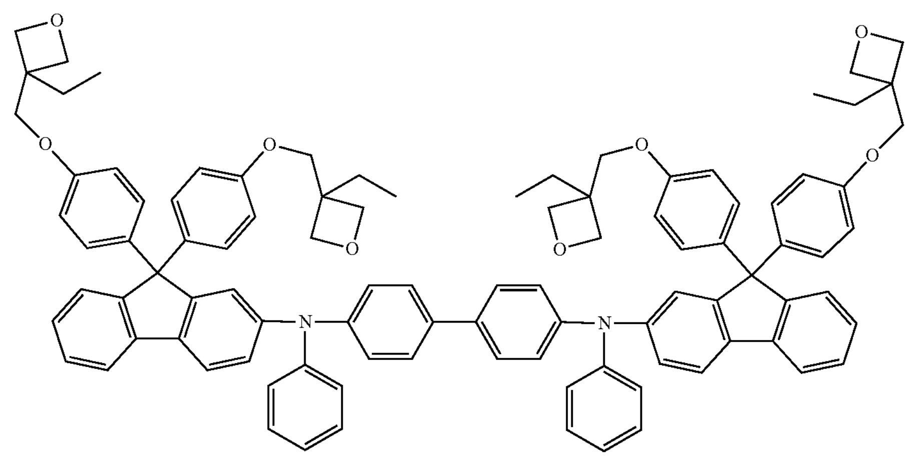
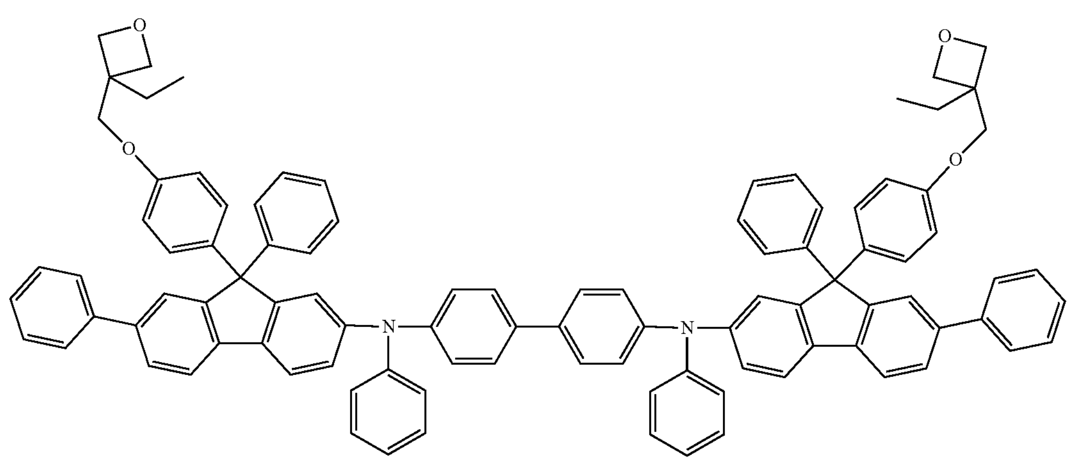

-continued
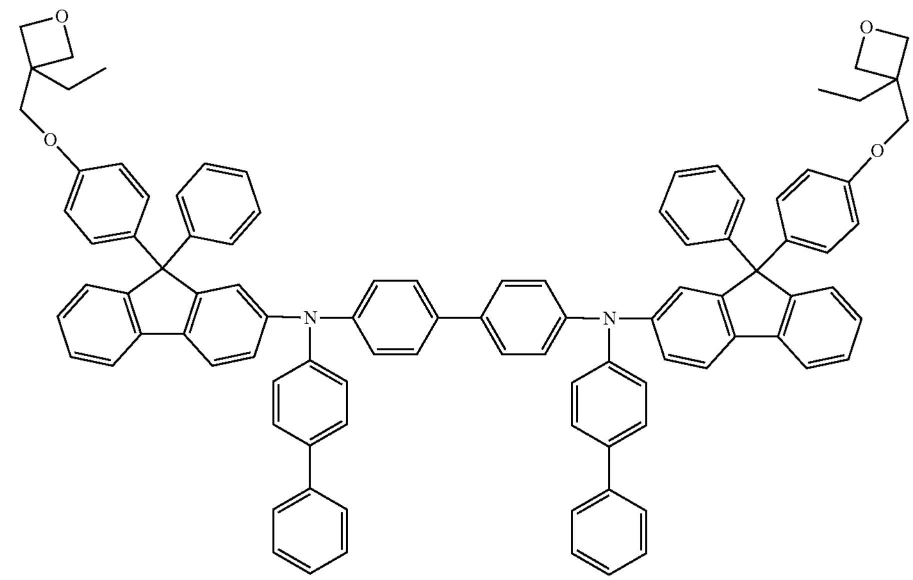
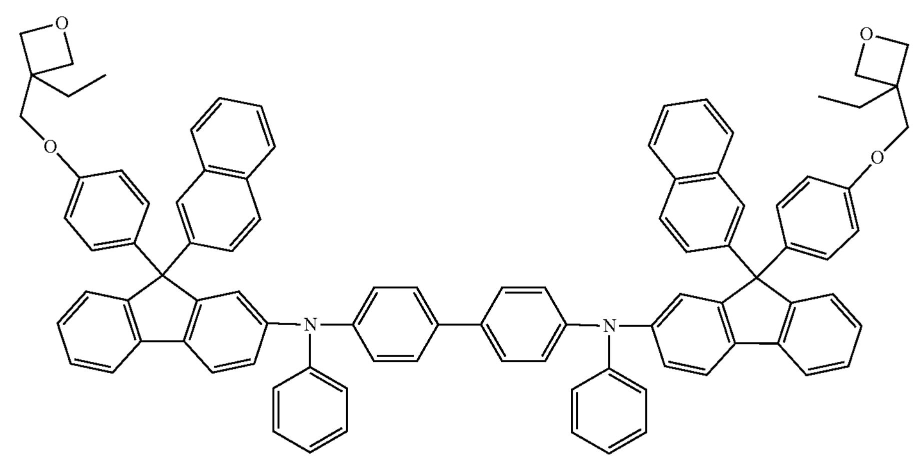
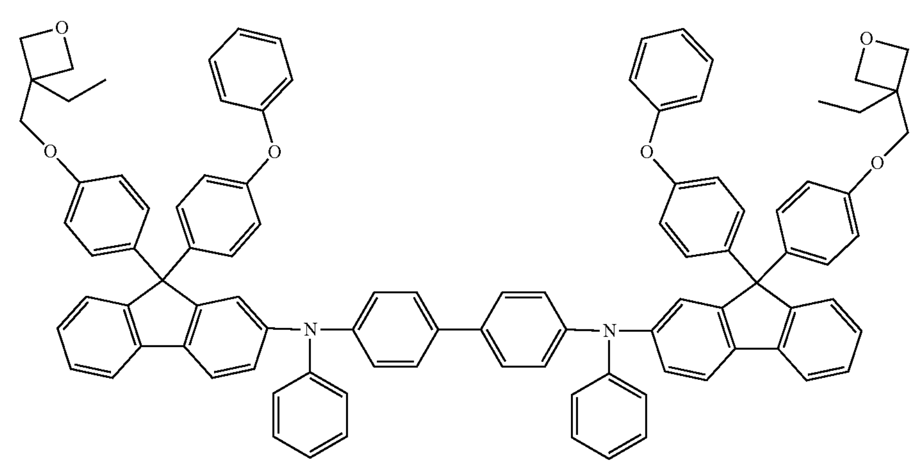

-continued
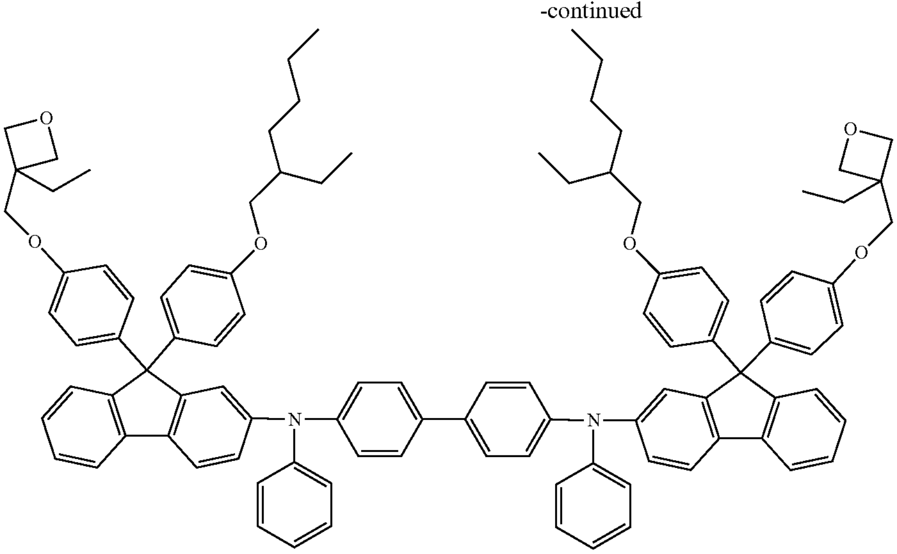
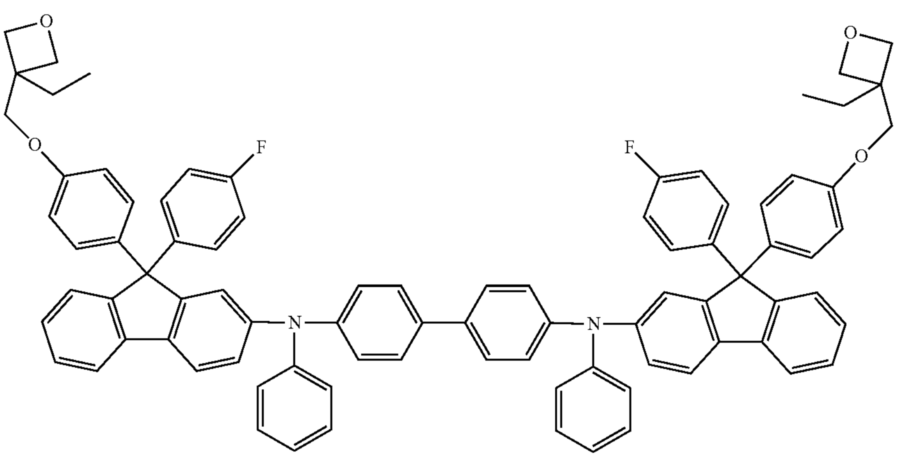
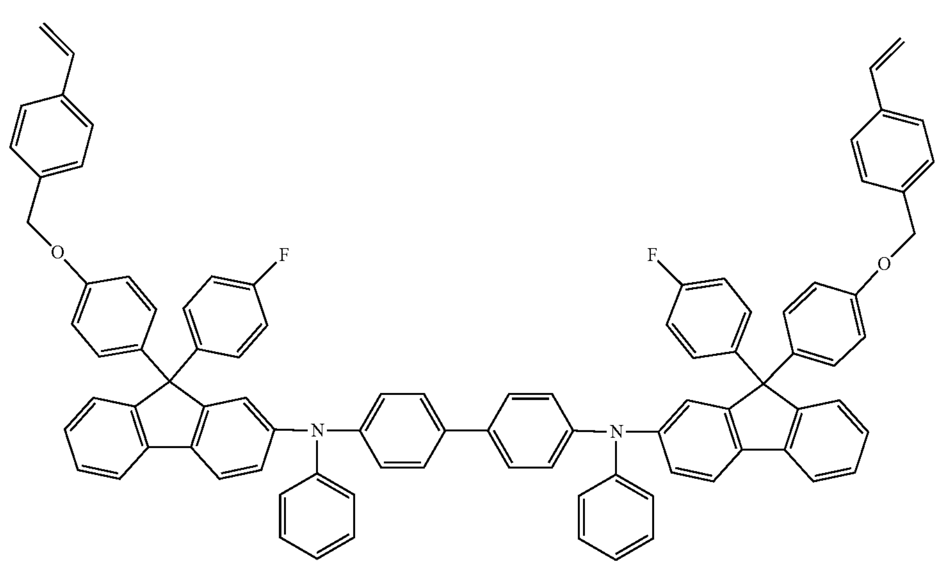

-continued
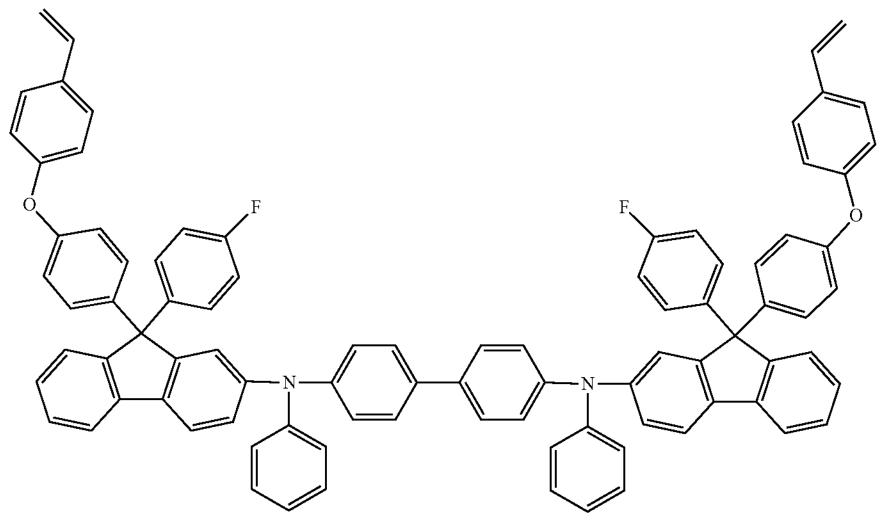
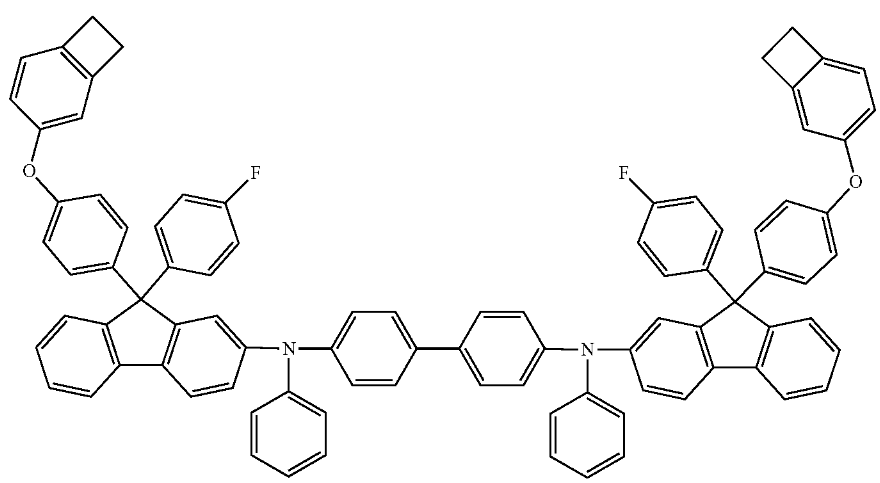
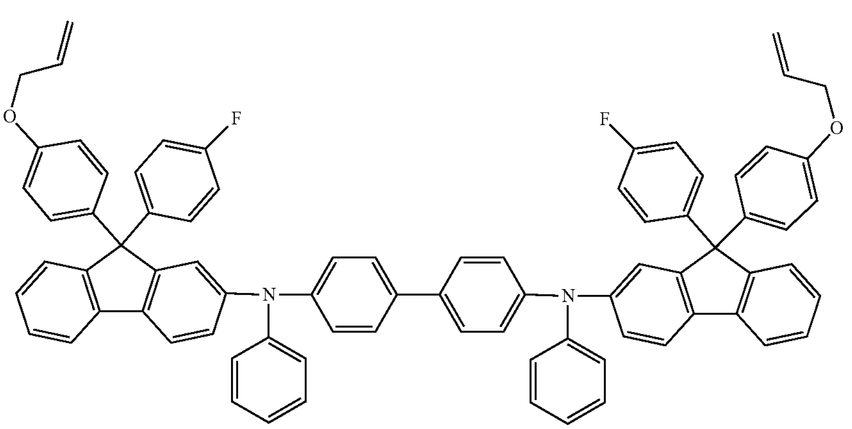

-continued
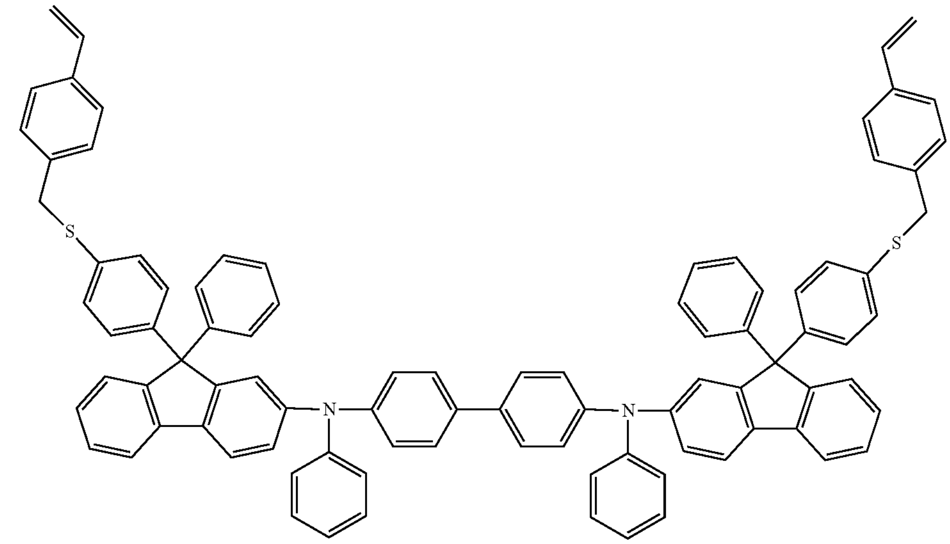
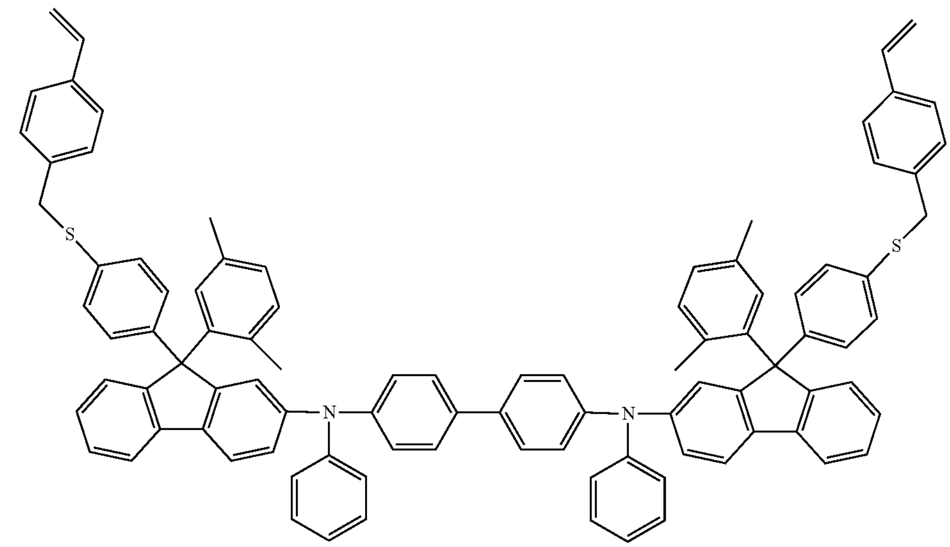
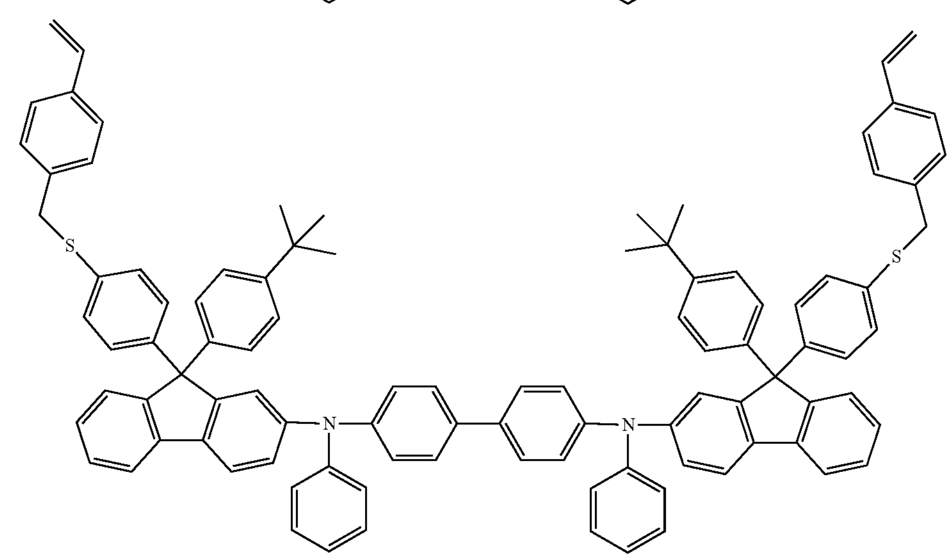

-continued
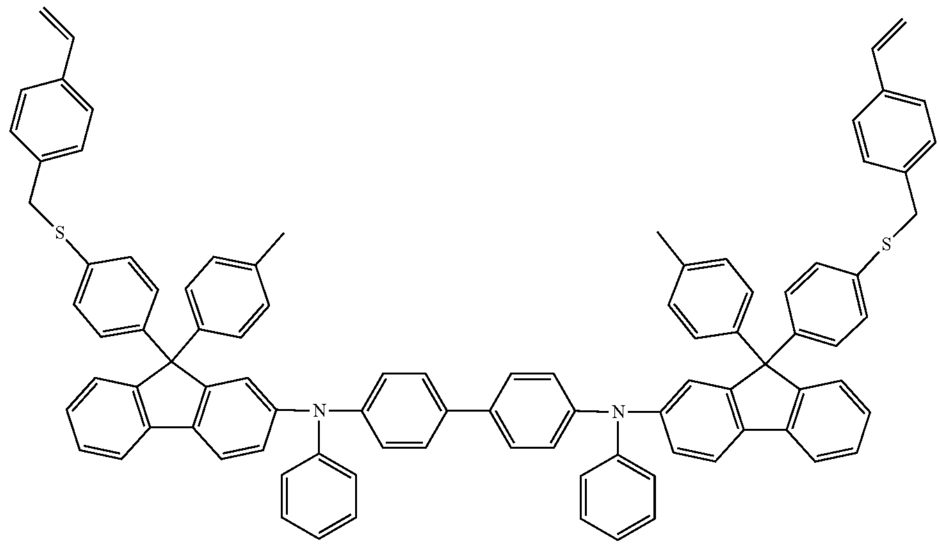
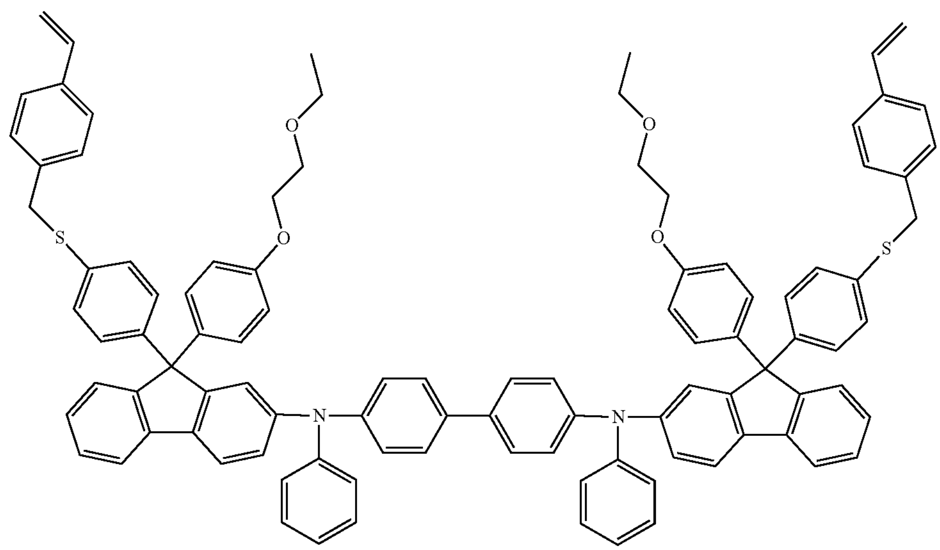
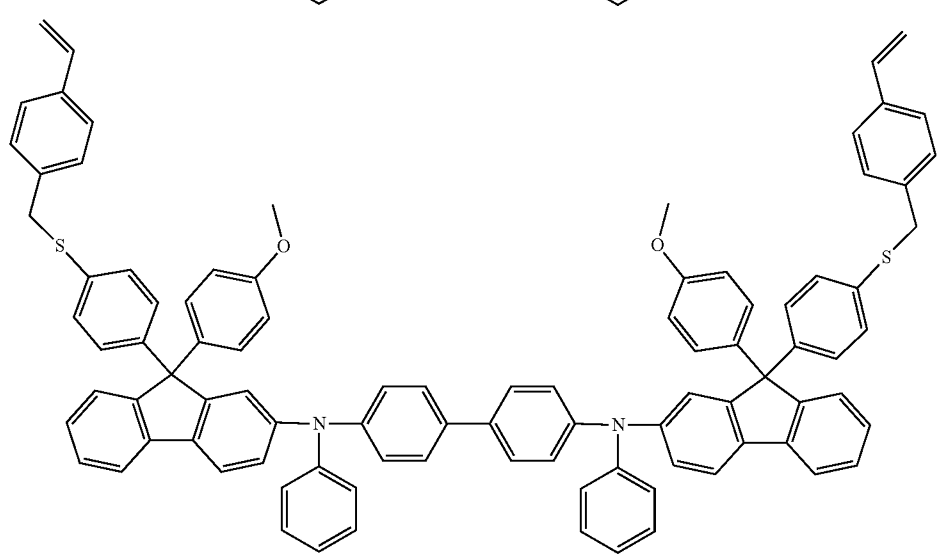

-continued
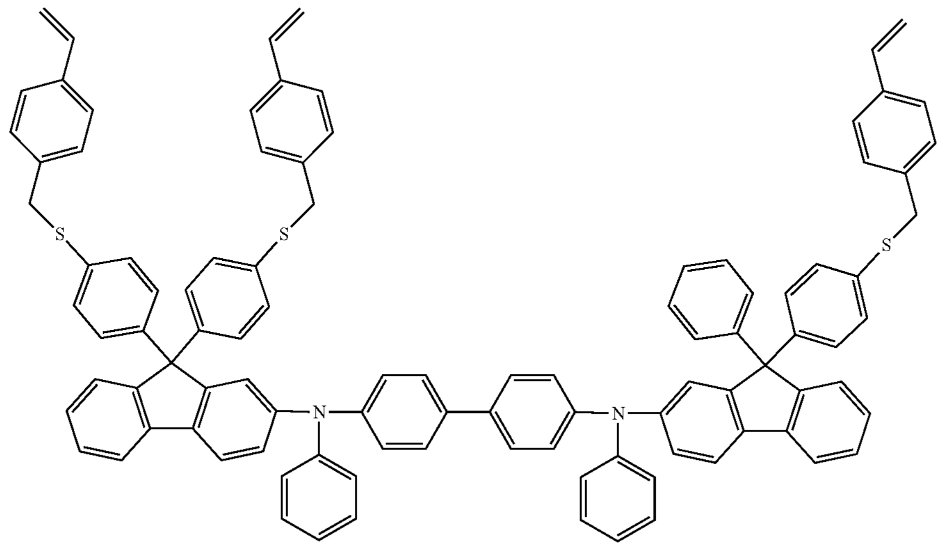
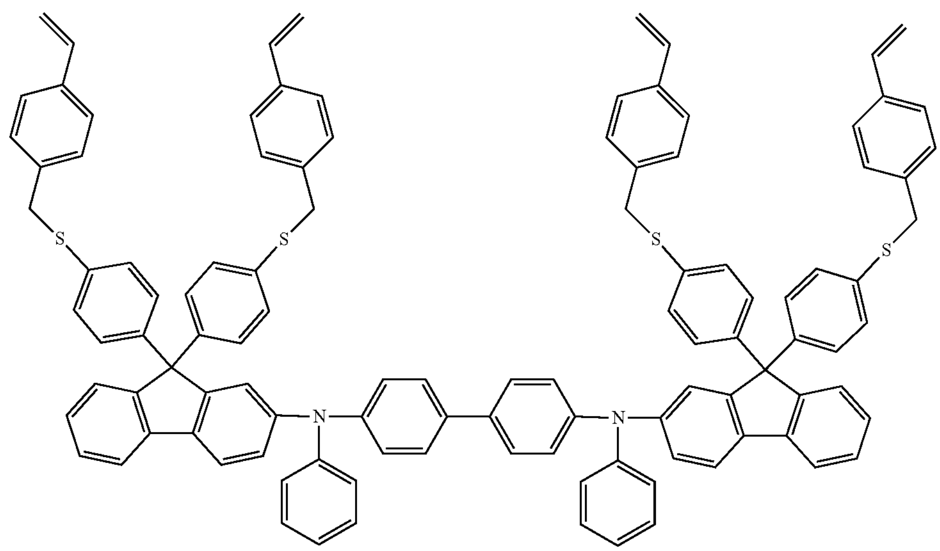
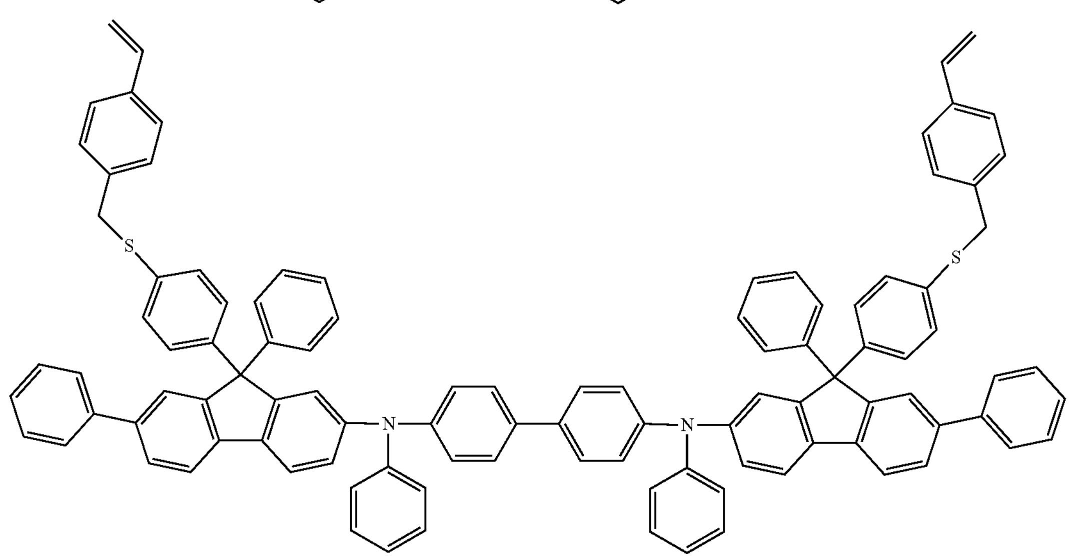

-continued
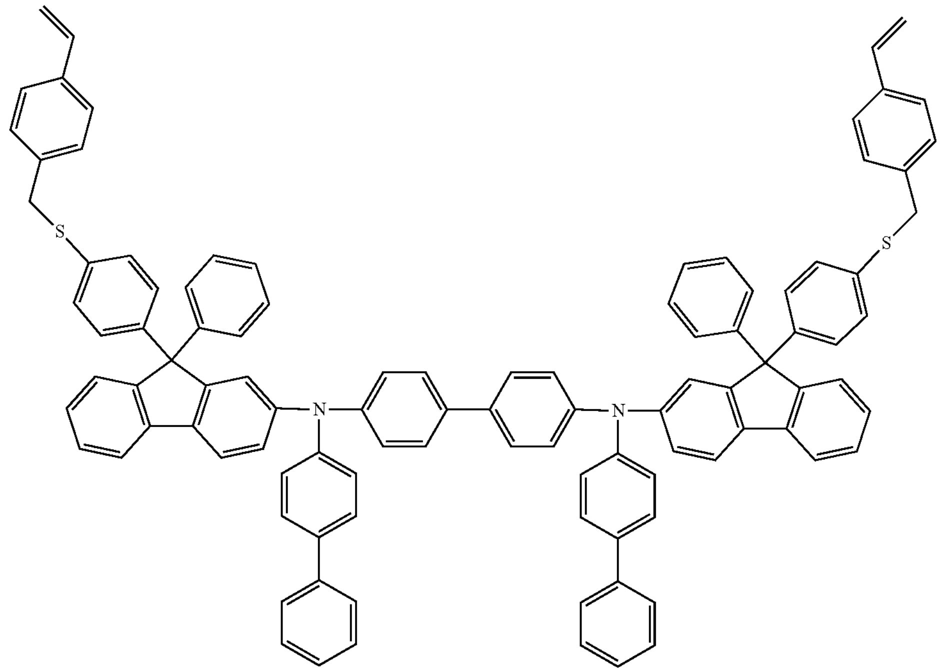
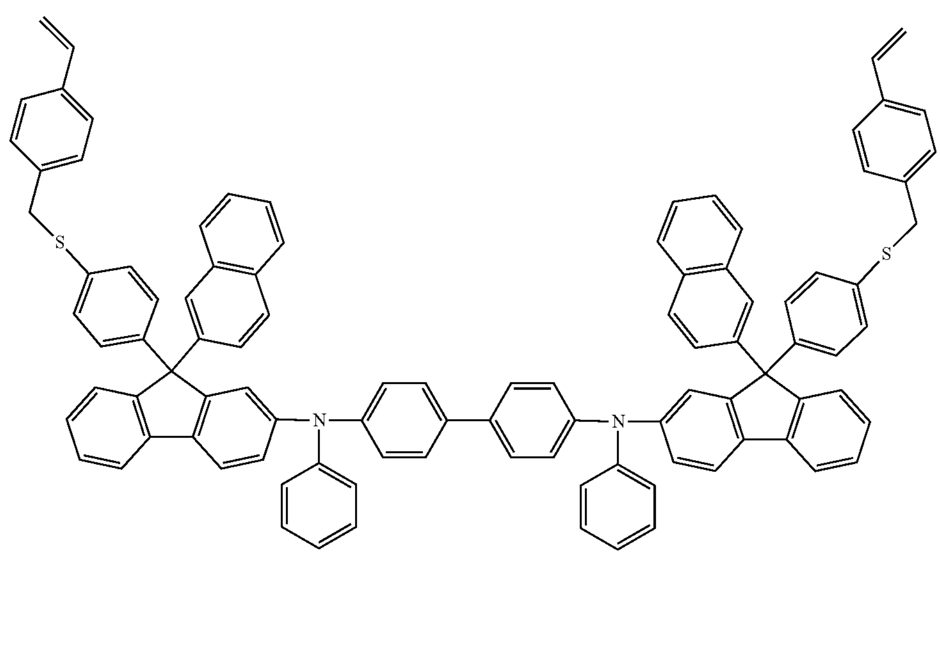

-continued
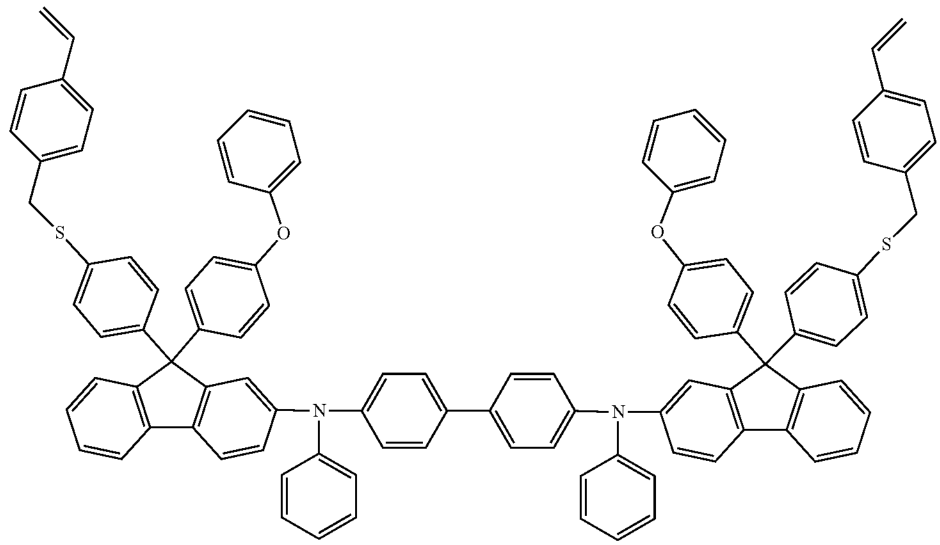
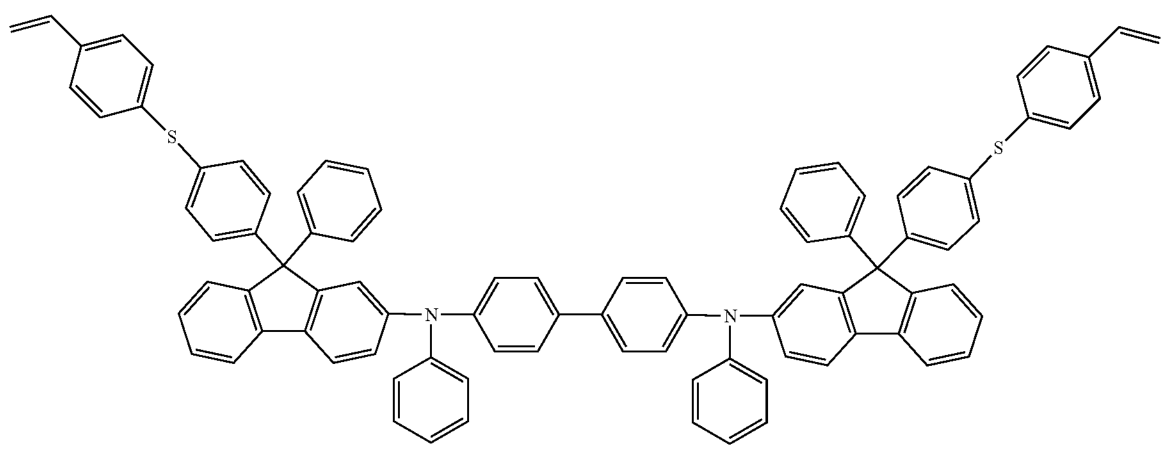
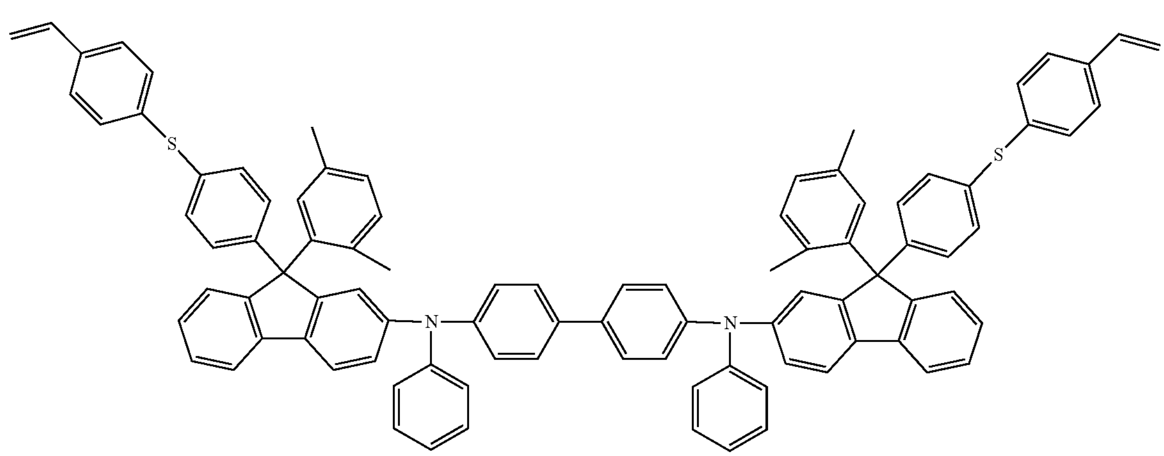

-continued
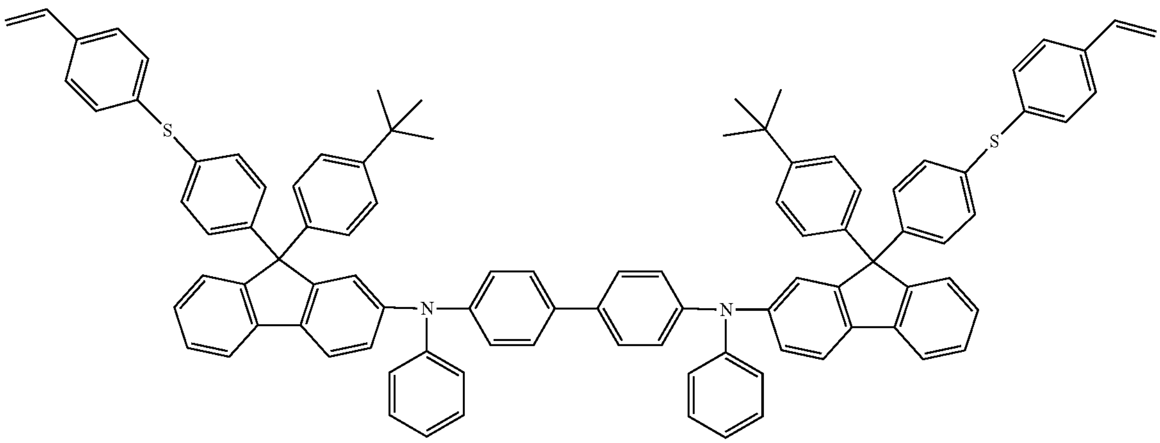
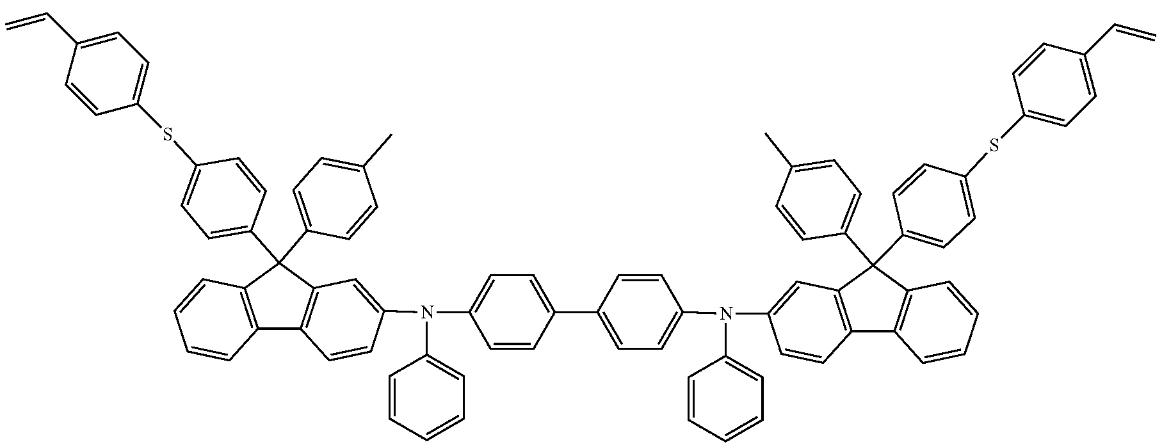
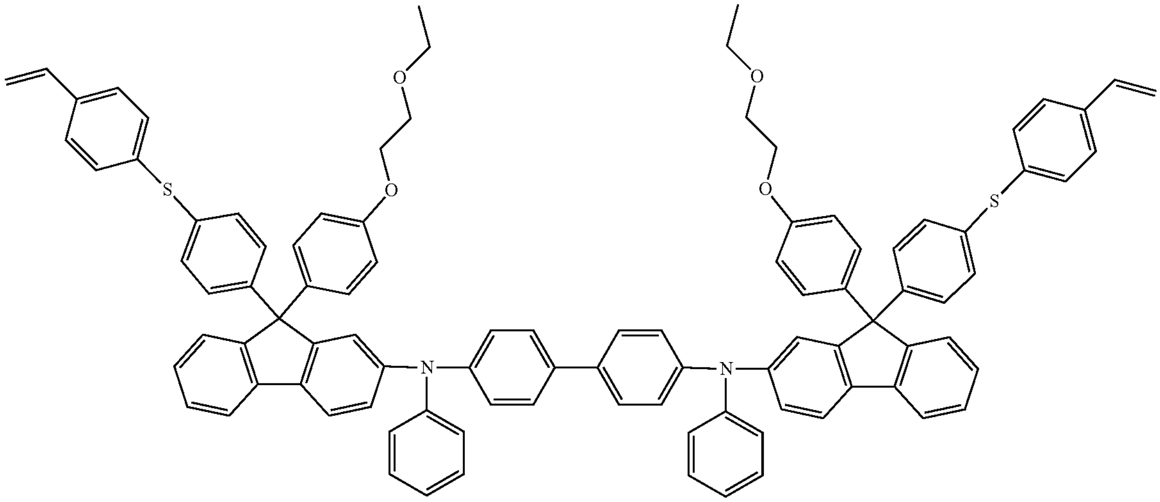

-continued
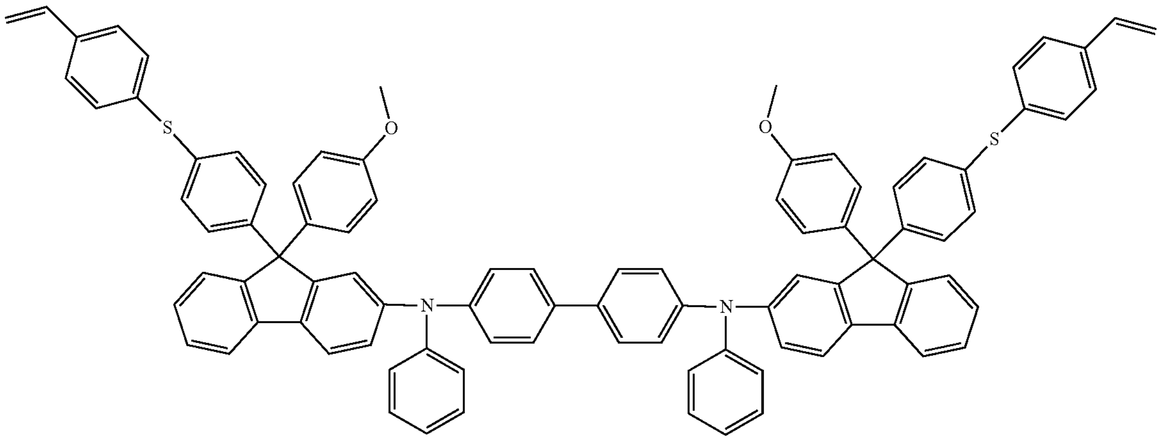
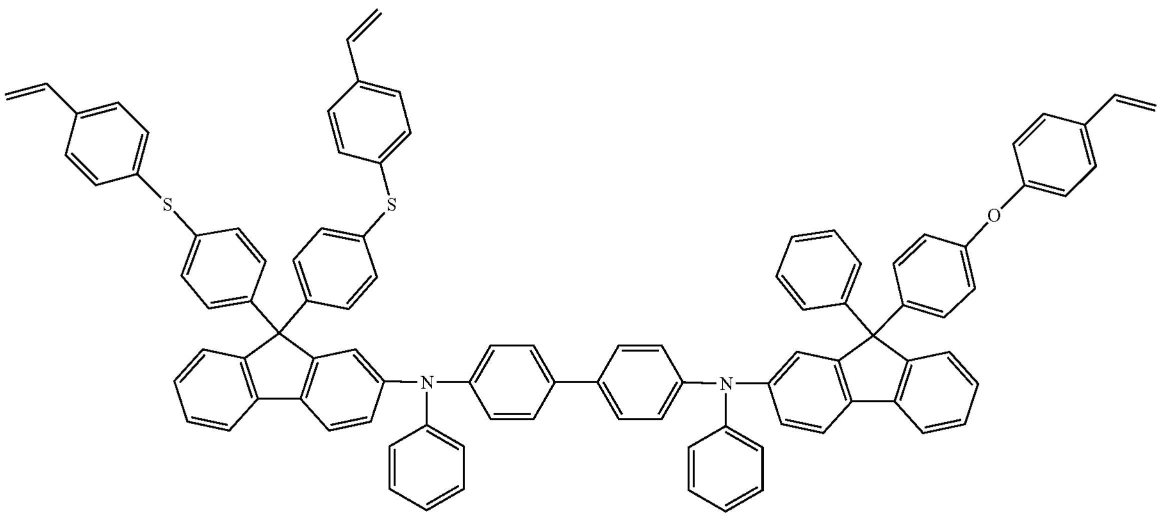
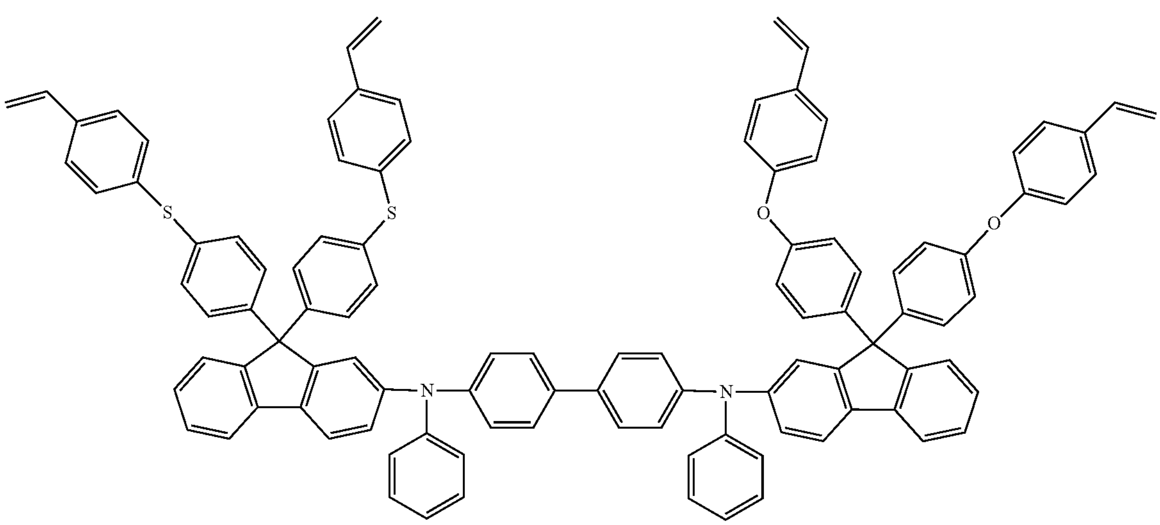

-continued
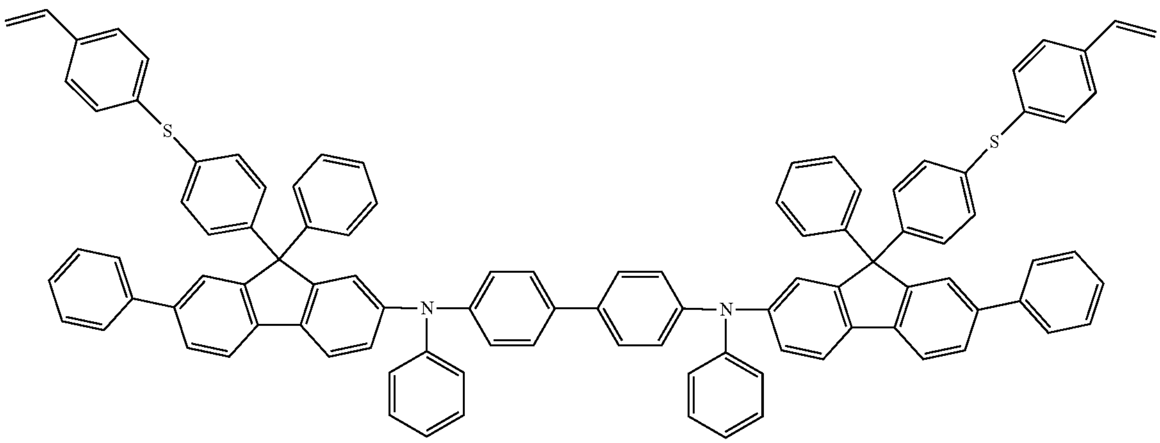
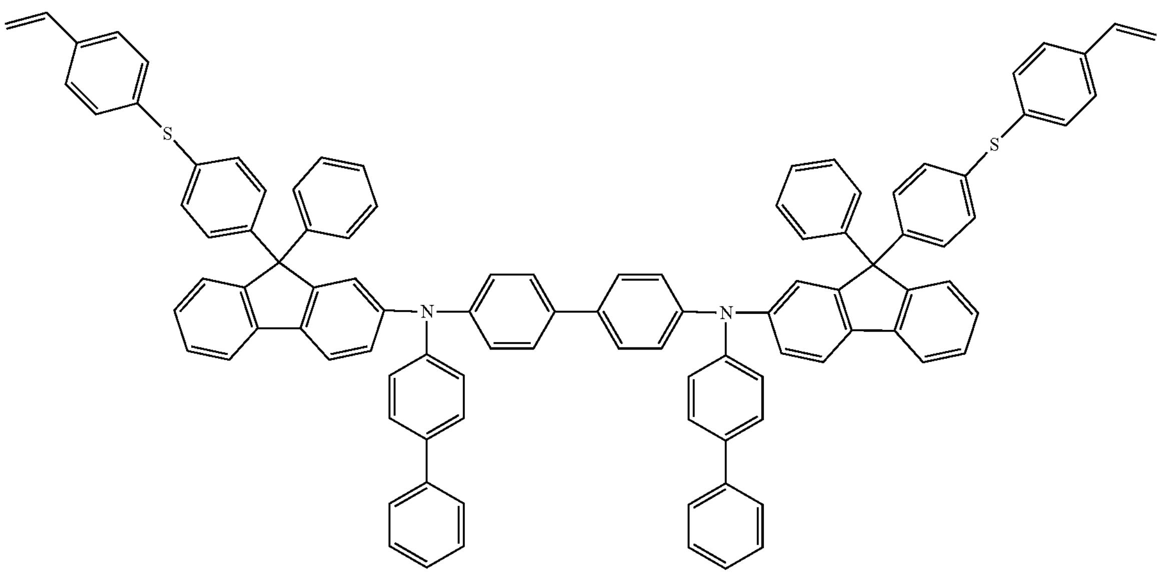
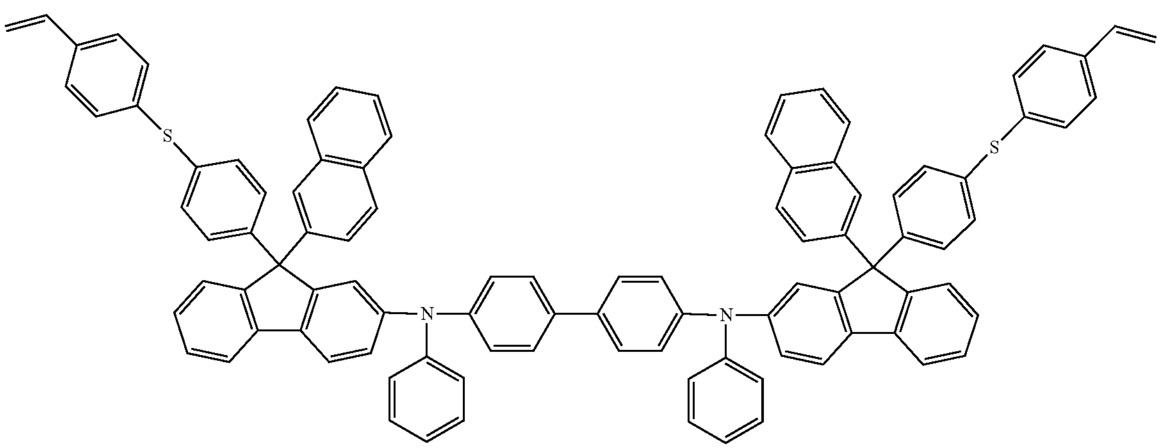

-continued
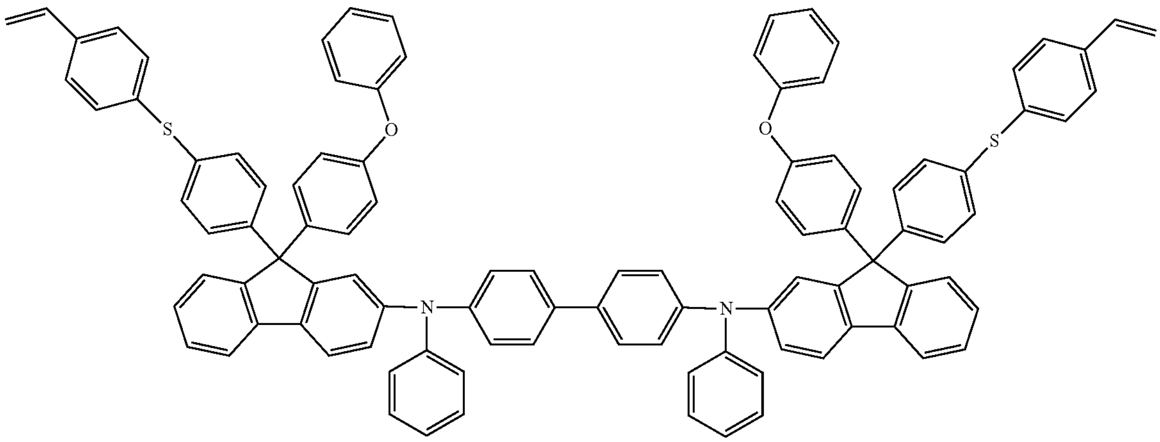
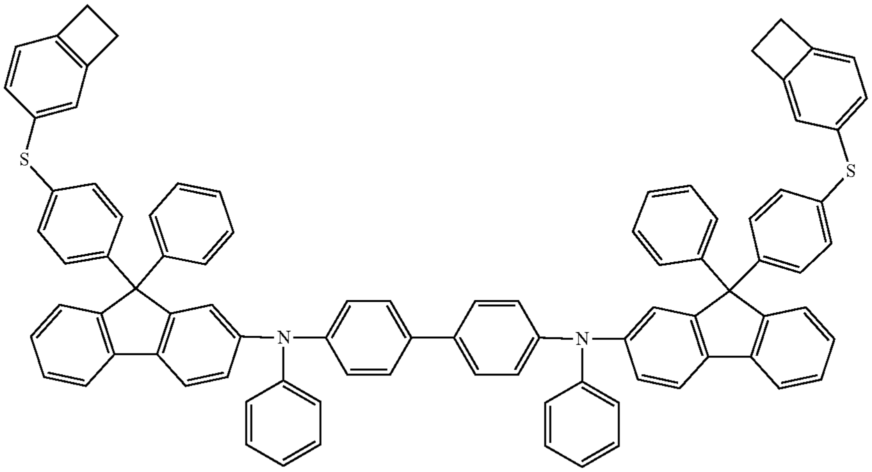
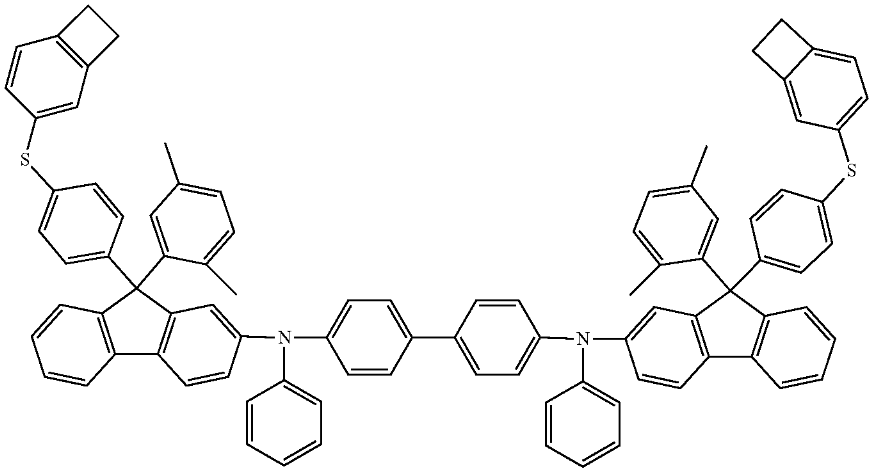

-continued
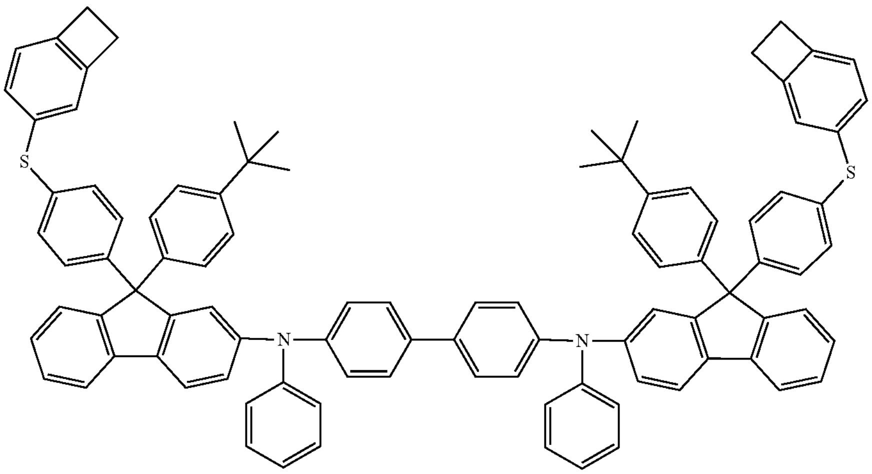
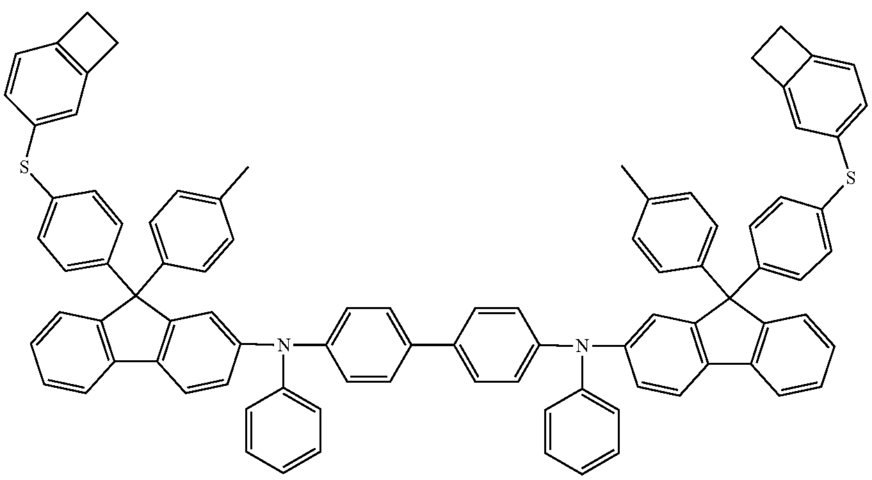
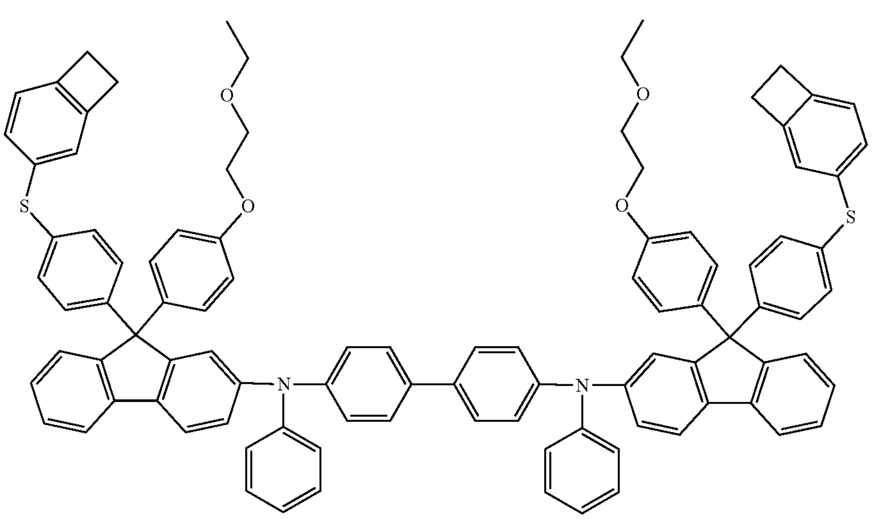

-continued
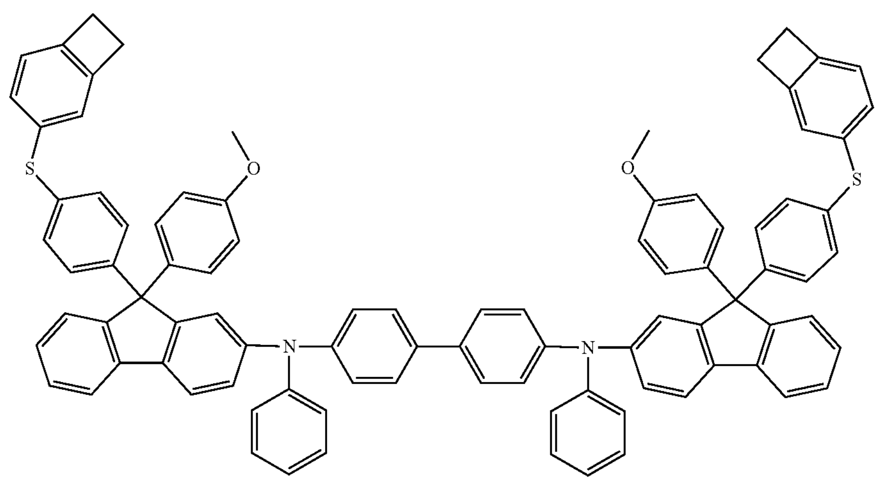
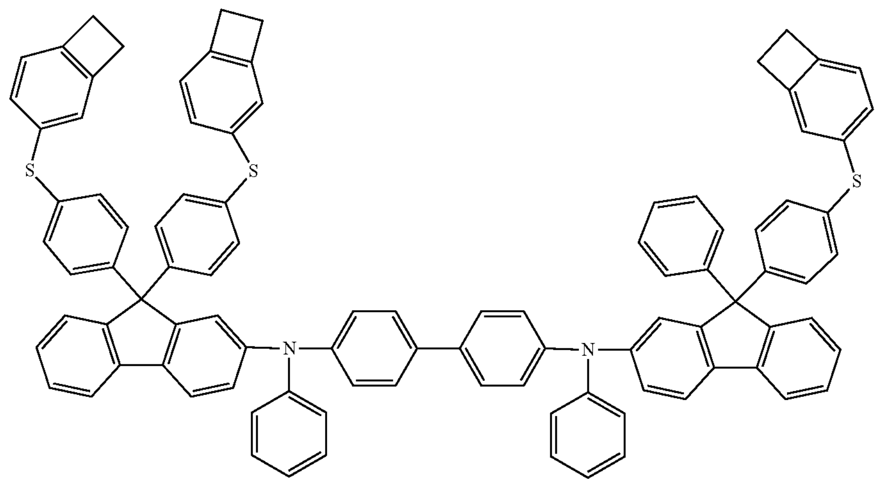
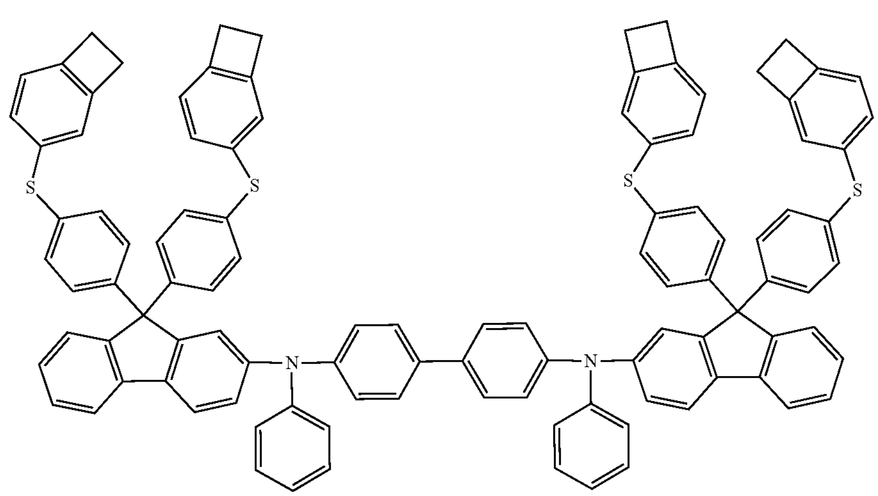

-continued
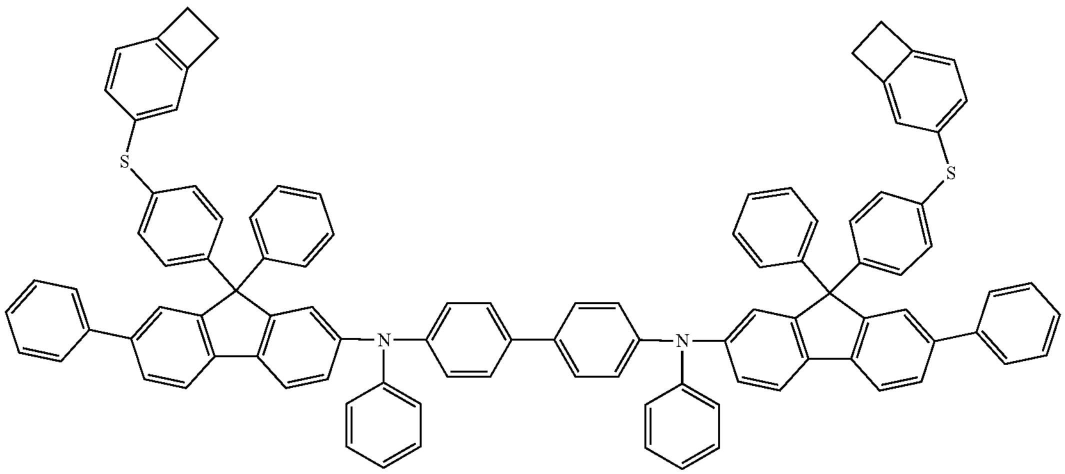
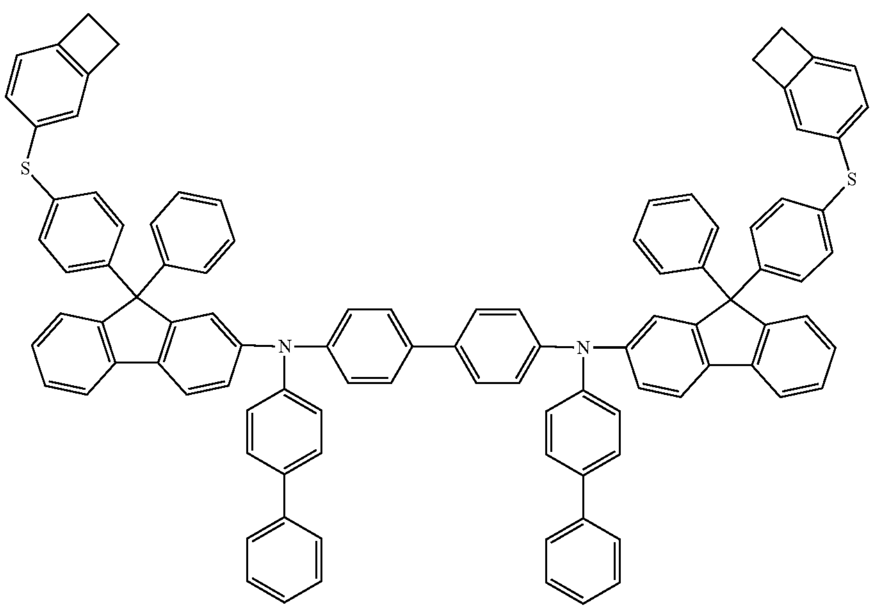
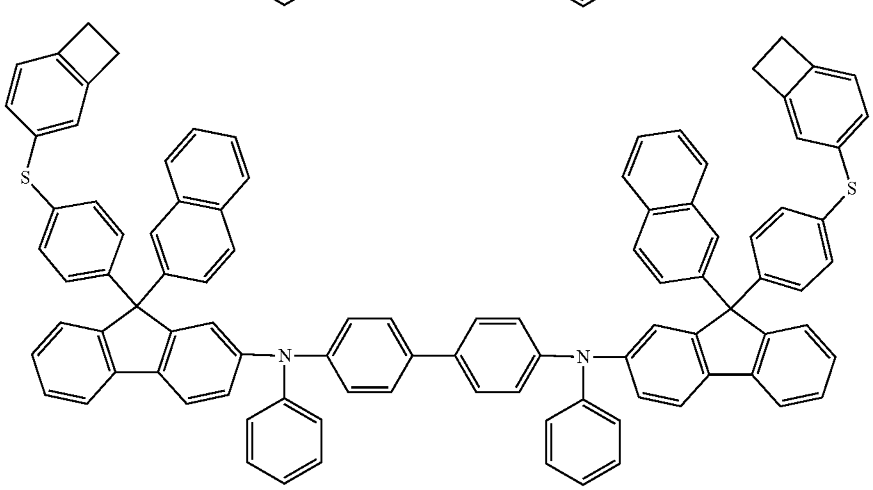

-continued
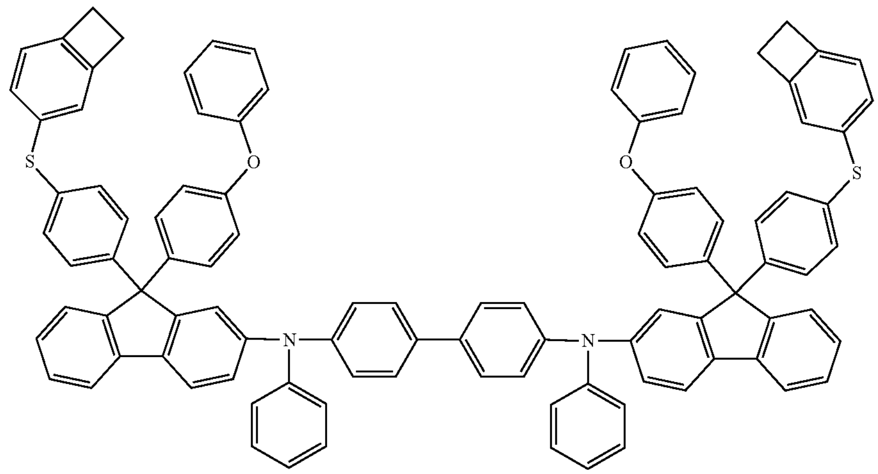
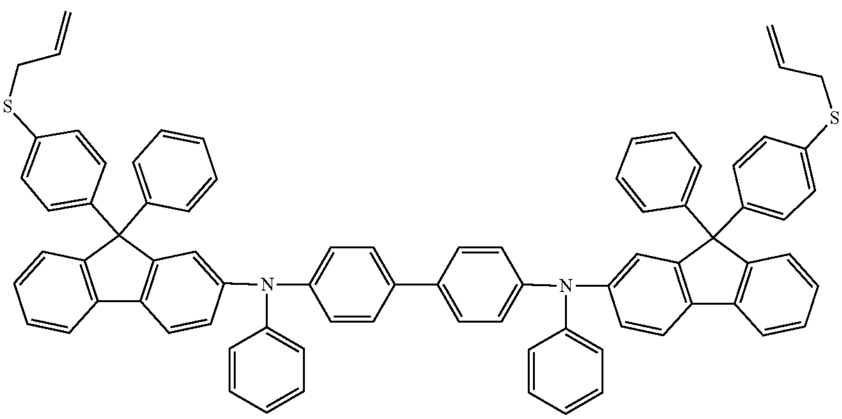
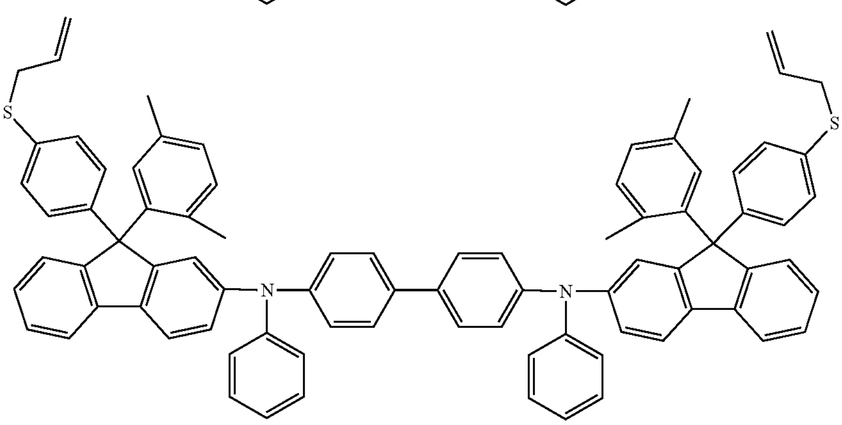
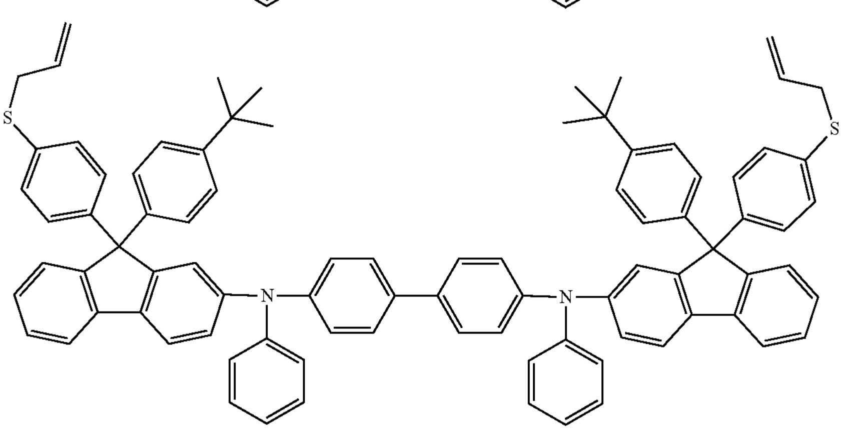

-continued
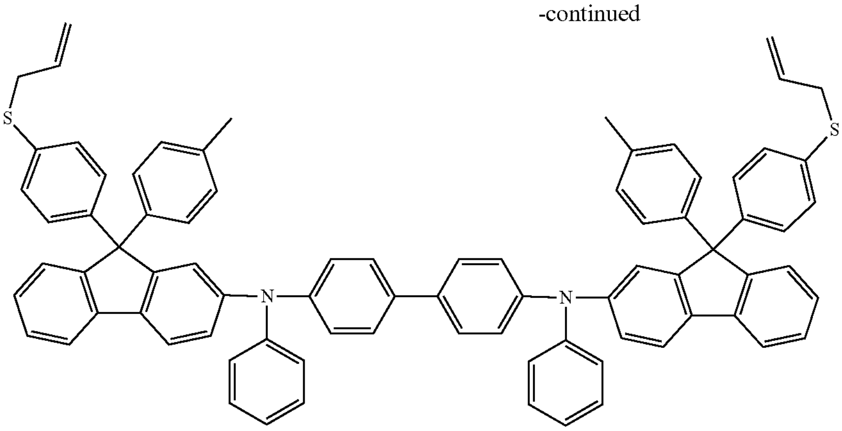
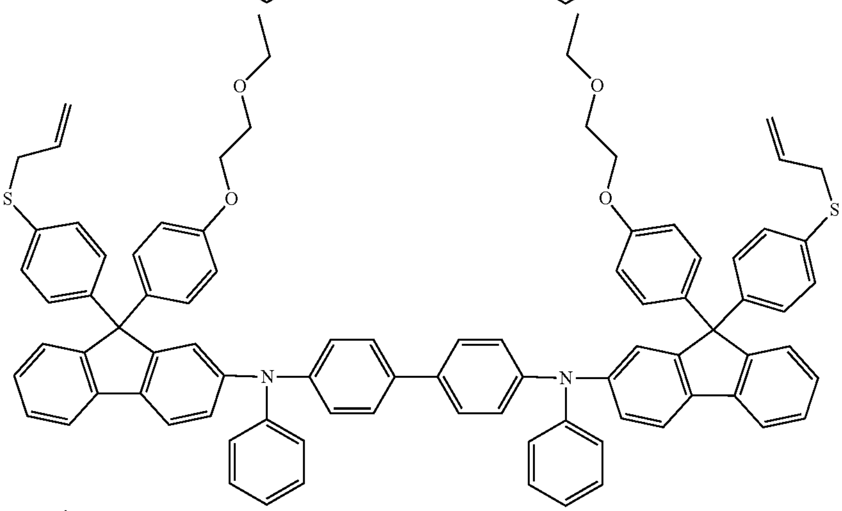
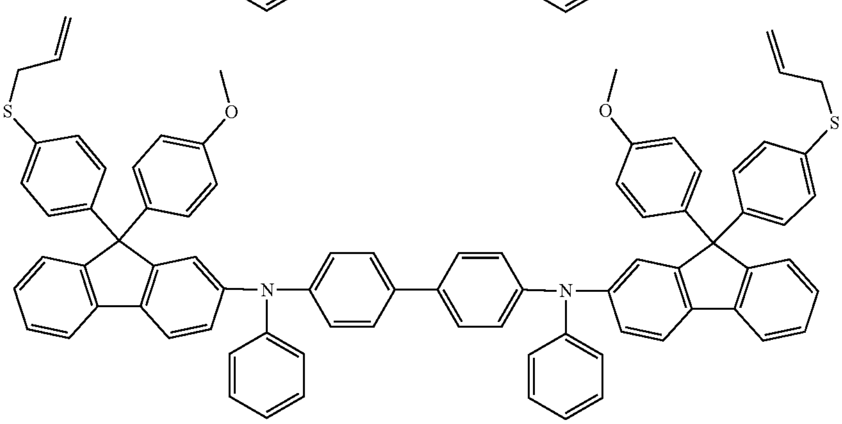
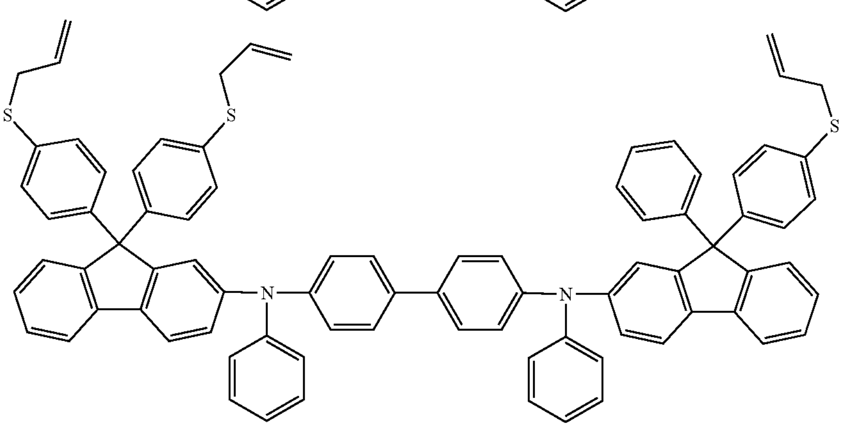

-continued
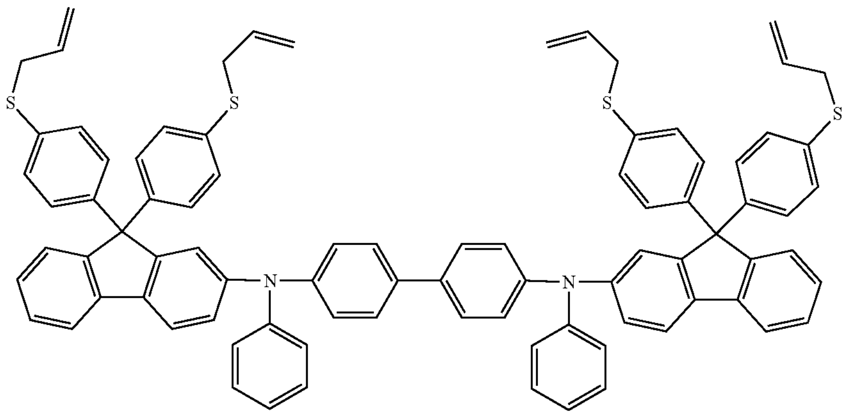
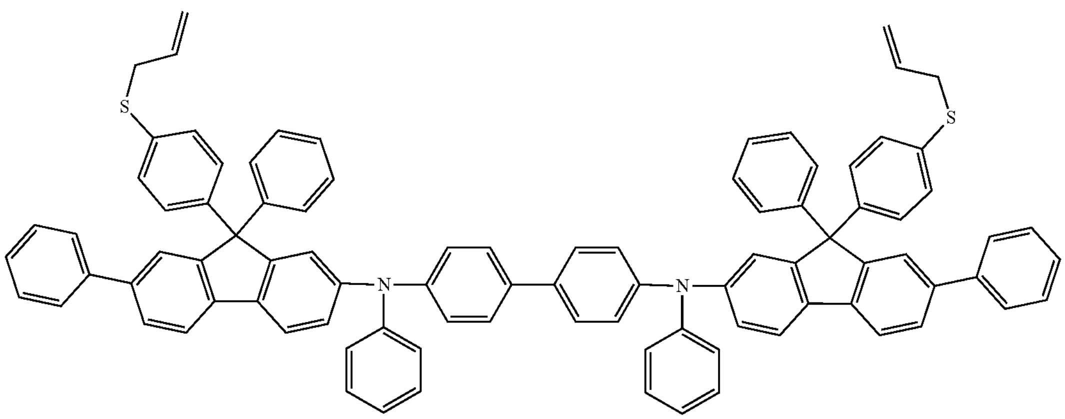
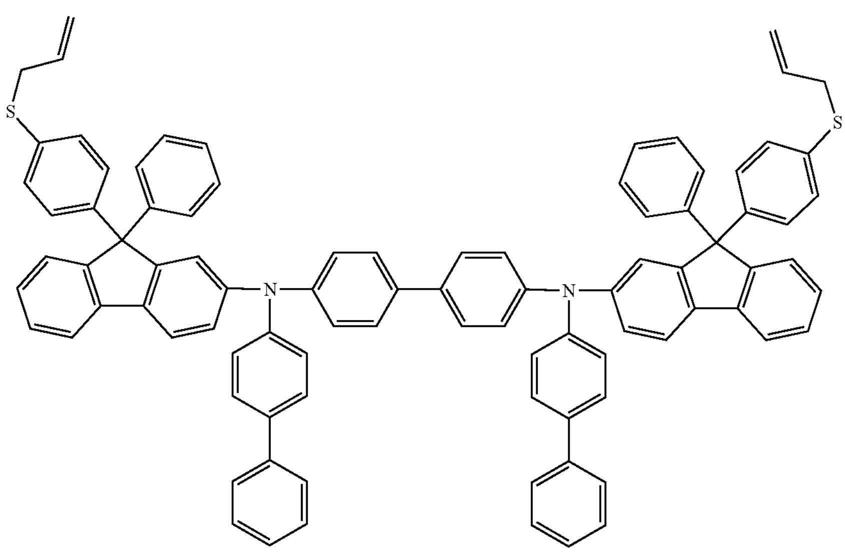

-continued
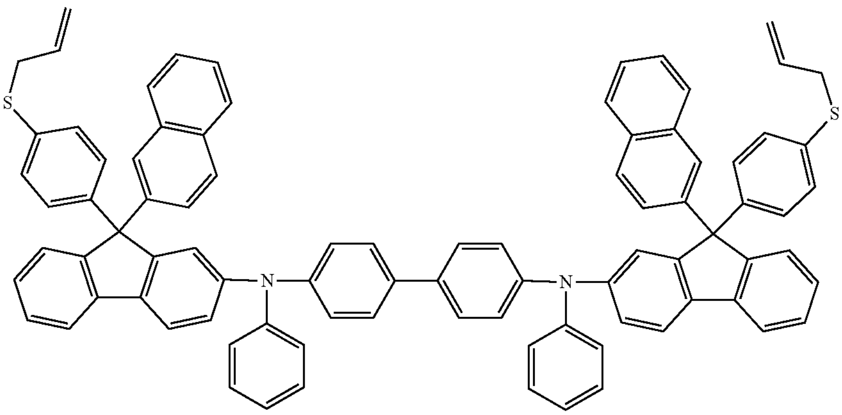
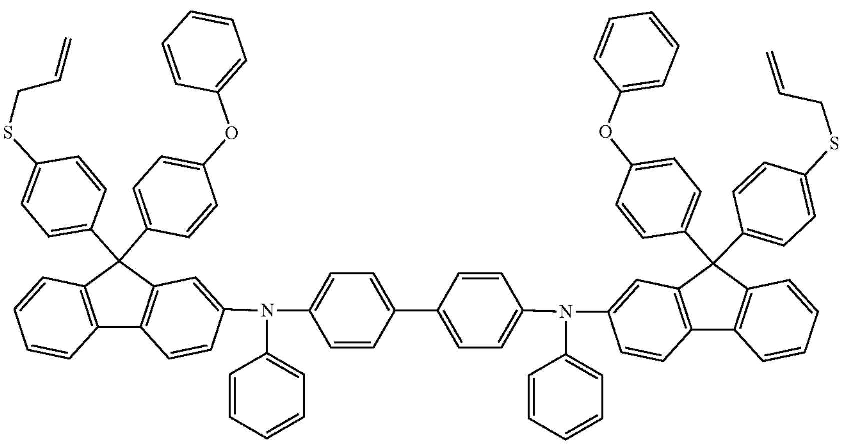
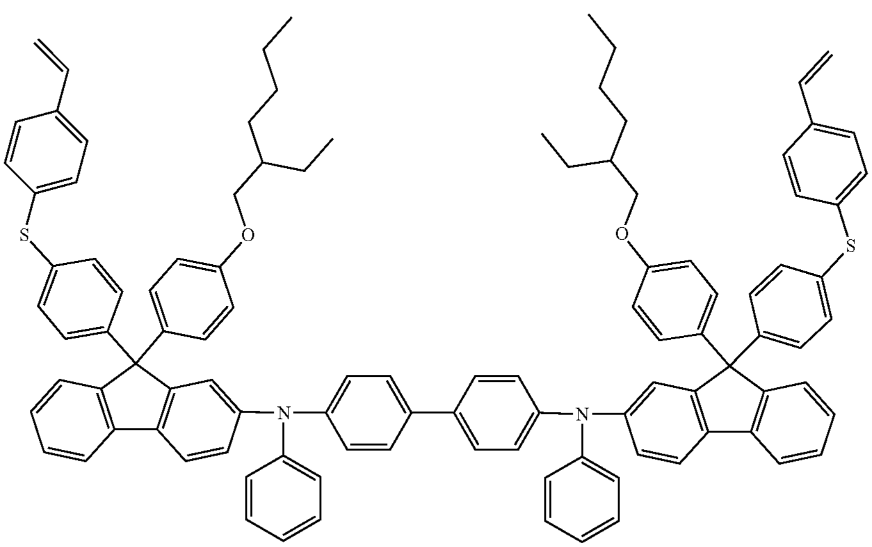

-continued
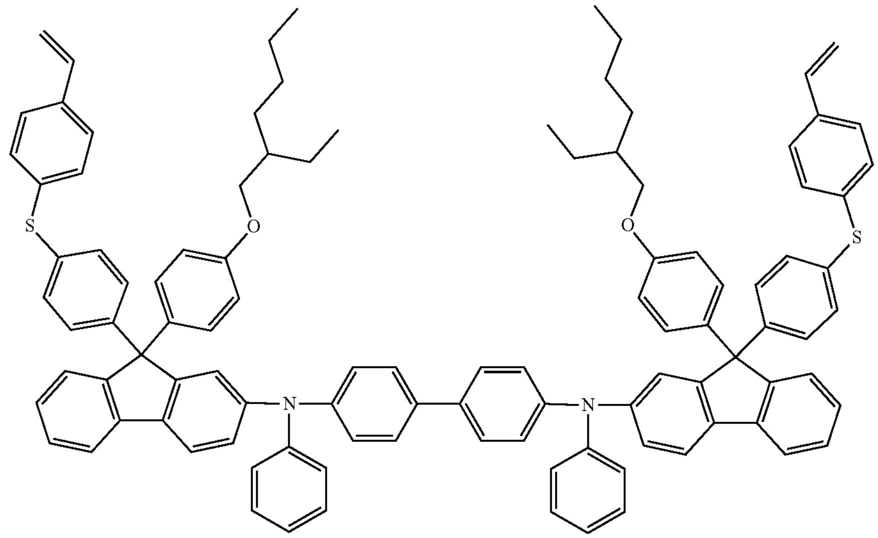
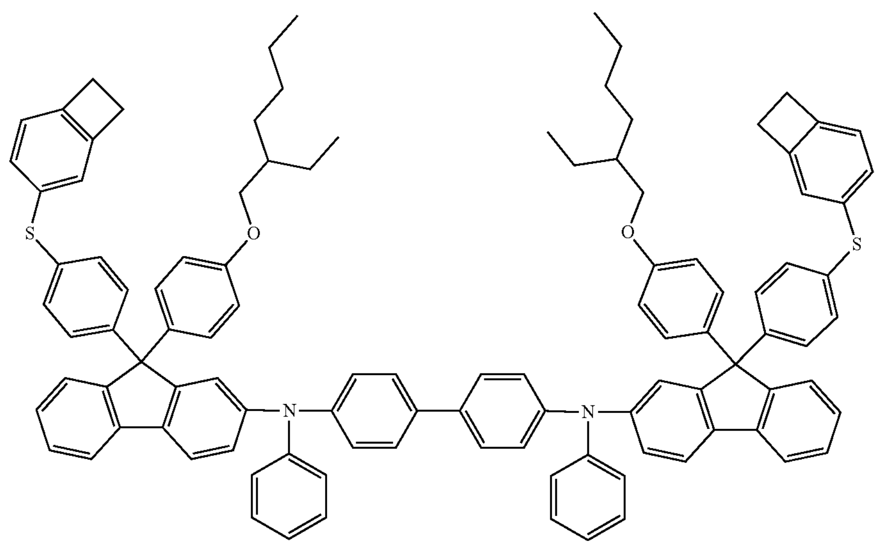
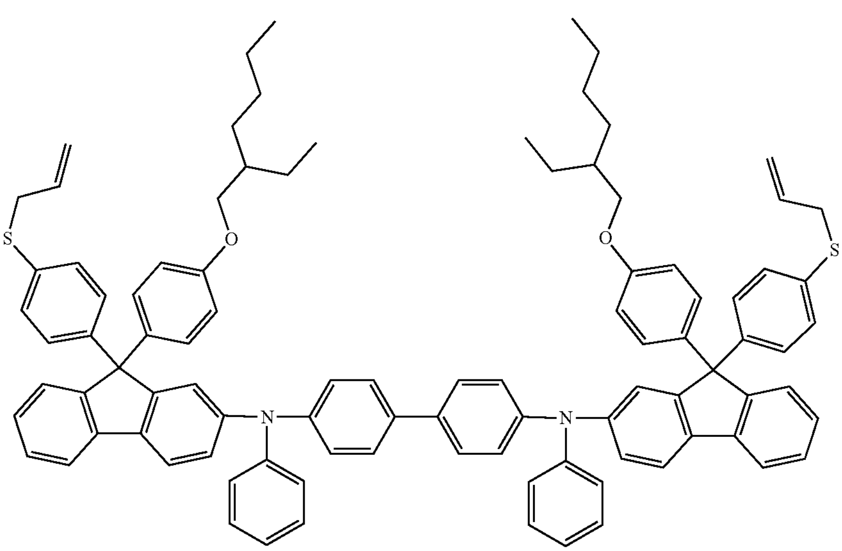

-continued
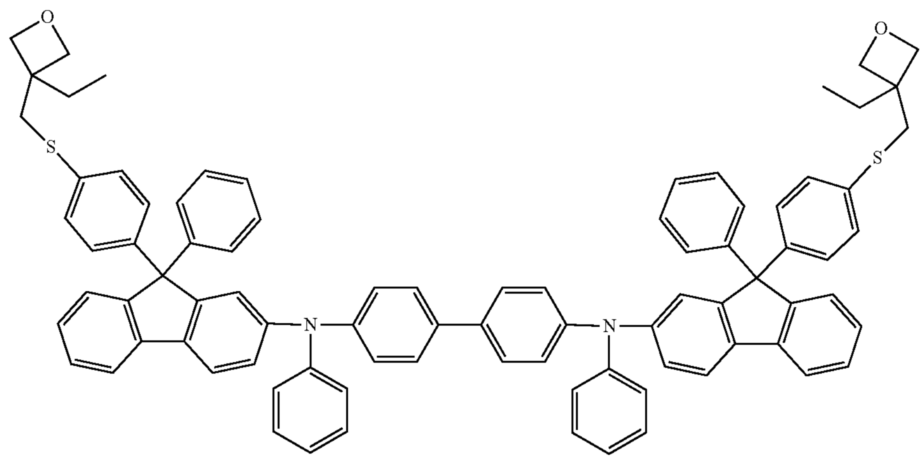
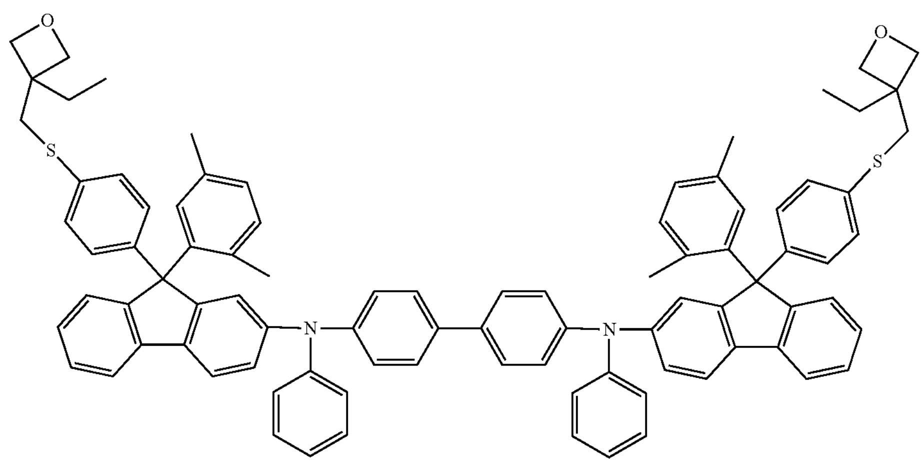
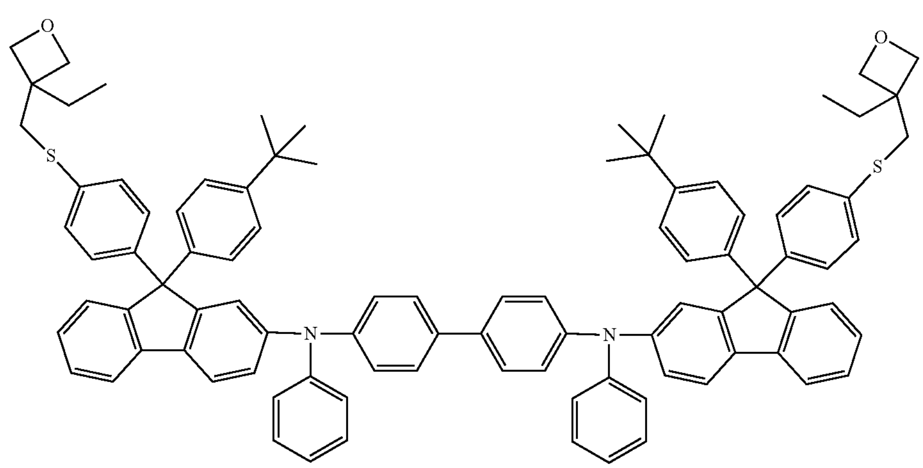

-continued
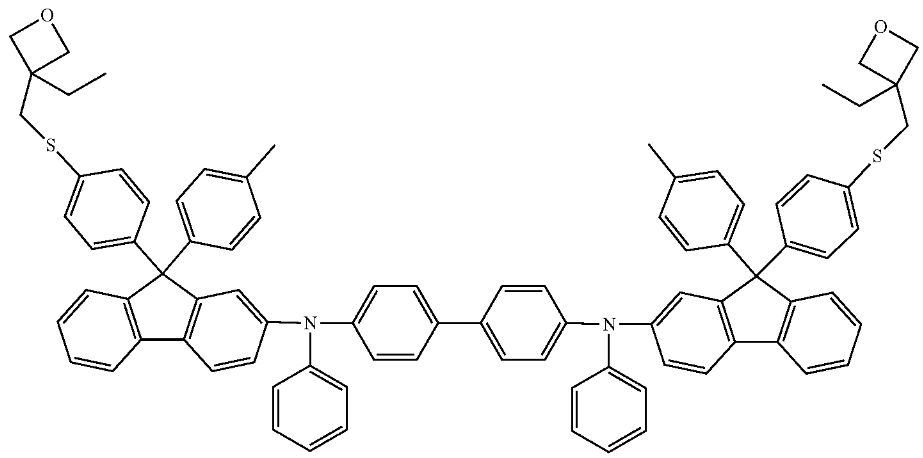
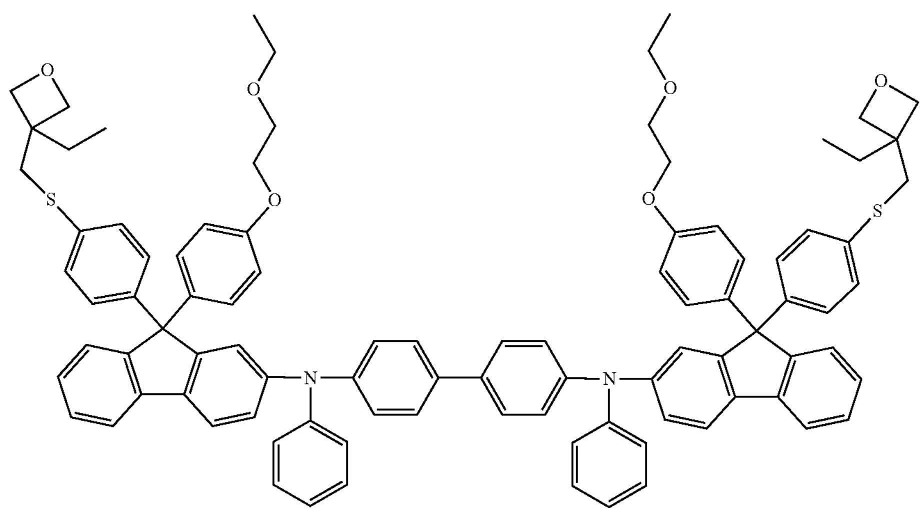
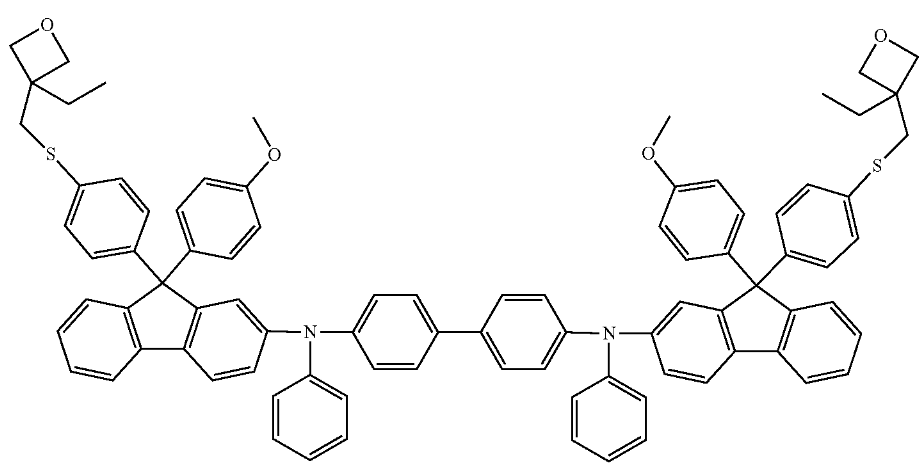

-continued
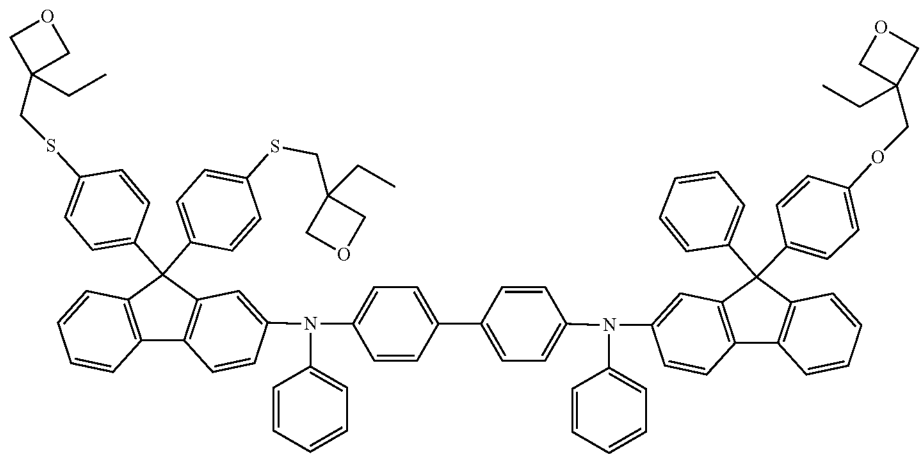
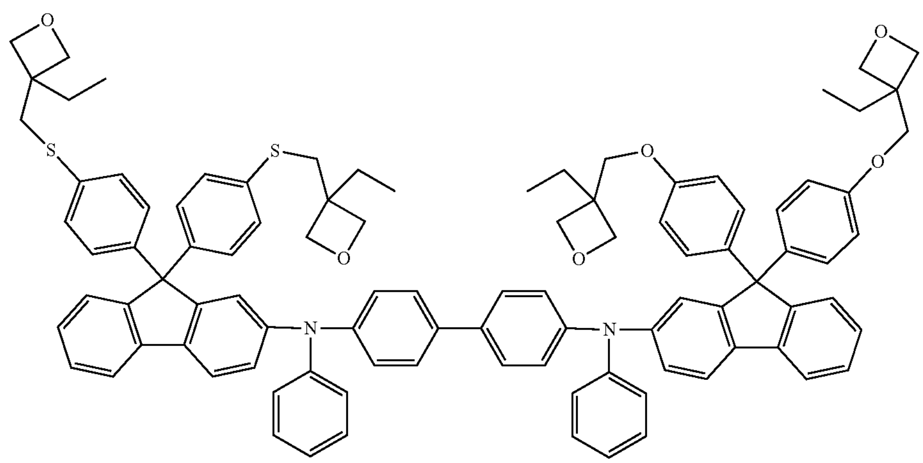
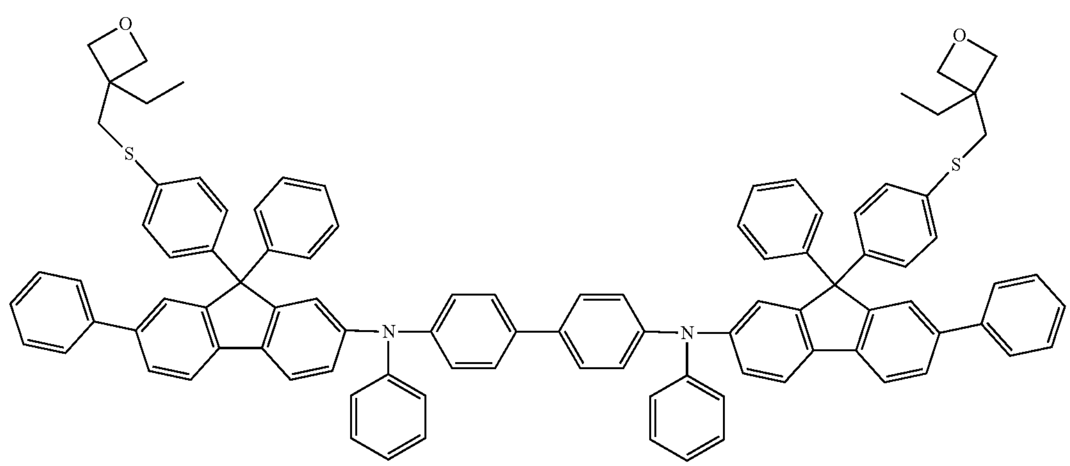

-continued
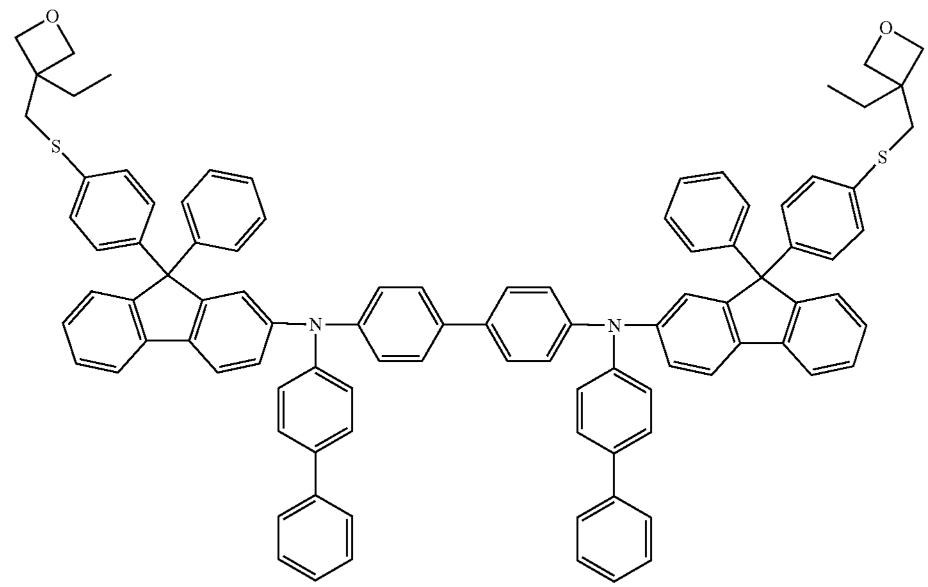
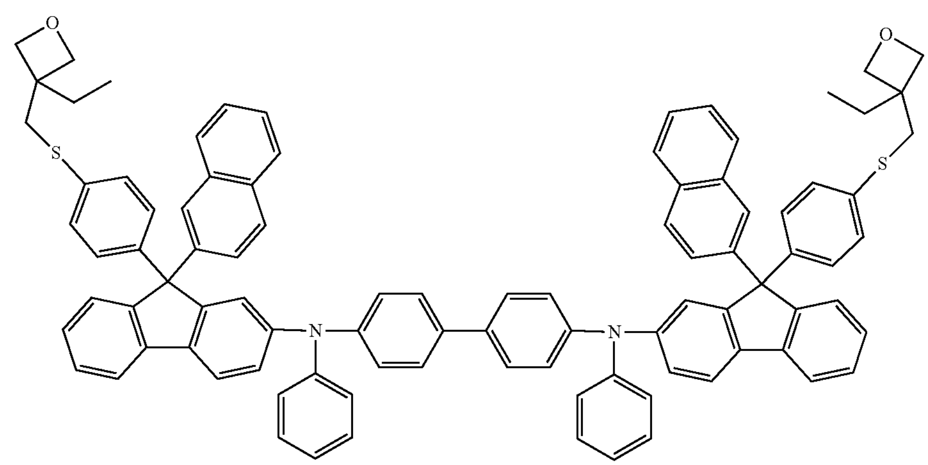
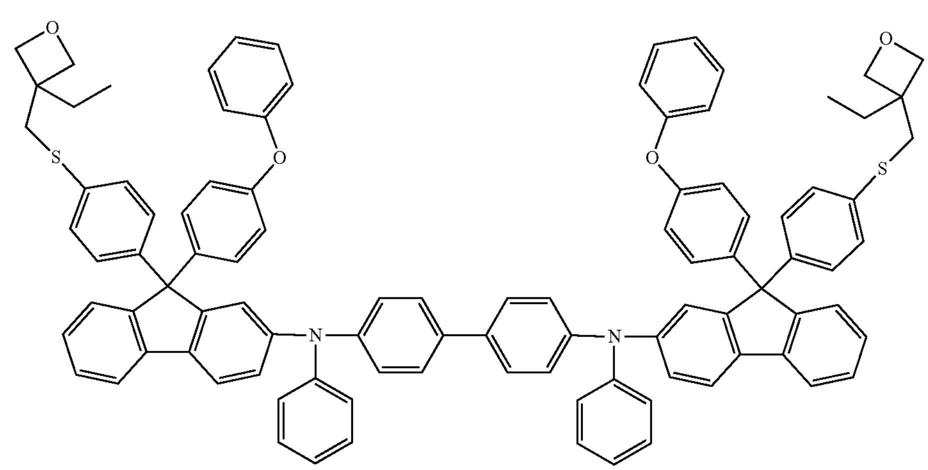

-continued
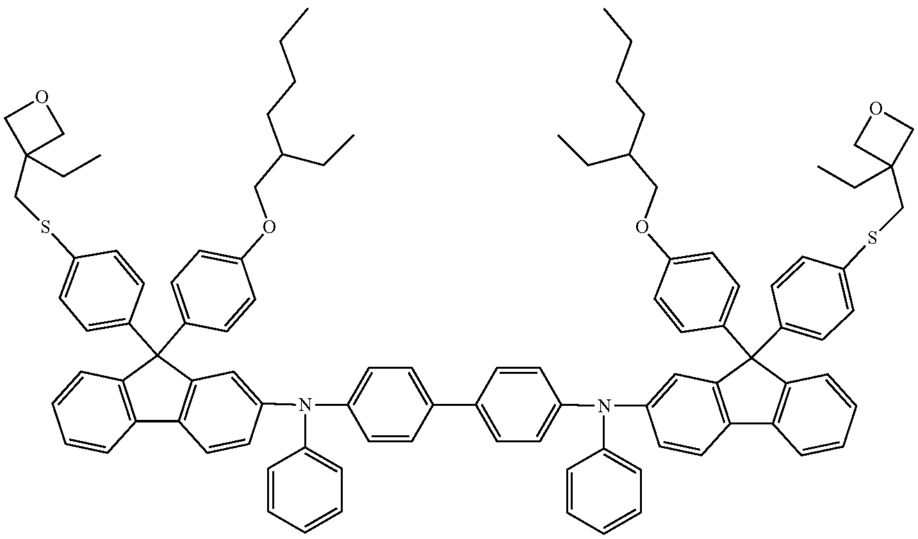
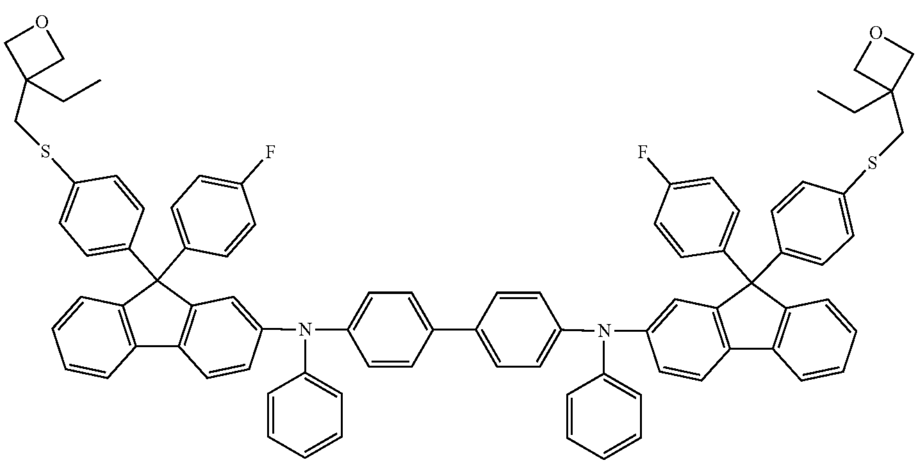
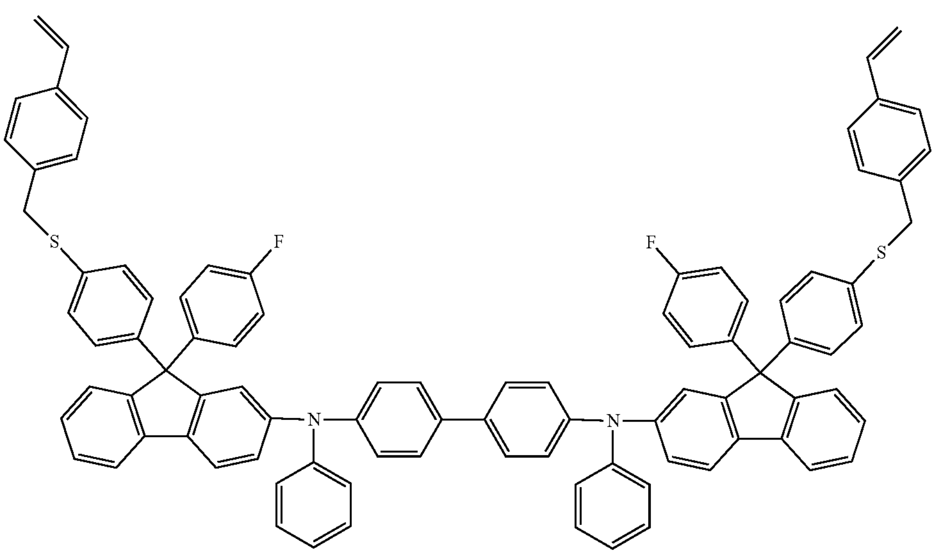

-continued
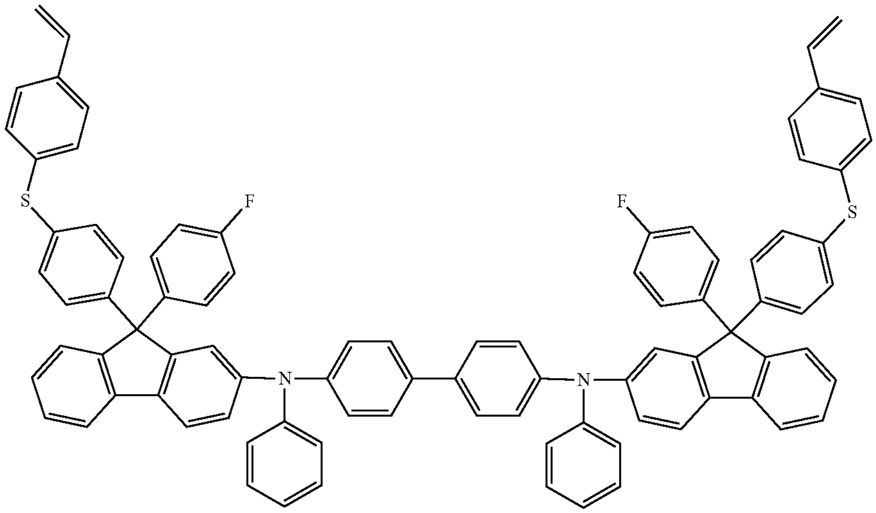
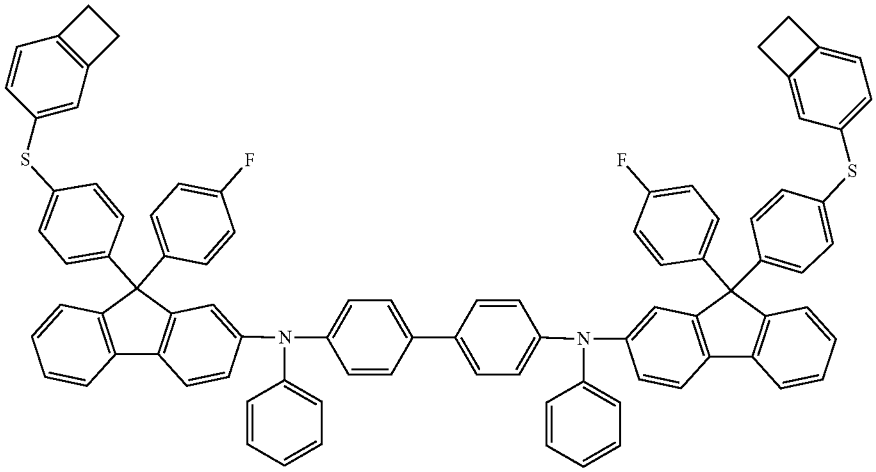
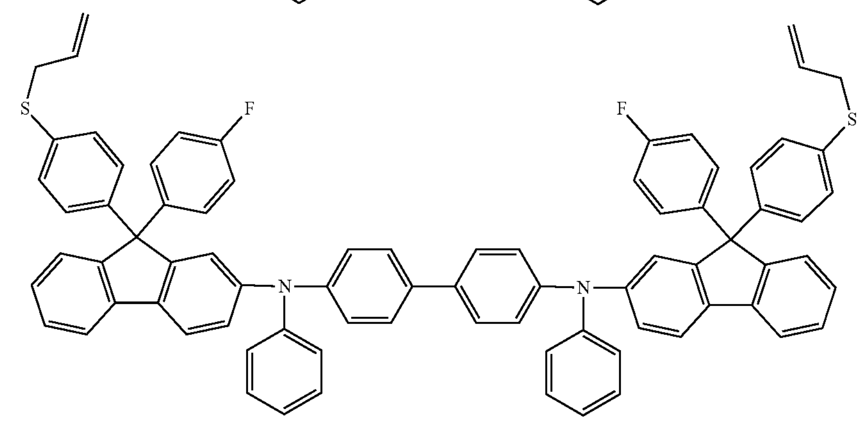
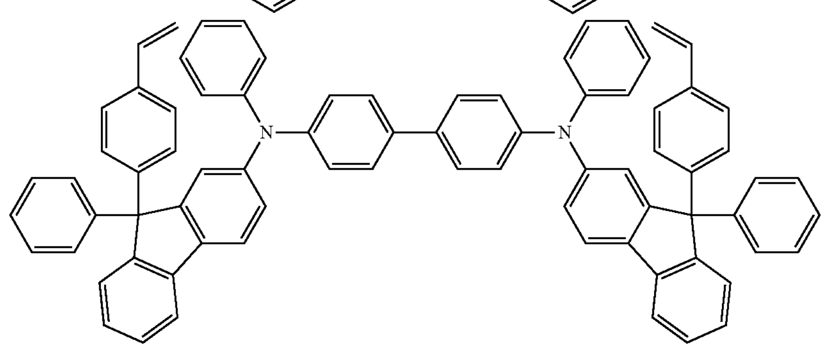

-continued
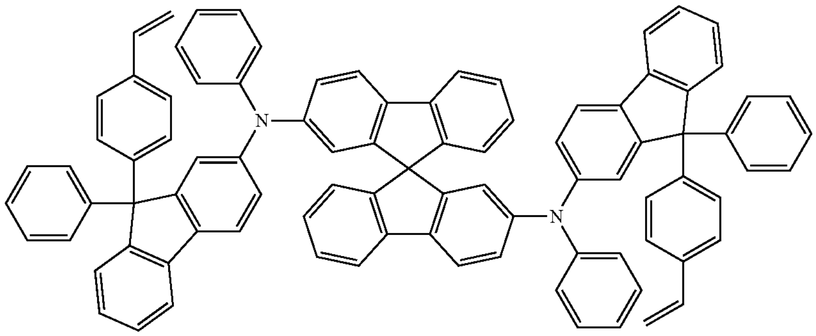
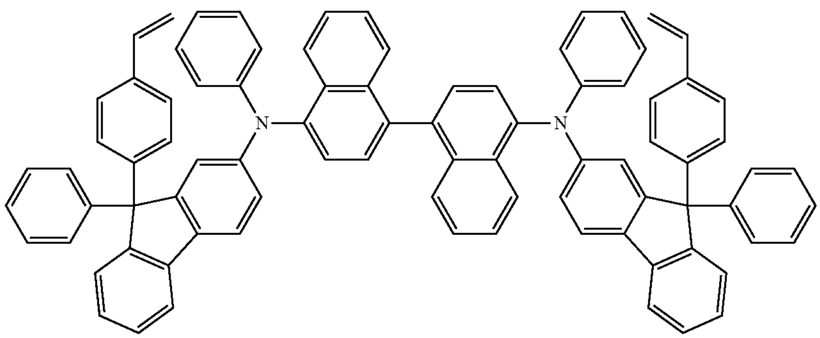
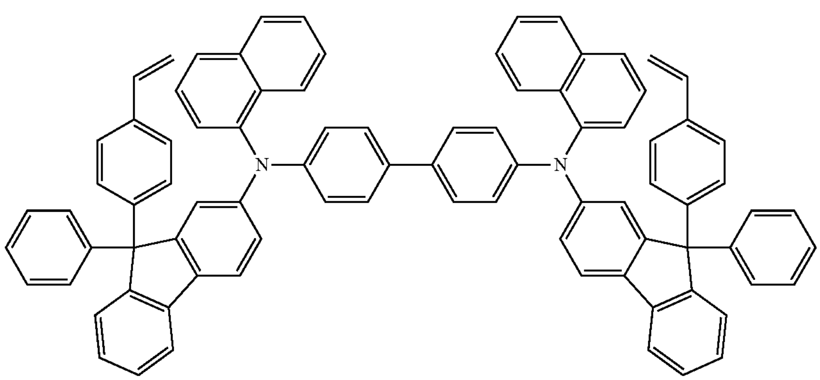
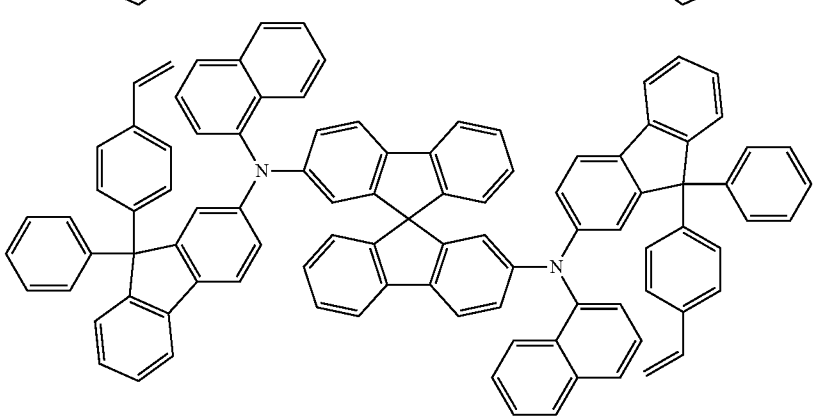

-continued
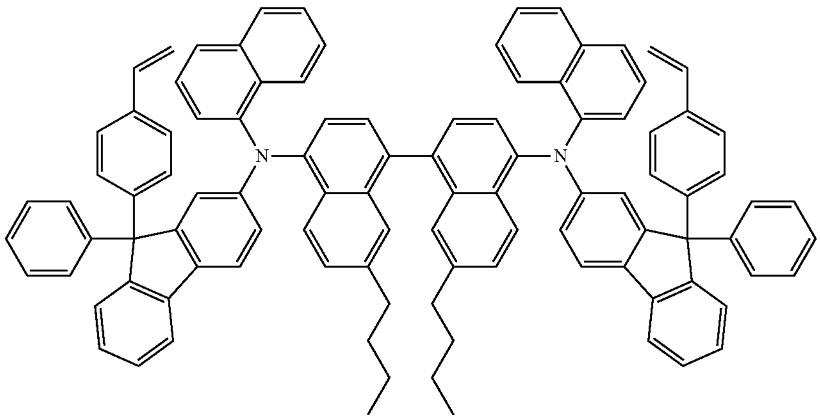
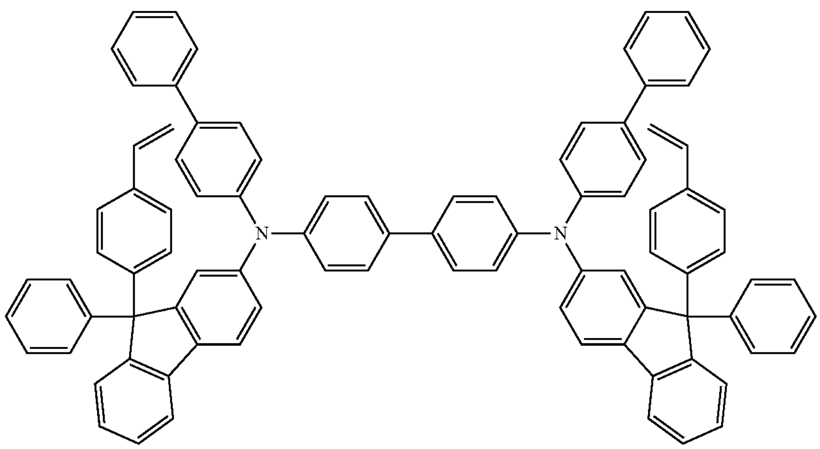
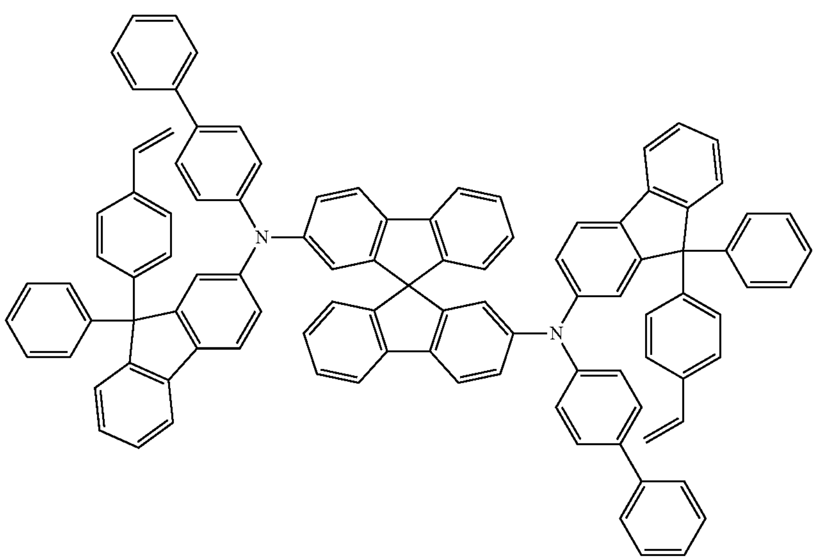

-continued
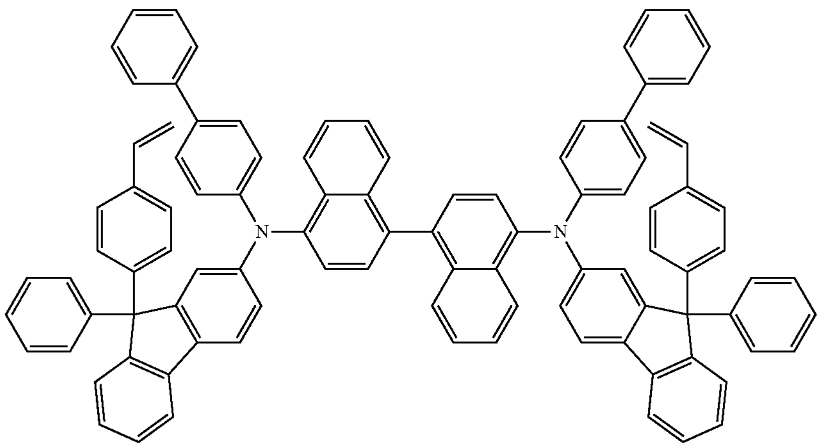
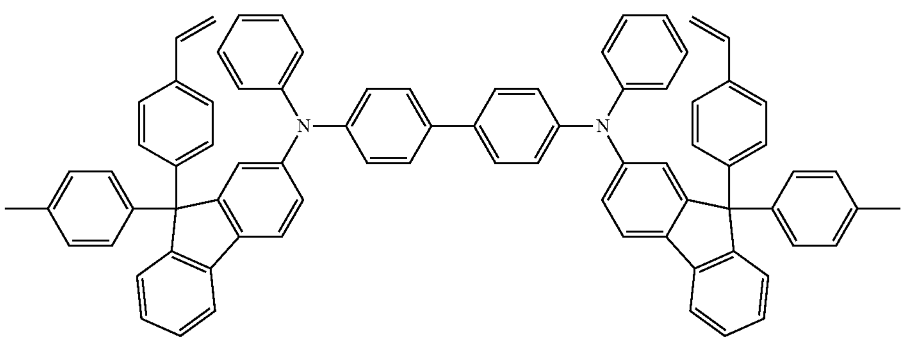
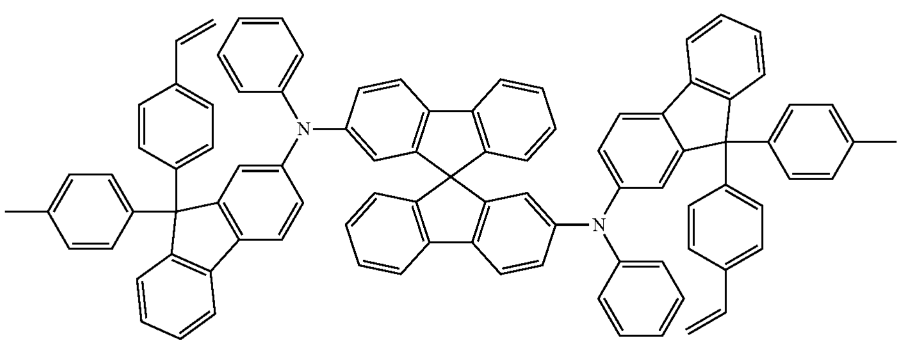
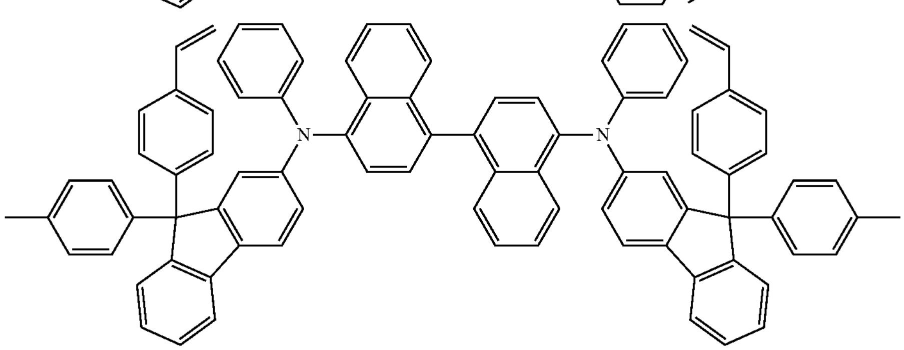

-continued
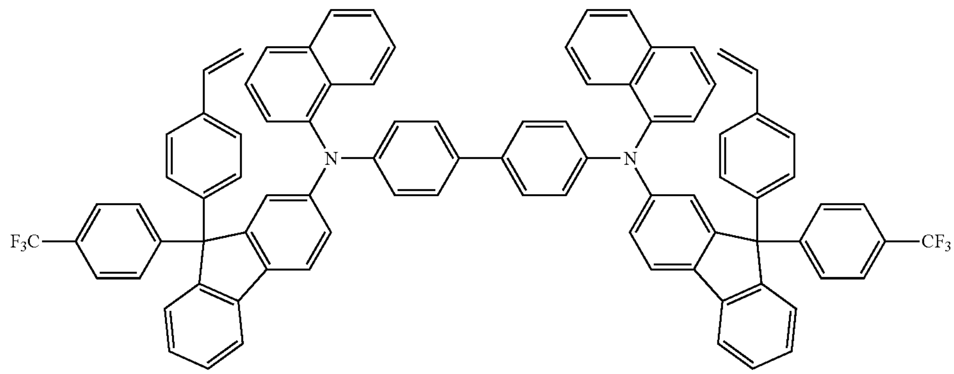
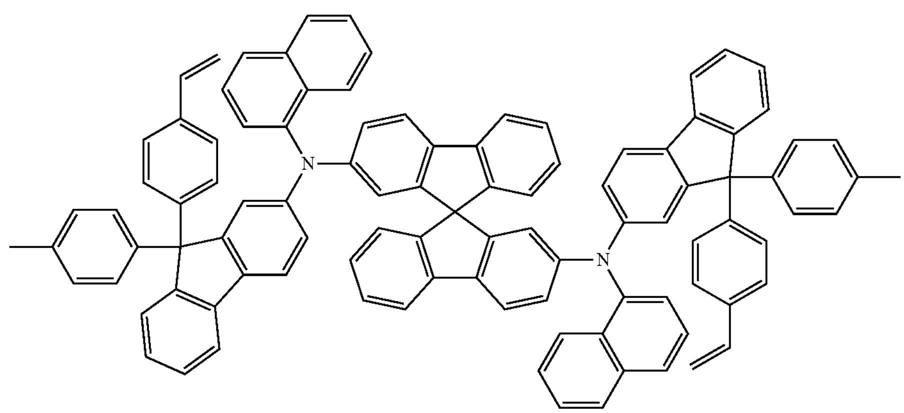
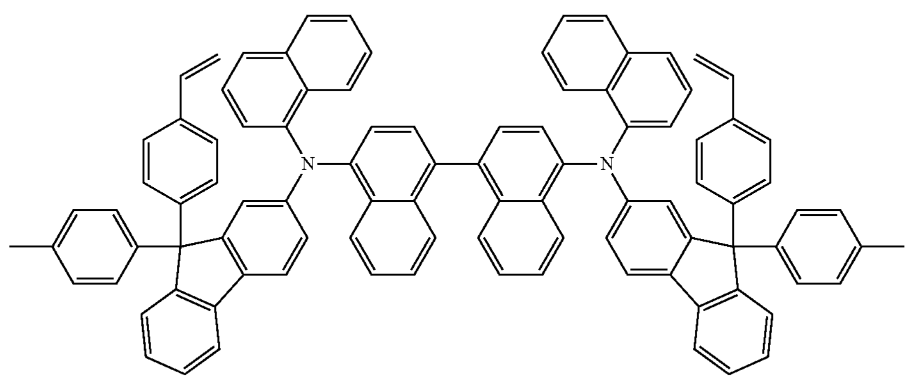
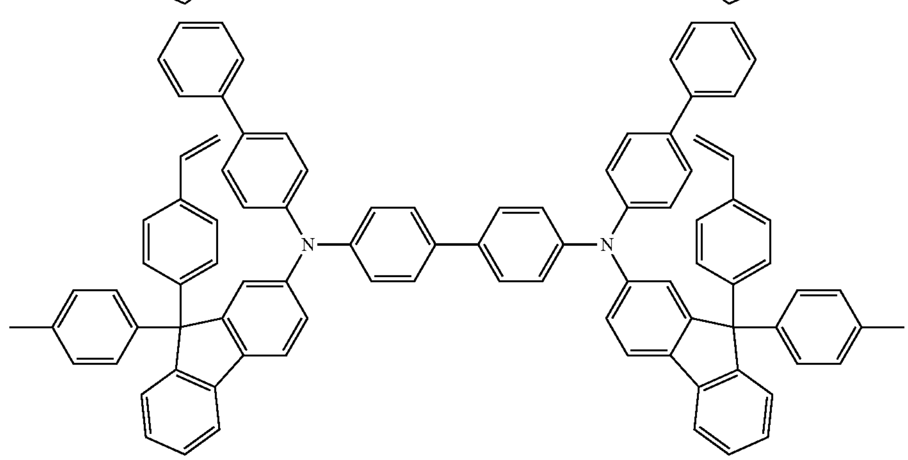

-continued
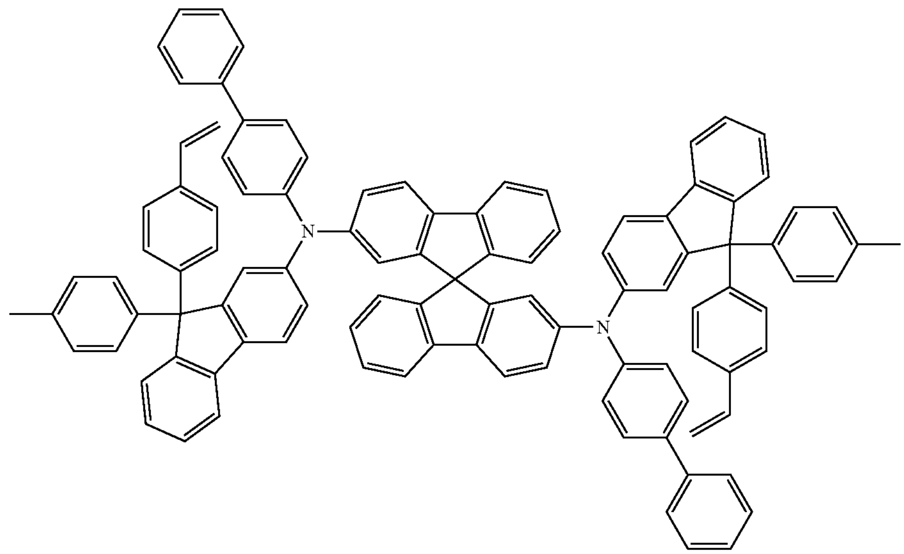
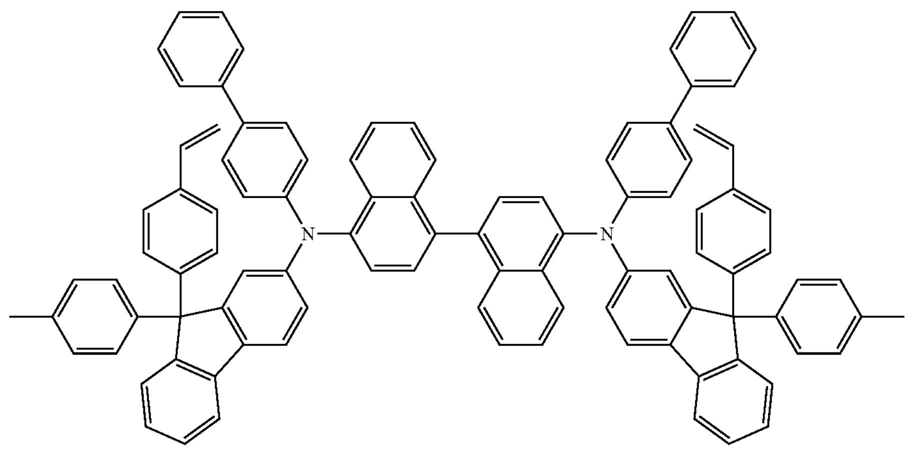
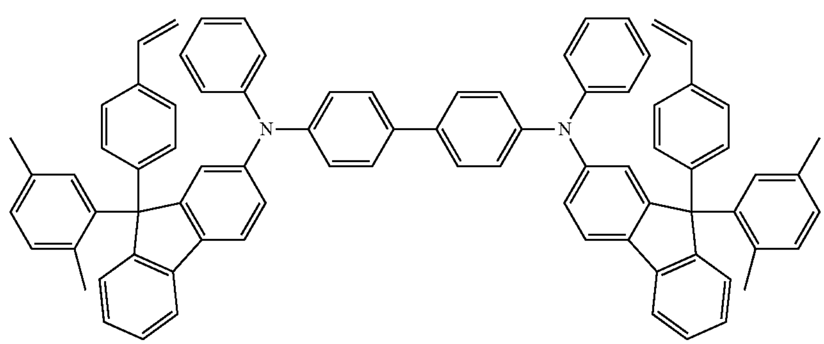
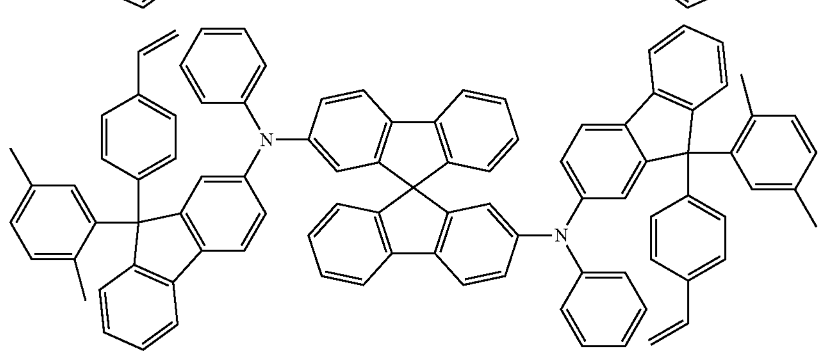

-continued
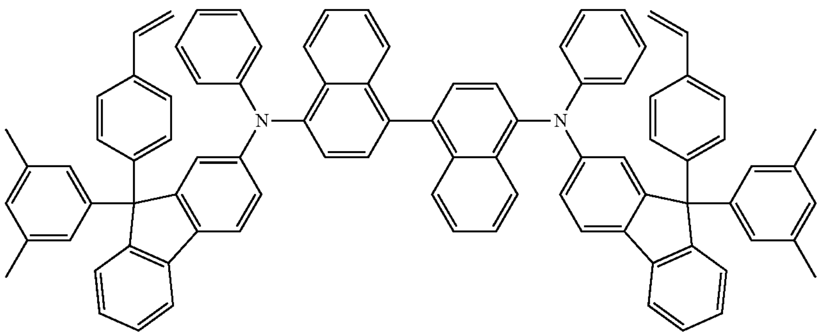
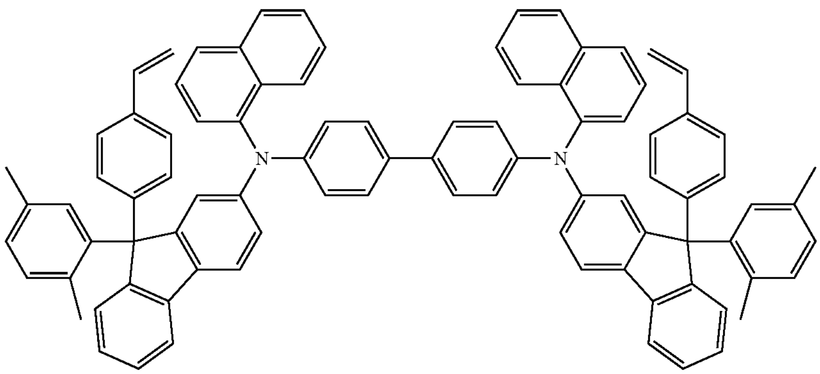
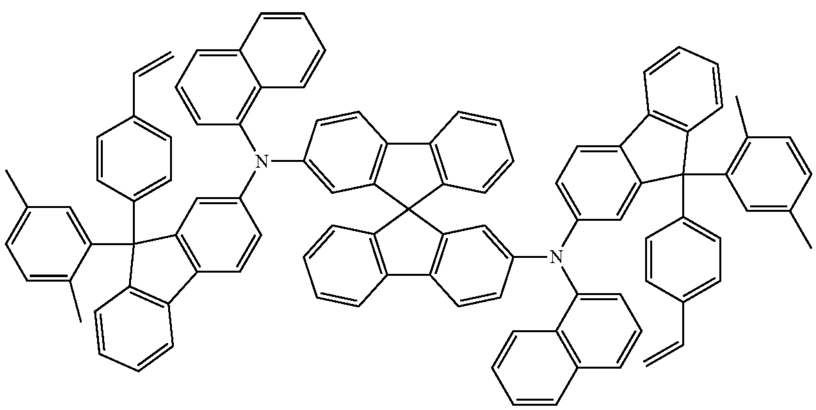
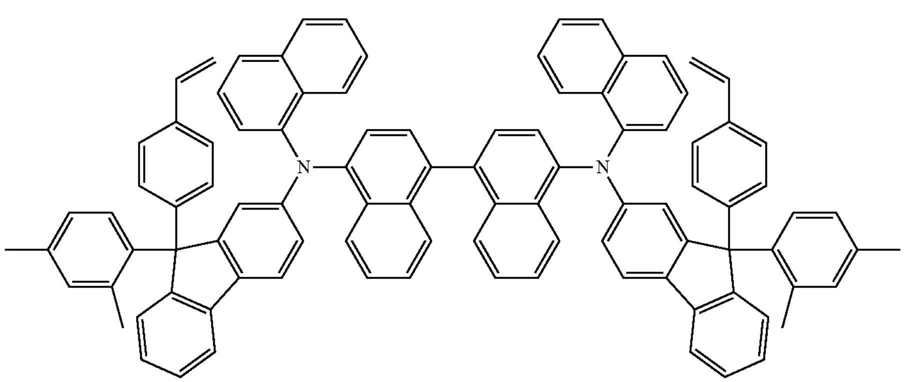

-continued
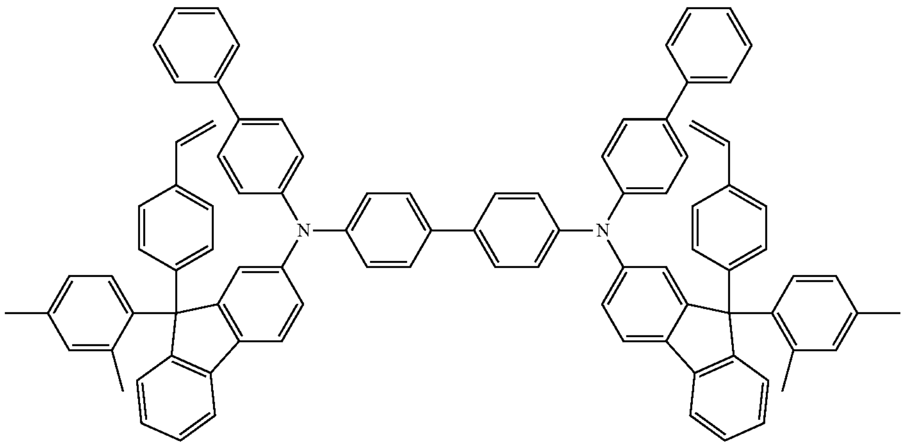
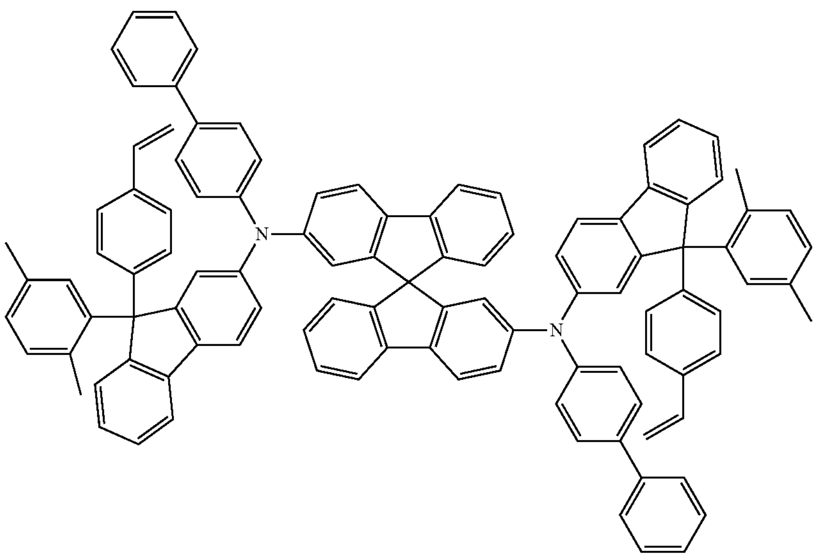
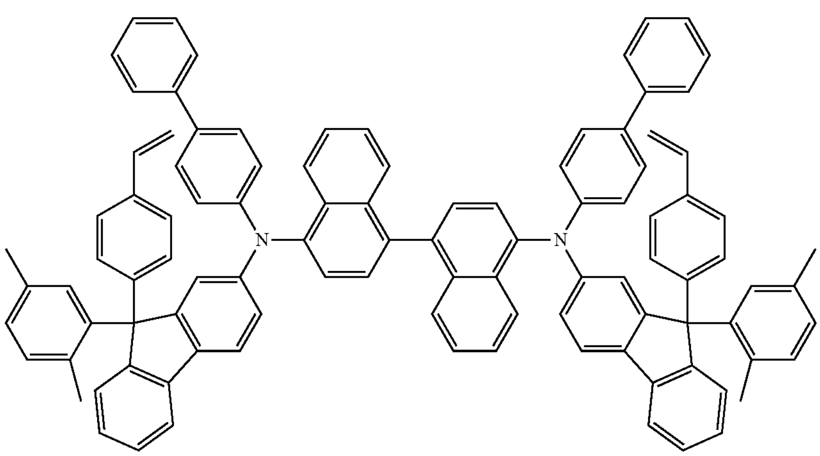

-continued
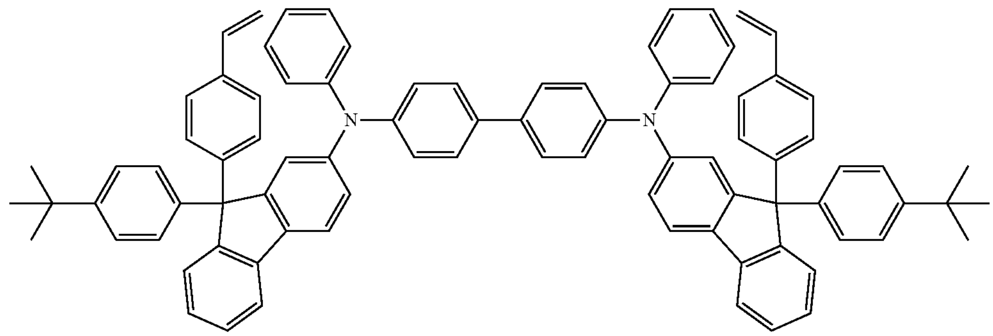
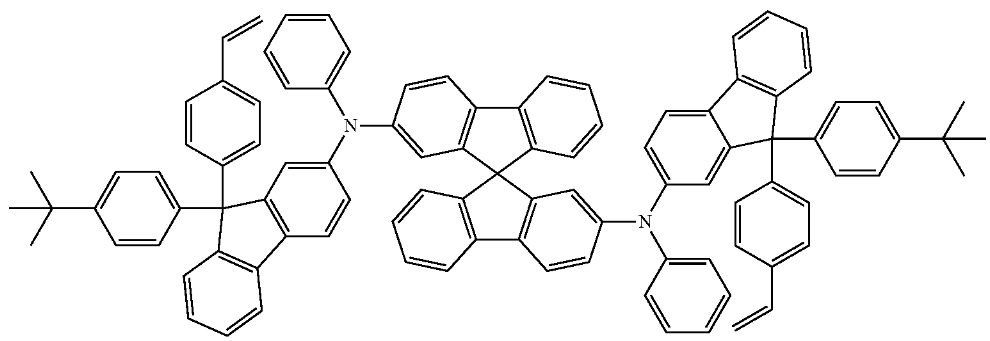
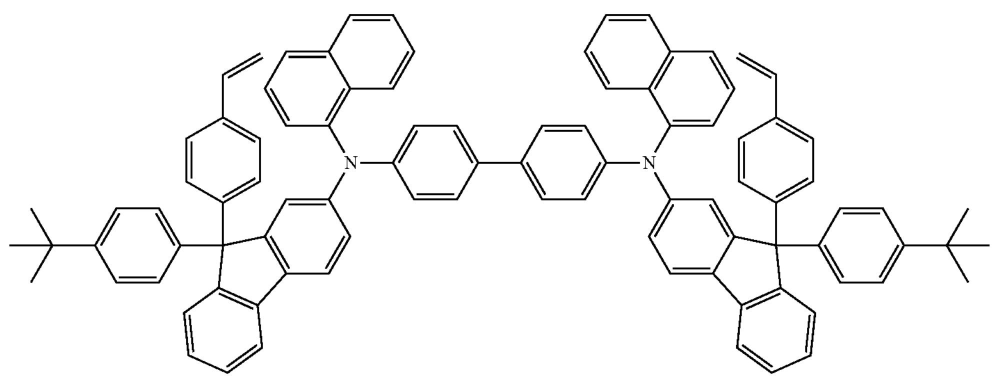
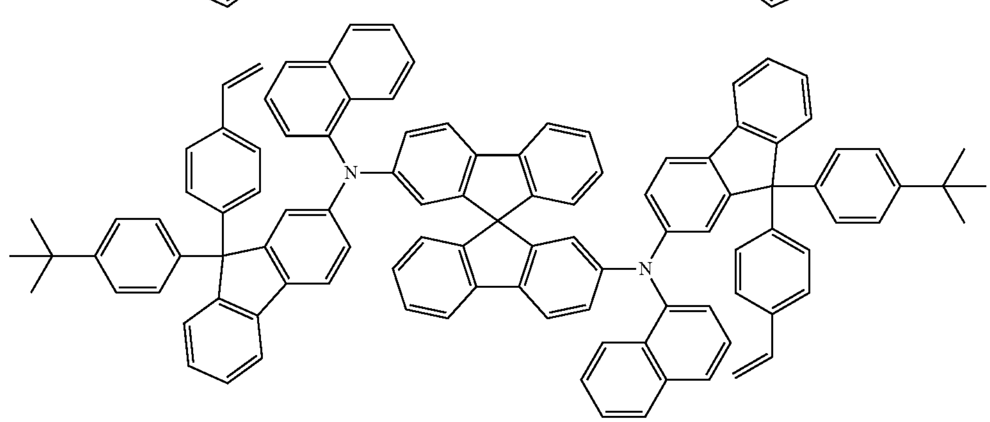

-continued
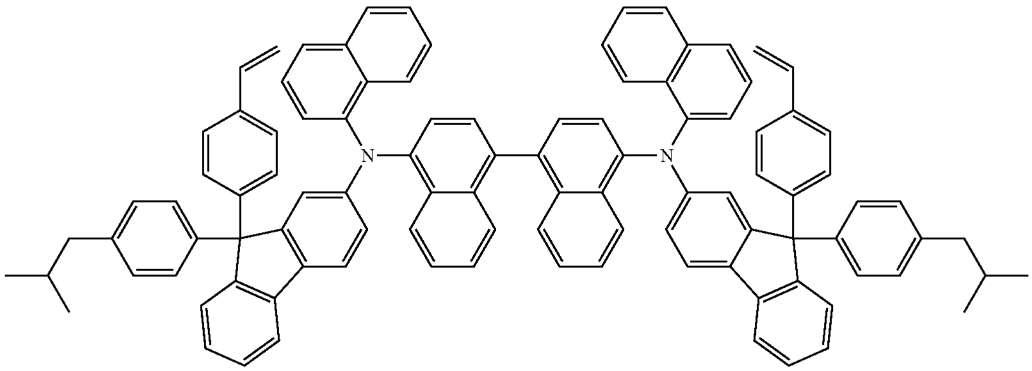
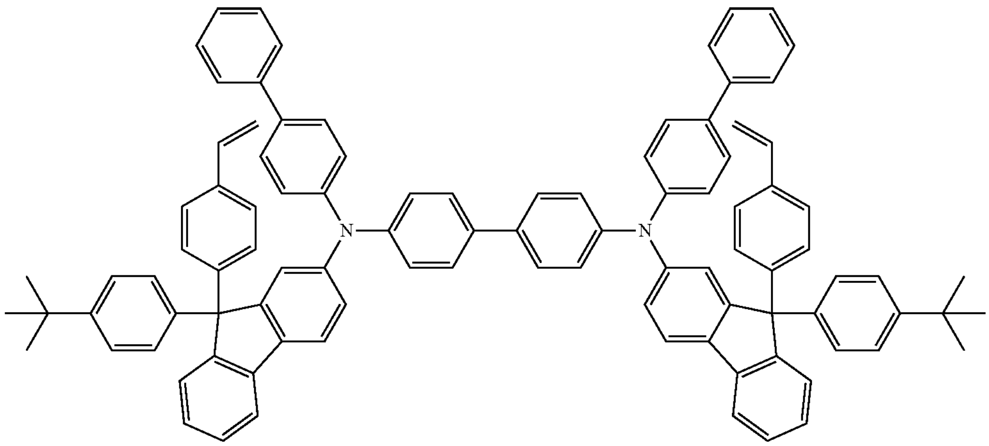
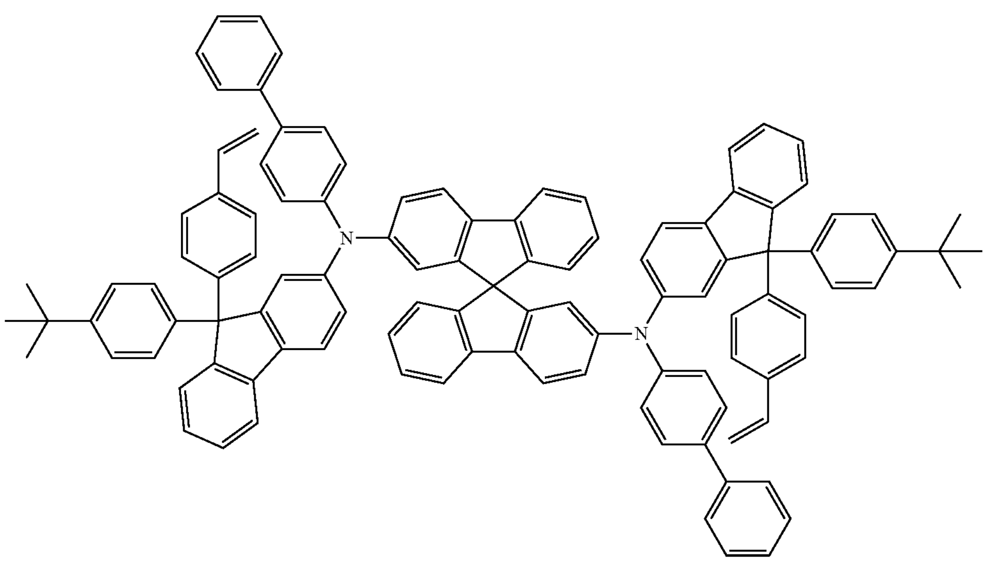

-continued
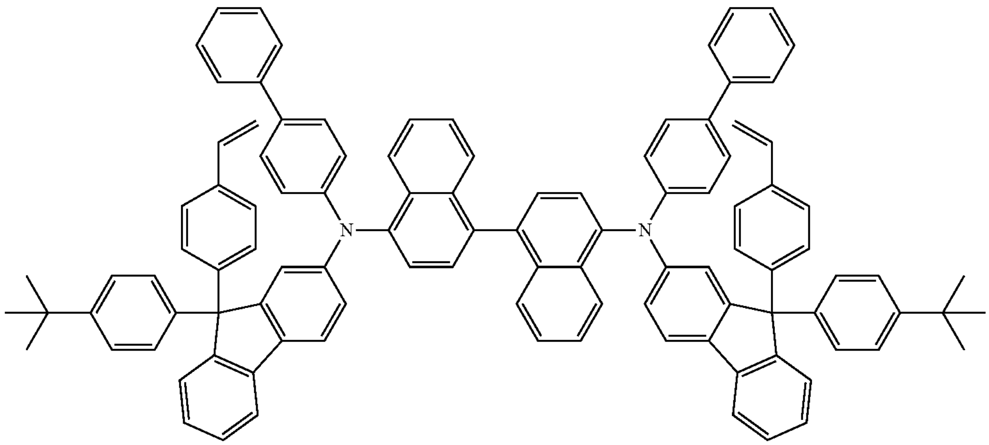
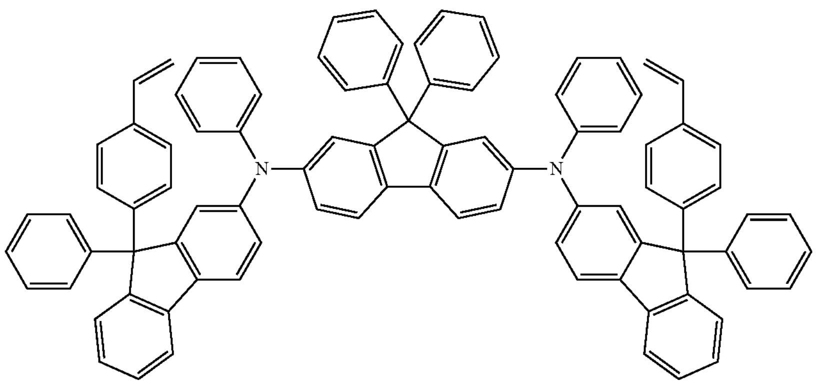
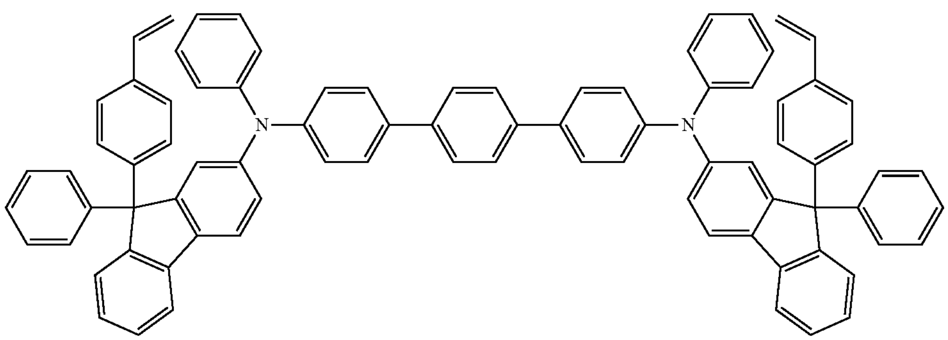
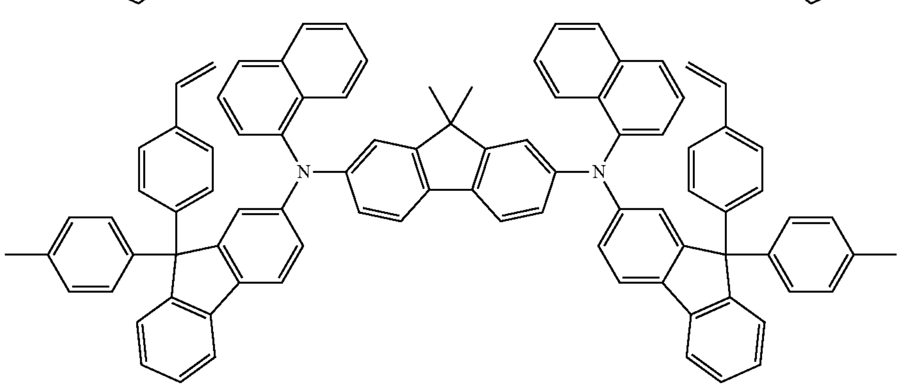

-continued
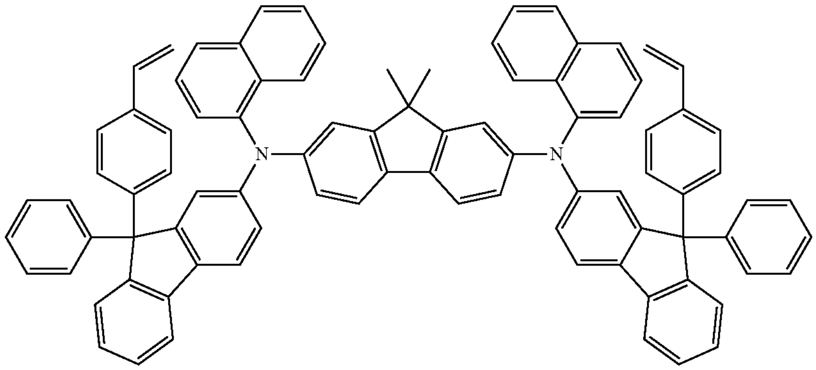
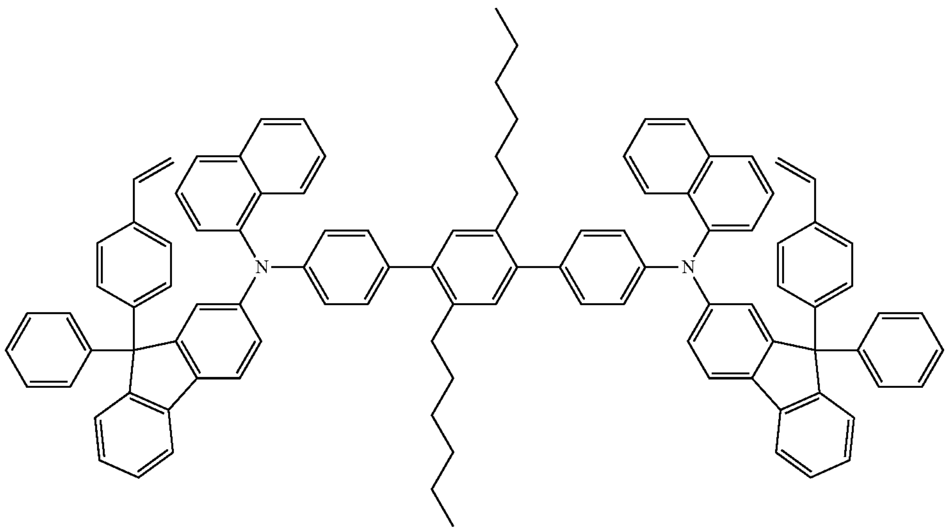
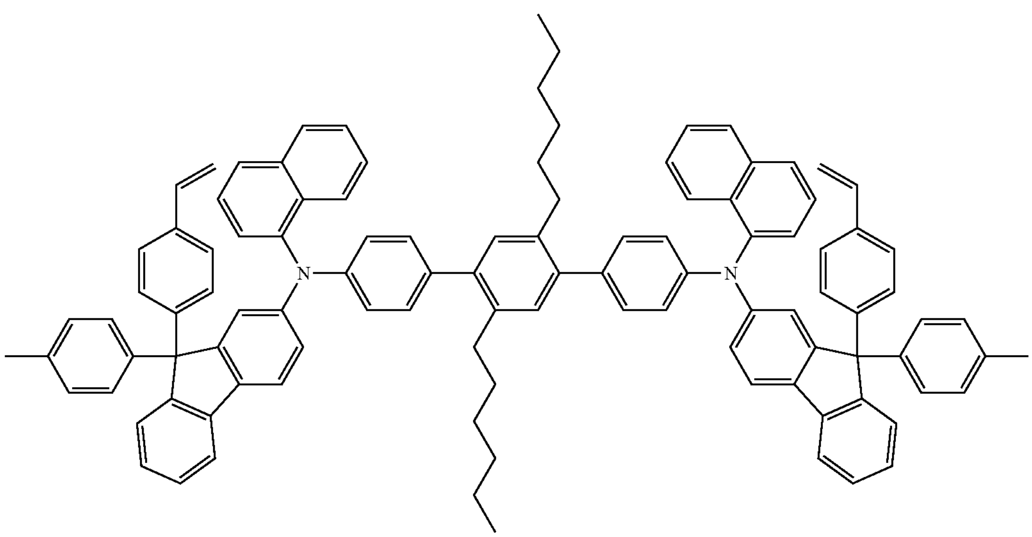

-continued
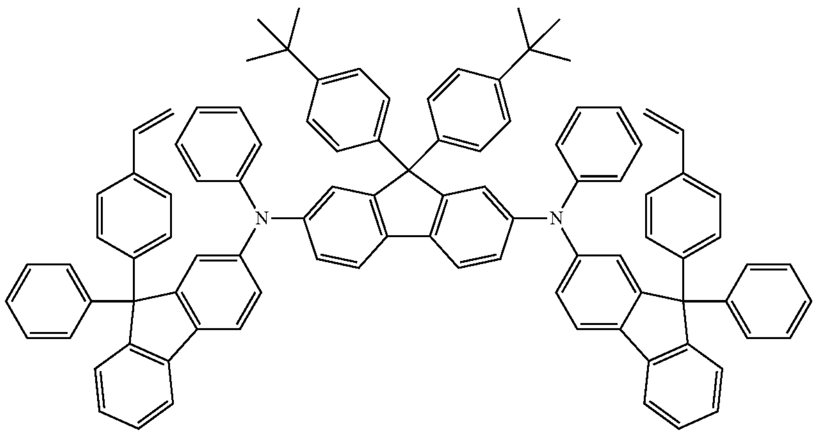
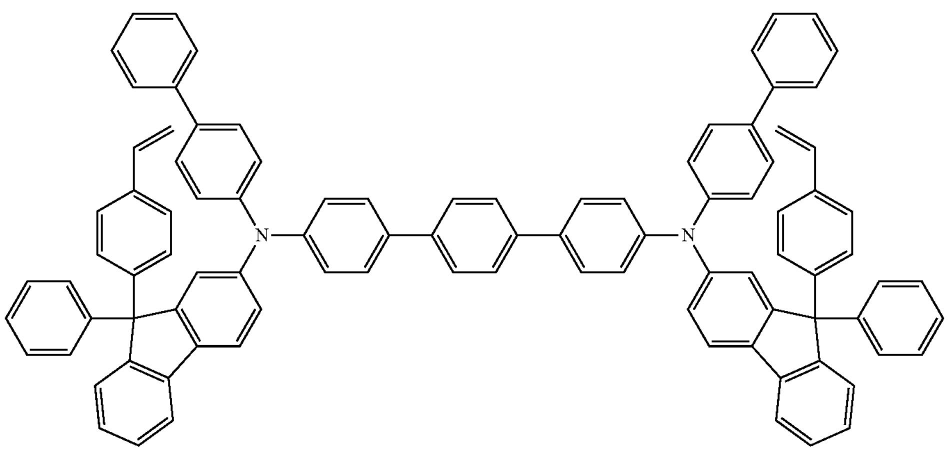
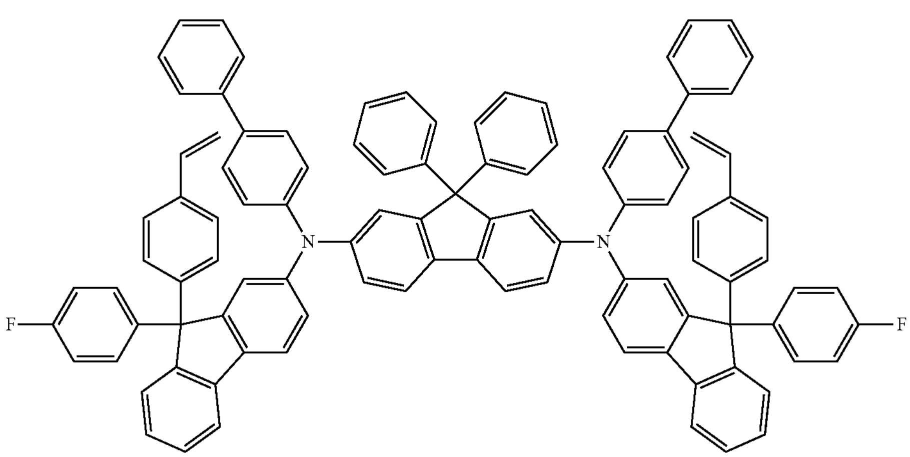

-continued
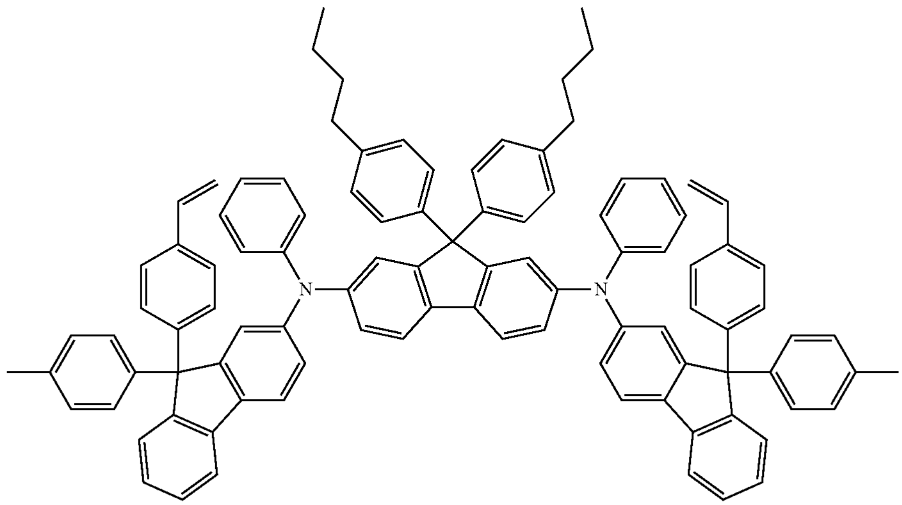
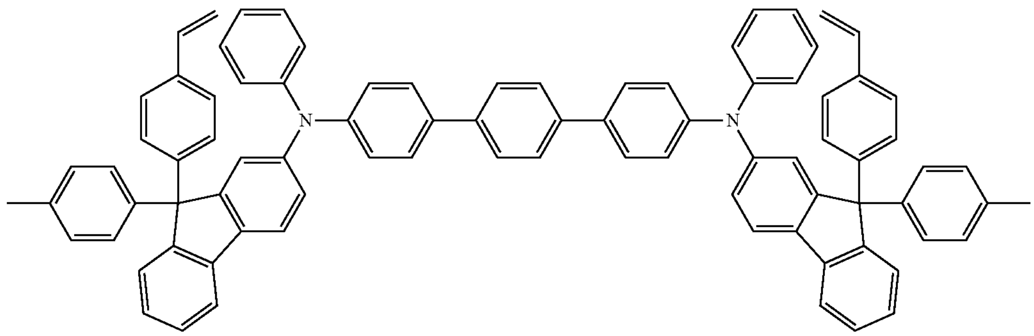
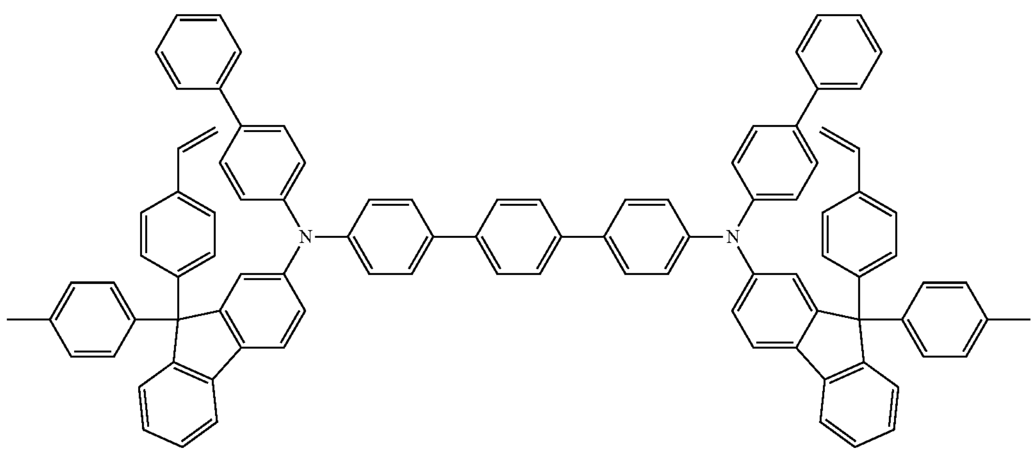
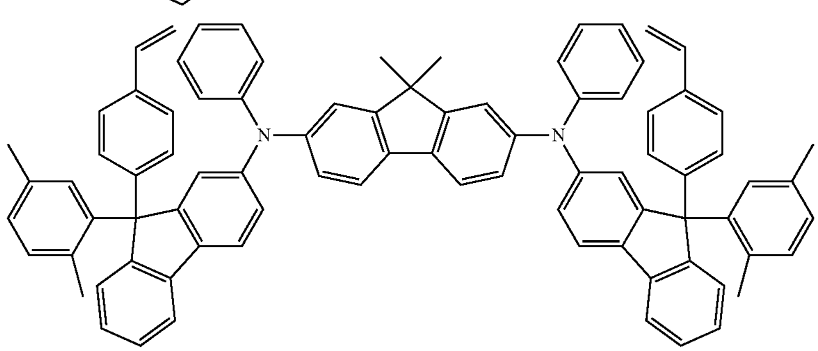

-continued
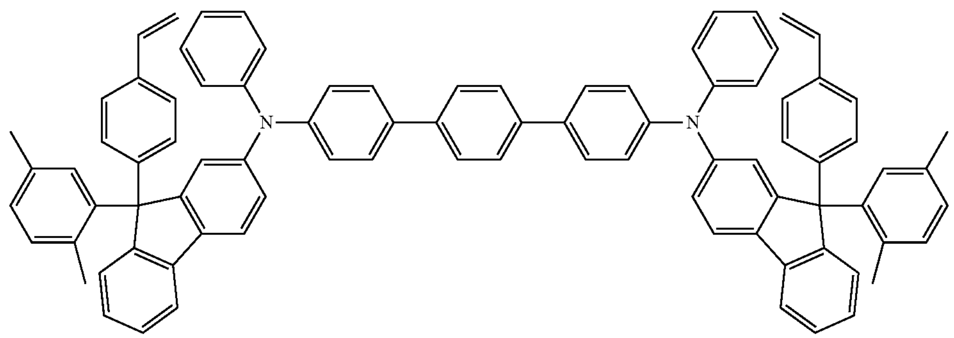
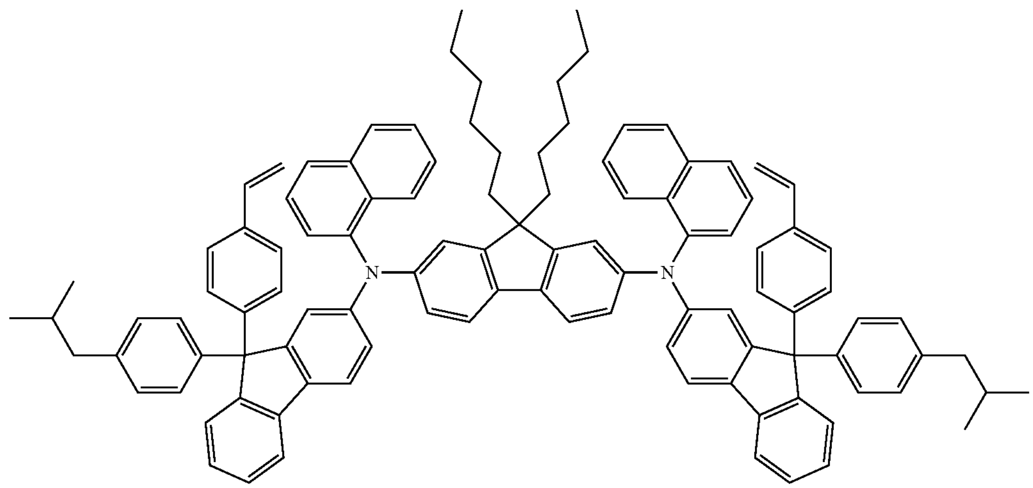
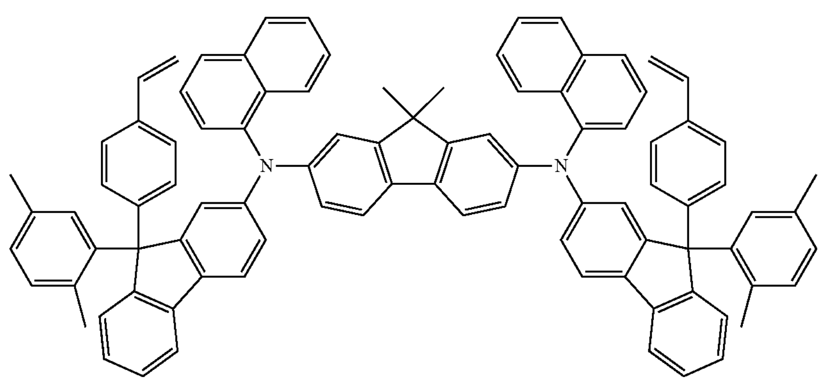
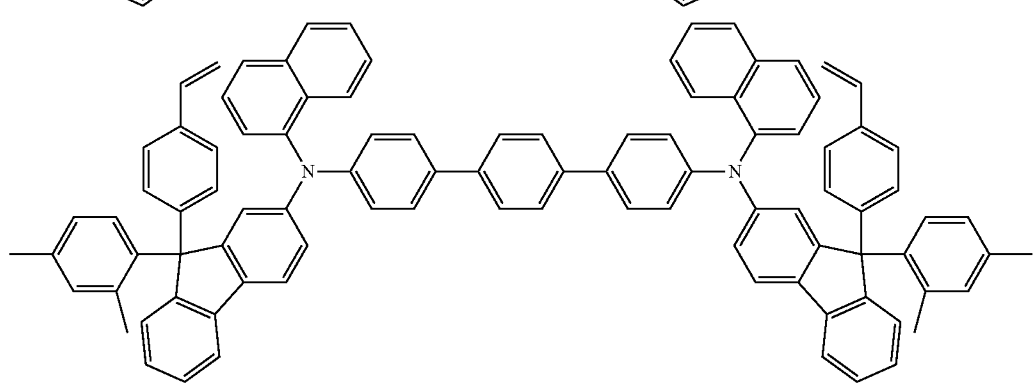

-continued
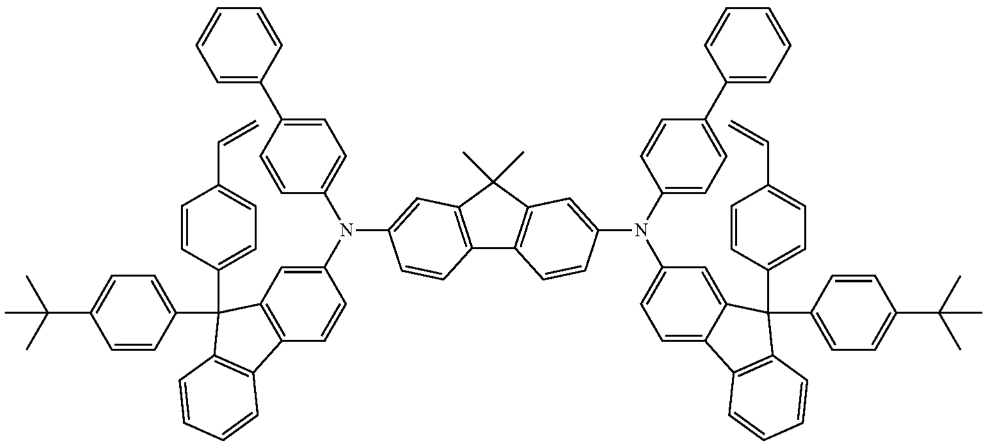
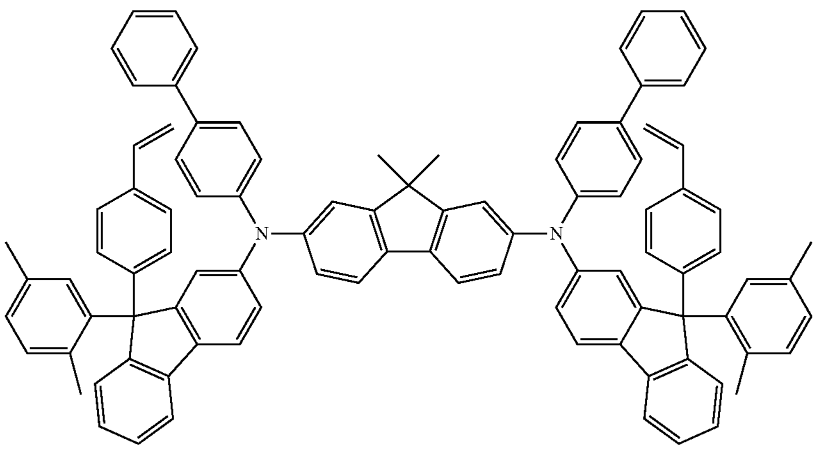
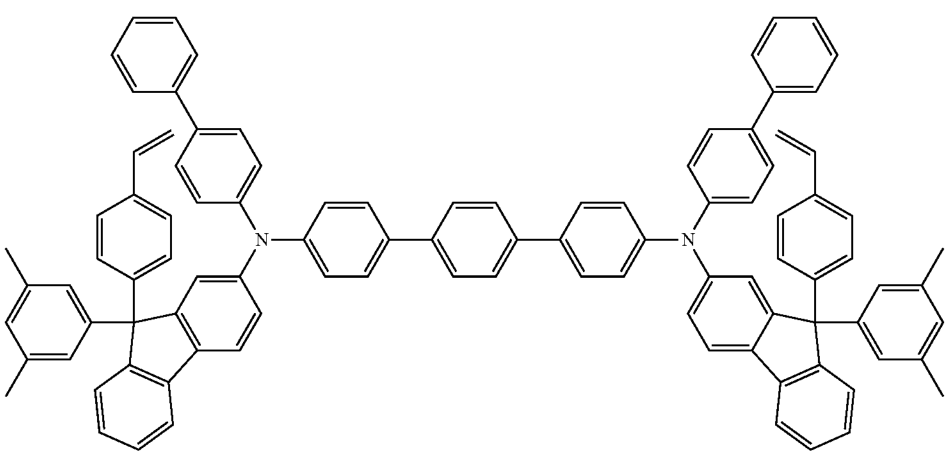
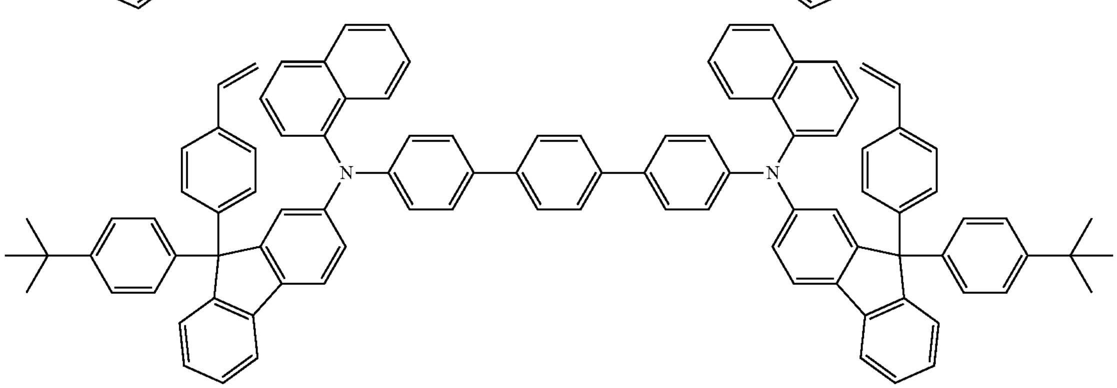

-continued
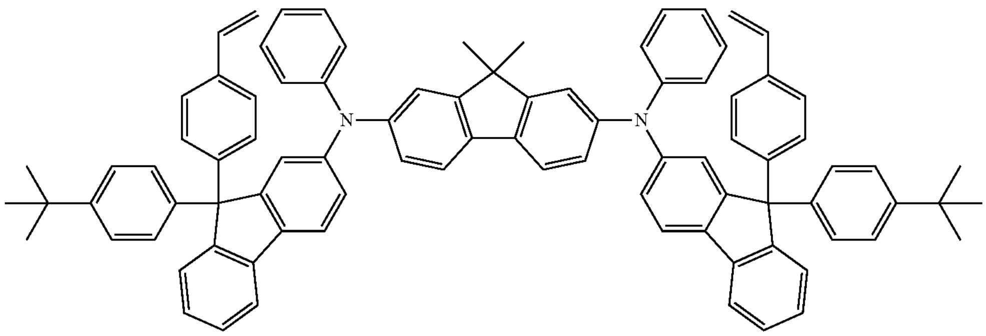
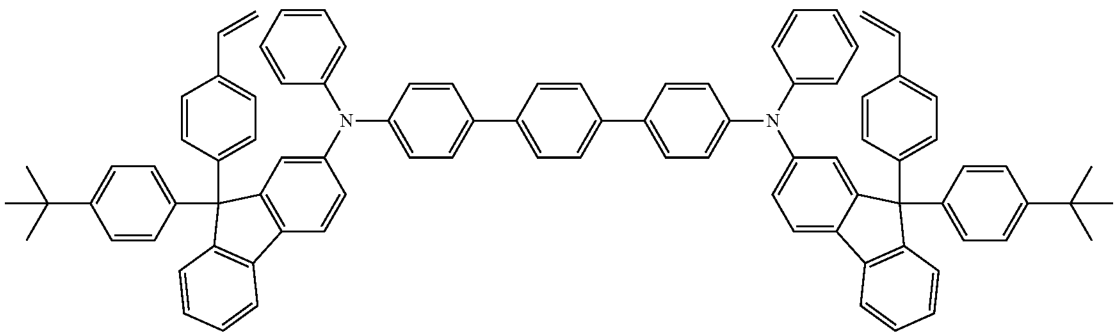
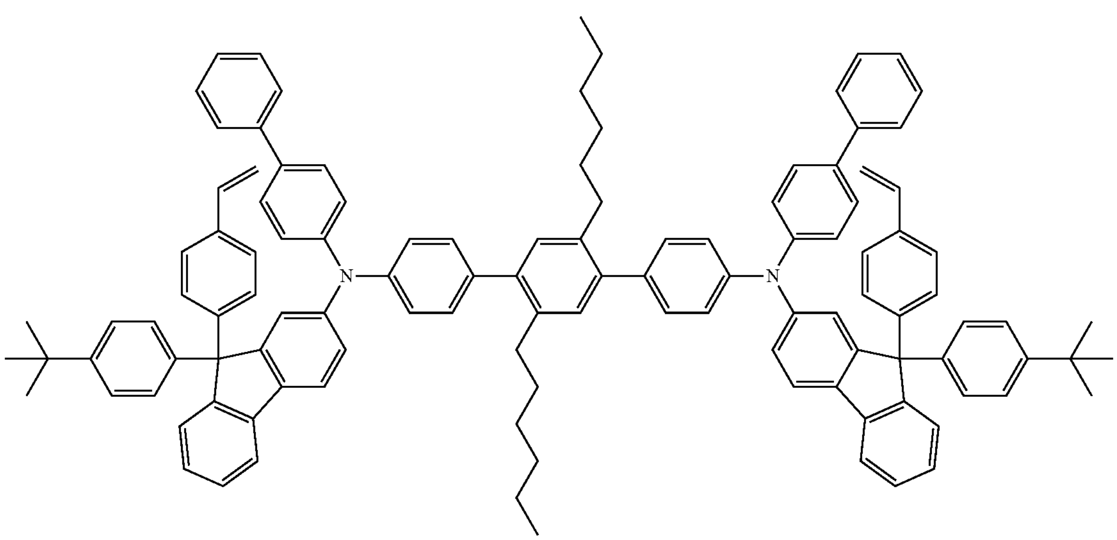
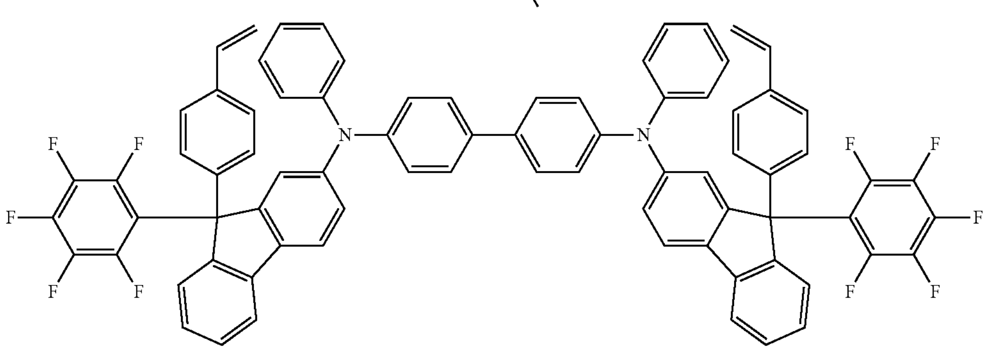

-continued
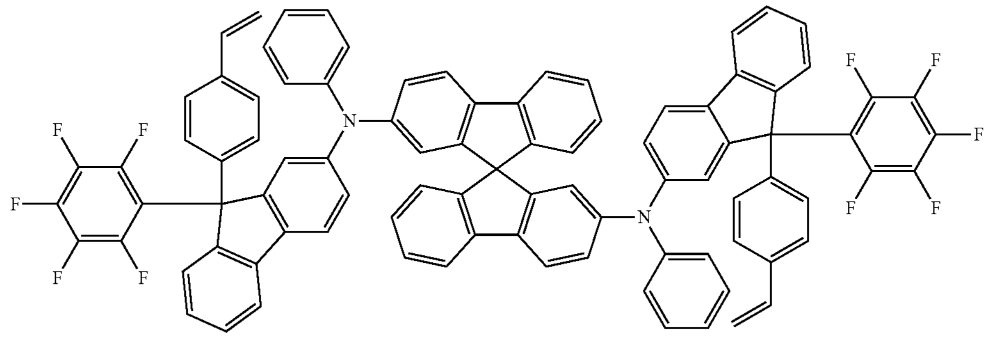
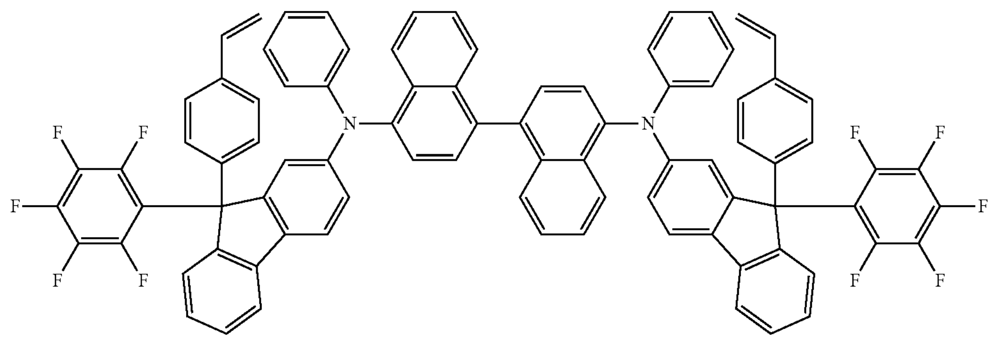
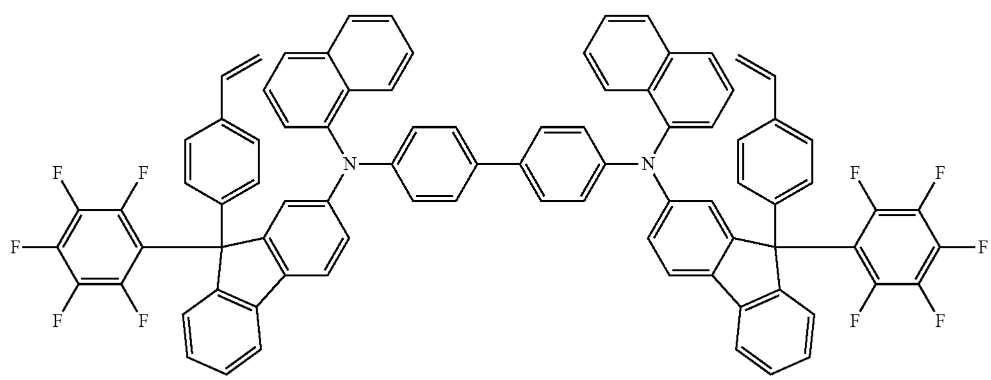
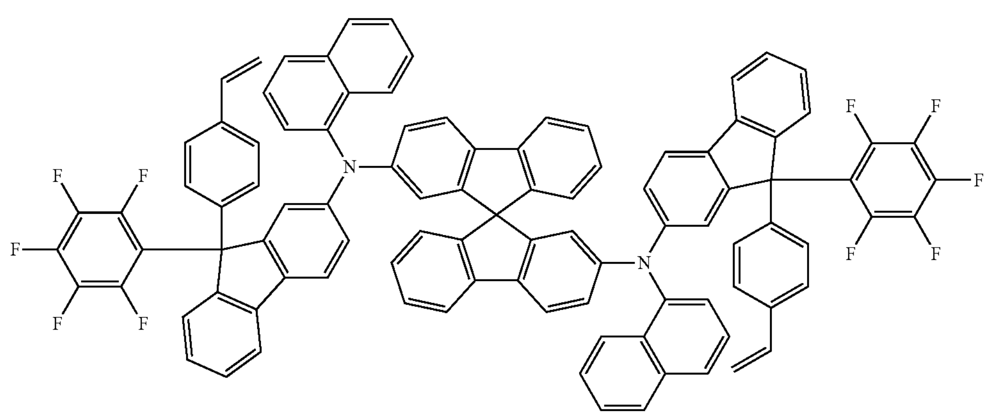

-continued
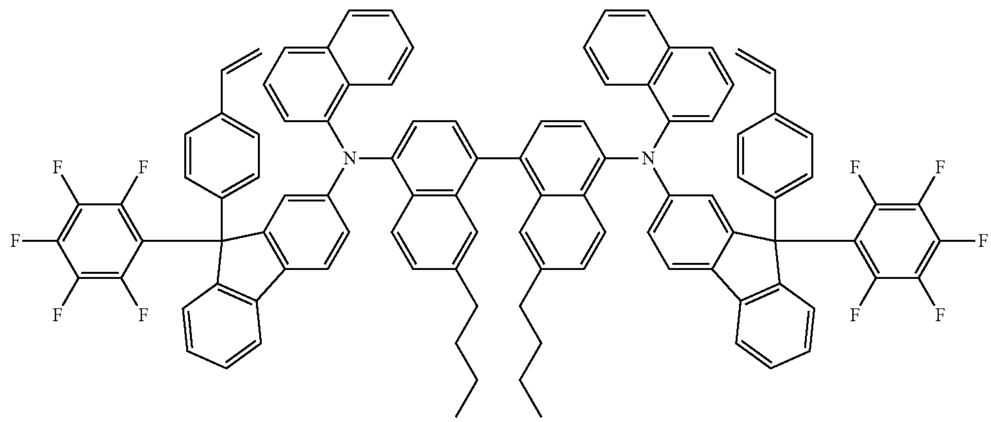
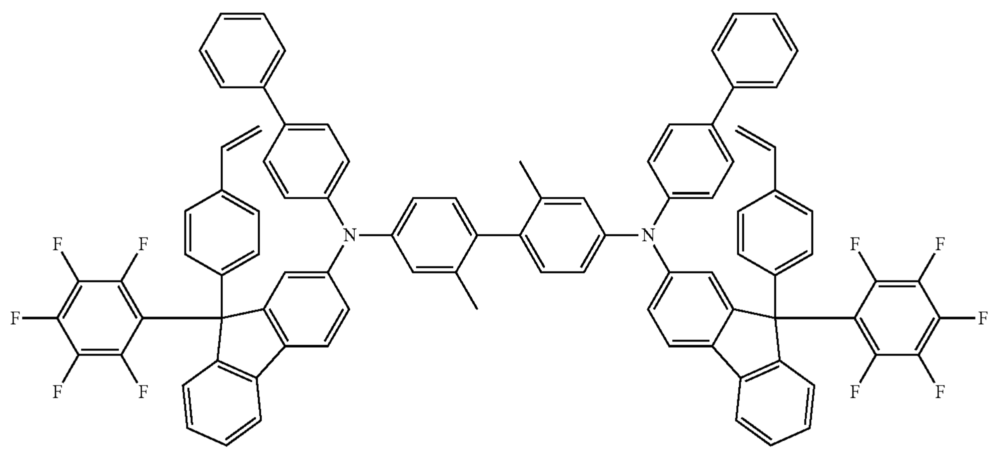
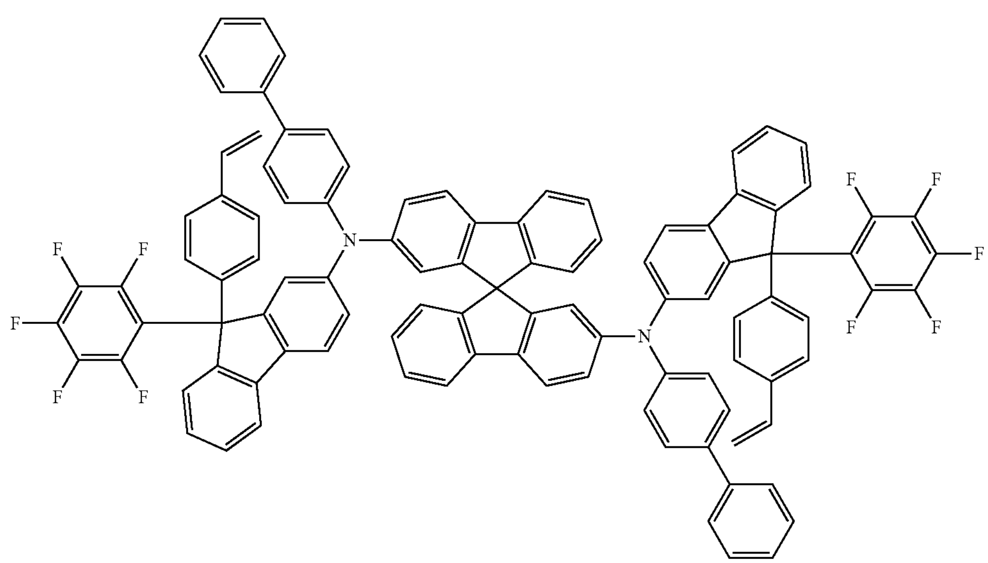

-continued
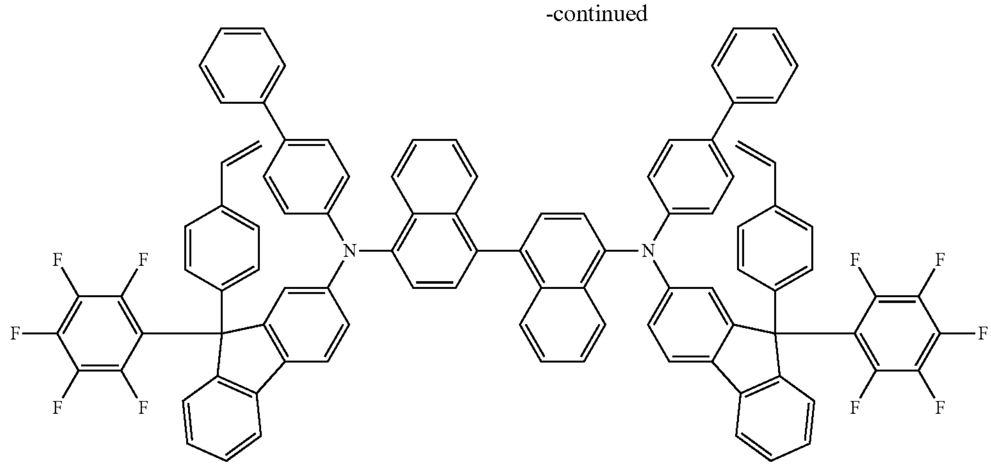
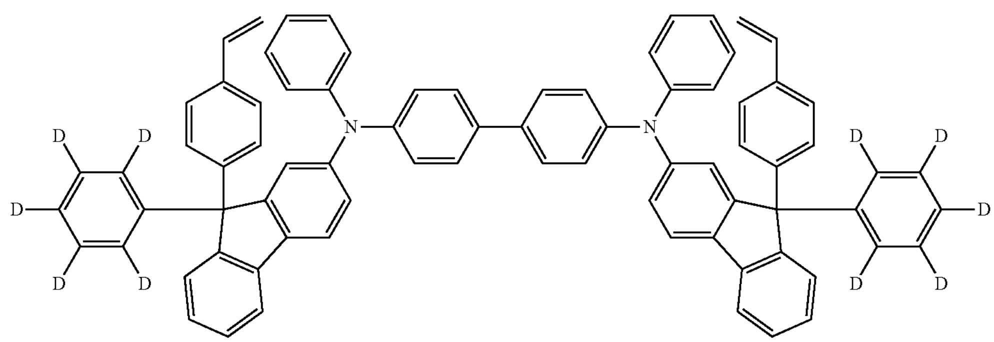
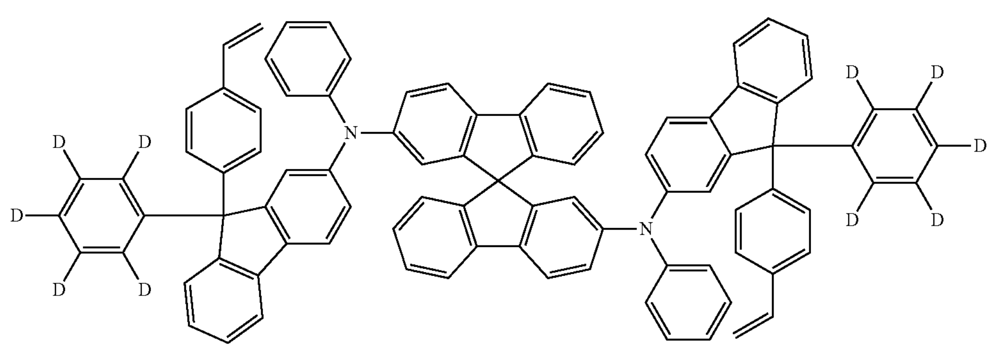
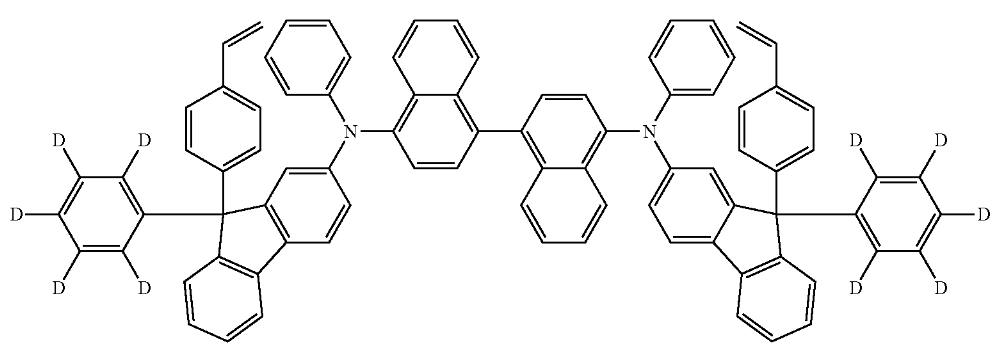

-continued
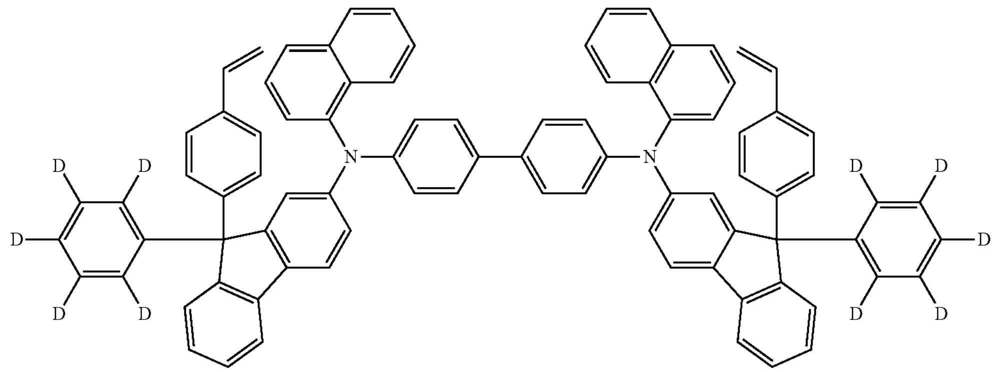
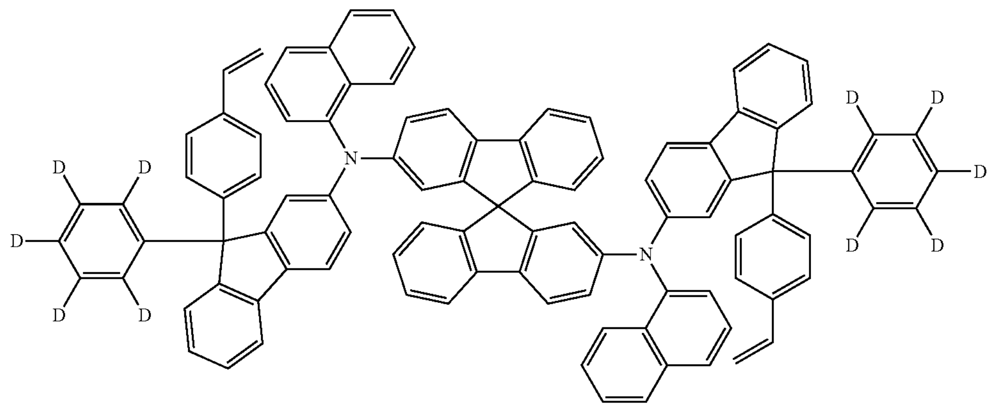
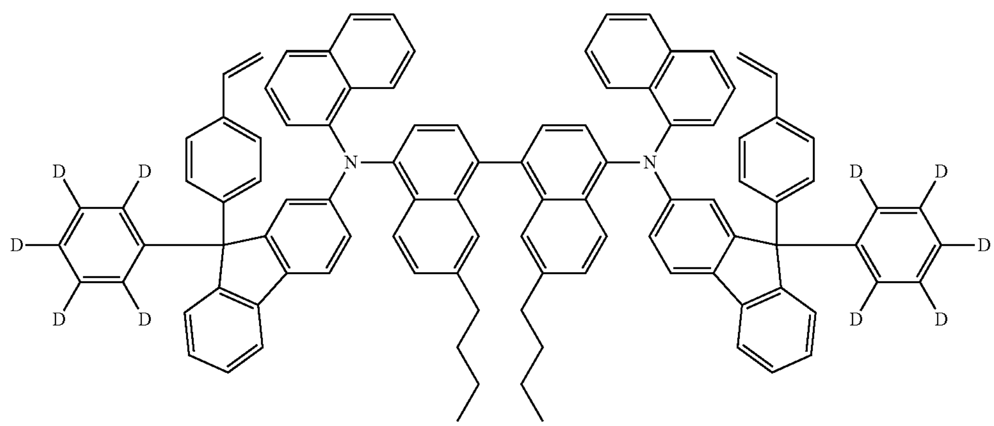
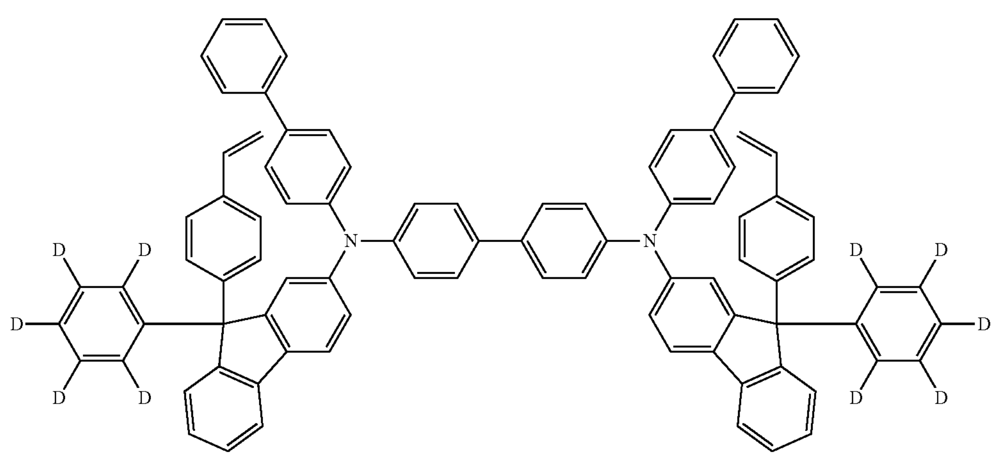

-continued
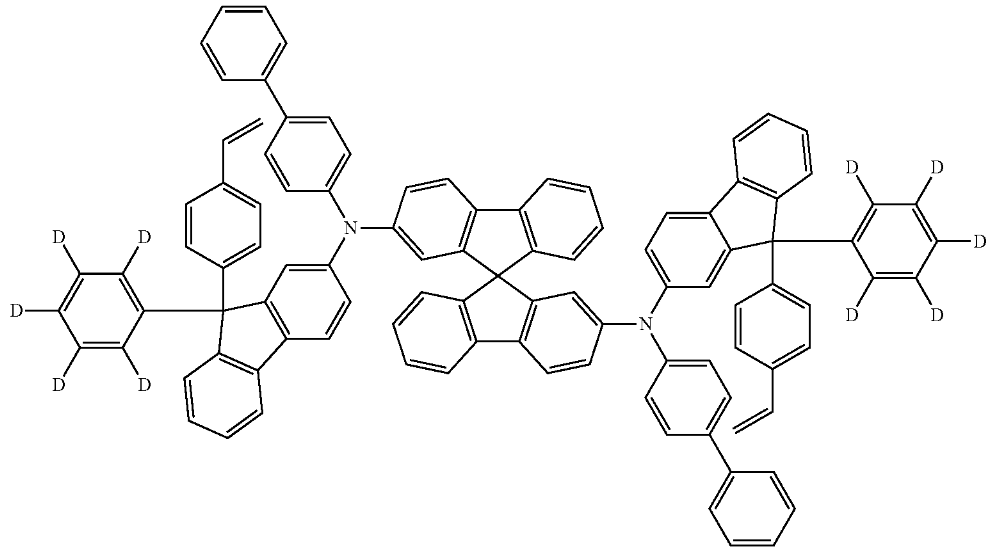
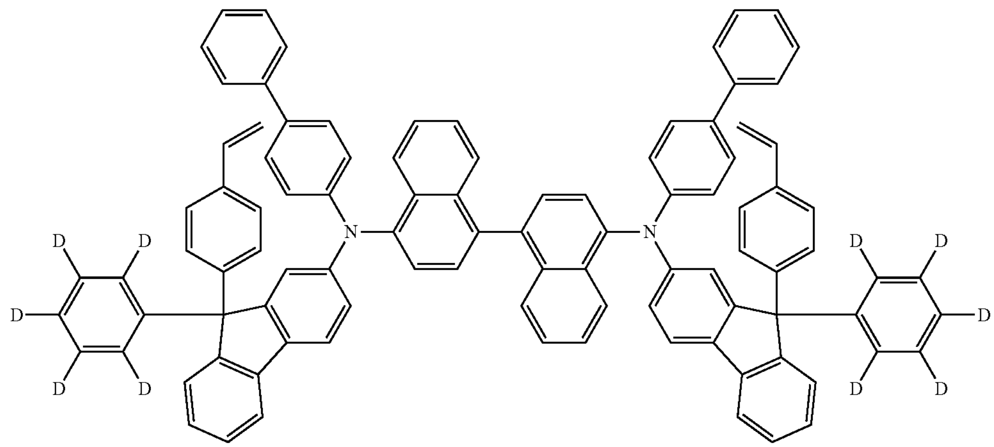
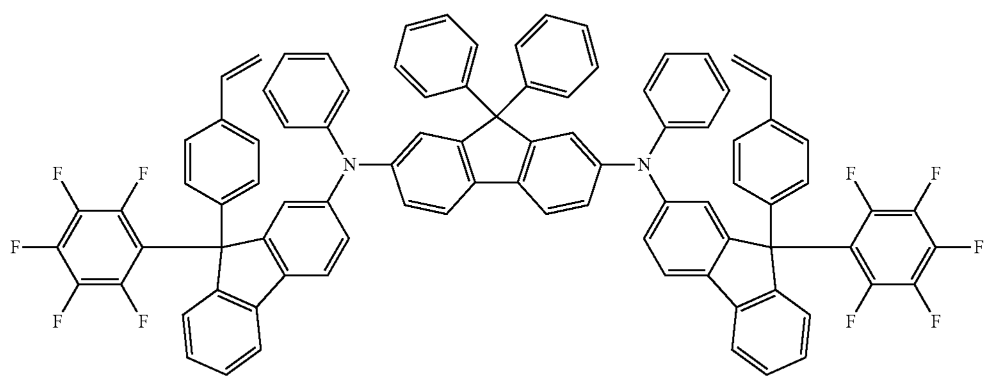
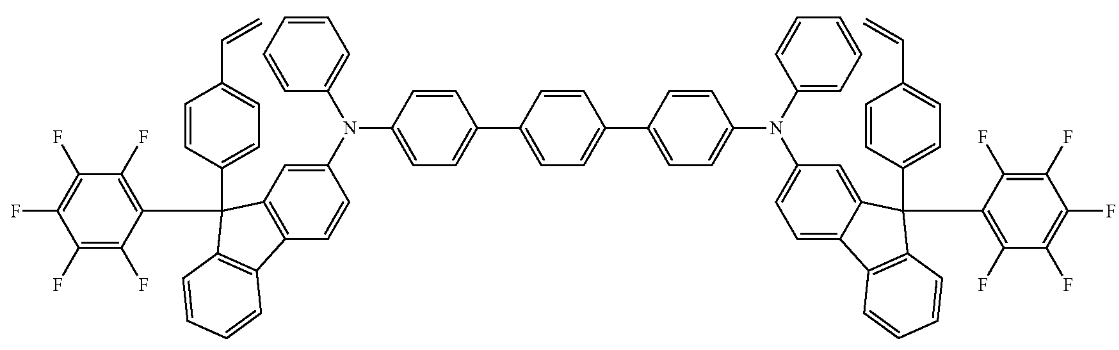

-continued
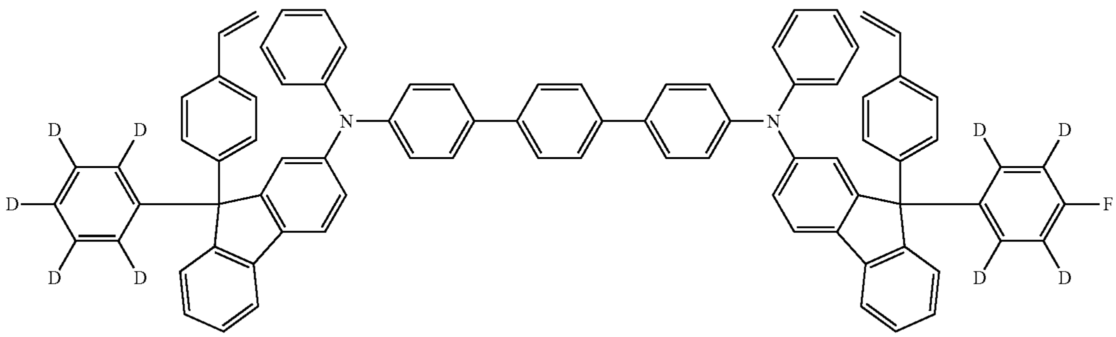
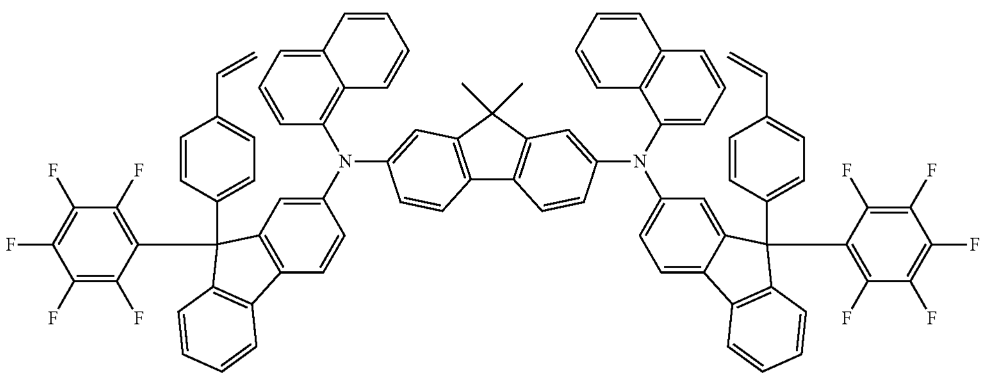
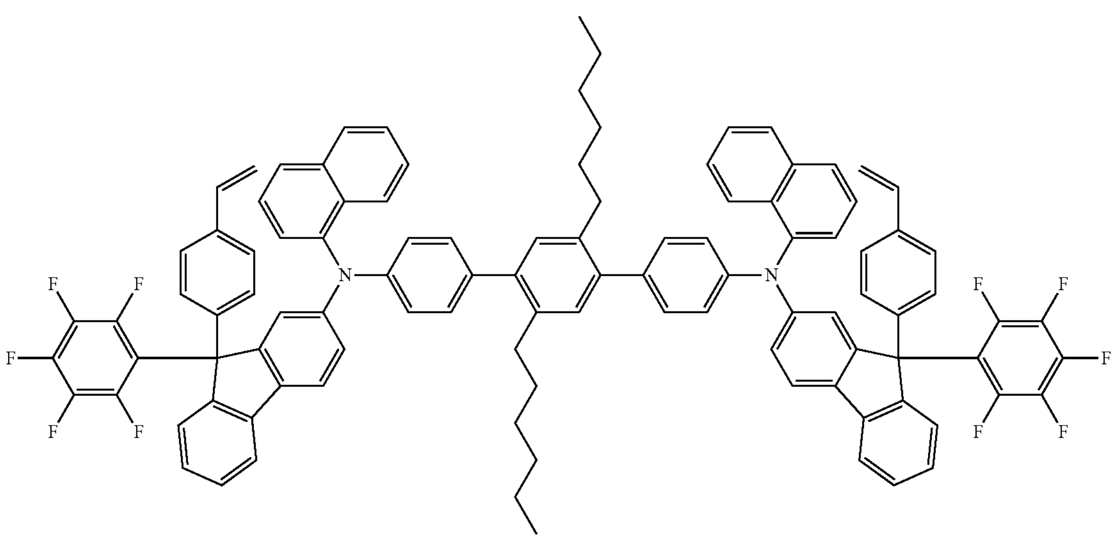
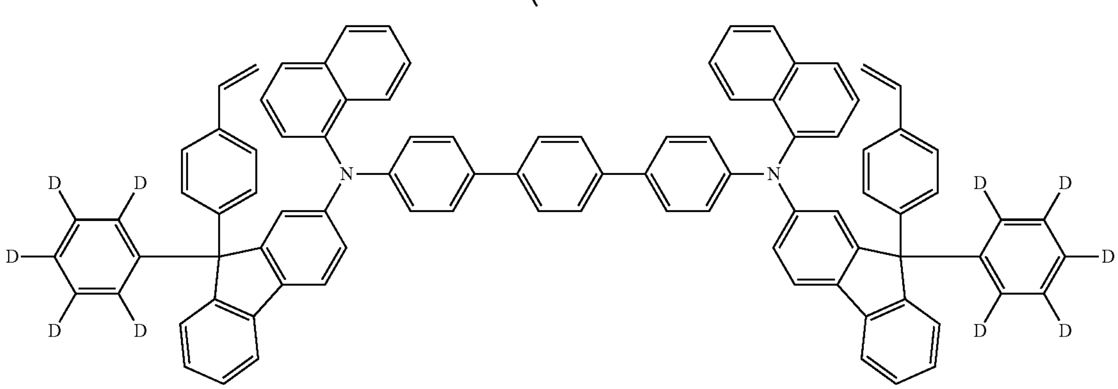

-continued
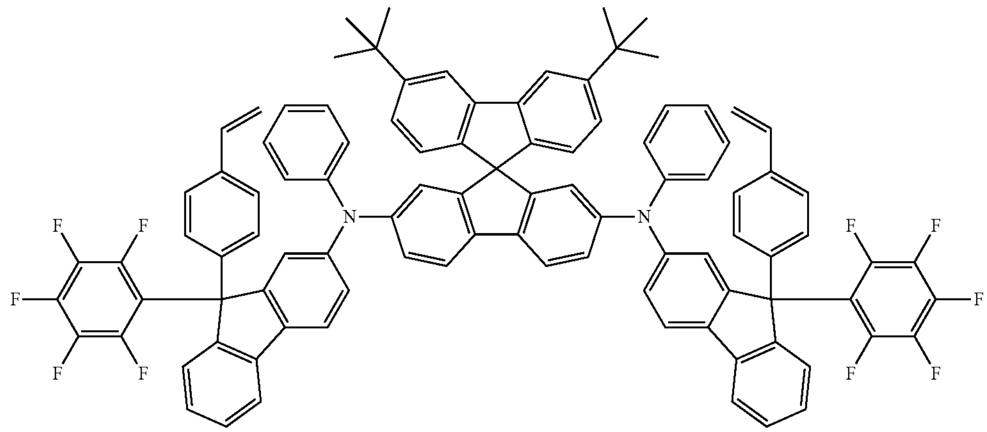
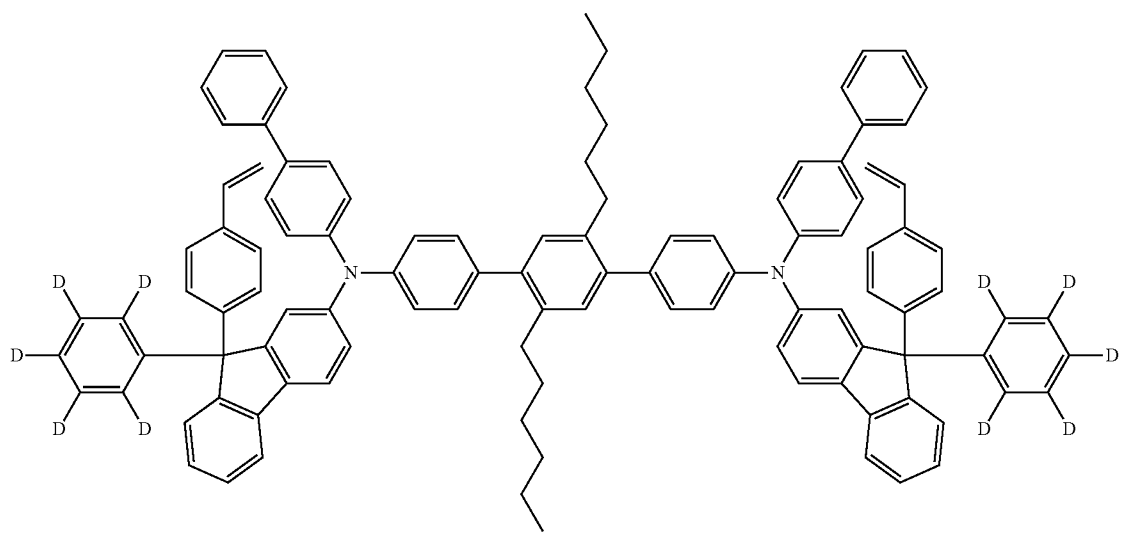
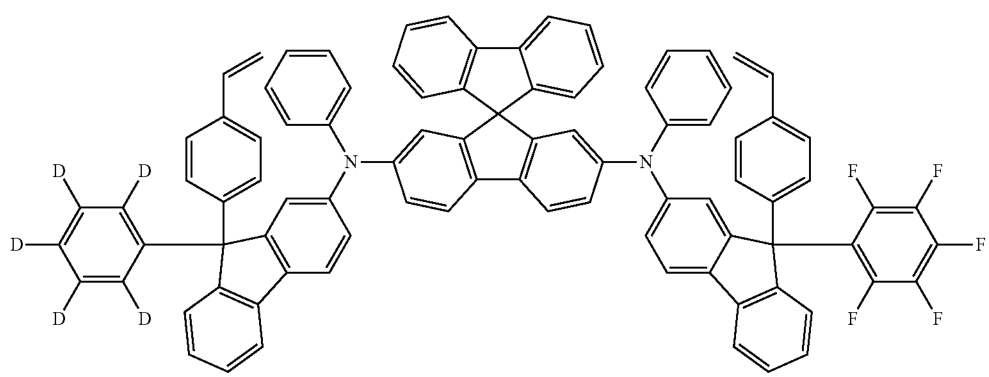
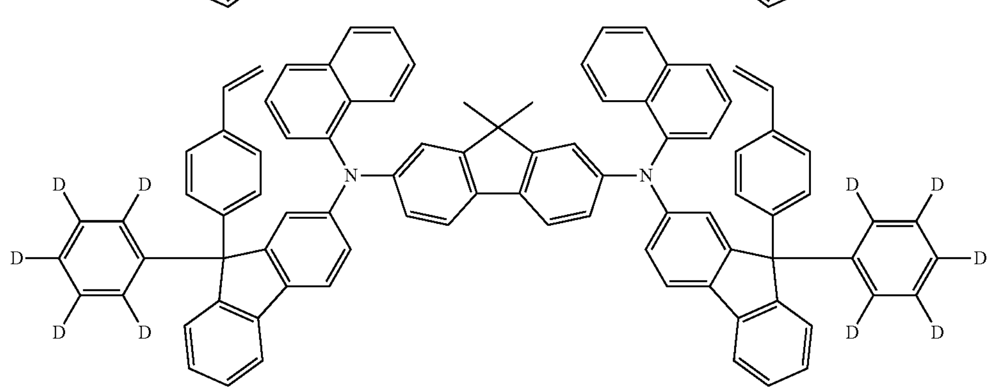

-continued
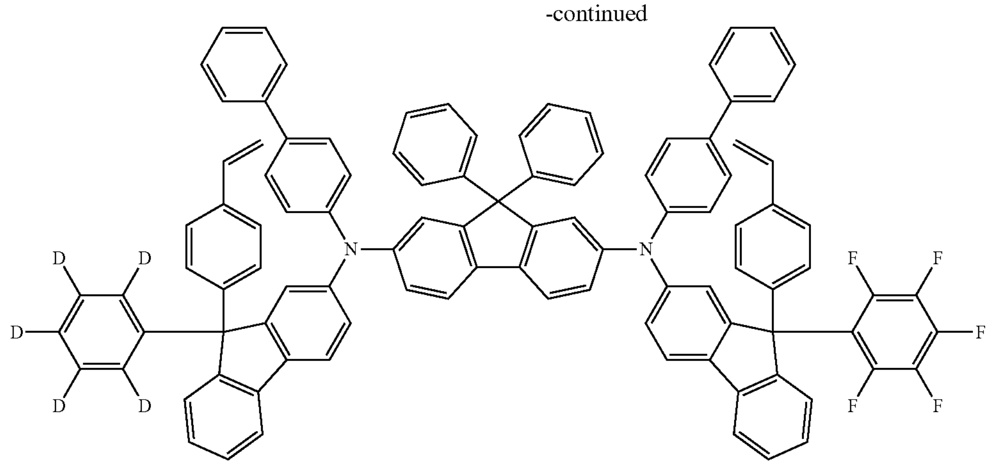
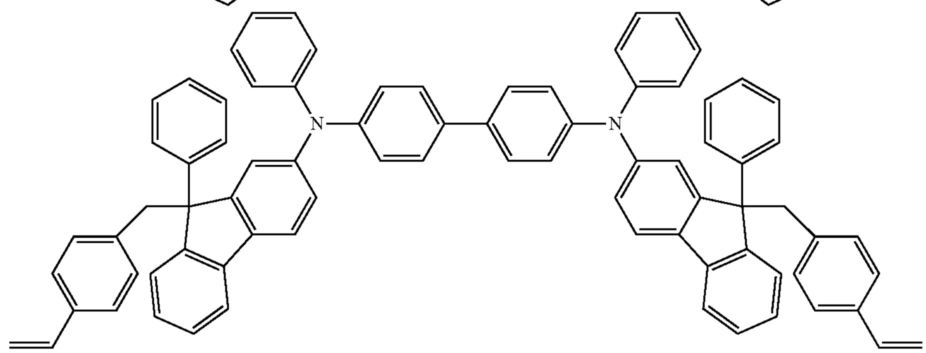
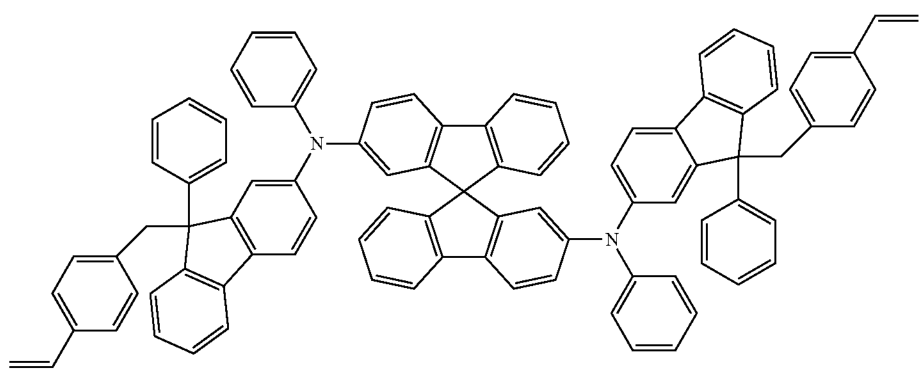
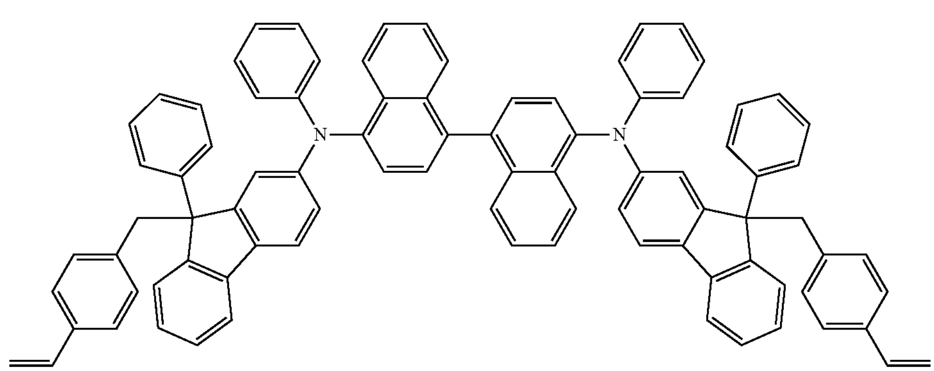

-continued
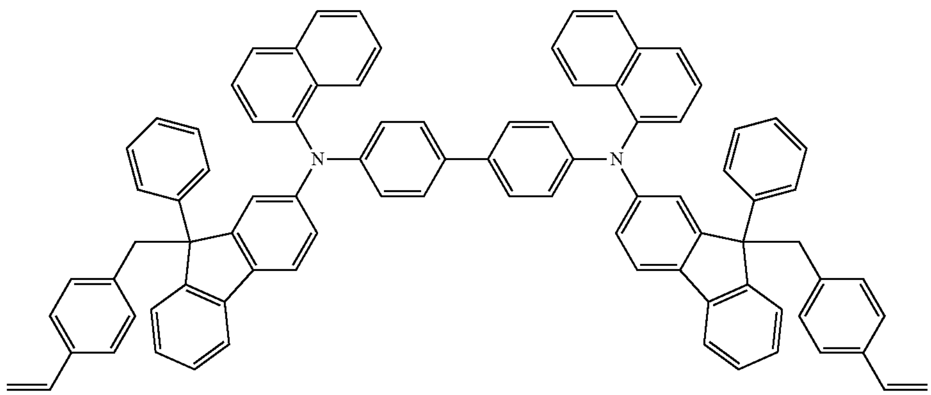
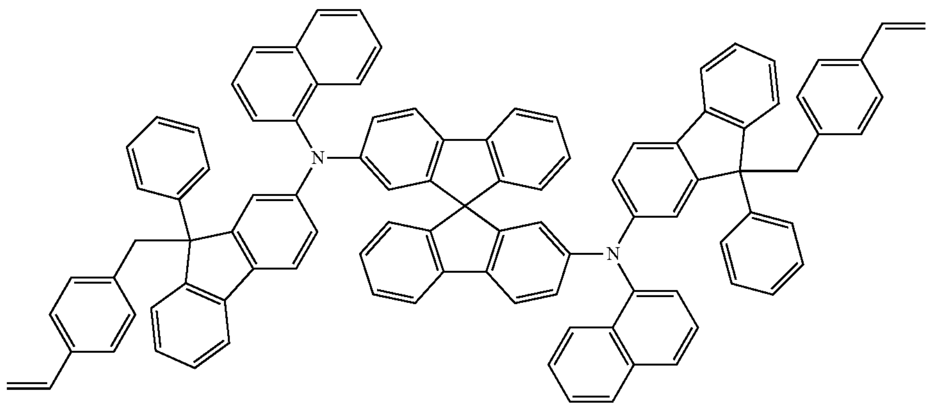
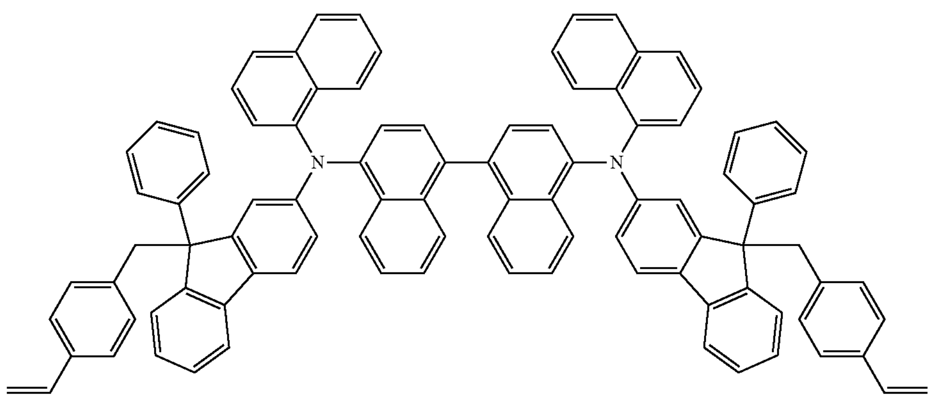
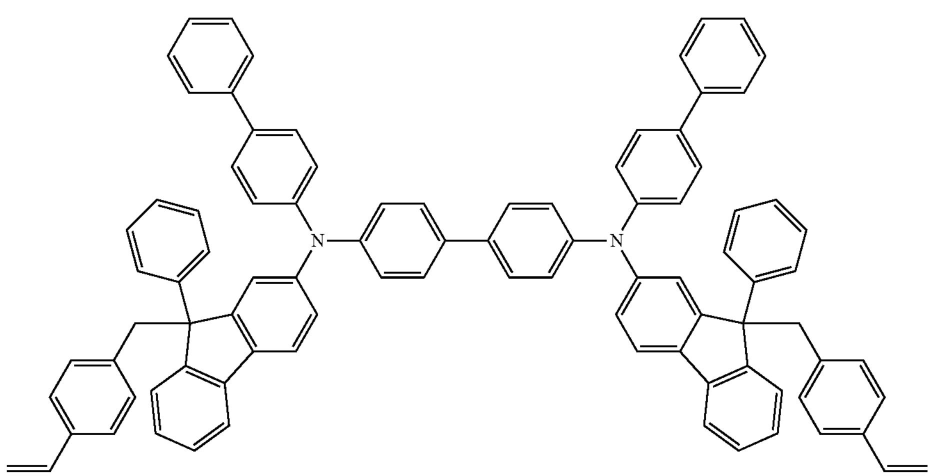

-continued
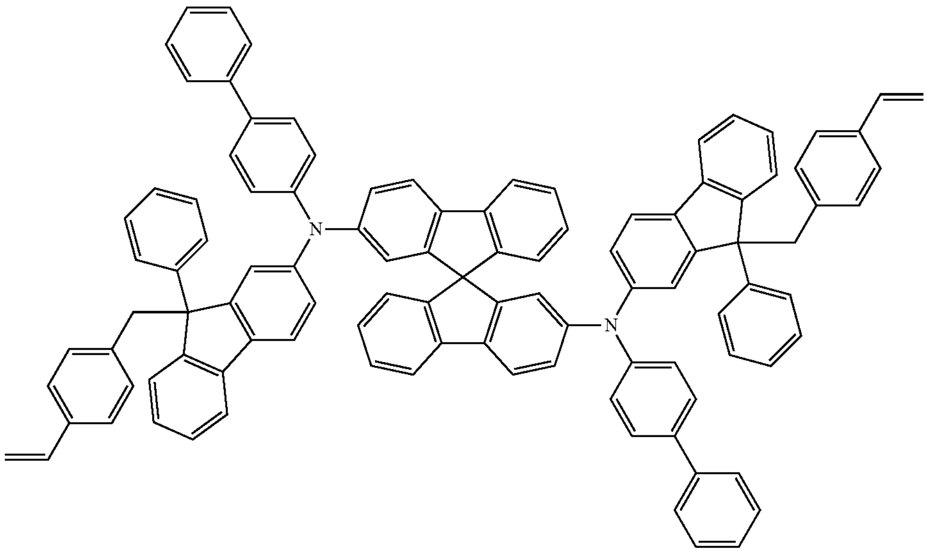
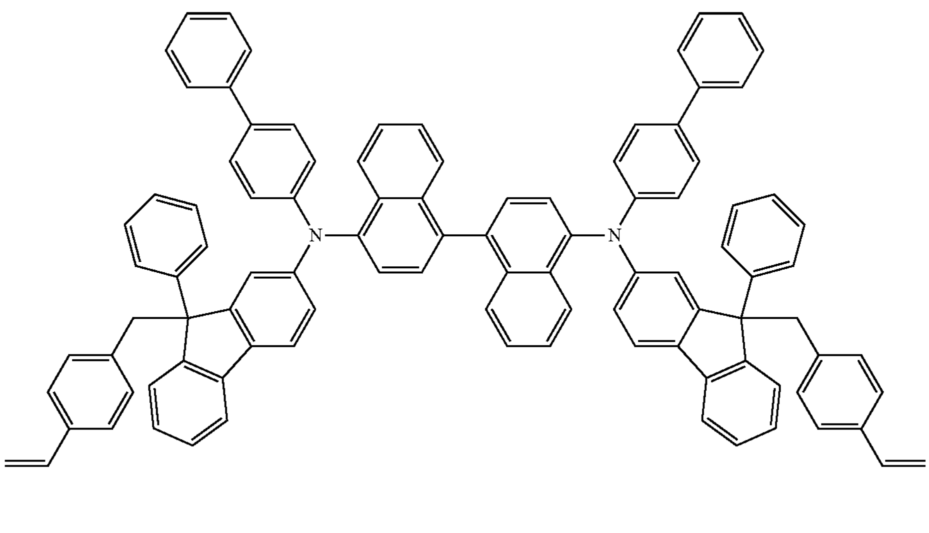
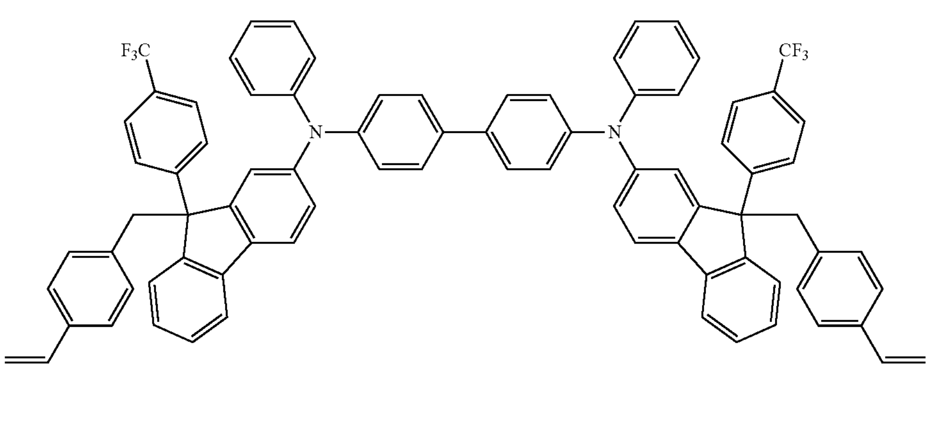

-continued
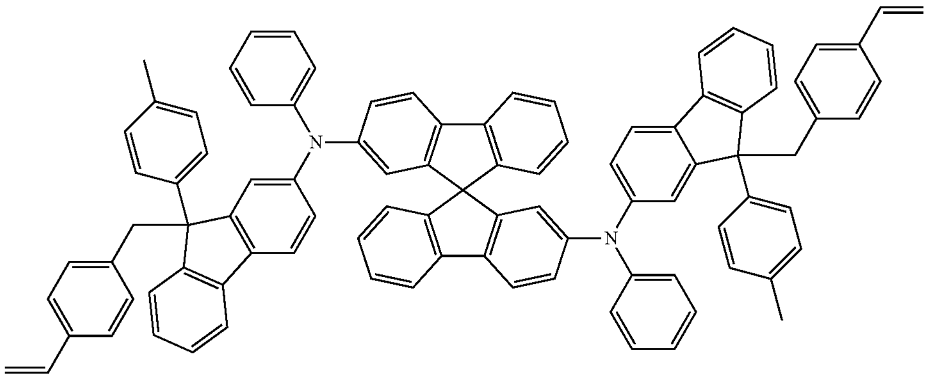
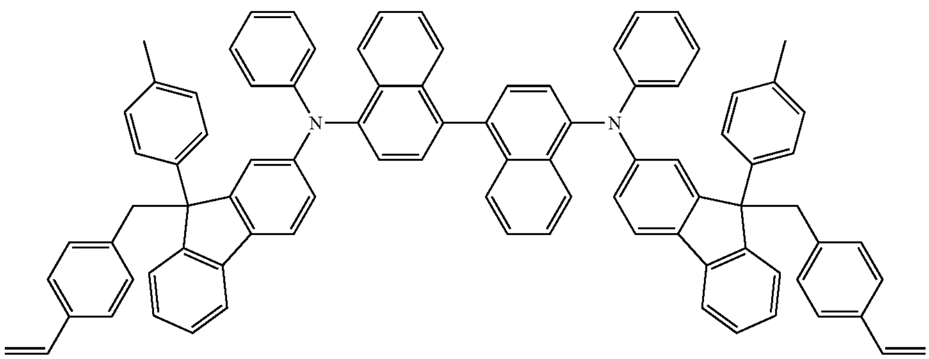
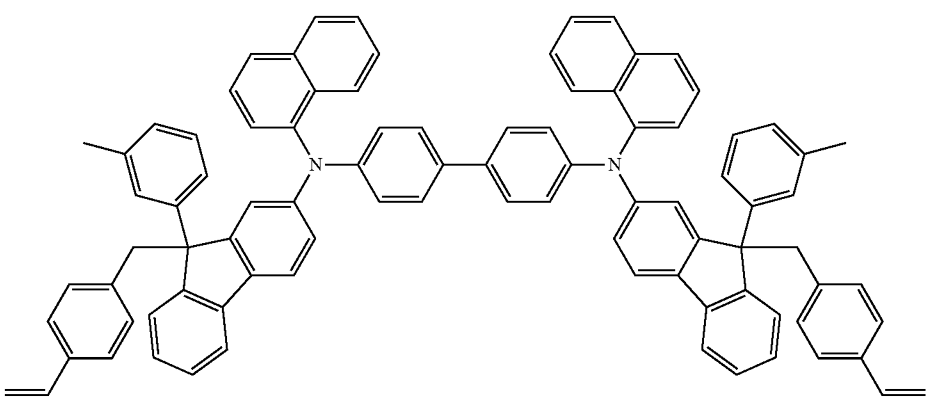
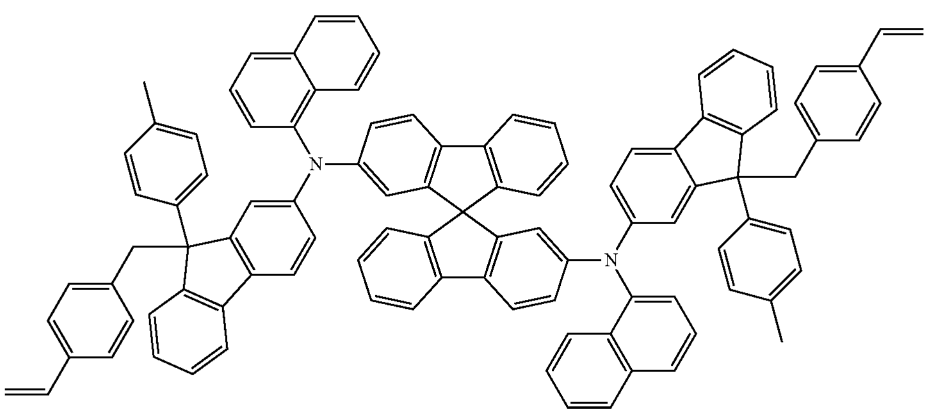

-continued
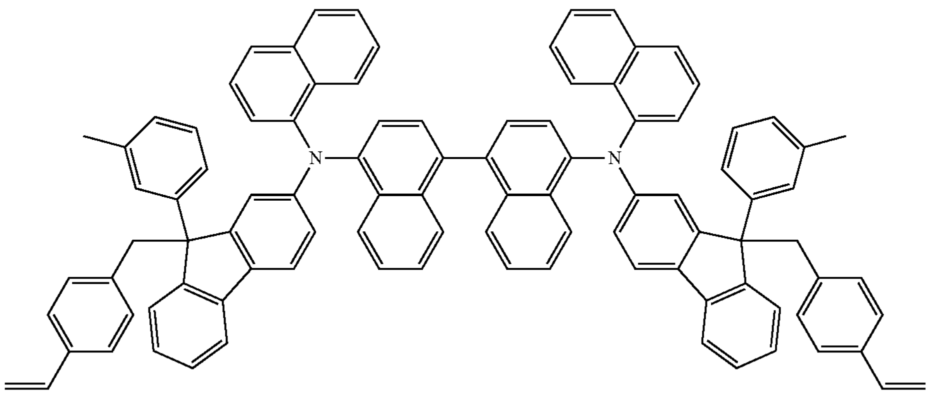
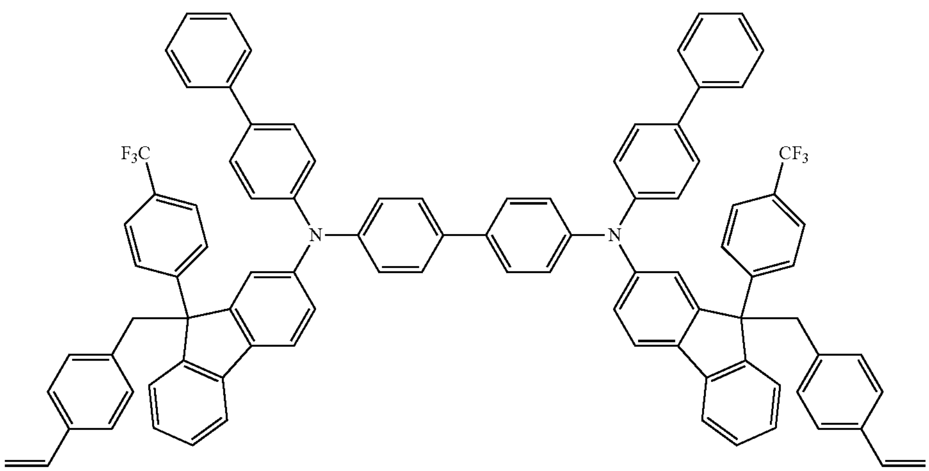
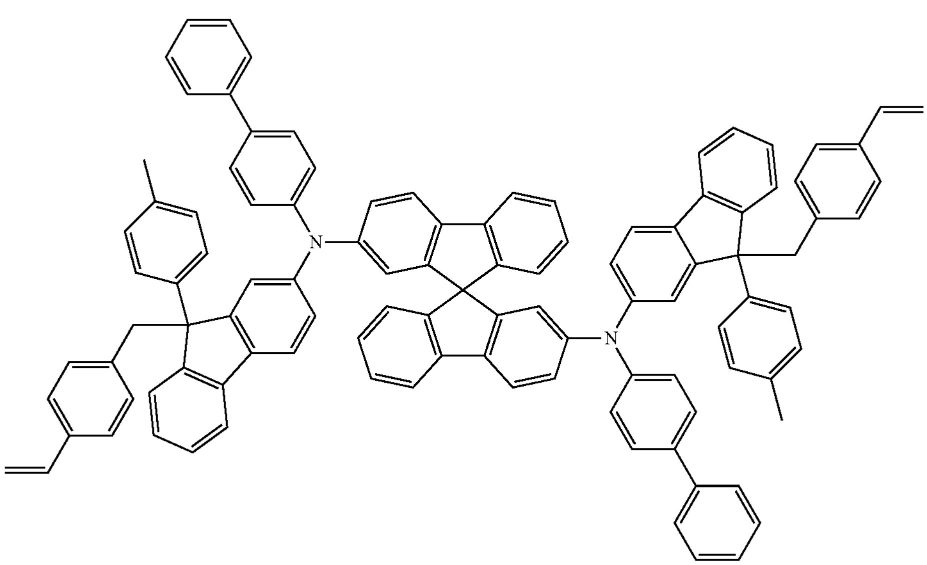

-continued
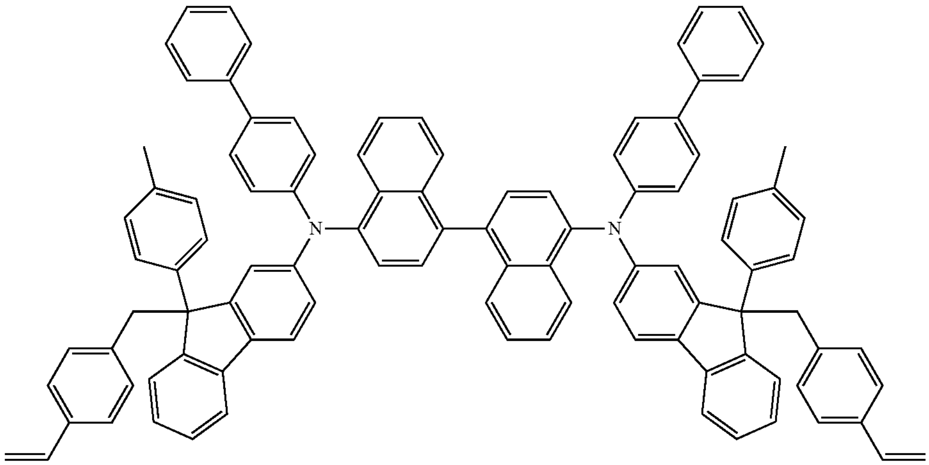
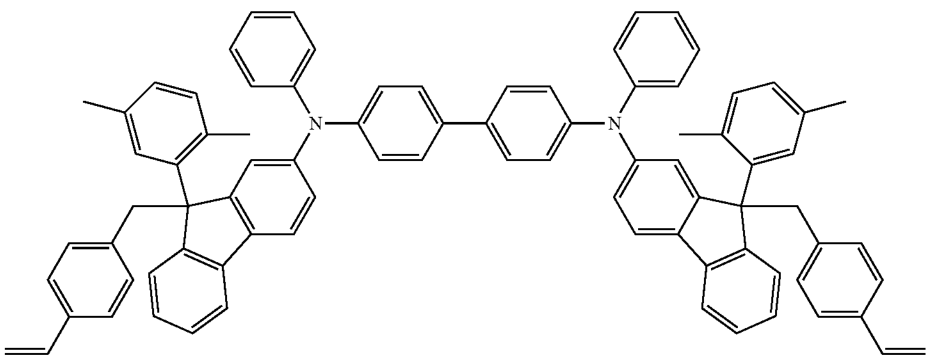
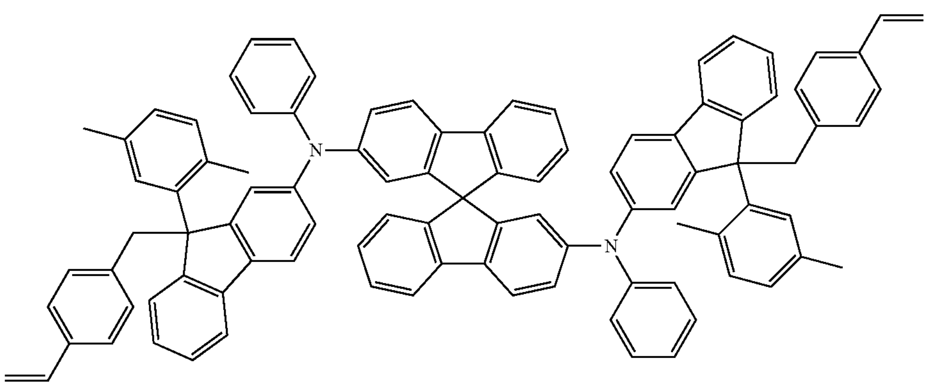
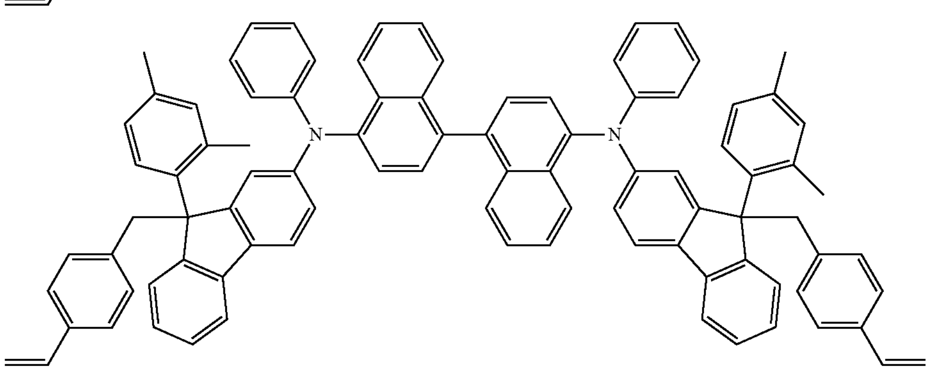

-continued
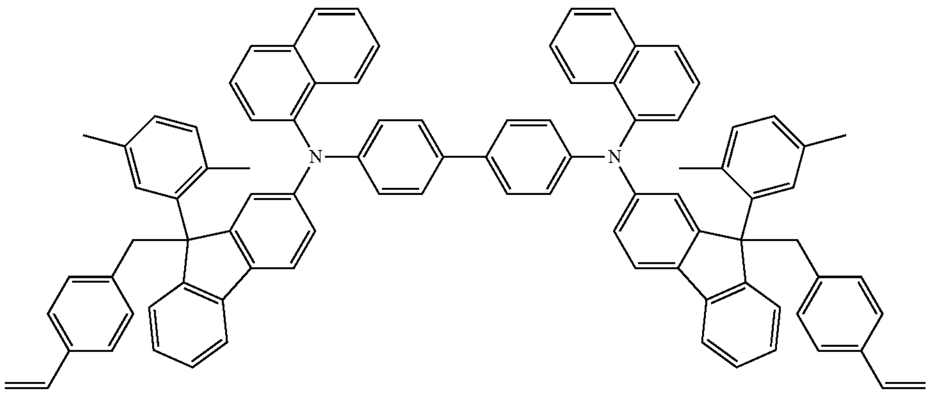
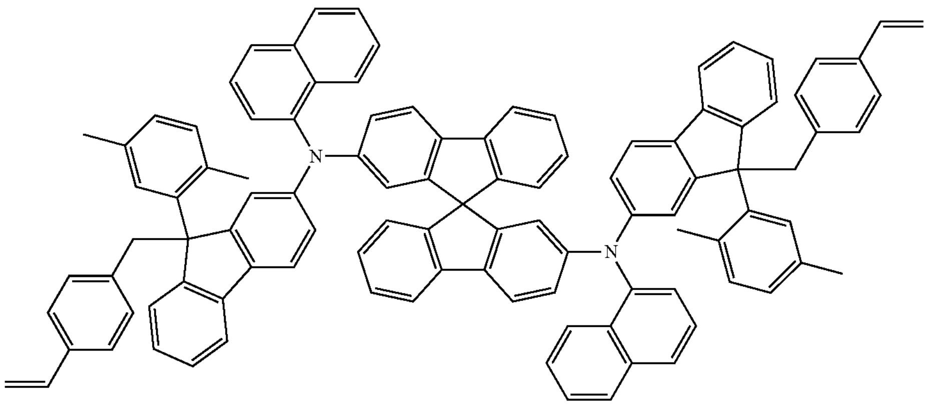
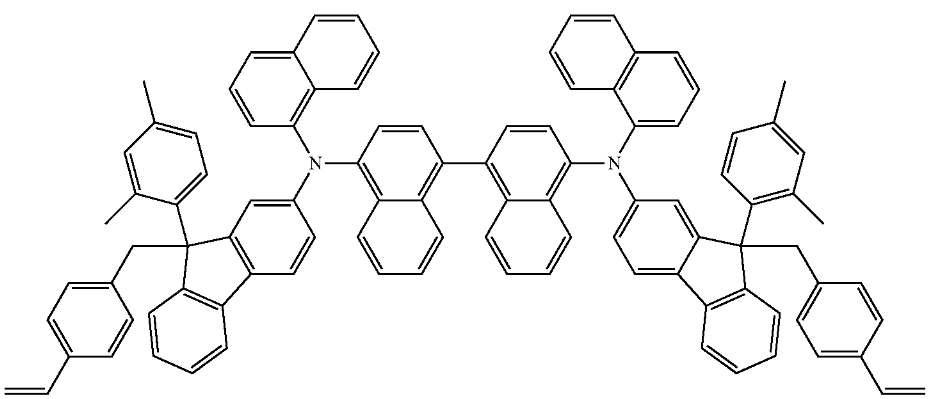
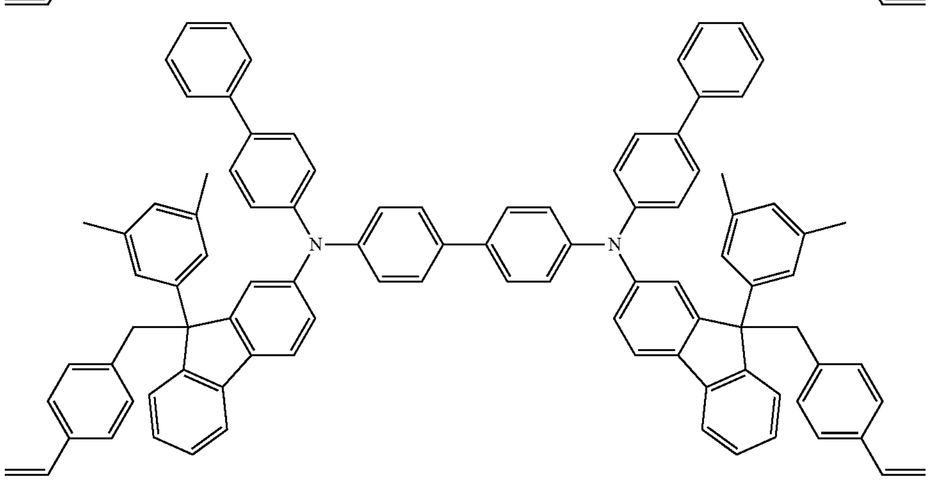

-continued
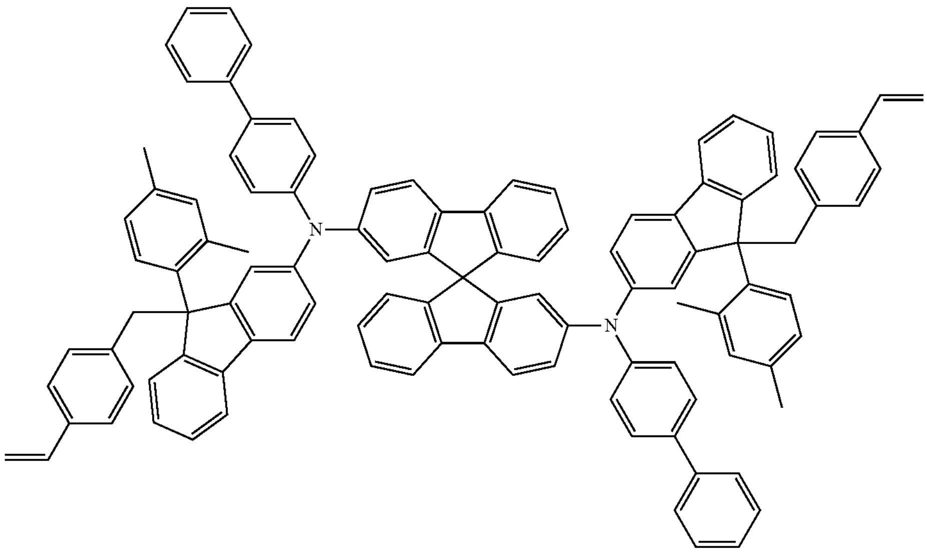
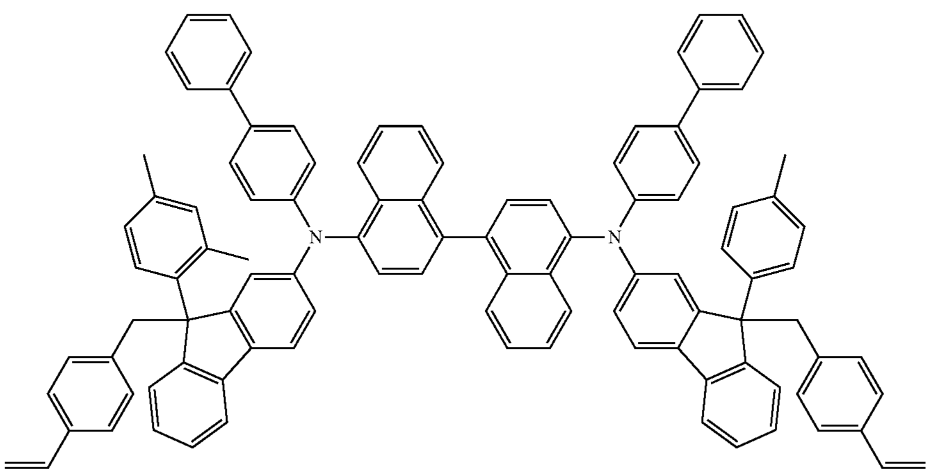
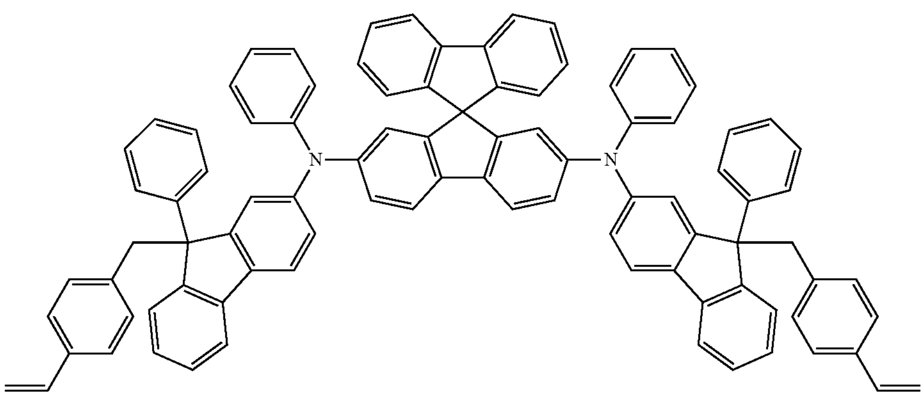

-continued
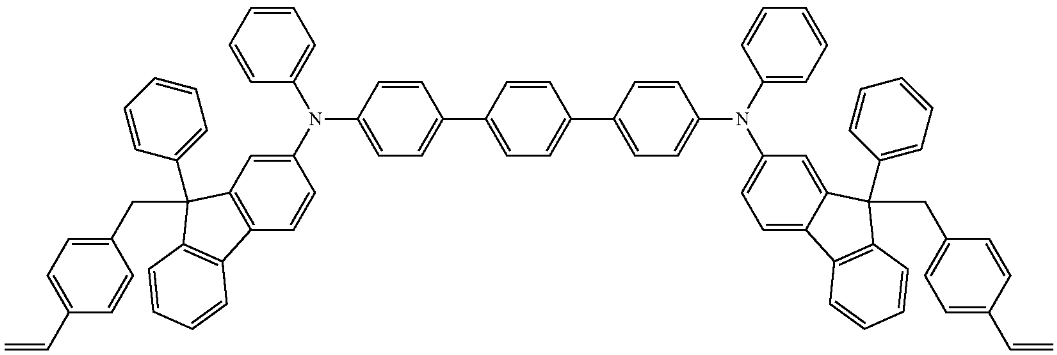
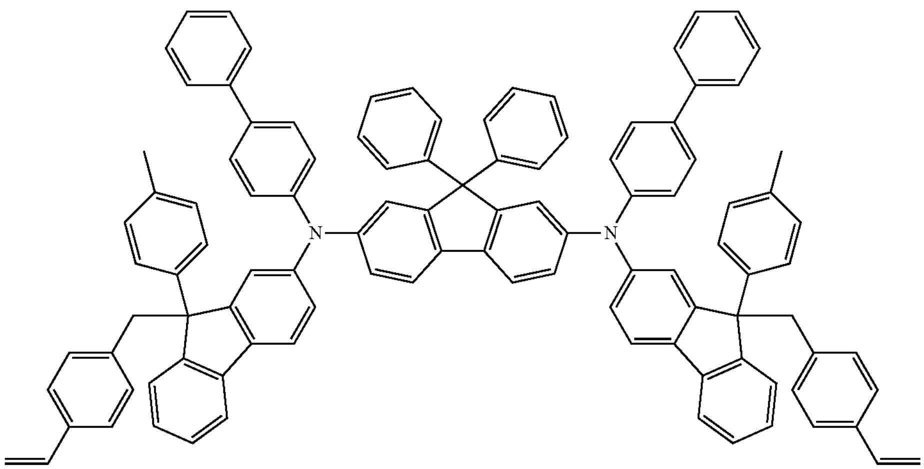
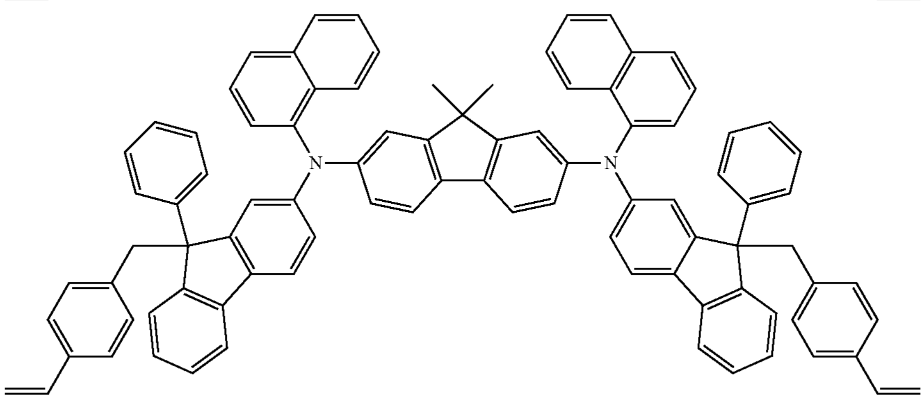
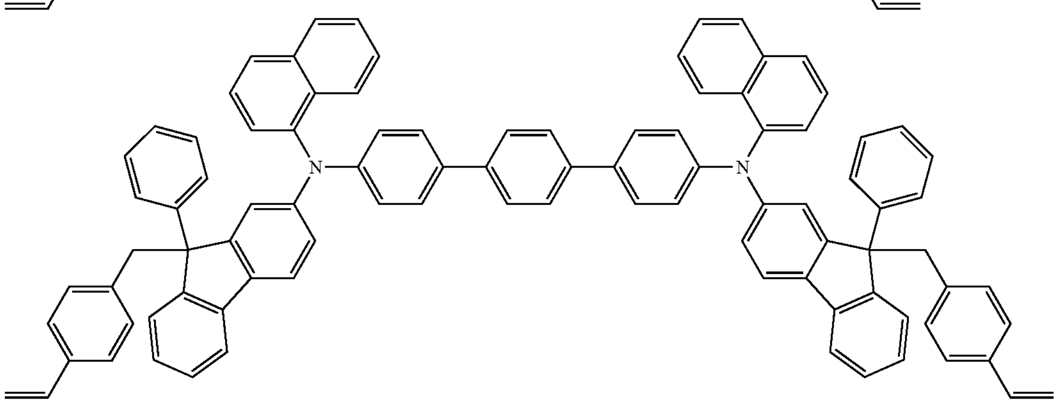

-continued
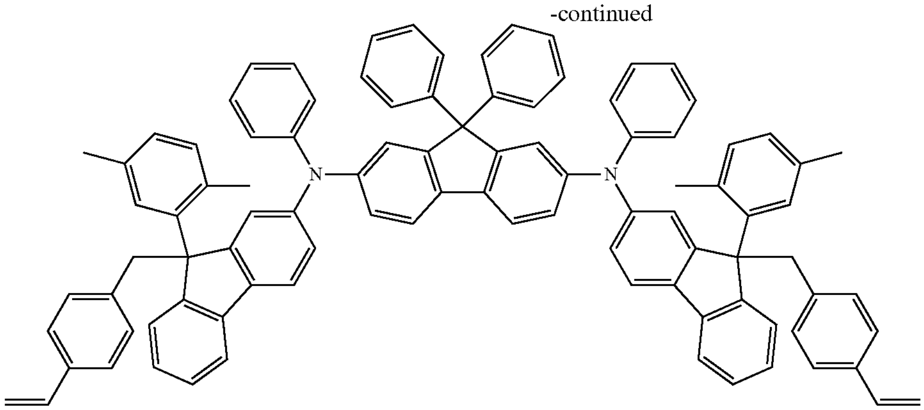
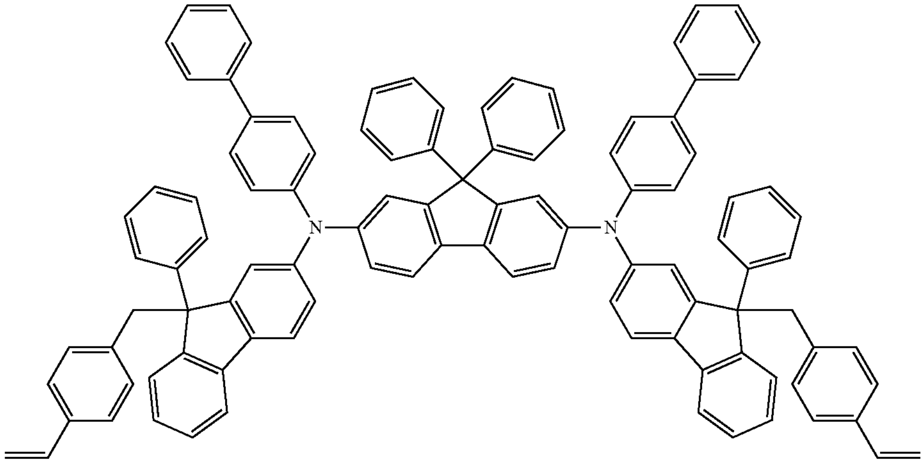
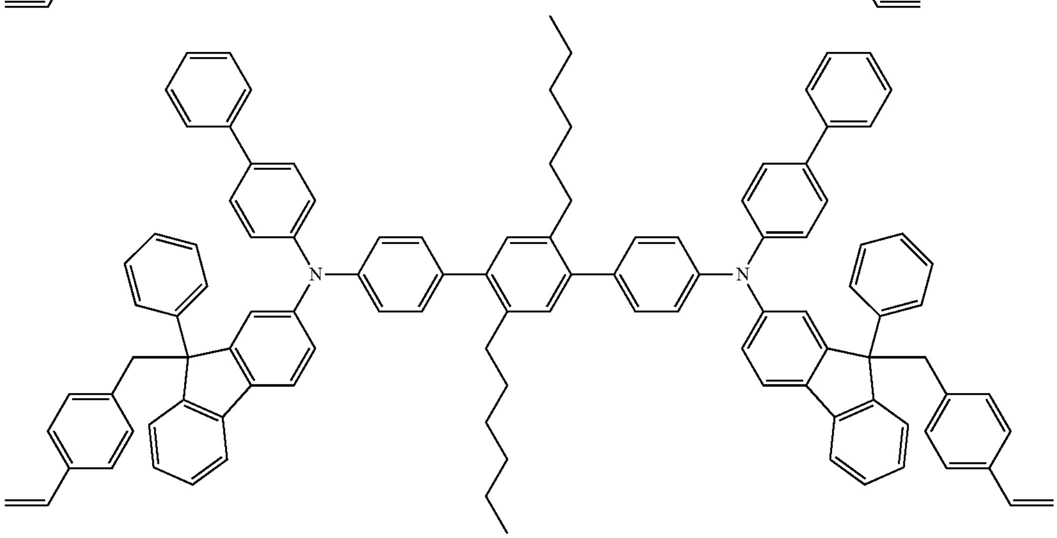
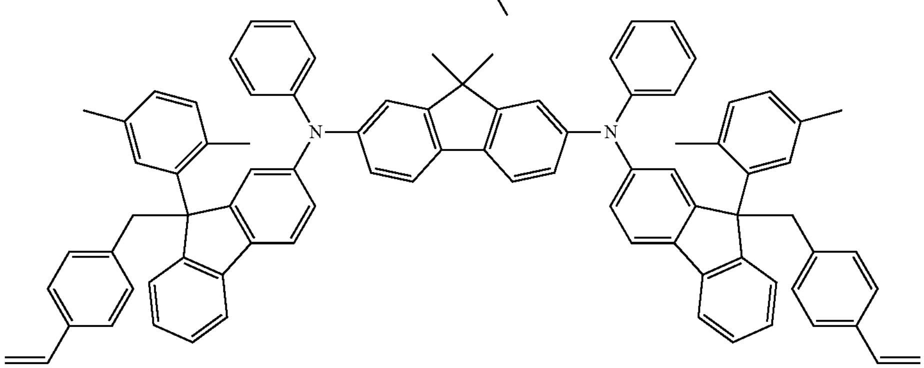

-continued
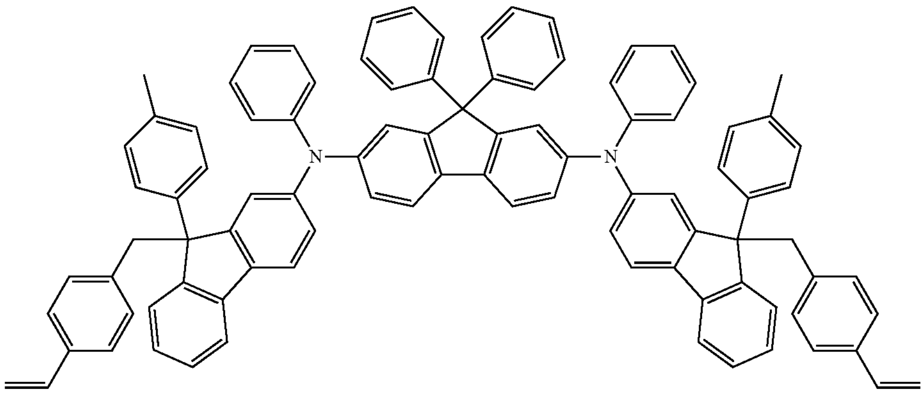
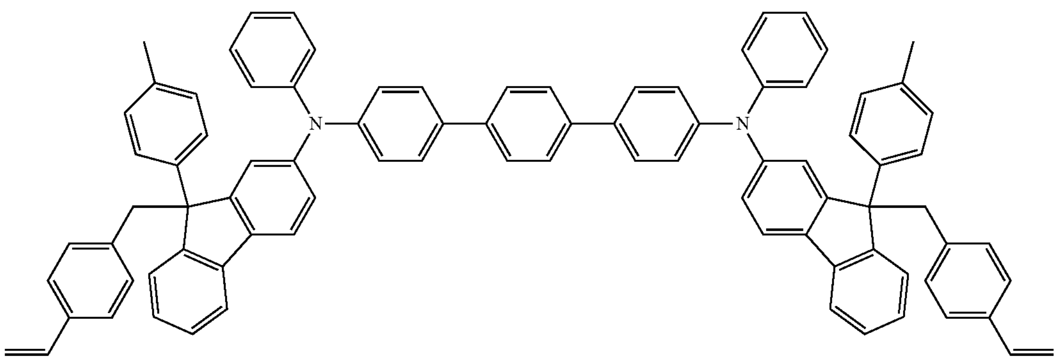
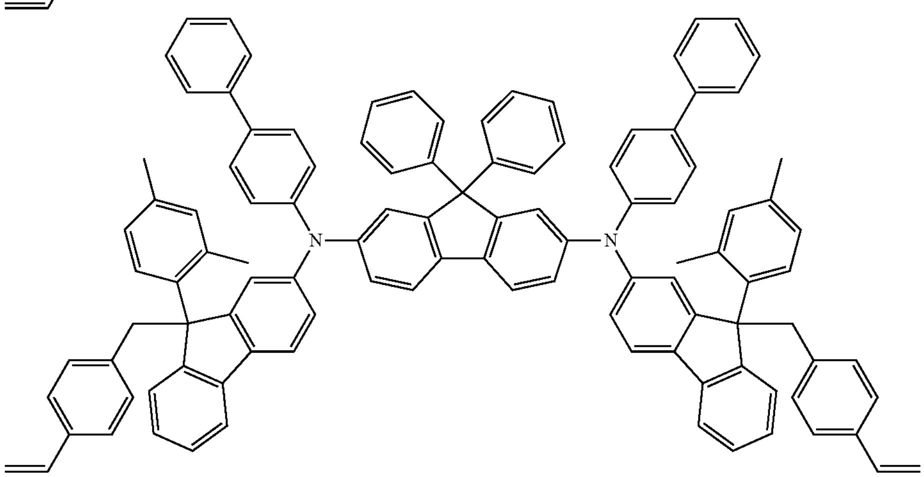
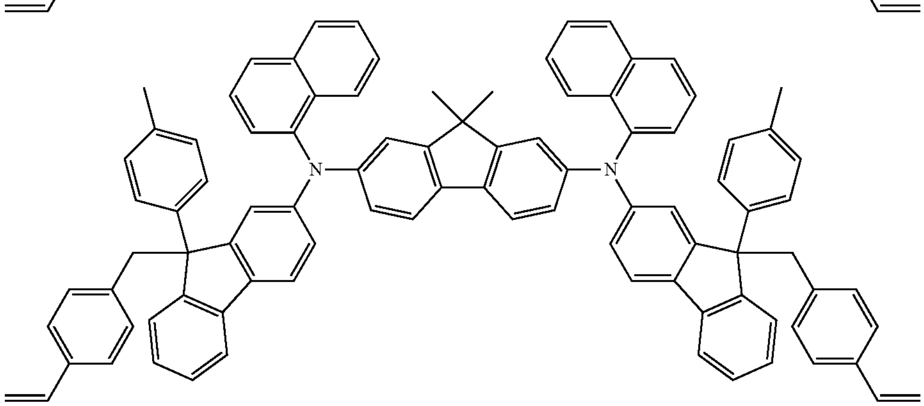

-continued
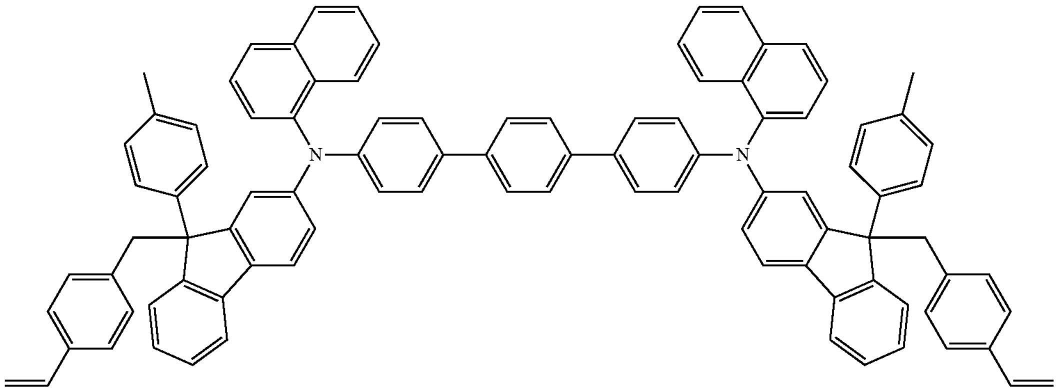
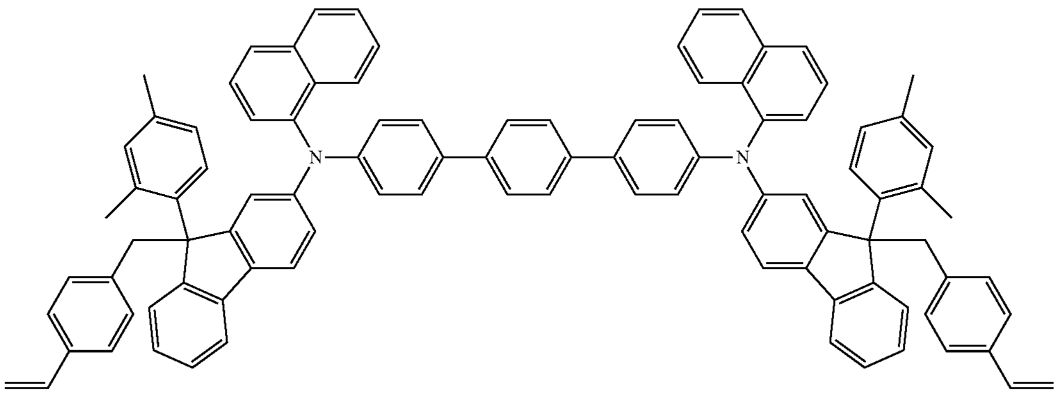
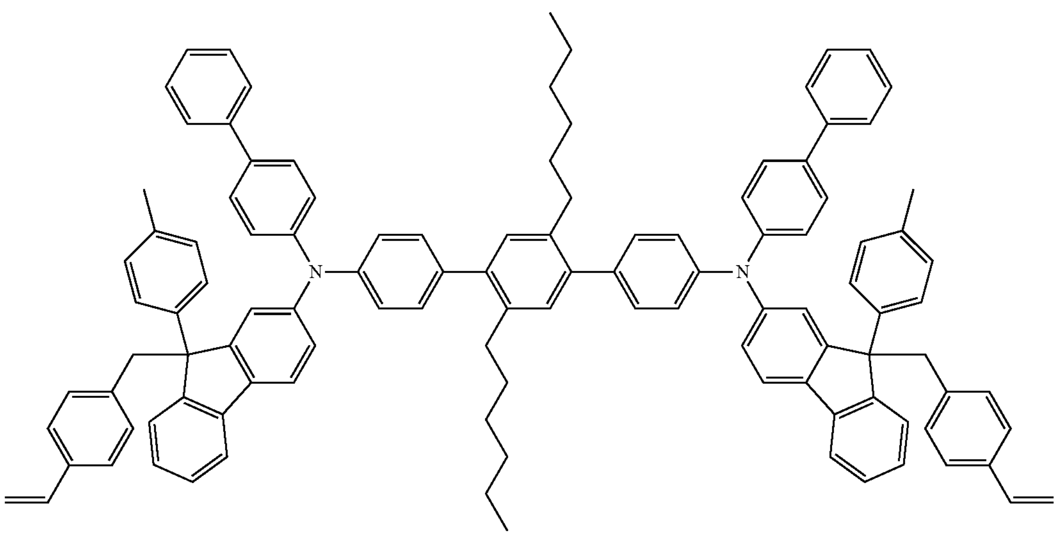
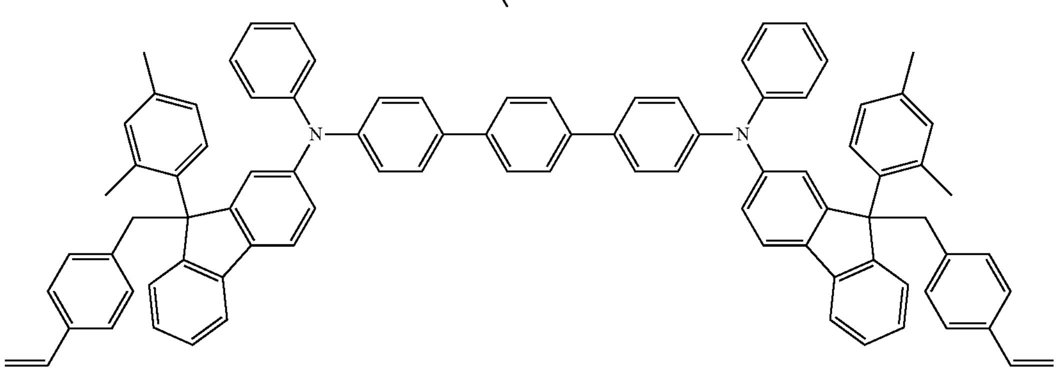

-continued
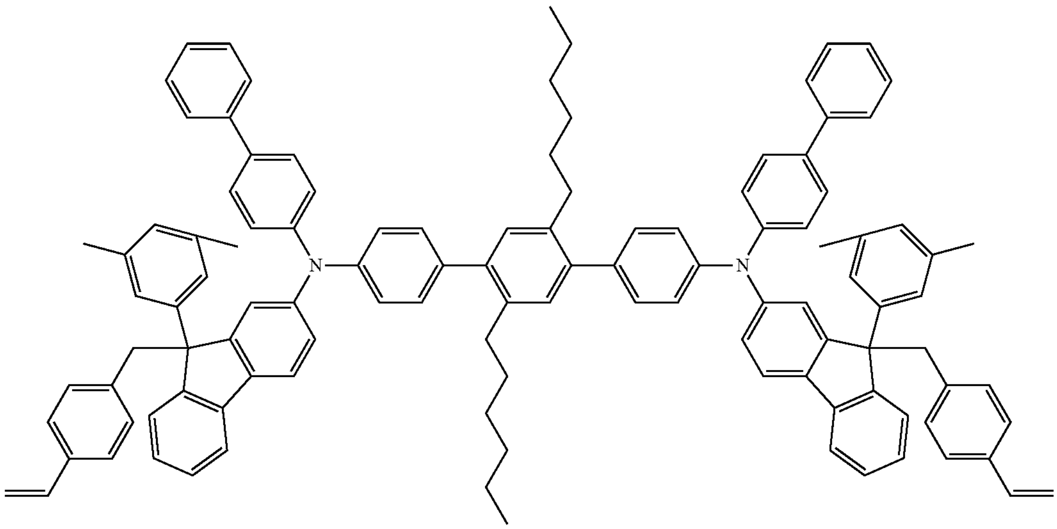
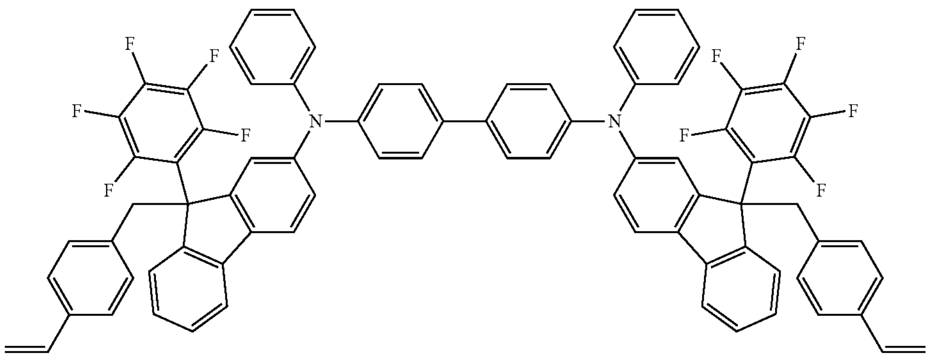
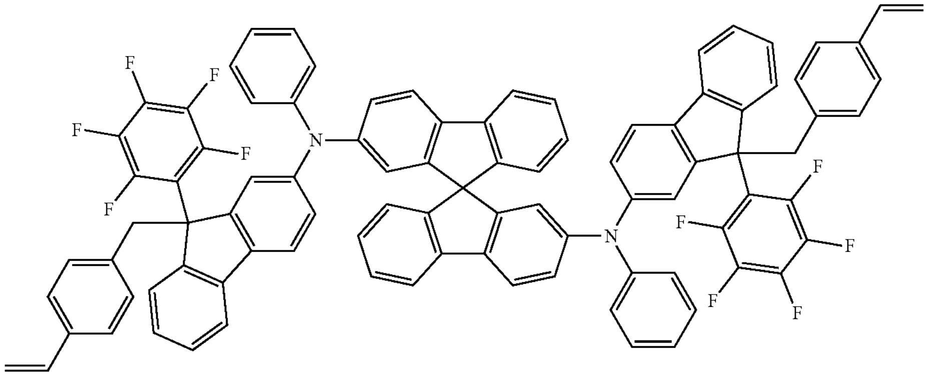
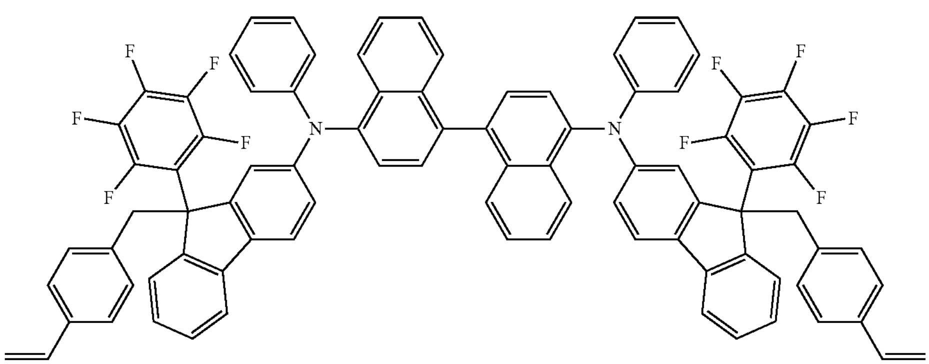

-continued
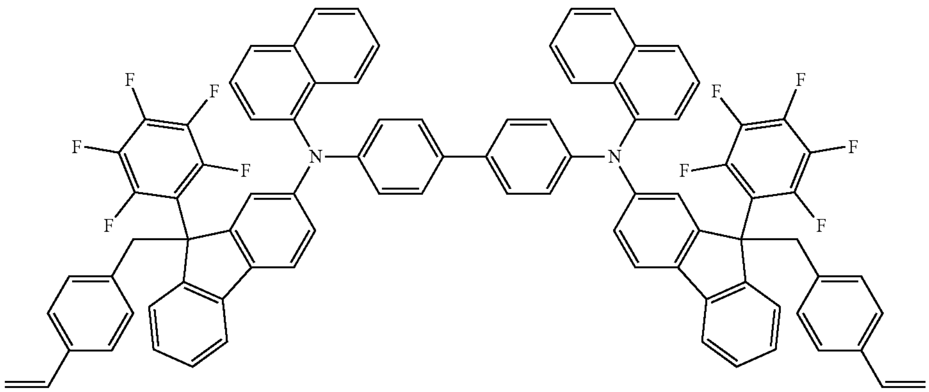
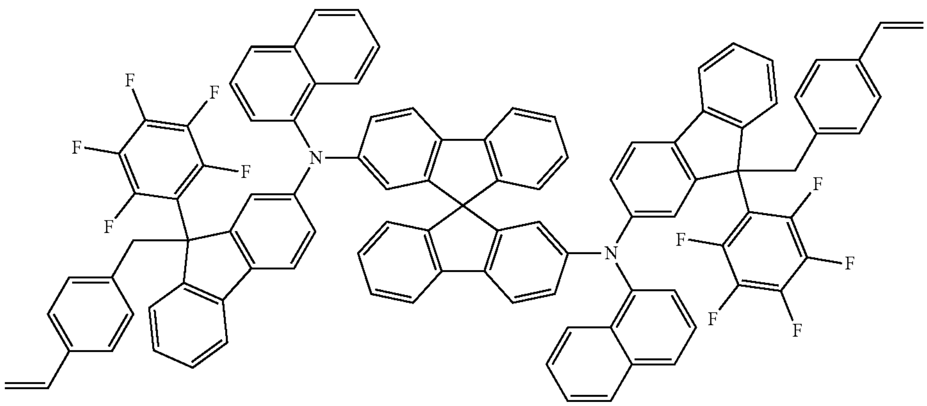
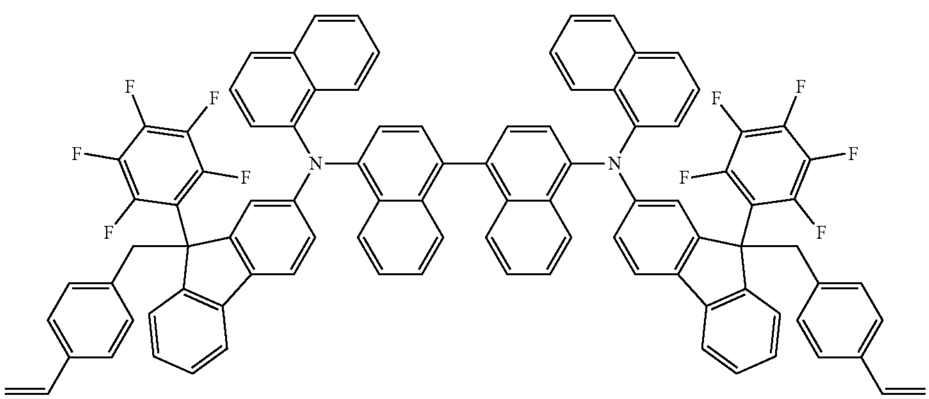
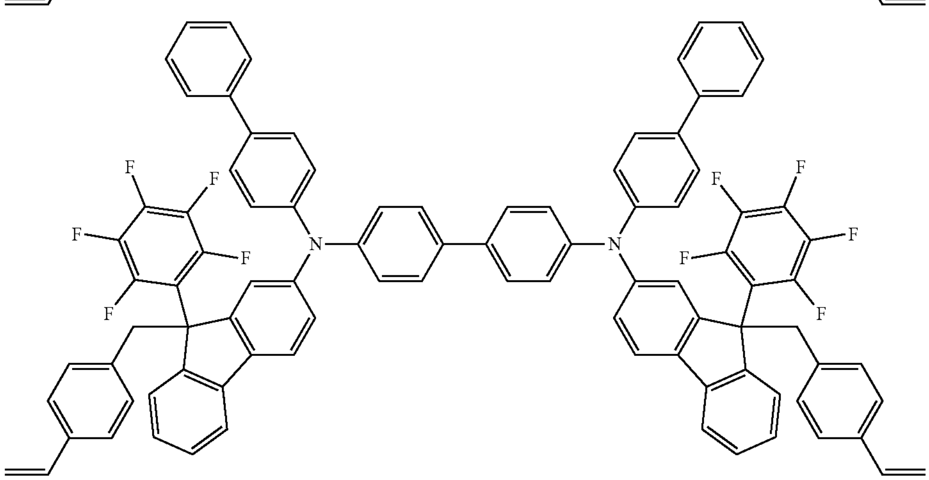

-continued
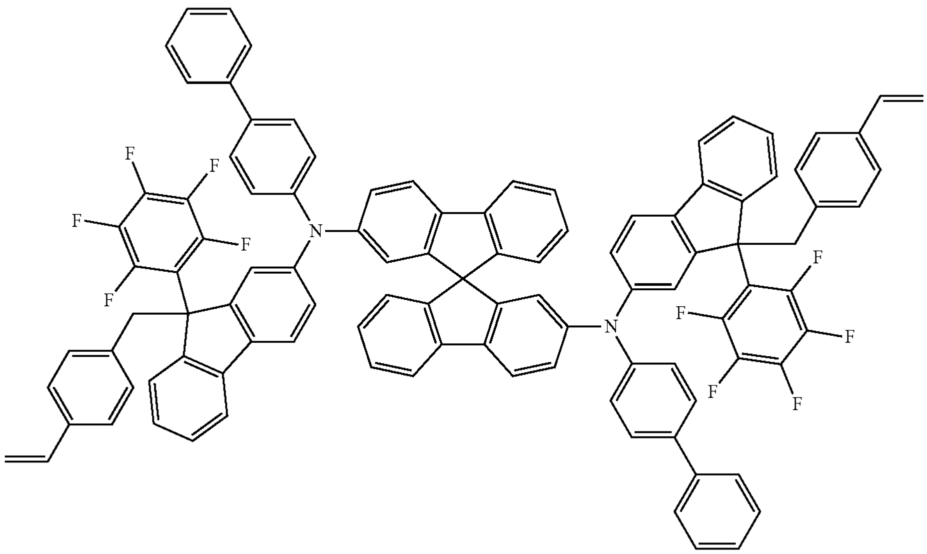
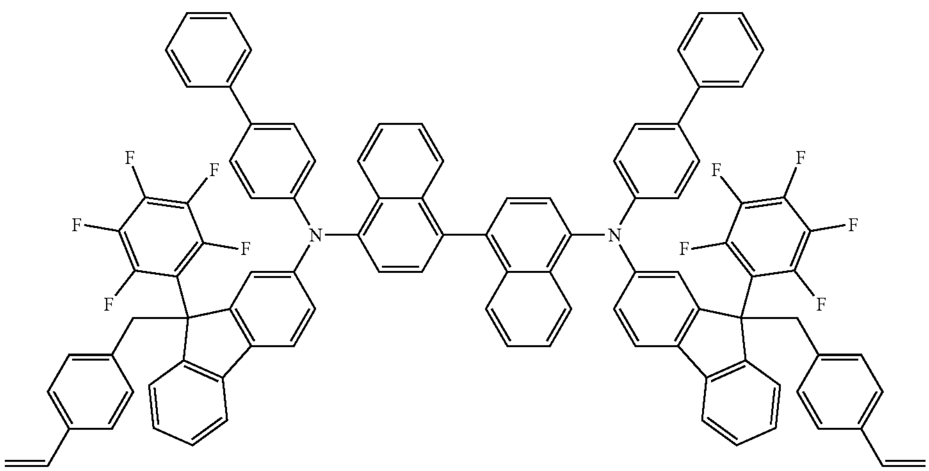
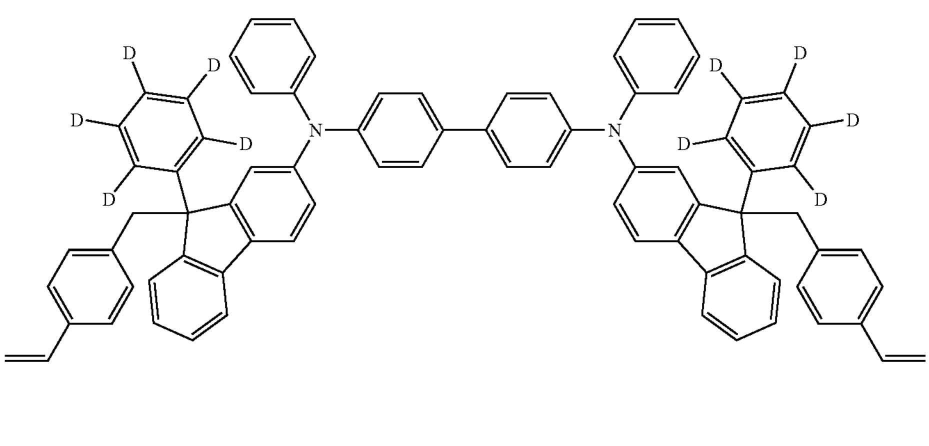

-continued
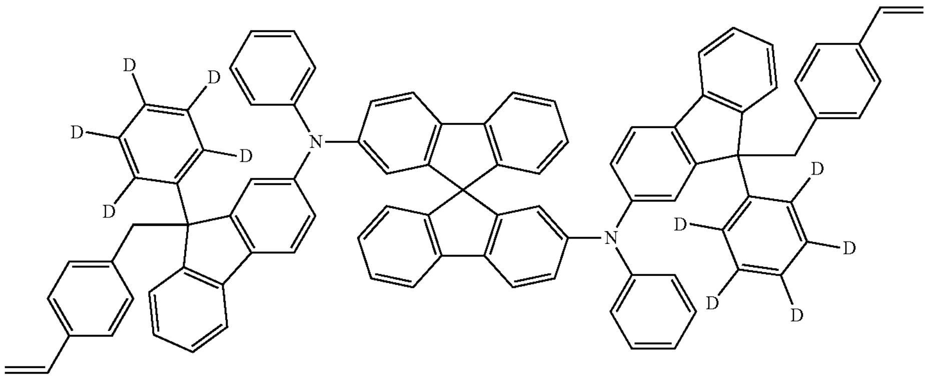
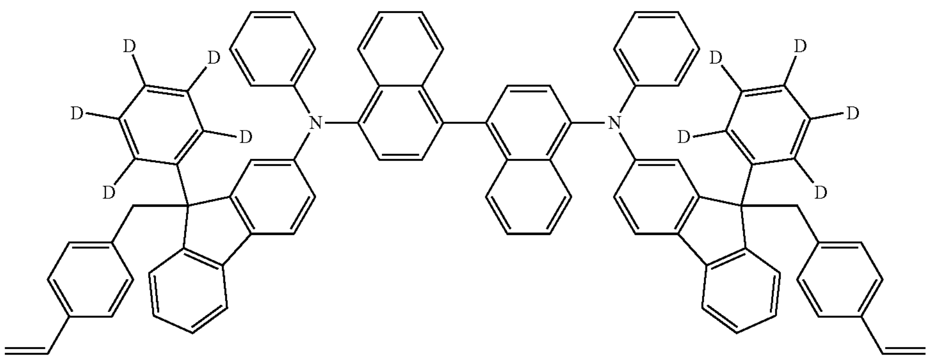
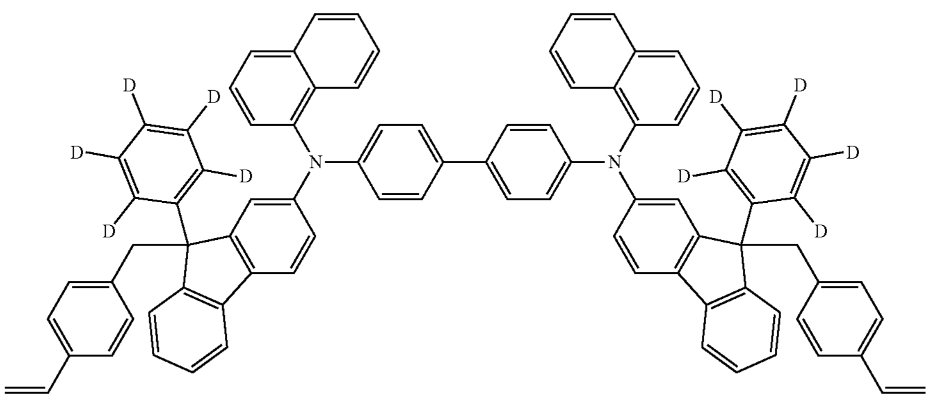
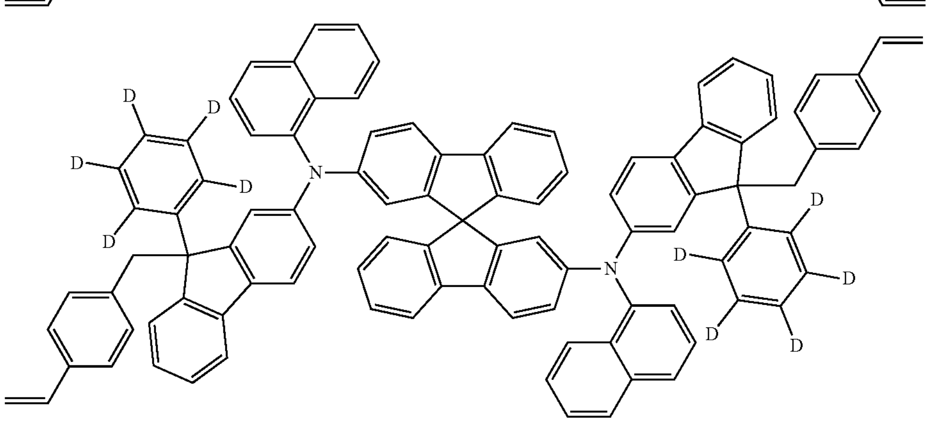

-continued
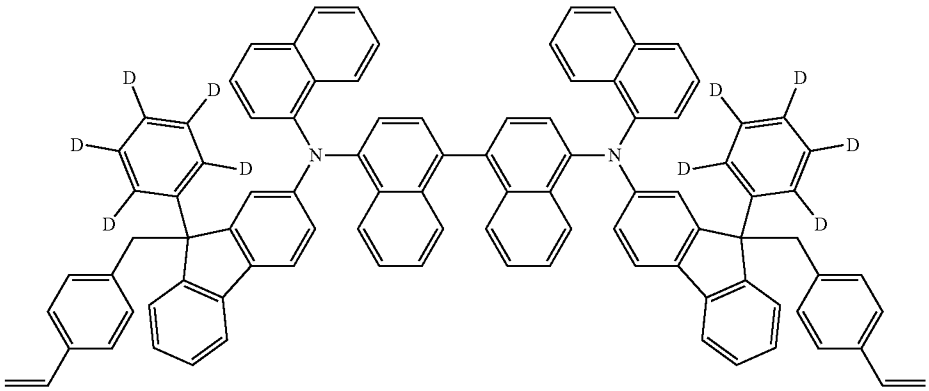
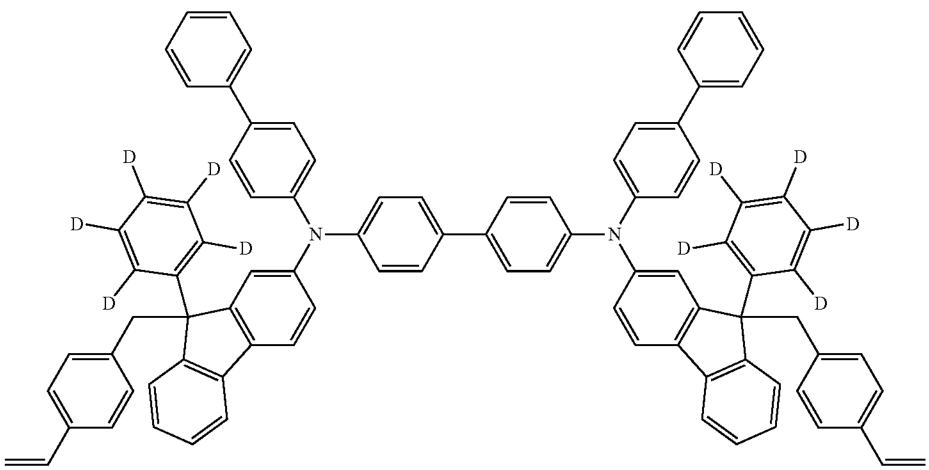
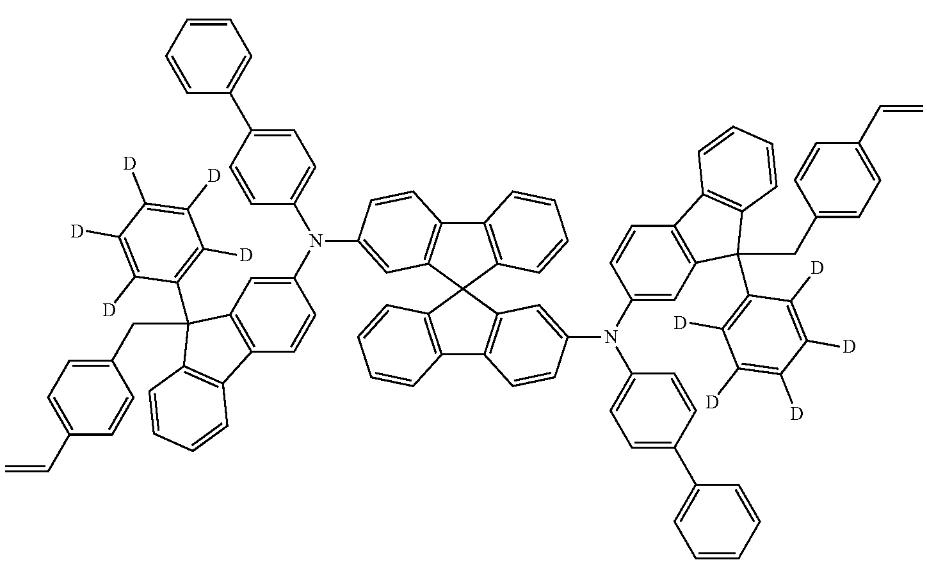

-continued
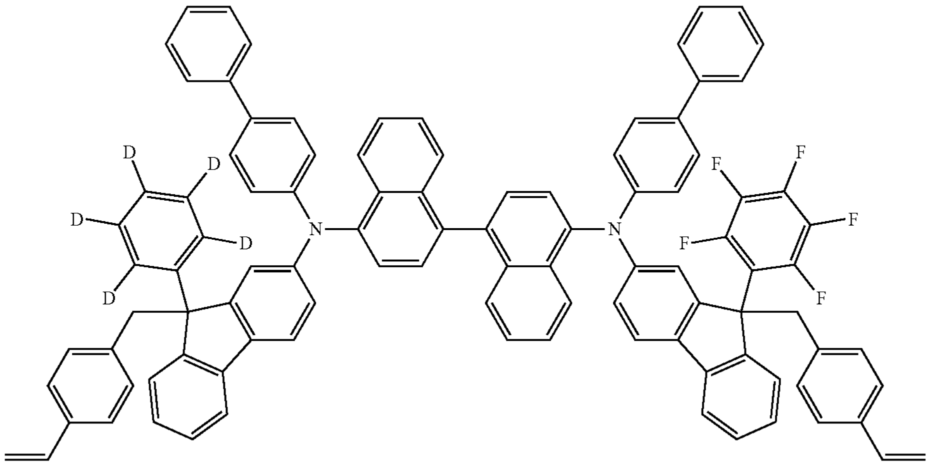
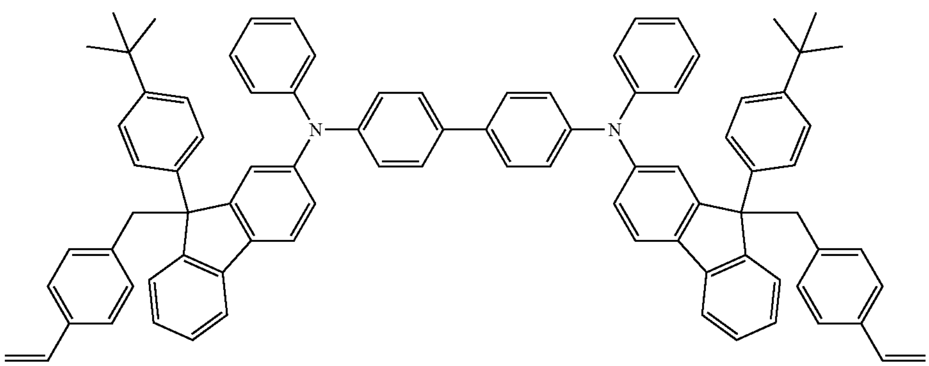
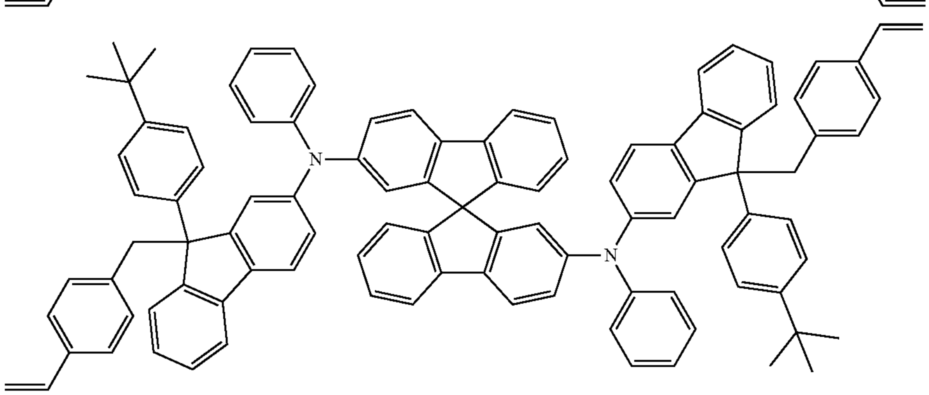
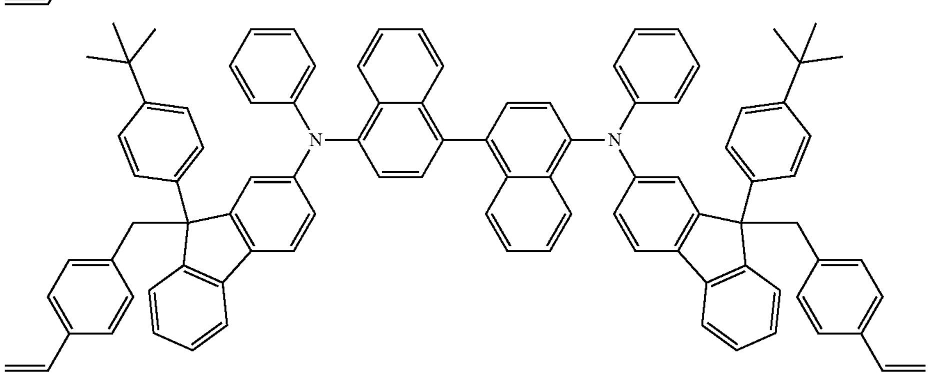

-continued
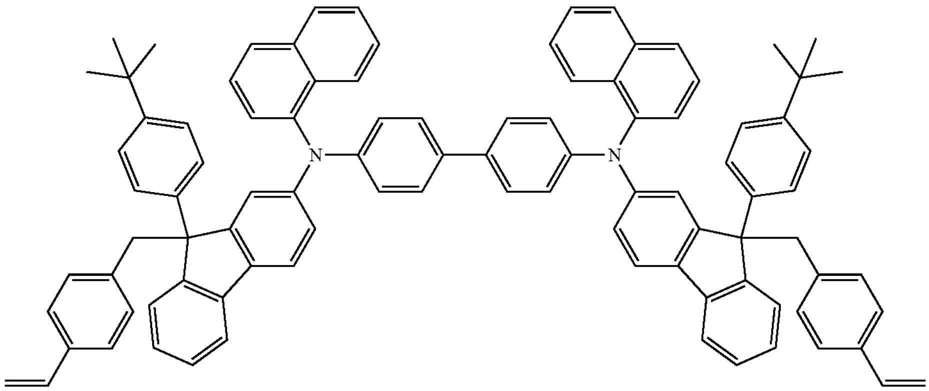
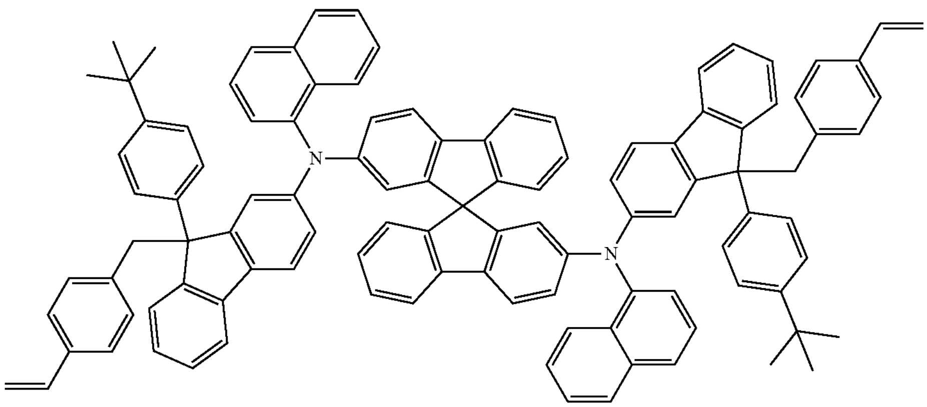
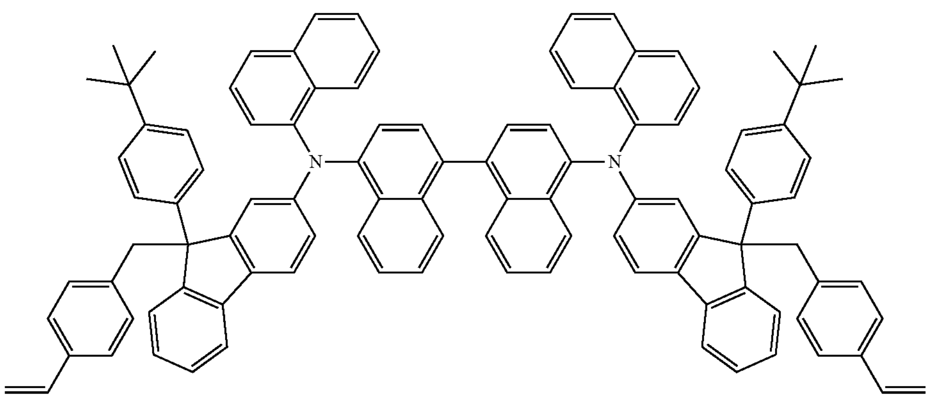
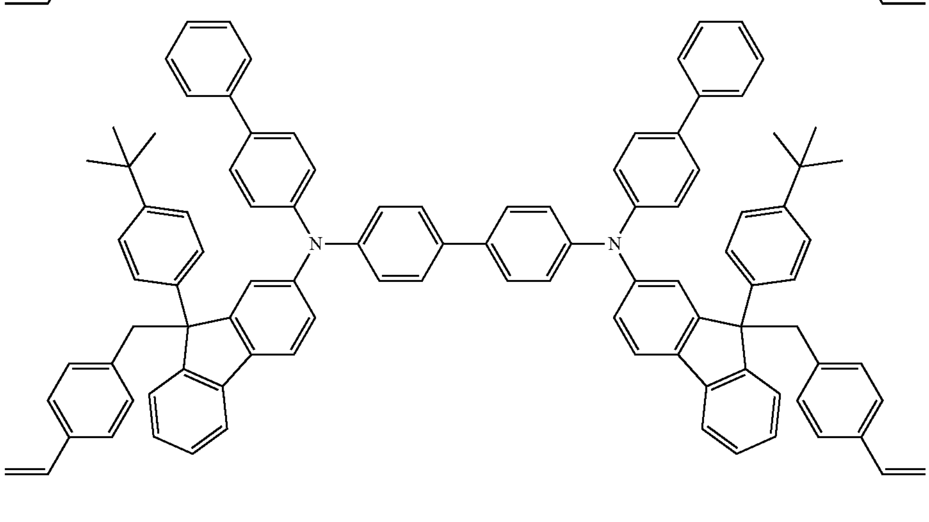

-continued
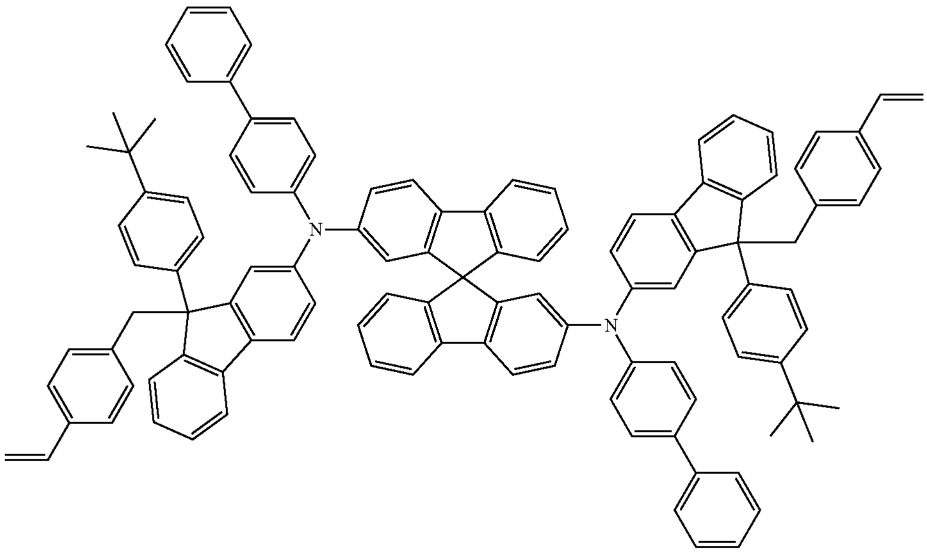
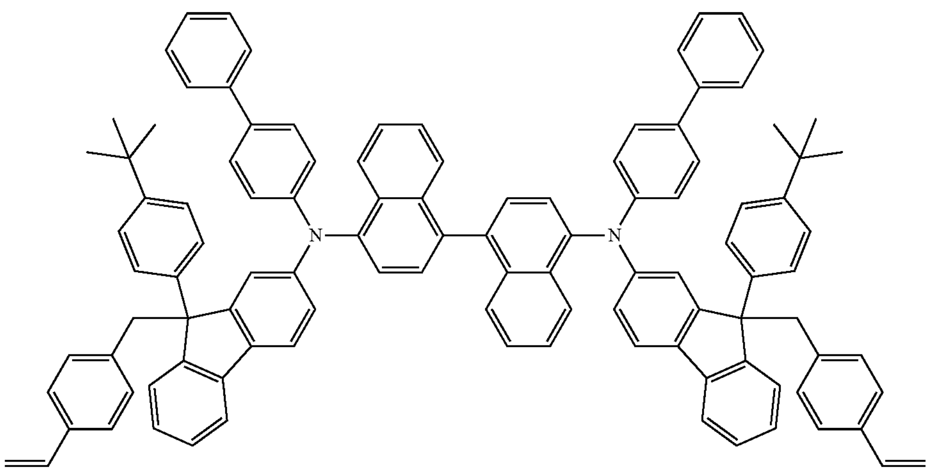
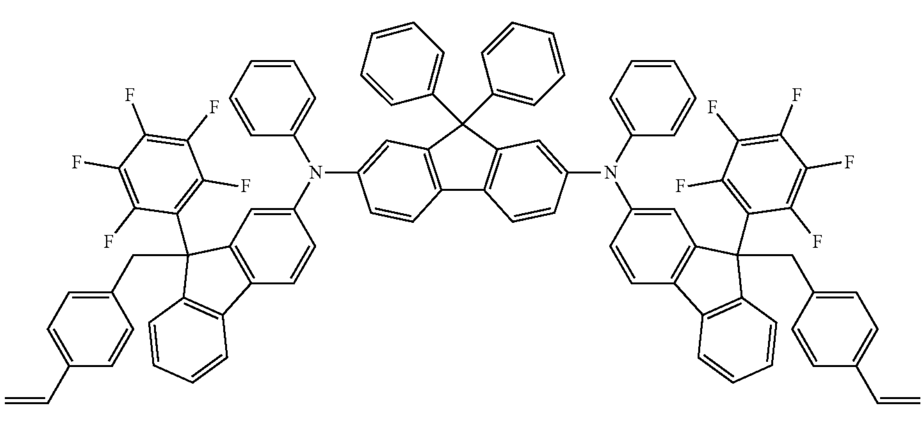

-continued
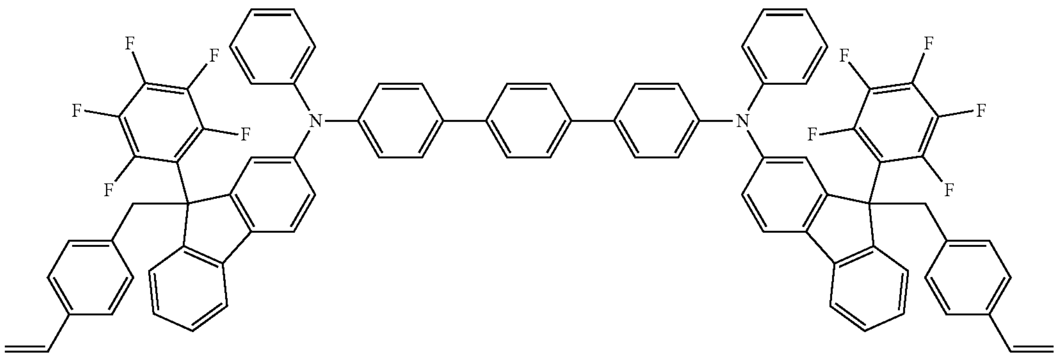
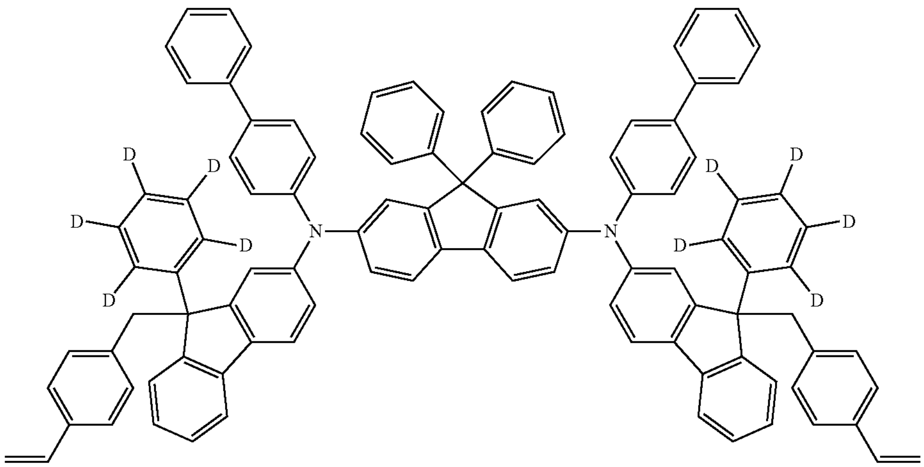
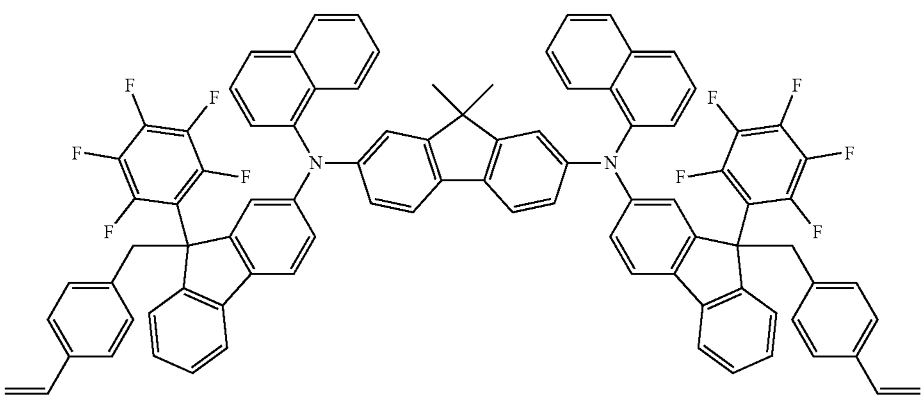
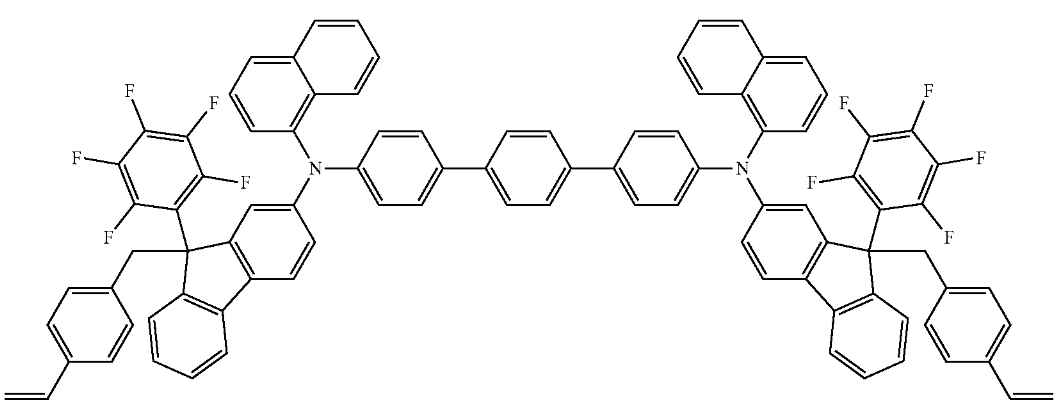

-continued
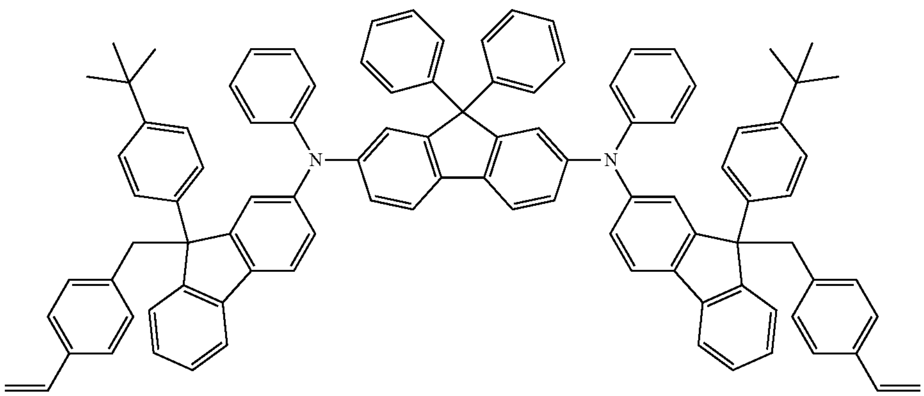
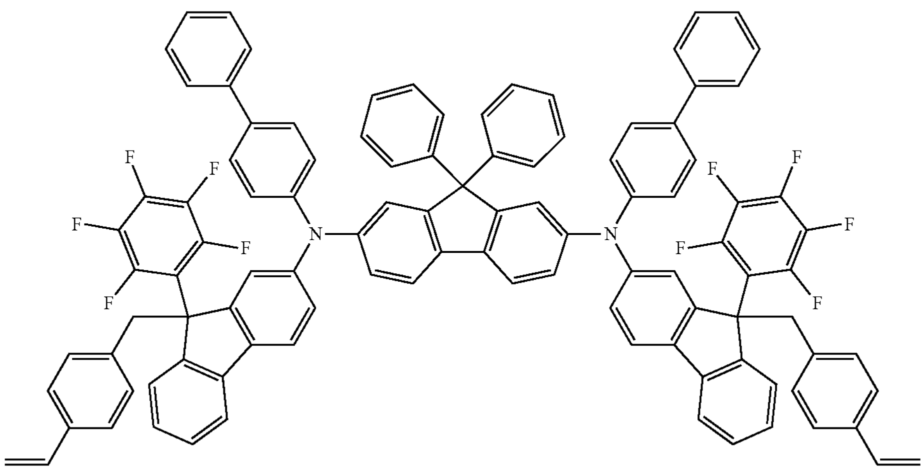
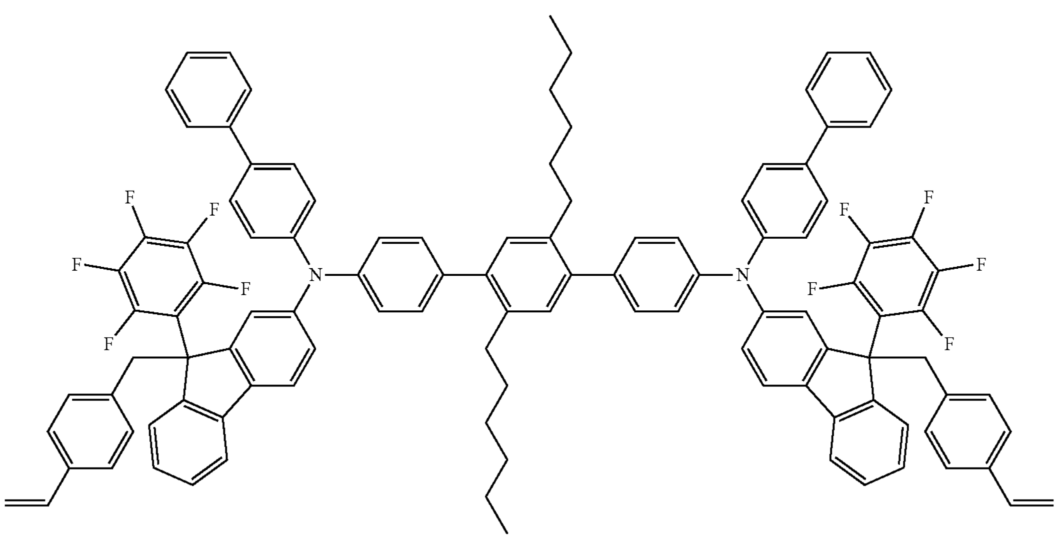

-continued
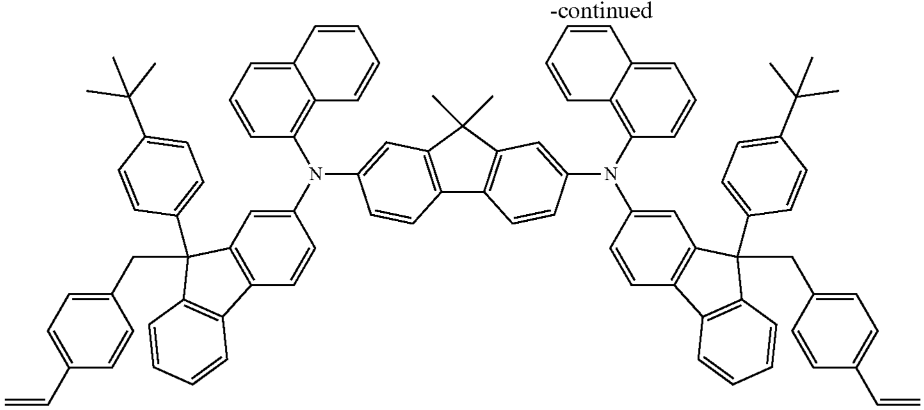
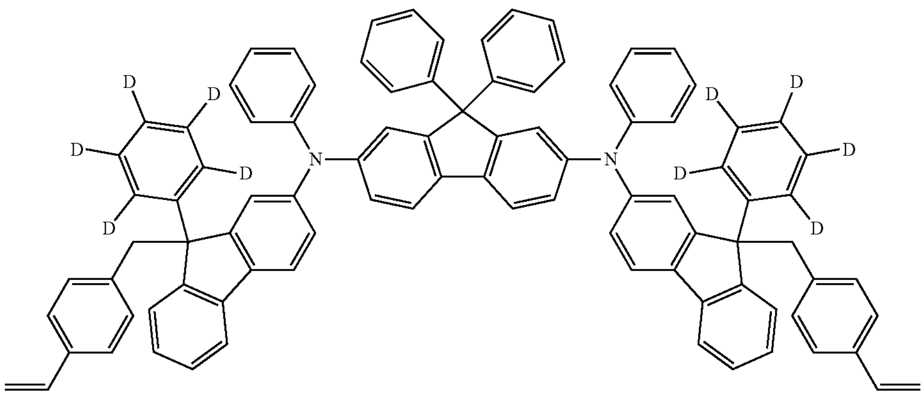
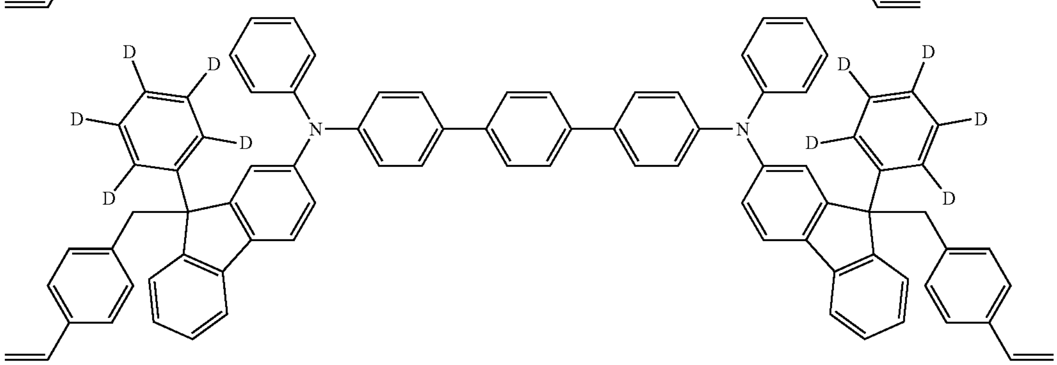
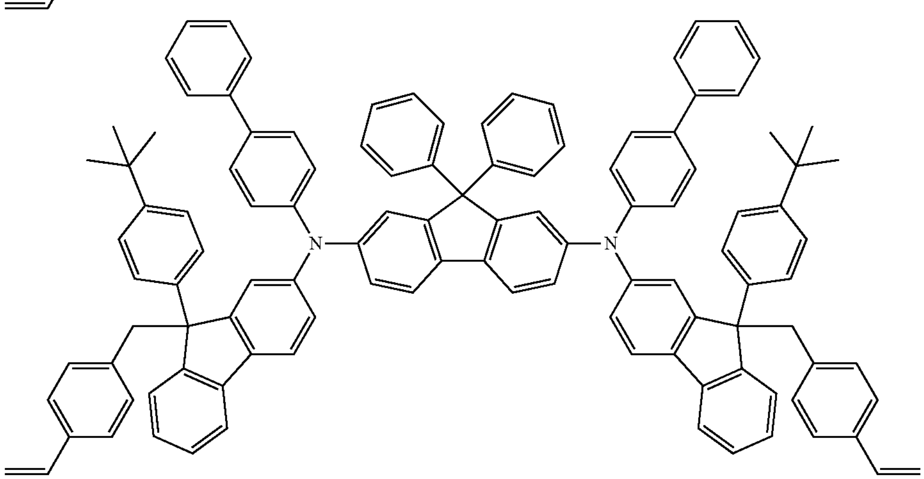

-continued
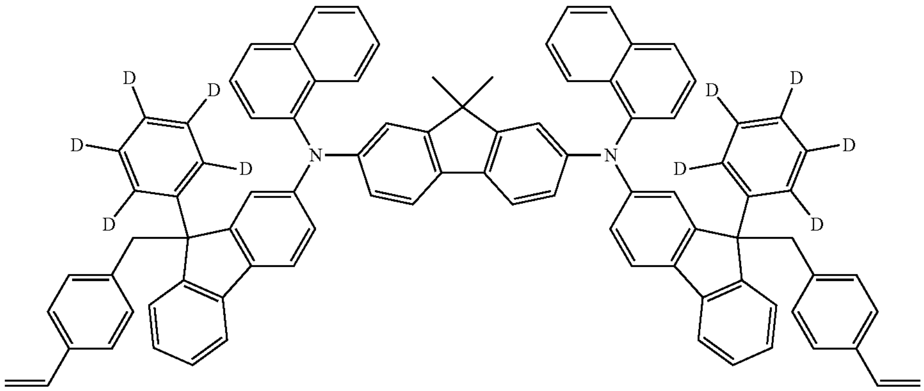
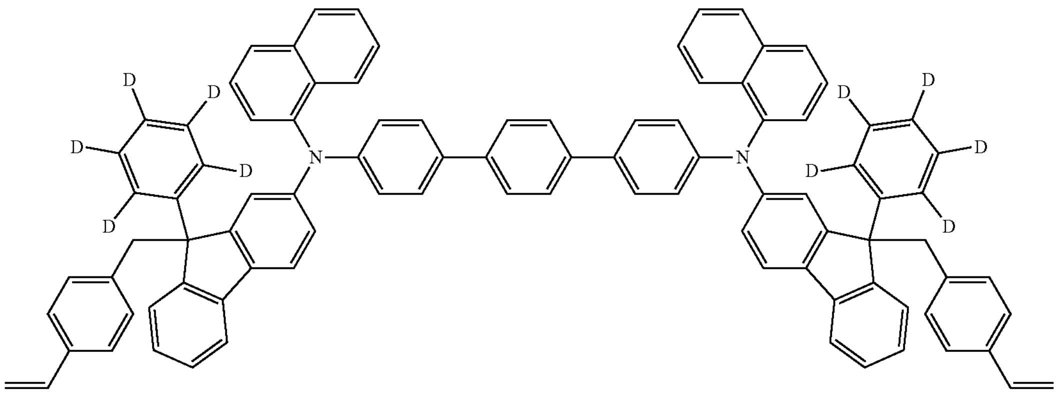
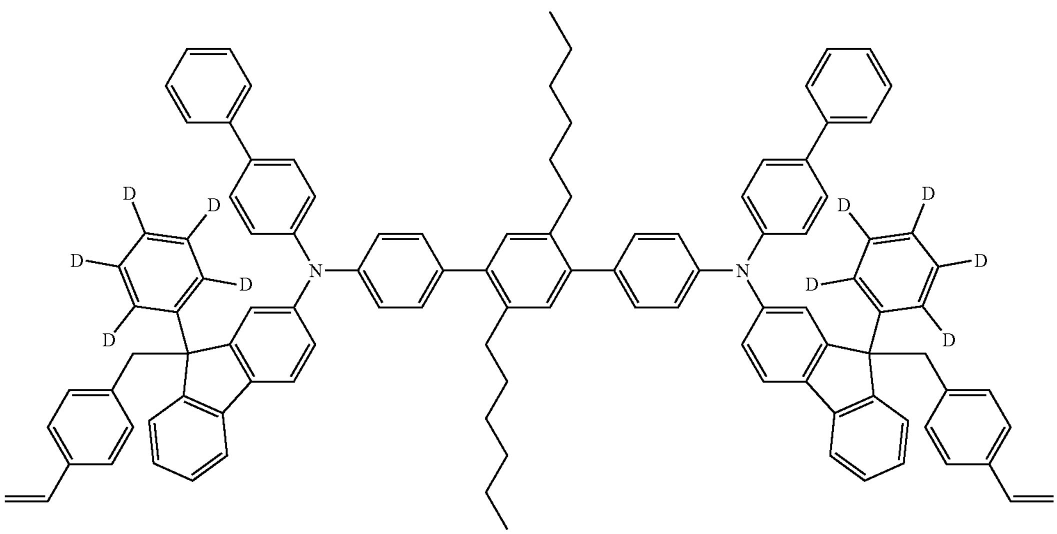
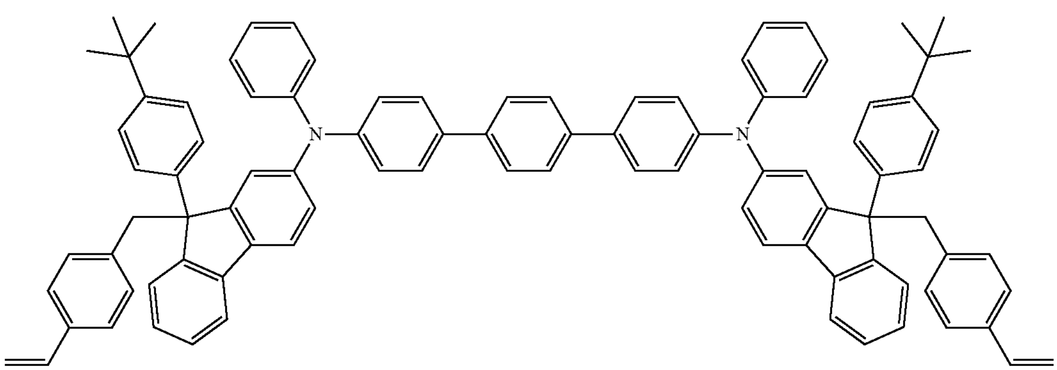

-continued
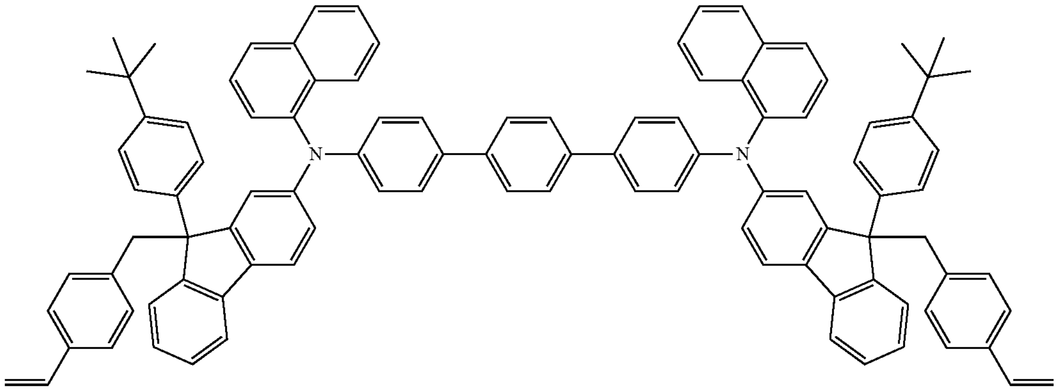
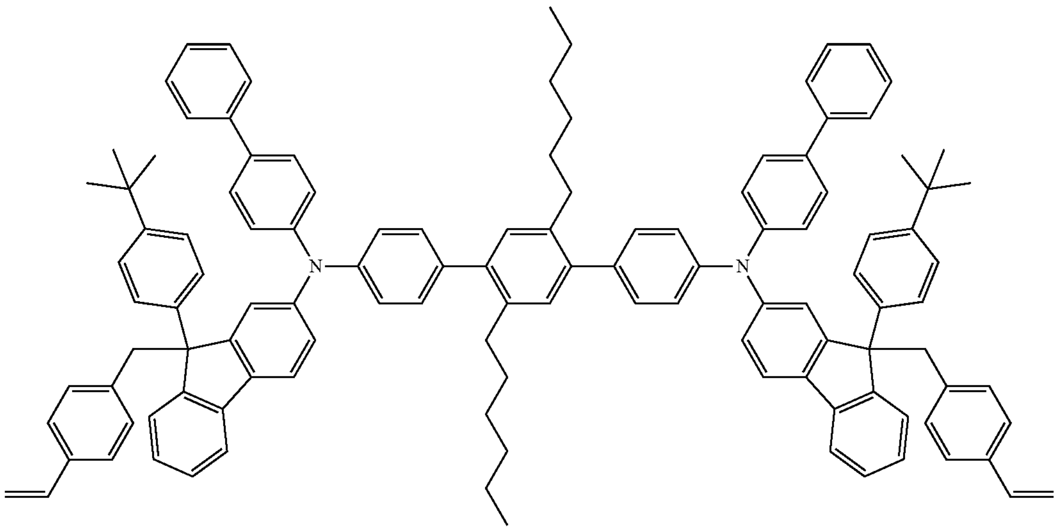
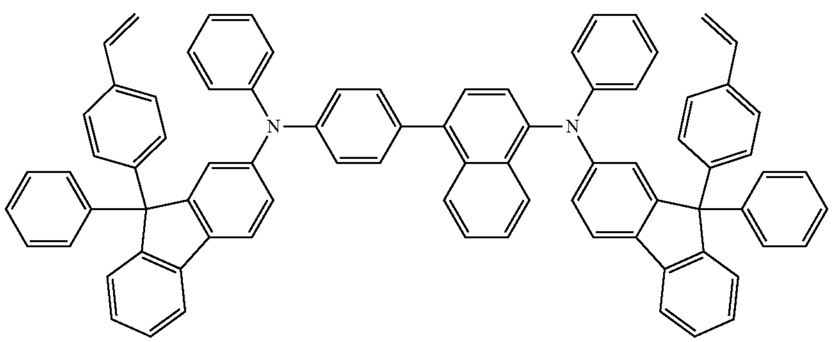
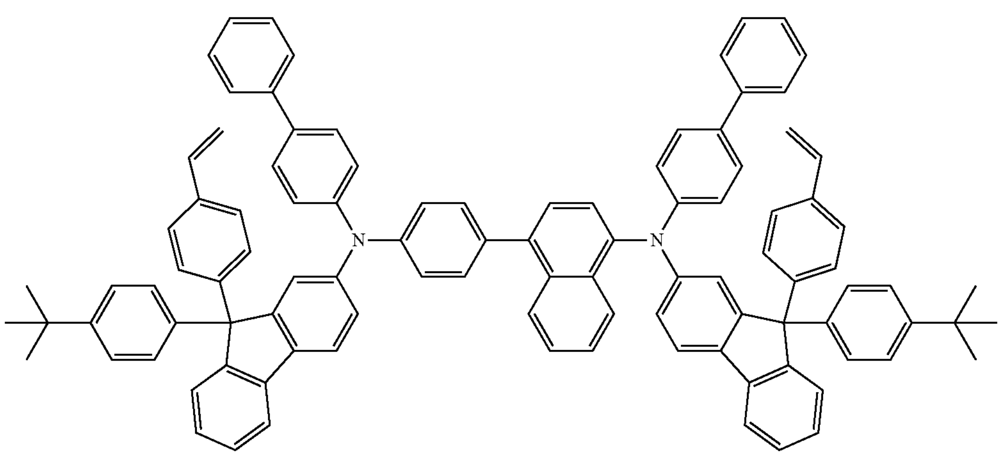

-continued
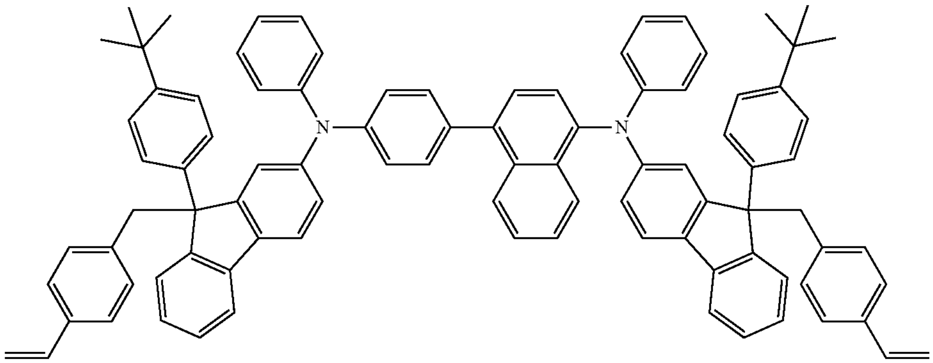
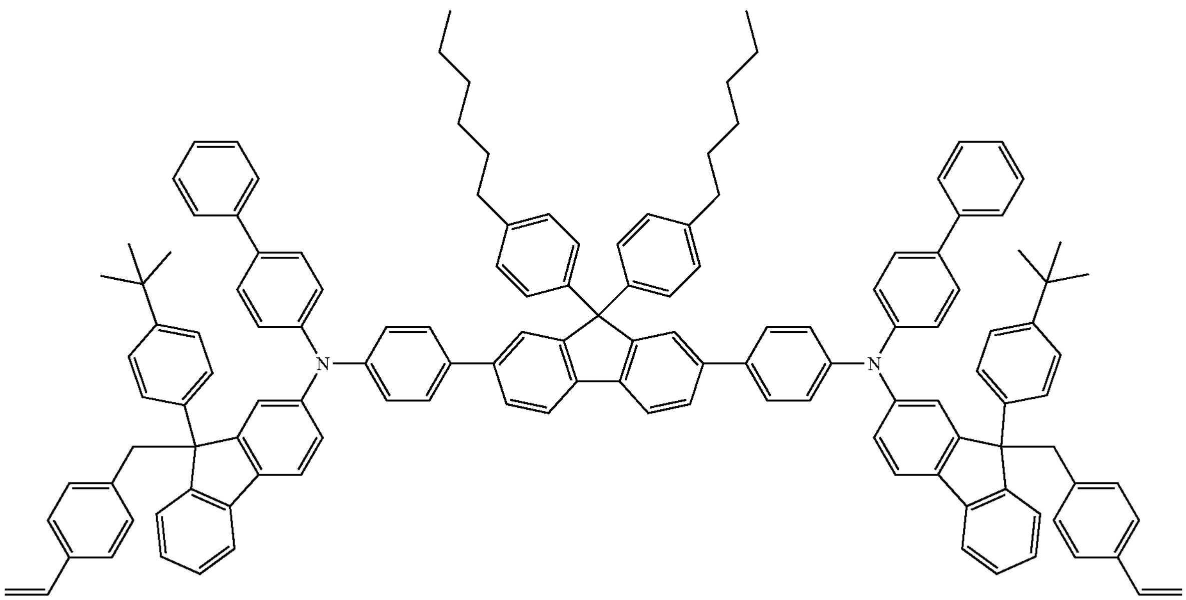
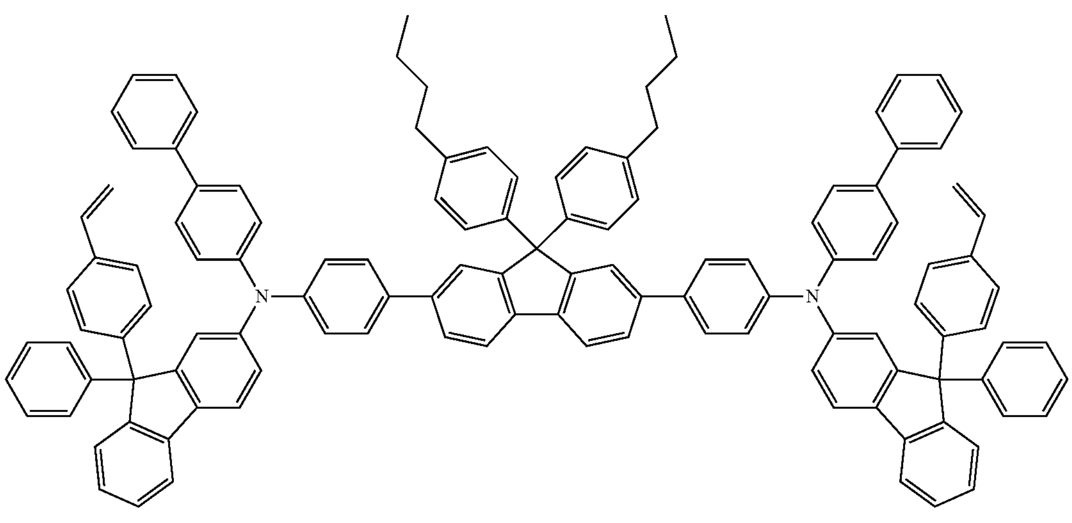

-continued
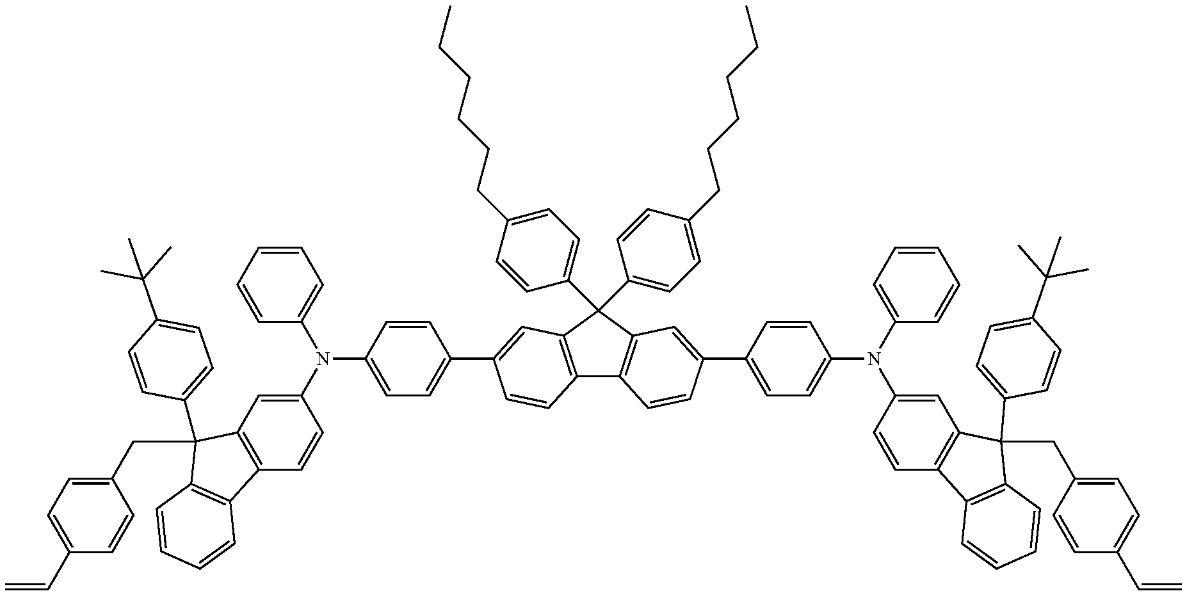
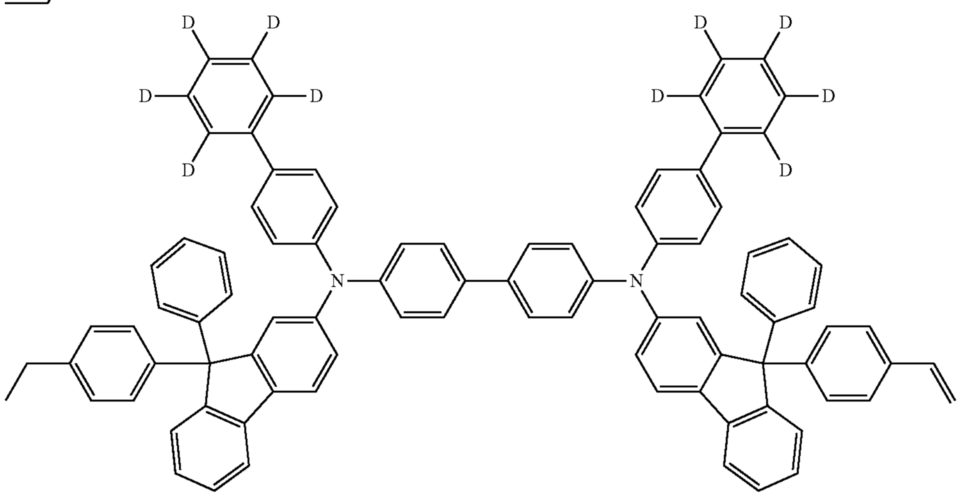
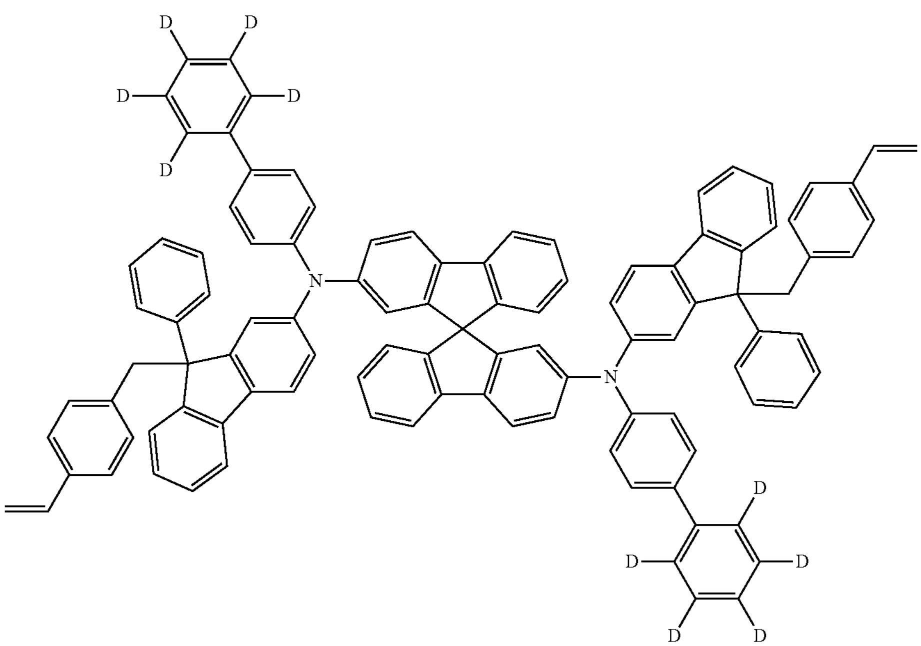

-continued
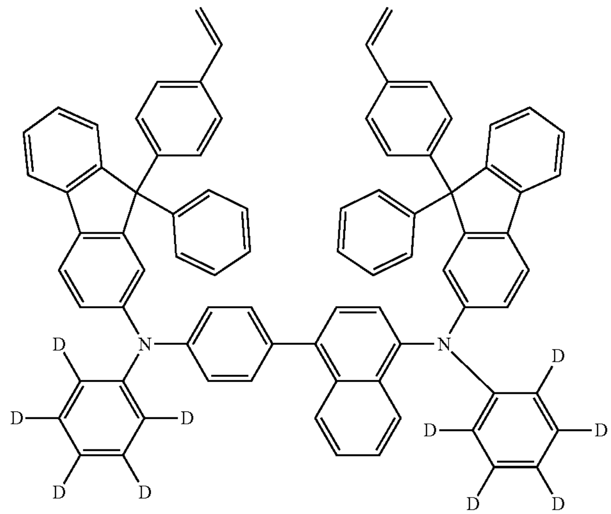
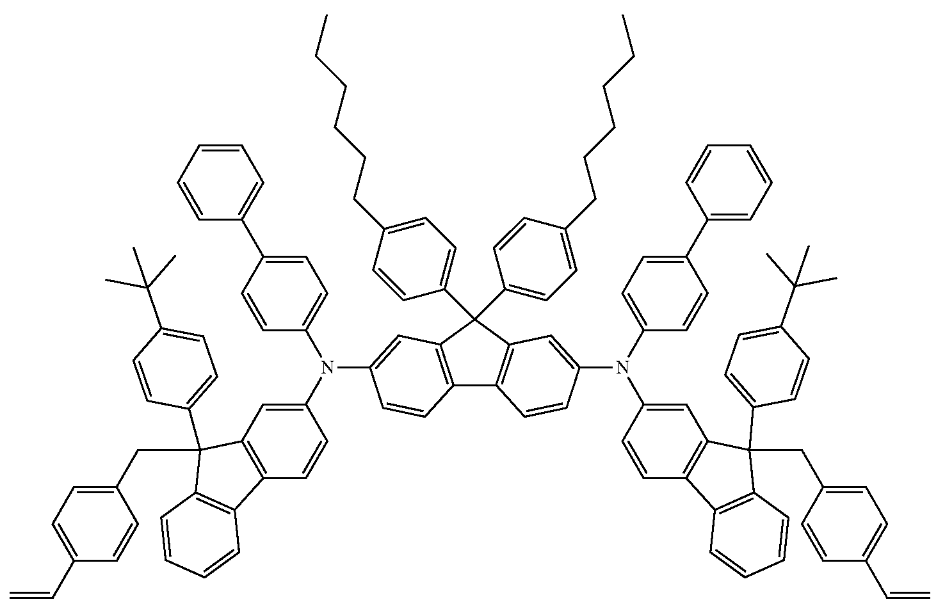
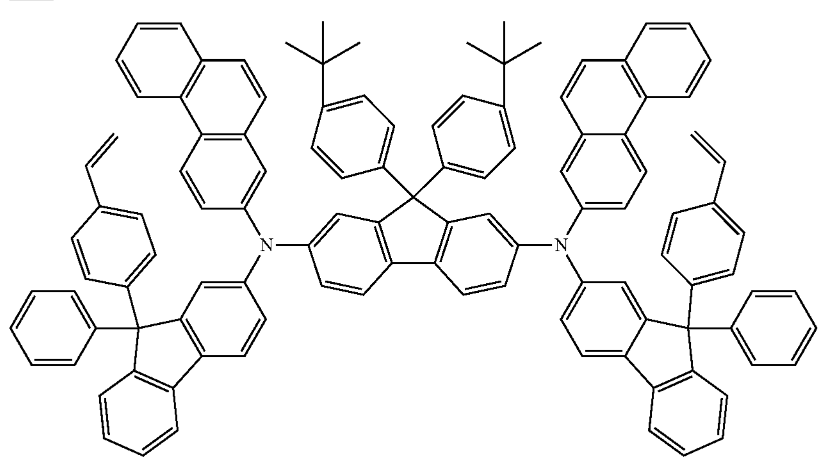

-continued

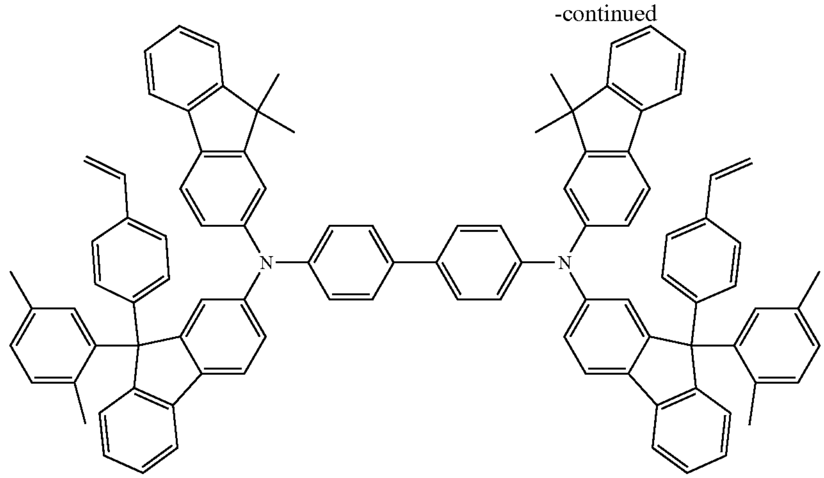

The compound represented by Chemical Formula 1 may be at least 10% deuterated. Alternatively, the compound represented by Chemical Formula 1 may be at least 20%, at least 30%, at least 40%, at least 50%, at least 60%, at least 70%, at least 80%, at least 90%, or 100% deuterated.

According to another embodiment, there is provided a method for preparing a compound represented by Chemical Formula 1 as shown in the following Reaction Scheme 1:

[Reaction Scheme 1]

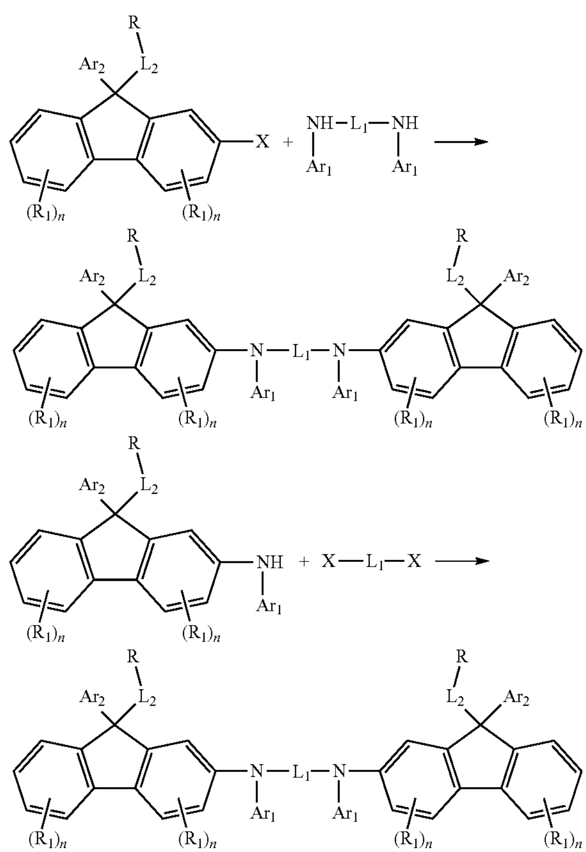

in the Reaction Schemes 1, the definition of the remaining substituents except for X is the same as defined above, and X is halogen, and more preferably, chloro or bromo. The reaction is an amine substitution reaction which is preferably carried out in the presence of a palladium catalyst and a base, and a reactive group for the amine substitution reaction can be modified as known in the art. The above preparation method may be further embodied in the Preparation Examples described hereinafter.

In addition, the hole injection layer according to the present disclosure may further include a compound represented by the following Chemical Formula 3:

[Chemical Formula 3]

$$(Ar''_1)_{n1}—\overset{\ominus}{B}—(Ar''_2)_{n2}$$

in the Chemical Formula 3, n1 and n2 are each independently an integer of 1 to 3, provided that n1+n2 is 4, Ar"$_1$ is

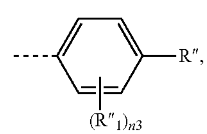

R" is a photocurable group; or a thermosetting group,

R"$_1$ is each independently hydrogen, halogen, or $C_{1-60}$ haloalkyl, n3 is an integer of 1 to 4, Ar"$_2$ is

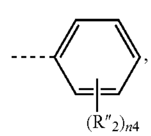

R"$_2$ is each independently hydrogen, halogen, $C_{1-60}$ haloalkyl, a photocurable group, or a thermosetting group, and n4 is an integer of 1 to 5.

Preferably, as for the photocurable group; or the thermosetting group of R", the contents concerning R defined in Chemical Formula 1 above may be applied.

Preferably, $R''_1$ is each independently hydrogen, fluoro, or $CF_3$.

Preferably, $Ar''_1$ is any one selected from the group consisting of the following:

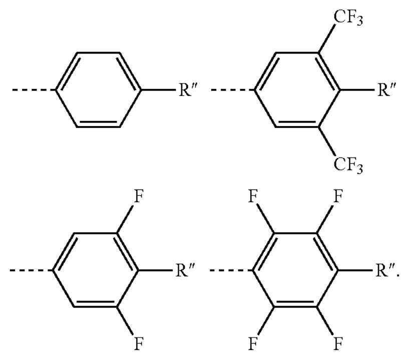

Preferably, $R''_2$ is each independently hydrogen, fluoro, $CF_3$, $CF(CF_3)_2$, $CF_2CF_2CF_2CF_3$, a photocurable group, or a thermosetting group. In this case, as for the photocurable group; or the thermosetting group, the contents concerning R defined in Chemical Formula 1 above may be applied.

Preferably, $Ar''_2$ is any one selected from the group consisting of the following:

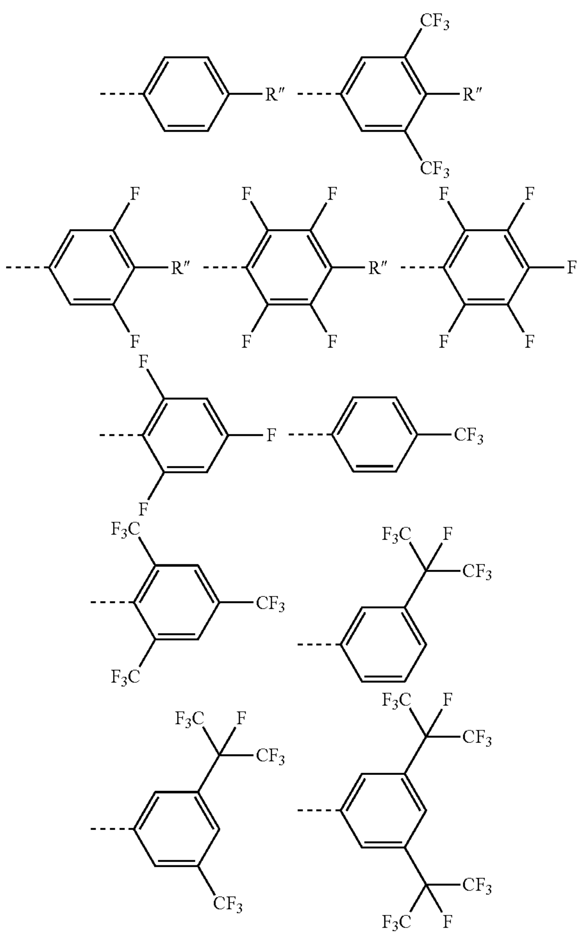

-continued

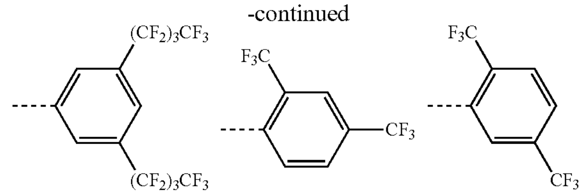

Representative examples of the compound represented by Chemical Formula 3 are as follows:

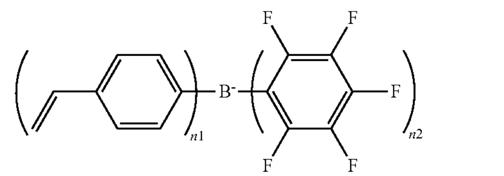

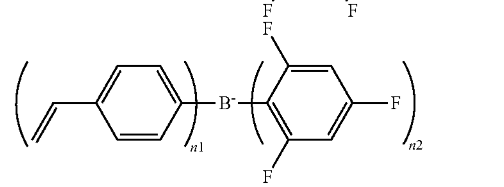

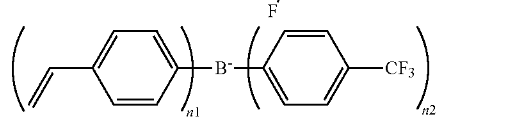

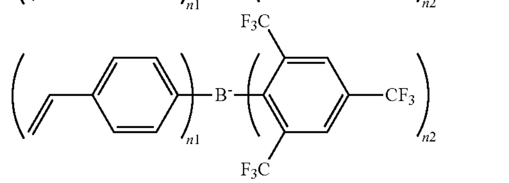

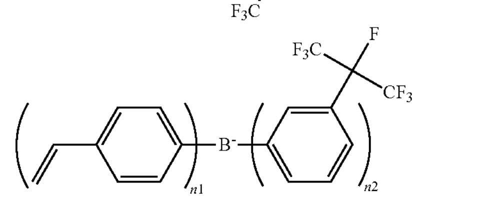

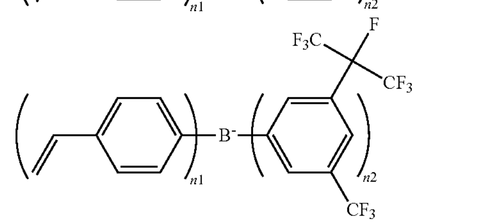

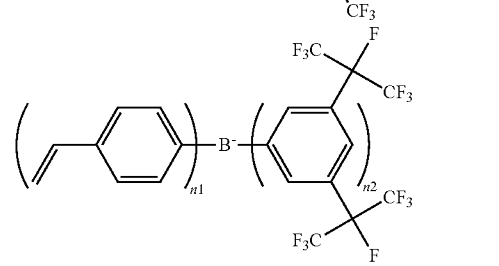

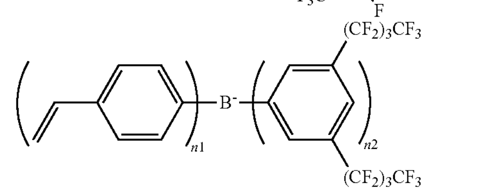

-continued
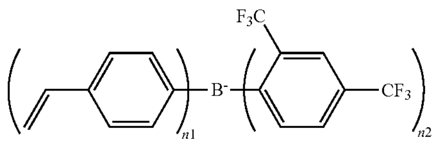
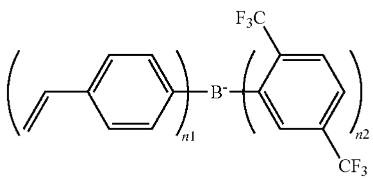
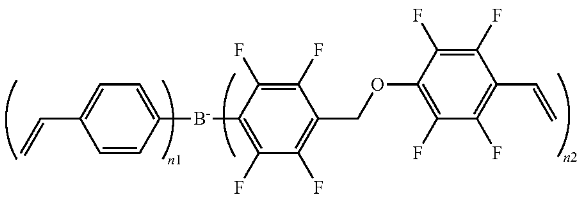
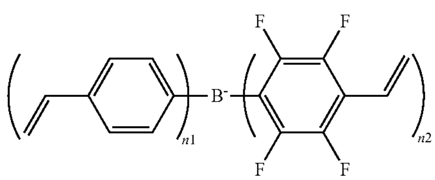
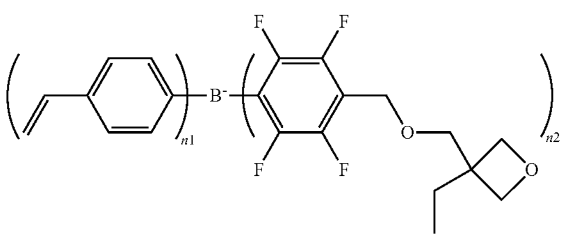
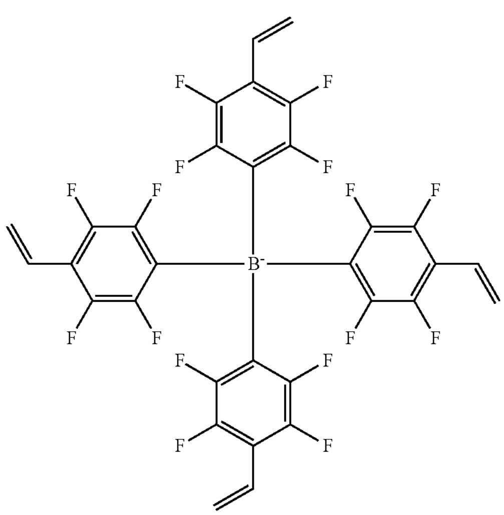
-continued
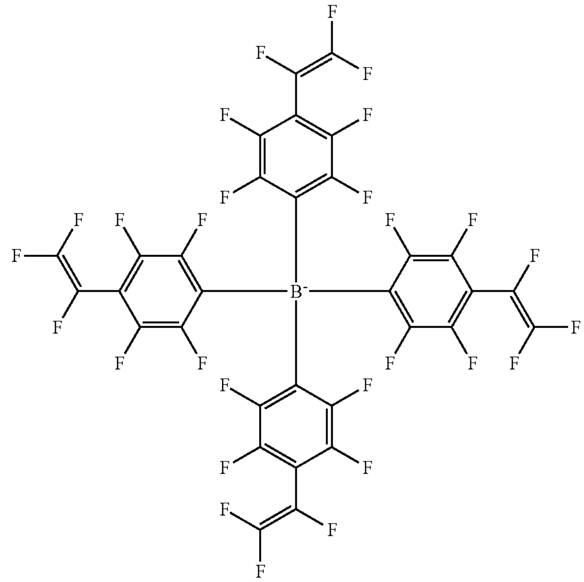
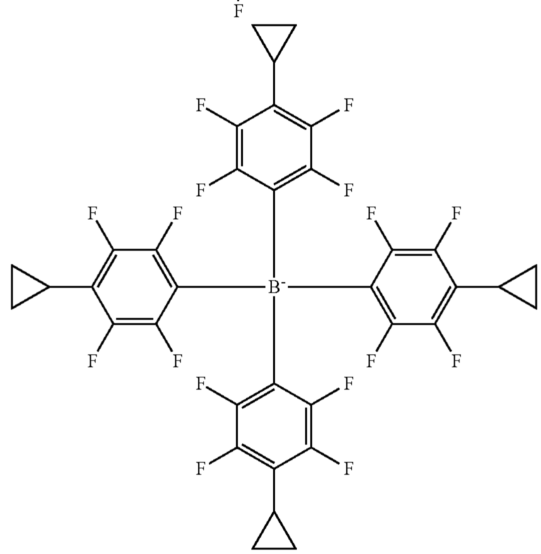
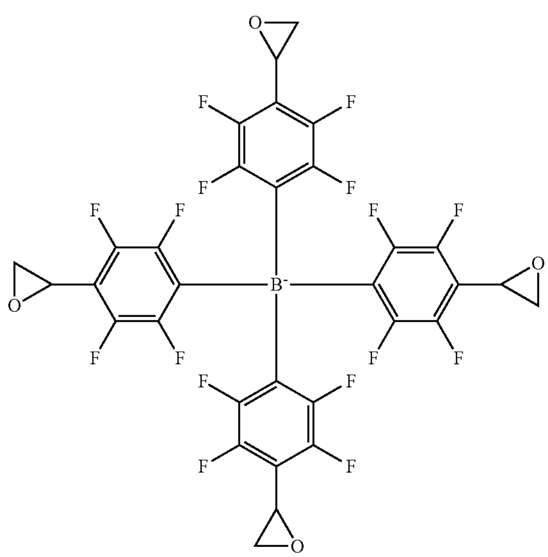

-continued
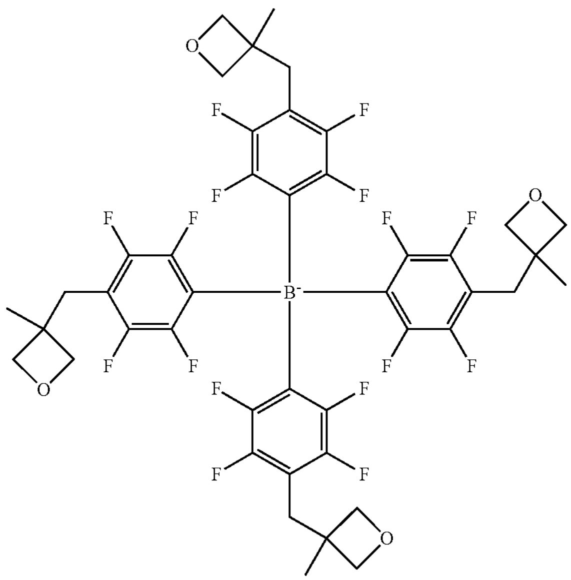
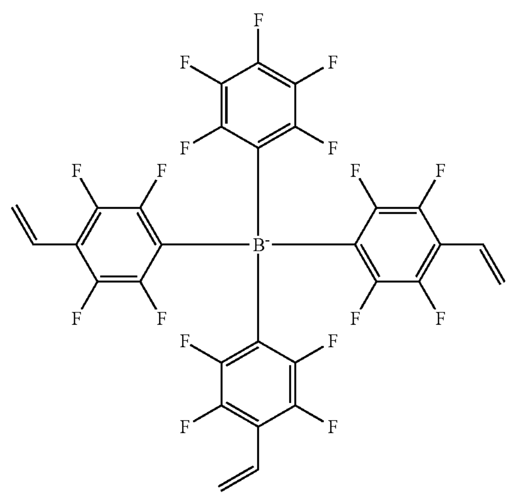
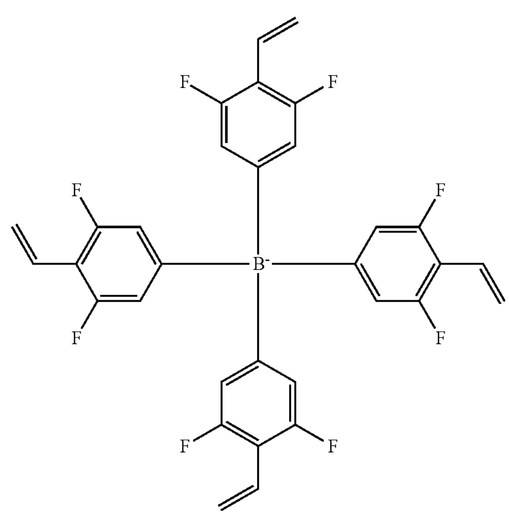
-continued
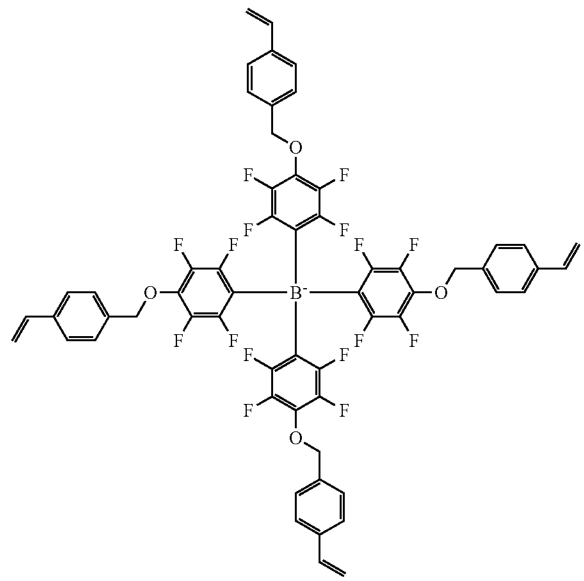
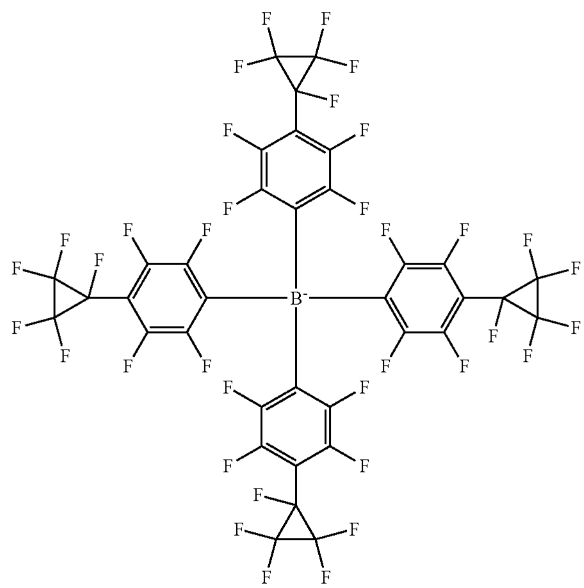
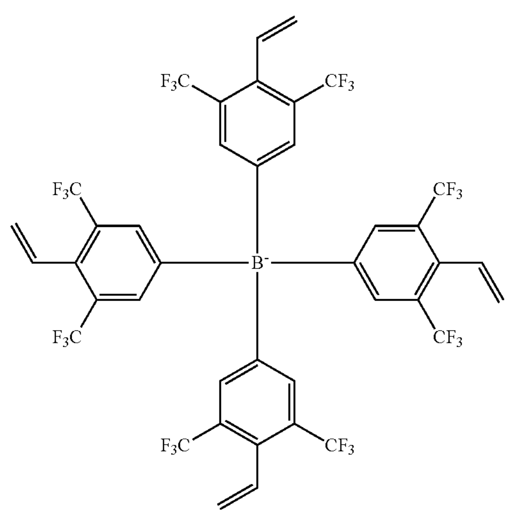

-continued

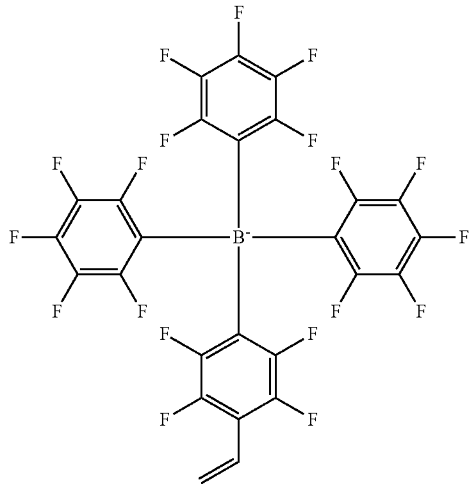 [SMILES: C=Cc1c(F)c(F)c([B-](c2c(F)c(F)c(F)c(F)c2F)(c2c(F)c(F)c(F)c(F)c2F)c2c(F)c(F)c(F)c(F)c2F)c(F)c1F]

wherein the above group, n1 and n2 are as defined in Chemical Formula 3.

The compound represented by Chemical Formula 3 may be at least 10% deuterated. Alternatively, the compound represented by Chemical Formula 3 may be at least 20%, at least 30%, at least 40%, at least 50%, at least 60%, at least 70%, at least 80%, at least 90%, or 100% deuterated.

In addition, the hole injection layer according to the present disclosure may further include a cationic compound in addition to the compound represented by Chemical Formula 3 above. Examples of the cationic compound are as follows:

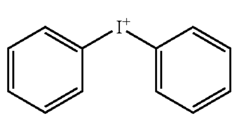

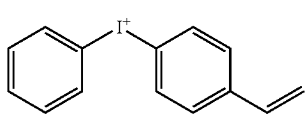

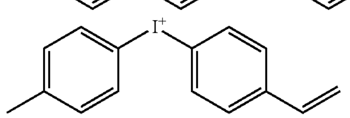

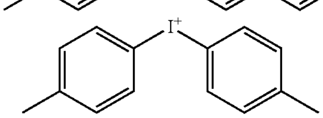

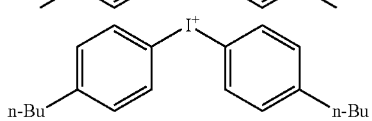

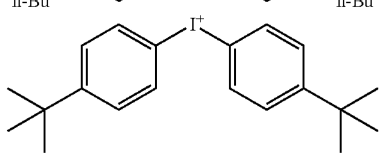

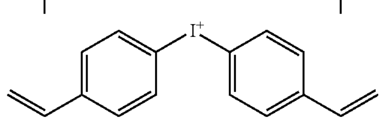

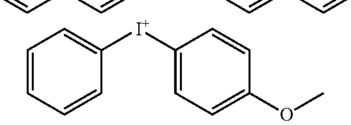

-continued

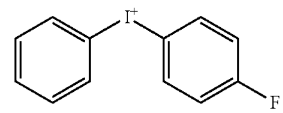

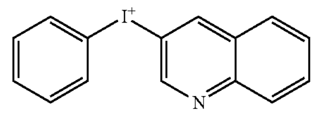

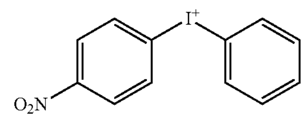

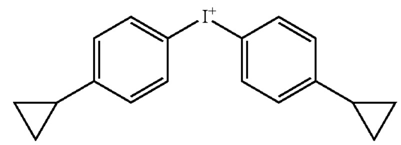

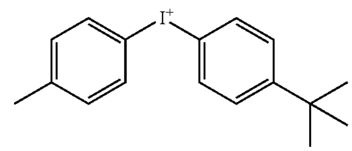

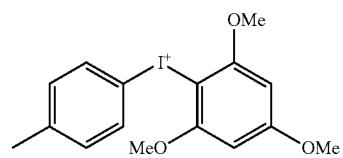

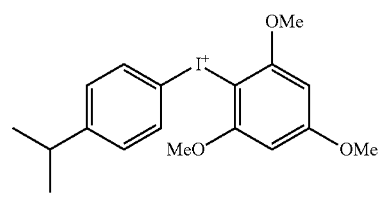

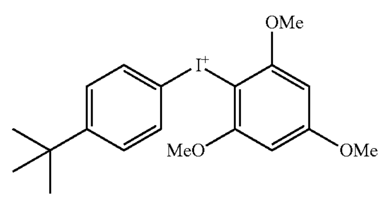

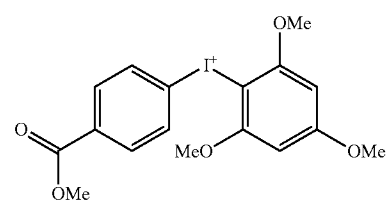

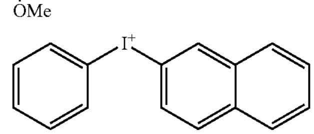

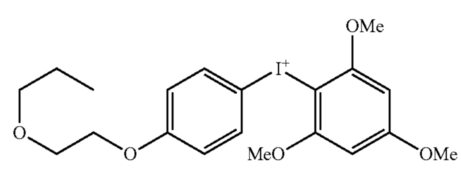

-continued
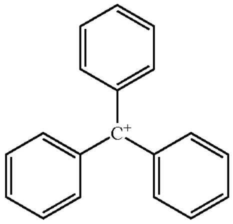
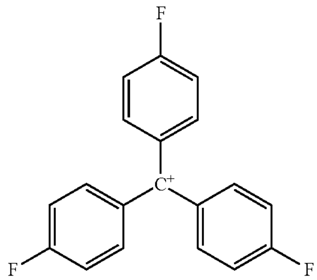
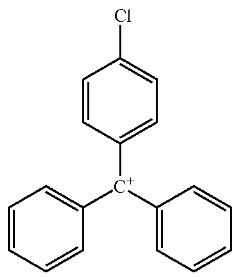
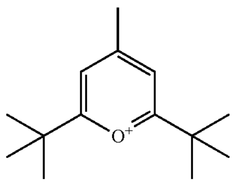
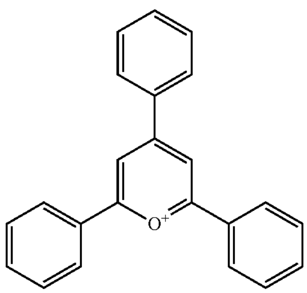
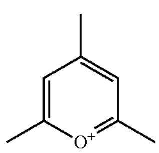
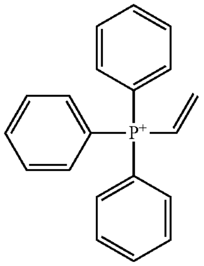
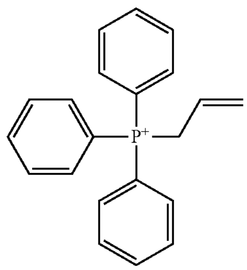
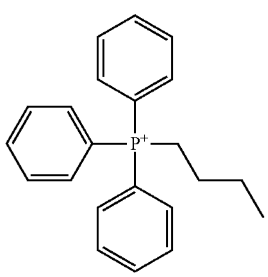
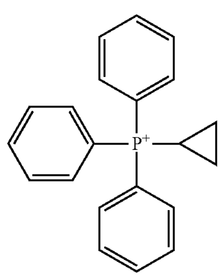
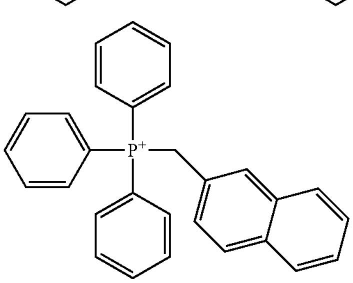
-continued
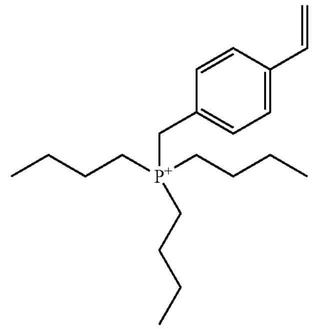
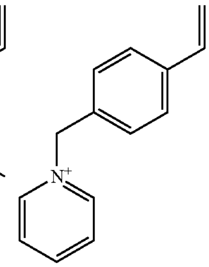
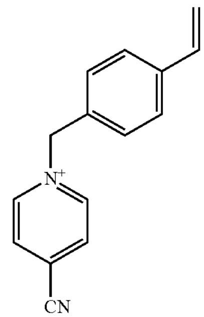
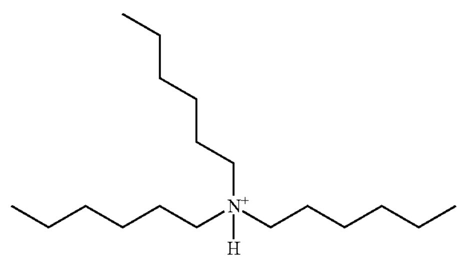
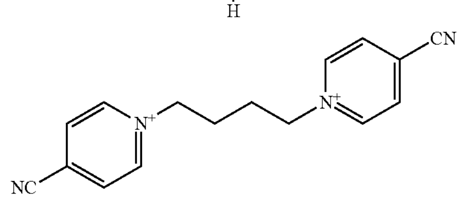
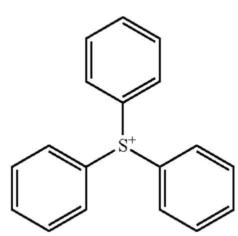
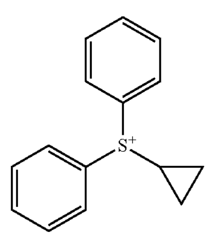
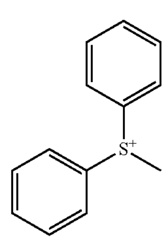
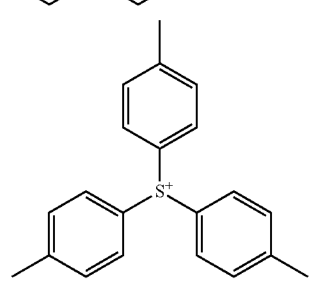

-continued

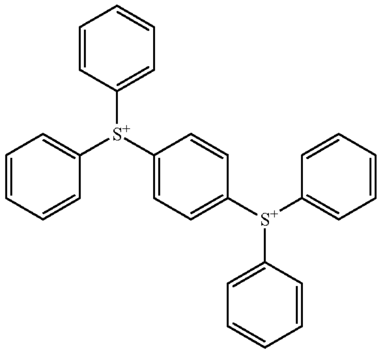

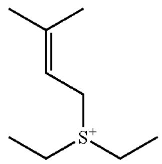

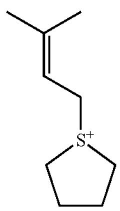

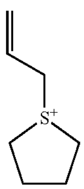

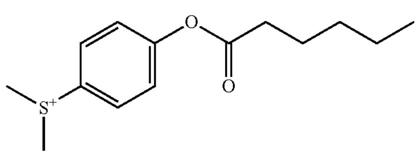

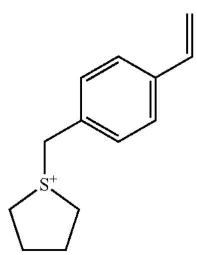

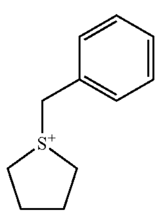

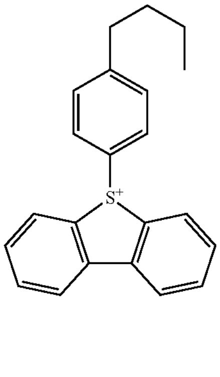

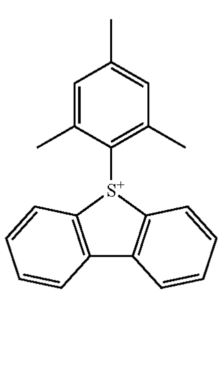

-continued

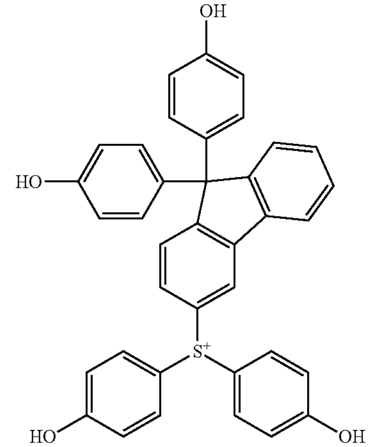

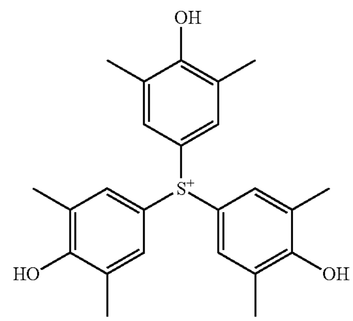

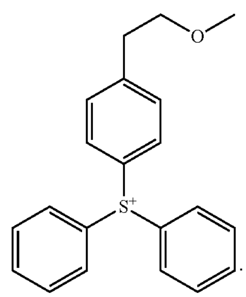 [SMILES: COCCc1ccc([S+](c2ccccc2)c2ccccc2)cc1]

The ionic compound may be at least 10% deuterated. Preferably, the ionic compound may be at least 20%, at least 30%, at least 40%, at least 50%, at least 60%, at least 70%, at least 80%, at least 90%, or 100% deuterated.

Meanwhile, the method of forming the hole injection layer according to the present disclosure is a method in which the compound represented by Chemical Formula 1 (or together with the compound represented by Chemical Formula 3 and/or the cationic compound) is subjected to thermal treatment or photo treatment to prepare a cured product, which will be described later.

(Hole Transport Layer)

The organic light emitting device according to the present disclosure includes a hole transport layer between the hole injection layer and the light emitting layer, wherein a polymer including the repeating unit represented by Chemical Formula 2-1 and the repeating unit represented by Chemical Formula 2-2 is used as a material for the hole transport layer. Specifically, the cured product of the polymer is used as a hole transport layer.

The Chemical Formula 2-1 may be represented by the following Chemical Formula 2-1-1:

[Chemical Formula 2-1-1]

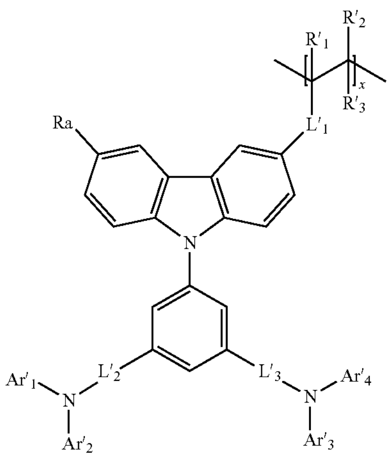

in the Chemical Formula 2-1-1,

R'$_1$ to R'$_3$, L'$_1$ to L'$_3$, Ar'$_1$ to Ar'$_4$ and Ra are the same as defined in Chemical Formula 2-1.

In Chemical Formula 2-1, preferably, R'$_1$ to R'$_3$ are each independently hydrogen or methyl, and more preferably, all of them are hydrogen.

Preferably, L'$_1$ is a substituted or unsubstituted $C_{6-20}$ arylene; -(substituted or unsubstituted $C_{6-20}$ arylene)-O-(substituted or unsubstituted $C_{6-20}$ arylene)-; -(substituted or unsubstituted $C_{6-20}$ arylene)-(substituted or unsubstituted $C_{1-10}$ alkylene)-(substituted or unsubstituted $C_{6-20}$ arylene)-; -(substituted or unsubstituted $C_{6-20}$ arylene)-O-(substituted or unsubstituted $C_{1-10}$ alkylene)-O—; or -(substituted or unsubstituted $C_{6-20}$ arylene)-(substituted or unsubstituted $C_{1-10}$ alkylene)-O-(substituted or unsubstituted $C_{1-10}$ alkylene)-(substituted or unsubstituted $C_{6-20}$ arylene)-.

More preferably, L'$_1$ is phenylene, -(phenylene)O(phenylene)-, -(phenylene)$(CH_2)_6$(phenylene)-; -(phenylene)O$(CH_2)_6$O—; or -(phenylene)$CH_2OCH_2$(phenylene)-.

Most preferably, L'$_1$ is any one selected from the group consisting of the following:

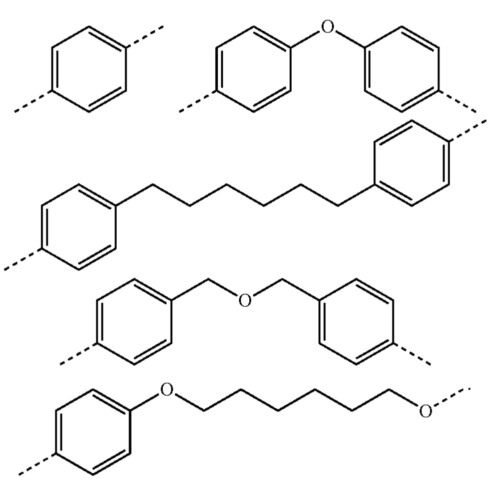

Preferably, L'$_2$ and L'$_3$ are each independently a single bond; or a substituted or unsubstituted $C_{6-20}$ arylene, more preferably, L'$_2$ and L'$_3$ are each independently a single bond or phenylene, and most preferably, L'$_2$ and L'$_3$ are each independently a single bond or 1,4-phenylene.

Preferably, Ar'$_1$ to Ar'$_4$ are each independently a substituted or unsubstituted $C_{6-20}$ aryl, or a substituted or unsubstituted $C_{2-20}$ heteroaryl containing any one or more selected from the group consisting of N, O and S, or Ar'$_1$ and Ar'$_2$; or Ar'$_3$ and Ar'$_4$ are bonded to each other to form $C_{6-20}$ aromatic ring; or $C_{2-20}$ heteroaromatic ring containing any one or more selected from the group consisting of N, O and S.

More preferably, Ar'$_1$ to Ar'$_4$ are each independently phenyl, biphenylyl, biphenylyl substituted with N,N-diphenylamino, or dimethylfluorenyl, or Ar'$_1$ and Ar'$_2$; or Ar'$_3$ and Ar'$_4$ are bonded to each other, and together with N to which they are attached to form

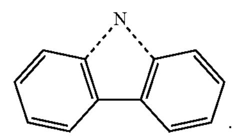

Most preferably, Ar'$_1$ to Ar'$_4$ are each independently any one selected from the group consisting of the following, or Ar'$_1$ and Ar'$_2$; or Ar'$_3$ and Ar'$_4$ are bonded to each other, and together with N to which they are attached to form

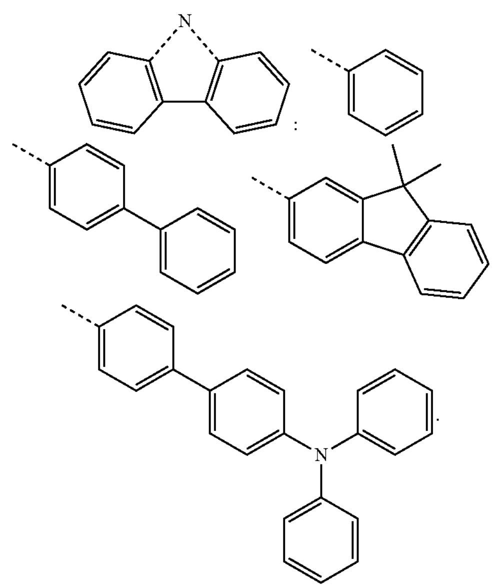

Preferably, Ar'$_1$ and Ar'$_3$ are each independently phenyl or biphenylyl, Ar'$_2$ and Ar'$_4$ are any one selected from the group consisting of the following; or Ar'$_1$ and Ar'$_2$, and Ar'$_3$ and Ar'$_4$ are bonded to each other, and together with N to which they are attached to form

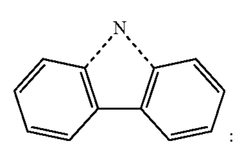

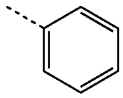
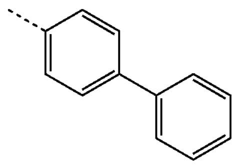
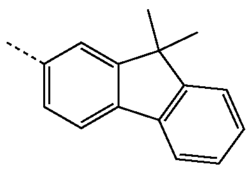
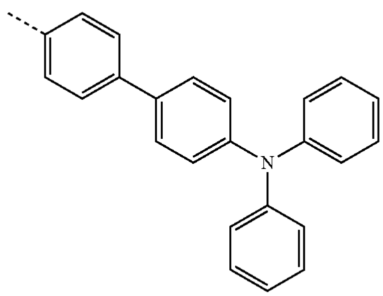
Preferably, Ra is hydrogen, $C_{1-10}$ alkyl, or $C_{6-20}$ aryl, more preferably, Ra is hydrogen, methyl, or phenyl.
Preferably, the Chemical Formula 2-1 is any one selected from the group consisting of repeating units represented by the following formulas:
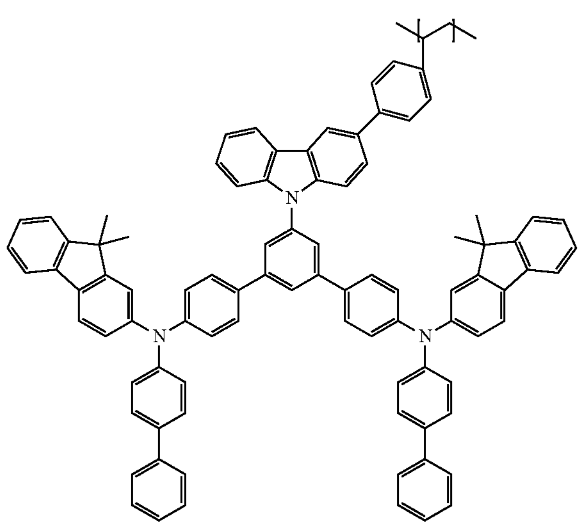
-continued
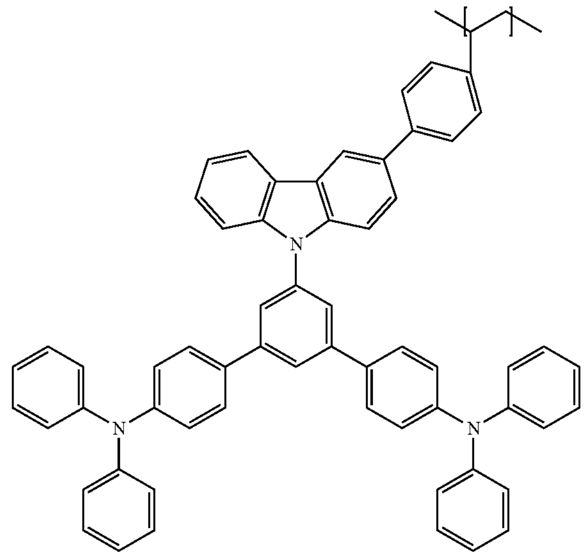
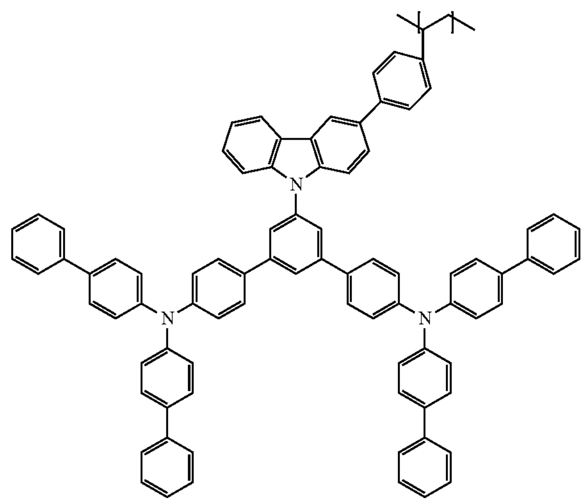
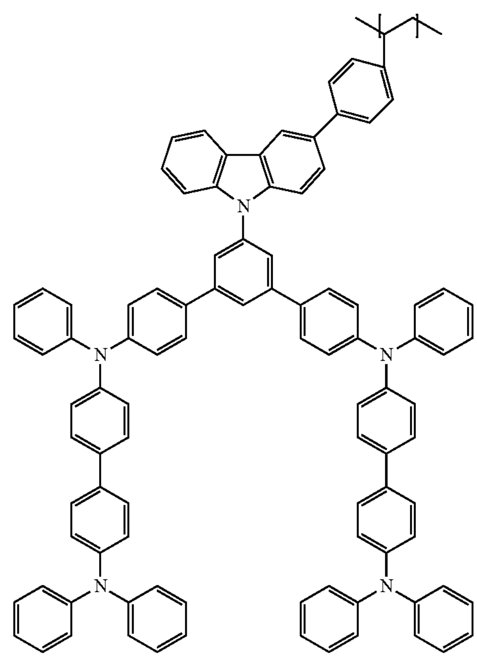

-continued
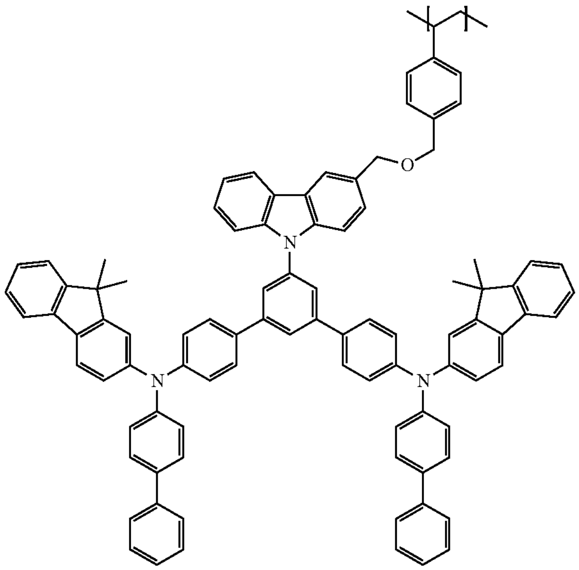
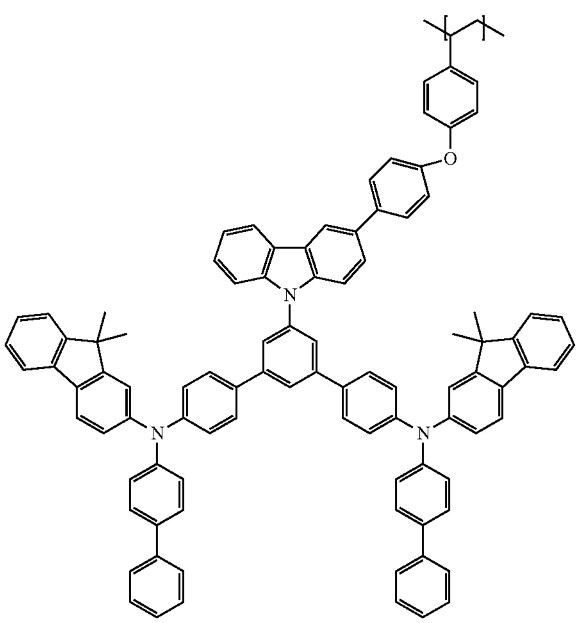
-continued
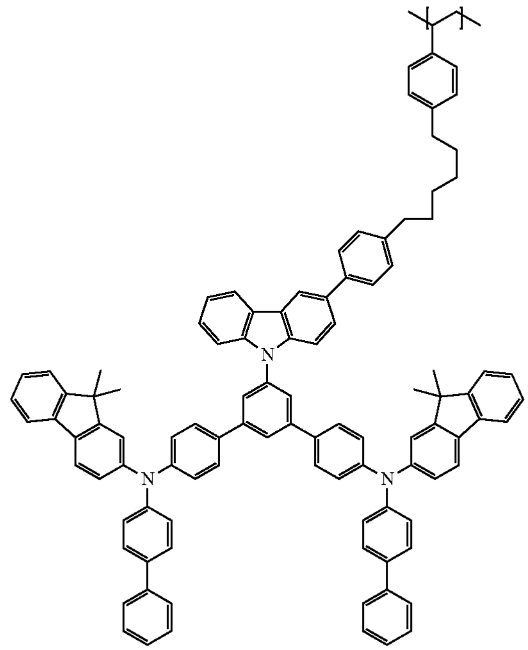
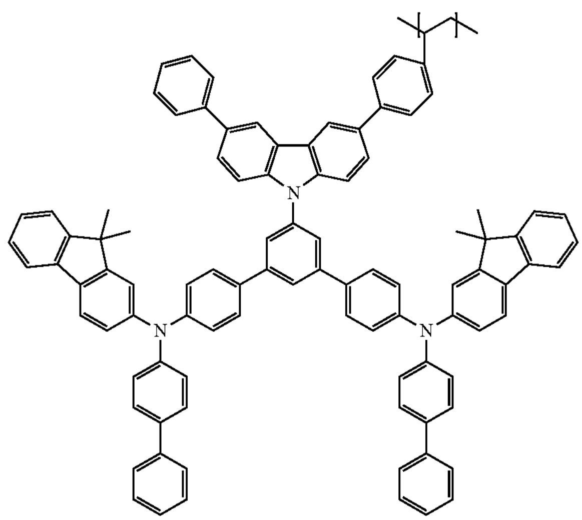
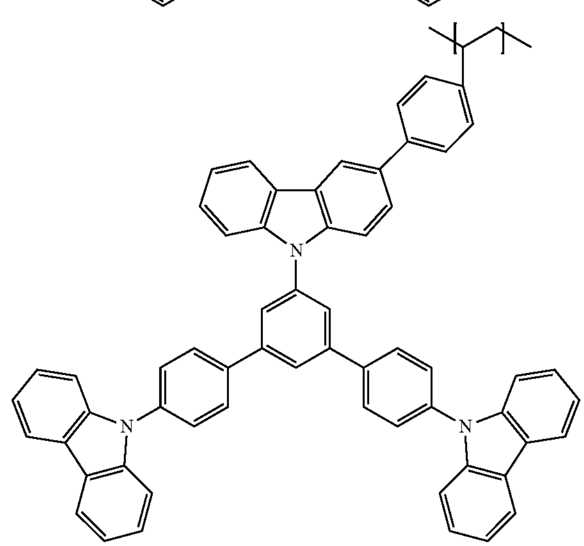

-continued

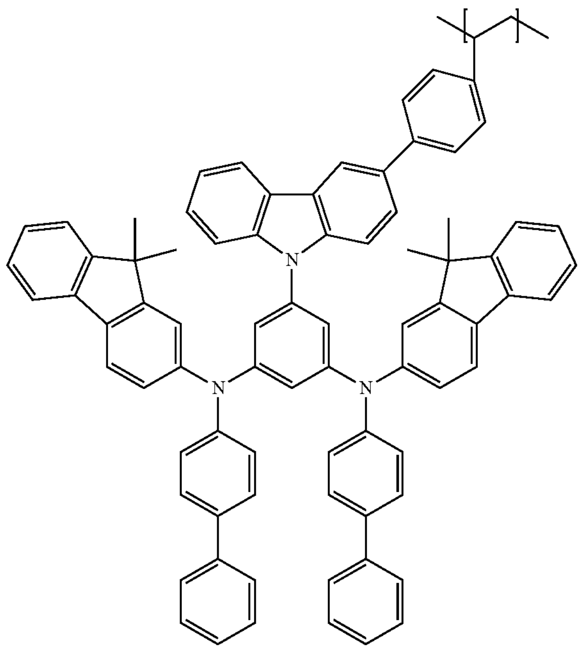

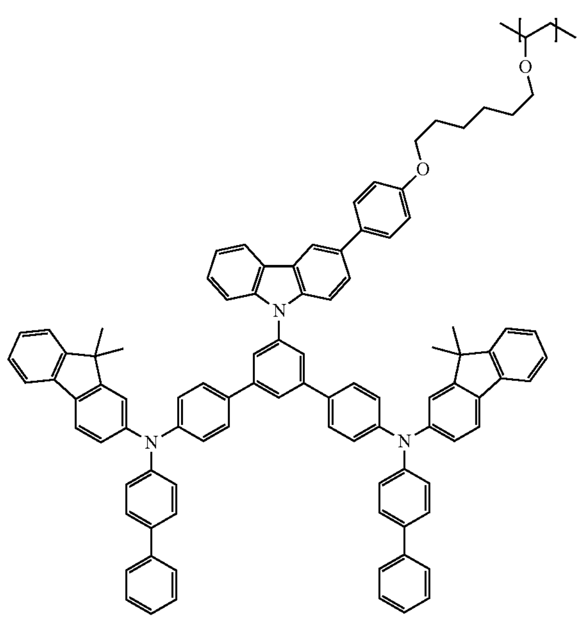

-continued

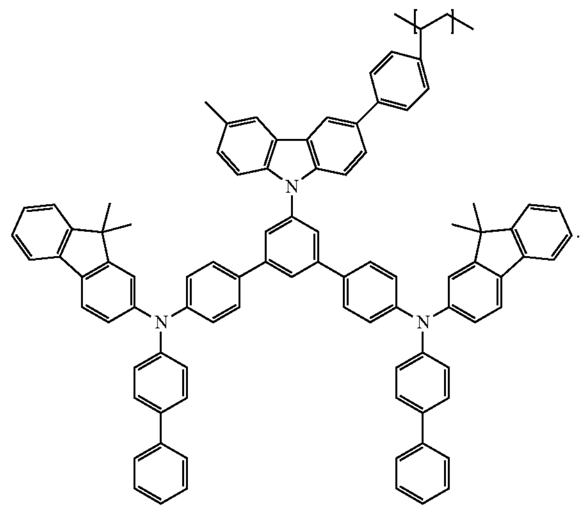

The repeating unit represented by Chemical Formula 2-1 may be at least 10% deuterated. Alternatively, the repeating unit represented by Chemical Formula 2-1 may be at least 20%, at least 30%, at least 40%, at least 50%, at least 60%, at least 70%, at least 80%, at least 90%, or 100% deuterated.

Meanwhile, the repeating unit represented by Chemical Formula 2-1 is derived from a monomer represented by the following Chemical Formula 2-1':

[Chemical Formula 2-1′]

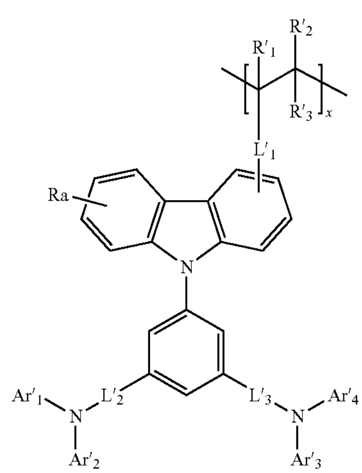

in the Chemical Formula 2-1', $R'_1$ to $R'_3$, $L'_1$ to $L'_3$, $Ar'_1$ to $Ar'_4$ and Ra are the same as defined in Chemical Formula 2-1 above.

The compound represented by Chemical Formula 2-1' can be prepared by a preparation method as shown in the following Reaction Scheme 2-1-1. Among the compounds represented by Chemical Formula 2-1', when $L'_1$ is -(phenylene)$CH_2OCH_2$(phenylene)-, it can be prepared, for example, by a preparation method as shown in the following Reaction Scheme 2-1-2, and other remaining compounds can be prepared in a similar manner.

[Reaction Scheme 2-1-1]

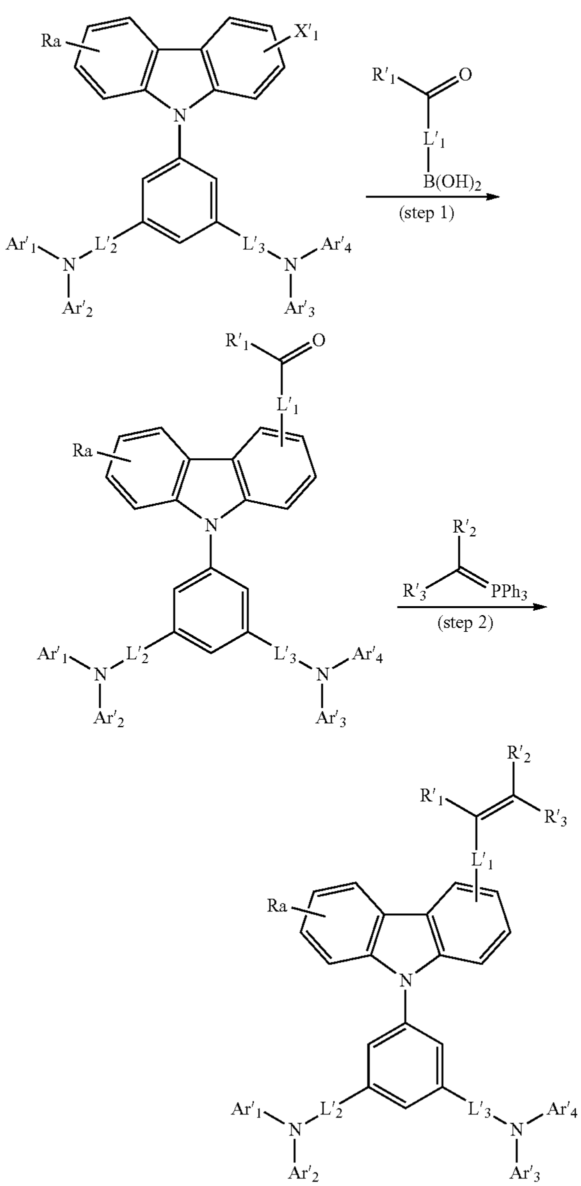

[Reaction Scheme 2-1-2]

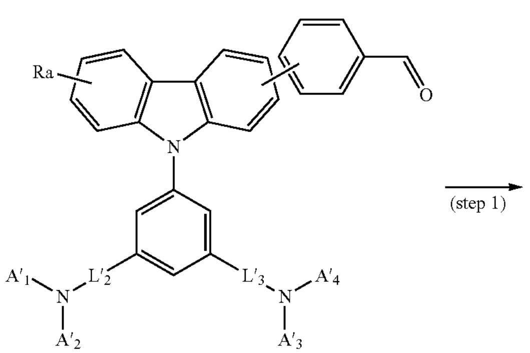

-continued

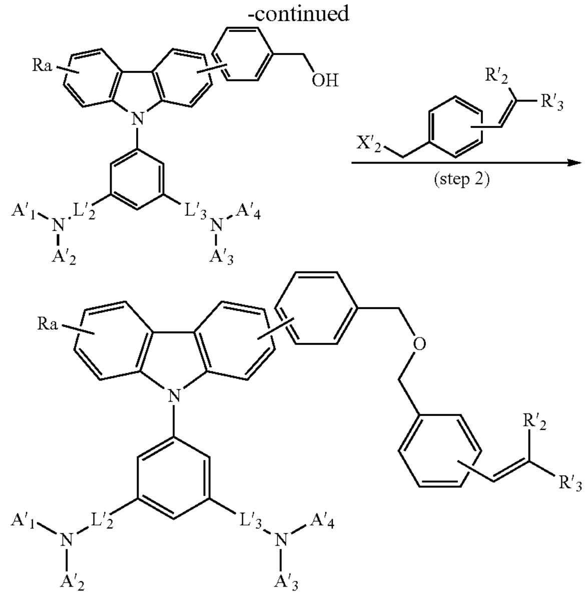

in the Reaction Schemes 2-1-1, the definition of the remaining substituents except for X'1 is the same as defined above, and $X'_1$ is halogen or —OTf, and preferably, iodo, bromo, chloro, or —OTf. Step 1 of Reaction Scheme 2-1-1 is an amine substitution reaction, which is preferably carried out in the presence of a palladium catalyst and a base, and a reactive group for the amine substitution reaction can be modified as known in the art. Further, step 2 is a Wittig reaction, in which a ketone or an aldehyde is reacted with phosphonium ylide to form an alkene. The reactive group for the Wittig reaction can be modified as known in the art.

In Reaction Scheme 2-1-2, the definition of the remaining substituents except for X'2 is the same as defined above, and $X'_2$ is halogen or -OTf, and more preferably, iodo, bromo, chloro, or -OTf. Step 1 of Reaction Scheme 2-1-2 is a reduction reaction of an aldehyde to which hydrogen is added, which can use $NaBH_3$, $LiAlH_4$, $H_2$ in the presence of metal catalysts, or the like. The reactive group for the reduction reaction of aldehyde can be modified as known in the art.

In addition, step 2 is a nucleophilic substitution reaction, which is a kind of substitution reaction in which an alcohol is alkoxylated through the addition of a base to generate a nucleophile, which is then reacted with a halogen substituent as a leaving group. The reactive group for the nucleophilic substitution reaction can be modified as known in the art.

The above preparation method may be further embodied in the Preparation Examples described hereinafter.

The repeating unit represented by Chemical Formula 2-2 includes R' which is a curable reactive group.

Preferably, as for a photocurable group; or a thermosetting group of R', the contents concerning R defined in Chemical Formula 1 above can be applied.

Preferably, $R'_4$ to $R'_6$ are each independently hydrogen or methyl, more preferably all of them is hydrogen.

Preferably, $L'_4$ is a single bond, a substituted or unsubstituted $C_{6-20}$ arylene, more preferably a single bond, or phenylene, and most preferably a single bond or 1,4-phenylene.

Preferably, the Chemical Formula 2-2 is any one selected from the group consisting of repeating units represented by the following formulas:

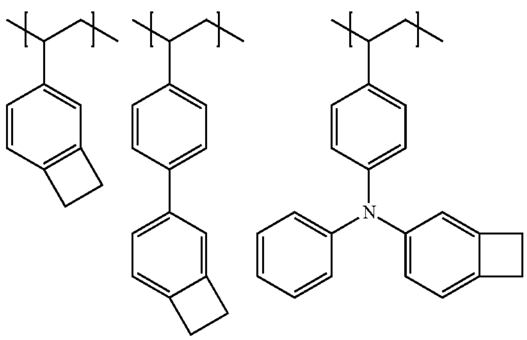

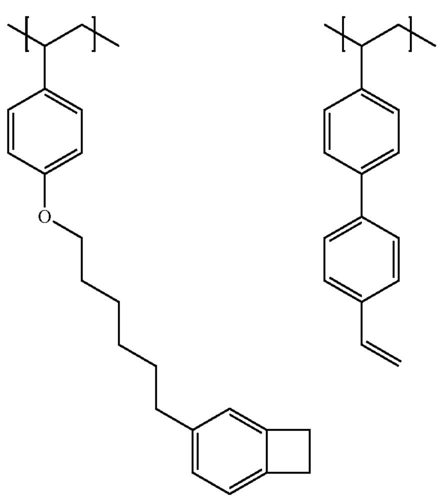

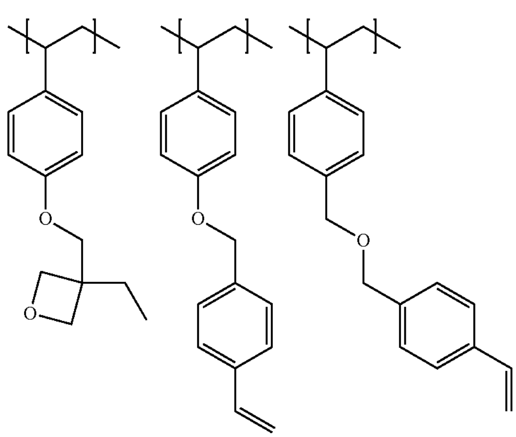

-continued

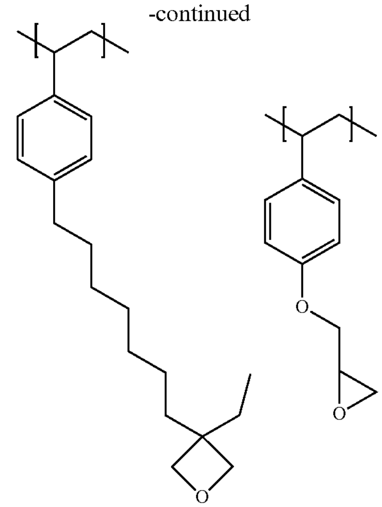

The repeating unit represented by Chemical Formula 2-2 may be at least 10% deuterated. Alternatively, the repeating unit represented by Chemical Formula 2-2 may be at least 20%, at least 30%, at least 40%, at least 50%, at least 60%, at least 70%, at least 80%, at least 90%, or 100% deuterated.

Preferably, at least one of the Chemical Formula 1, the Chemical Formula 2-1, and the Chemical Formula 2-2 may be at least 10% deuterated.

Meanwhile, the repeating unit of Chemical Formula 2-2 is derived from a monomer represented by the following Chemical Formula 2-2':

[Chemical Formula 2-2']

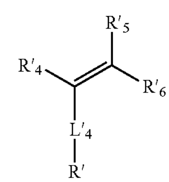

in the Chemical Formula 2-2', $R'_4$ to $R'_6$ and $L'_4$ are as defined in Chemical Formula 2-2 above.

The compound represented by Chemical Formula 2-2' can be prepared by a preparation method as shown in the following Reaction Scheme 2-2.

[Reaction Scheme 2-2]

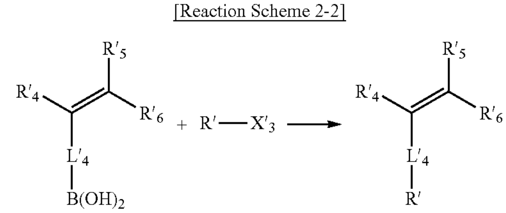

in the Reaction Scheme 2-2, the definition of the remaining substituents except for $X'_3$ are the same as defined above, and $X'_3$ is halogen, preferably bromo or chloro. The Reaction Scheme 2-2 is a Suzuki coupling reaction which is conducted in the presence of a palladium catalyst and a base to prepare the compound represented by Chemical Formula 2-2'. The above preparation method may be further embodied in the Preparation Examples described hereinafter.

The polymer according to the present disclosure can be prepared by polymerizing the monomer represented by Chemical Formula 2-1' and a monomer represented by Chemical Formula 2-2'. Preferably, the polymer according to the present disclosure is a random copolymer including the repeating unit.

In the polymer according to the present disclosure, x and y are mole fractions of the repeating unit of Chemical Formula 2-1 and the repeating unit of Chemical Formula 2-2 in the polymer, wherein x:y is 0.5 to 0.99:0.01 to 0.5, preferably 0.5 to 0.9:0.1 to 0.5. The molar ratio of the polymer can be adjusted by adjusting the reaction molar ratio of the monomer represented by Chemical Formula 2-1' and the monomer represented by Chemical Formula 2-2'.

Preferably, the weight average molecular weight of the polymer is 5,000 to 1,000,000 g/mol or 5,000 to 300,000 g/mol, more preferably 5,000 to 100,000 g/mol.

As used herein, the terms "weight average molecular weight (Mw)" and "number average molecular weight (Mn)" are values converted in terms of standard polystyrene measured using GPC (gel permeation chromatograph). As used herein, the term "molecular weight" means a weight average molecular weight unless otherwise specified.

For example, the molecular weight was measured using an Agilent PL-GPC 220 instrument equipped with PLgel MIXED-B column (300 mm in length) from Polymer Laboratories. Here, a measurement temperature was 35° C., THF was used as a solvent, and a flow rate was measured at a rate of 1 mL/min. A sample was prepared at a concentration of 10 mg/10 mL and then supplied in an amount of 200 μL. A calibration curve formed using a polystyrene standard specimen was used to derive the values of Mw and Mn. As the polystyrene standard specimen, nine types of specimens having molecular weights of 2,000/10,000/30,000/70,000/200,000/700,000/2,000,000/4,000,000/10,000,000, respectively, were used.

On the other hand, the method of forming the hole transport layer according to the present disclosure is a method of subjecting the polymer to thermal treatment or photo treatment to prepare a cured product, which will be described later.

(Light Emitting Layer)

The light emitting layer may include a host material and a dopant material. The host material may be a fused aromatic ring derivative, a heterocycle-containing compound or the like. Specific examples of the fused aromatic ring derivatives include anthracene derivatives, pyrene derivatives, naphthalene derivatives, pentacene derivatives, phenanthrene compounds, fluoranthene compounds, and the like. Examples of the heterocyclic-containing compounds include carbazole derivatives, dibenzofuran derivatives, ladder-type furan compounds, pyrimidine derivatives, and the like, but are not limited thereto.

Examples of the dopant material include an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

(Electron Transport Layer)

The organic light emitting device according to the present disclosure may include an electron transport layer on the light emitting layer.

The electron transport layer is a layer receiving electrons from an electron injection layer and transporting the electrons to a light emitting layer, the electron transport material is a material that can receive the electrons well from a cathode and transport the electrons to a light emitting layer, and a material having large mobility to the electrons is suitable. Specific examples thereof include an 8-hydroxyquinoline Al complex; a complex including $Alq_3$; an organic radical compound; a hydroxyflavone-metal complex, and the like, but are not limited thereto. The electron transport layer may be used together with a predetermined desired cathode material as used according to the prior art. In particular, an example of an appropriate cathode material is a general material having the low work function and followed by an aluminum layer or a silver layer. Specific examples thereof include cesium, barium, calcium, ytterbium, and samarium, and each case is followed by the aluminum layer or the silver layer.

(Electron Injection Layer)

The organic light emitting device according to the present disclosure may include an electron injection layer between an electron transport layer (or a light emitting layer) and a cathode, if necessary.

The electron injection layer is a layer injecting electrons from the electrode, and a compound which has a capability of transporting the electrons, an electron injecting effect from the cathode, and an excellent electron injecting effect to the light emitting layer or the light emitting material, prevents movement of an exciton generated in the light emitting layer to the hole injection layer, and has an excellent thin film forming ability is preferable. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone, and the like, and its derivative, a metal complex compound, a nitrogen-containing 5-membered cycle derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

(Organic Light Emitting Device)

The organic light emitting device according to the present disclosure may be a normal type organic light emitting device in which an anode, at least one organic material layer, and a cathode are sequentially stacked on a substrate. Further, the organic light emitting device according to the present disclosure may be an inverted type organic light emitting device in which a cathode, at least one organic material layer and an anode are sequentially stacked on a substrate. For example, the structure of an organic light emitting device according to an embodiment of the present disclosure is illustrated in FIGS. 1 and 2.

FIG. 1 shows an example of an organic light emitting device comprising a substrate 1, an anode 2, a hole injection layer 3, a hole transport layer 4, a light emitting layer 5, and a cathode 6. In such a structure, the hole injection layer includes the compound represented by Chemical Formula 1, and the hole transport layer includes a polymer including a repeating unit represented by Chemical Formula 2-1, a repeating unit represented by Chemical Formula 2-2, and a repeating unit represented by Chemical Formula 2-3.

FIG. 2 shows an example of an organic light emitting device comprising a substrate 1, an anode 2, a hole injection layer 3, a hole transport layer 4, a light emitting layer 5, an electron transport layer 7, an electron injection layer 8, and a cathode 6. In such a structure, the hole injection layer includes the compound represented by Chemical Formula 1, and the hole transport layer includes a polymer including a repeating unit represented by Chemical Formula 2-1, a repeating unit represented by Chemical Formula 2-2, and a repeating unit represented by Chemical Formula 2-3.

The organic light emitting device according to the present disclosure may be manufactured by materials and methods known in the art, except that the above-mentioned elements are used.

For example, the organic light emitting device according to the present disclosure can be manufactured by sequentially stacking an anode, an organic material layer and a cathode on a substrate. In this case, the organic light emitting device may be manufactured by depositing a metal, metal oxides having conductivity, or an alloy thereof on the substrate by using a PVD (physical vapor deposition) method such as a sputtering method or an e-beam evaporation method to form the anode, forming the organic material layer including the hole injection layer, the hole transport layer, the light emitting layer, and the electron transport layer thereon, and then depositing a material that can be used as the cathode thereon.

In addition to such a method, the organic light emitting device may be manufactured by sequentially depositing a cathode material, an organic material layer, and an anode material on a substrate (International Publication WO 2003/012890). However, the manufacturing method is not limited thereto.

The organic light emitting device according to the present disclosure may be a front side emission type, a back side emission type, or a double side emission type according to the used material.

In addition, the compound according to the present disclosure may be included in an organic solar cell or an organic transistor in addition to an organic light emitting device.

(Coating Composition)

Meanwhile, the hole injection layer and the hole transport layer according to the present disclosure may be formed by a solution process, respectively. For this purpose, in some embodiments, there is provided a coating composition for forming a hole injection layer comprising the compound represented by Chemical Formula 1 and a solvent; and a coating composition for forming a hole transport layer comprising a polymer containing a repeating unit represented by Chemical Formula 2-1 and a repeating unit represented by Chemical Formula 2-2.

The solvent is not particularly limited as long as it is a solvent capable of dissolving or dispersing the compound according to the present disclosure. Examples of the solvent may include chlorine-based solvents such as chloroform, methylene chloride, 1,2-dichloroethane, 1,1,2-trichloroethane, chlorobenzene and o-dichlorobenzene; ether-based solvents such as tetrahydrofuran and dioxane; aromatic hydrocarbon-based solvents such as toluene, xylene, trimethylbenzene and mesitylene; aliphatic hydrocarbon-based solvents such as cyclohexane, methylcyclohexane, n-pentane, n-hexane, n-heptane, n-octane, n-nonane and n-decane; ketone-based solvents such as acetone, methyl ethyl ketone, and cyclohexanone; ester-based solvents such as ethyl acetate, butyl acetate and ethyl cellosolve acetate; polyalcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexanediol, and derivatives thereof; alcohol-based solvents such as methanol, ethanol, propanol, isopropanol and cyclohexanol; sulfoxide-based solvents such as dimethyl sulfoxide; amide-based solvents such as N-methyl-2-pyrrolidone and N,N-dimethylformamide; benzoate-based solvents such as butyl benzoate and methyl-2-methoxybenzoate; tetraline; 3-phenoxy-toluene, and the like. In addition, the above-mentioned solvents may be used singly or in combination of two or more solvents.

Preferably, the solvent of the coating composition for forming the hole injection layer and the solvent of the coating composition for forming the hole transport layer are different from each other.

Moreover, the viscosity of the coating composition is preferably 1 cP to 10 cP, and coating is easy within the above range. Further, the concentration of the compound according to the present disclosure in the coating composition is preferably 0.1 wt/v % to 20 wt/v %.

In addition, the coating composition may further include one or two or more additives selected from the group consisting of a thermal polymerization initiator and a photopolymerization initiator.

Examples of the thermal polymerization initiator may include peroxide initiators such as methyl ethyl ketone peroxide, methyl isobutyl ketone peroxide, acetyl acetone peroxide, methyl cyclohexanone peroxide, cyclohexanone peroxide, isobutyryl peroxide, 2,4-dichlorobenzoyl peroxide, bis-3,5,5-trimethylhexanoyl peroxide, lauryl peroxide, benzoyl peroxide, or azo-based initiators such as azobis isobutylnitrile, azobis dimethylvaleronitrile and azobis cyclohexylnitrile, but are not limited thereto.

Examples of the photopolymerization initiator may include acetophenone-based or ketal-based photopolymerization initiators such as diethoxyacetophenone, 2,2-dimethoxy-1,2-diphenylethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl)butanone-1,2-hydroxy-2-methyl-1-phenylpropan-1-one, 2-methyl-2-morpholino(4-methylthiophenyl)propan-1-one and 1-phenyl-1,2-propanedion-2-(o-ethoxycarbonyl)oxime; benzoin ether-based photopolymerization initiators such as benzoin, benzoin methyl ether and benzoin ethyl ether; benzophenone-based photopolymerization initiators such as benzophenone, 4-hydroxybenzophenone, 2-benzoyl naphthalene, 4-benzoylbiphenyl and 4-benzoylphenyl ether; thioxanthone-based photopolymerization initiators such as 2-isopropylthioxanthone, 2-chlorothioxanthone, 2,4-dimethylthioxanthone, 2,4-diethylthioxanthone and 2,4-dichlorothioxanthone; and other photopolymerization initiators such as ethyl anthraquinone, 2,4,6-trimethylbenzoyldiphenylphosphine oxide, 2,4,6-trimethylbenzoylphenylethoxyphosphine oxide, bis(2,4,6-trimethylbenzoyl)phenylphosphine oxide, bis(2,4-dimethoxy benzoyl)-2,4,4-trimethylpentylphosphine oxide, but are not limited thereto.

Moreover, those having a photopolymerization promoting effect can also be used alone or in combination with the photopolymerization initiator. Examples thereof include triethanolamine, methyldiethanolamine, ethyl 4-dimethylaminobenzoate, isoamyl 4-dimethylamino benzoate, (2-dimethylamino)ethyl benzoate, 4,4'-dimethylaminobenzophenone, and the like, but are not limited thereto.

In another embodiment of the present disclosure, there is provided a method for forming a hole injection layer and a hole transport layer using the above-mentioned coating composition. Specifically, the method includes the steps of: coating the above-mentioned coating composition for forming a hole injection layer onto an anode by a solution process; and subjecting the coated coating composition to thermal treatment or photo treatment. Further, the method includes the steps of: coating the above-mentioned coating composition for forming a hole transport layer onto a hole injection layer by a solution process; and subjecting the coated coating composition to thermal treatment or photo treatment.

The solution process uses the coating composition according to the present disclosure, and refers to spin coating, dip coating, doctor blading, inkjet printing, screen printing, spray method, roll coating, and the like, but is not limited thereto.

The heat treatment temperature in the heat treatment step is preferably from 150 to 230° C. In some embodiments, a heat treatment time may be from 1 minute to 3 hours, more preferably 10 minutes to 1 hour. In some embodiments, the heat treatment is preferably carried out in an inert gas atmosphere such as argon and nitrogen. Further, a step of evaporating a solvent may be further included between the coating step and the thermal treatment or photo treatment The preparation of the organic light emitting device according to the present disclosure will be described in detail in the following examples. However, these examples are presented for illustrative purposes only, and the scope of the present disclosure is not limited thereto.

Preparation Example—HIL HOST

Preparation Example 1-1: Preparation of Compound 1-1

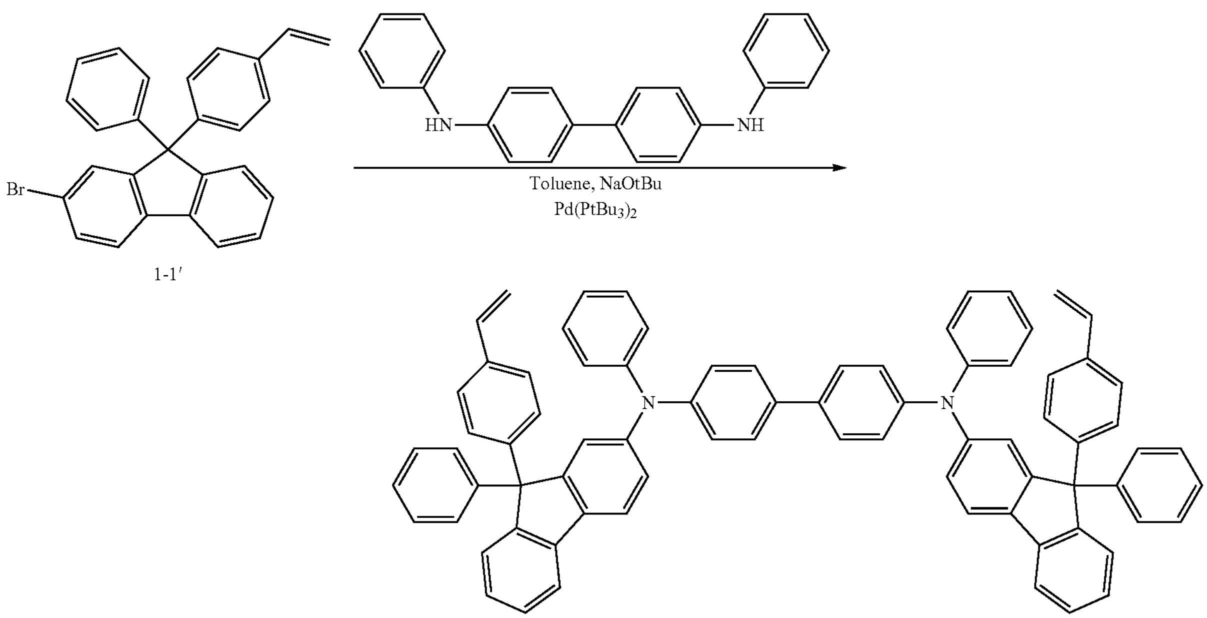

1-1'

1-1

Toluene was placed in a flask containing Compound 1-1' (1.58 g, 3.74 mmol), N4,N4'-diphenyl-[1,1'-biphenyl]-4,4'-diamine (572 mg. 1.7 mmol), and sodium tert-butoxide (980 mg, 10.2 mmol). The flask containing the reactants was immersed in an oil bath at 90° C., and then $Pd(P(tBu)_3)_2$ (43 mg, 0.085 mmol) was added and agitated for 1 hour. The reaction was stopped by adding water, the mixture was extracted with dichloromethane, and then the organic layer was dried with $MgSO_4$. The organic solvent was removed using a rotary vacuum concentrator, and the residue was subjected column purification to give Compound 1-1 (950 mg, yield: 55%, HPLC purity: 99.5%).

$^1$H NMR (500 MHz, $CDCl_3$): δ 7.71 (d, 2H), 7.65 (d, 2H), 7.42 (d, 4H), 7.35 (d, 4H), 7.27-7.20 (m, 18H), 7.17-7.13 (m, 4H), 7.11-7.06 (m, 14H), 7.03 (t, 2H), 6.70-6.64 (dd, 2H), 5.69 (d, 2H), 5.19 (d, 2H)

Preparation Example 1-2: Preparation of Compound 1-2

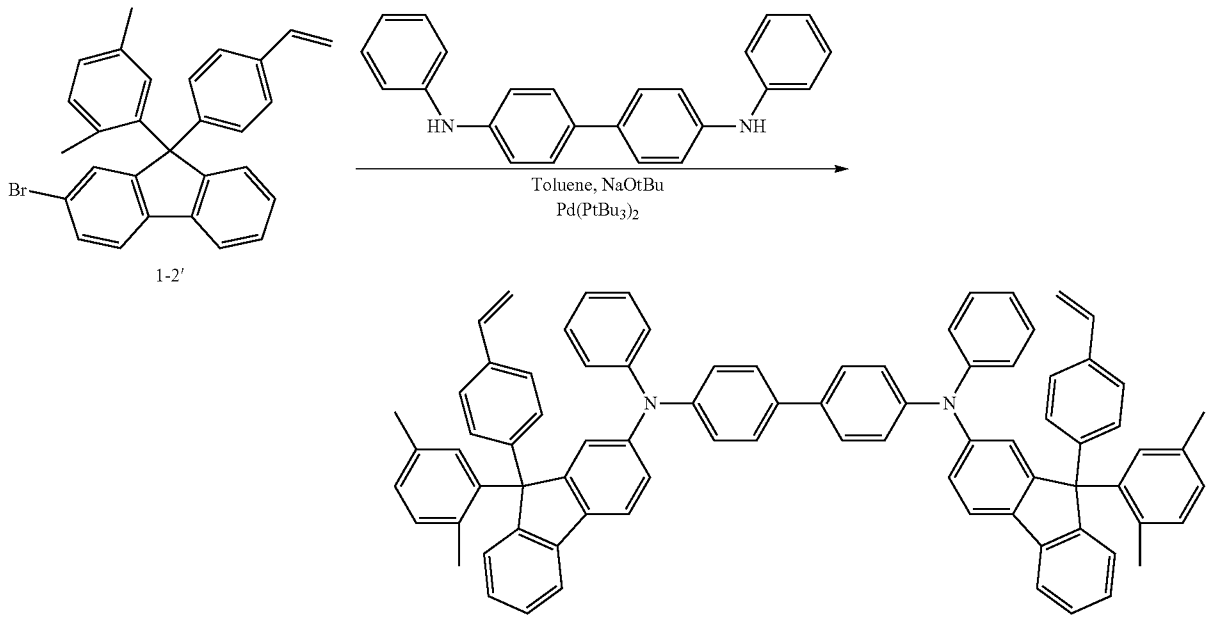

Toluene was placed in a flask containing Compound 1-2' (1.37 g, 3.03 mmol), N4,N4'-diphenyl-[1,1'-biphenyl]-4,4'-diamine (464 mg. 1.38 mmol), and sodium tert-butoxide (769 mg, 8.3 mmol). The flask containing the reactants was immersed in an oil bath at 90° C., and then $Pd(P(tBu)_3)_2$ (36 mg, 0.085 mmol) was added and agitated for 1 hour. The reaction was stopped by adding water, the mixture was extracted with dichloromethane, and then the organic layer was dried with $MgSO_4$. The organic solvent was removed using a rotary vacuum concentrator, and the residue was subjected column purification to give Compound 1-2 (500 mg, yield: 34%, HPLC purity: 99.8%).

$^1H$ NMR (500 MHz, $CDCl_3$): δ 7.70 (d, 2H), 7.63 (d, 2H), 7.43 (d, 4H), 7.37 (t, 2H), 7.30-7.20 (m, 14H), 7.15-7.05 (m, 14H), 7.02 (t, 2H), 6.93 (s, 4H), 6.86 (s, 2H), 6.71-6.65 (dd, 2H), 5.70 (d, 2H), 5.20 (d, 2H), 2.15 (s, 6H), 1.57 (s, 6H)

Preparation Example 1-3: Preparation of Compound 1-3

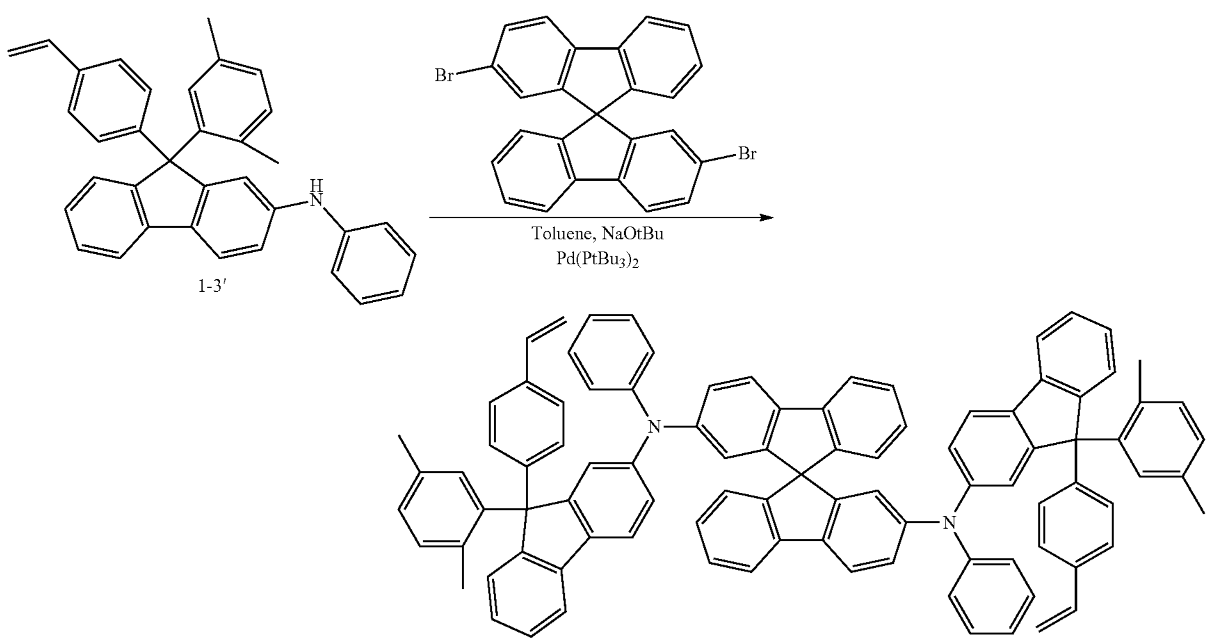

Toluene was placed in a flask containing Compound 1-3' (2.32 g, 5.0 mmol), 2,2'-dibromo-9,9'-spirobi(fluorene) (948 mg. 2.0 mmol), and sodium tert-butoxide (960 mg, 10.0 mmol). The flask containing the reactants was immersed in an oil bath at 90° C., and then $Pd(P(tBu)_3)_2$ (72 mg, 0.14 mmol) was added and agitated for 1 hour. The reaction was stopped by adding water, the mixture was extracted with dichloromethane, and then the organic layer was dried with $MgSO_4$. The organic solvent was removed using a rotary vacuum concentrator, and the residue was subjected column purification to give Compound 1-3 (1.46 g, yield: 59%, HPLC purity: 99.2%).

$^1$H NMR (500 MHz, $CDCl_3$): δ 7.74-7.69 (m, 4H), 7.68-7.63 (m, 2H), 7.62-7.56 (m, 2H), 7.39 (td, 2H), 7.33 (ddddd, 4H), 7.26 (tdd, 6H), 7.19-7.04 (m, 12H), 7.04-6.90 (m, 14H), 6.85 (d, 2H), 6.76-6.68 (m, 4H), 6.65-6.55 (m, 2H), 5.78-5.70 (m, 2H), 5.25 (dq, 2H), 2.16 (s, 6H), 1.57 (s, 6H)

Preparation Example 1-4: Preparation of Compound 1-4

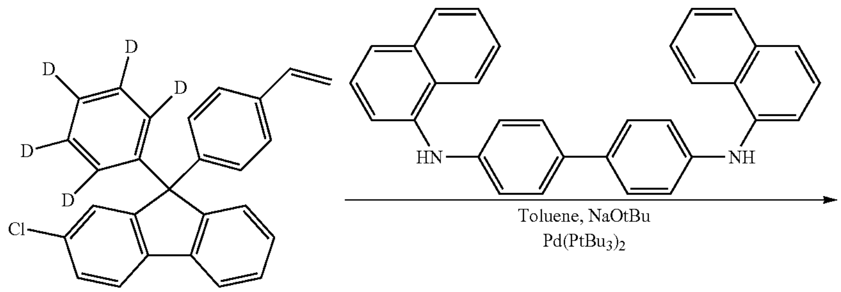

1-4'

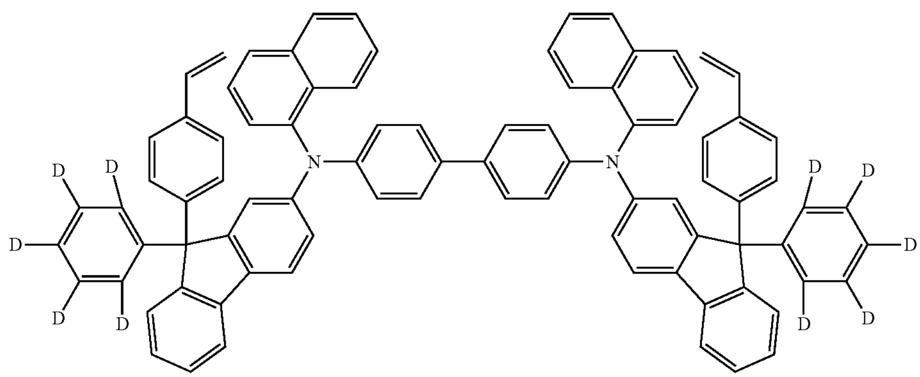

1-4

Toluene was placed in a flask containing Compound 1-4'(1.6 g, 4.2 mmol), N4,N4'-di(naphthalen-1-yl)-[1,1'-biphenyl]-4,4'-diamine (873 mg, 2.0 mmol), and sodium tert-butoxide (769 mg, 8.0 mmol), and bubbled with nitrogen. The flask containing the reactants was immersed in an oil bath at 100° C., and then $Pd(P(tBu)_3)_2$ (82 mg, 0.16 mmol) was added and agitated for 12 hours. The reaction was stopped by adding water, the mixture was extracted with dichloromethane, and then the organic layer was dried with $MgSO_4$. The organic solvent was removed using a rotary vacuum concentrator, and the residue was subjected column purification to give Compound 1-4 (1.2 g, yield: 53%, HPLC purity: 99.1%).

$^1$H NMR (500 MHz, $CDCl_3$): δ 7.90-7.88 (m, 2H), 7.87 (dd, 2H), 7.79-7.75 (m, 2H), 7.64 (dt, 2H), 7.59 (dd, 2H), 7.49-7.41 (m, 4H), 7.37-7.30 (m, 12H), 7.22-7.11 (m, 8H), 7.09-7.03 (m, 4H), 7.02-6.96 (m, 6H), 6.64 (dd, 2H), 5.67 (dd, 2H), 5.18 (dd, 2H)

Preparation Example—HTL

Preparation Example 2-1: Preparation of Compound 2-1

Step 1) Preparation of Intermediate a1

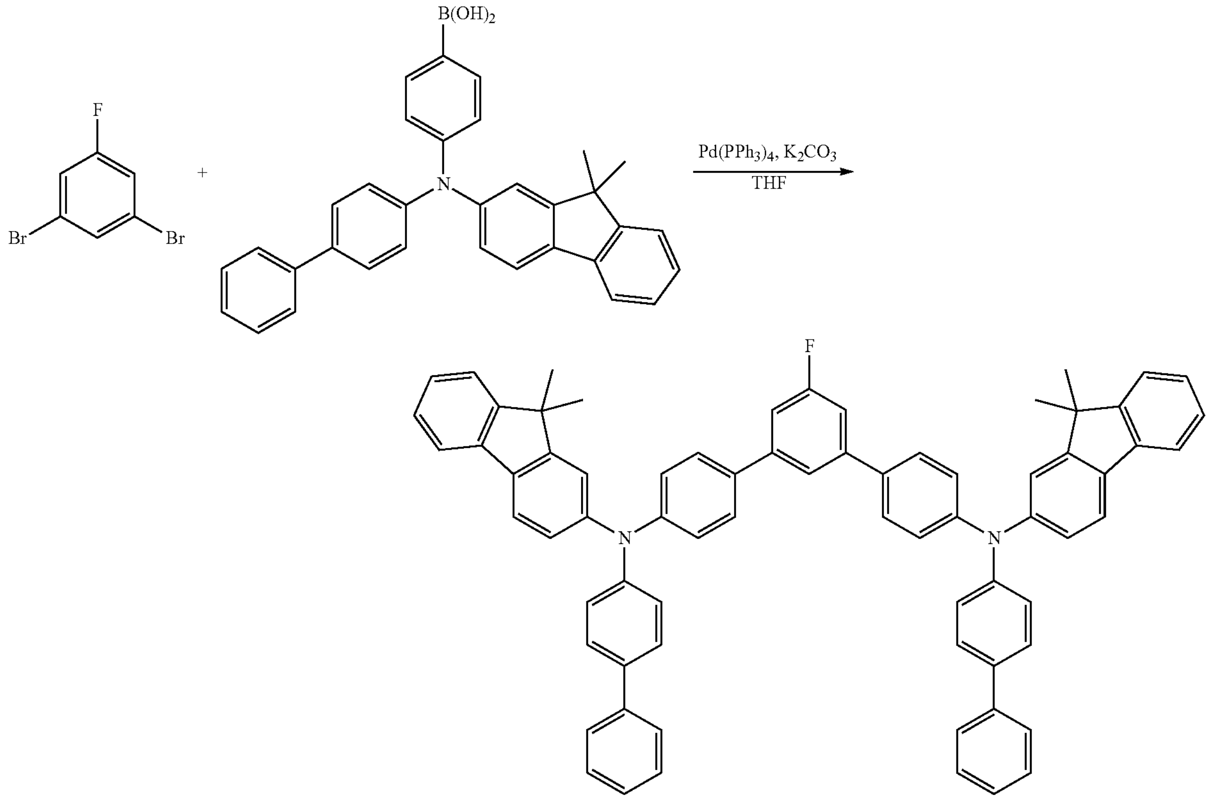

a1

4-(Biphenyl-4-yl(9,9-dimethyl-9H-fluoren-2-yl)amino) phenyl boronic acid (12 g, 25 mmol), $Pd(PPh_3)_4$ (578 mg, 0.5 mmol) and $K_2CO_3$ (6.9 g, 50 mmol) were placed in a round bottom flask, and then purged with nitrogen. 1,3-Dibromo-5-fluorobenzene (1.26 mL, 10 mmol), THF (tetrahydrofuran, 40 mL) and $H_2O$ (10 mL) were added thereto, and then stirred at 90° C. for 12 hours. After completion of the reaction, the mixture was extracted with ethyl acetate and water. After collecting the organic layer, the organic layer was dried using $MgSO_4$ and filtered.

The filtrate was dried with a rotary vacuum concentrator to remove the organic solvent, and then the residue was subjected to column purification to give 9.5 g (yield: 98%) of Intermediate a1.

Step 2) Preparation of Intermediate a2

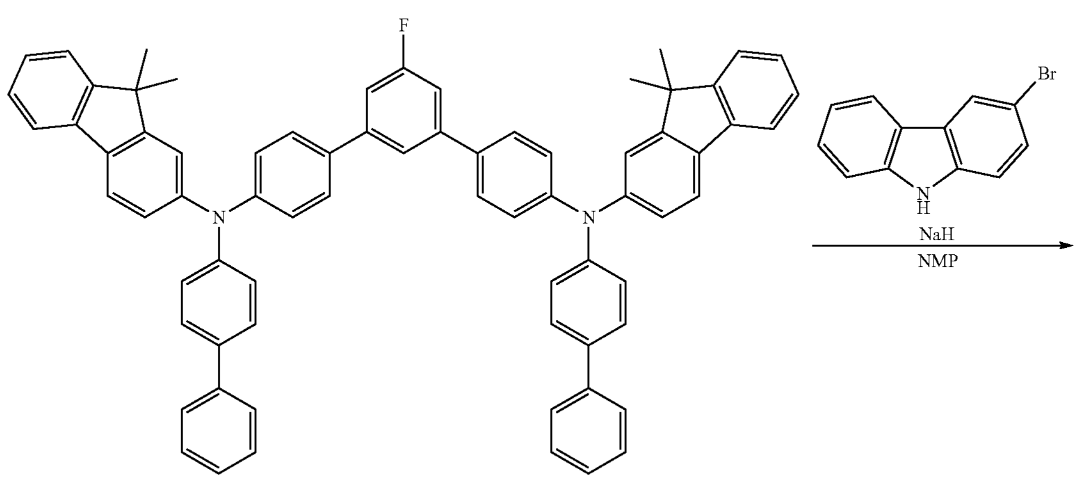

a1

-continued

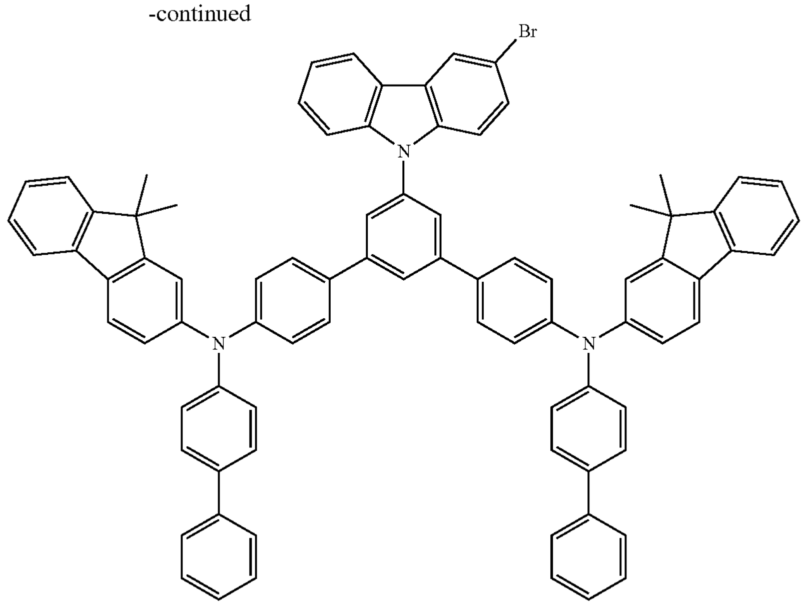

a2

NaH (60 wt %, 420 mg, 10.5 mmol) was placed in a round bottom flask, and then purged with nitrogen. NMP (N-methylpyrrolidone, 8.8 mL) was added thereto, and then cooled to 0° C. A solution of 3-bromocarbazole (2.6 g, 10.5 mmol) dissolved in NMP (8.8 mL) was slowly added to the reaction mixture, and then stirred at 0° C. for 30 minutes. A solution of Intermediate a1 (6.8 g, 7 mmol) dissolved in NMP (17 mL) was added to the reaction mixture, and then stirred at 220° C. for 2 hours. After completion of the reaction, the reaction mixture was extracted with ethyl acetate and water. After collecting the organic layer, the organic layer was dried using $MgSO_4$ and filtered. The filtrate was dried with a rotary vacuum concentrator to remove the organic solvent, and the residue was subjected to column purification to give 5 g (yield: 60%) of Intermediate a2.

Step 3) Preparation of Intermediate a3

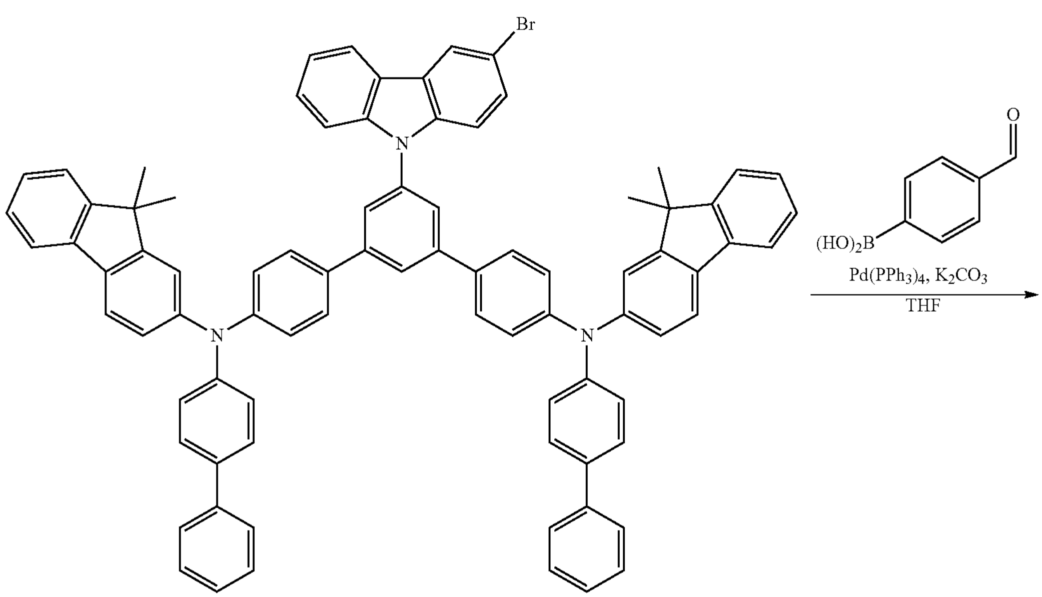

a2

-continued

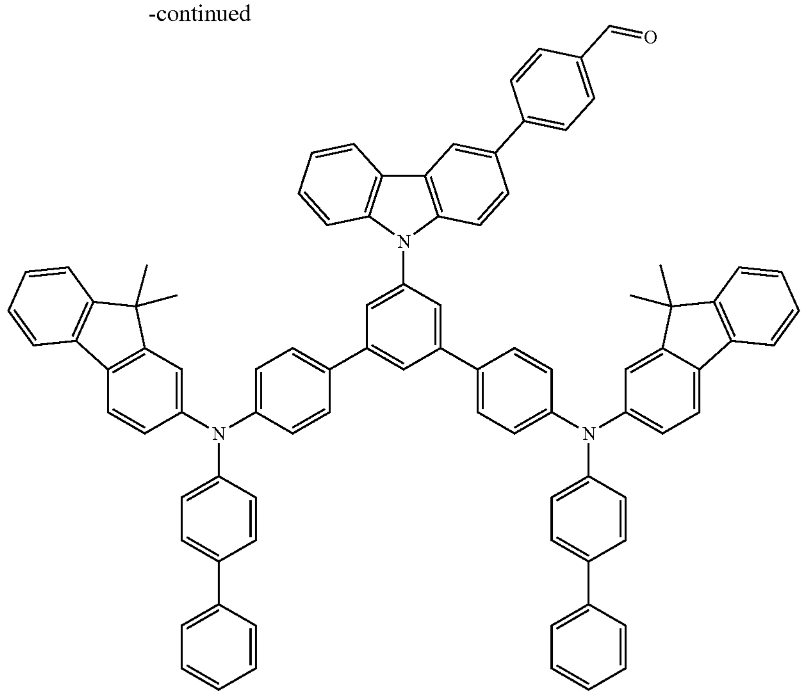

a3

Intermediate a2 (4 g, 3.35 mmol), 4-formylphenyl boronic acid (750 mg, 5 mmol), $Pd(PPh_3)_4$ (196 mg, 0.17 mmol) and $K_2CO_3$ (1.4 g, 10 mmol) were placed in a round bottom flask and then purged with nitrogen. THF (13.4 mL) and $H_2O$(3.4 mL) were added thereto, and then stirred at 90° C. for 4 hours. After completion of the reaction, the mixture was extracted with ethyl acetate and water. After collecting the organic layer, the organic layer was dried using $MgSO_4$ and filtered. The filtrate was dried with a rotary vacuum concentrator to remove the organic solvent, and then the residue was subjected to column purification to give 2.87 g (yield: 70%) of Intermediate a3.

Step 4) Preparation of Compound 2-1

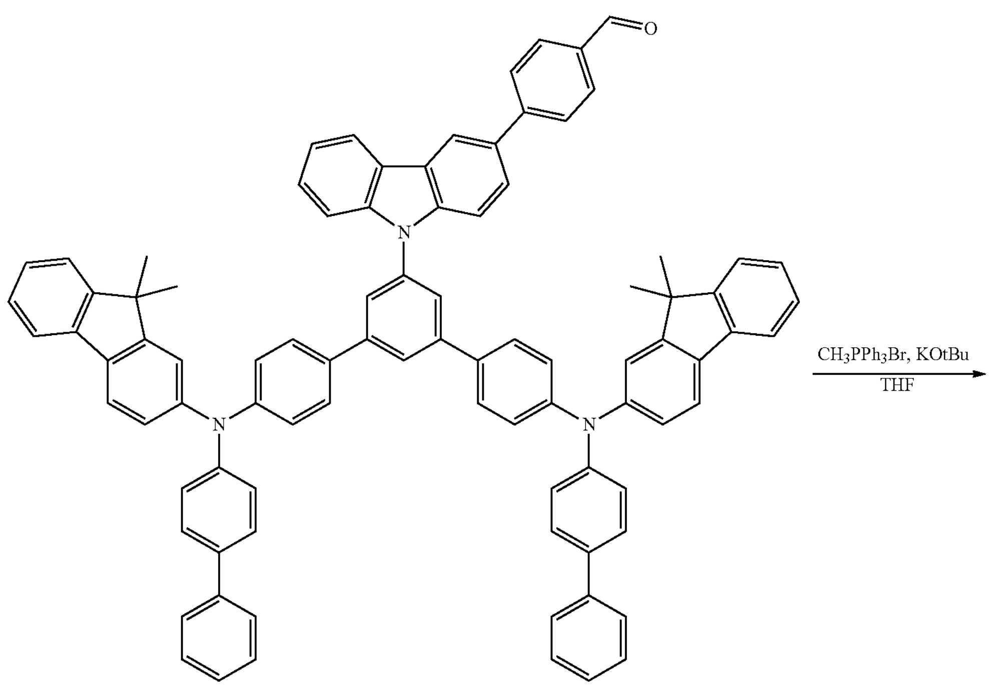

a3

-continued

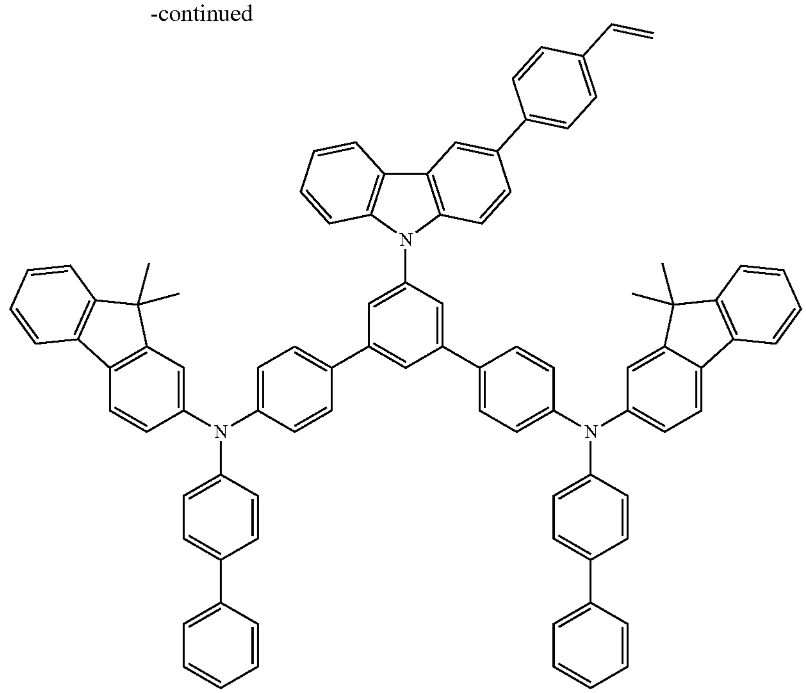

2-1

$CH_3PPh_3Br$ (1.57 g, 4.4 mmol) and THF (12 mL) were placed in a round bottom flask, then purged with nitrogen, and cooled to 0° C. KOtBu (494 mg, 4.4 mmol) was added to the reaction mixture and then purged with nitrogen and stirred at 0° C. for 20 minutes. A solution of Intermediate a3 (2.68 g, 2.2 mmol) dissolved in THF (10 mL) was slowly added to the reaction mixture, and then stirred at 0° C. for 40 minutes. After completion of the reaction, the reaction mixture was extracted with ethyl acetate and water. After collecting the organic layer, the organic layer was dried using $MgSO_4$ and filtered. The filtrate was dried with a rotary vacuum concentrator to remove the organic solvent, and then the residue was subjected to column purification to give 2.25 g (yield: 84%) of Compound 2-1.

$^1H$ NMR (500 MHz, $CD_2Cl_2$): δ 8.40 (s, 1H), 8.21 (d, 1H), 7.95 (s, 1H), 7.77 (s, 2H), 7.71 (d, 3H) 7.66-7.50 (m, 20H), 7.46-7.38 (m, 7H), 7.33-7.20 (m, 17H), 7.11 (d, 2H), 6.78 (dd, 1H), 5.80 (d, 1H), 5.26 (d, 2H), 1.41 (s, 12H)

Preparation Example 2-2: Preparation of Compound 2-2

Step 1) Preparation of Intermediate b1

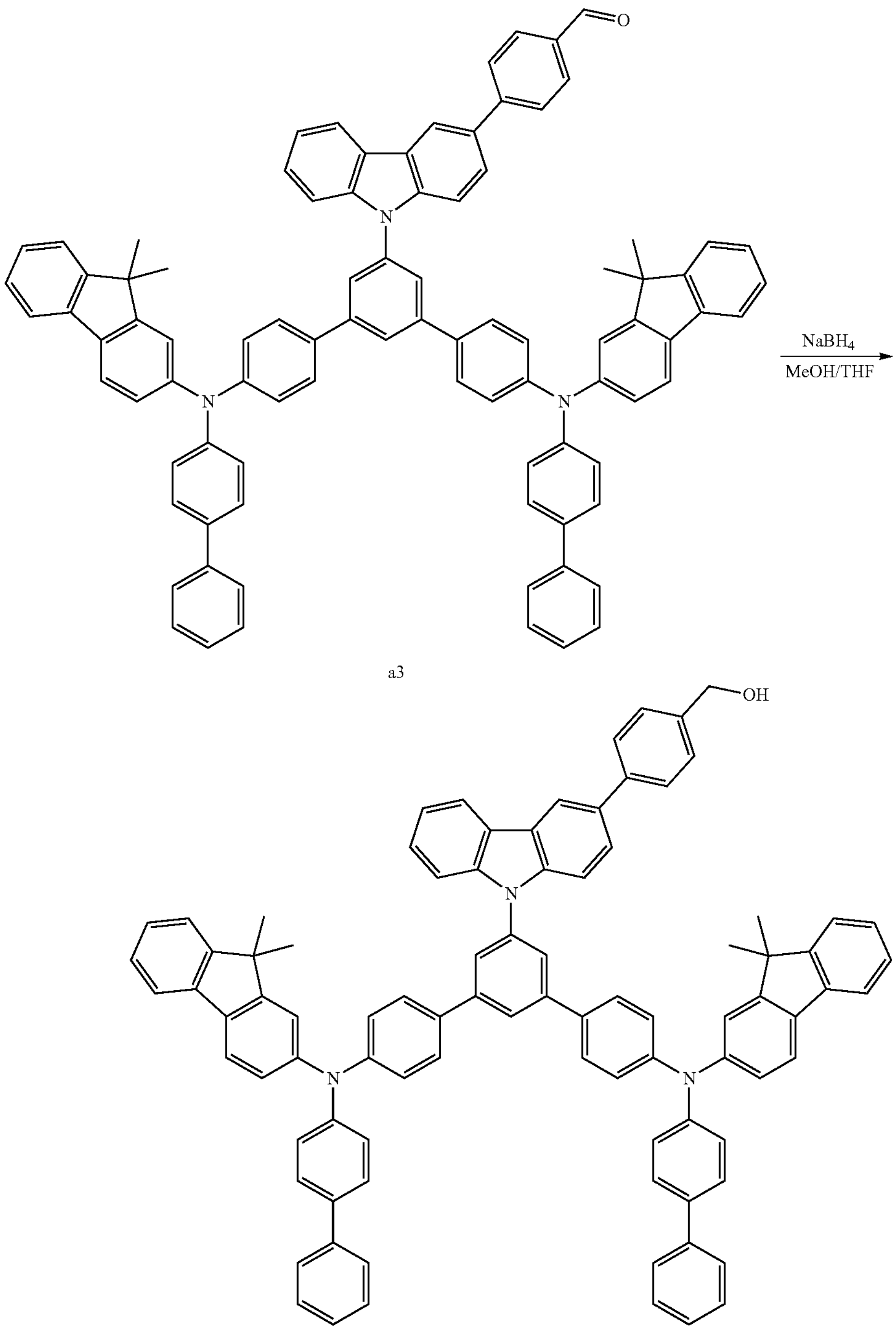

a3 b1

Intermediate a3 (2.44 g, 2 mmol) was placed in a round bottom flask, and then dissolve in MeOH (5 mL) and THF (5 mL). While maintaining the reaction mixture at room temperature, sodium borohydride (227 mg, 6 mmol) was added little by little, and then the mixture was stirred at room temperature for 30 minutes. After completion of the reaction, the reaction mixture was extracted with ethyl acetate and water. After collecting the organic layer, the organic layer was dried using $MgSO_4$ and filtered. The filtrate was dried with a rotary vacuum concentrator to give 2.1 g (yield: 86%) of Intermediate b1.

Step 2) Preparation of Compound 2-2
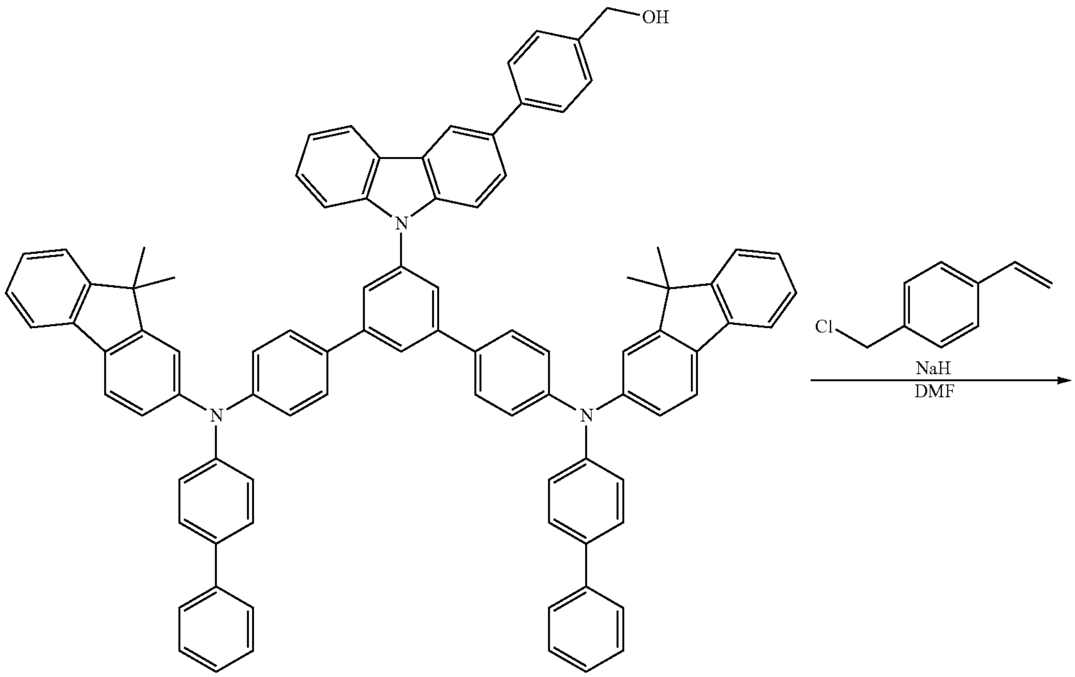
b1
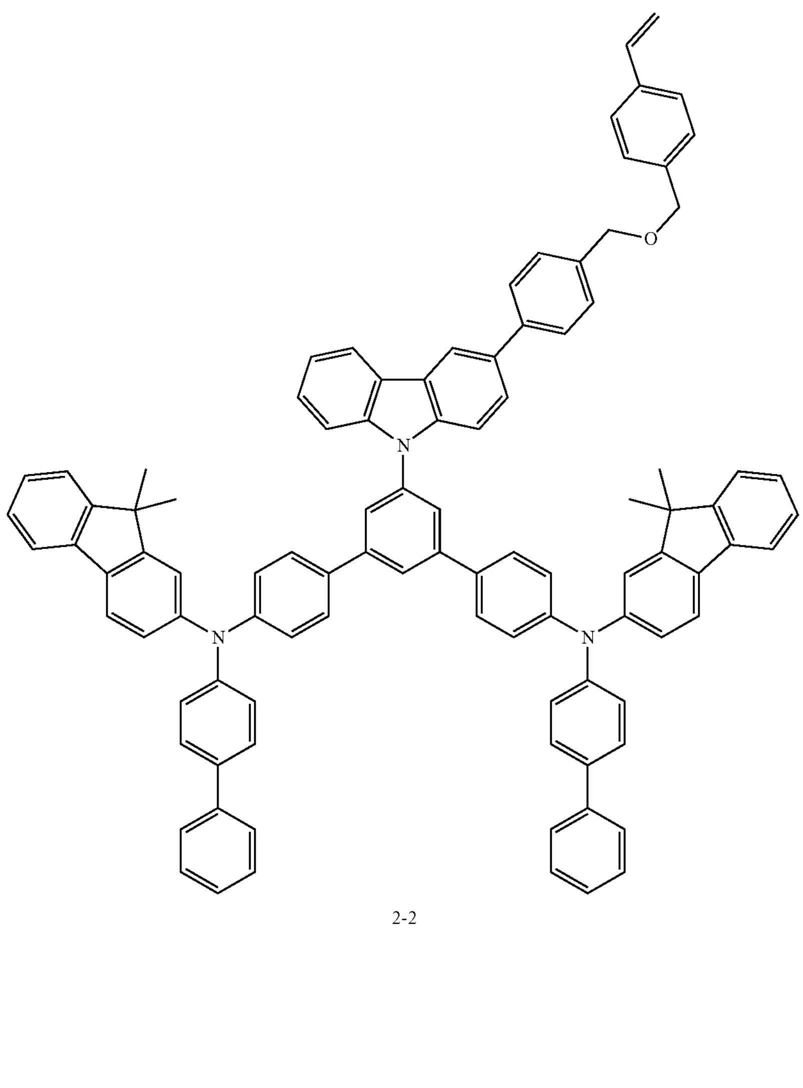
2-2

Sodium hydride (60 wt %, 112 mg, 2.8 mmol) was placed in a round bottom flask, and the atmosphere was purged to be substituted with nitrogen. Anhydrous DMF (3.5 mL) was added thereto, and then cooled to 0° C. A solution of Intermediate b1 (1.71 g, 1.4 mmol) dissolved in anhydrous DMF (3.5 mL) was slowly added to the reaction mixture, and then stirred at 0° C. for 1 hour. After adding 4-vinylbenzyl chloride (0.39 mL, 2.8 mmol), the temperature was raised to 60° C., and the mixture was stirred for 4 hours. After completion of the reaction, the reaction mixture was extracted with ethyl acetate water. After collecting the organic layer, the organic layer was dried using $MgSO_4$ and filtered. The filtrate was dried with a rotary vacuum concentrator to blow off the organic solvent. The residue was subjected to column purification to give 1.22 g (yield: 65%) of Compound 2-2.

$^1$H NMR (500 MHz, $CDCl_3$): δ 8.40 (s, 1H), 8.21 (d, 1H), 7.95 (s, 1H), 7.77 (s, 2H), 7.71 (d, 3H) 7.66-7.50 (m, 22H), 7.46-7.38 (m, 7H), 7.33-7.20 (m, 19H), 7.11 (d, 2H), 6.69 (dd, 1H), 5.73 (d, 1H), 5.21 (d, 1H), 4.50 (s, 2H), 4.48 (s, 2H), 1.41 (s, 12H)

Preparation Example 2-3: Preparation of Polymer C1

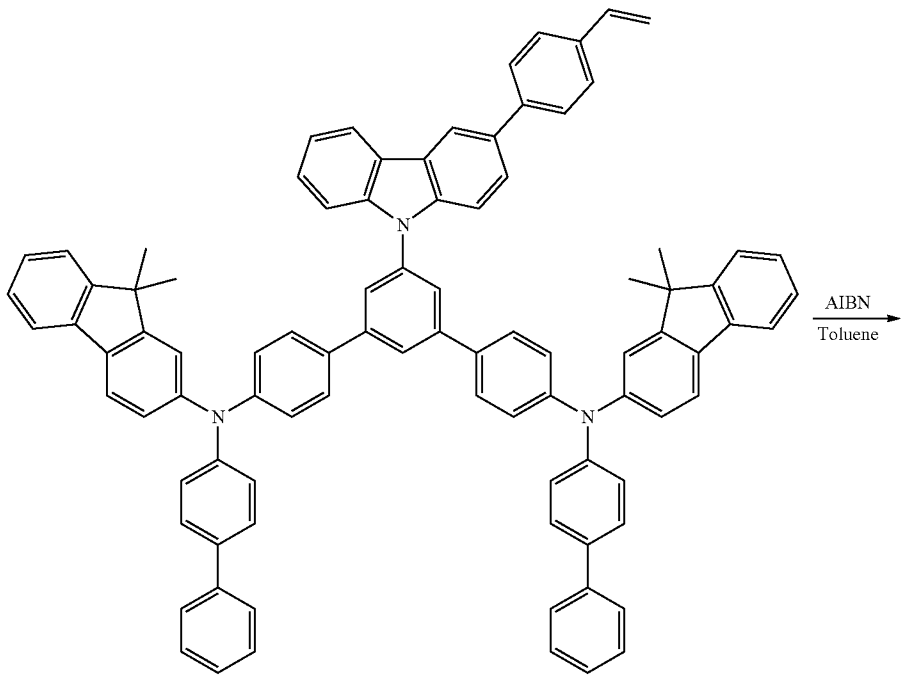

2-1

-continued

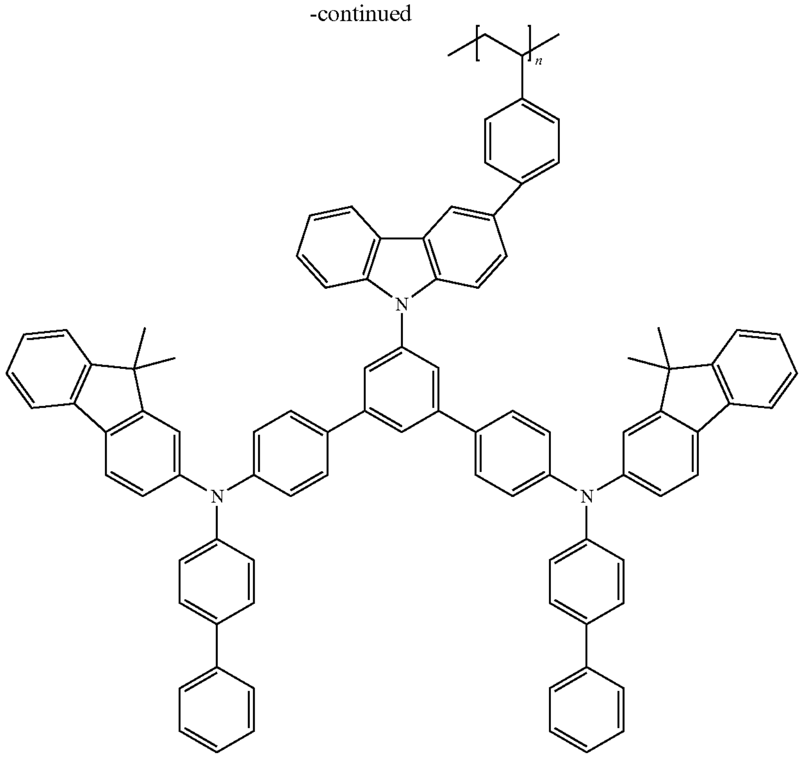

C1

Compound 2-1 (973 mg, 0.8 mmol) and azobisisobutyronitrile (1.3 mg, 0.008 mmol) were placed in a round bottom flask, and then dissolved in anhydrous toluene (1.6 mL) under a nitrogen atmosphere. The mixture was stirred at 70° C. for 6 hours. After completion of the reaction, the reaction mixture was diluted with THF (5 mL), and then added to ethyl acetate (70 mL). The precipitate was filtered and washed with ethyl acetate. The obtained solid was dried to give 620 mg (yield: 64%) of Polymer C1. (Mw=102591, Mn=45941; the number average molecular weight and weight average molecular weight was measured by GPC using PS standards and Agilent 1200 series).

Preparation Example 2-4: Preparation of Polymer C2
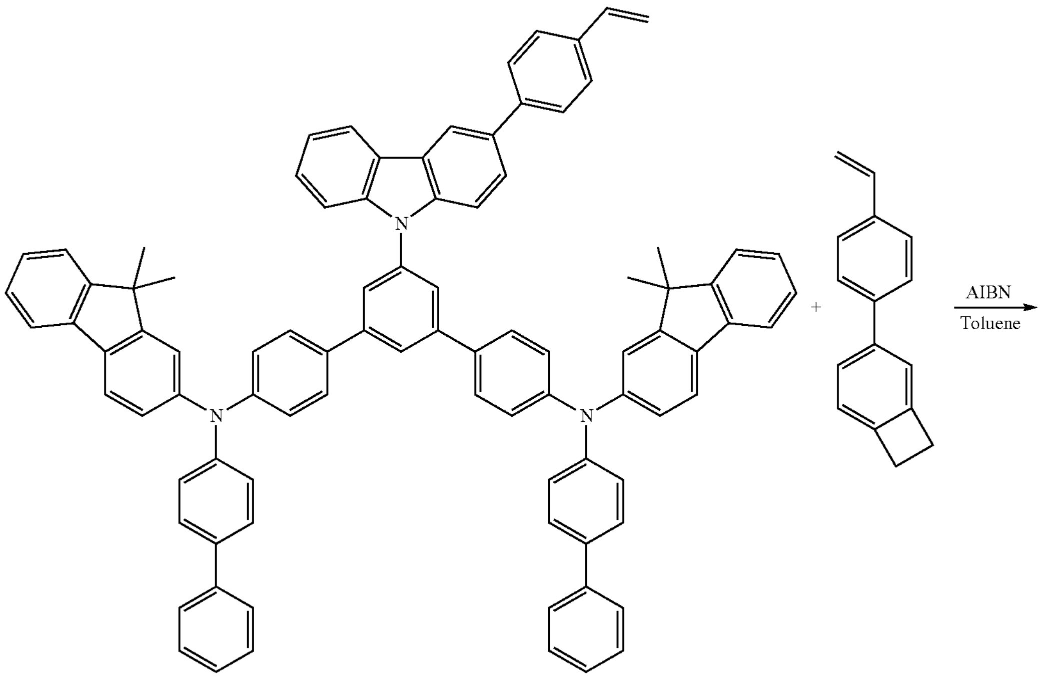
2-1
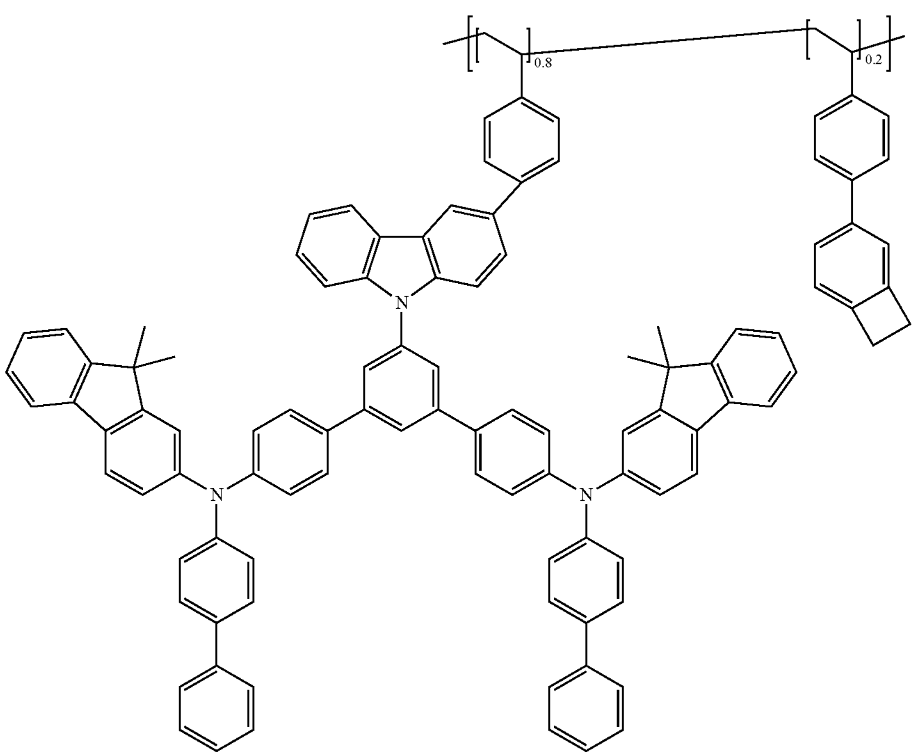
C2

Compound 2-1 (973 mg, 0.8 mmol) and 3-(4-vinylphenyl)bicyclo[4.2.0]octa-1(6),2,4-triene (41 mg, 0.2 mmol), and azobisisobutyronitrile (1.3 mg, 0.008 mmol) were placed in a round bottom flask, and then dissolved in anhydrous toluene (1.6 mL) under a nitrogen atmosphere. The mixture was stirred at 70° C. for 6 hours. After completion of the reaction, the reaction mixture was diluted with THF (5 mL), and then added to ethyl acetate (70 mL). The precipitate was filtered and washed with ethyl acetate. The obtained solid was dried to obtain 730 mg (yield: 72%) of Polymer C2. (Mw=90410, Mn=48393; the number average molecular weight and weight average molecular weight were measured by GPC using PS standards and Agilent 1200 series).

Preparation Example 2-5: Preparation of Polymer C3

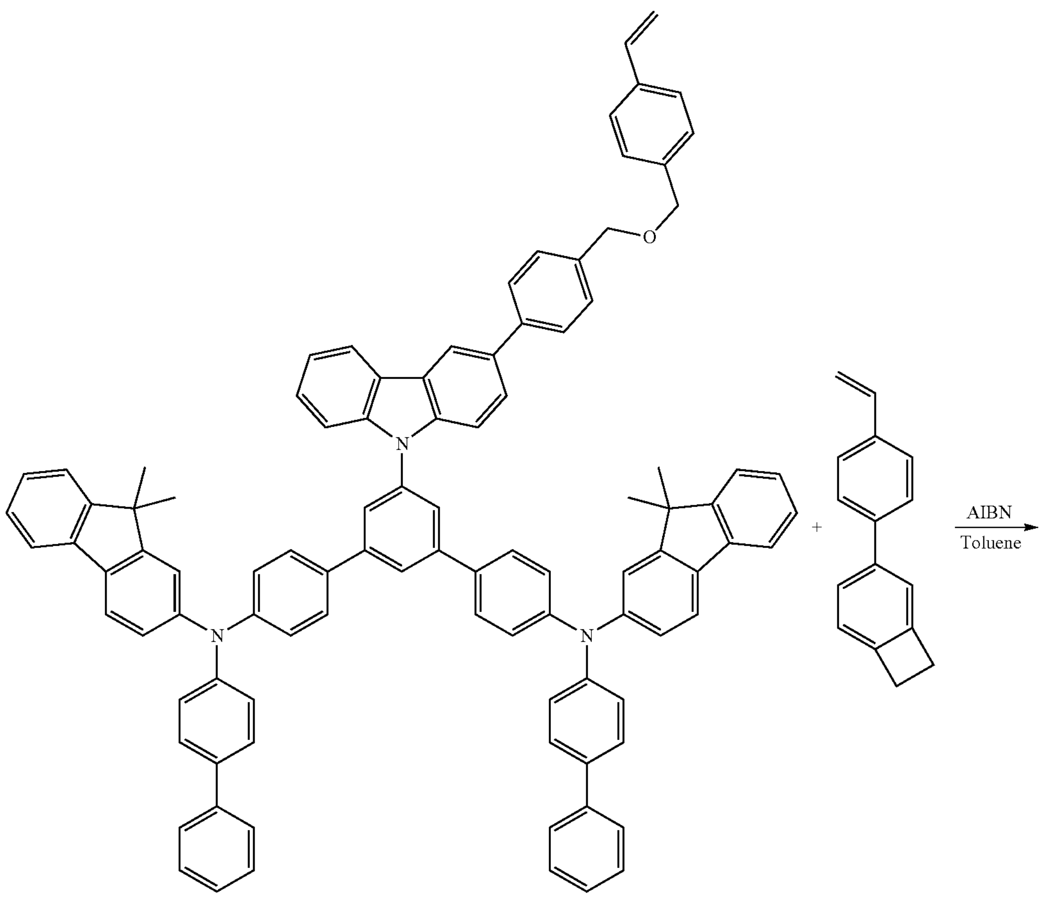

2-2

-continued

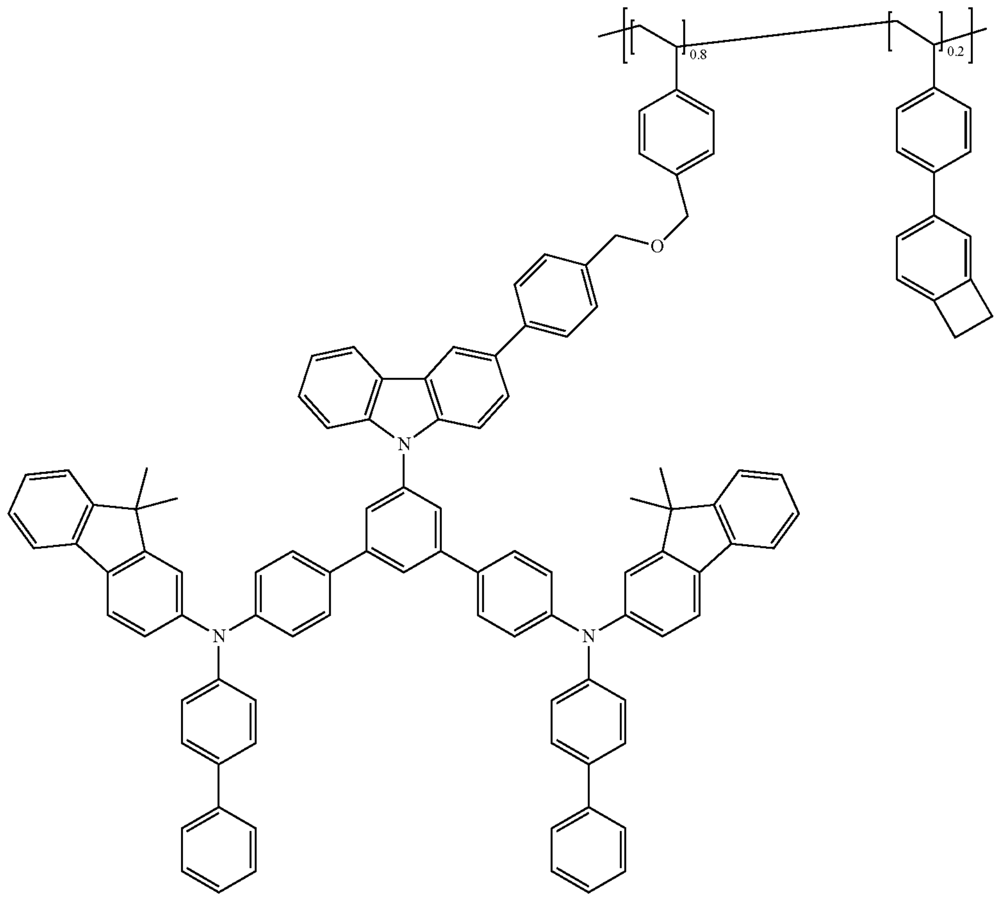

C3

Compound 2-2 (1.07 g, 0.8 mmol) and 3-(4-vinylphenyl) bicyclo[4.2.0]octa-1(6),2,4-triene (41 mg, 0.2 mmol), and azobisisobutyronitrile (1.3 mg, 0.008 mmol) were placed in a round bottom flask, and then dissolved in anhydrous toluene (1.6 mL) under a nitrogen atmosphere. The mixture was stirred at 70° C. for 6 hours. After completion of the reaction, the reaction mixture was diluted with THF (5 mL), and then added to ethyl acetate (70 mL). The precipitate was filtered and washed with ethyl acetate. The obtained solid was dried to give 689 mg (yield: 62%) of Polymer C3. (Mw=108187, Mn=78944; the number average molecular weight and weight average molecular weight were measured by GPC using PS standards and Agilent 1200 series)

Preparation Example—HIL Dopant

Preparation Example 3-1: Preparation of Compound 3-1

Step 1) Preparation of Compound 3-1'

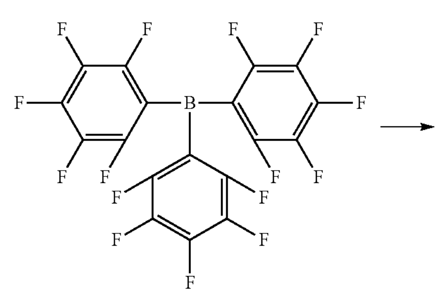

-continued

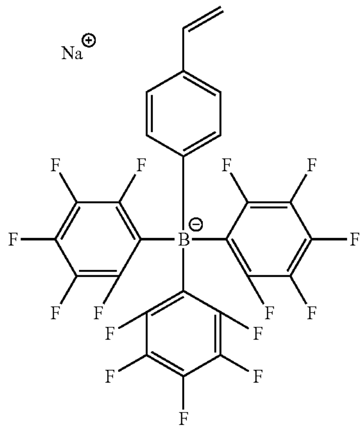

3-1'

-continued

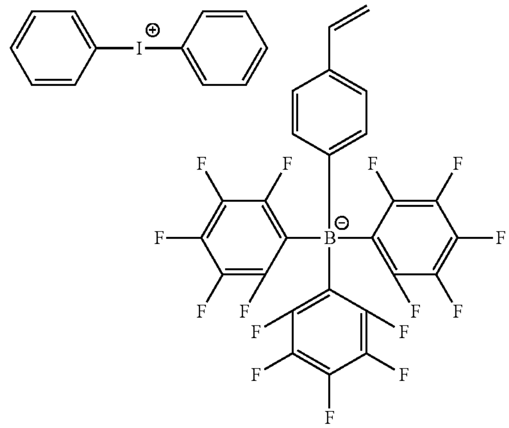

3-1

Mg (193 mg, 7.92 mmol), $I_2$ (4 mg) and THF (10 mL) were placed in a 100 mL round bottom flask under a nitrogen atmosphere, and stirred for 30 minutes. 4-Bromostyrene (1.04 mL, 7.92 mmol) was added thereto, and the mixture was stirred for a day while a 30° C. water bath was placed under a round bottom flask. Dissolution of Mg was identified by the solution becoming black. Ether (5 mL) was added to dilute the reaction solution. Tris(pentafluorophenyl)borane (1 g, 3.96 mmol) was dissolved in ether (5 mL) and slowly added to the reaction solution for 30 minutes. The solution was stirred for a day. $Na_2CO_3$ (0.1 M, 80 mL, 8.0 mmol) was slowly added to the reaction solution. The organic solvent was extracted using ethyl acetate (20 mL*3), and residual water was removed with $MgSO_4$. In order to additionally remove residual water and impurities, the result was distilled with benzene using a Dean-stark. When approximately 10 mL of the solvent was left, the solution was cooled and filtered to give Compound 3-1' (1.6 g, yield: 64%).

Step 2) Preparation of Compound 3-1

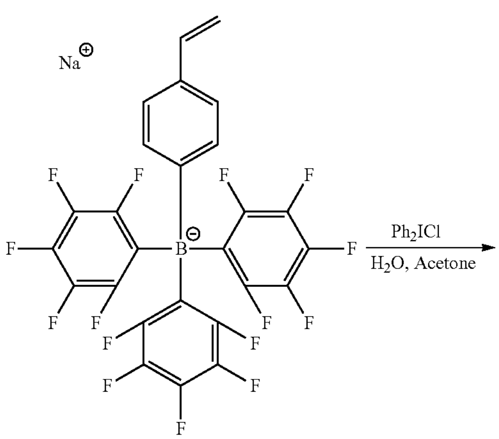

3-1'

Compound 3-1' (100 mg, 0.16 mmol), distilled water (10 mL) and $Ph_2ICl$ (60 mg, 0.19 mmol) were placed in a 25 mL round bottom flask, and stirred for 1 hour. Acetone (15 mL) was added to the reaction solution to cause precipitation, and the precipitate was filtered and dried to give Compound 3-1 (140 mg, yield: 100%).

MS: $[M-H]^-$=615 (negative mode)

MS: $[M+H]^+$=281 (positive mode)

Preparation Example 3-2: Preparation of Compound 3-2

Step 1) Preparation of Compound 3-2'

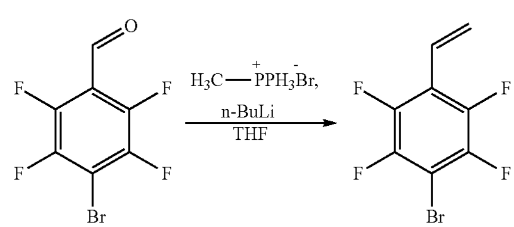

3-2'

Methyltriphenyl potassium bromide (13.90 g, 38.91 mmol) and THF (100 mL) were placed in a 250 mL round bottom flask, and stirred at 0° C. for 30 minutes. n-BuLi (15.6 mL, 38.91 mmol, 2.5 M in hexane) was slowly added to the reaction solution, and stirred at 0° C. for 30 minutes. 4-Formyl-2,3,5,6-tetrafluoro-1-bromobenzene (5.0 g, 19.47 mmol, 30 mL in THF) was slowly added to the reaction solution at 0° C. The reaction solution was stirred while gradually raising the temperature to room temperature. After 3 hours, ether (100 mL) and saturated $NH_4Cl$ solution (400 mL) were added to the reaction solution. The organic solvent was extracted with ether (200 mL*2) and the residual water was removed with $MgSO_4$. The resulting material was subjected to column chromatography with ethyl acetate: hexane=1:9 (v:v) to give Compound 3-2' (1.29 g, yield: 26%).

Step 2) Preparation of Compound 3-2"

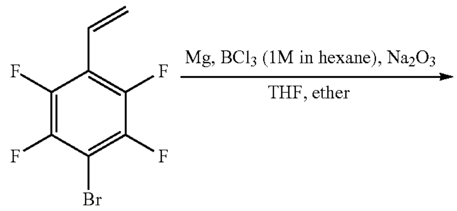

3-2′

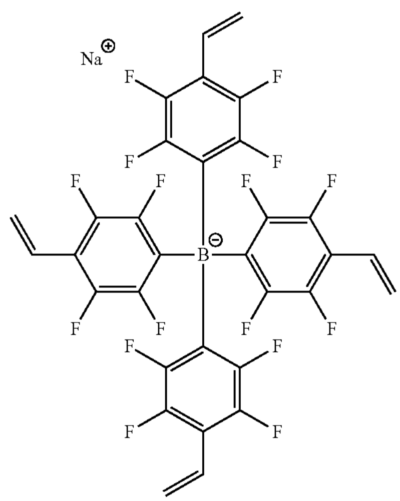

3-2″

Mg (95 mg, 3.92 mmol), THF (10 mL) and $I_2$ (4 mg) were placed in a 25 mL round bottom flask, and stirred. Compound 3-2' (1.0 g, 3.92 mmol) was added to the reaction solution, and stirred at room temperature. After 10 hours, complete dissolution of Mg was identified by the solution becoming black, and ether (10 mL) and $BCl_3$ (1.3 mL, 1.3 mmol, 1 M in hexane solution) were added over 30 minutes. After stirring the reaction solution for a day, $Na_2CO_3$ (30 mL, 3.0 mmol, 0.1 M in $H_2O$) was added. The synthesized material was extracted with ethyl acetate (10 mL*3), and then the residual water was removed with $MgSO_4$. After removing all the solvent, water was completely removed with Dean-stock using benzene, and the solids were filtered to give Compound 3-2" (340 mg, yield: 28%).

Step 3) Preparation of Compound 3-2

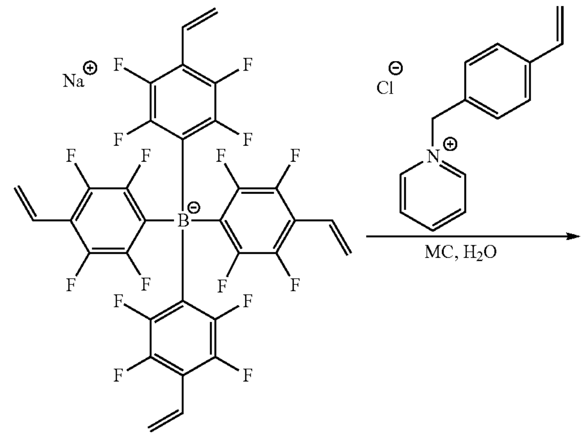

3-2″

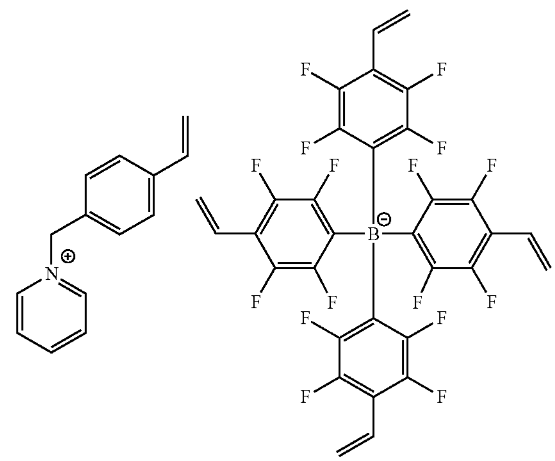

3-2

Compound 3-2" (200 mg, 0.27 mmol), 1-(4-vinylbenzyl) pyridin-1-ium chloride (69 mg, 0.30 mmol), $H_2O$ (10 mL) and methylene chloride (10 mL) were placed in a 25 mL round bottom flask, and vigorously stirred for 30 minutes. The organic solvent was extracted with ether (10 mL×3) and the residual water was removed with $MgSO_4$. The solvent was removed and dried in vacuo to give Compound 3-2 (247 mg, yield: 100%).

MS: $[M-H]^-=711$ (negative mode)

MS: $[M+H]^+=196$ (positive mode)

Preparation Example 3-3: Preparation of Compound 3-3

Step 1) Preparation of Compound 3-3'

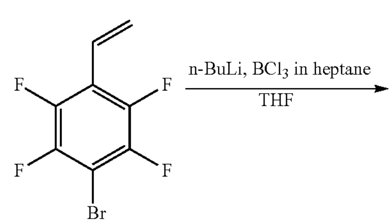

-continued

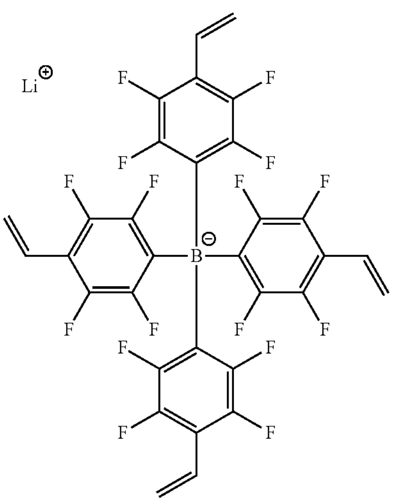

3-3'

1-bromo-2,3,5,6-tetrafluoro-4-vinylbenzene (2 g, 7.84 mmol) was added to THF (20 mL) in a 50 mL round bottom flask, and stirred at −78° C. for 30 minutes. n-BuLi (3.45 mL, 8.63 mmol, 2.5 M in hexane) was slowly added to the solution, and stirred at −78° C. for 30 minutes. $BCl_3$ (2.6 mL, 2.61 mmol, 1 M in hexane solution) was added to the reaction solution and stirred at −78° C. over 15 minutes. The reaction solution was stirred for a day while slowly raising the temperature to room temperature, and then water (30 mL) was added. The synthesized material was extracted with ethyl acetate (10 mL*3), and then all solvent was removed. Water was completely removed with Dean-stock using benzene, and the solids were filtered to give Compound 3-3' (800 mg), yield: 43%).

Step 2) Preparation of Compound 3-3

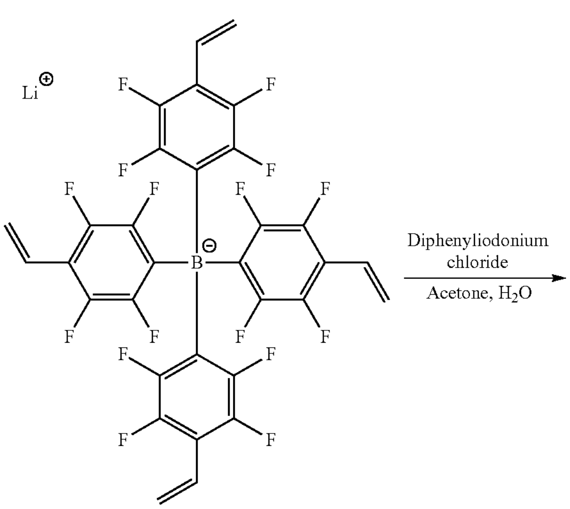

3-3'

-continued

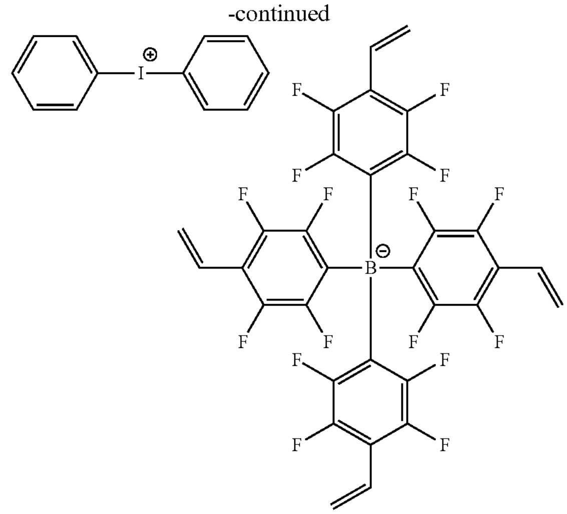

3-3

Compound 3-3' (400 mg, 0.56 mmol), diphenyliodonium chloride (176 mg, 0.56 mmol), water (10 mL) and acetone (10 mL) were placed in a 25 mL round bottom flask, and vigorously stirred for 30 minutes. The result was extracted using dichloromethane (10 mL*3), and then dried after removing the solvent to give Compound 3-3 (552 mg, yield: 100%)

$$MS: [M-H]^- = 711 \text{ (negative mode)}$$

$$MS: [M+H]^+ = 281 \text{ (positive mode)}$$

Preparation Example 3-4: Preparation of Compound 3-4

Step 1) Preparation of Compound 3-4'

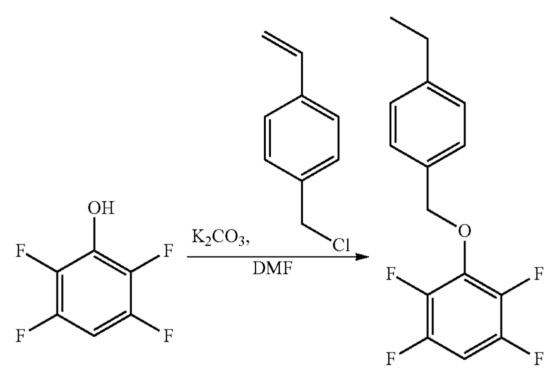

3-4'

Potassium carbonate (10.4 g, 75.3 mmol) was placed in a 500 mL round bottom flask, to which DMF (200 ml) was added. 2,3,5,6-tetrafluorophenol (10.0 g, 60.22 mmol) was added to the flask and the mixture was stirred at 60° C. for 30 minutes. 4-Vinylbenzyl chloride (7.66 g, 50.18 mmol) was slowly added to the reaction solution and stirred at 60° C. for 16 hours. Then, water (300 mL) and ethyl acetate (200 ml) were added. The organic layer was extracted with ethyl acetate (200 mL*2) and the residual water was removed with $MgSO_4$. The resulting material was subjected to column chromatography from ethyl acetate:hexane=1:9 (v:v) to give Compound 3-4' (11.2 g, yield: 79%).

Step 2) Preparation of Compound 3-4"

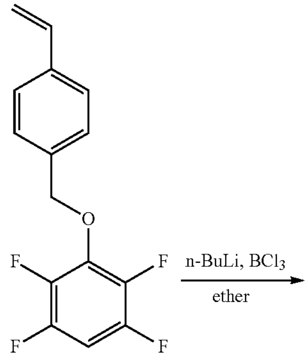

3-4'

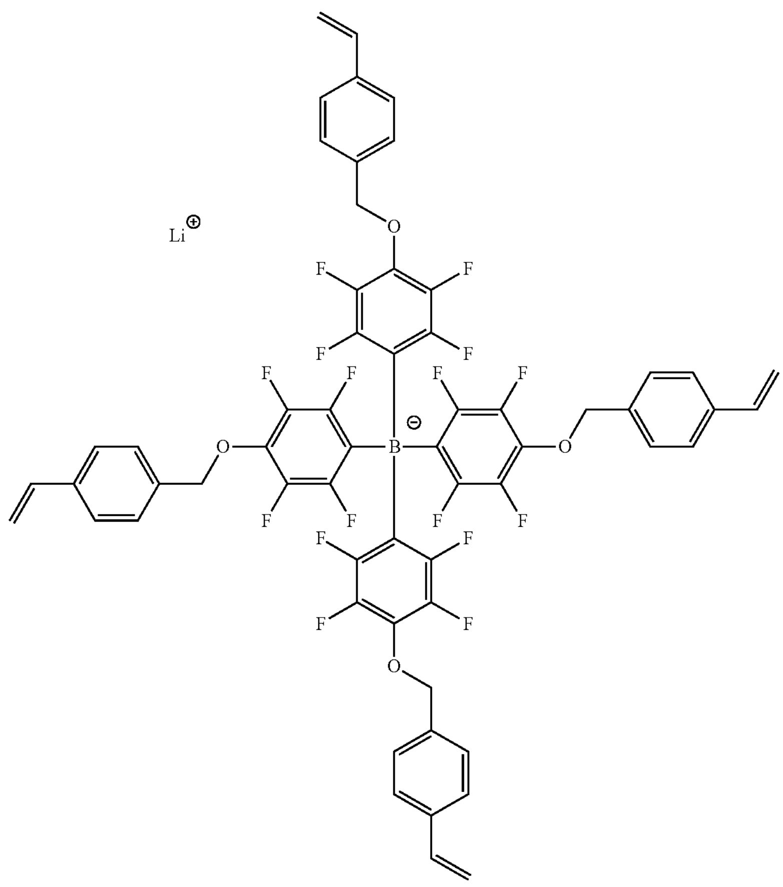

3-4"

Compound 3-4' (10 g, 35.43 mmol) was placed in a 250 ml round bottom flask, to which ether (130 ml) was added, and the mixture was stirred. The reaction solution was cooled to −78° C., and stirred for 30 minutes. n-BuLi (17 ml, 42.52 mmol, 2.5 M in hexane) was slowly injected thereto over 30 minutes. Then, the result was stirred for 1 hour. $BCl_3$ (8.15 ml, 8.15 mmol, 1 M in hexane) was slowly added over 30 minutes. The temperature of the reaction solution was slowly raised to room temperature. After stirring the reaction solution for a day, water (200 mL) was added thereto. The synthesized material was extracted using ether (100 mL*3), and all the solvent was removed. After that, water was completely removed with Dean-stark using benzene, and the solids were filtered to give Compound 3-4" (6.2 g, yield: 66%).

Step 3) Preparation of Compound 3-4
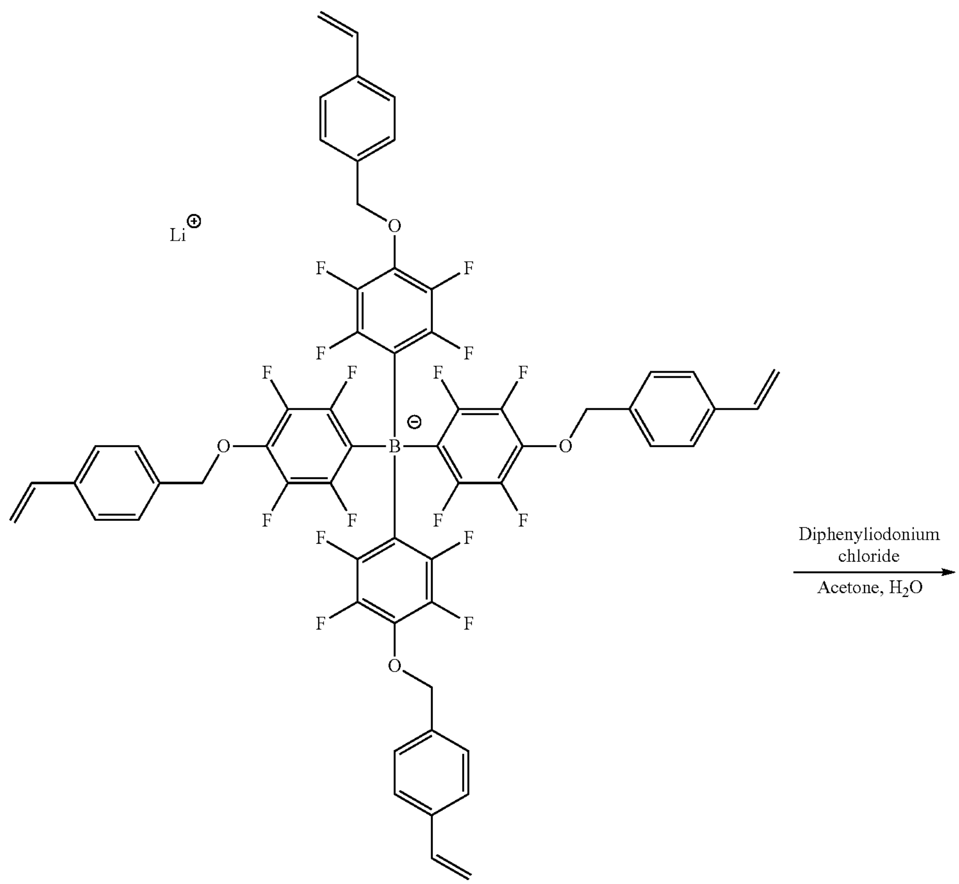
3-4″

-continued

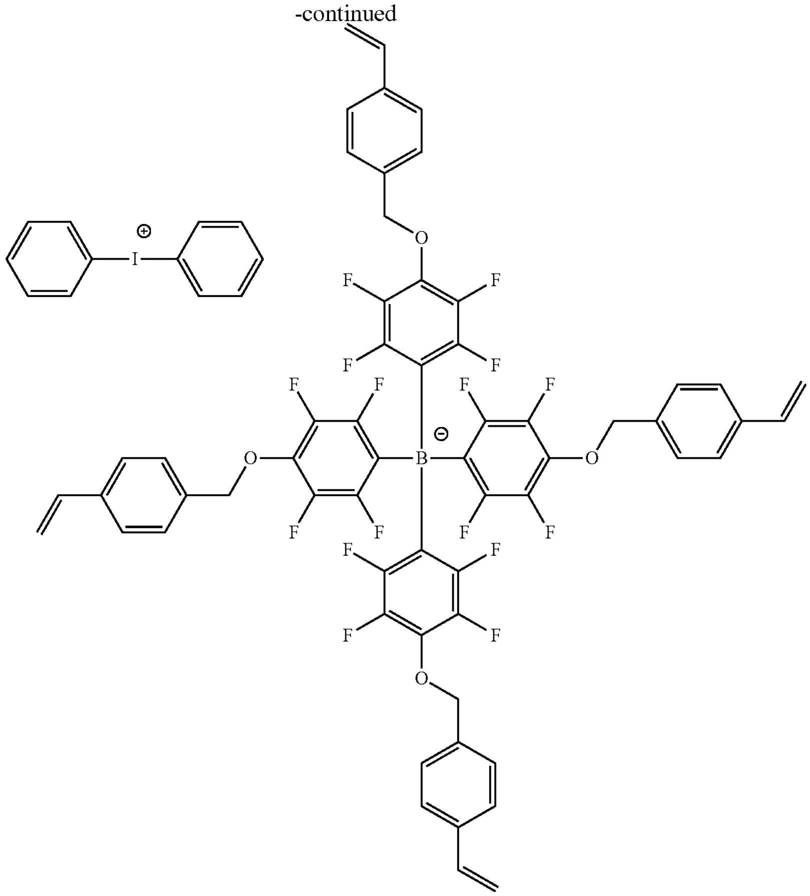

3-4

Compound 3-4" (6.2 g, 5.42 mmol), diphenyl iodonium chloride (2.57 g, 8.13 mmol), water (50 mL) and acetone (10 mL) were placed in a 25 mL round bottom flask, and vigorously stirred for 30 minutes. The organic solvent was extracted with methylene chloride (20 mL*3) and the solvent was removed. The resulting material was subjected to column chromatography from methylene chloride:acetone=9:1 (v:v) to give Compound 3-4 (5.0 g, yield: 65%).

$$MS\text{: } [M-H]^{-} = 1135 \text{ (negative mode)}$$

$$MS\text{: } [M+H]^{+} = 281 \text{ (positive mode)}$$

Preparation Example A: Preparation of Comparative Compound 1

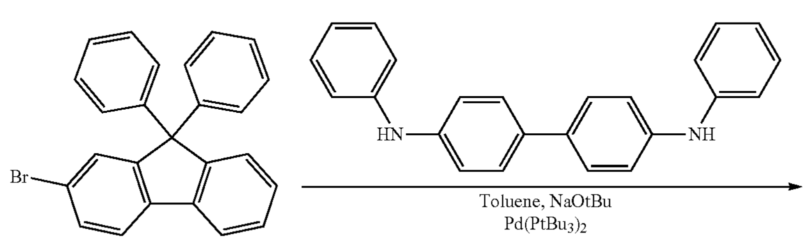

-continued

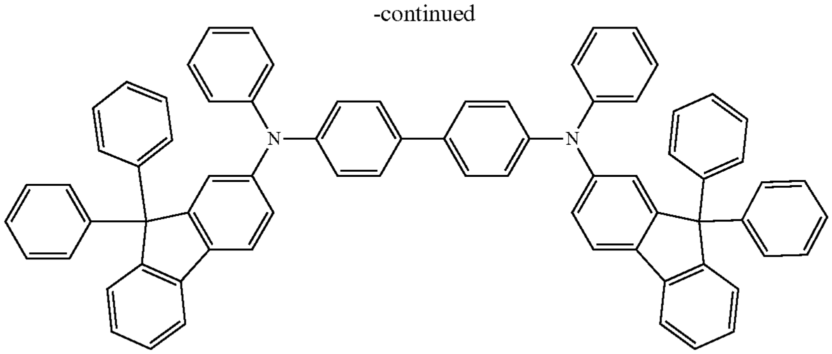

Toluene was placed in a flask containing 2-bromo-9,9-diphenyl-9H-fluorene (1.49 g, 3.74 mmol), N4,N4'-diphenyl-[1,1'-biphenyl]-4,4'-diamine (572 mg. 1.7 mmol), and sodium tert-butoxide (980 mg, 10.2 mmol). The flask containing the reactants was immersed in an oil bath at 90° C., and then $Pd(P(tBu)_3)_2$ (43 mg, 0.085 mmol) was added and agitated for 1 hour. The reaction was stopped by adding water, the mixture was extracted with dichloromethane, and then the organic layer was dried with $MgSO_4$. The organic solvent was removed using a rotary vacuum concentrator, and the residue was subjected column purification to give Comparative Compound 1 (870 mg, HPLC purity: 99.0%).

$$MS: [M+H]^+ = 969$$

Preparation Example B: Preparation of Comparative Compound 2

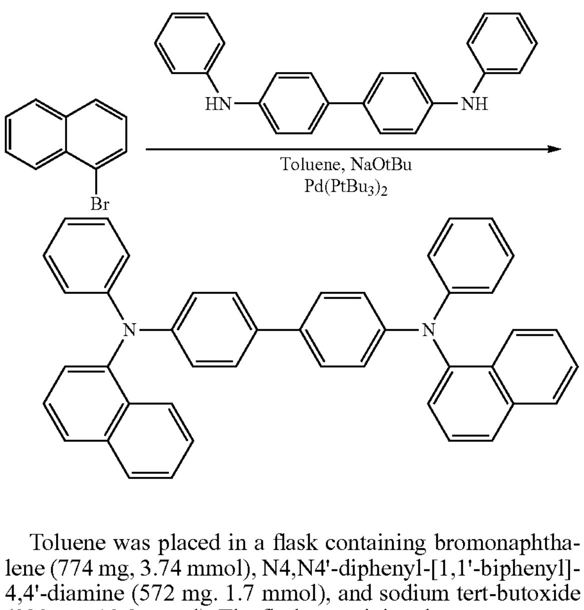

Toluene was placed in a flask containing bromonaphthalene (774 mg, 3.74 mmol), N4,N4'-diphenyl-[1,1'-biphenyl]-4,4'-diamine (572 mg. 1.7 mmol), and sodium tert-butoxide (980 mg, 10.2 mmol). The flask containing the reactants was immersed in an oil bath at 90° C., and then $Pd(P(tBu)_3)_2$ (43 mg, 0.085 mmol) was added and agitated for 1 hour. The reaction was stopped by adding water, the mixture was extracted with dichloromethane, and then the organic layer was dried with $MgSO_4$. The organic solvent was removed using a rotary vacuum concentrator, and the residue was subjected column purification to give Comparative Compound 2 (830 mg, HPLC purity: 99.0%).

$$MS: [M+H]^+ = 589$$

Preparation Example C: Preparation of Comparative Polymer 1

Step 1) Preparation of Compound d1'

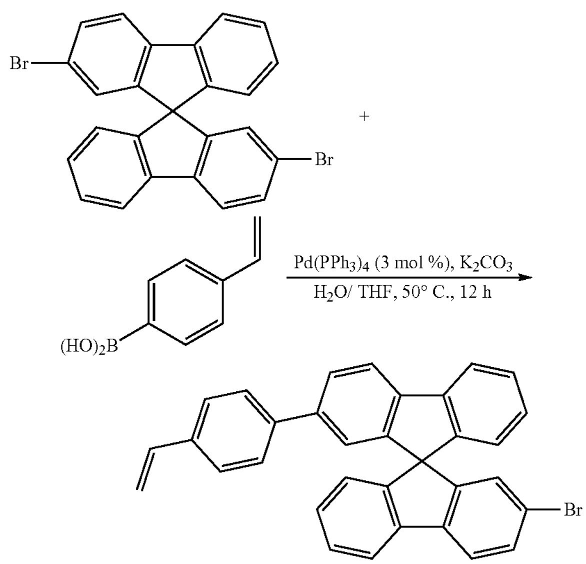

d1′

2,2'-Dibromo-9,9'-spirobifluorene (50 g, 105.4 mmol, 1.0 eq) and 4-vinylphenylboronic acid (31.2 g, 211 mmol, 2.0 eq) were dissolved in 300 g of tetrahydrofuran (THF), and stirred in a water bath at 80° C. for 10 minutes. $K_2CO_3$ (37.89 g, 274 mmol, 2.60 eq) was dissolved in 300 mL of water, and then added dropwise for 10 minutes. Pd catalyst (3.66 g, 3.2 mmol, 0.03 eq) was added under reflux. After stirring for 2 hours, the mixture was washed with ethyl acetate (EA)/$H_2O$, the organic layer was separated, and the solvent was dried in vacuo. The resulting material was purified by column chromatography through n-hexane (n-Hex) and ethyl acetate (EA), and then recrystallized from tetrahydrofuran (THF) and ethanol to give Compound d1' (22.8 g) as a white solid.

$$MS: [M+H]^+ = 496$$

Step 2) Preparation of Monomer d1

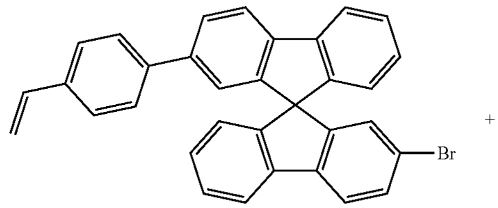

d1′

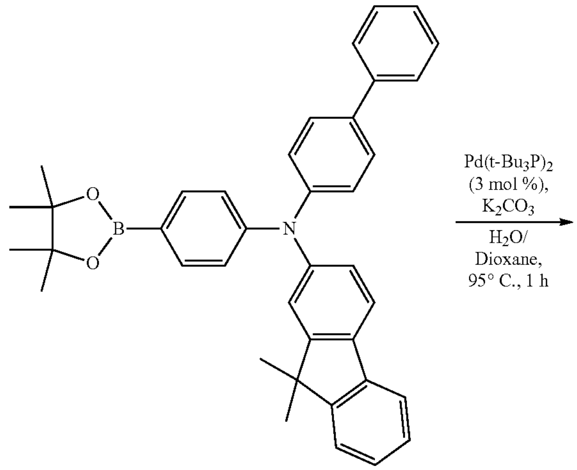

d2′

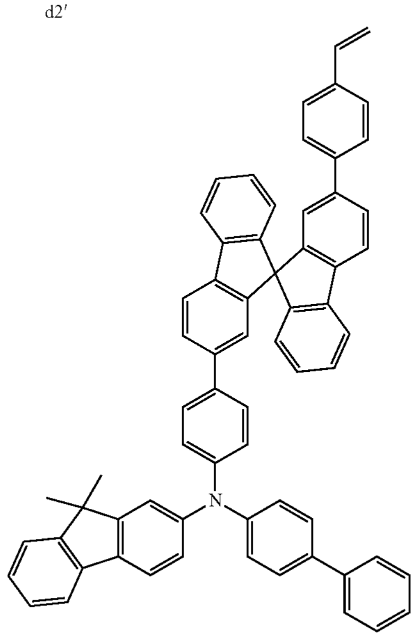

d1 ompound d1' (2.4 g, 5.0 mmol, 1.0 eq) and Compound d2' (2.82 g, 5.0 mmol, 1.0 eq) were dissolved in 20 ml of 1,4-dioxane, and stirred in a water bath at 120° C. for 30 minutes. $K_2CO_3$ (5.10 g, 37 mmol, 1.75 eq) was dissolved in 40 mL of water, and the solution was added dropwise for 10 minutes while maintaining the internal temperature at 90° C. Pd catalyst (0.077 g, 0.15 mmol, 0.03 eq) was added under reflux. After stirring for 1 hour, the mixture was washed with ethyl acetate (EA)/$H_2O$, the organic layer was separated and the solvent was dried in vacuo. The resulting material was purified by column chromatography through n-hexane (n-Hex) and dichloromethane (DCM) and recrystallized from n-hexane (n-Hex) to give Monomer d1.

$$MS: [M+H]^+ = 854.5$$

Step 3) Preparation of Comparative Polymer 1

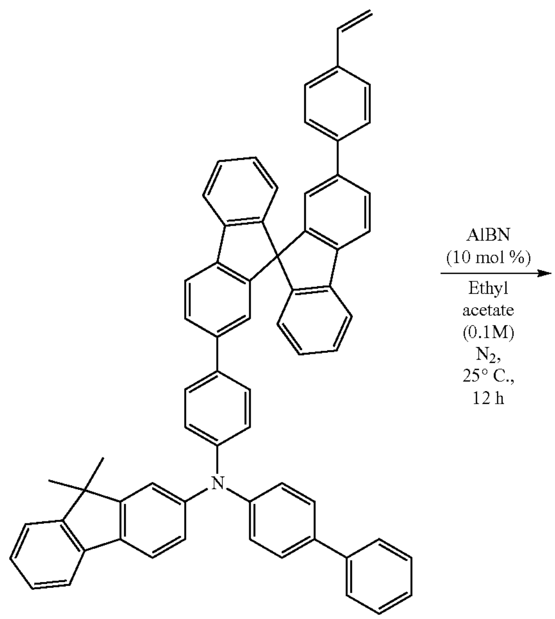

d1

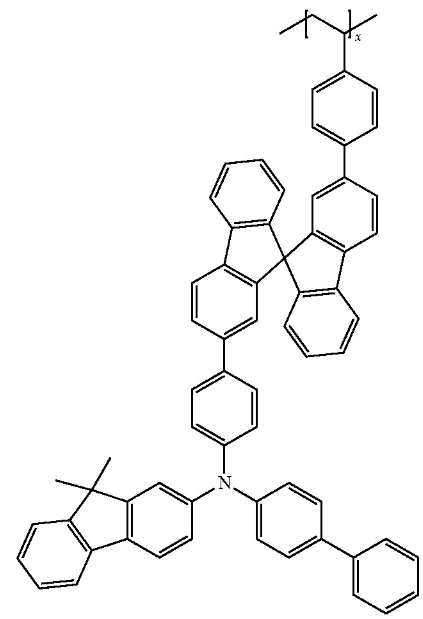

1

Monomer 1 (500 mg) and azobisisobutyronitrile (AIBN) (1.2 mg) were added to ethyl acetate (EA), and reacted at 25° C. for 12 hours under nitrogen substitution. The precipitate formed after the reaction was filtered to prepare Comparative Polymer 1.

The prepared Comparative Polymer 1 had a number average molecular weight of 37,100 g/mol, and a weight average molecular weight of 78,600 g/mol. At this time, the molecular weight was measured by GPC using PS standards and Agilent 1200 series.

DEVICE EXAMPLE

Example 1

A glass substrate on which ITO (indium tin oxide) was coated as a thin film to a thickness of 1500 Å was ultrasonically cleaned using an acetone solvent for 10 minutes. The substrate was then put into distilled water in which a detergent was dissolved, ultrasonically cleaned for 10 minutes, and then ultrasonic cleaning was repeated twice using distilled water for 10 minutes. After the cleaning with distilled water was completed, the substrate was ultrasonically cleaned with a solvent of isopropyl alcohol for 10 minutes, and then dried. The substrate was then transported to a glove box.

On the transparent ITO electrode prepared as above, a 2 wt % cyclohexanone solution containing the previously prepared Compound 1-2 and Compound 3-3 in a weight ratio of 8:2 was spin-coated and heat treated at 230° C. for 30 minutes to form a hole injection layer having a thickness of 600 Å. A 0.8 wt % toluene solution containing the previously prepared Polymer C2 was spin-coated on the hole injection layer to form a hole transport layer having a thickness of 1400 Å.

Subsequently, the result was transferred to a vacuum depositor, and then Compound A below and Compound B below were vacuum-deposited in a weight ratio of 9:1 on the hole transport layer to form a light emitting layer having a thickness of 300 Å. Compound C below was vacuum-deposited on the light emitting layer to form an electron injection and transport layer having a thickness of 400 Å. LiF and aluminum were sequentially deposited to have a thickness of 5 Å and 1,000 Å, respectively, on the electron injection and transport layer, thereby forming a cathode.

A

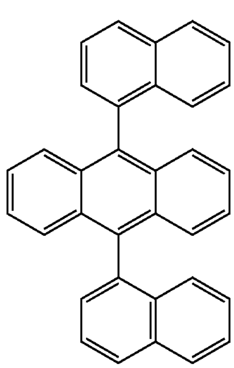

-continued

B

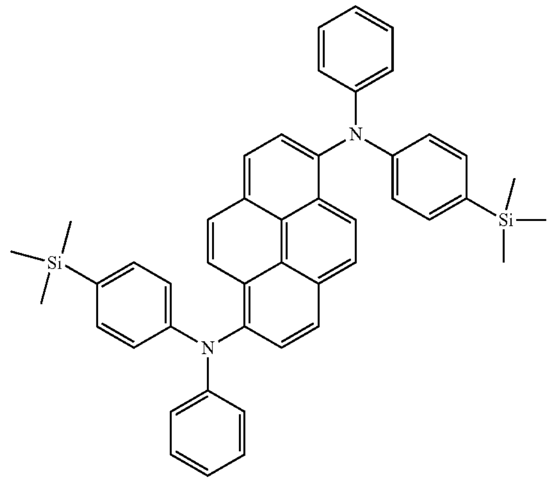

C

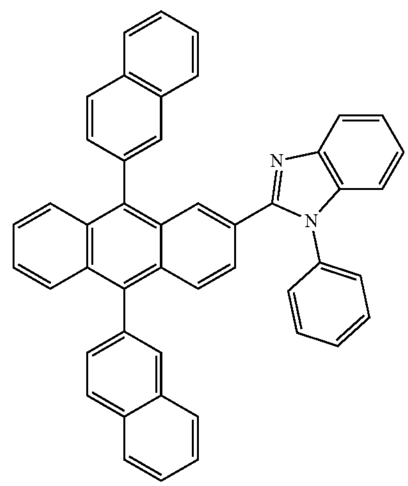

In the above-mentioned processes, the deposition rates of the organic materials were maintained at 0.4 to 1.0 Å/sec, the deposition rates of the LiF and the aluminum of the cathode were maintained at 0.3 Å/sec and 2 Å/sec, respectively, and the degree of vacuum during the deposition was maintained at $2*10^{-8}$ to $5*10^{-6}$ torr.

Examples 2 to 29

The organic light emitting devices were manufactured in the same manner as in Example 1, except that the compounds shown in Table 1 below were used instead of Compound 1-2, Compound 3-3, and/or Polymer C2.

Comparative Examples 1 to 6

The organic light emitting devices were manufactured in the same manner as in Example 1, except that the compounds shown in Table 1 below were used instead of Compound 1-2, Compound 3-3, and/or Polymer C2.

Experimental Example

For the organic light emitting devices manufactured in the Examples, the driving voltage, current efficiency, power efficiency, and lifetime were measured at a current density of 10 mA/cm2, and the results are shown in Table 1 below. In this case, LT90 means the time required for the luminance to be reduced to 90% of the initial luminance

TABLE 1

| | HIL Host | HIL Dopant | HTL | Driving voltage (V) | Current efficiency (cd/A) | Power efficiency (lm/W) | LT90 (hr) |
|---|---|---|---|---|---|---|---|
| Example 1 | Compound 1-2 | Compound 3-3 | Polymer C2 | 4.27 | 5.98 | 4.40 | 530 |
| Example 2 | Compound 1-2 | Compound 3-3 | Polymer C3 | 4.21 | 6.11 | 4.56 | 545 |
| Example 3 | Compound 1-4 | Compound 3-3 | Polymer C3 | 4.09 | 6.20 | 5.55 | 610 |
| Example 4 | Compound 1-1 | Compound 3-1 | Polymer C2 | 4.62 | 5.40 | 3.67 | 450 |
| Example 5 | Compound 1-1 | Compound 3-1 | Polymer C3 | 4.51 | 5.42 | 3.77 | 435 |
| Example 6 | Compound 1-1 | Compound 3-2 | Polymer C2 | 4.53 | 5.42 | 3.76 | 449 |
| Example 7 | Compound 1-1 | Compound 3-2 | Polymer C3 | 4.49 | 5.44 | 3.80 | 460 |
| Example 8 | Compound 1-1 | Compound 3-3 | Polymer C2 | 4.29 | 5.69 | 4.16 | 510 |
| Example 9 | Compound 1-1 | Compound 3-3 | Polymer C3 | 4.30 | 5.75 | 4.20 | 521 |
| Example 7 | Compound 1-1 | Compound 3-4 | Polymer C2 | 4.47 | 5.52 | 3.88 | 490 |
| Example 8 | Compound 1-1 | Compound 3-4 | Polymer C3 | 4.53 | 5.56 | 3.85 | 475 |
| Example 9 | Compound 1-2 | Compound 3-1 | Polymer C2 | 4.45 | 5.45 | 3.85 | 482 |
| Example 10 | Compound 1-2 | Compound 3-1 | Polymer C3 | 4.32 | 5.48 | 3.98 | 477 |
| Example 11 | Compound 1-2 | Compound 3-2 | Polymer C2 | 4.45 | 5.61 | 3.96 | 502 |
| Example 12 | Compound 1-2 | Compound 3-2 | Polymer C3 | 4.43 | 5.65 | 4.00 | 514 |
| Example 13 | Compound 1-2 | Compound 3-4 | Polymer C2 | 4.40 | 5.80 | 4.14 | 531 |
| Example 14 | Compound 1-2 | Compound 3-4 | Polymer C3 | 4.35 | 5.76 | 4.16 | 520 |
| Example 15 | Compound 1-3 | Compound 3-1 | Polymer C2 | 4.33 | 5.41 | 3.92 | 462 |
| Example 16 | Compound 1-3 | Compound 3-1 | Polymer C3 | 4.35 | 5.35 | 3.86 | 453 |
| Example 17 | Compound 1-3 | Compound 3-2 | Polymer C2 | 4.41 | 5.69 | 4.05 | 493 |
| Example 18 | Compound 1-3 | Compound 3-2 | Polymer C3 | 4.39 | 5.56 | 3.98 | 478 |
| Example 19 | Compound 1-3 | Compound 3-3 | Polymer C2 | 4.19 | 6.02 | 4.51 | 550 |
| Example 20 | Compound 1-3 | Compound 3-3 | Polymer C3 | 4.25 | 6.05 | 4.47 | 526 |
| Example 21 | Compound 1-3 | Compound 3-4 | Polymer C2 | 4.30 | 5.78 | 4.22 | 511 |
| Example 22 | Compound 1-3 | Compound 3-4 | Polymer C3 | 4.33 | 5.82 | 4.22 | 531 |
| Example 23 | Compound 1-4 | Compound 3-1 | Polymer C2 | 4.50 | 5.60 | 3.91 | 497 |
| Example 24 | Compound 1-4 | Compound 3-1 | Polymer C3 | 4.39 | 5.53 | 3.96 | 503 |
| Example 25 | Compound 1-4 | Compound 3-2 | Polymer C2 | 4.29 | 5.79 | 4.24 | 509 |
| Example 26 | Compound 1-4 | Compound 3-2 | Polymer C3 | 4.35 | 5.85 | 4.22 | 513 |
| Example 27 | Compound 1-4 | Compound 3-3 | Polymer C2 | 4.12 | 6.15 | 4.69 | 617 |
| Example 28 | Compound 1-4 | Compound 3-4 | Polymer C2 | 4.21 | 5.98 | 4.46 | 520 |
| Example 29 | Compound 1-4 | Compound 3-4 | Polymer C3 | 4.23 | 6.01 | 4.46 | 556 |
| Comparative Example 1 | Compound 1-1 | Compound 3-1 | Polymer C1 | 4.89 | 5.27 | 4.23 | 430 |
| Comparative Example 2 | Compound 1-2 | Compound 3-3 | Polymer C1 | 4.40 | 5.89 | 4.79 | 400 |
| Comparative Example 3 | Comparative Compound 1 | Compound 3-1 | Comparative Polymer 1 | 4.9 | 5.10 | 3.27 | 13 |
| Comparative Example 4 | Compound 1-1 | Compound 3-2 | Comparative Compound 2 | 4.7 | 6.16 | 4.12 | 75 |

TABLE 1-continued

| | HIL Host | HIL Dopant | HTL | Driving voltage (V) | Current efficiency (cd/A) | Power efficiency (lm/W) | LT90 (hr) |
|---|---|---|---|---|---|---|---|
| Comparative Example 5 | Comparative Compound 1 | Compound 3-3 | Polymer C2 | 4.6 | 6.2 | 4.23 | 52 |
| Comparative Example 6 | Comparative Compound 1 | Compound 3-3 | Polymer C3 | 4.7 | 6.3 | 4.21 | 67 |

As shown in Table 1 above, it was confirmed that the organic light-emitting devices of Examples in which the cured product of the compound represented by Chemical Formula 1 was used as a host material of the hole injection layer, and the cured product of the polymer containing the repeating unit represented by Chemical Formula 2-1 and the repeating unit represented by Chemical Formula 2-2 was used as a hole transport layer material, exhibited improved characteristics in terms of the driving voltage, efficiency and lifetime, particularly exhibited remarkably improved lifetime, as compared with the organic light emitting devices in which the cured product of the polymer not containing the repeating unit represented by Chemical Formula 2-1 and/or Chemical Formula 2-2 was used as a material of the hole transport layer.

It was also confirmed that the organic light-emitting device of one embodiment of the present disclosure exhibited improved characteristics in terms of the driving voltage, efficiency and lifetime, particularly exhibited remarkably improved lifetime, as compared with the organic light emitting device using a compound not containing a curing group as a host material for the hole injection layer.

DESCRIPTION OF SYMBOLS

| | |
|---|---|
| 1: | substrate |
| 2: | anode |
| 3: | hole injection layer |
| 4: | hole transport layer |
| 5: | light emitting layer |
| 6: | cathode |
| 7: | electron transport layer |
| 8: | electron injection layer |

The invention claimed is:

1. An organic light emitting device comprising:

an anode, a hole injection layer, a hole transport layer, a light emitting layer, and a cathode, wherein the hole injection layer includes a cured product of a compound represented by the following Chemical Formula 1, and wherein the hole transport layer includes a cured product of a polymer containing a repeating unit represented by the following Chemical Formula 2-1 and a repeating unit represented by the following Chemical Formula 2-2:

[Chemical Formula 1]

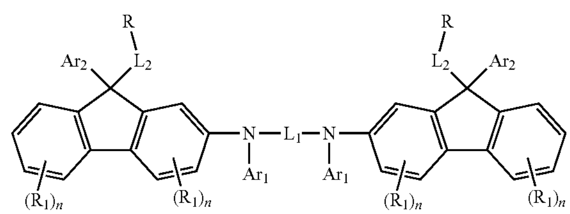

in the Chemical Formula 1, $L_1$ is a substituted or unsubstituted $C_{6-60}$ arylene; or a substituted or unsubstituted $C_{2-60}$ heteroarylene containing one or more heteroatoms selected from the group consisting of N, O and S, $Ar_1$ is each independently a substituted or unsubstituted $C_{6-60}$ aryl, $Ar_2$ is each independently a substituted or unsubstituted $C_{6-60}$ aryl, $L_2$ is each independently a single bond; a substituted or unsubstituted $C_{1-10}$ alkylene; or a substituted or unsubstituted $C_{6-60}$-arylene, $R_1$ is each independently deuterium; halogen; a substituted or unsubstituted $C_{1-60}$ alkyl; a substituted or unsubstituted $C_{1-60}$ alkoxy; a substituted or unsubstituted $C_{6-60}$ aryl; or a substituted or unsubstituted $C_{2-60}$ heteroaryl containing one or more heteroatoms selected from the group consisting of N, O and S, n is each independently an integer of 0 to 3, R is each independently a photocurable group; or a thermosetting group,

[Chemical Formula 2-1]

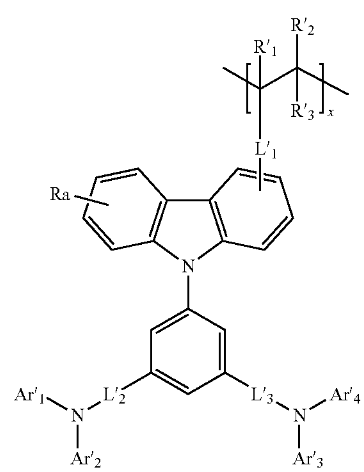

in the Chemical Formula 2-1,

R'$_1$ to R'$_3$ are each independently hydrogen; or $C_{1-10}$ alkyl,

L'$_1$ is a substituted or unsubstituted $C_{6-60}$ arylene; -(substituted or unsubstituted $C_{6-60}$ arylene)-O-(substituted or unsubstituted $C_{6-60}$ arylene)-; -(substituted or unsubstituted $C_{6-60}$ arylene)-(substituted or unsubstituted $C_{1-10}$ alkylene)-(substituted or unsubstituted $C_{6-60}$ arylene)-; -(substituted or unsubstituted $C_{6-60}$ arylene)-O-(substituted or unsubstituted $C_{1-10}$ alkylene)-O—; or -(substituted or unsubstituted $C_{6-60}$ arylene)-(substituted or unsubstituted $C_{1-10}$ alkylene)-O-(substituted or unsubstituted $C_{1-10}$ alkylene)-(substituted or unsubstituted $C_{6-60}$ arylene)-, L'$_2$ and L'$_3$ are each independently a single bond; a substituted or unsubstituted $C_{6-60}$ arylene; or a substituted or unsubstituted $C_{2-60}$ heteroarylene containing one or more selected from the group consisting of N, O, and S, Ar'$_1$ to Ar'$_4$ are each independently a substituted or unsubstituted $C_{6-60}$ aryl; or a substituted or unsubstituted $C_{2-60}$ heteroaryl containing one or more selected from the group consisting of N, O and S; or Ar'$_1$ and Ar'$_2$, or Ar'$_3$ and Ar'$_4$ are bonded to each other, and together with N to which they are attached to form a $C_{2-60}$ heteroaromatic ring containing one or more selected from the group consisting of N, O and S, Ra is hydrogen; deuterium; halogen; cyano; nitro; amino; a substituted or unsubstituted $C_{1-60}$ alkyl; a substituted or unsubstituted $C_{3-60}$ cycloalkyl; a substituted or unsubstituted $C_{2-60}$ alkenyl; a substituted or unsubstituted $C_{6-60}$ aryl; or a substituted or unsubstituted $C_{2-60}$ heteroaryl containing one or more selected from the group consisting of N, O and S, x is a mole fraction of the repeating unit represented by Chemical Formula 2-1 in the polymer,

[Chemical Formula 2-2]

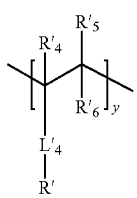

in the Chemical Formula 2-2,

R'$_4$ to R'$_6$ are each independently hydrogen; or $C_{1-10}$ alkyl,

L'$_4$ is a single bond; or a substituted or unsubstituted $C_{6-60}$ arylene,

R' is a photocurable group; or a thermosetting group, and y is a mole fraction of the repeating unit represented by Chemical Formula 2-2 in the polymer.

2. The organic light emitting device according to claim 1, wherein $L_1$ is phenylene, biphenyldiyl, terphenyldiyl, phenylnaphthalenediyl, binaphthyldiyl, penanthrenediyl, spirobifluorenediyl, dimethylfluorenediyl, diphenylfluorenediyl, or tetraphenylfluorenediyl, each of which is unsubstituted or substituted with one or two $C_{1-10}$ alkyls.

3. The organic light emitting device according to claim 1, wherein $L_1$ is any one selected from the group consisting of the following:

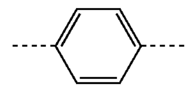

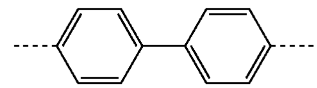

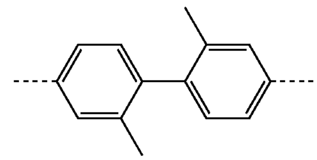

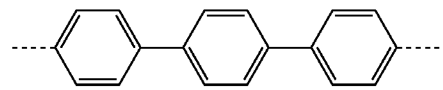

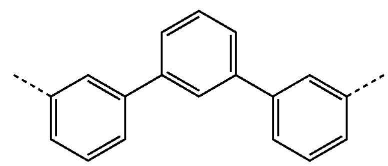

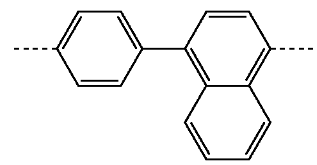

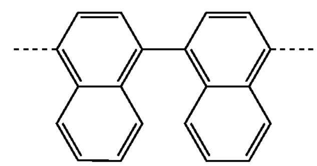

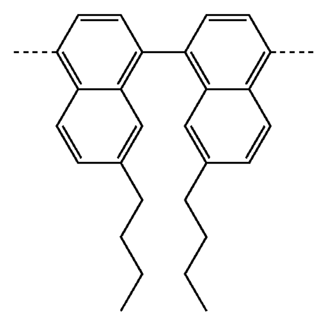

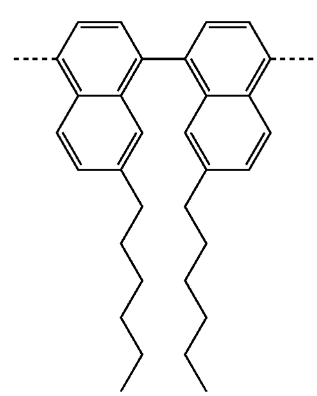

-continued
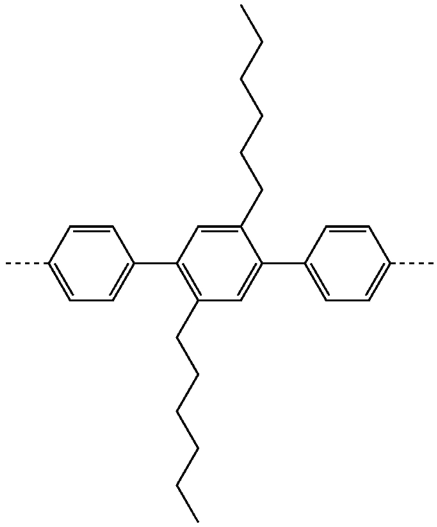
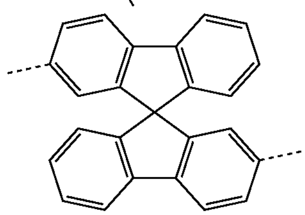
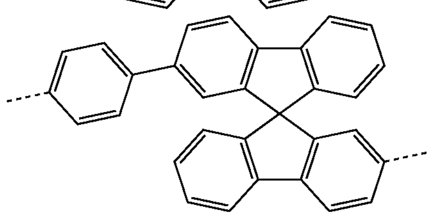
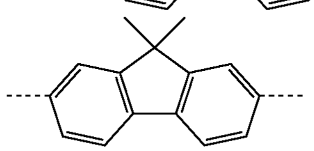
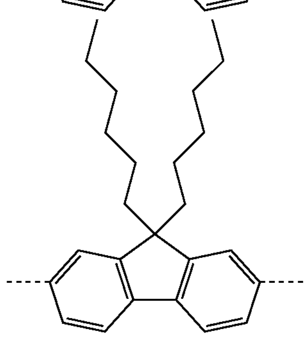
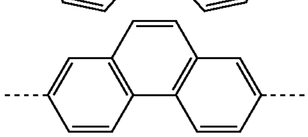
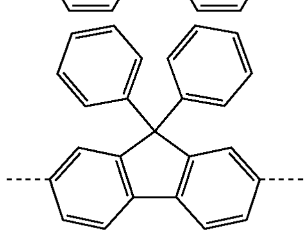
-continued
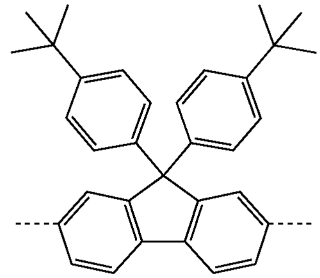
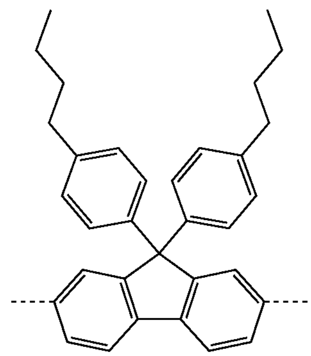
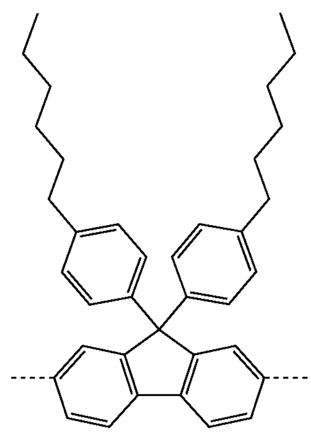
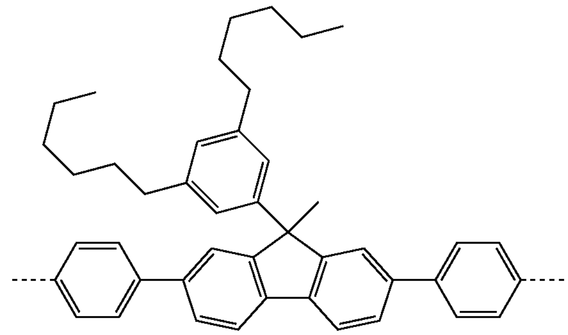

-continued

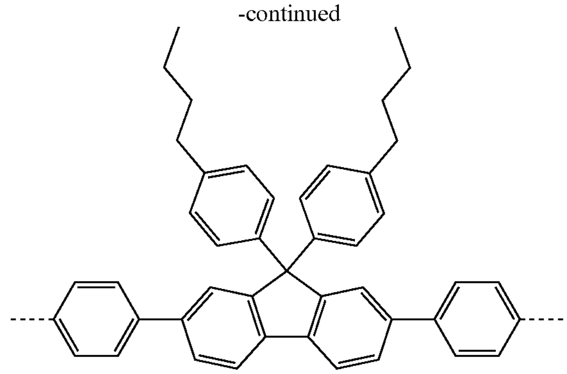

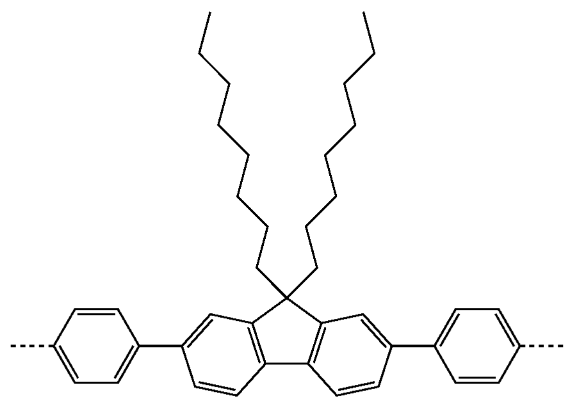

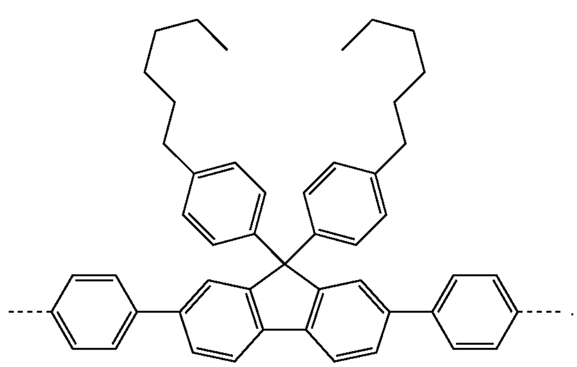

4. The organic light emitting device according to claim 1, wherein $Ar_1$ is each independently phenyl, biphenylyl, naphthyl, phenanthrenyl, or dimethylfluorenyl, each of which is unsubstituted or substituted with 1 to 5 deuteriums, or halogen.

5. The organic light emitting device according to claim 1, wherein $Ar_2$ is each independently phenyl, biphenylyl, or naphthyl, each of which is unsubstituted, or substituted with —R; 1 to 5 deuteriums; 1 or 2 $C_{1-10}$ alkyls; 1 to 5 halogens; $C_{1-10}$ alkoxy; $C_{1-10}$ alkoxy substituted with $C_{1-10}$ alkoxy; $C_{1-10}$ haloalkyl; or phenoxy, and R is as defined in claim 1.

6. The organic light emitting device according to claim 1, wherein $L_2$ is each independently a single bond, butylene, pentylene, hexylene, heptylene, or phenylene.

7. The organic light emitting device according to claim 1, wherein n is 1, and $R_1$ is each phenyl.

8. The organic light emitting device according to claim 1, wherein R is $-L_3-R_2$, $L_3$ is a single bond, —O—, —S—, —$CH_2$—, —$CH_2O$—, —$OCH_2$—, —$CH_2OCH_2$—, —N(phenyl)-, or —$O(CH_2)_6$—, and $R_2$ is any one selected from the group consisting of the following:

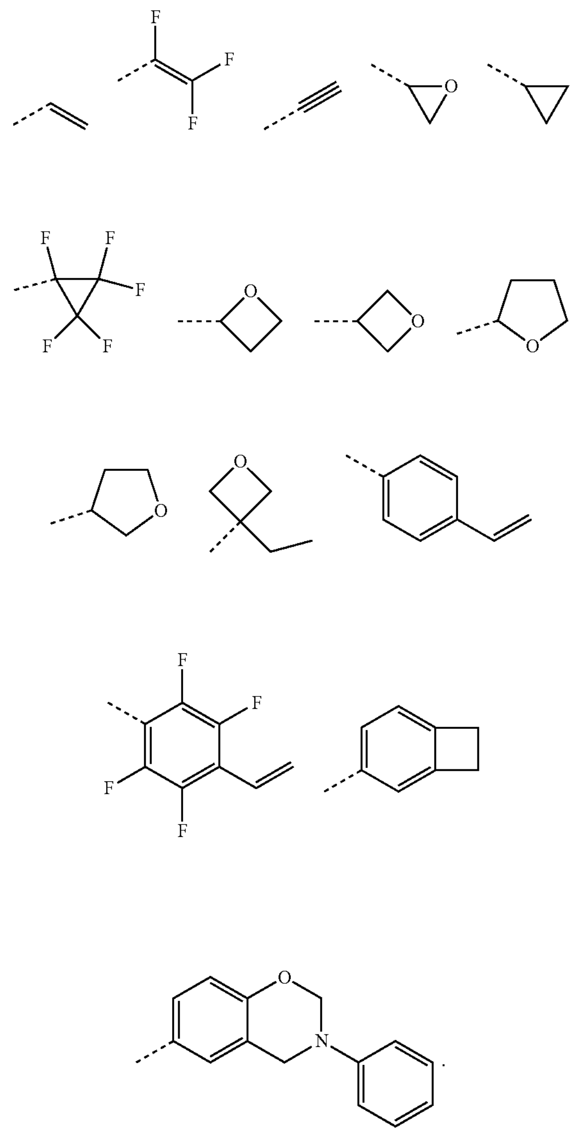

9. The organic light emitting device according to claim 1, wherein the compound represented by Chemical Formula 1 is any one compound selected from the group consisting the following:

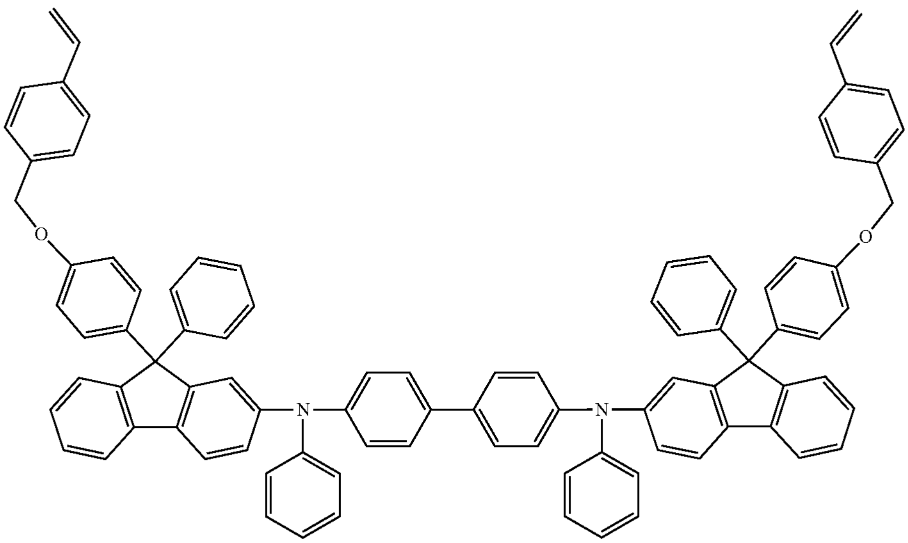
O
N
N
O
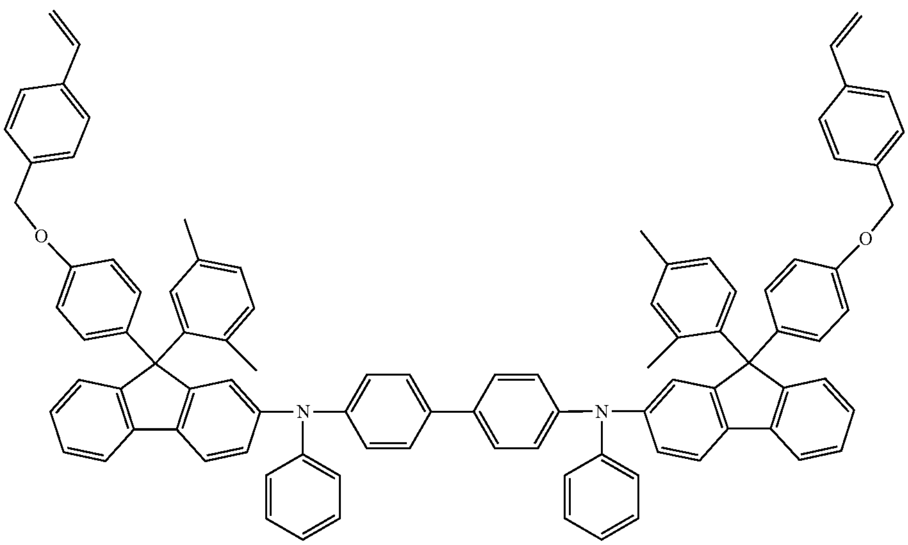
O
N
N
O
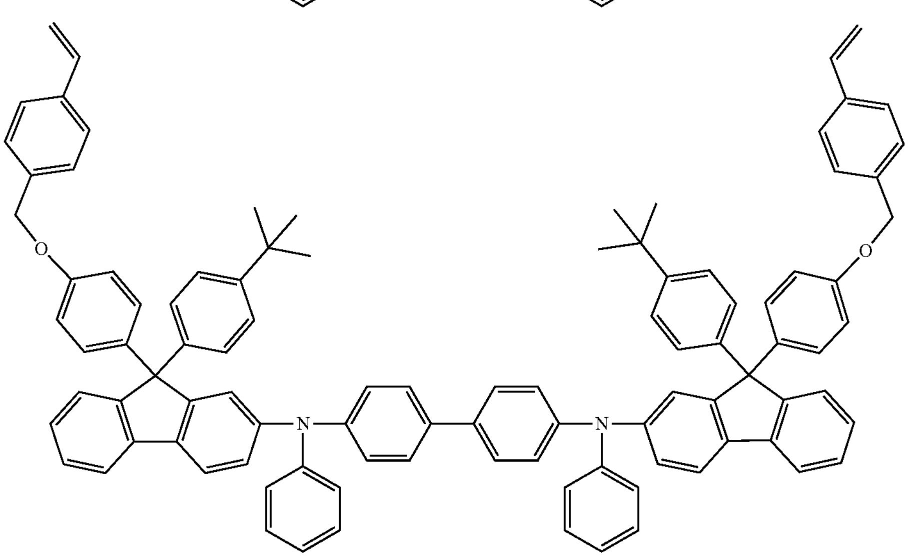
O
N
N
O

-continued
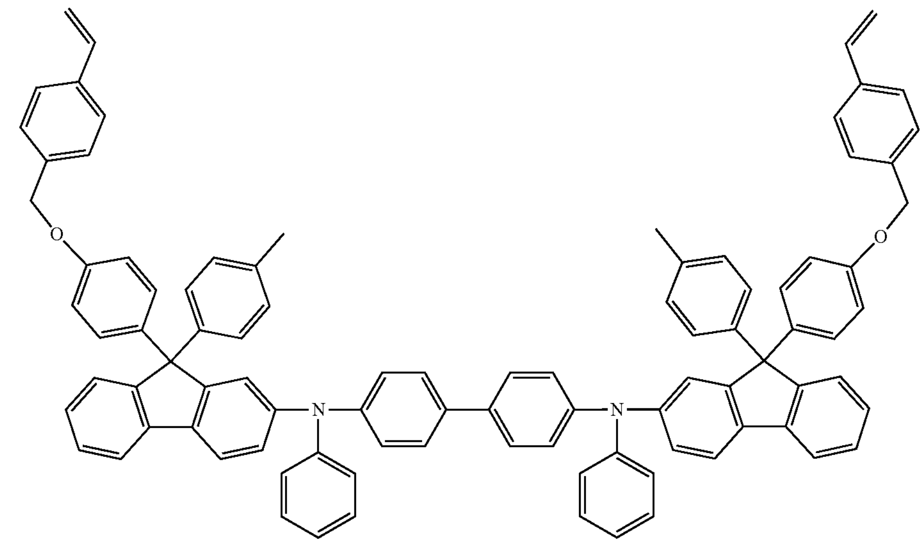
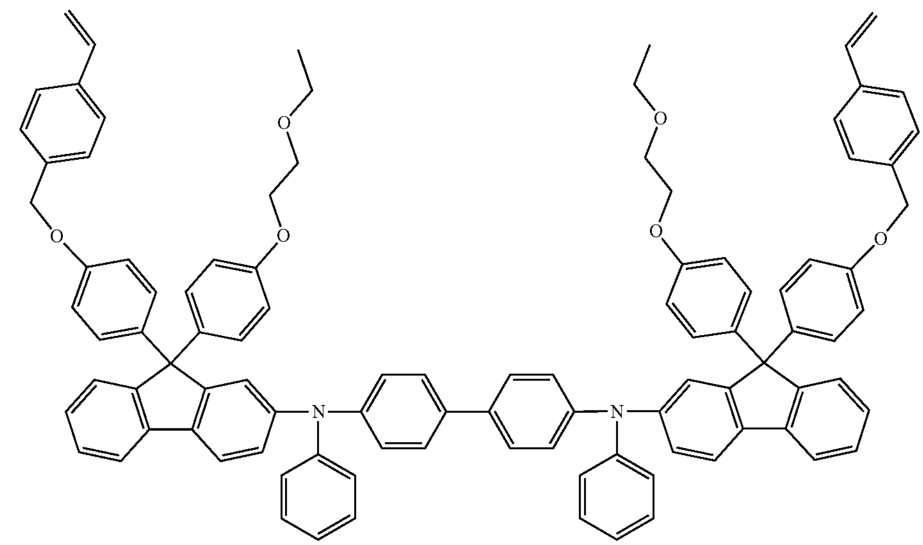
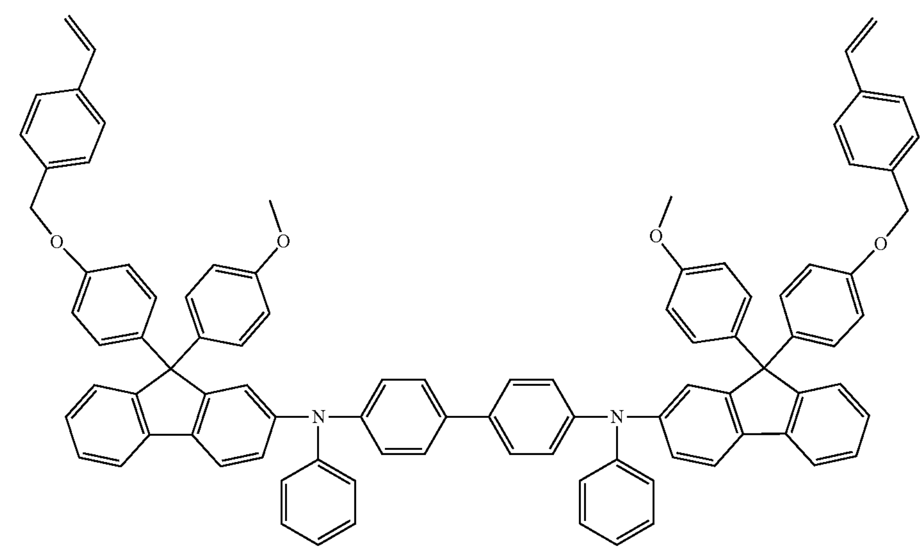

-continued
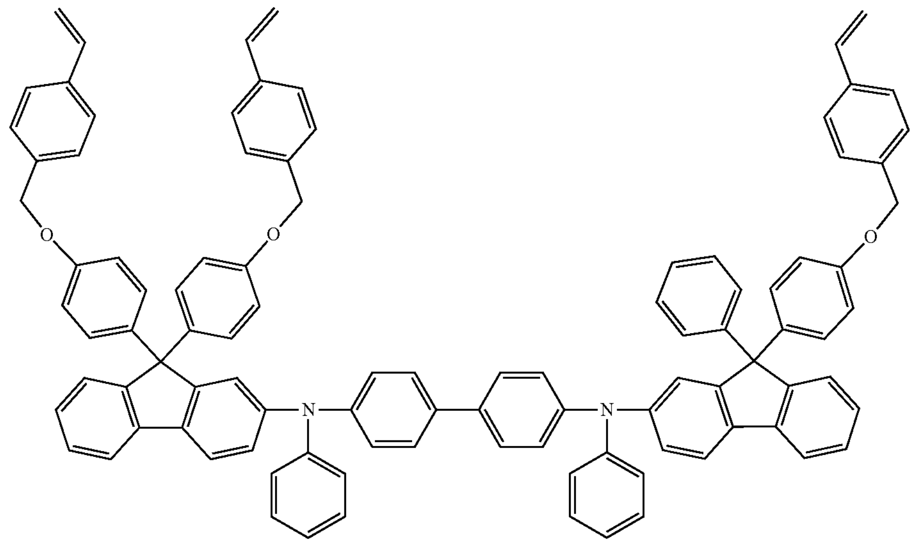
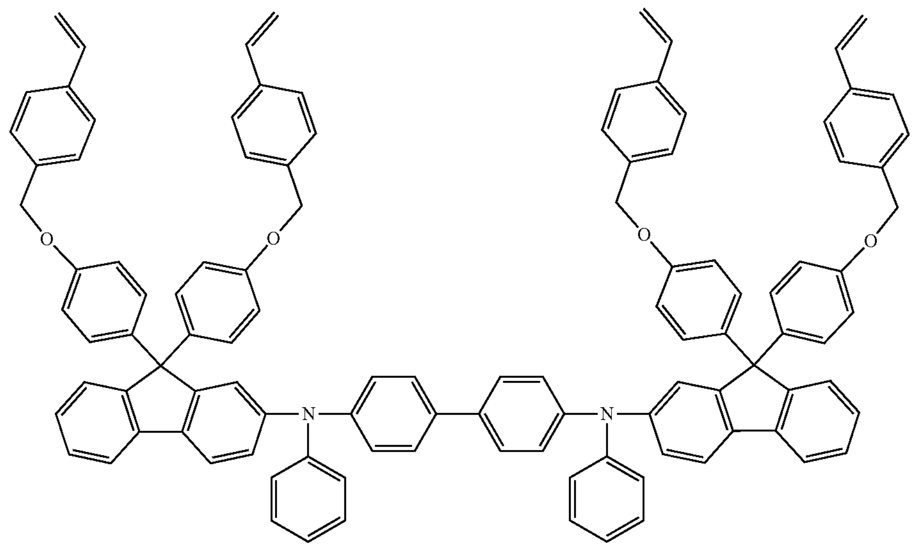
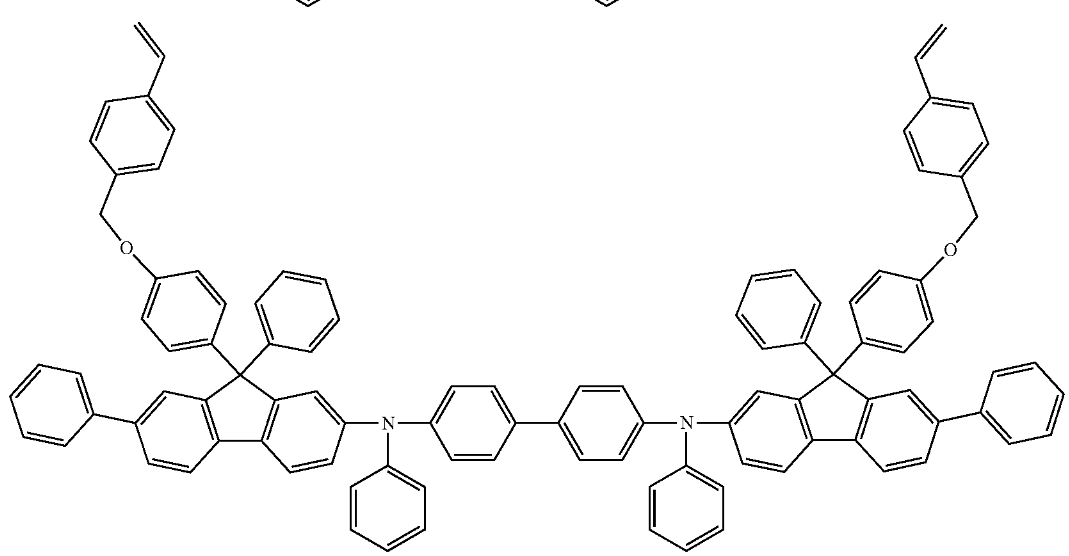

-continued
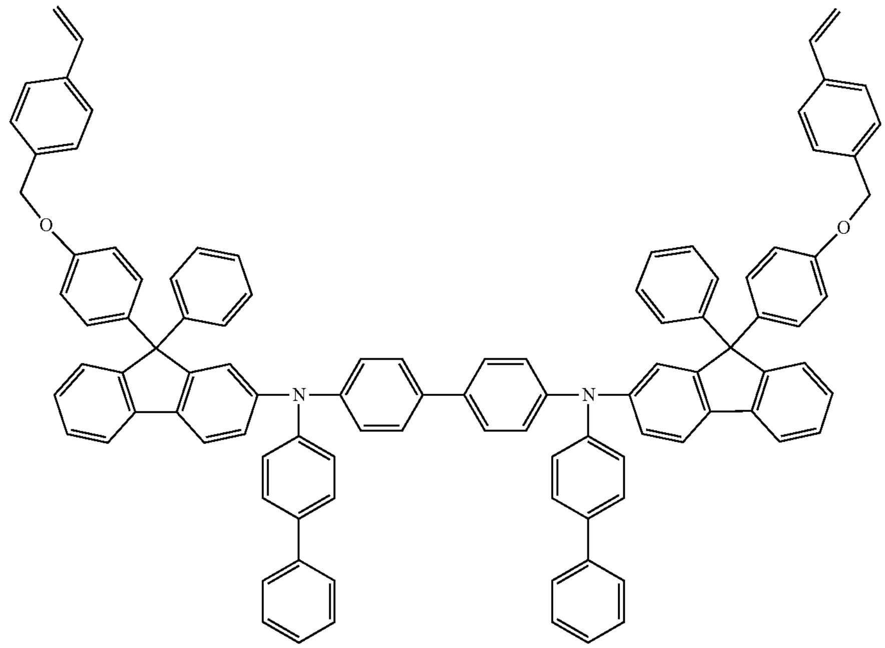
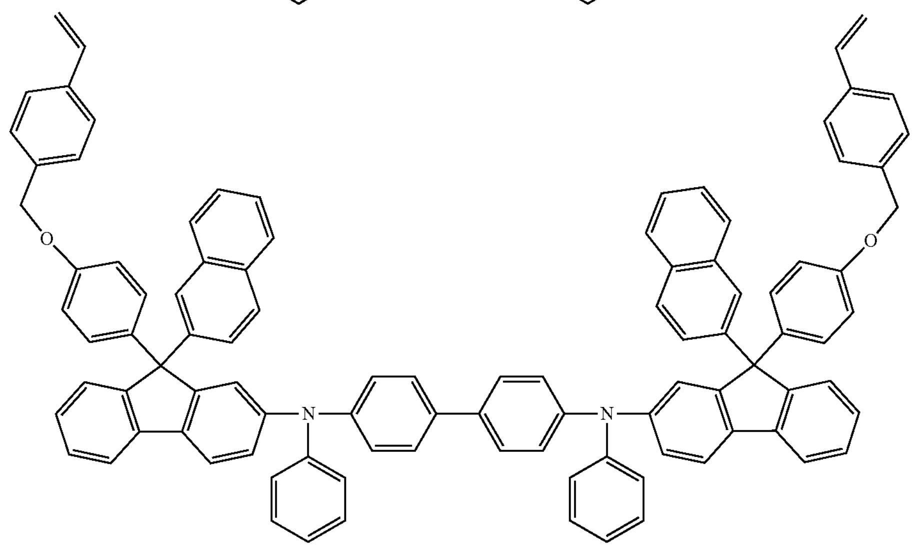
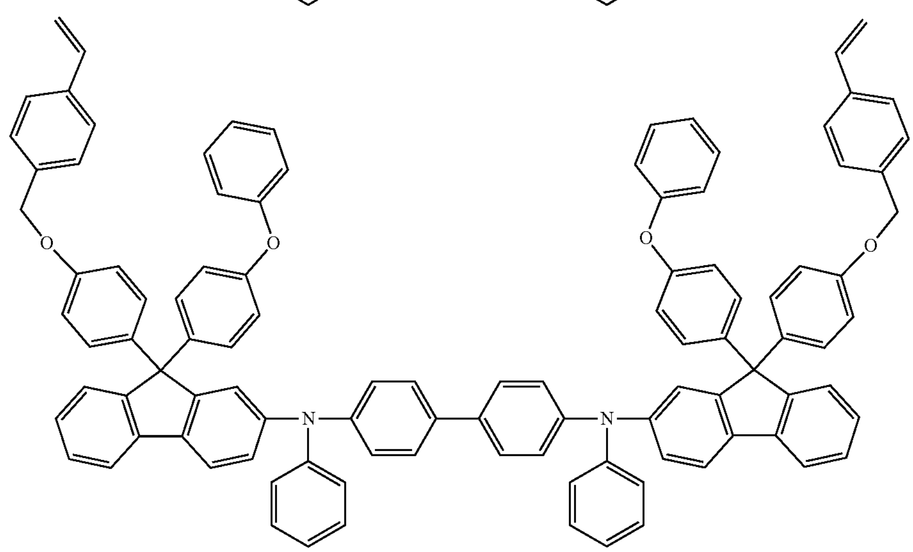

-continued
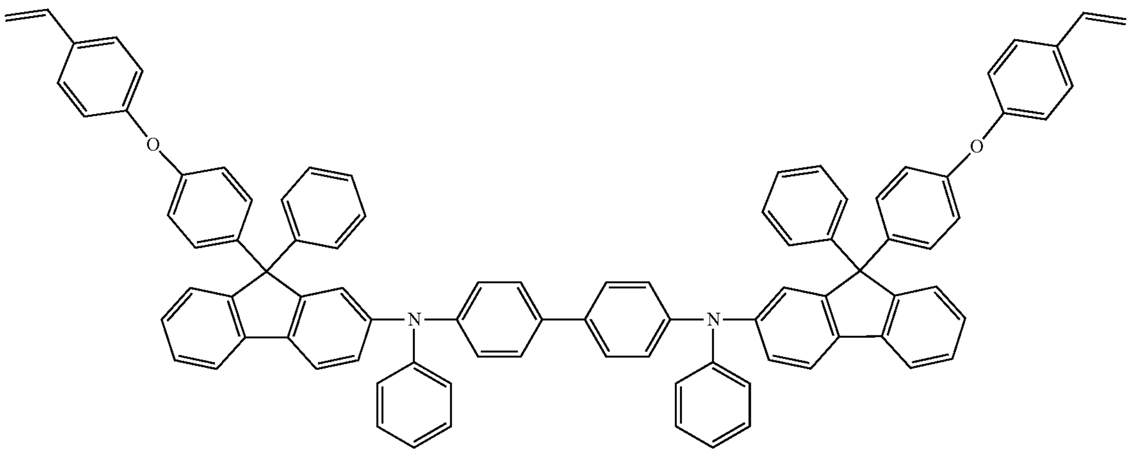
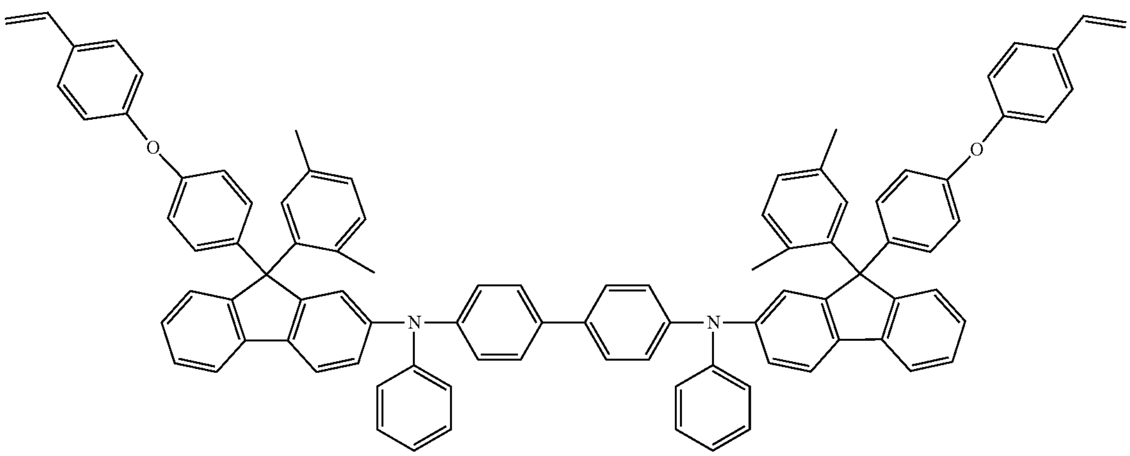
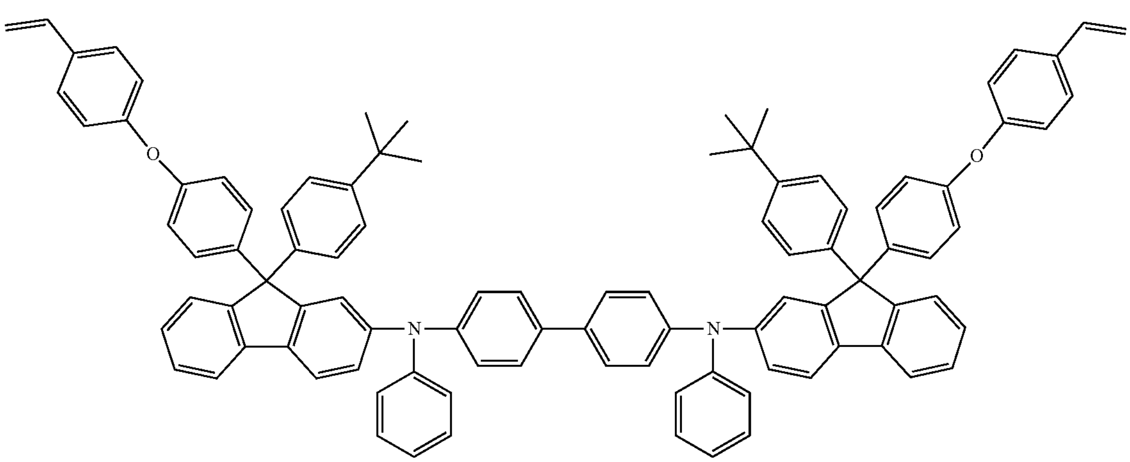

-continued
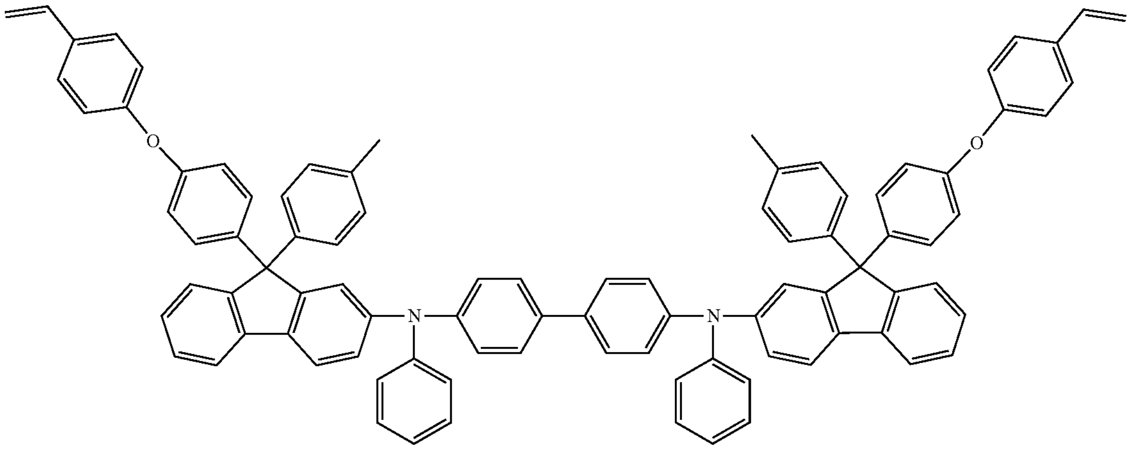
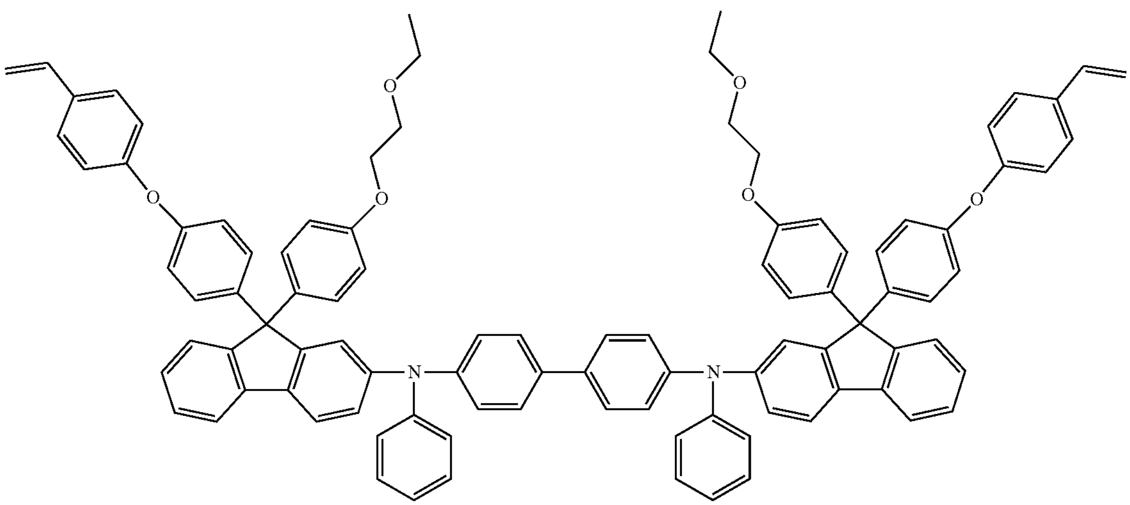
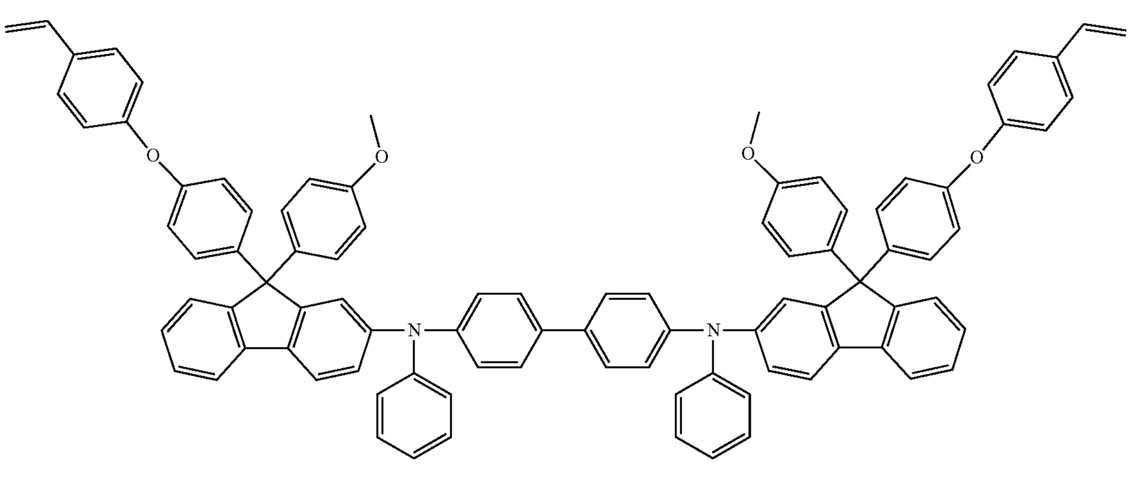

-continued
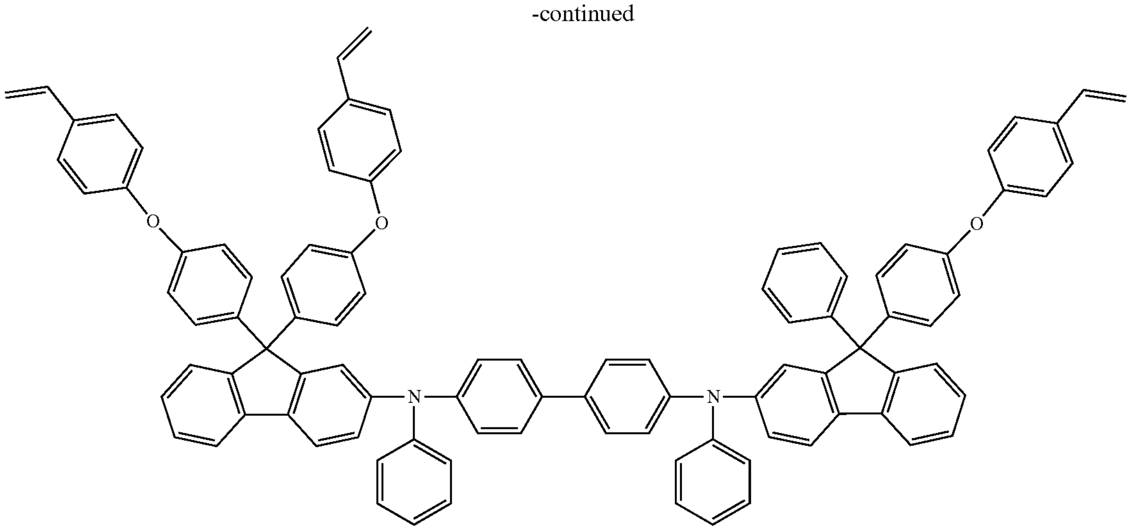
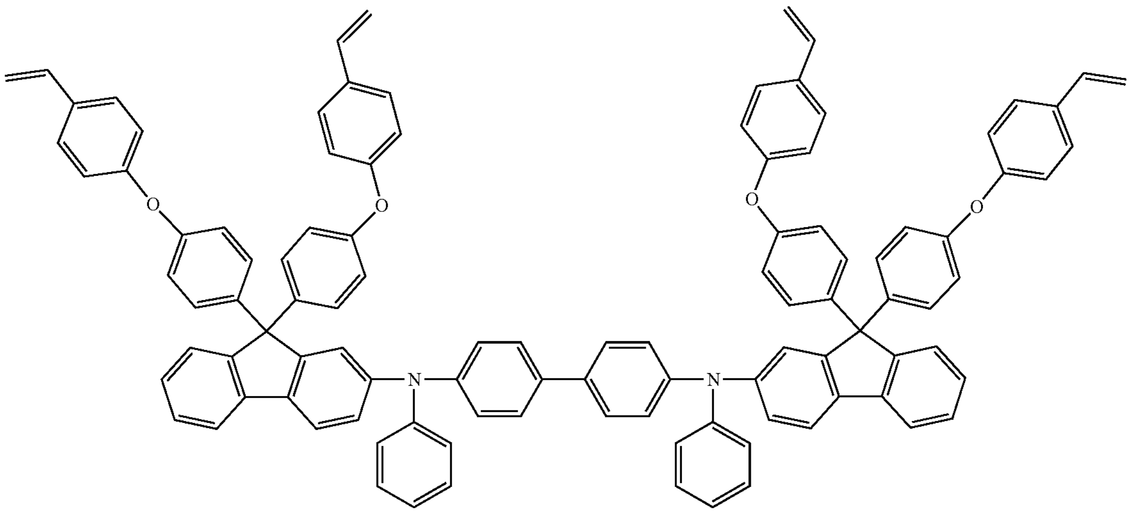
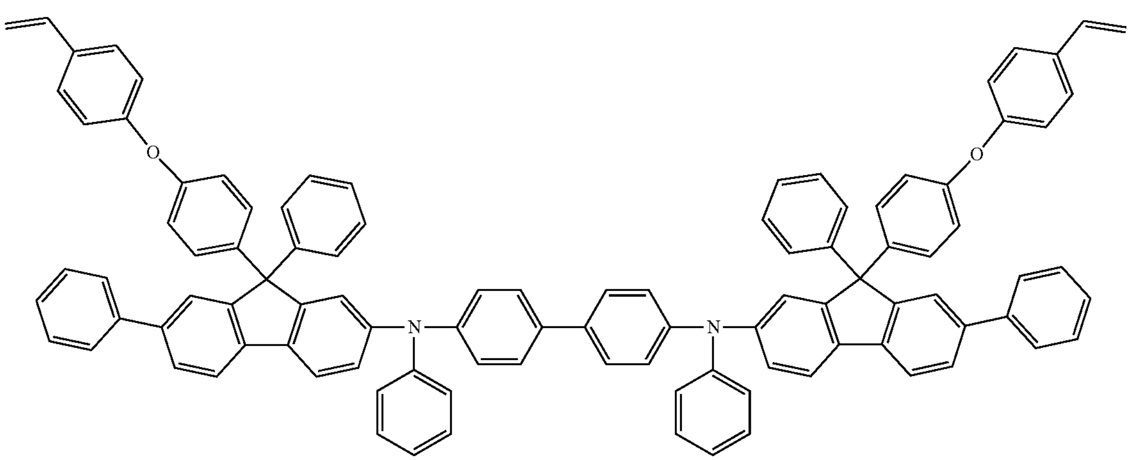

-continued
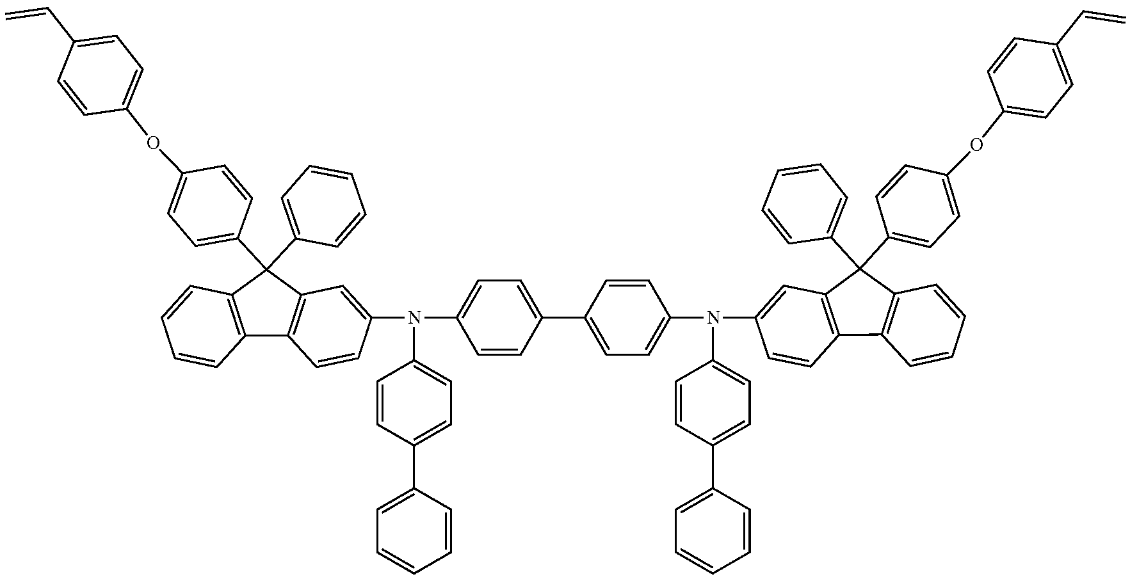
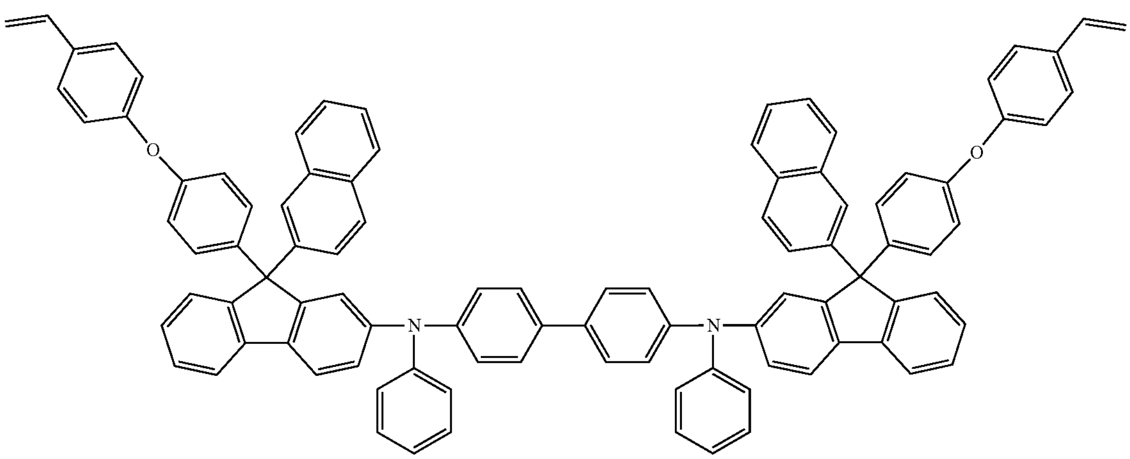
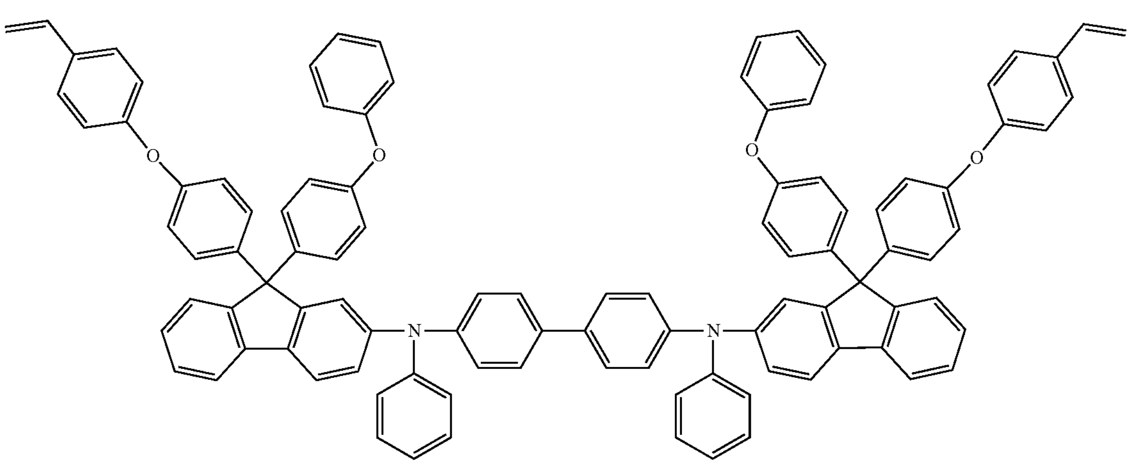

-continued
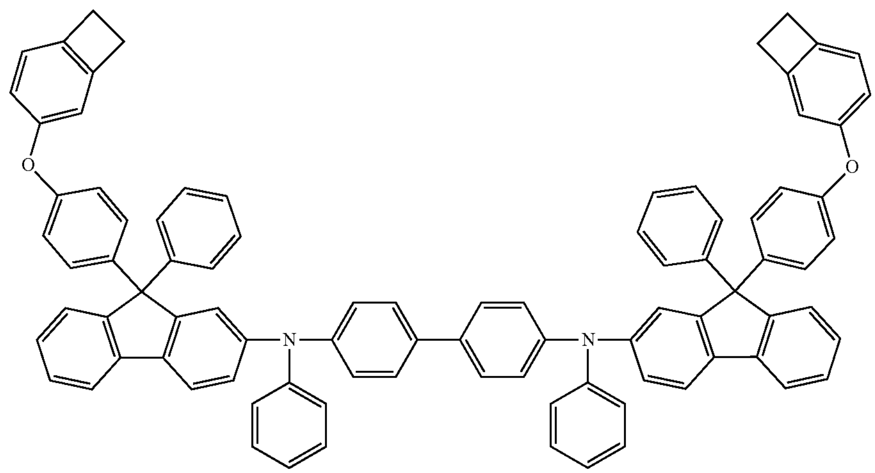
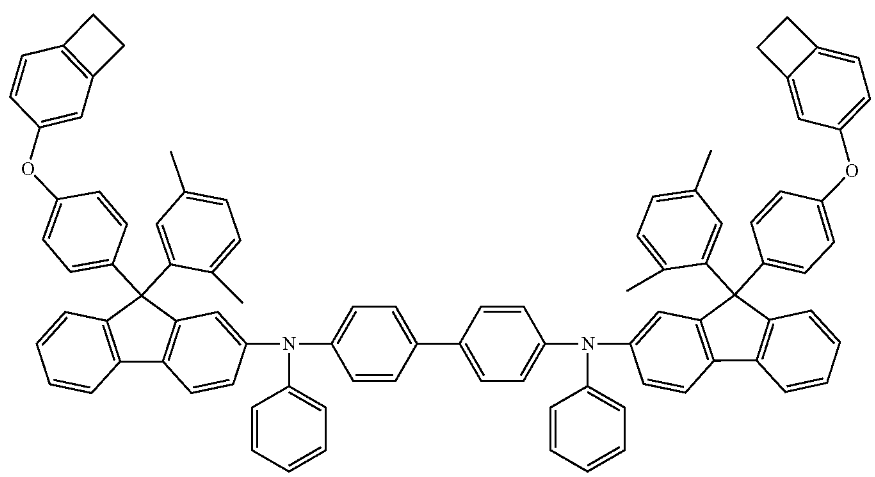
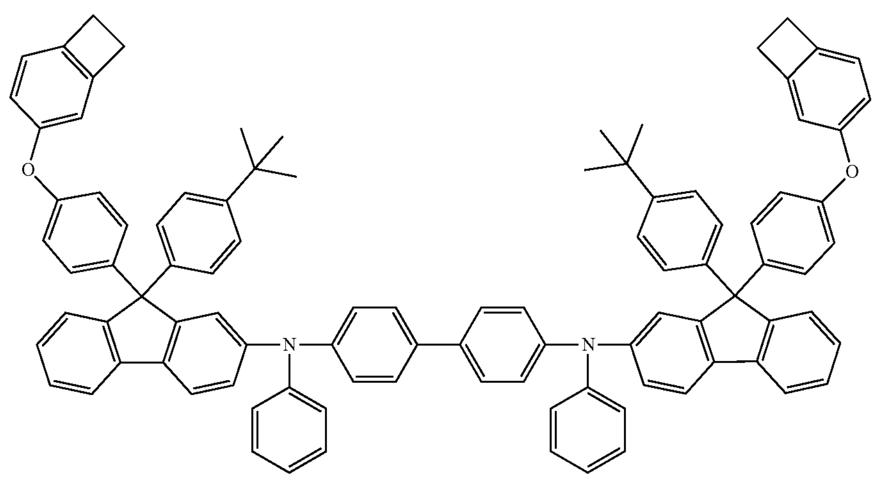

-continued
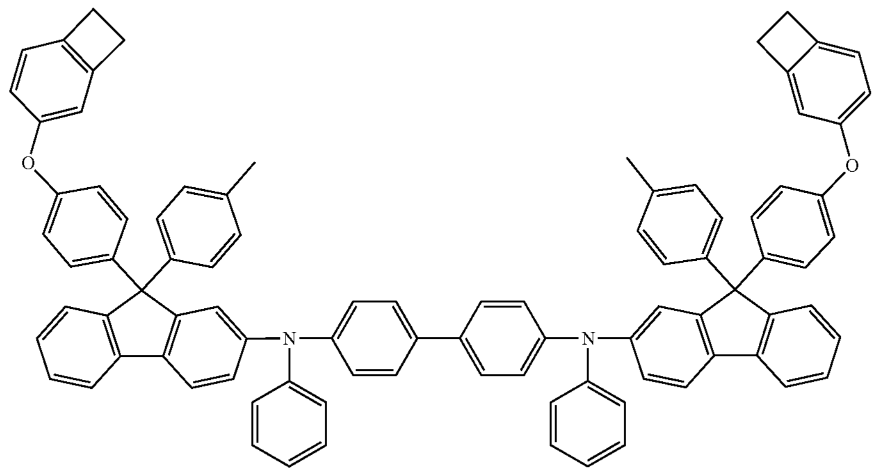
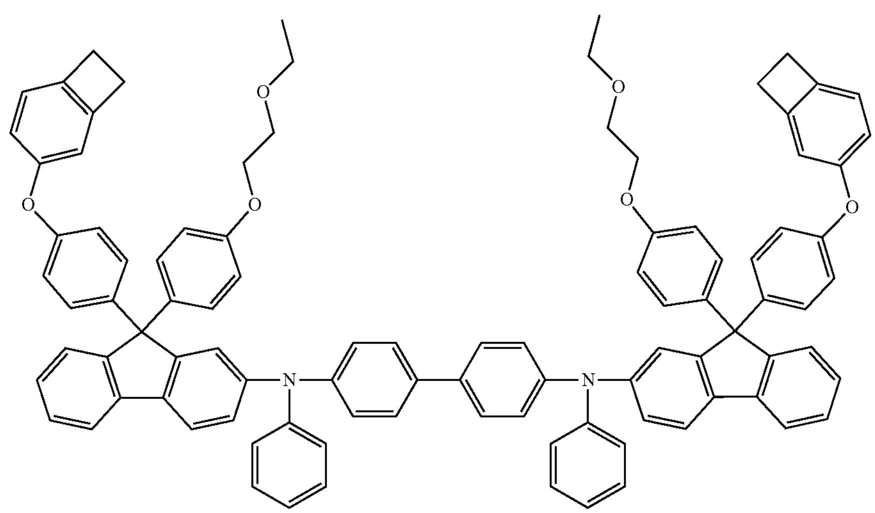
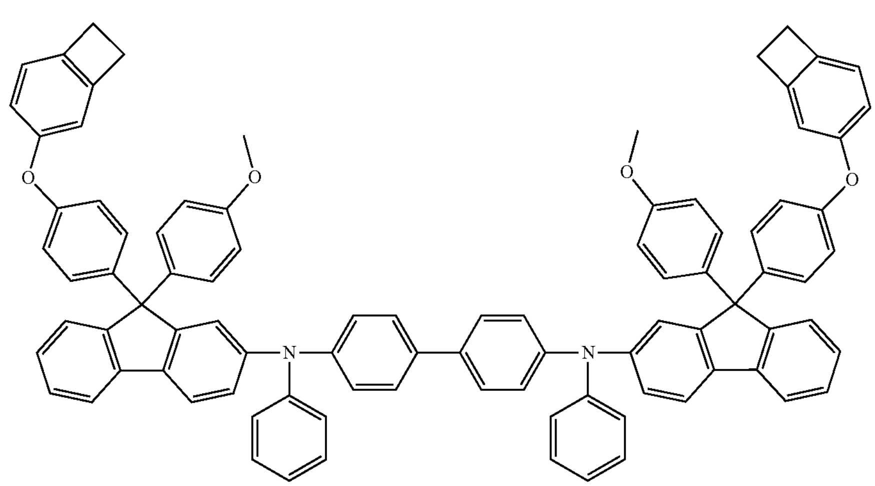

-continued
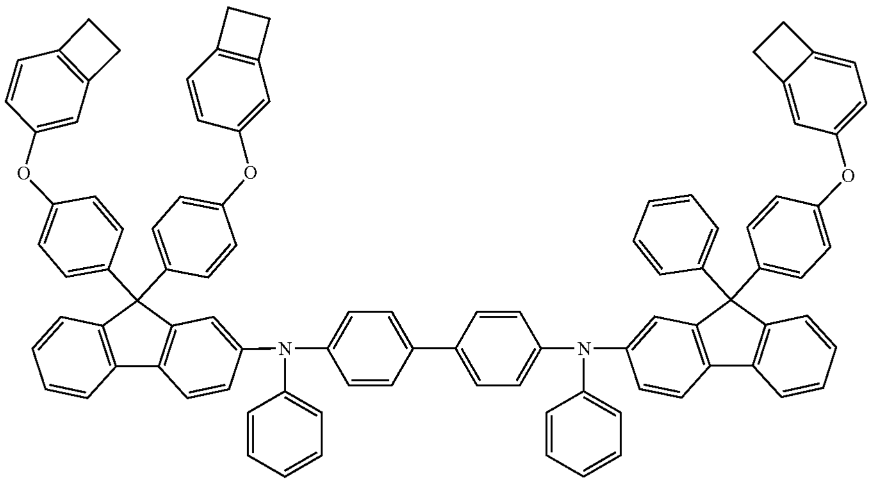
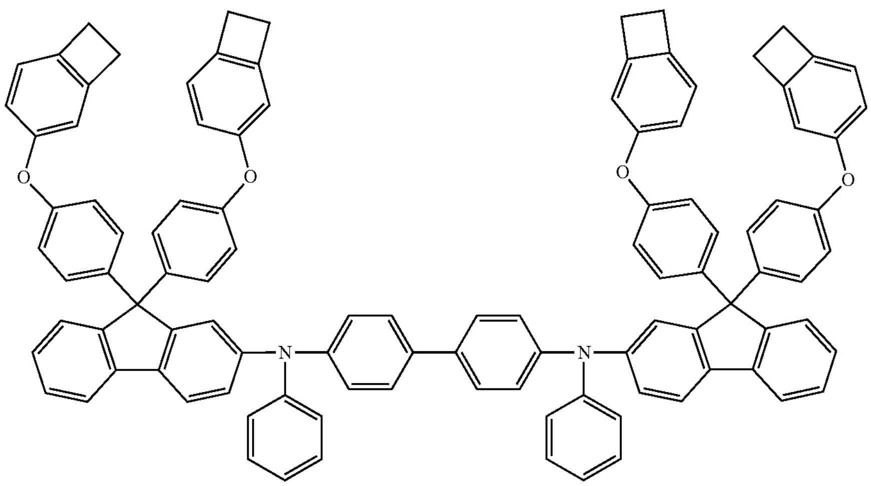
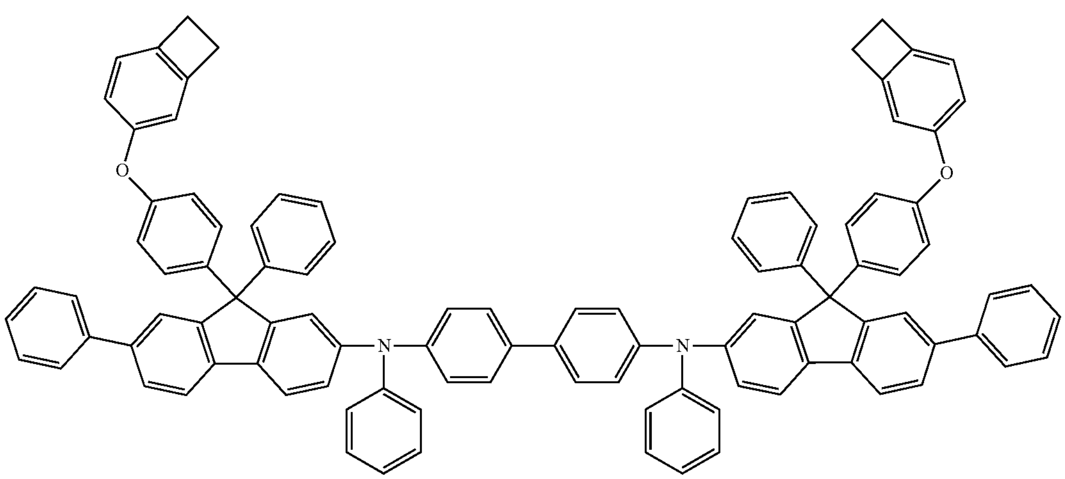

-continued
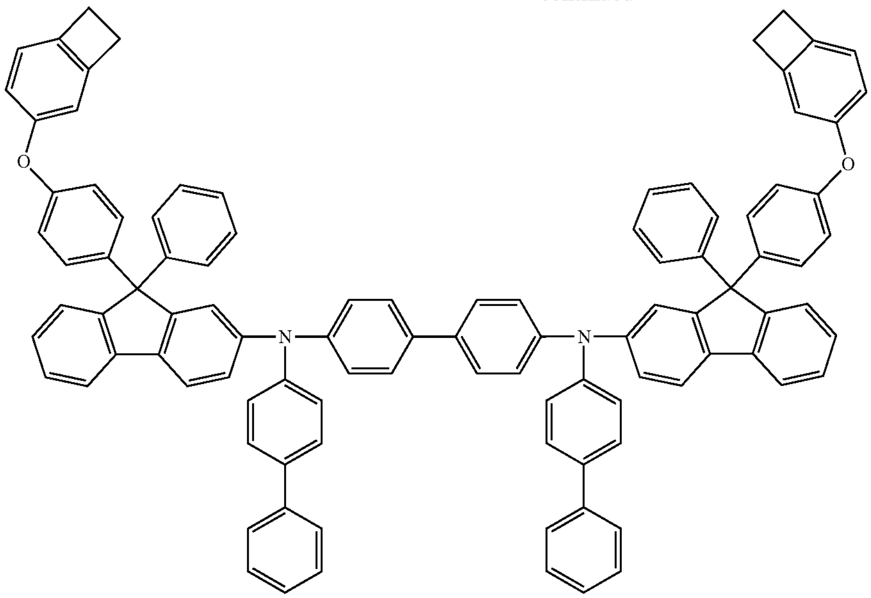
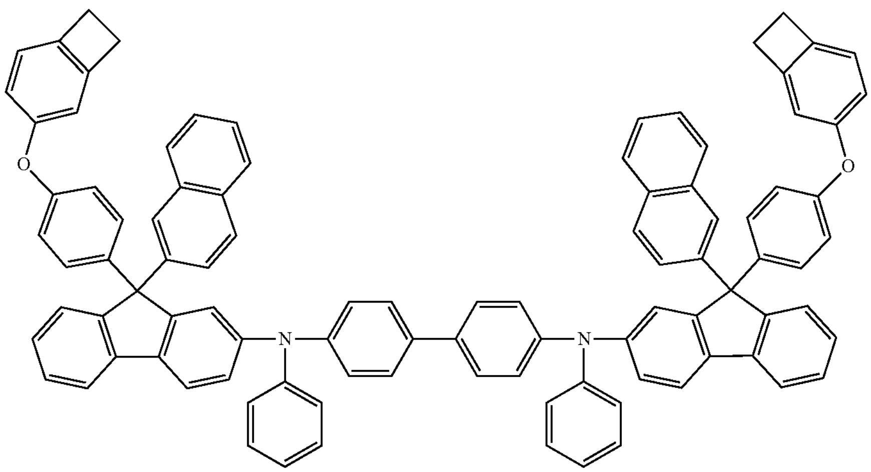
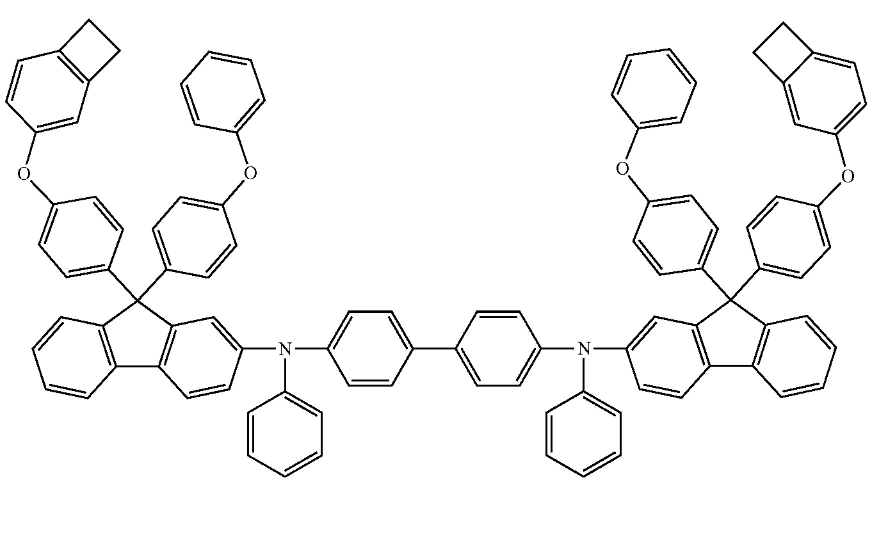

-continued
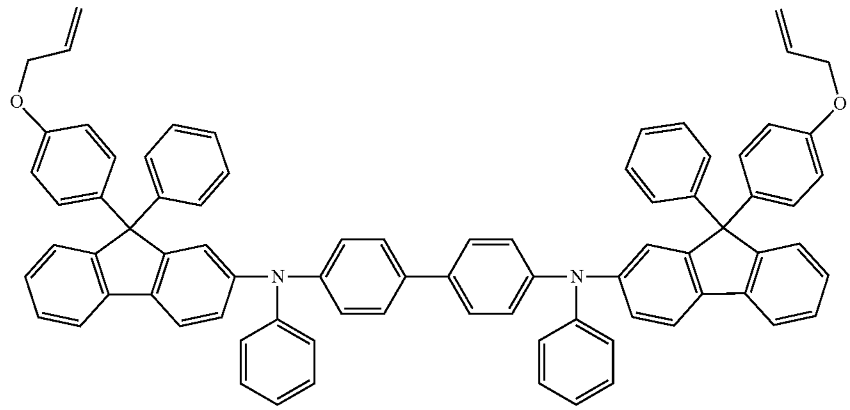
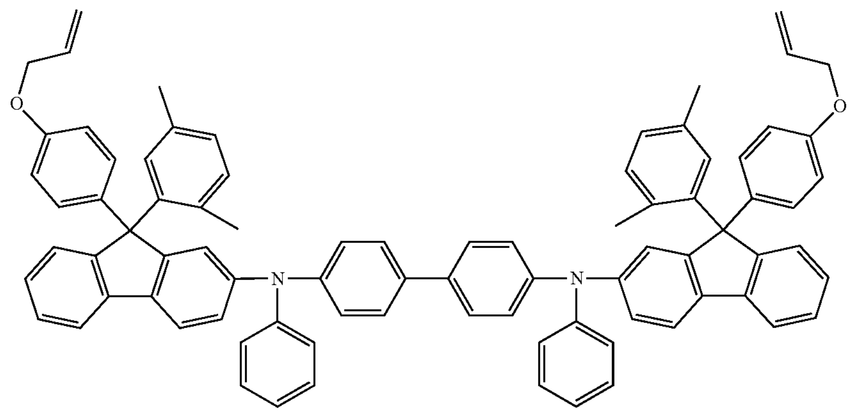
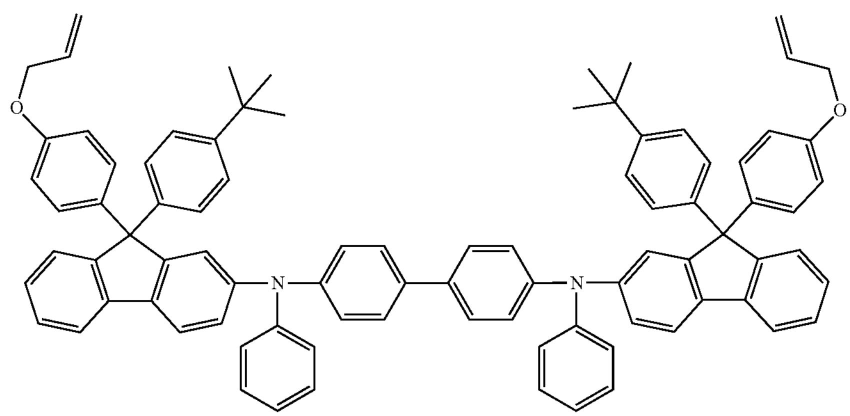
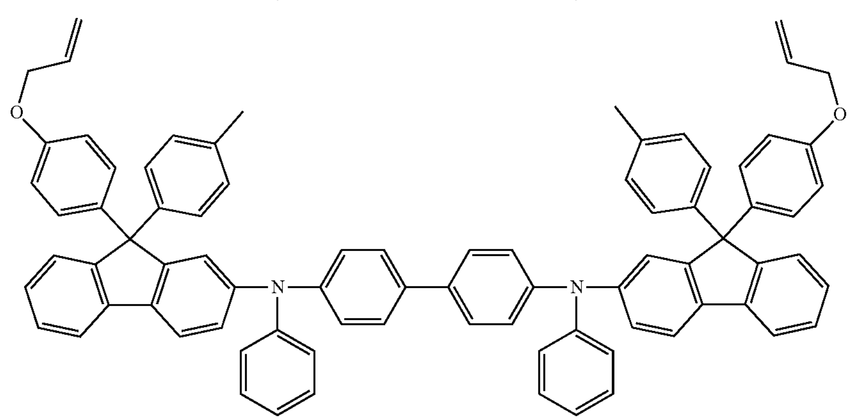

-continued
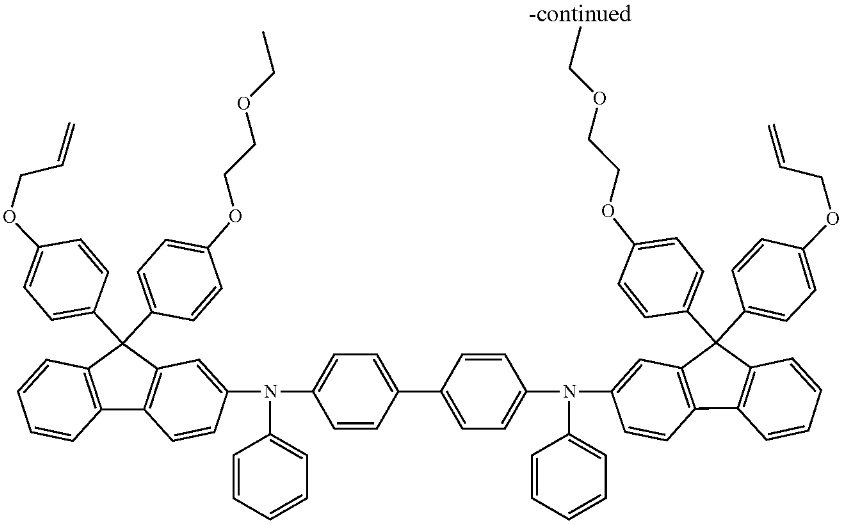
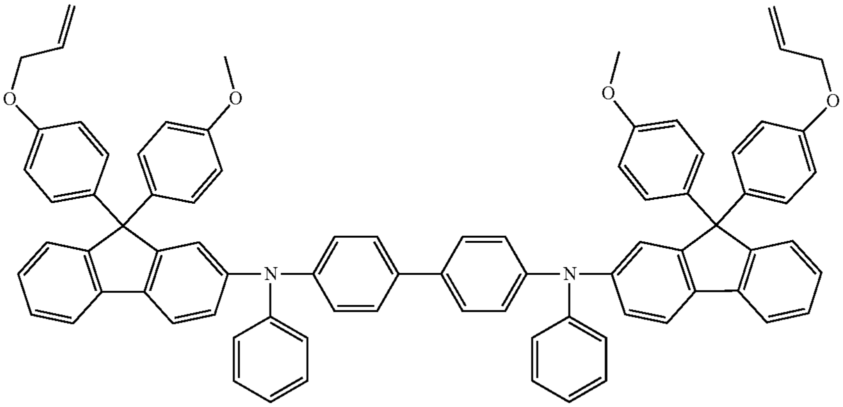
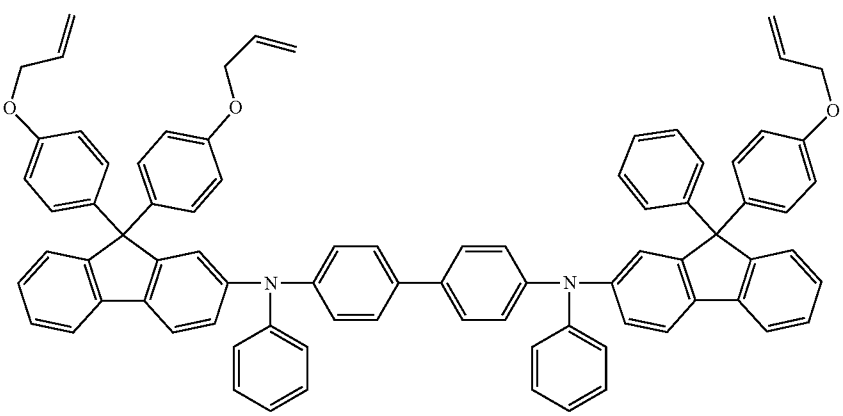
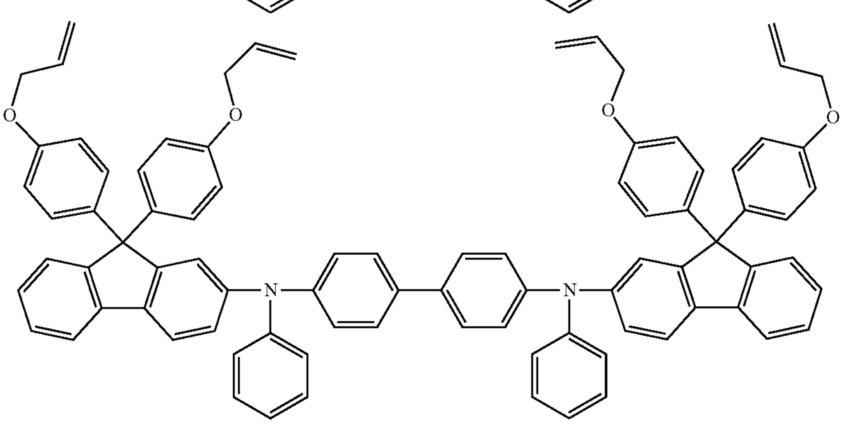

-continued
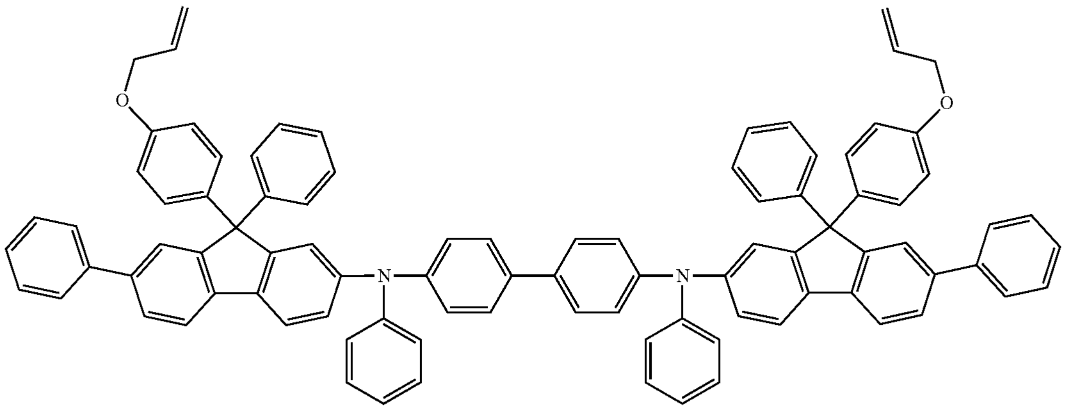
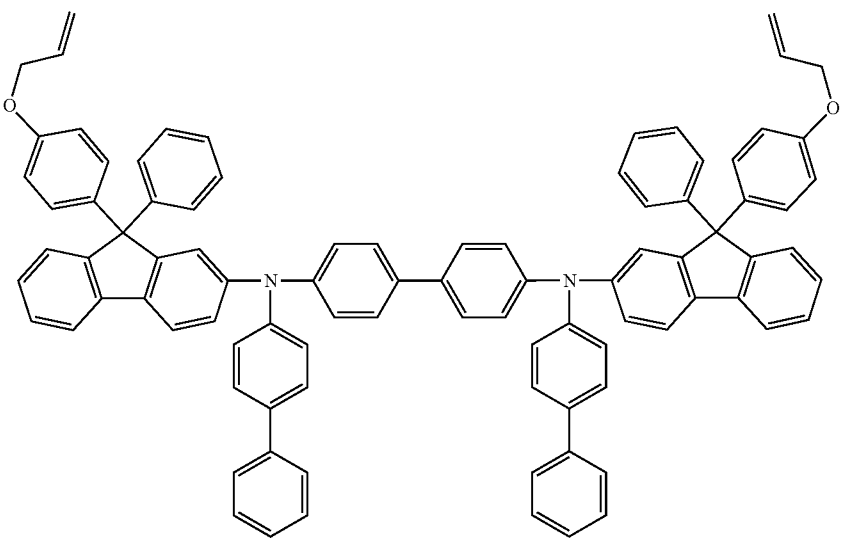
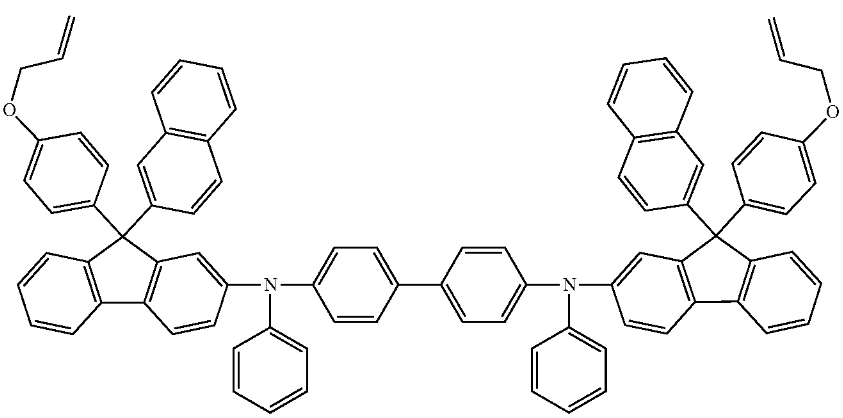

-continued
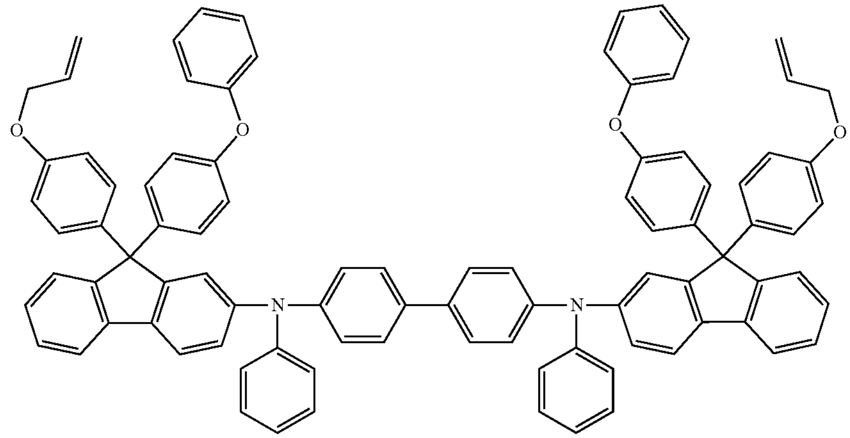
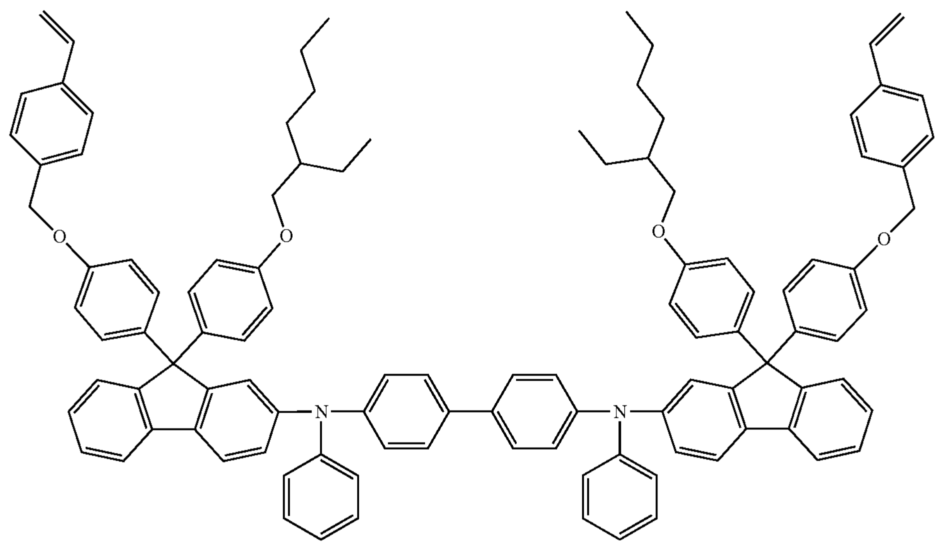
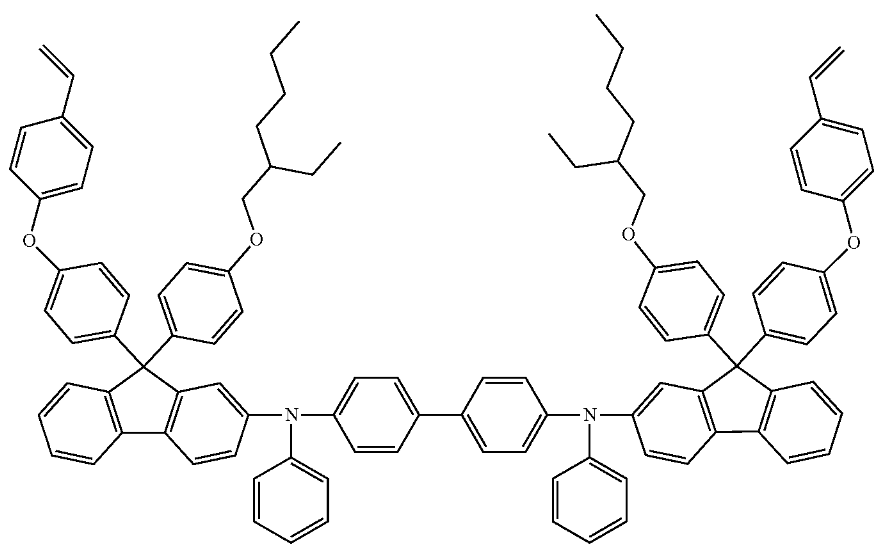

-continued
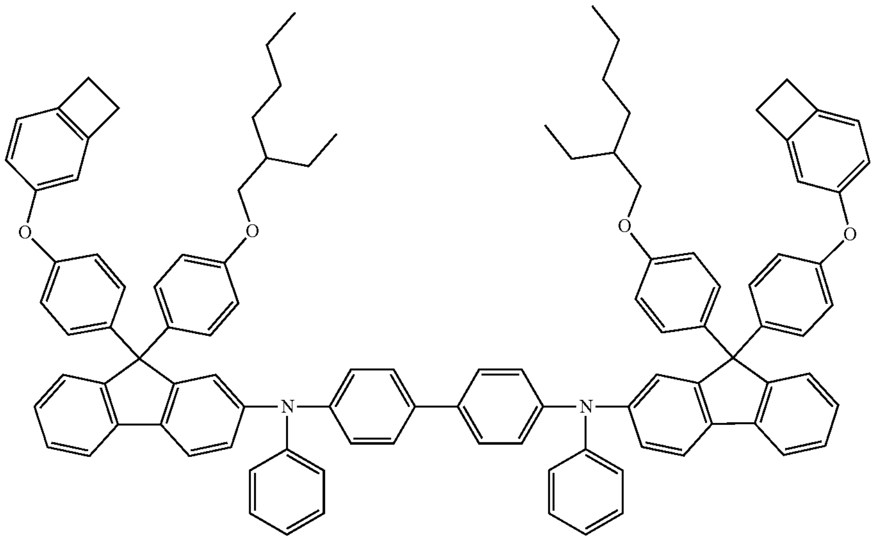
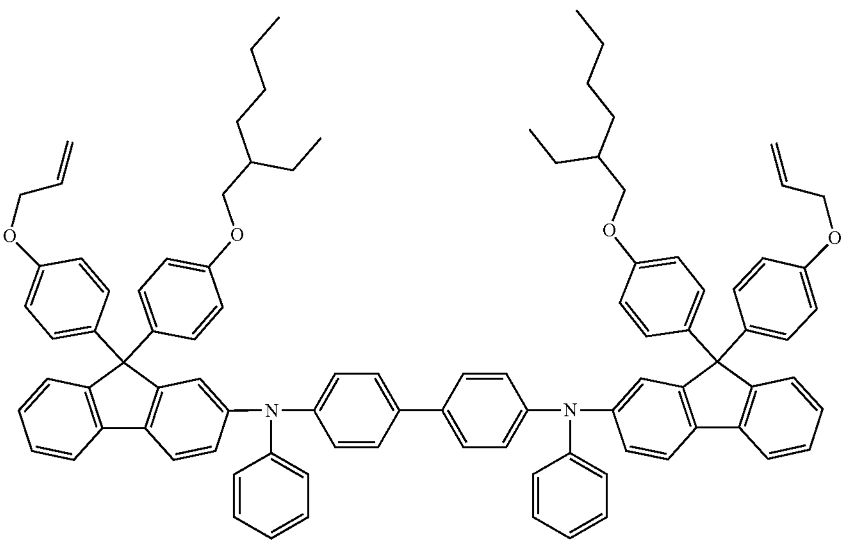
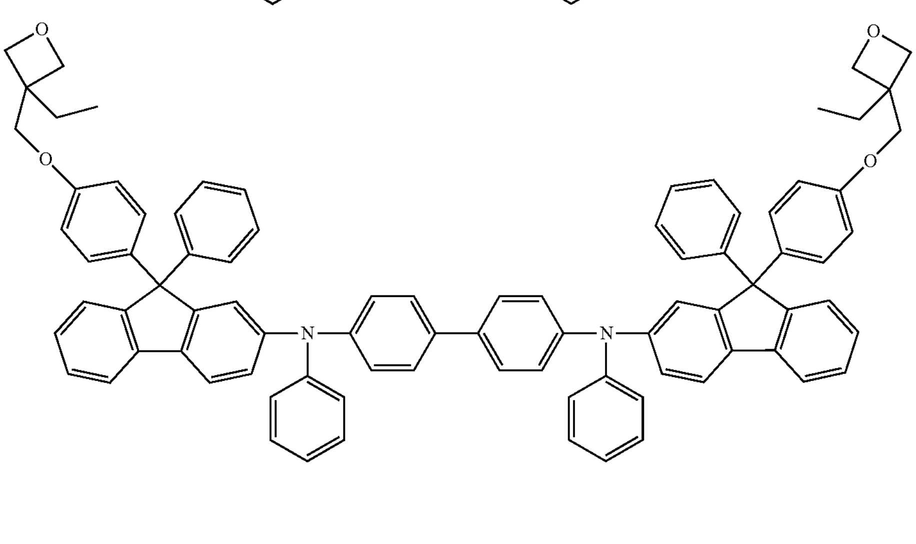

-continued
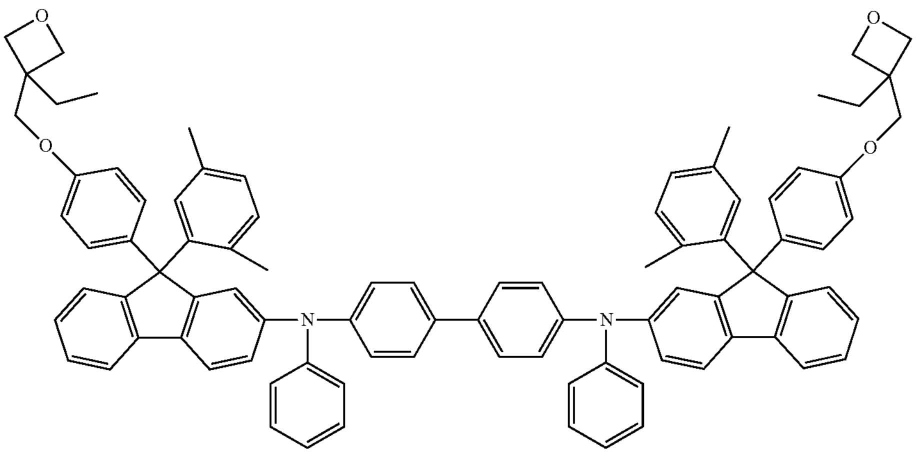
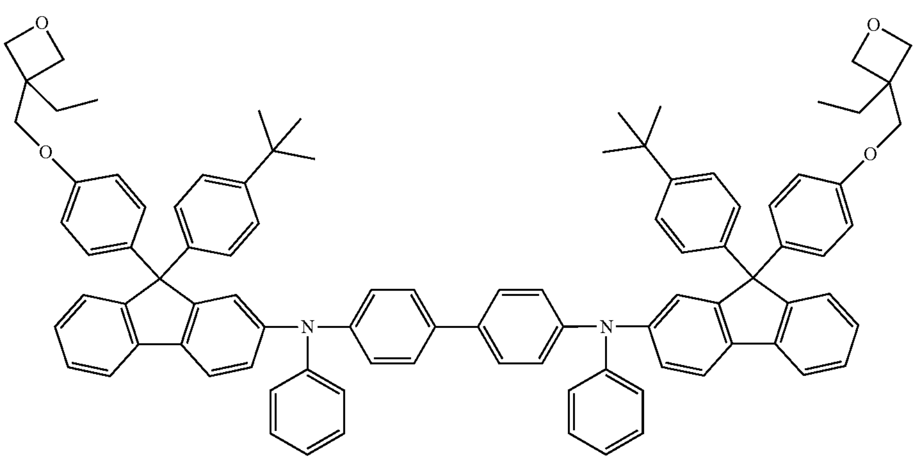
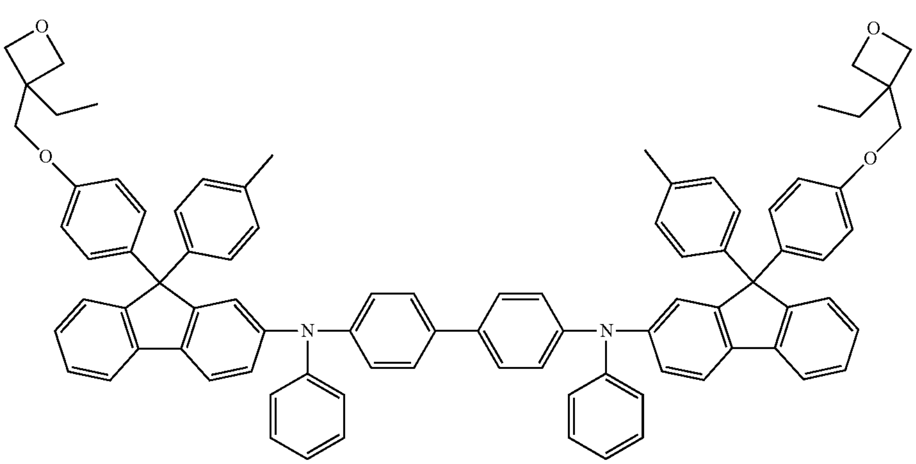

-continued
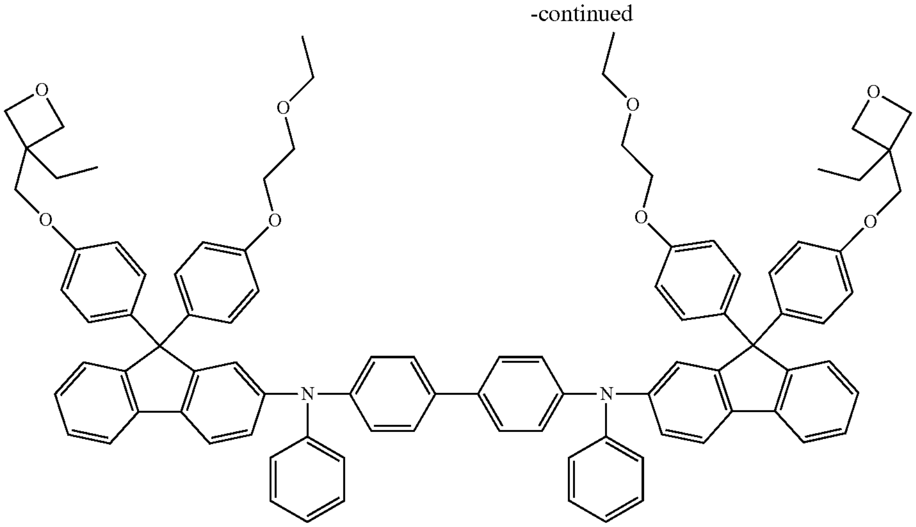
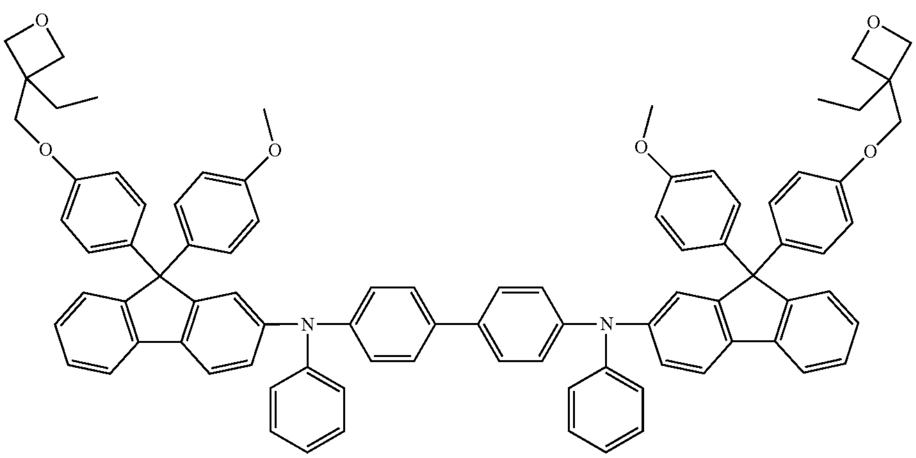
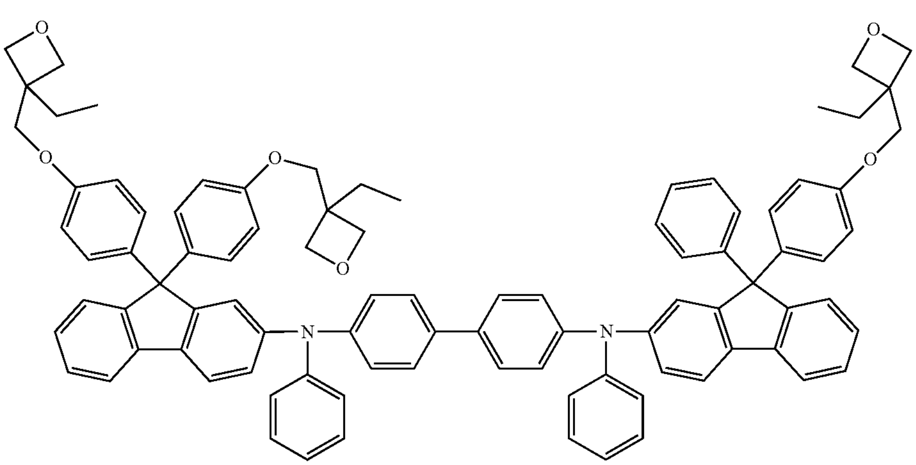

-continued
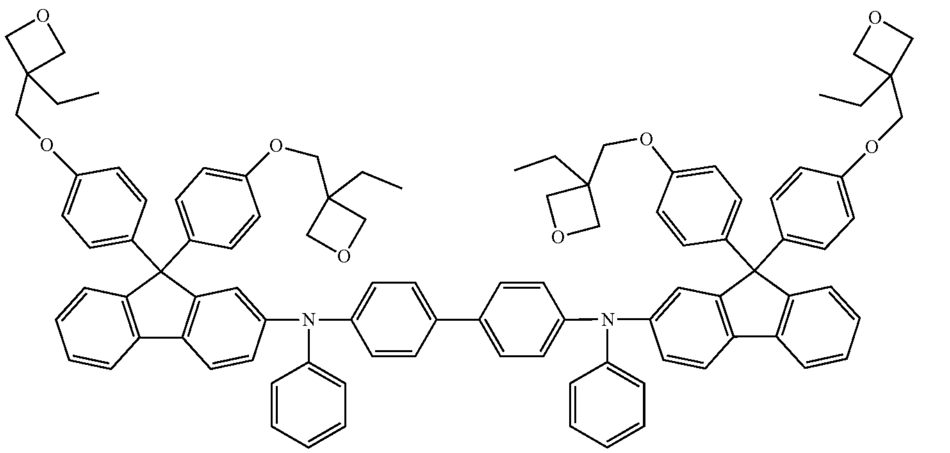
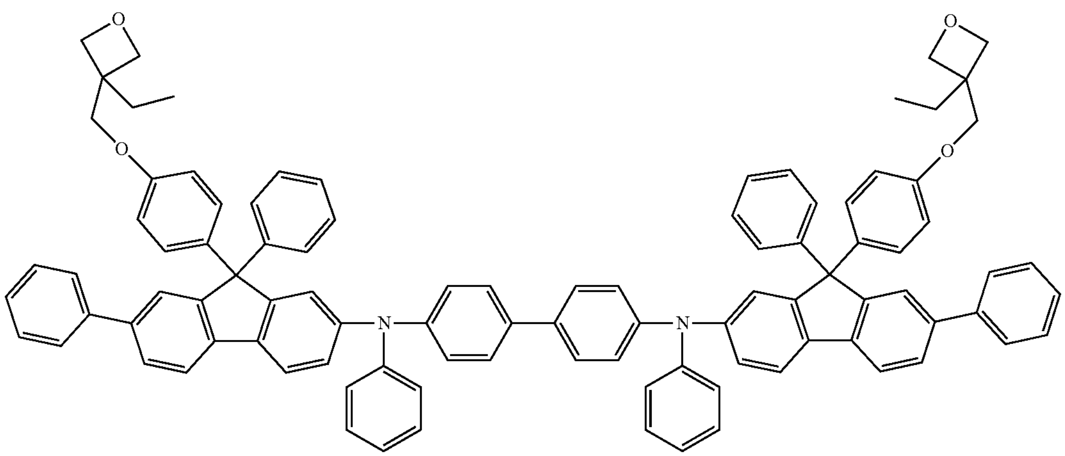
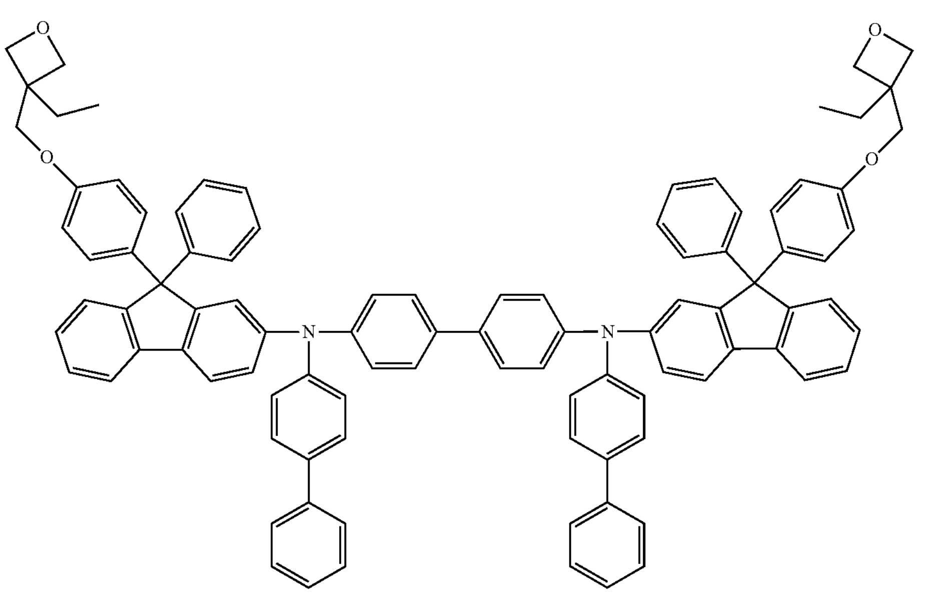

-continued
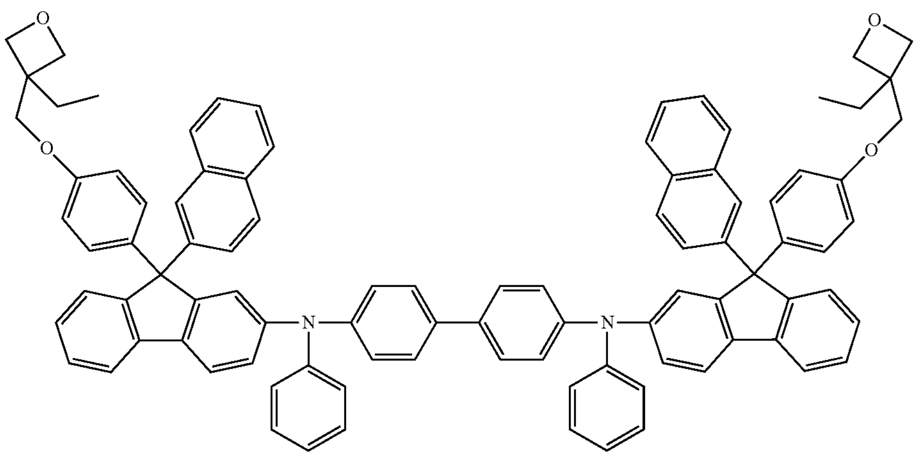
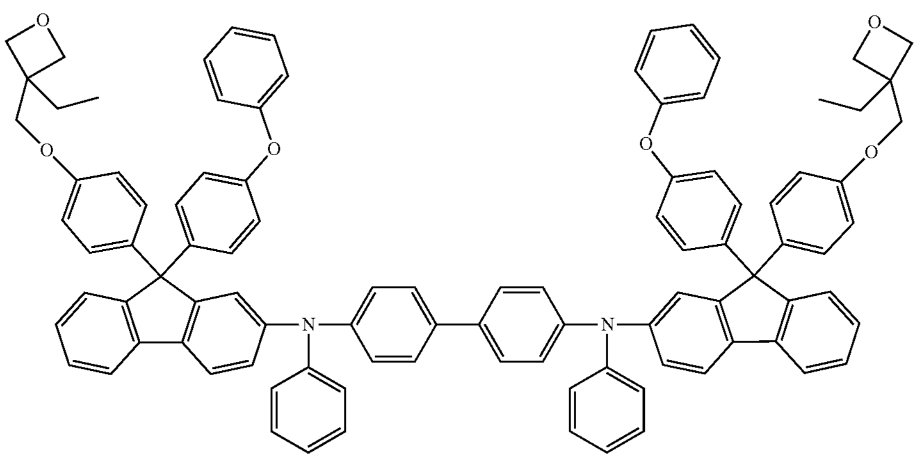
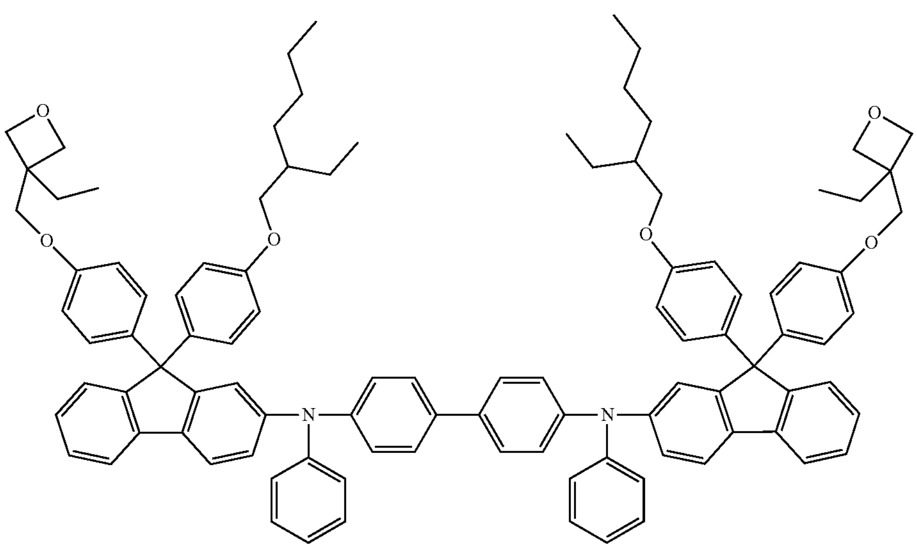

-continued
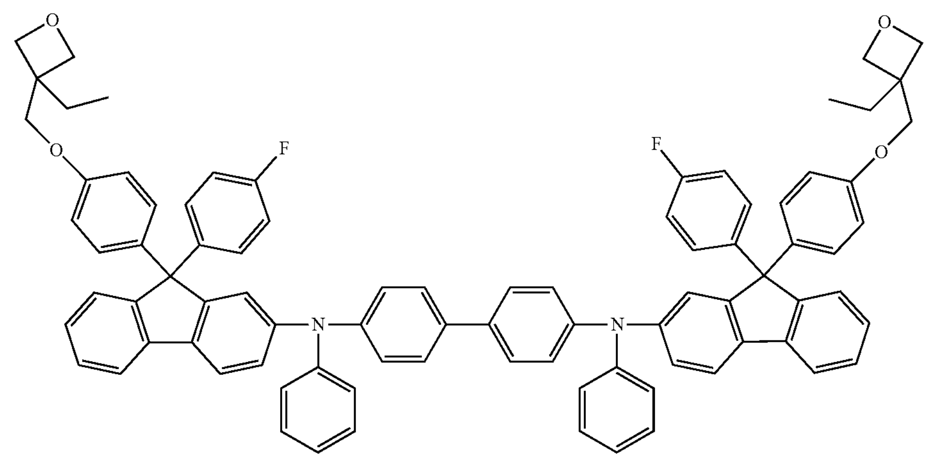
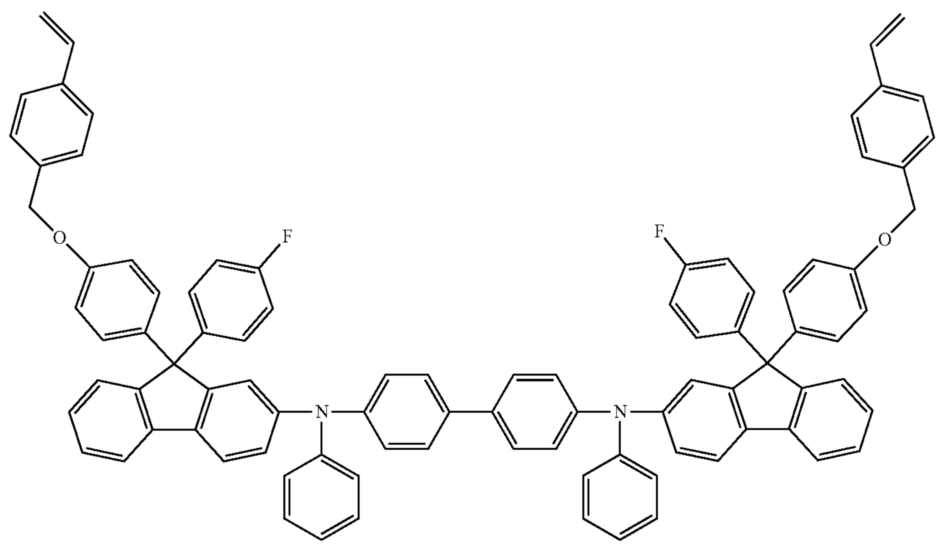
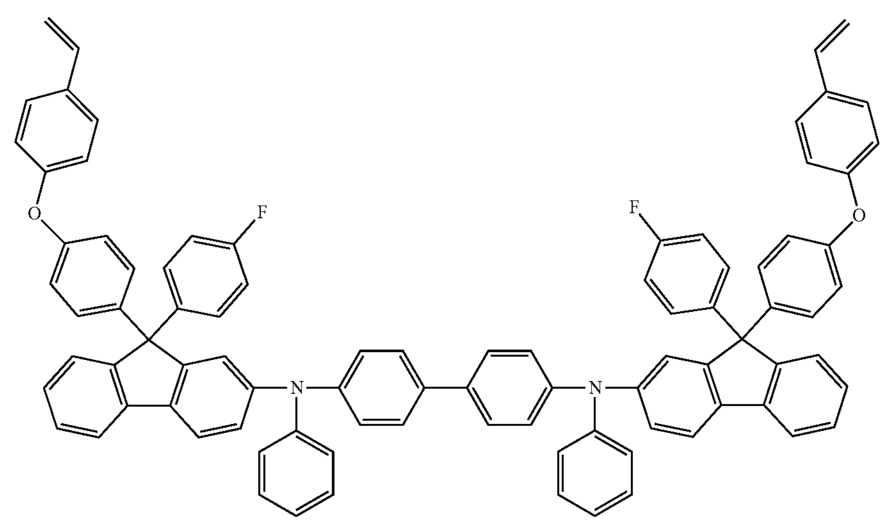

-continued
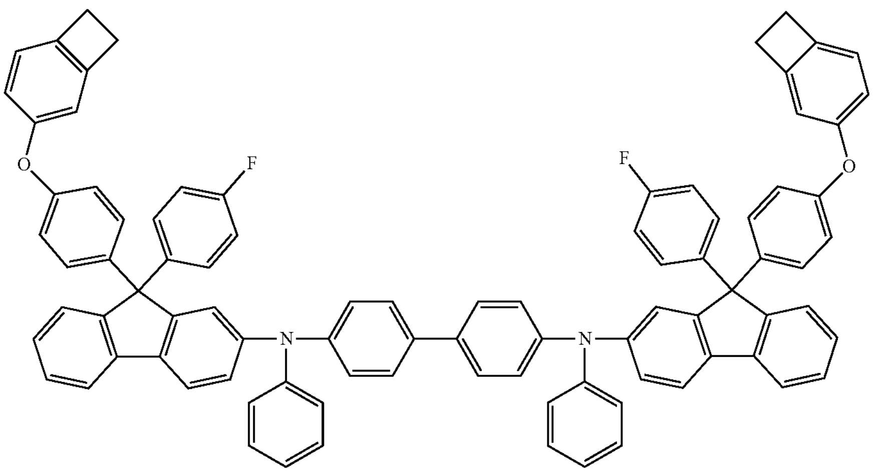
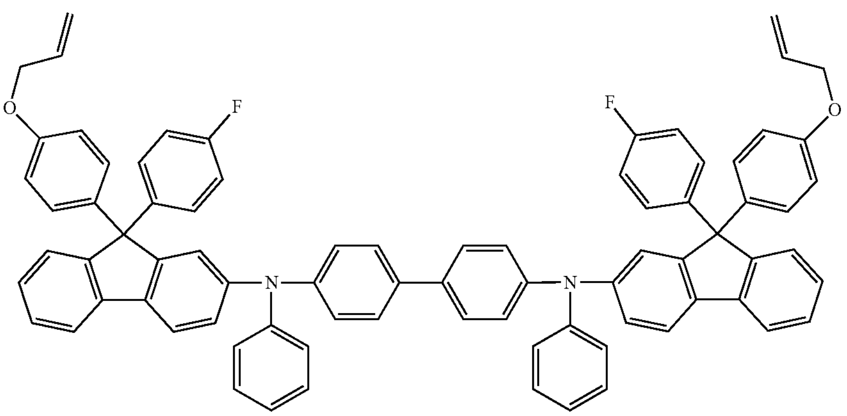
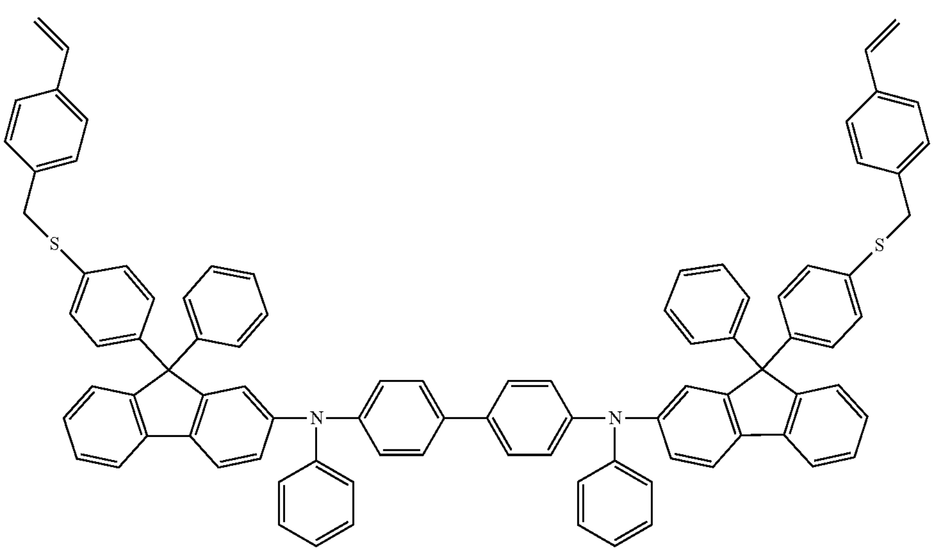

-continued
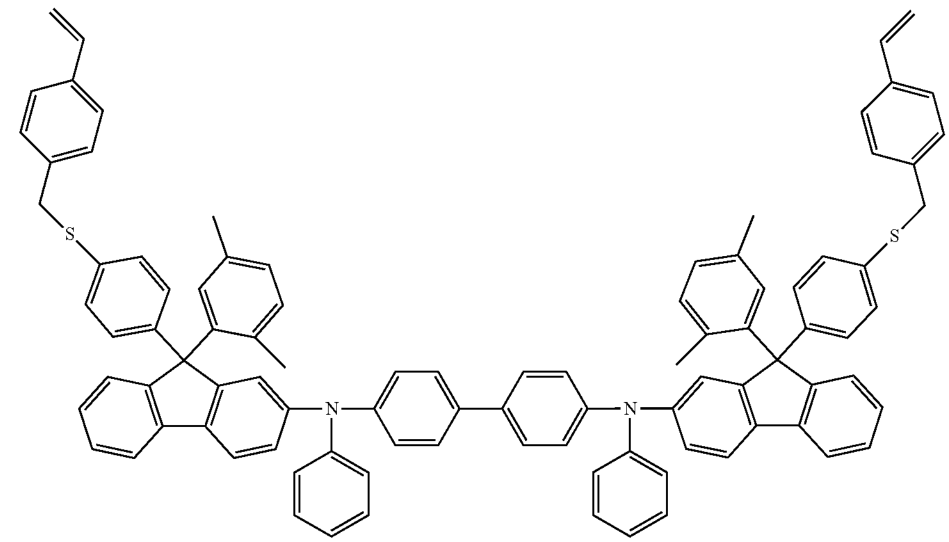
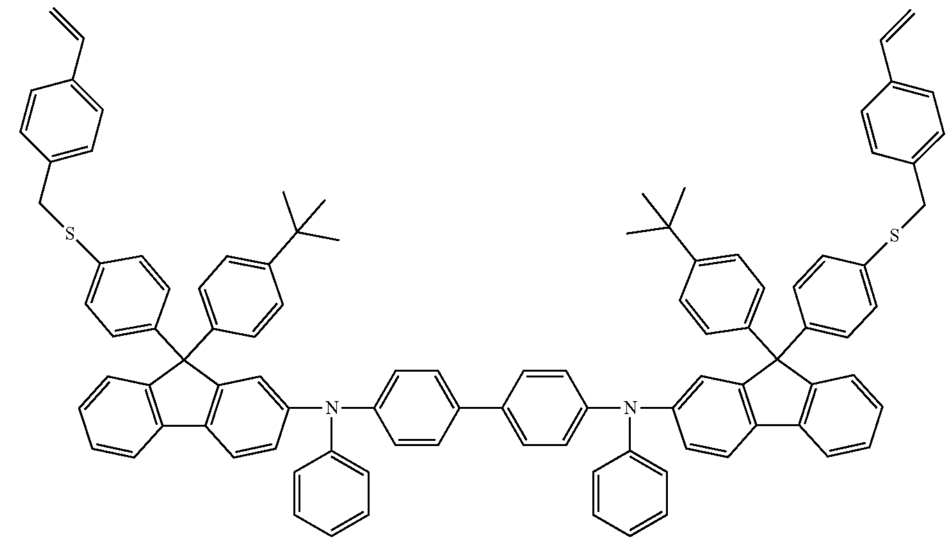
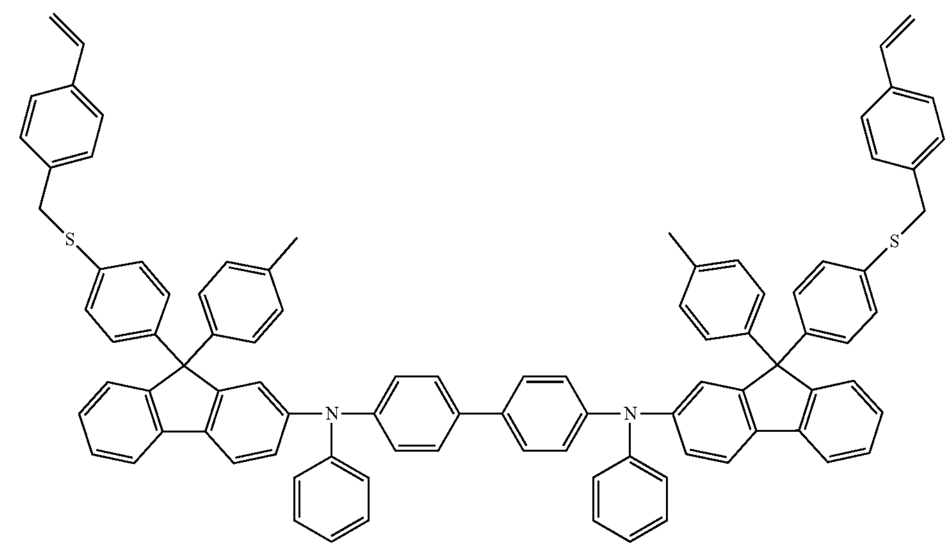

-continued
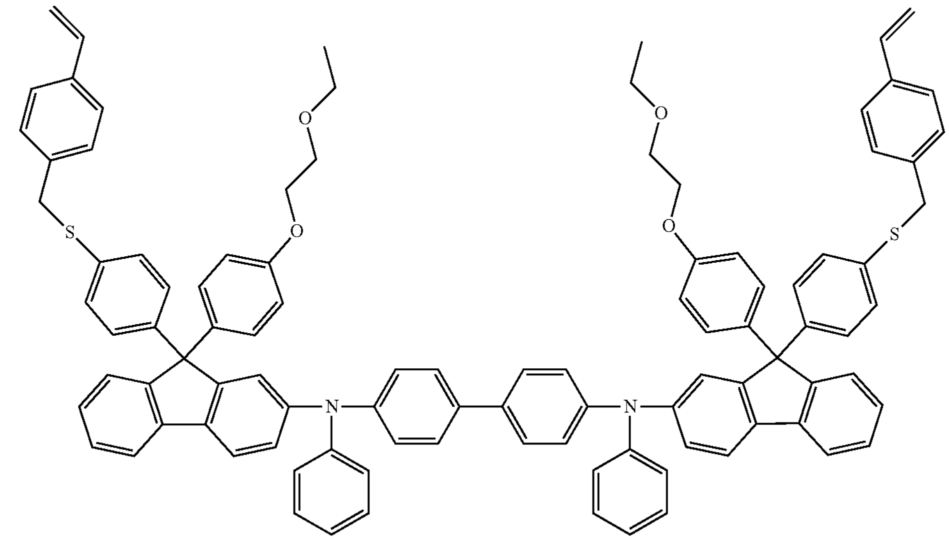
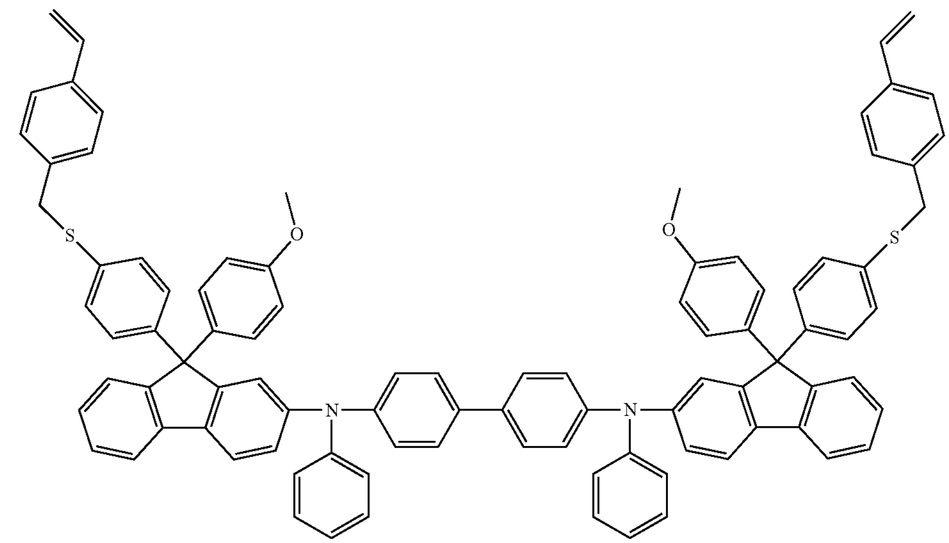
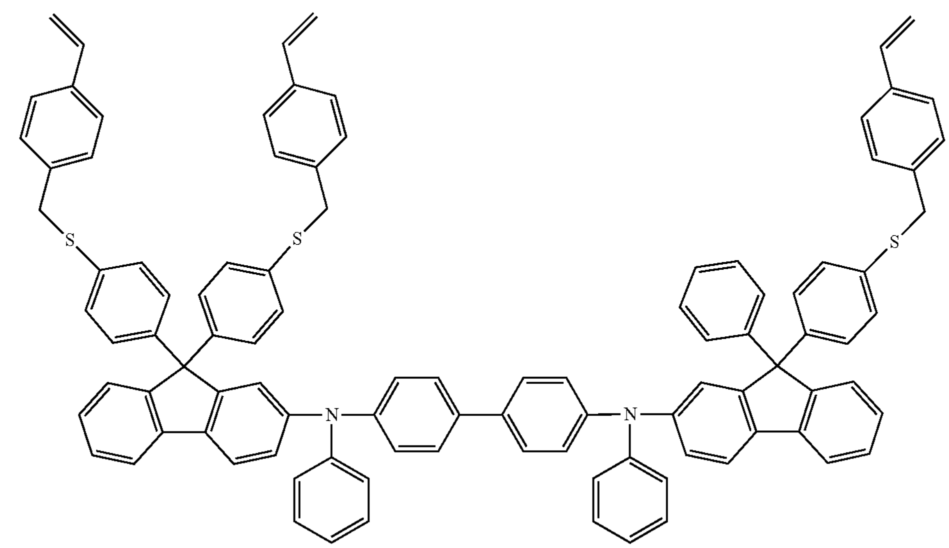

-continued
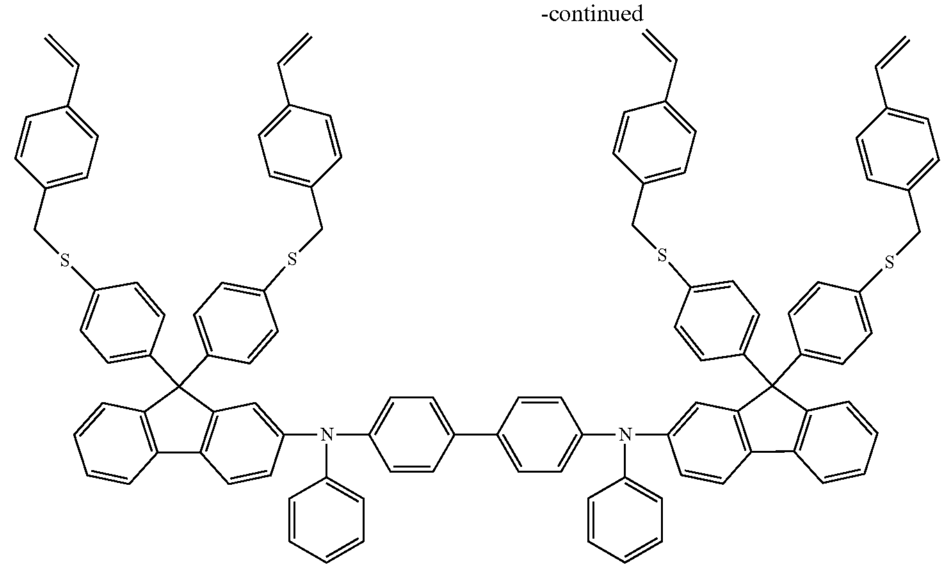
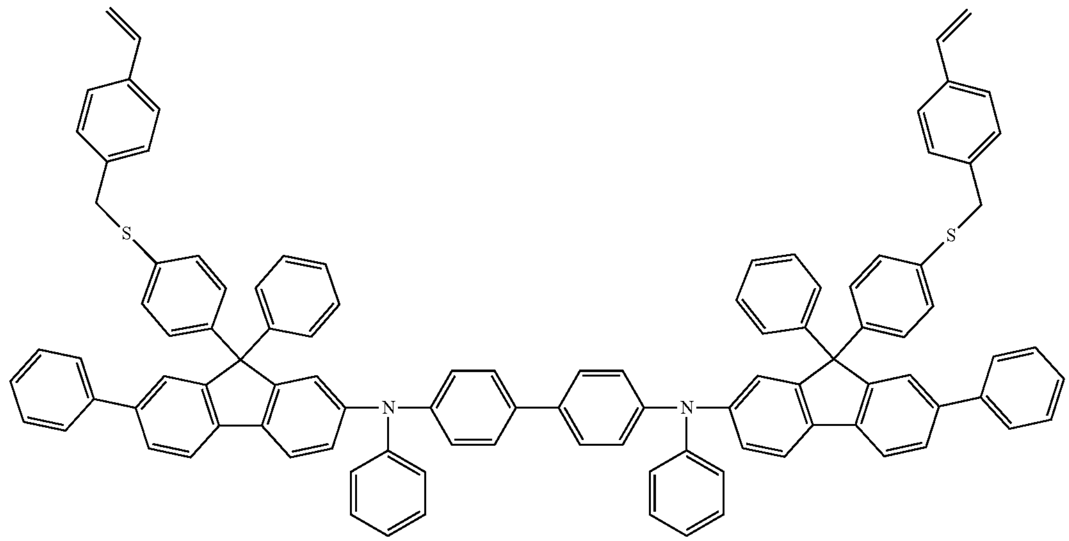
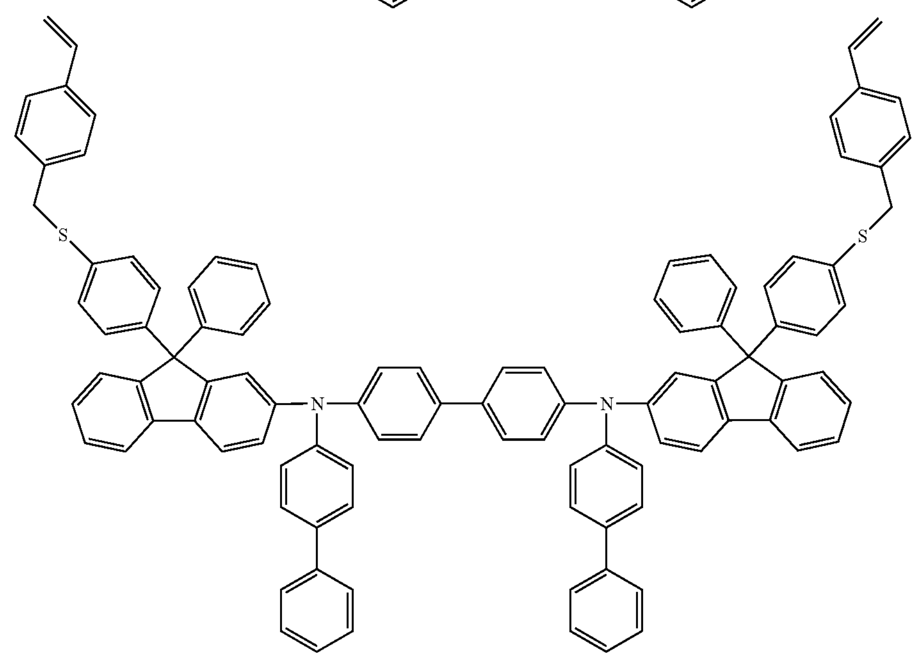

-continued
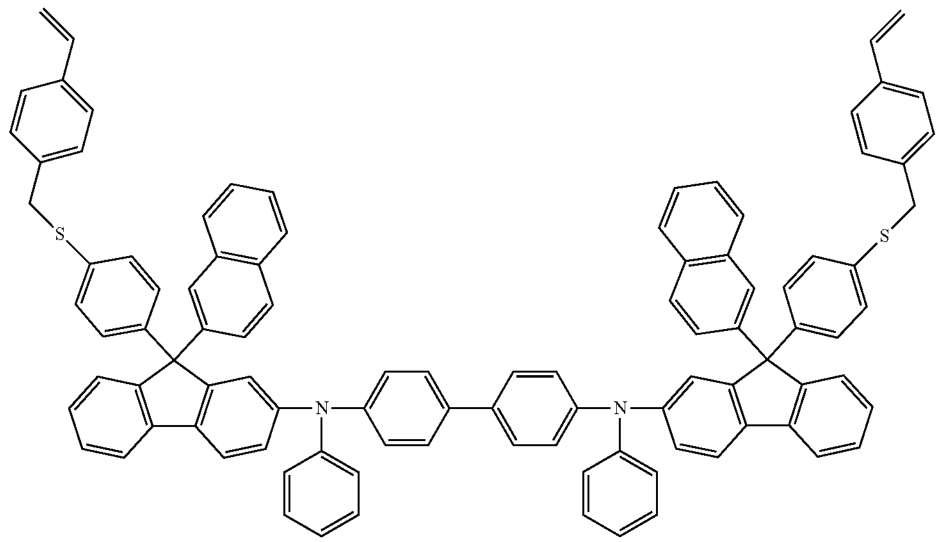
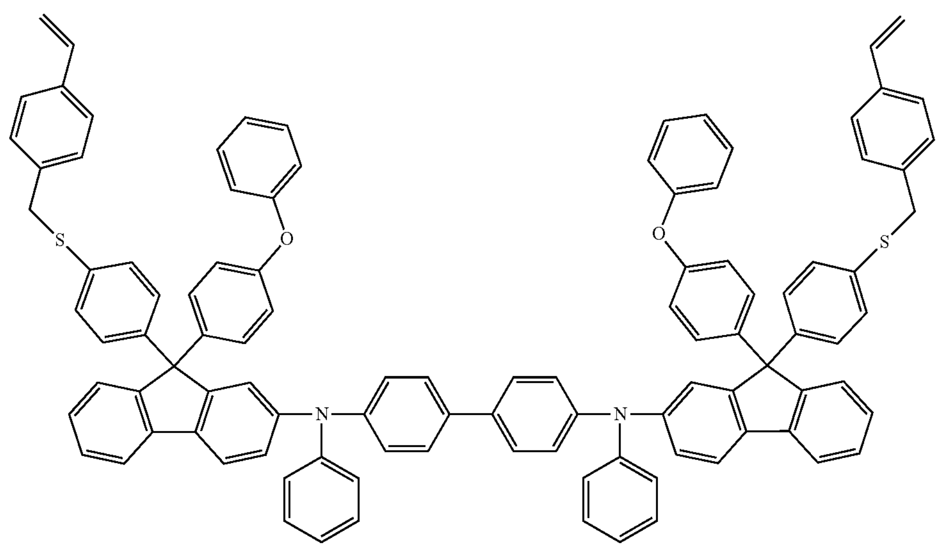
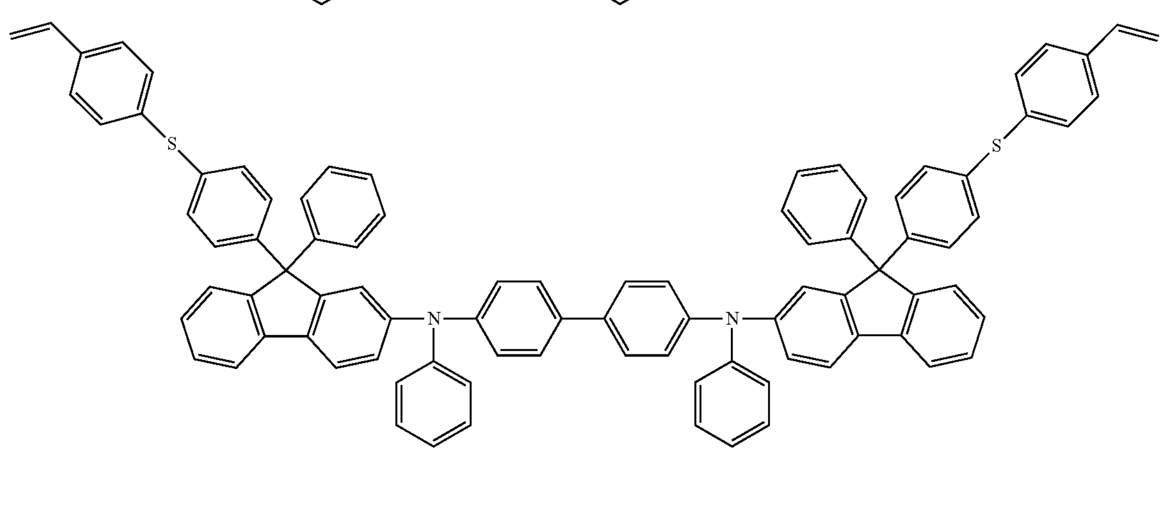

-continued
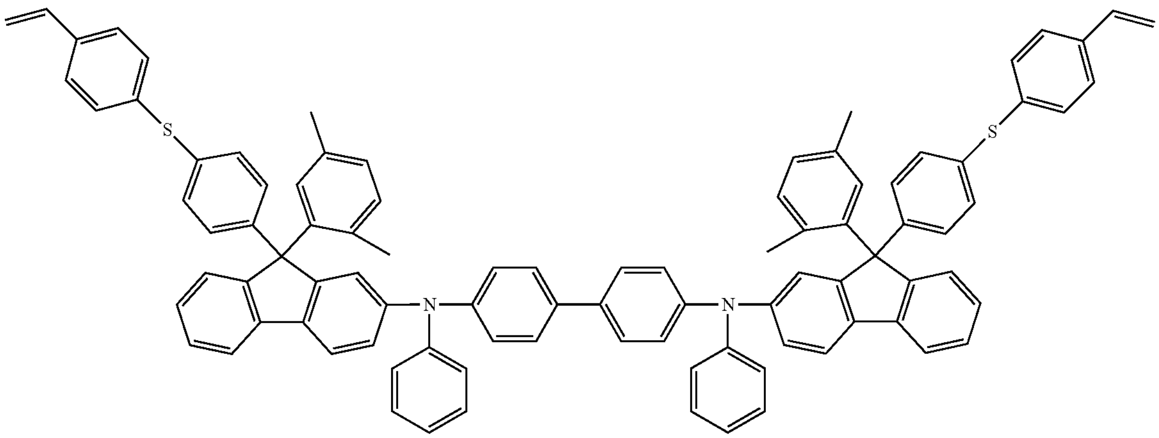
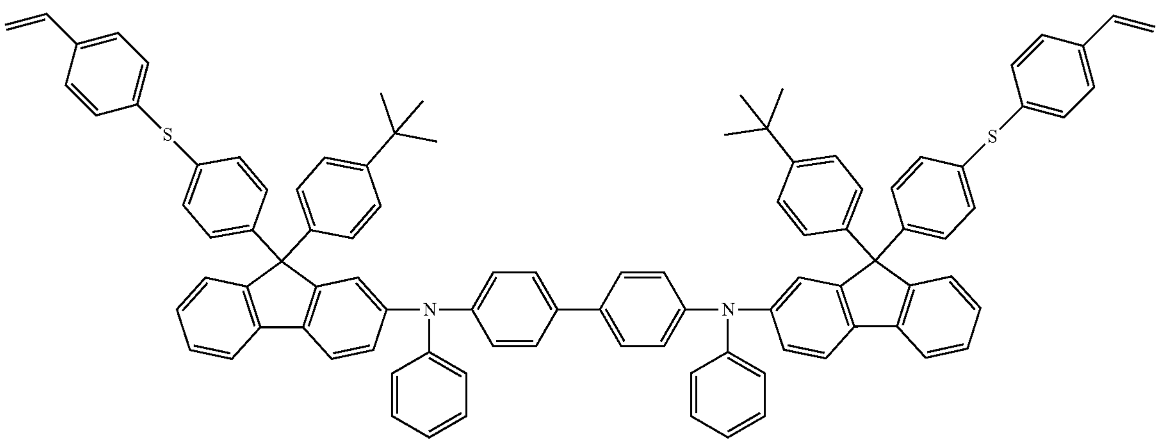
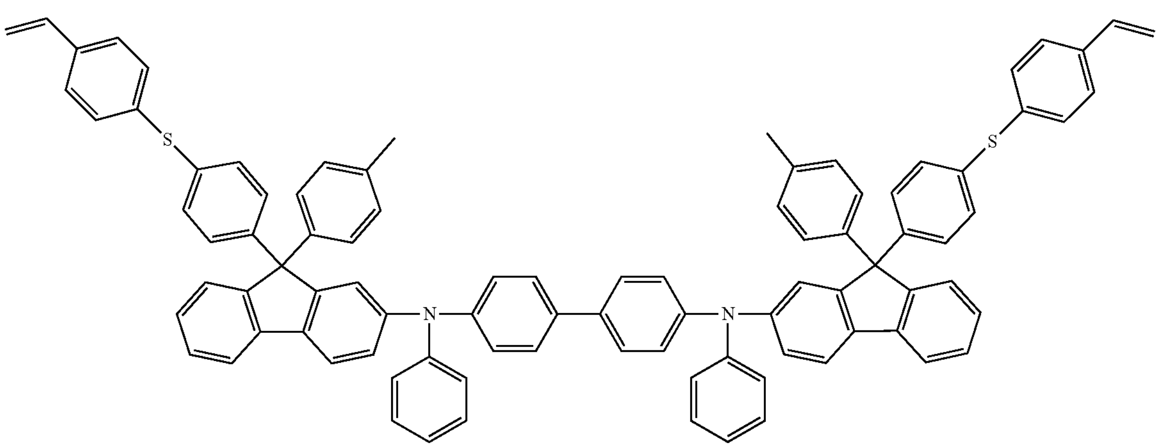

-continued
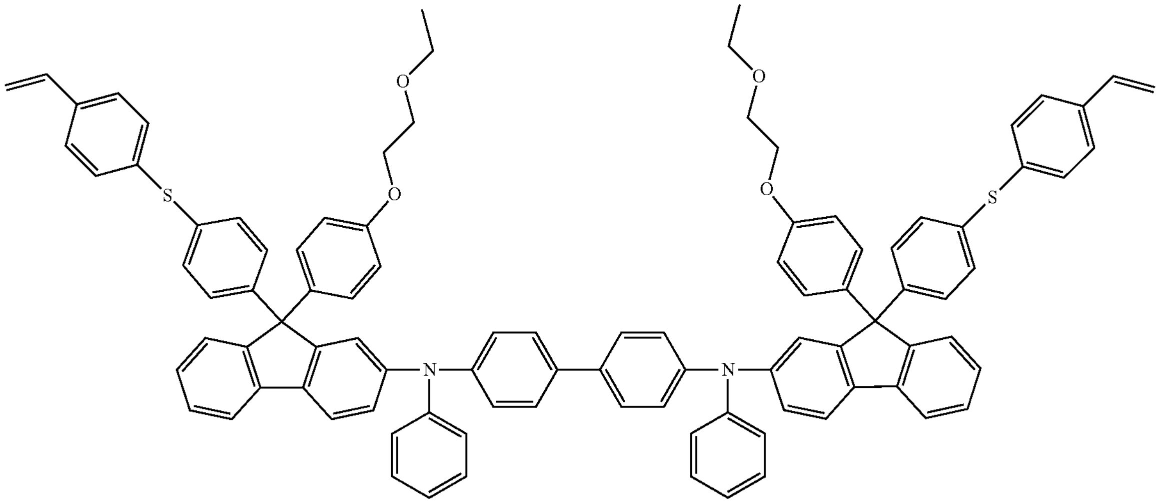
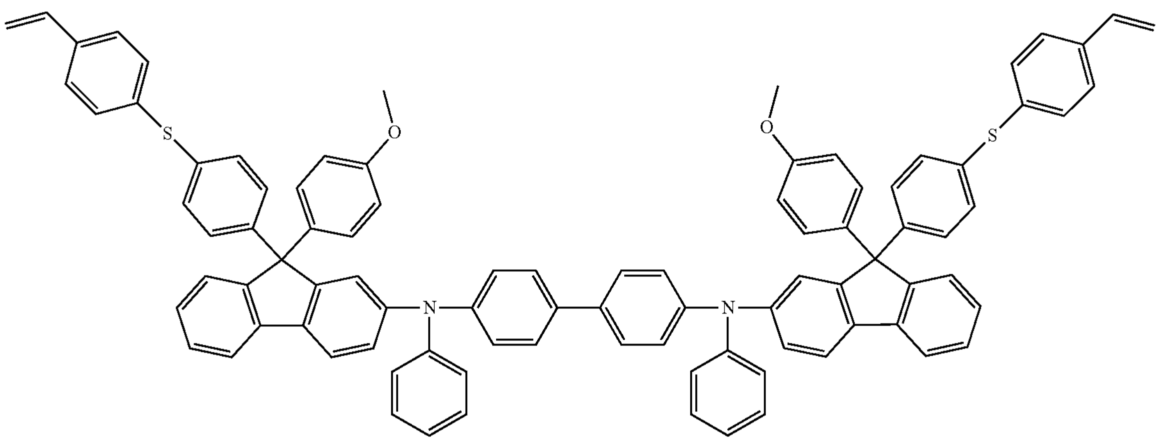
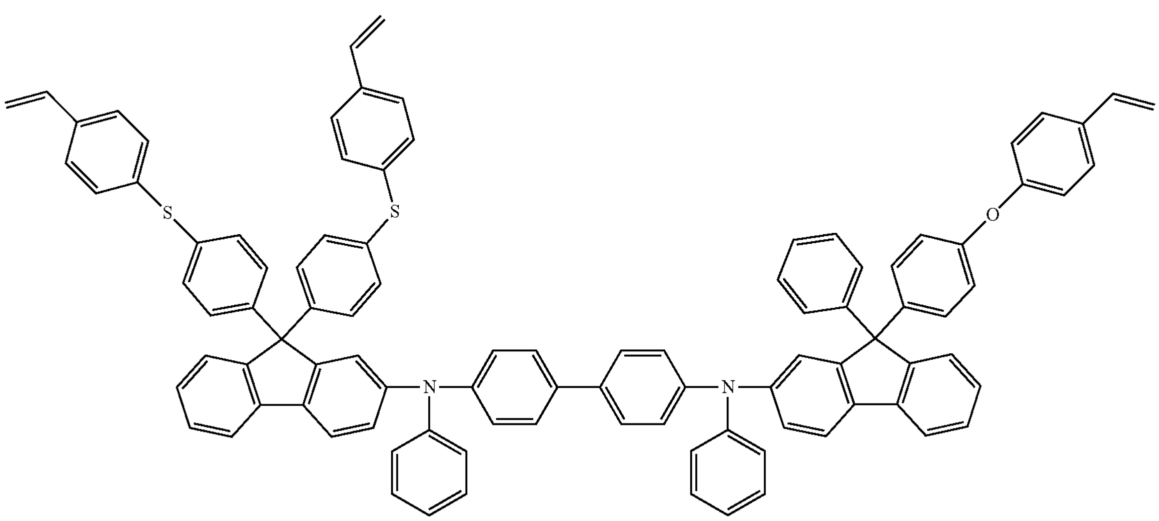

-continued
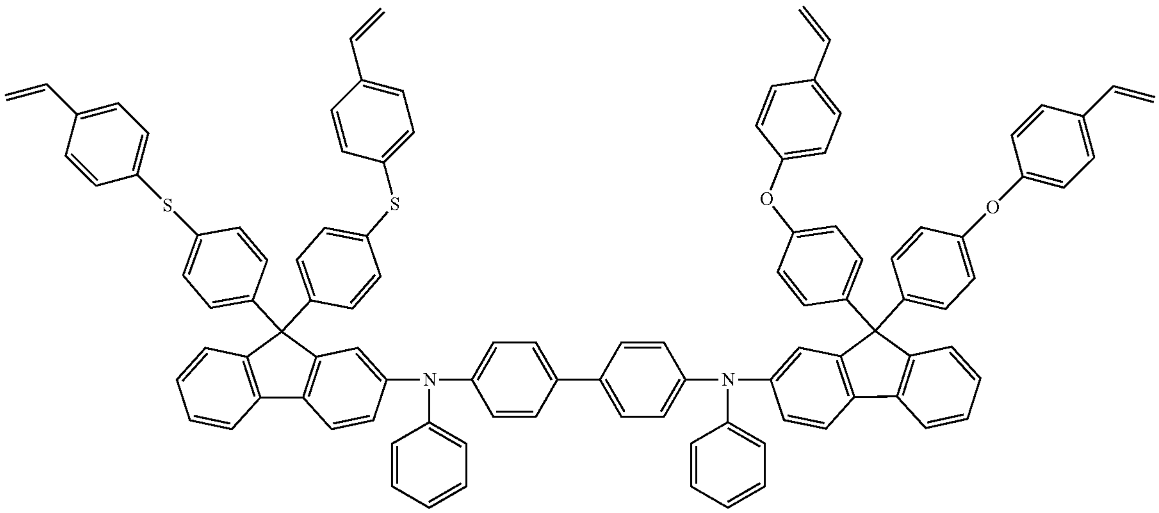
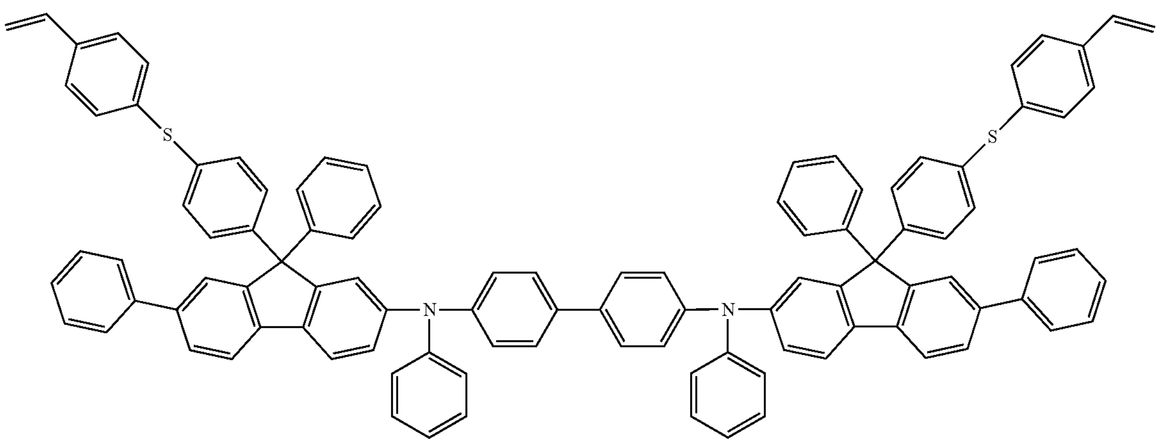
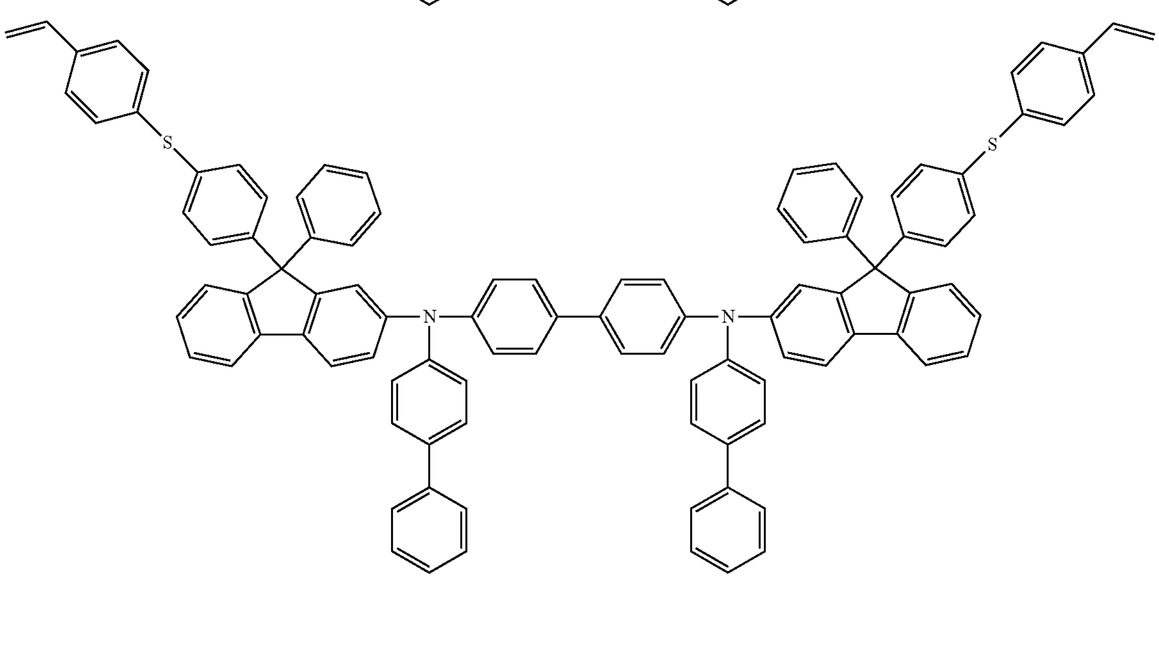

-continued
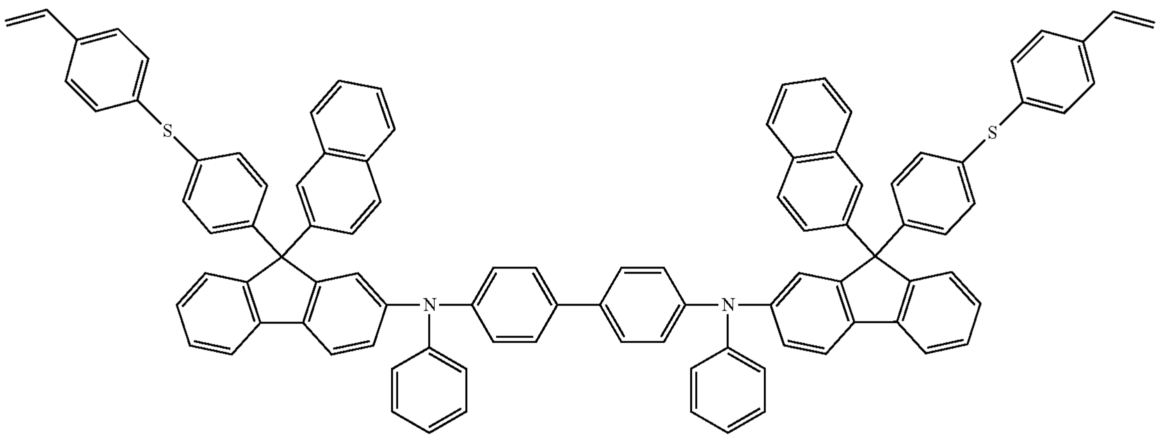
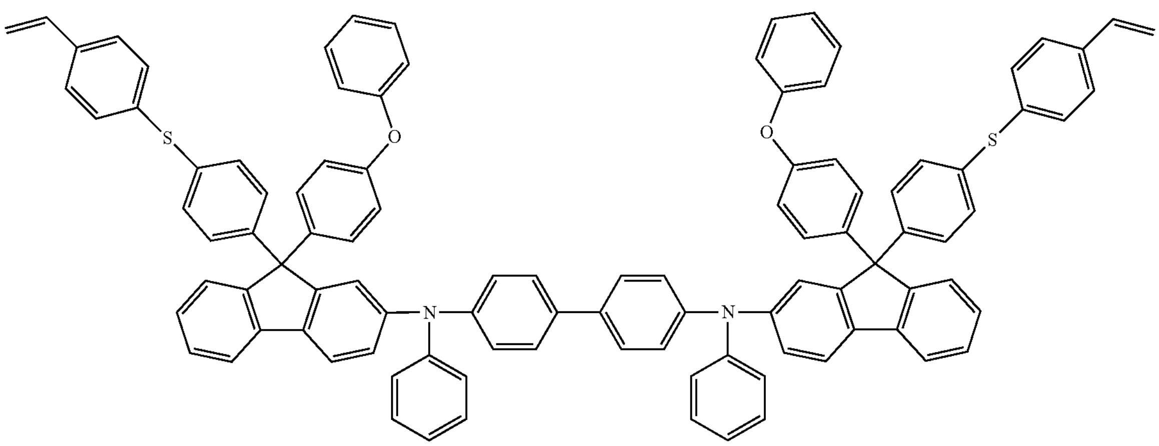
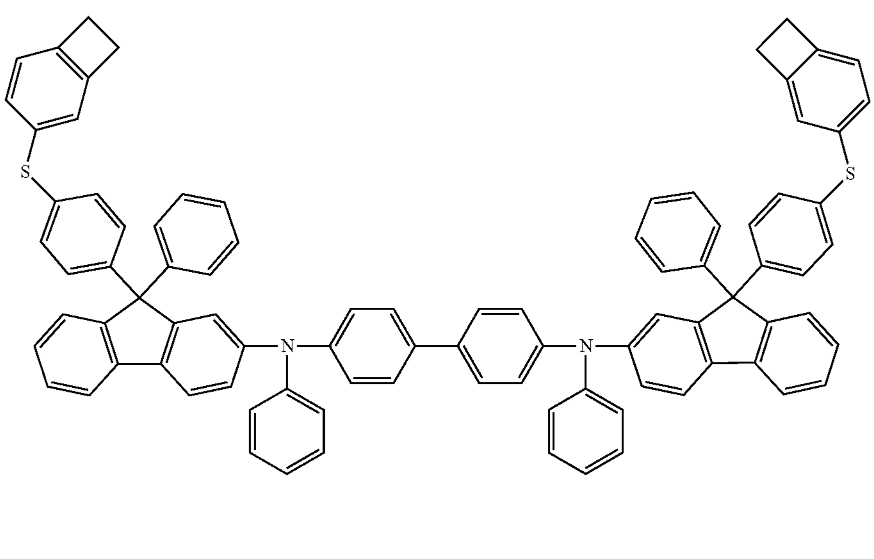

-continued
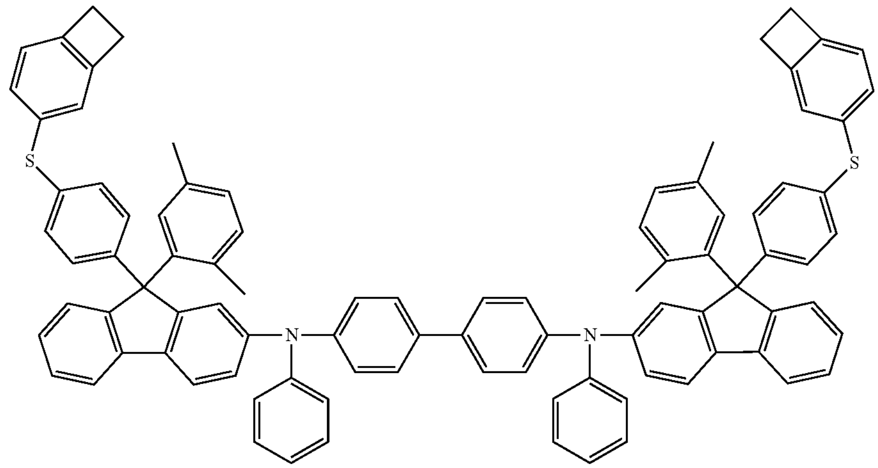
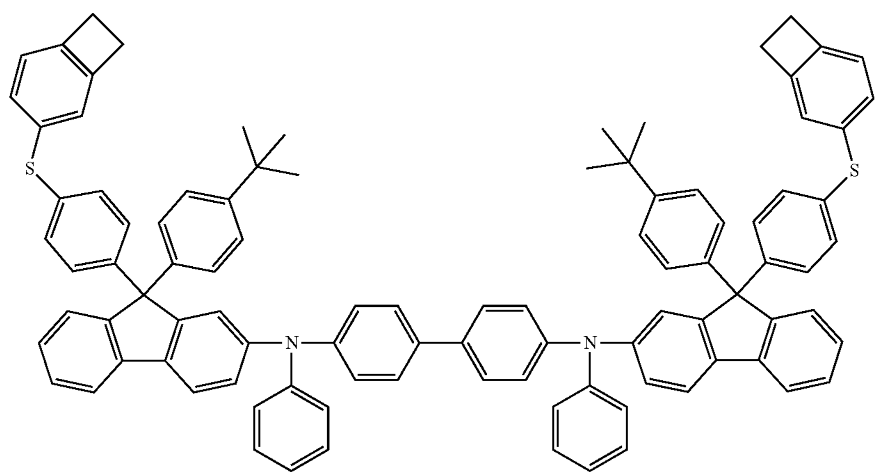
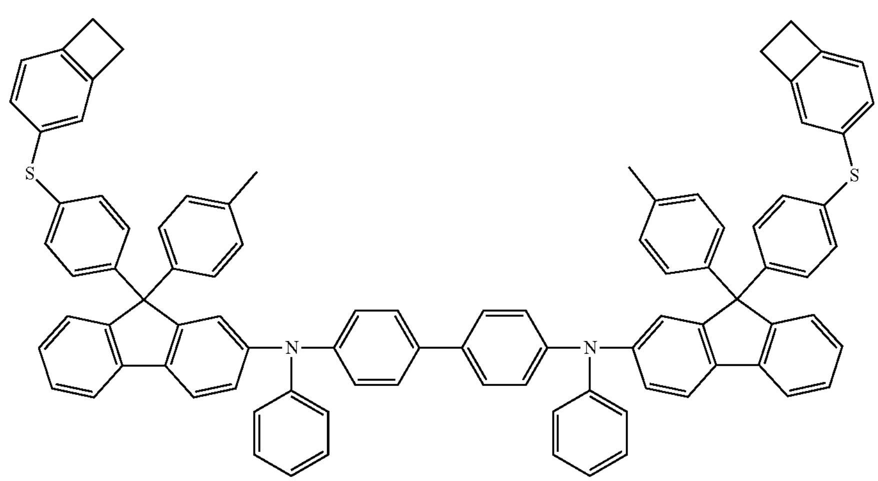

-continued
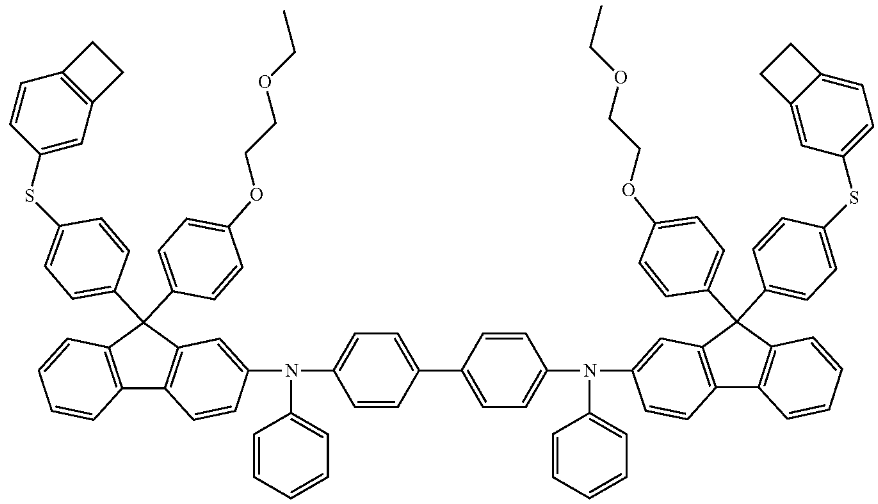
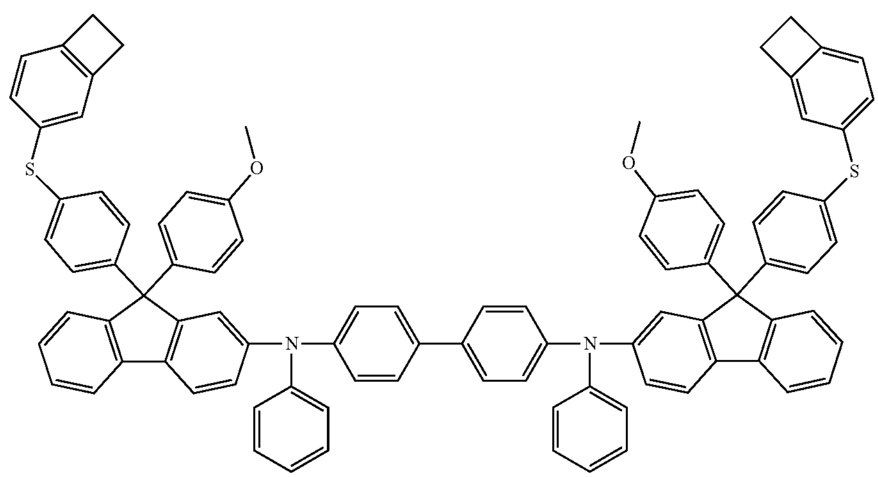
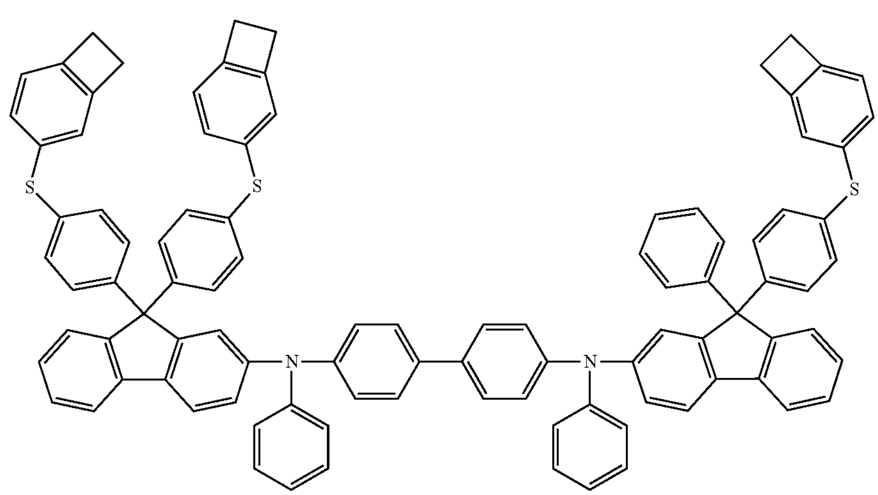

-continued
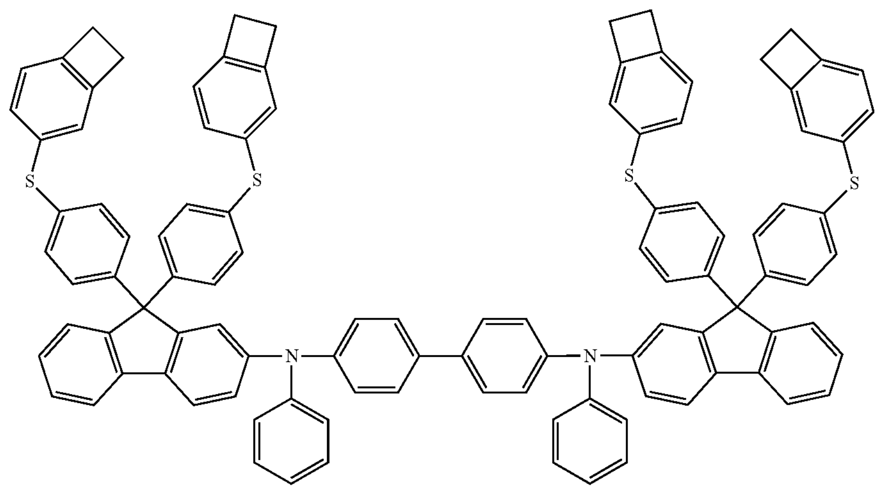
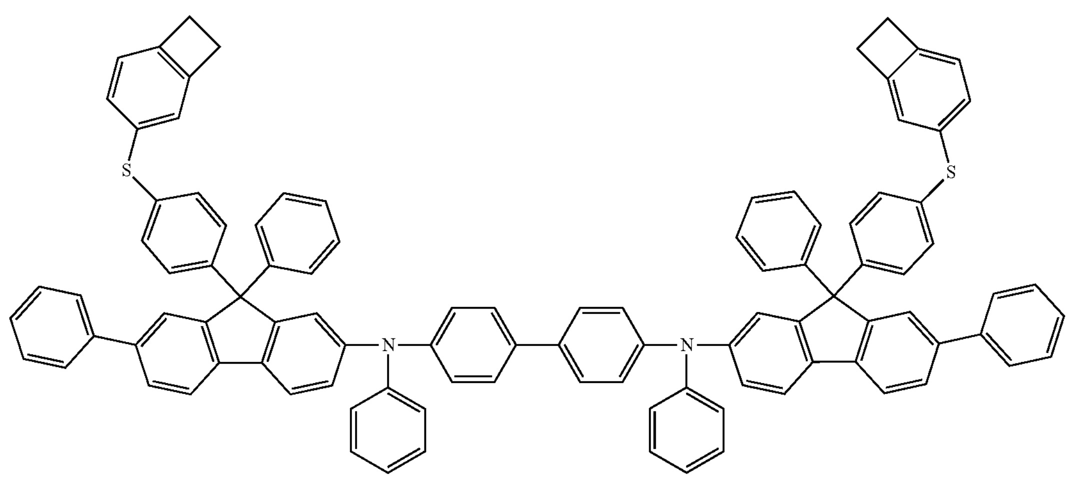
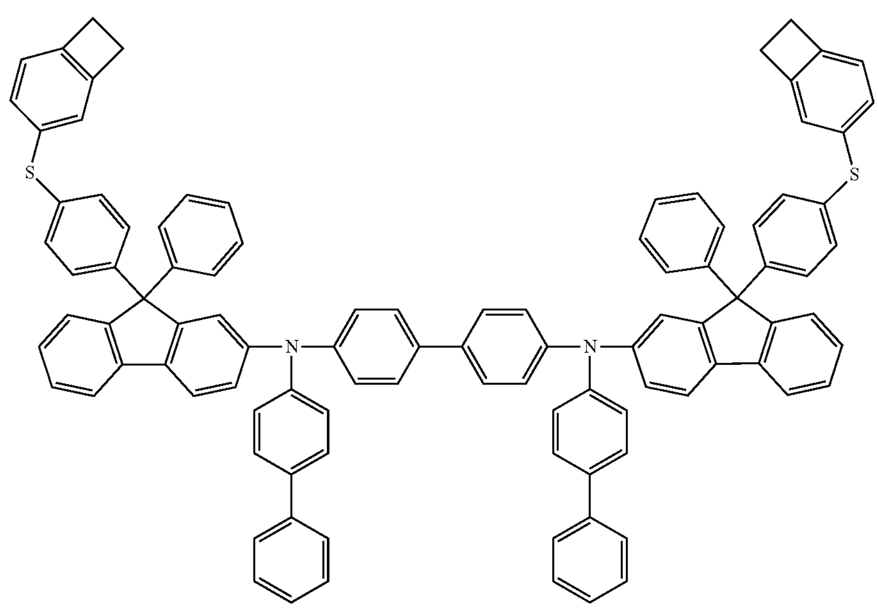

-continued
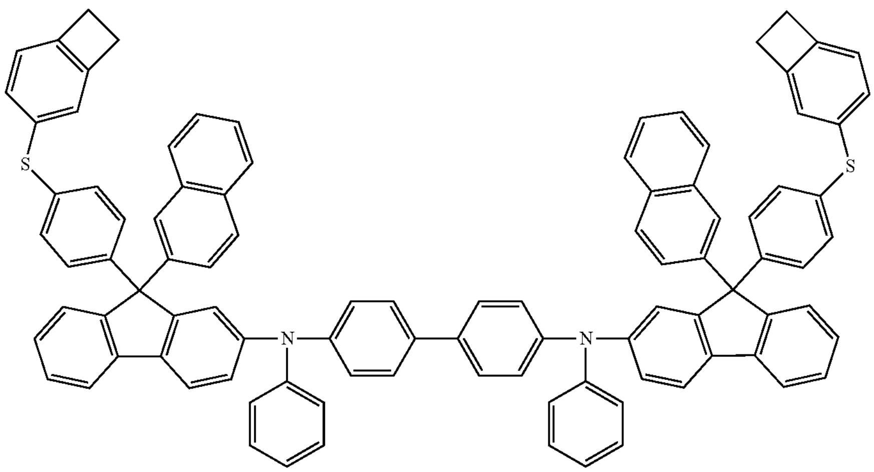
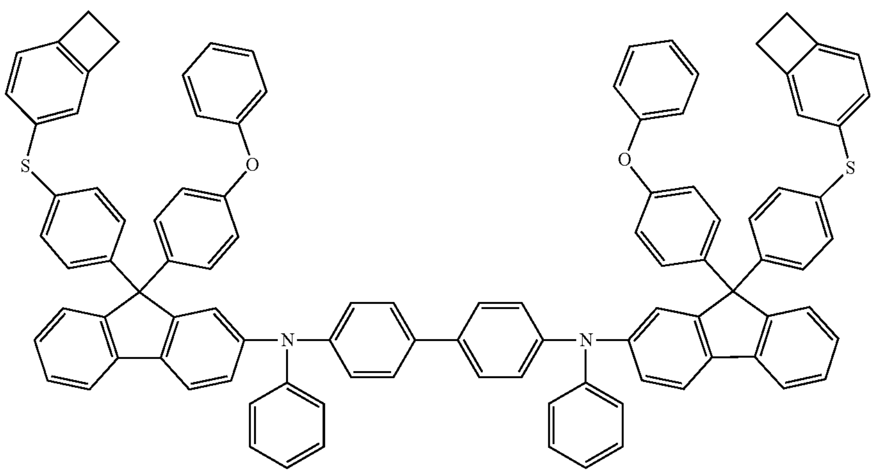
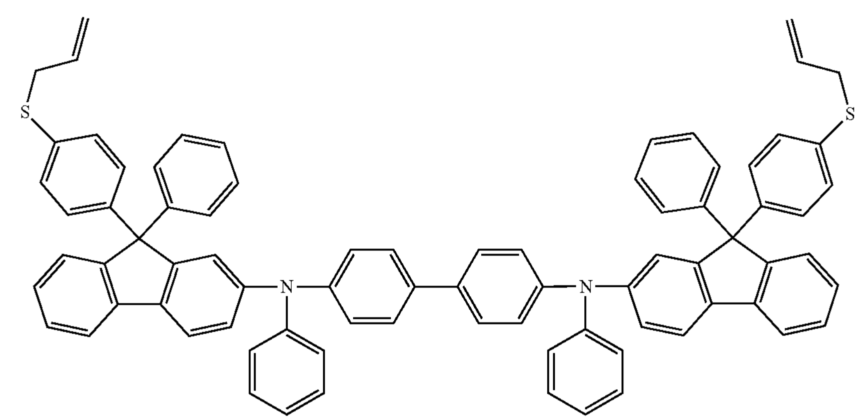

-continued
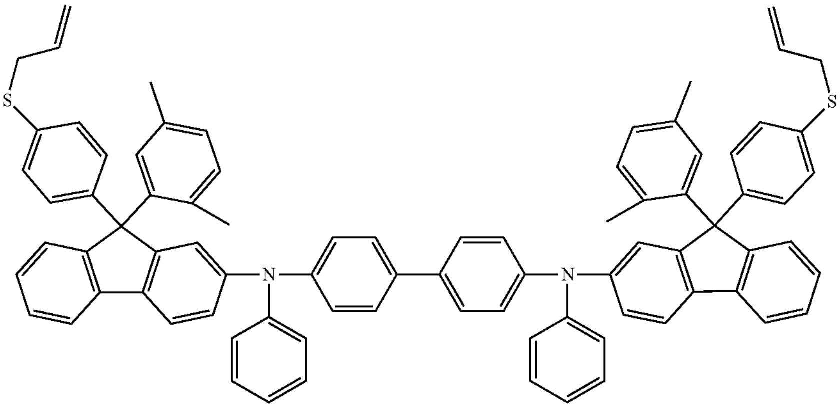
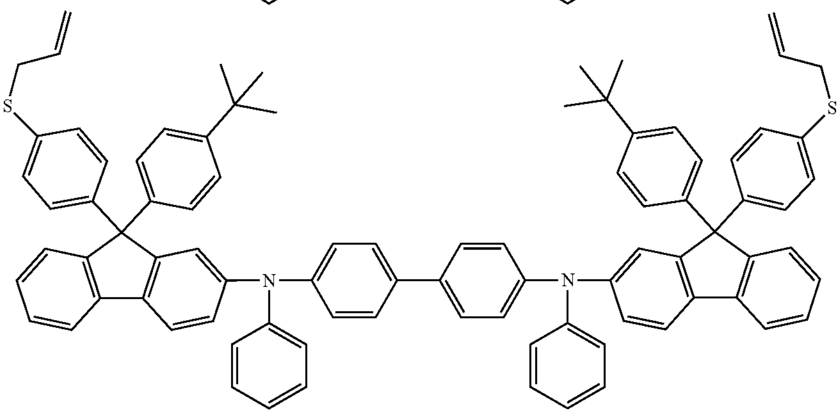
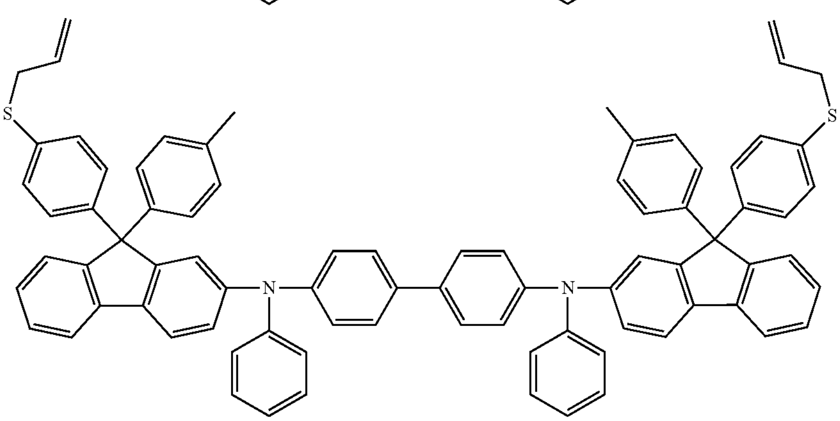
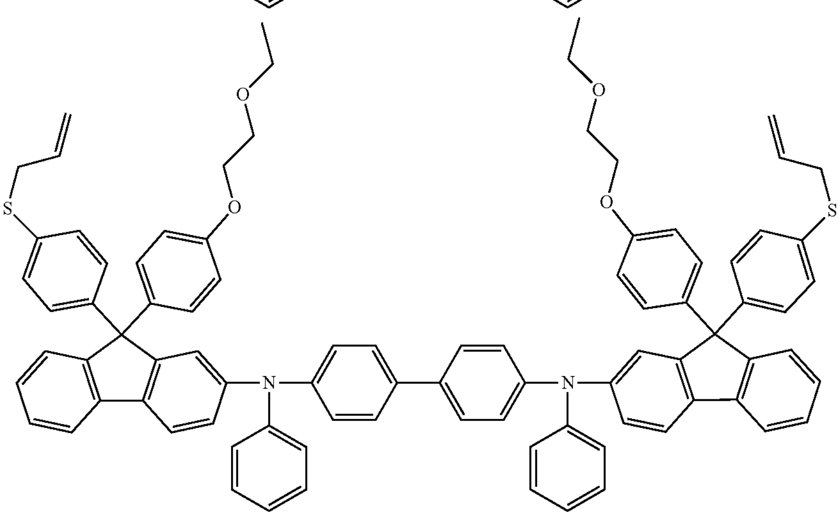

-continued
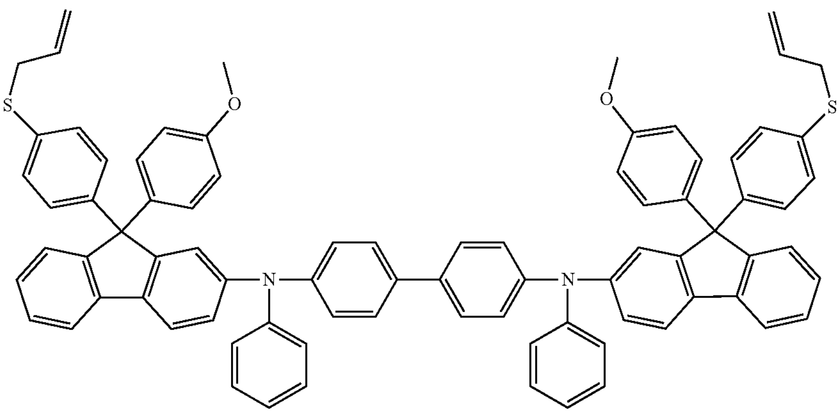
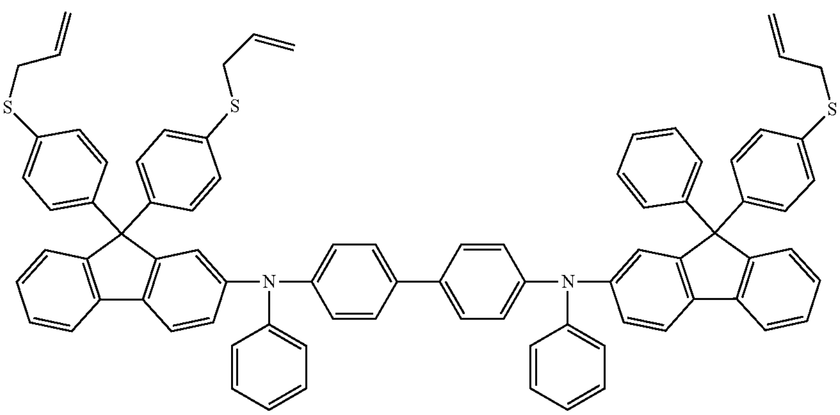
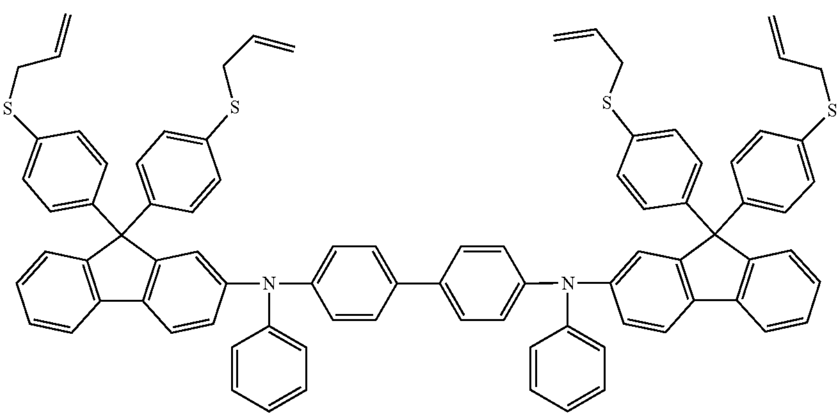
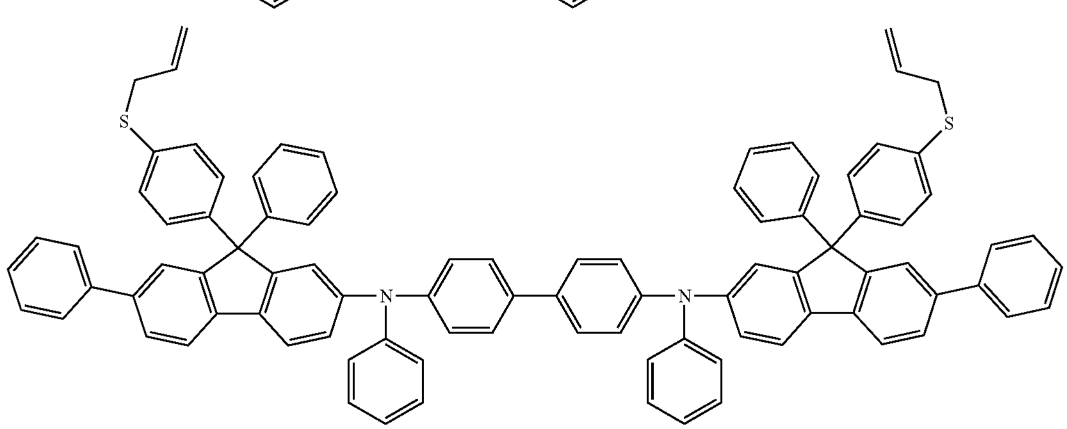

-continued
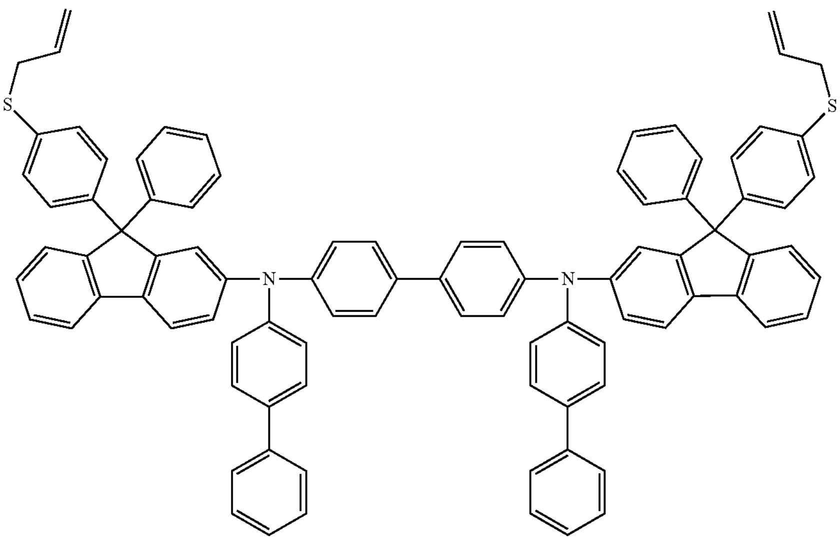
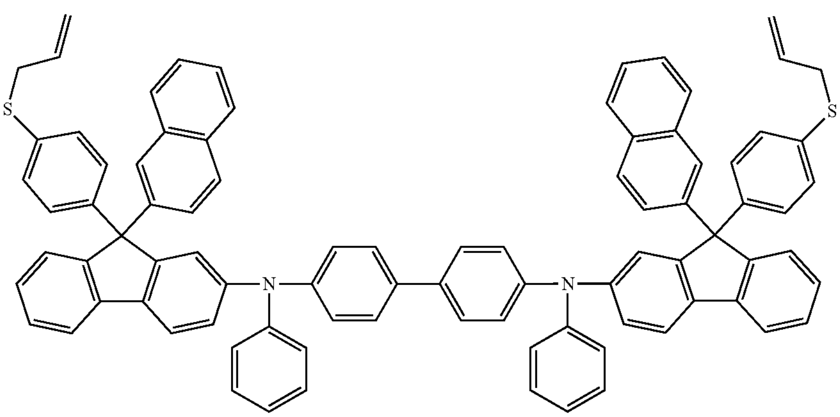
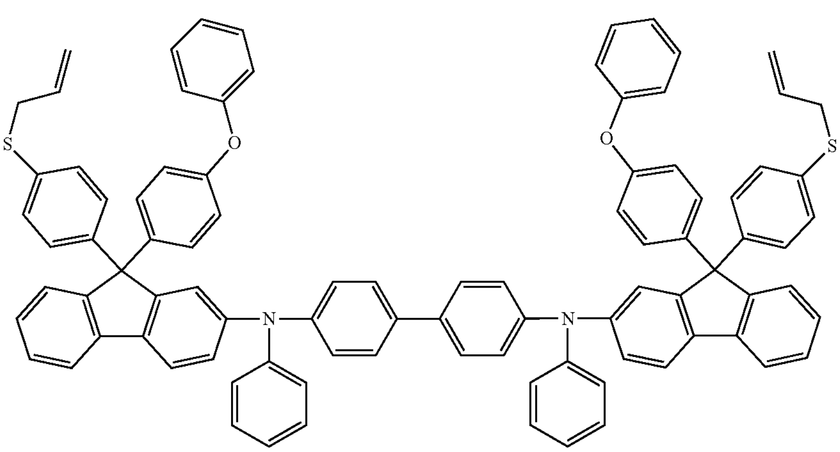

-continued
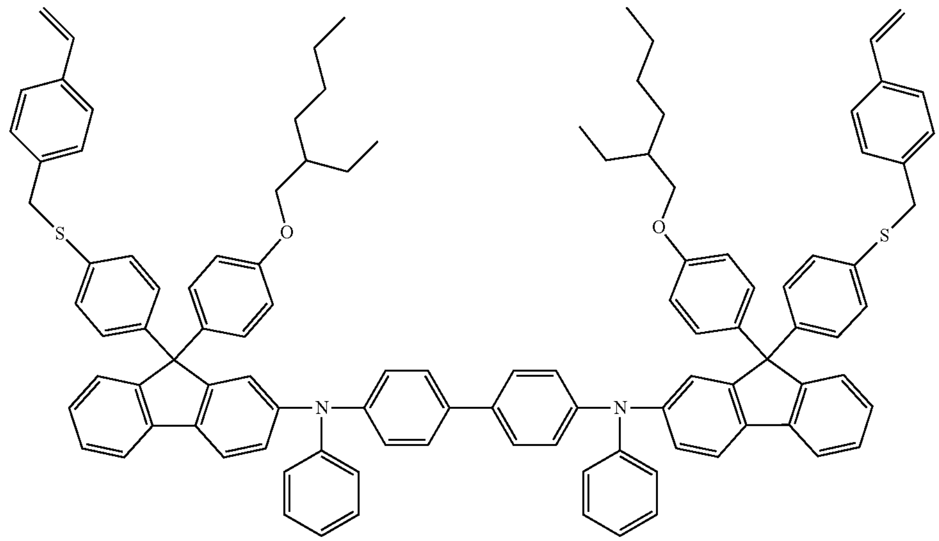
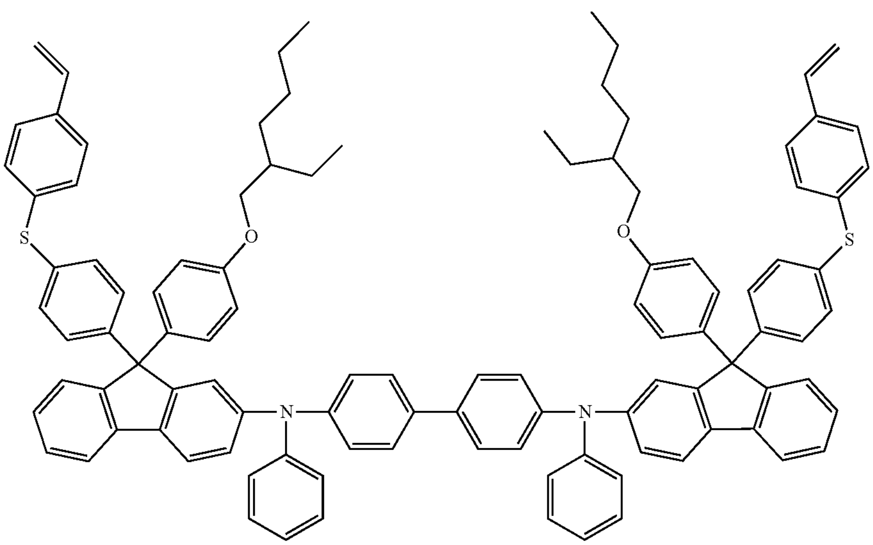
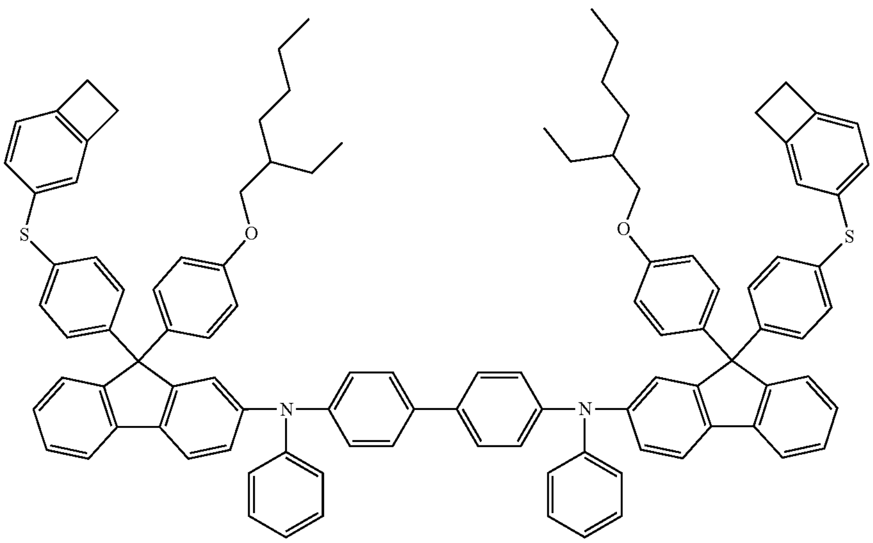

-continued
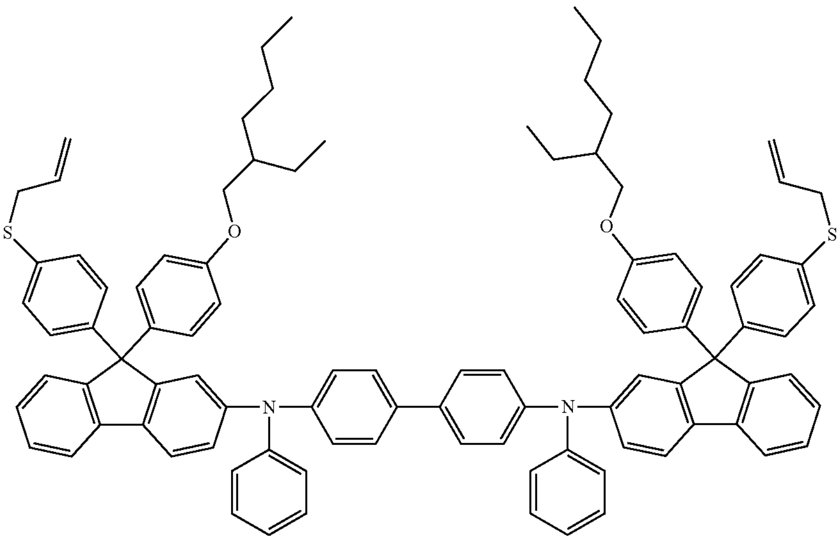
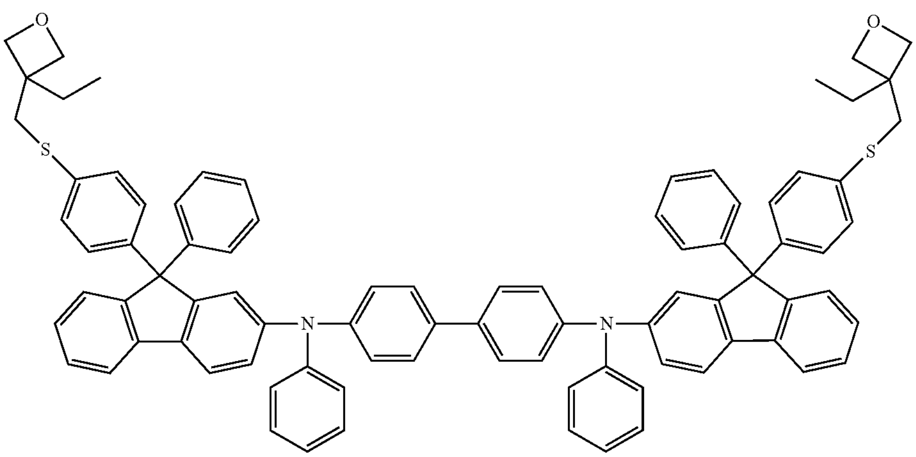
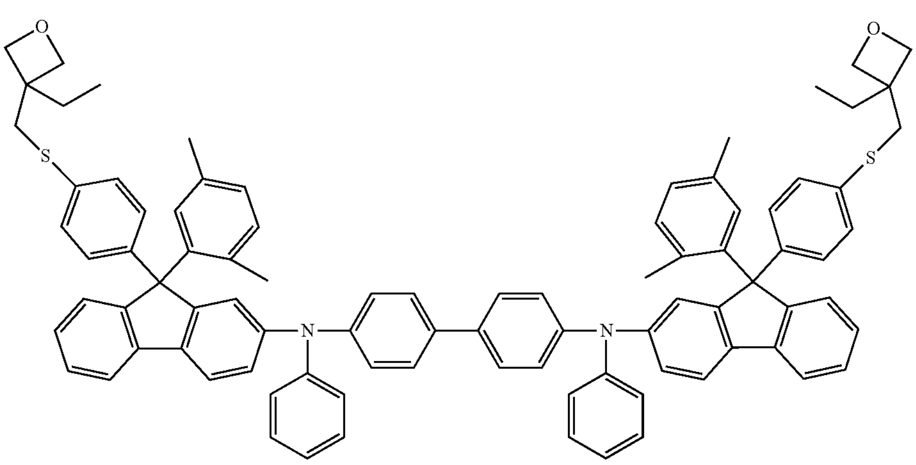

-continued
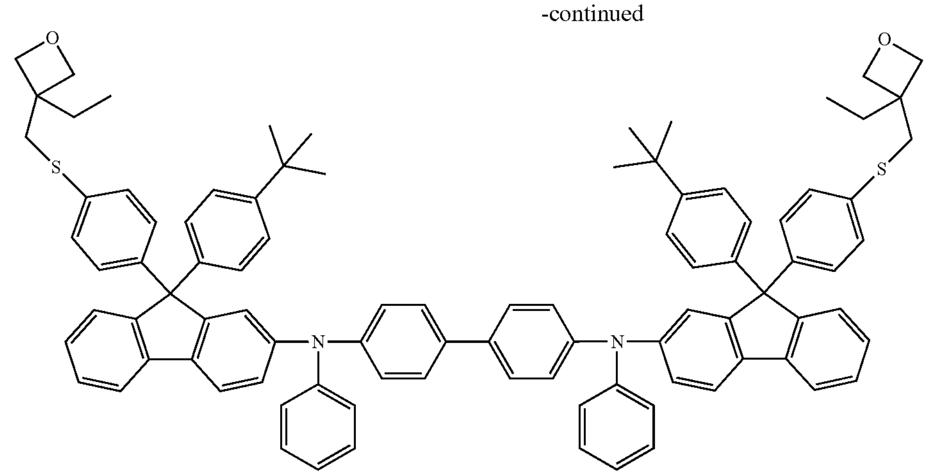
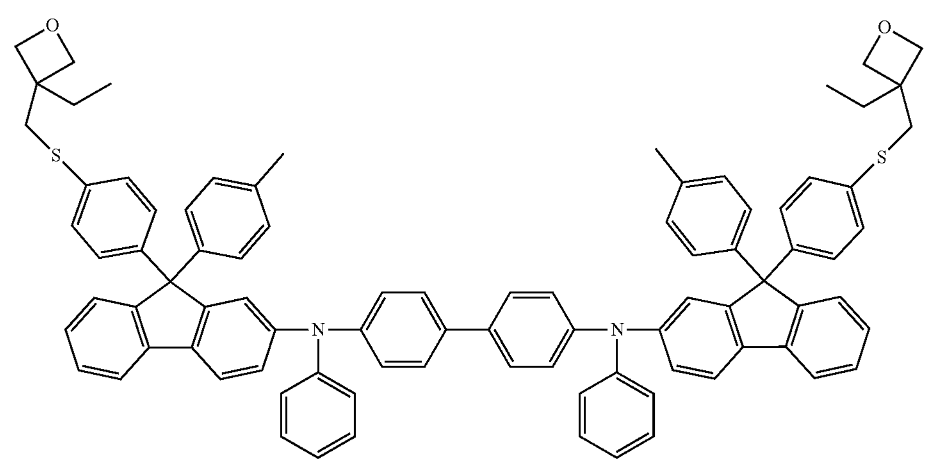
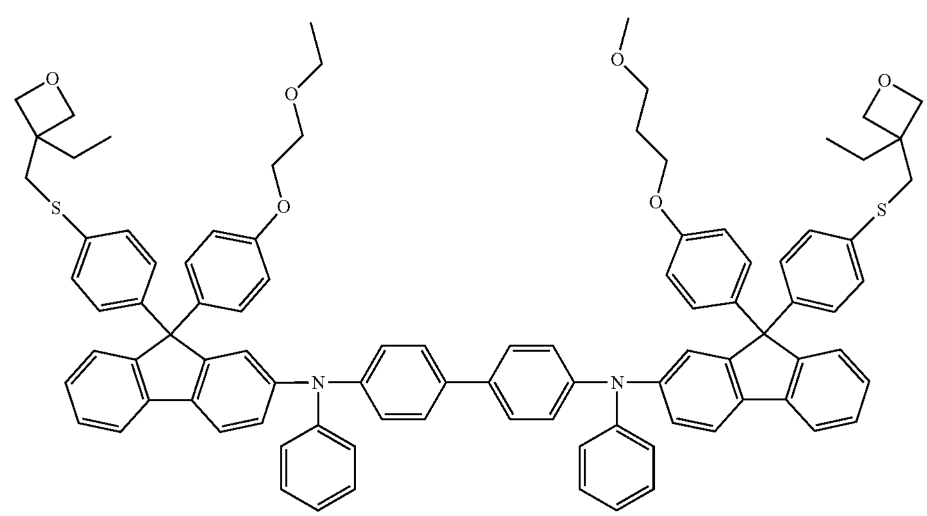

-continued
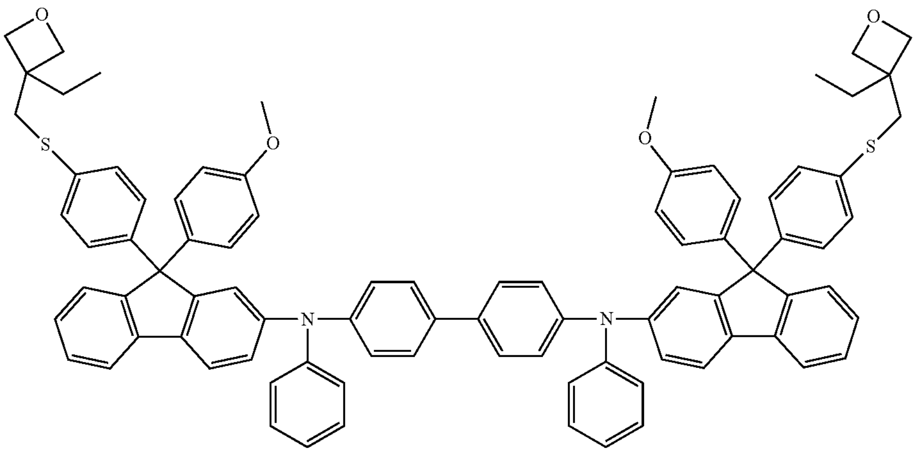
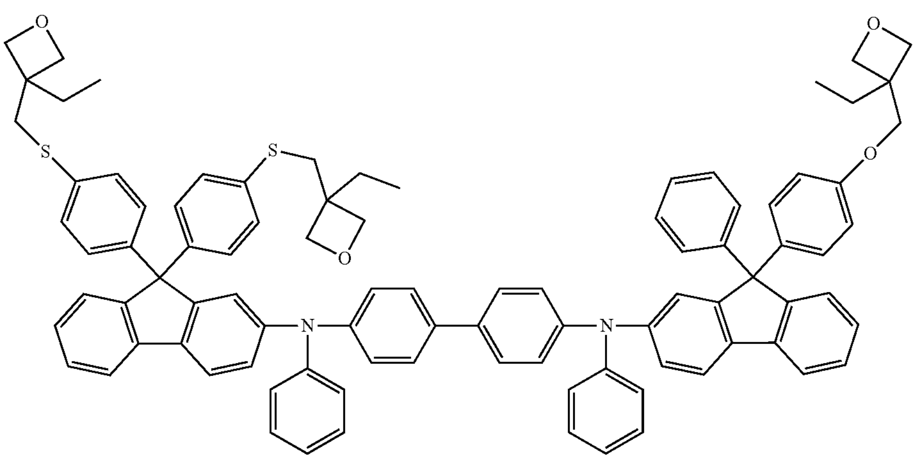
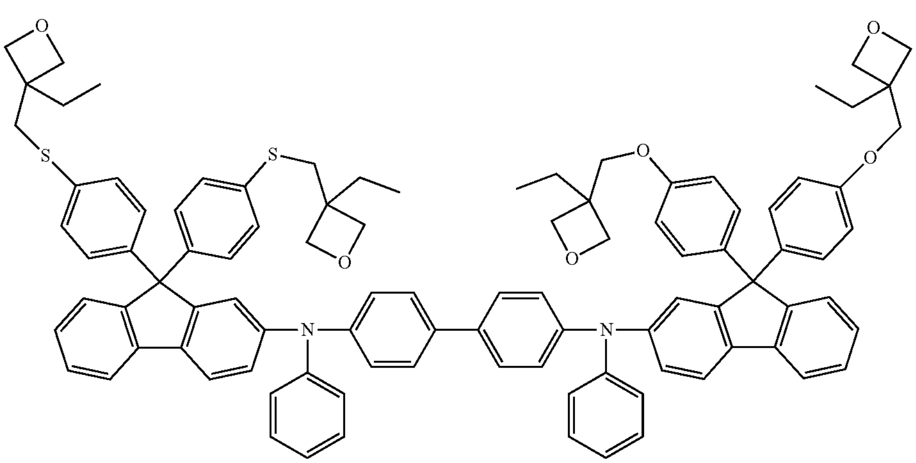

-continued
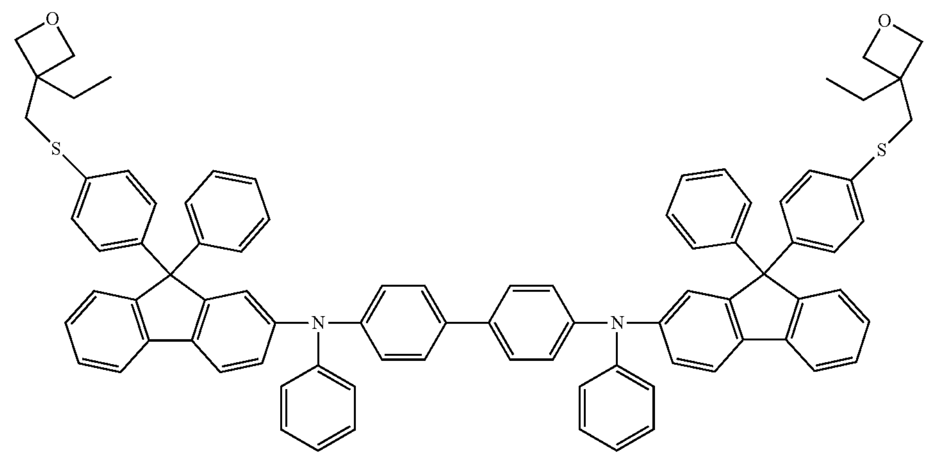
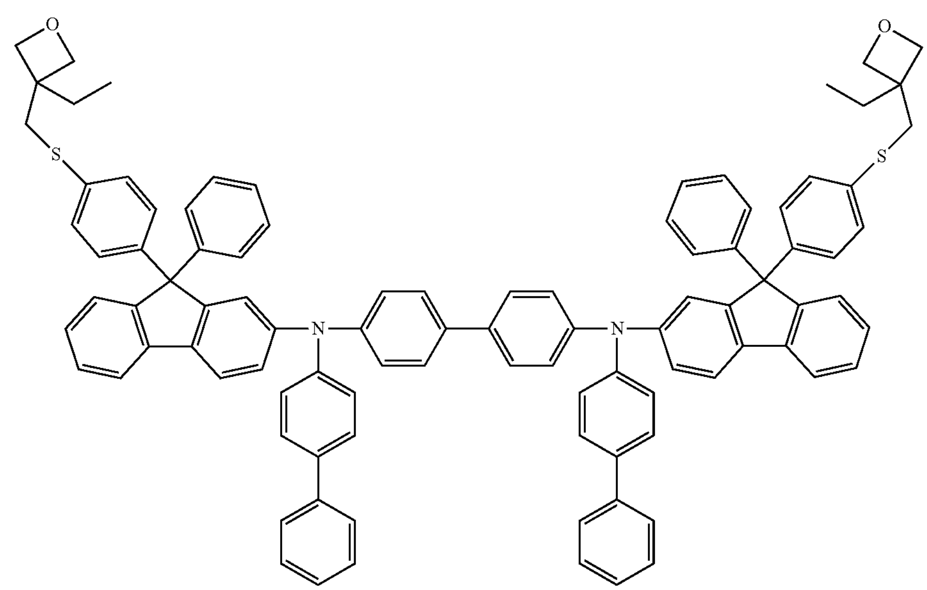
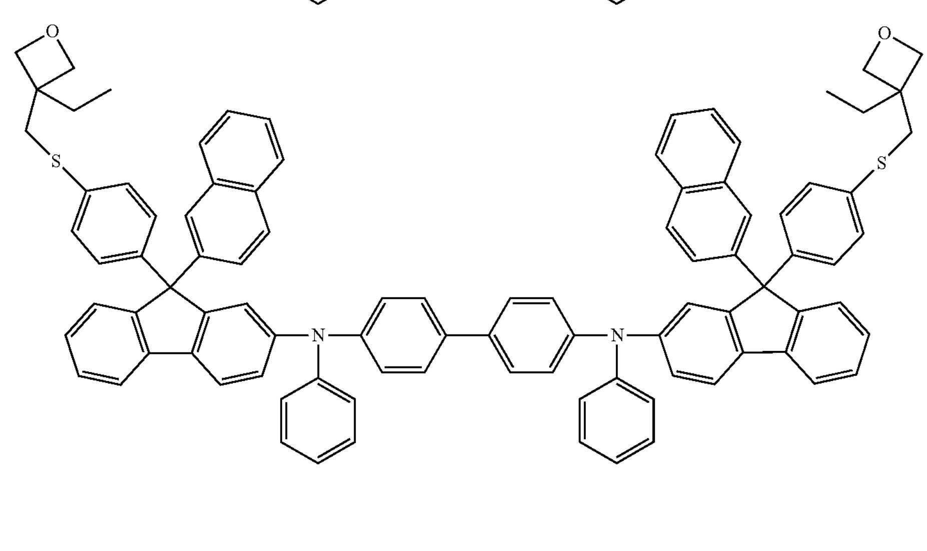

-continued
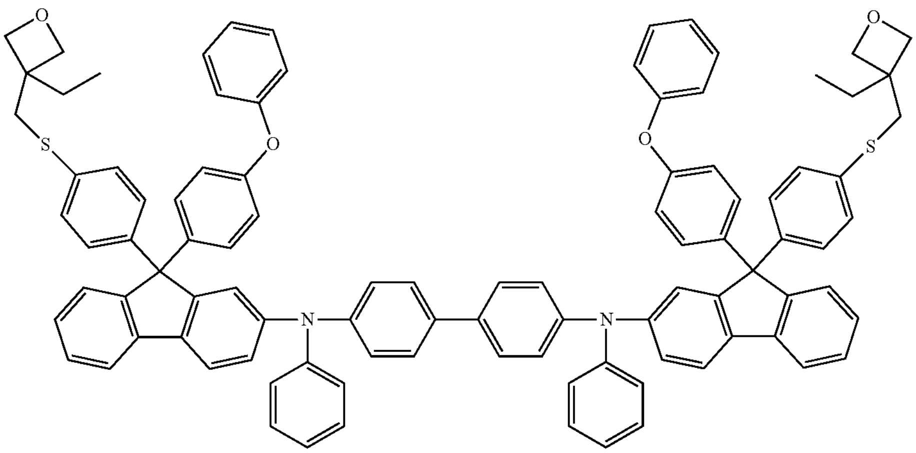
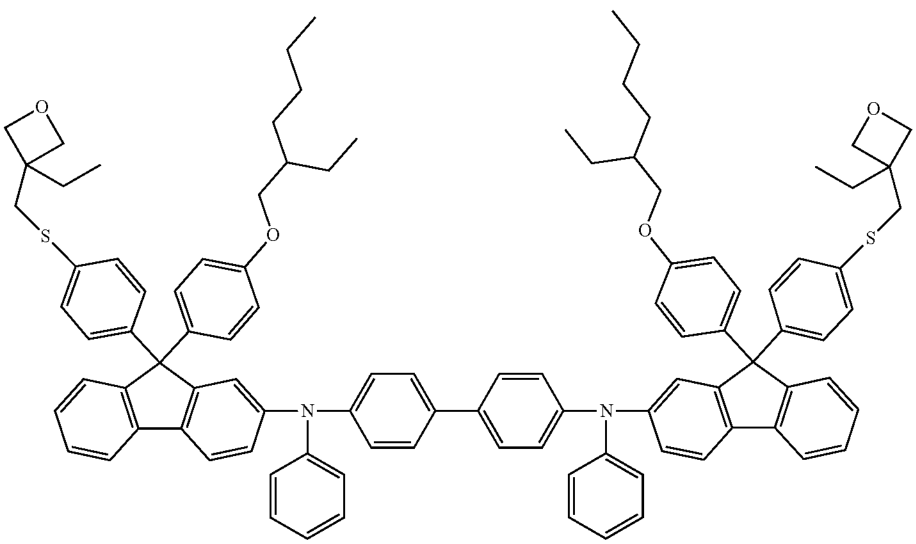
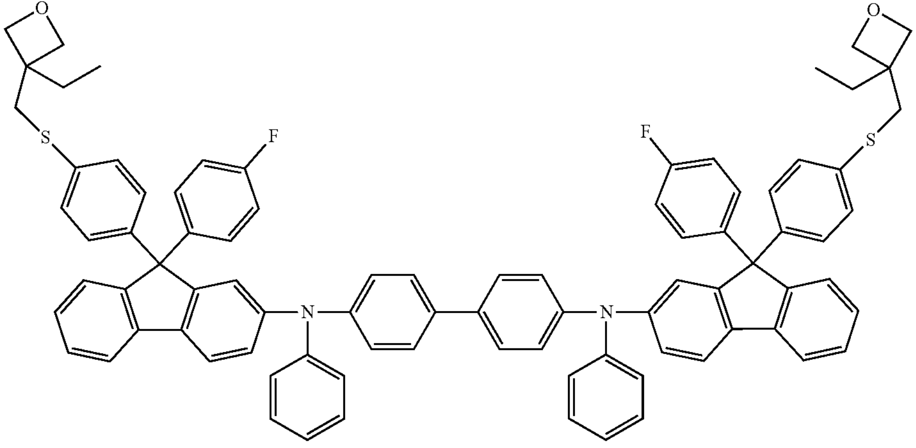

-continued
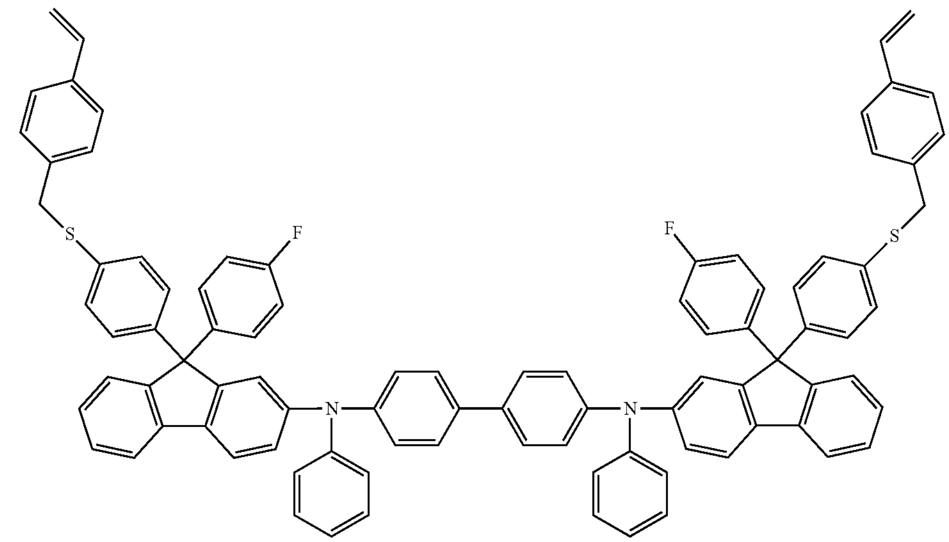
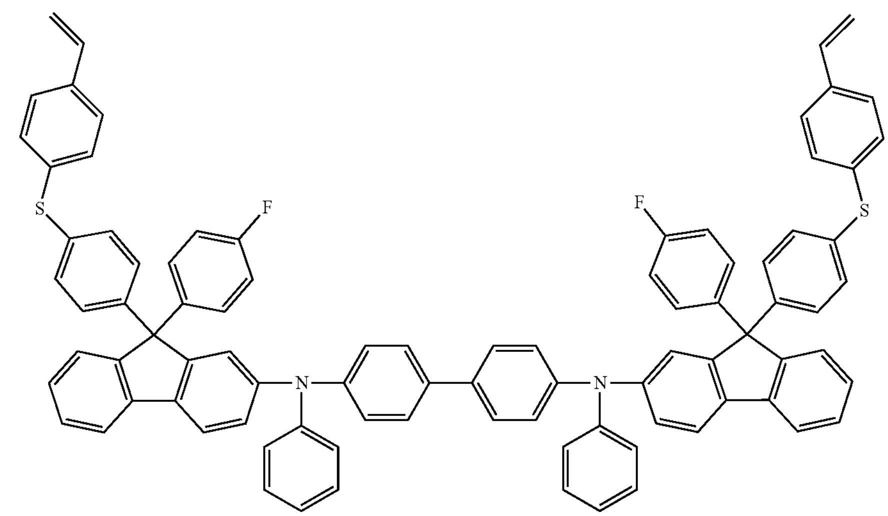
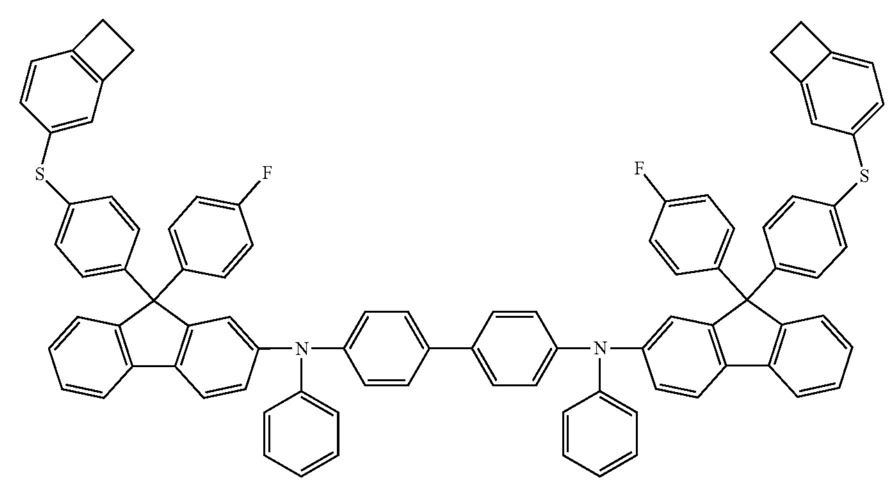

-continued
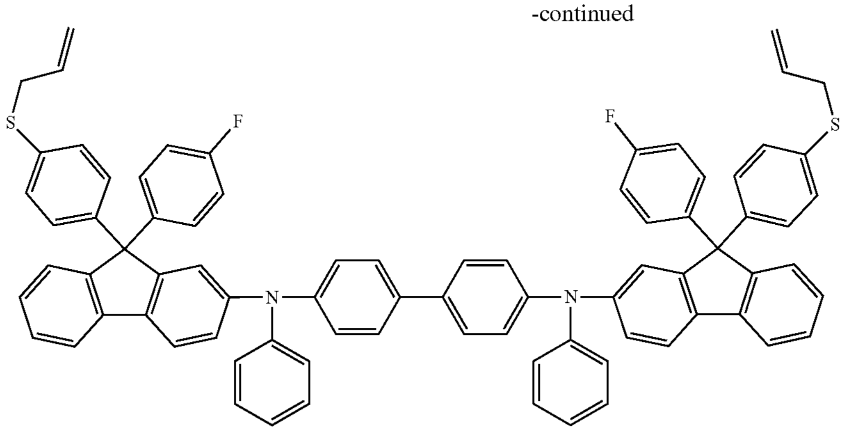
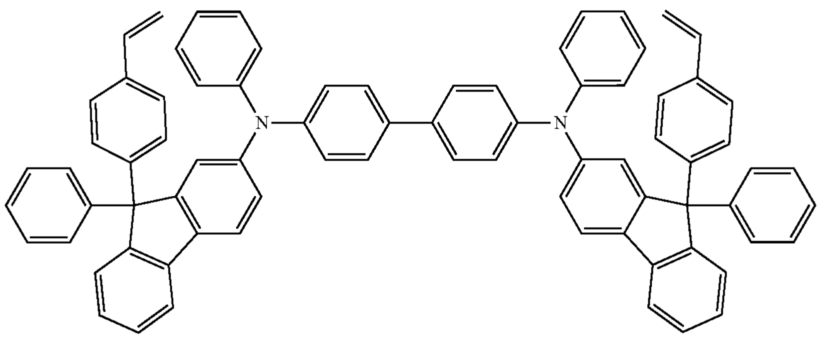
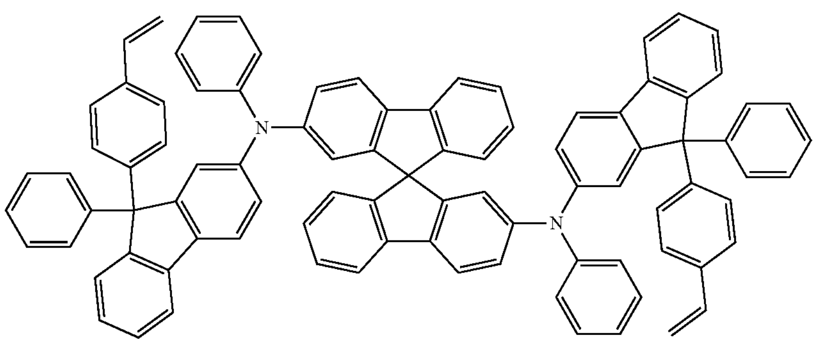
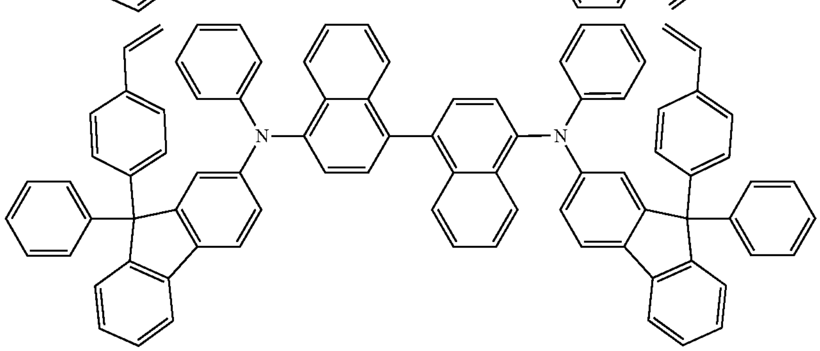

-continued
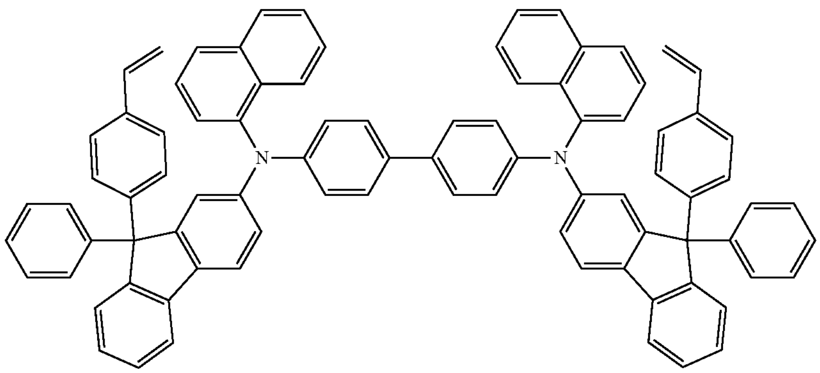
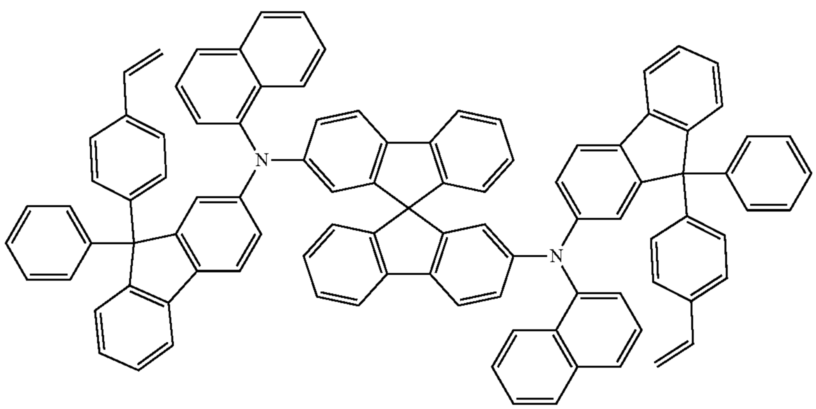
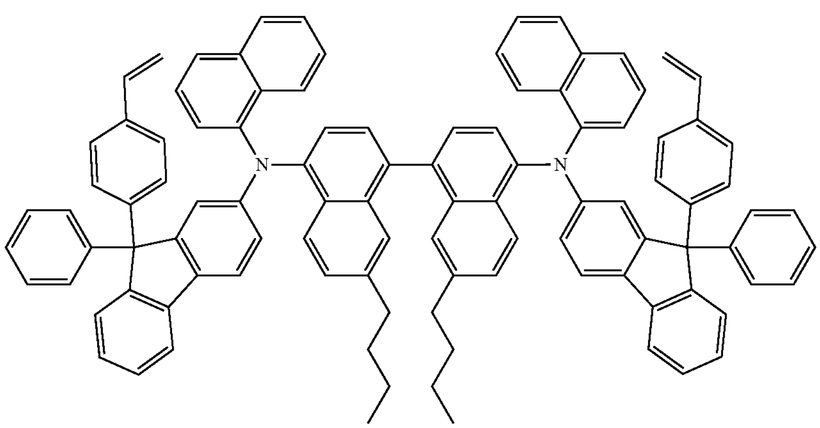
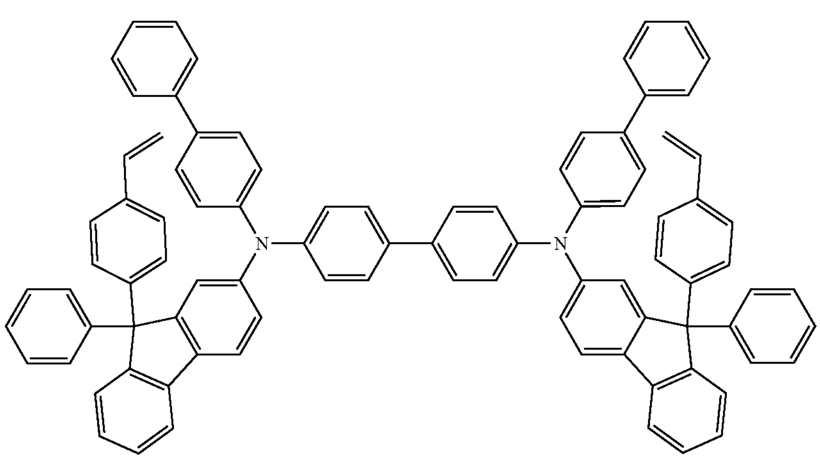

-continued
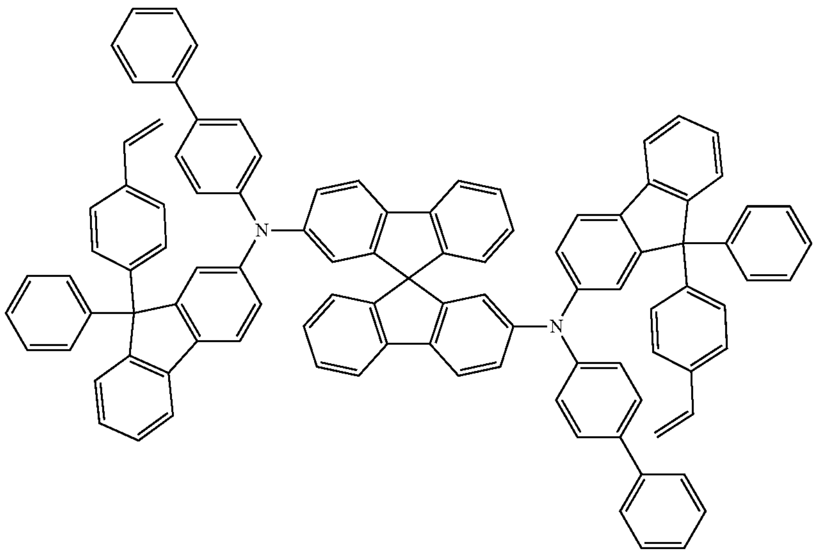
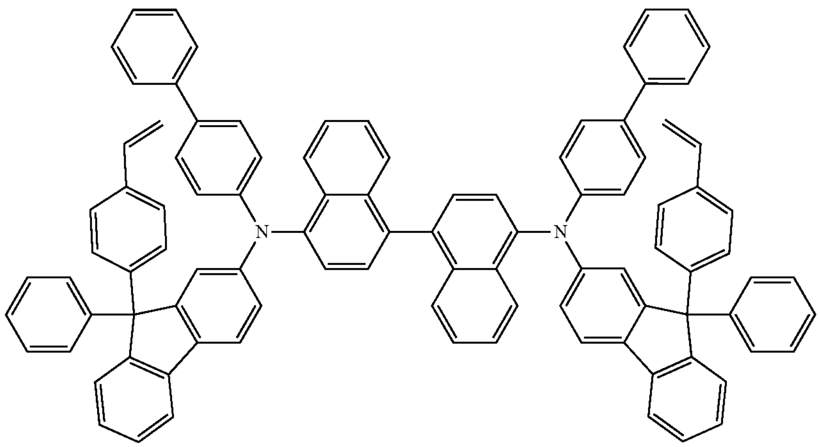
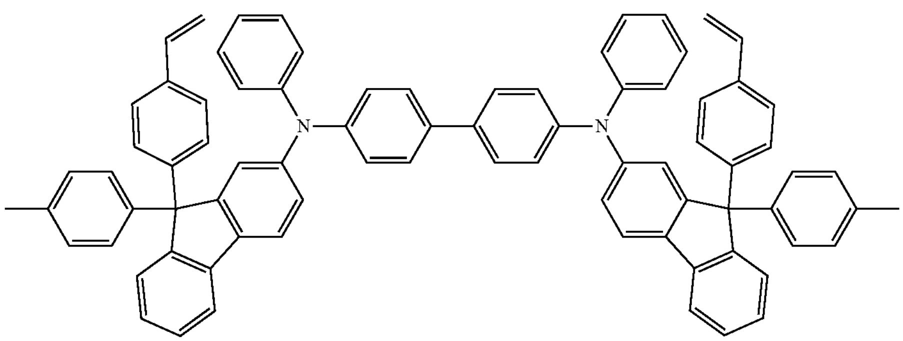
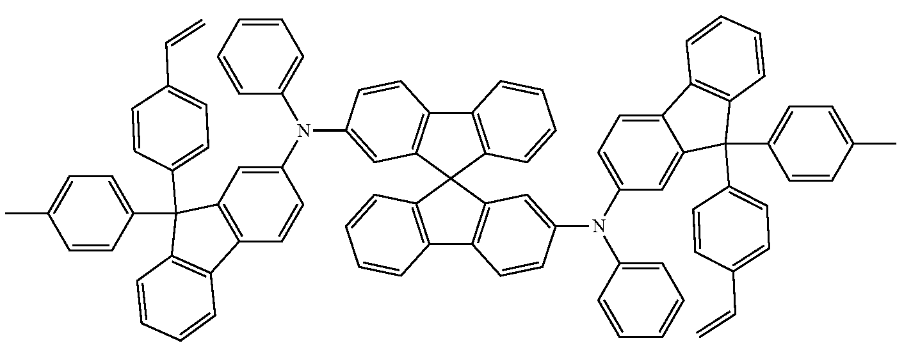

-continued
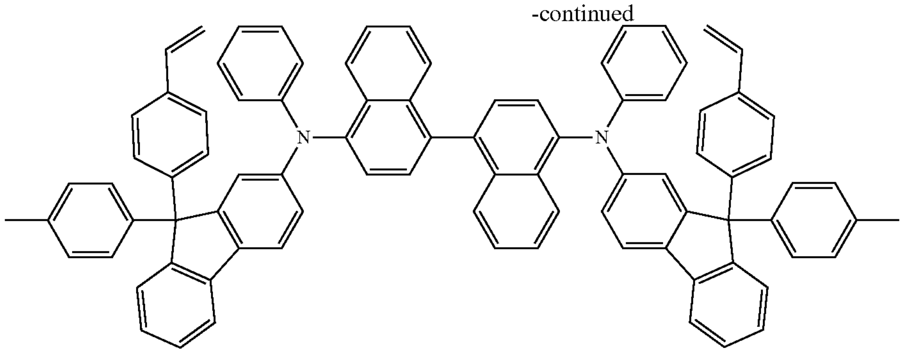
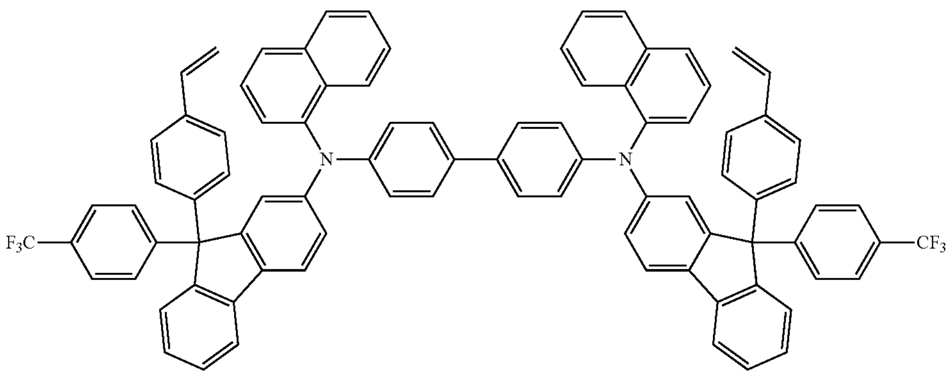
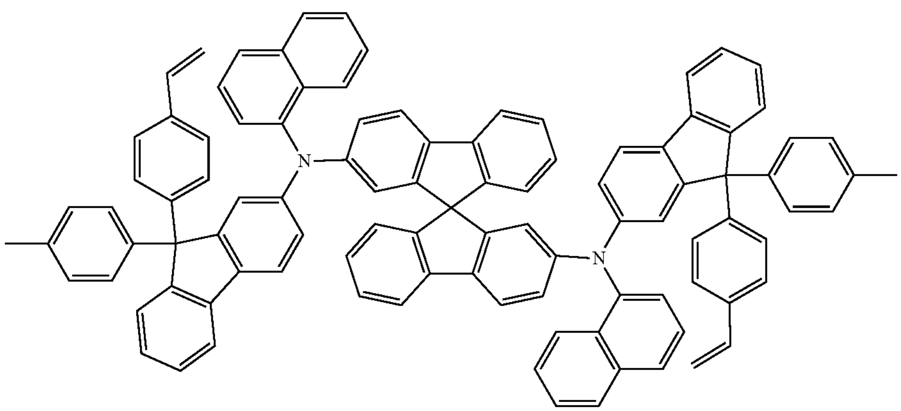
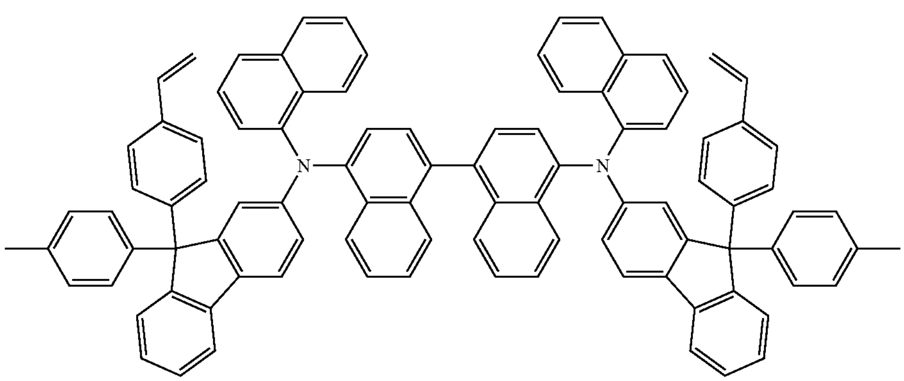

-continued
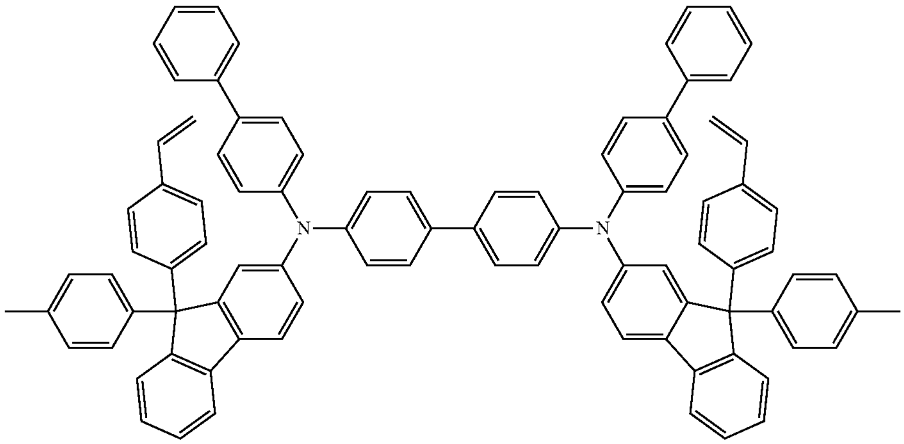
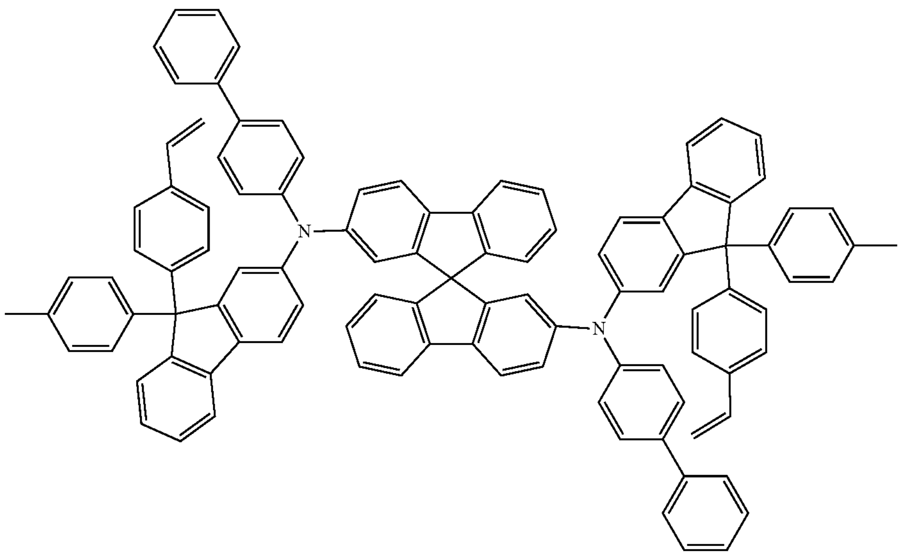
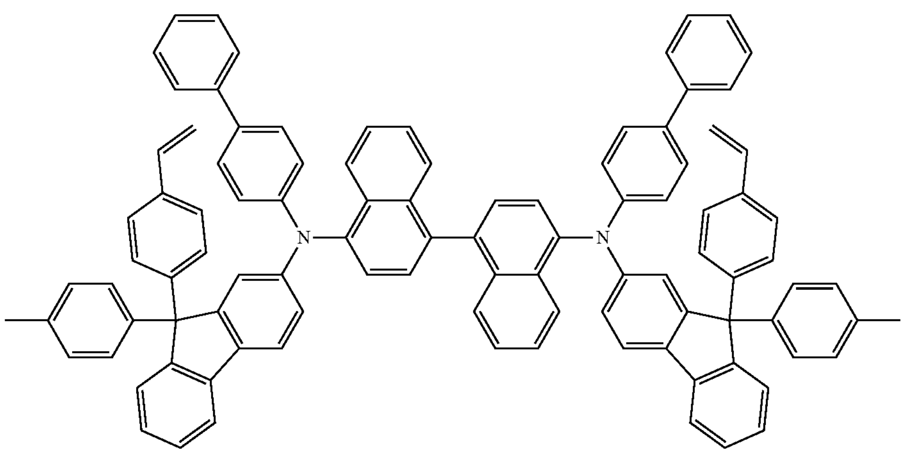

-continued
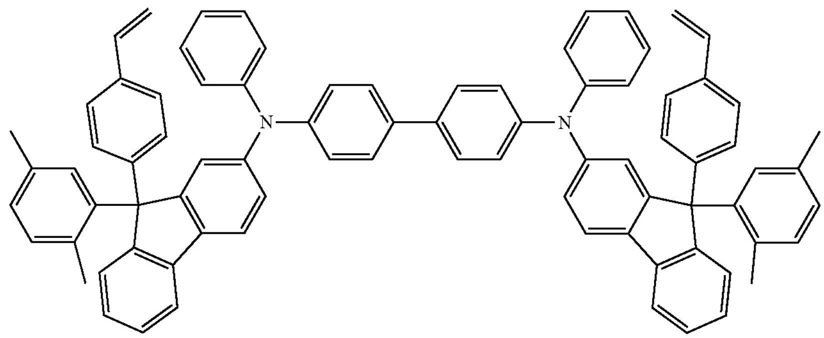
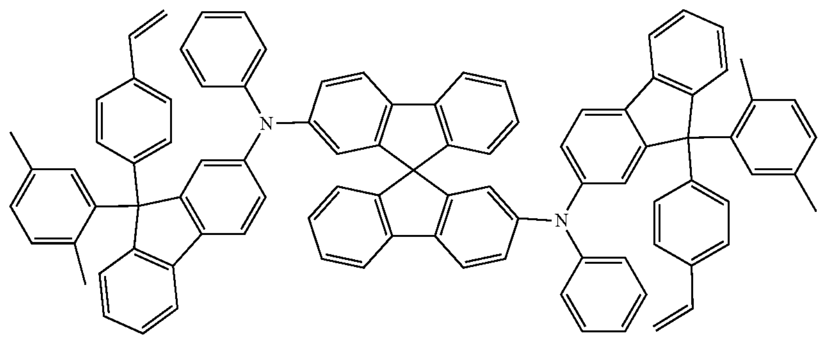
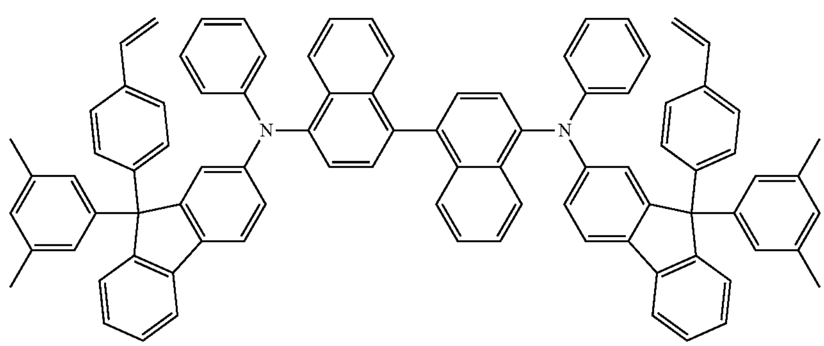
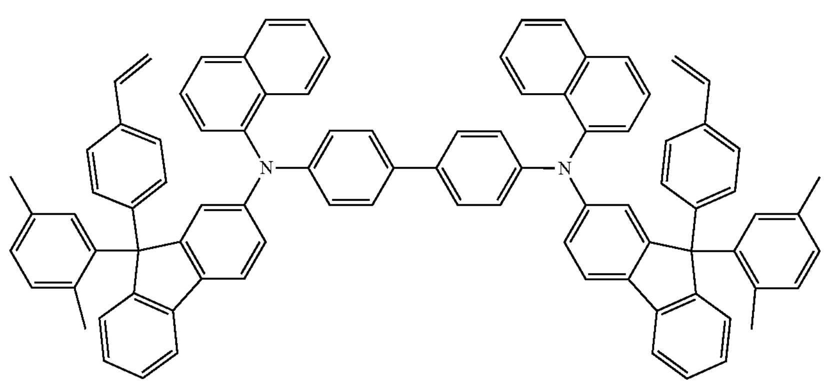

-continued
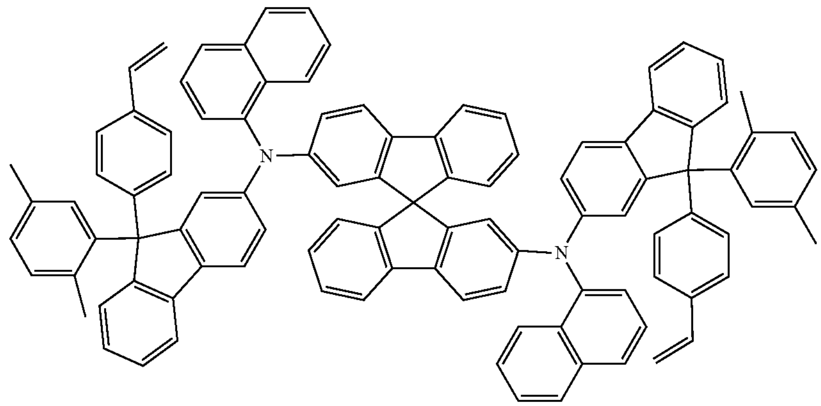
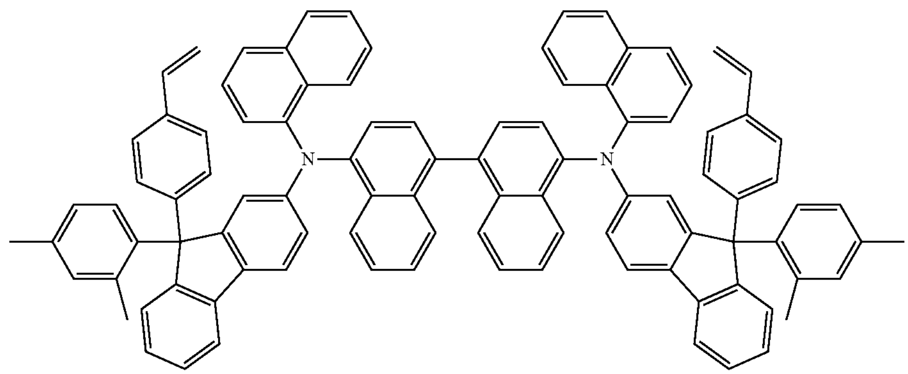
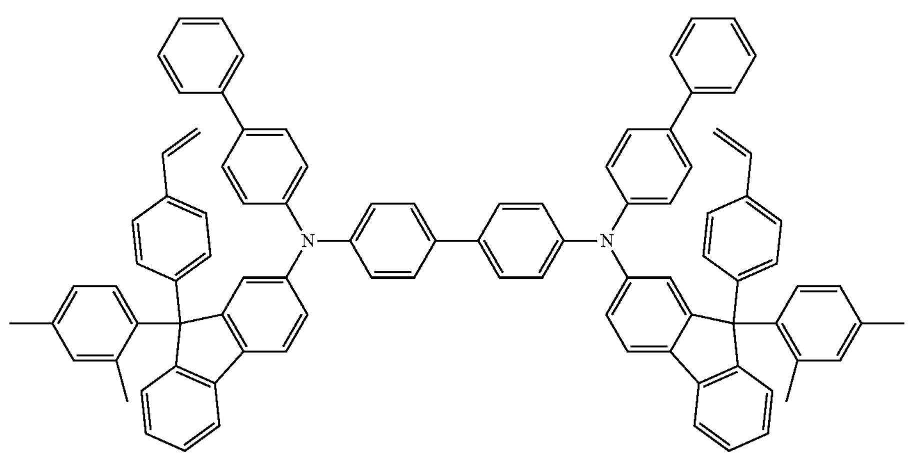

-continued
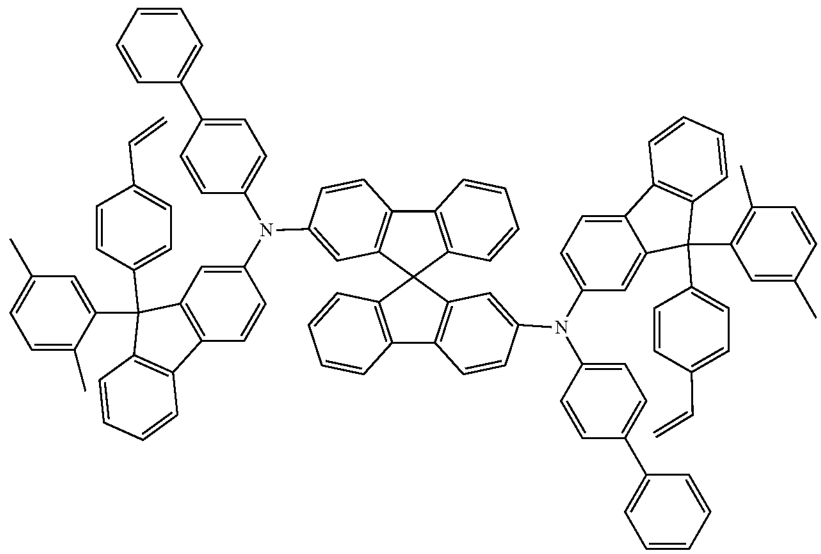
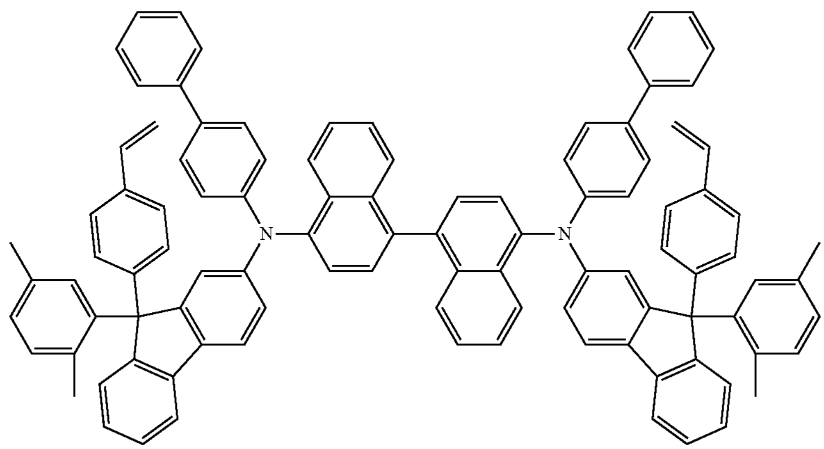
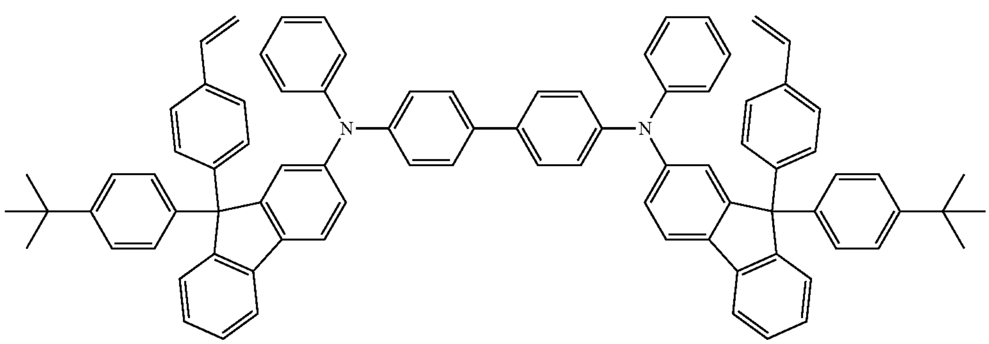
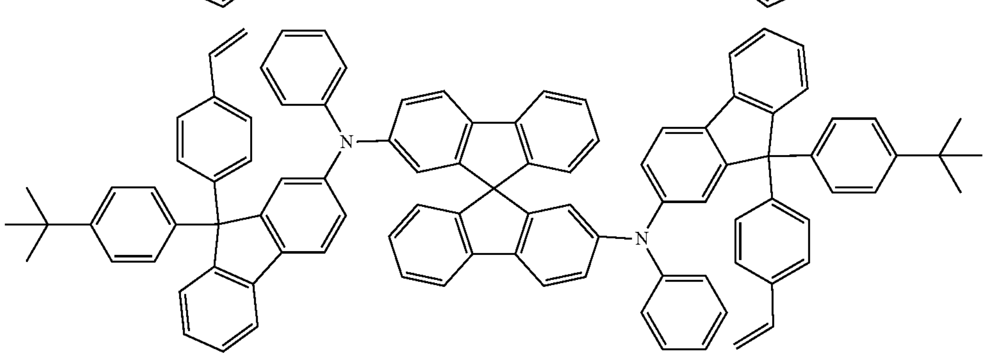

-continued
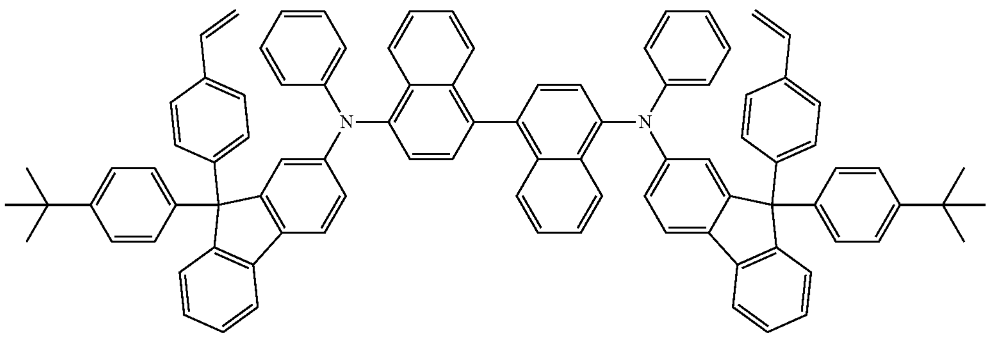
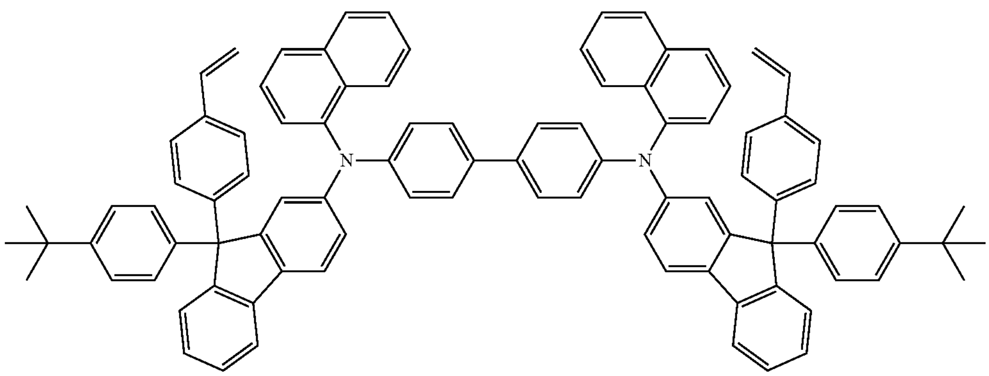
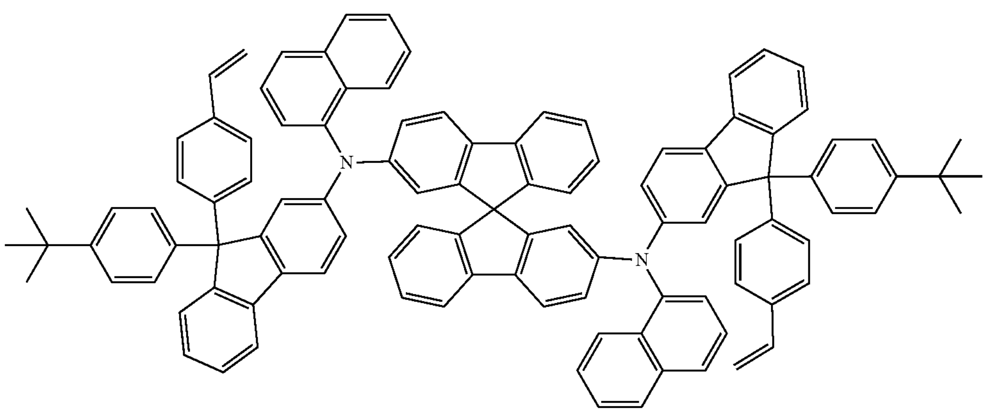
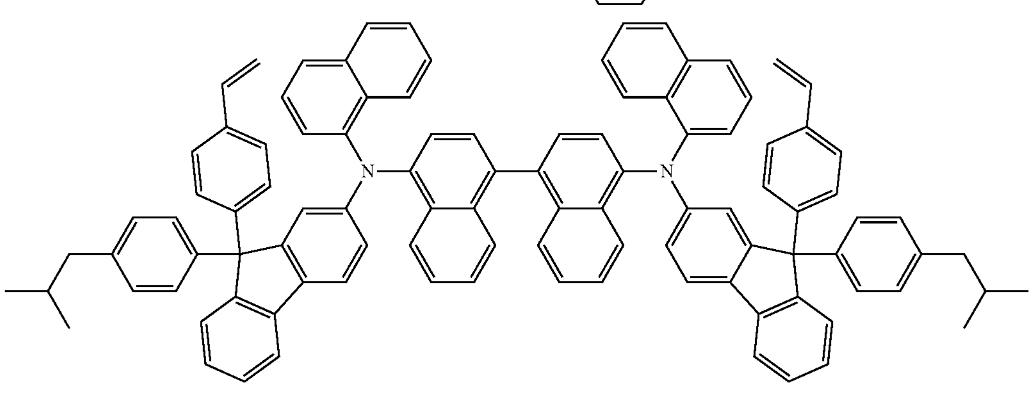

-continued
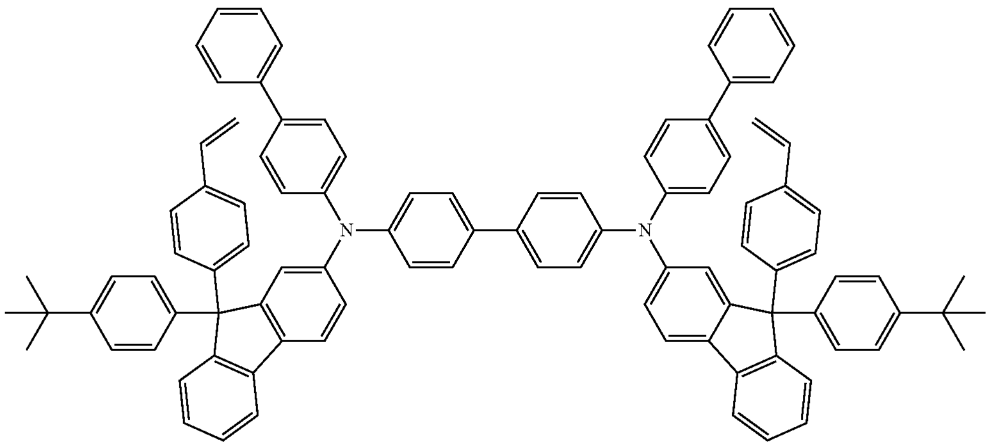
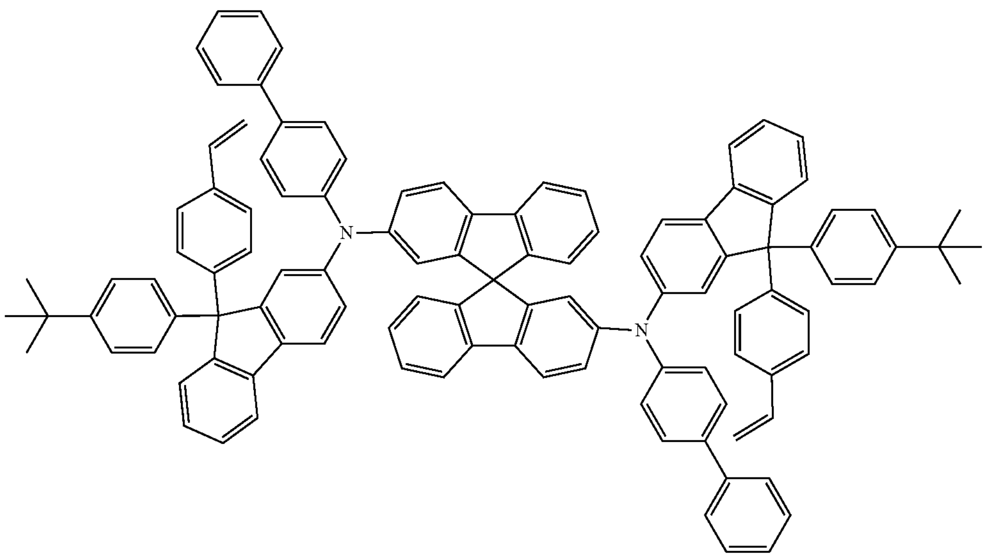
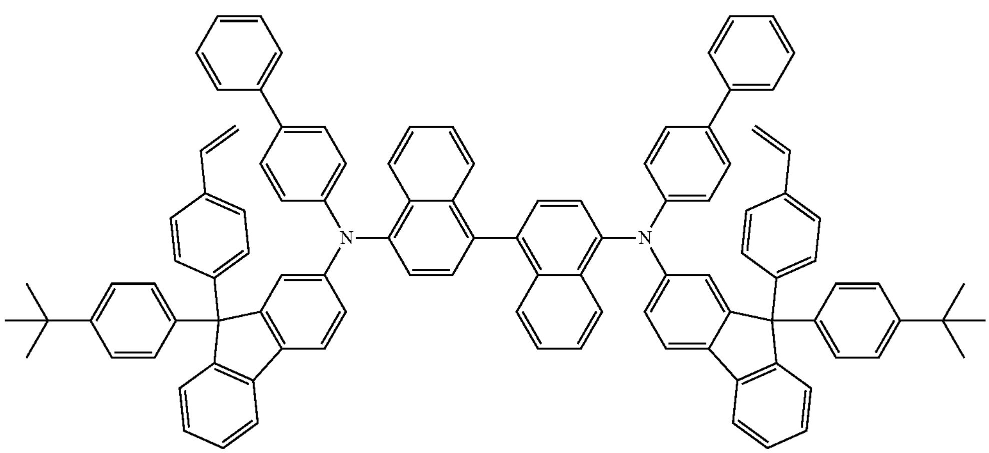

-continued
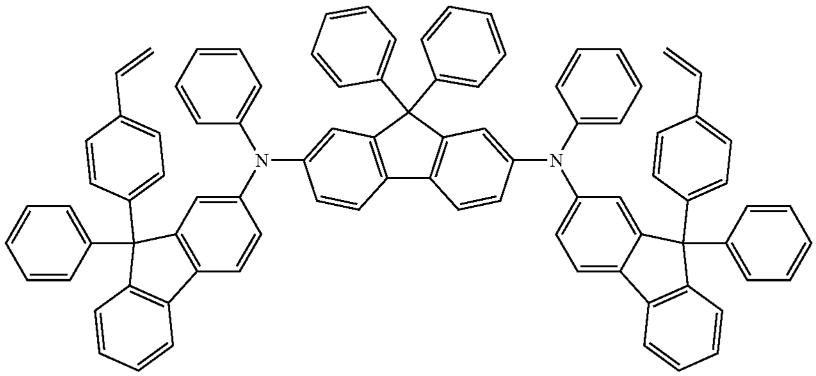
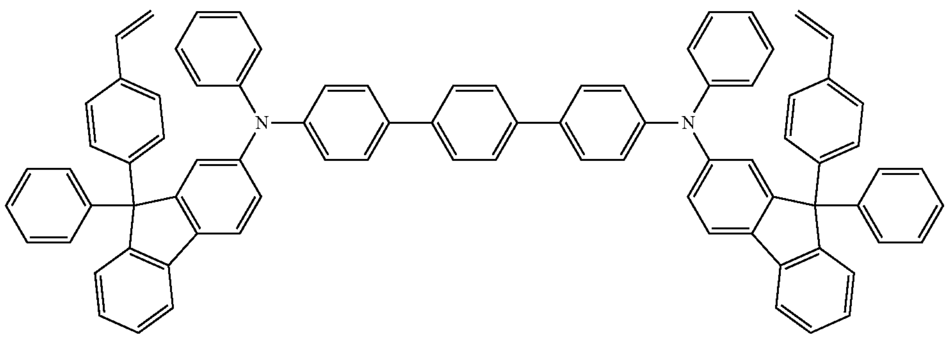
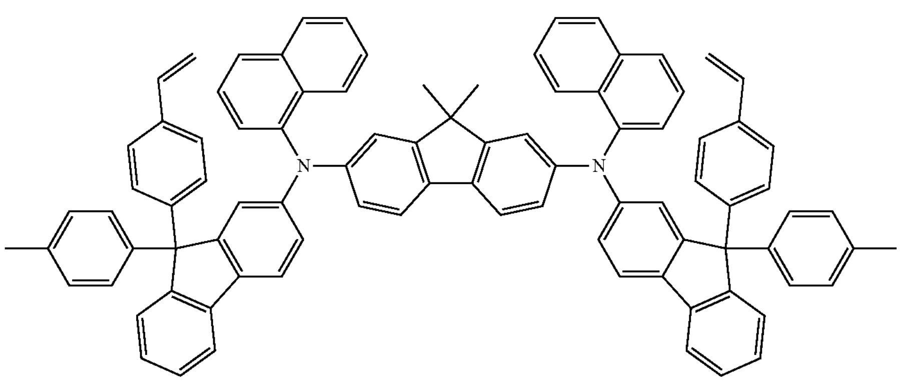
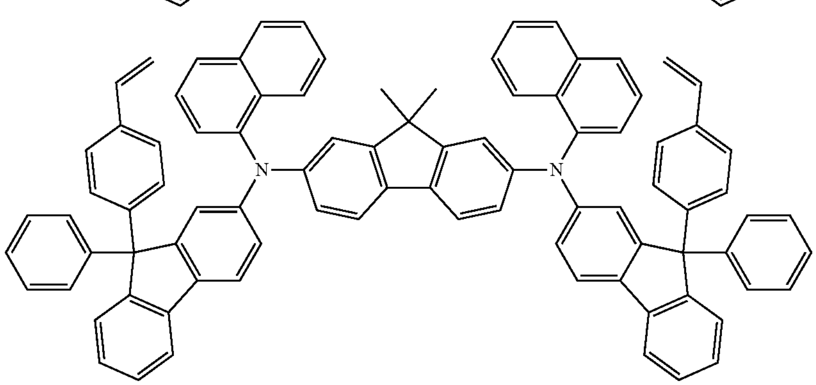

-continued
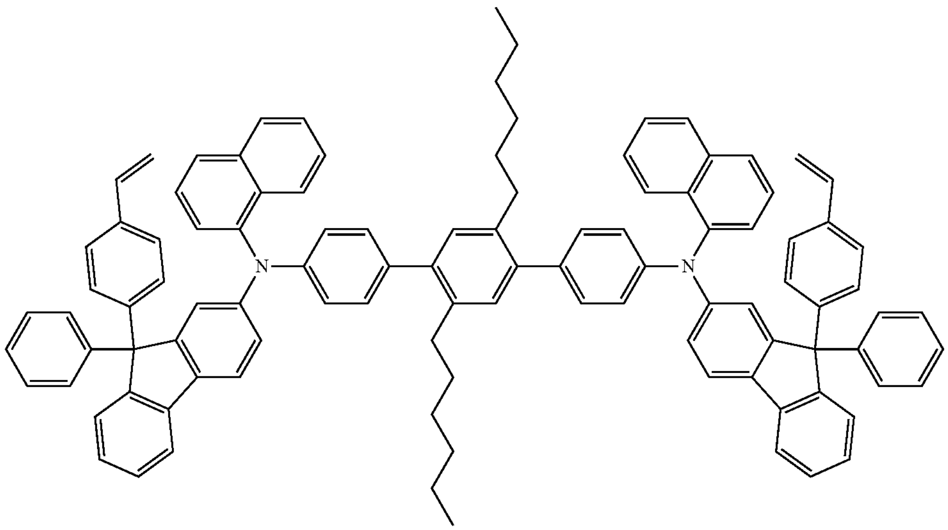
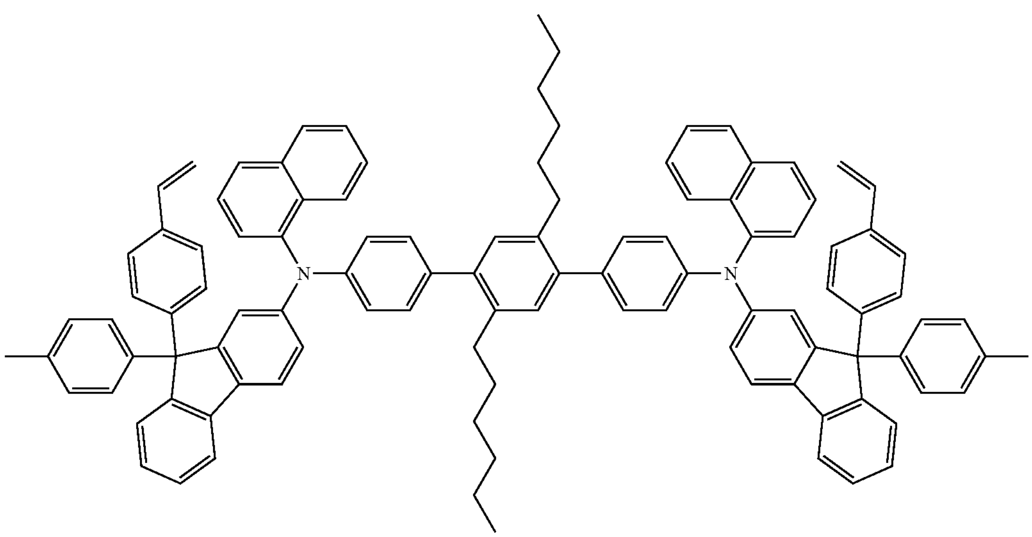
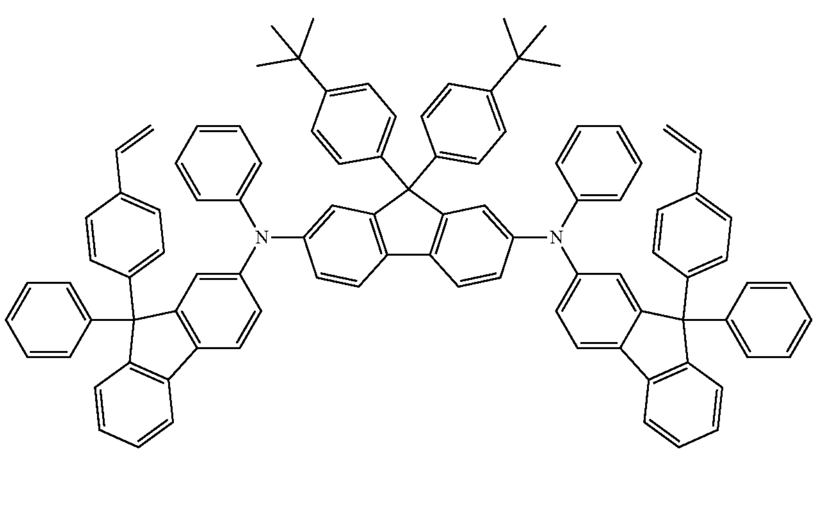

-continued
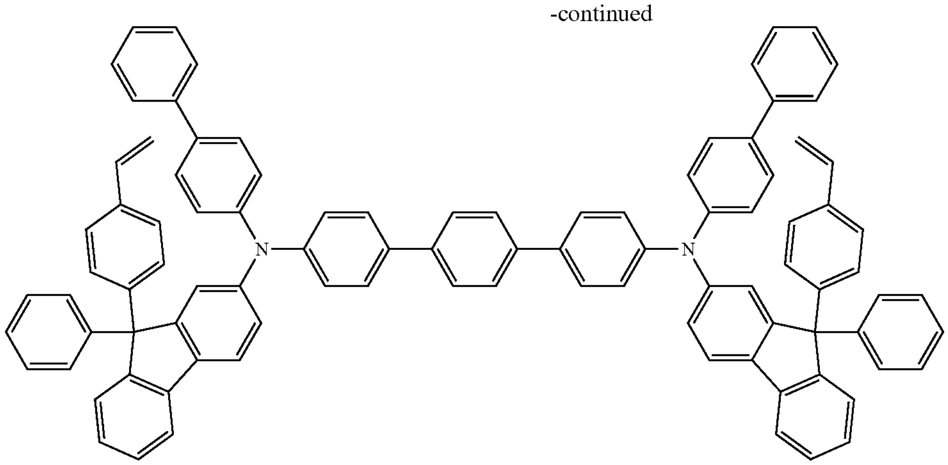
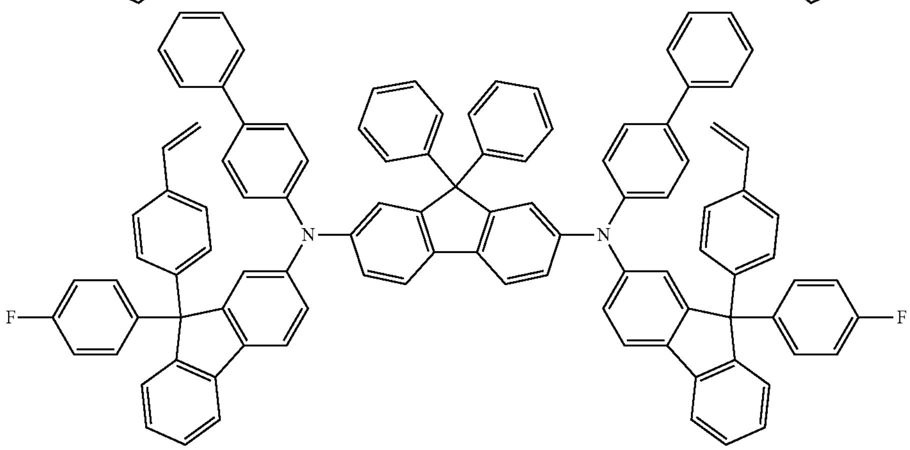
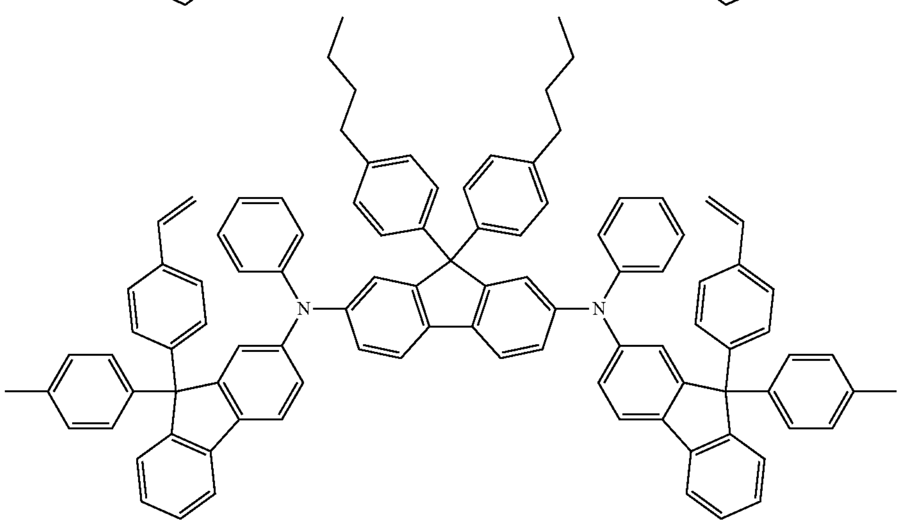
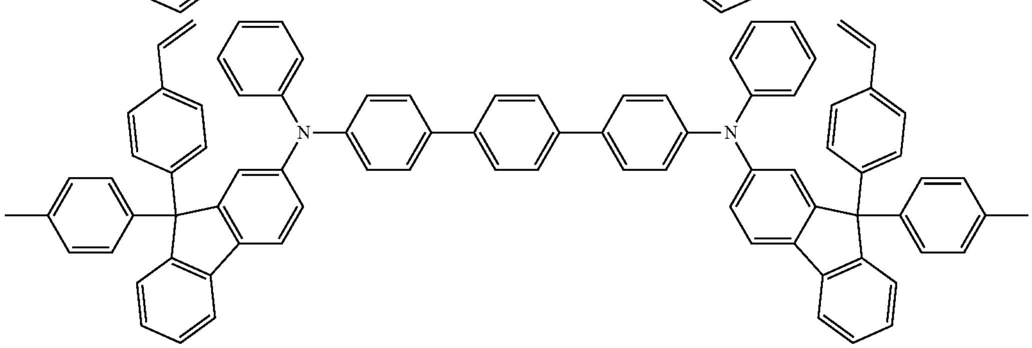

-continued
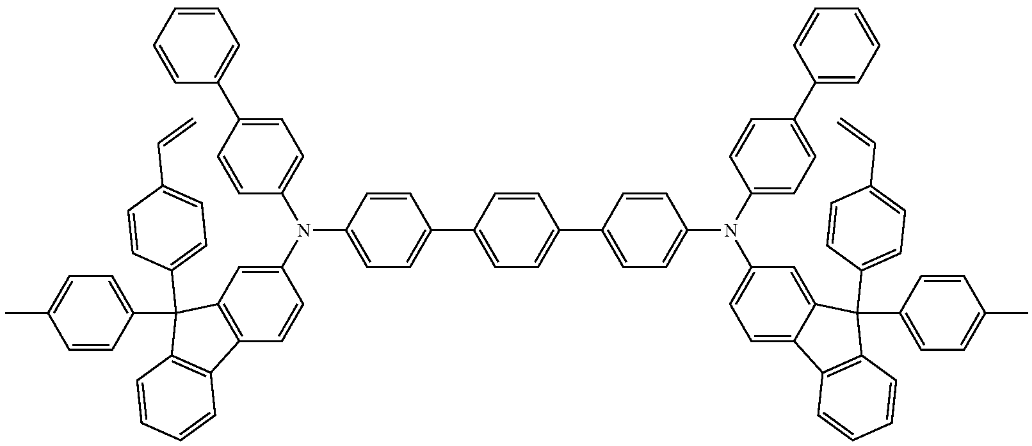
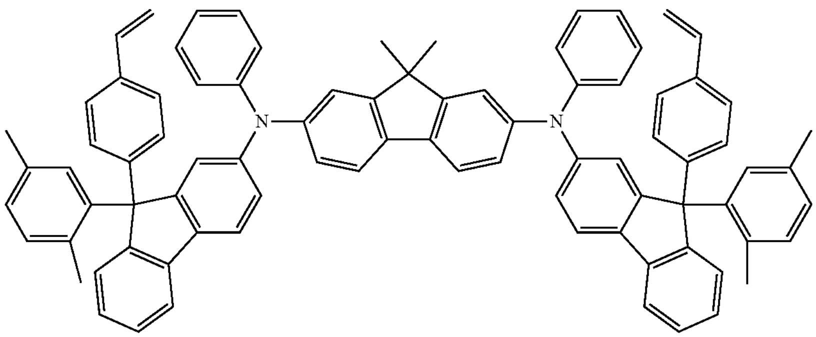
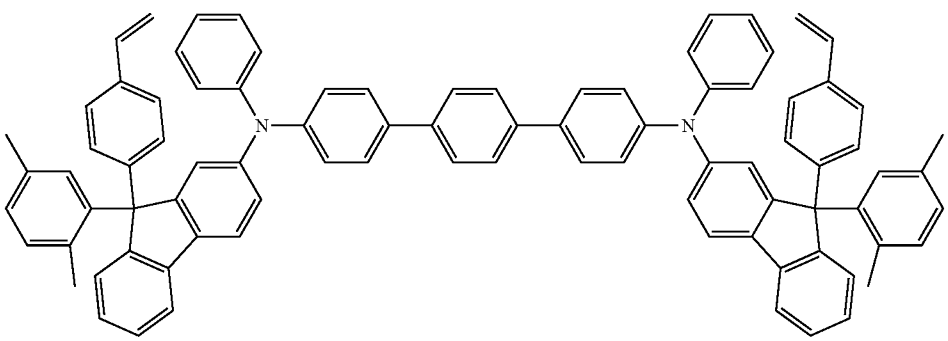
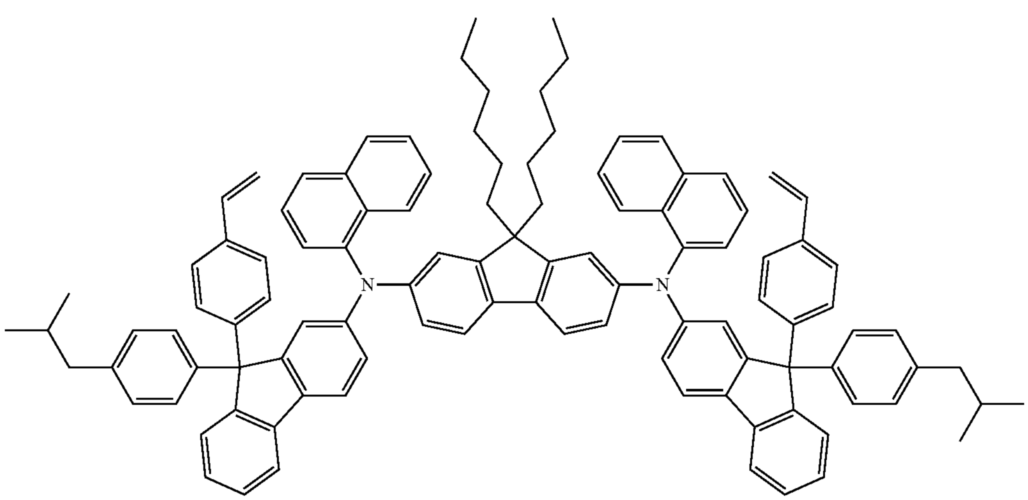

-continued
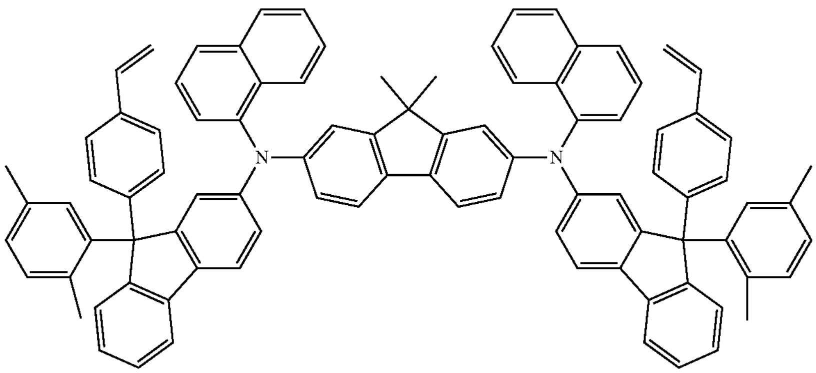
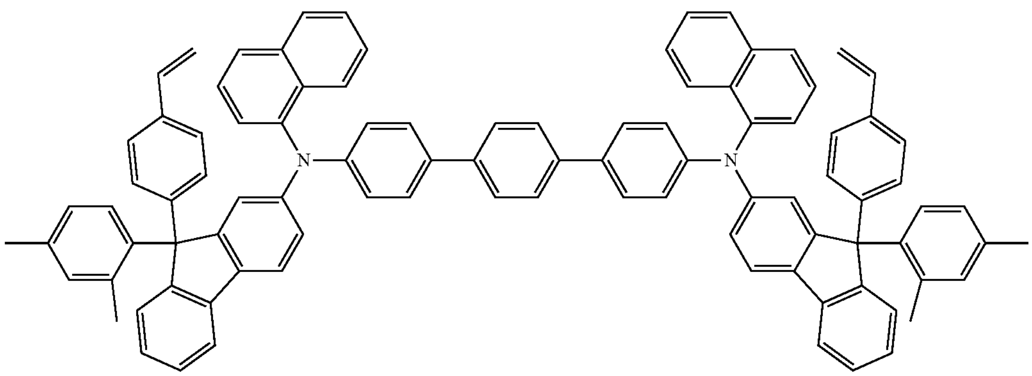
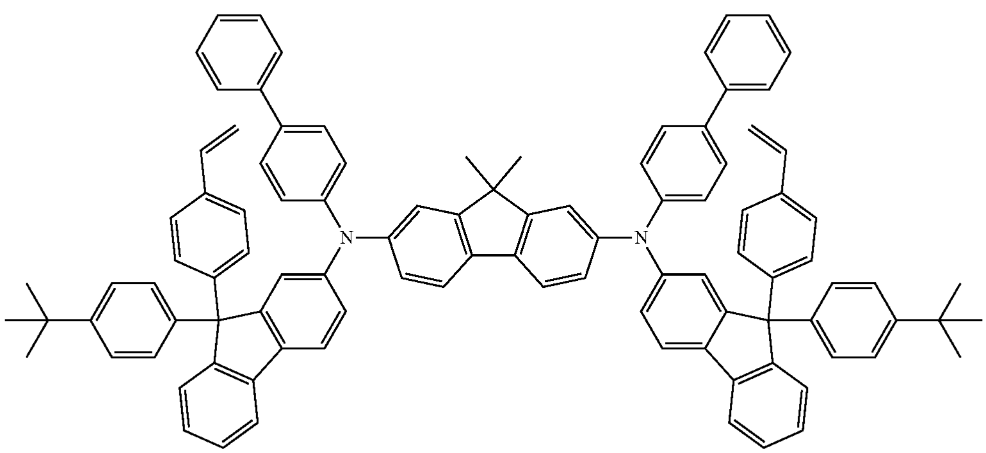
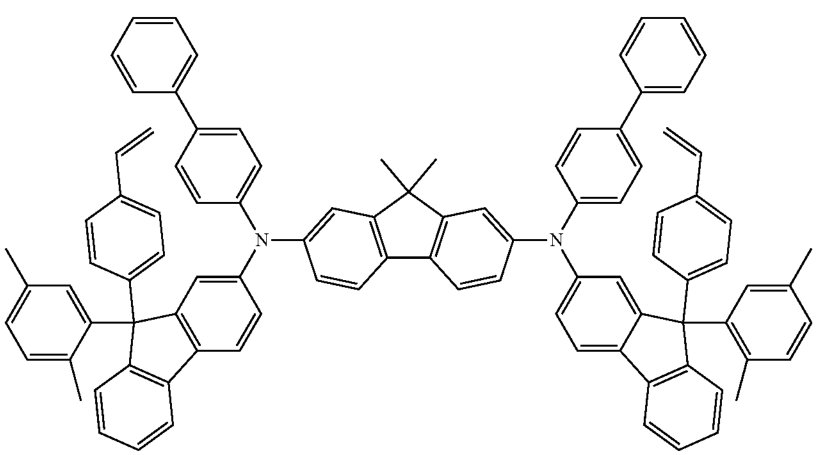

-continued
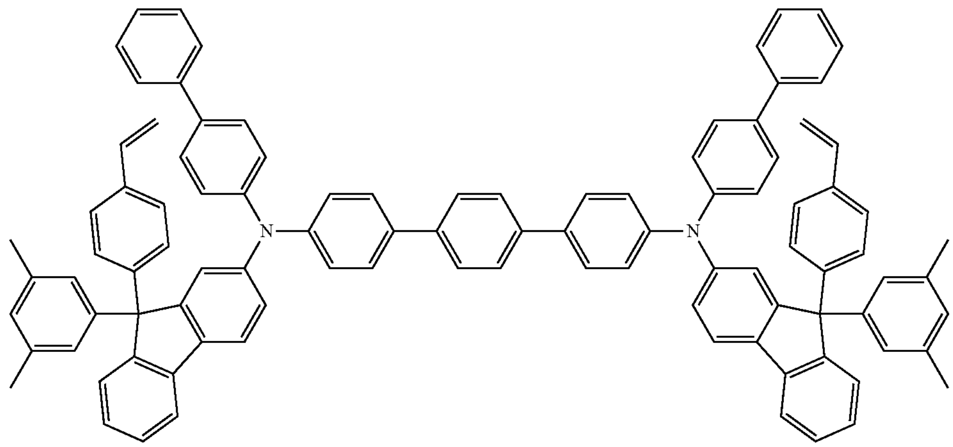
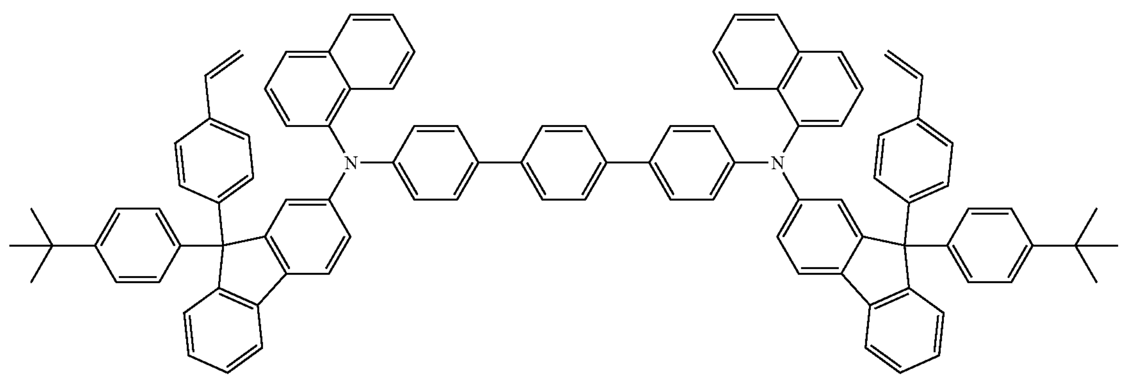
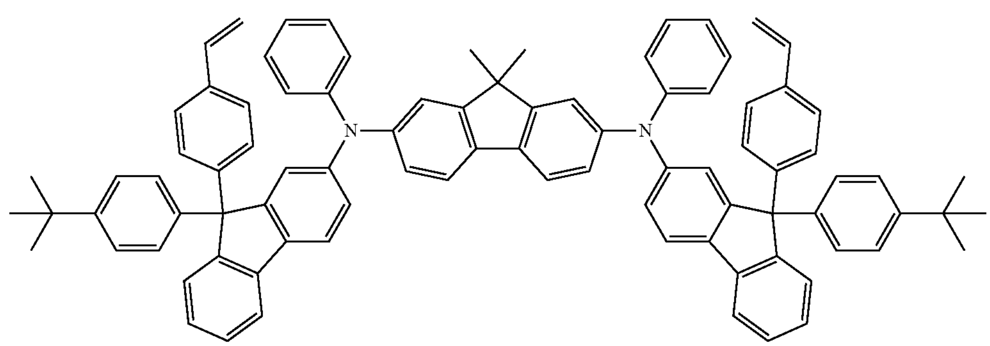
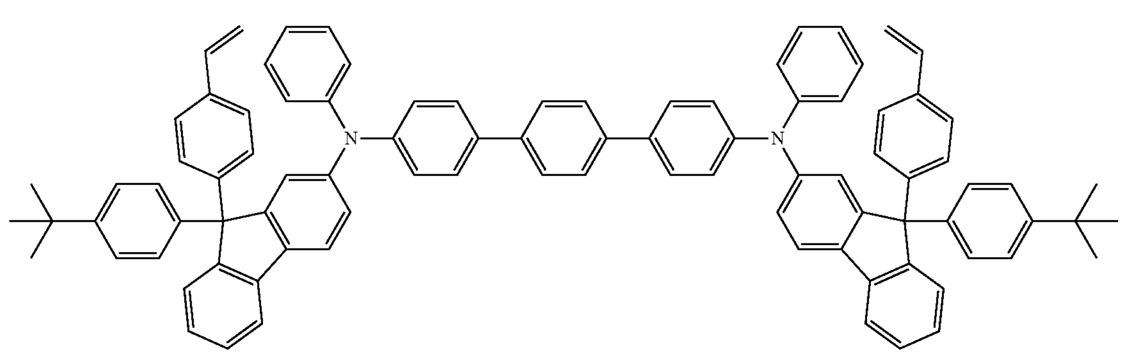

-continued
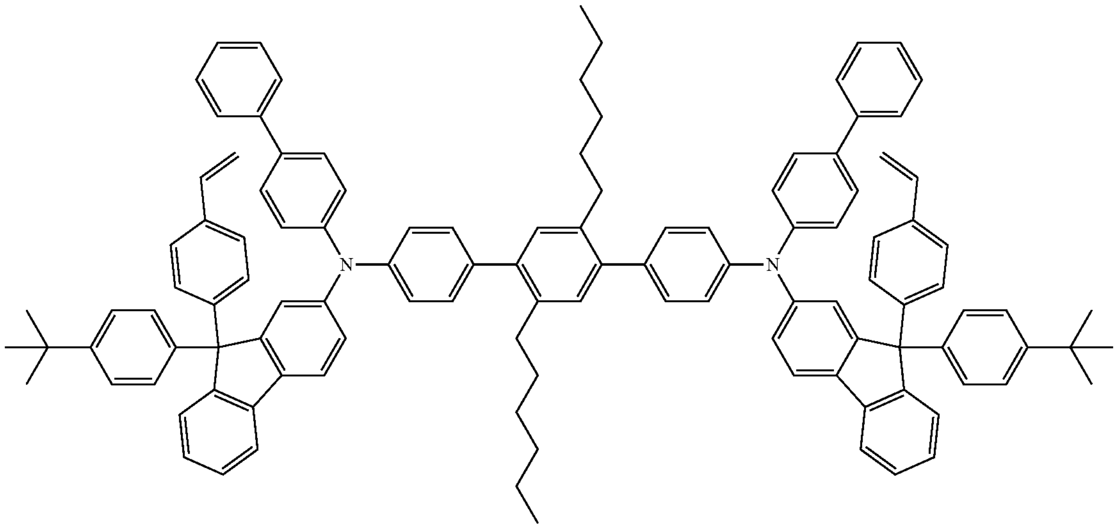
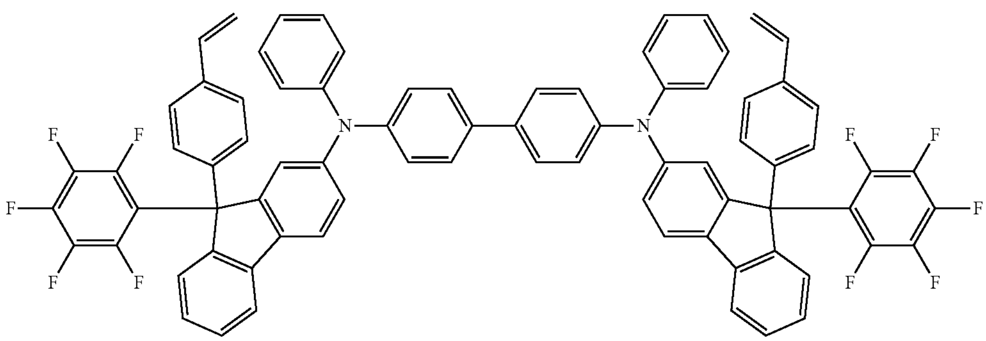
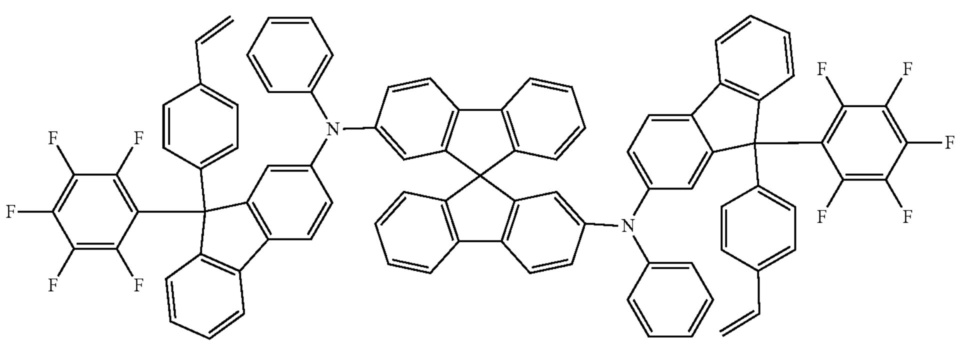
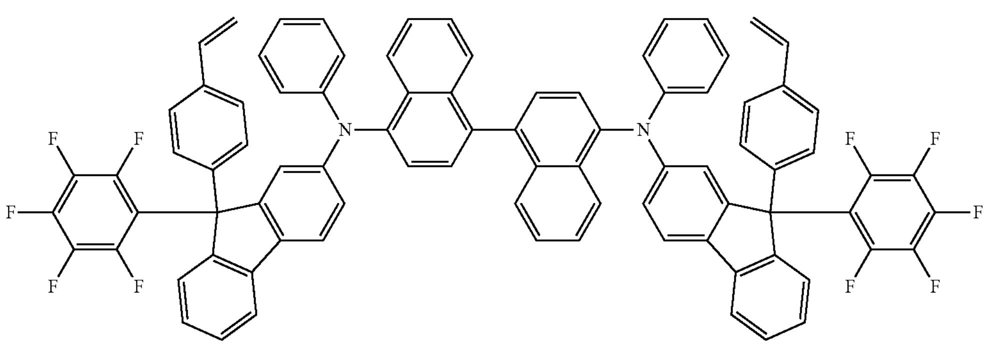

-continued
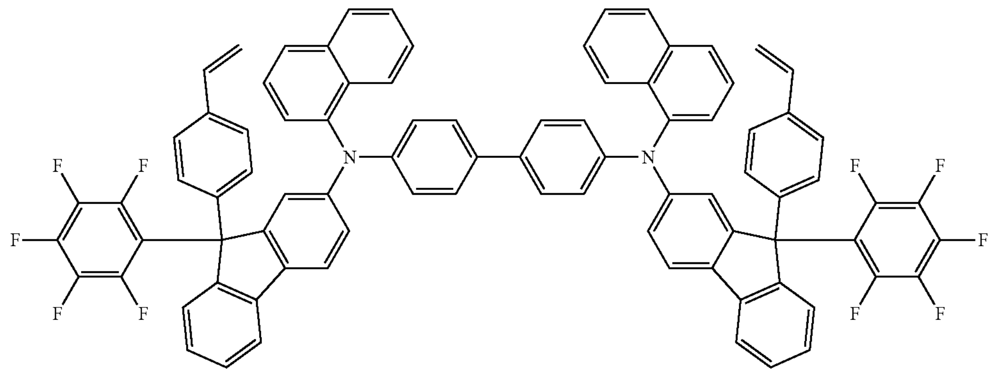
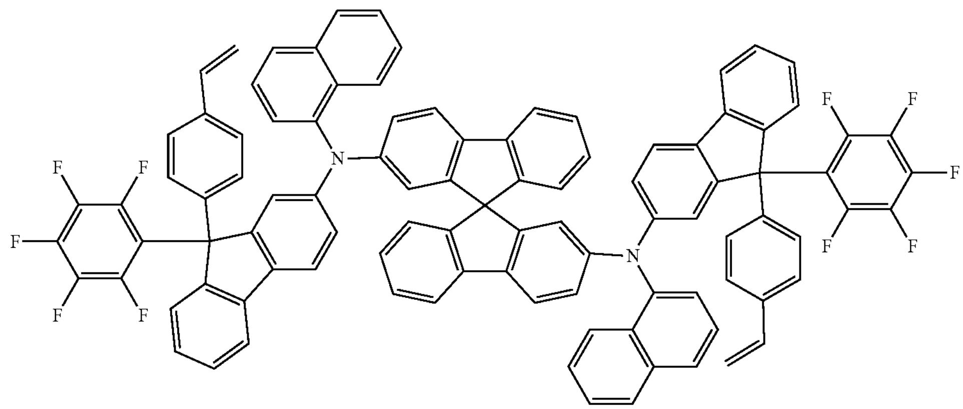
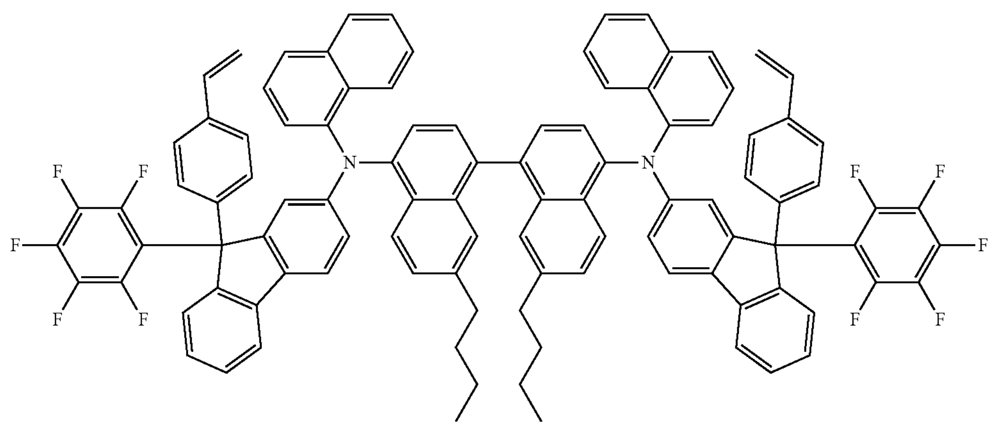
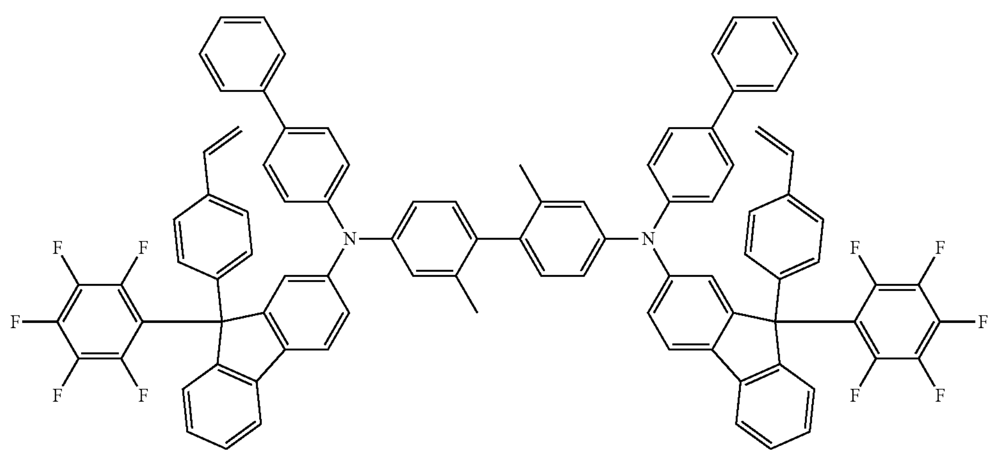

-continued
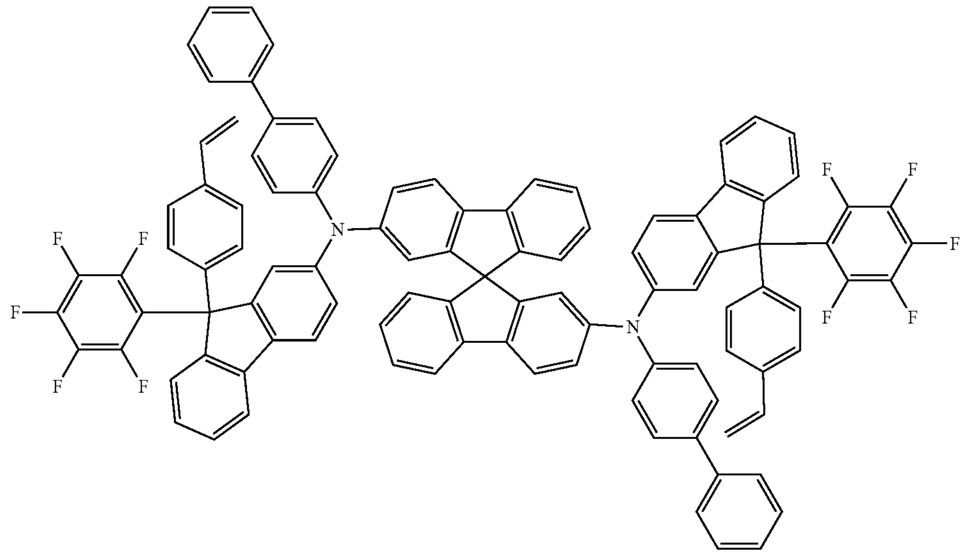
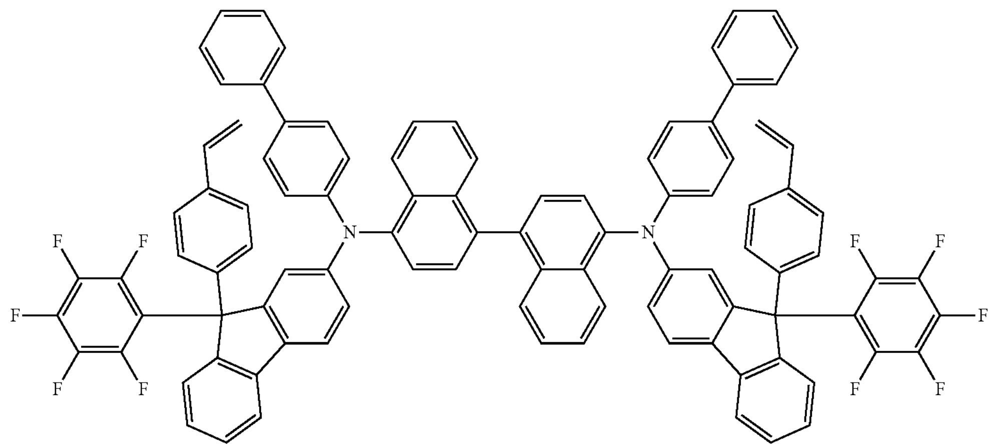
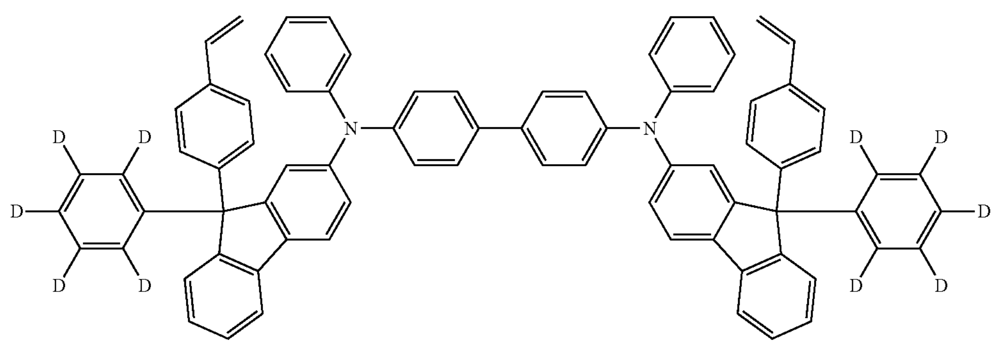
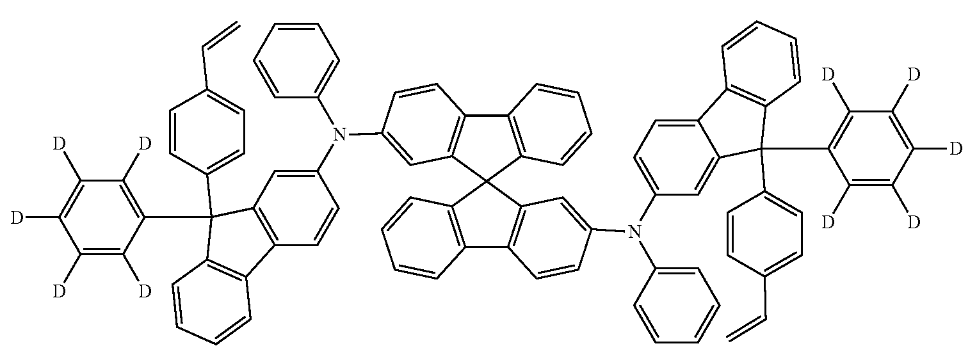

-continued
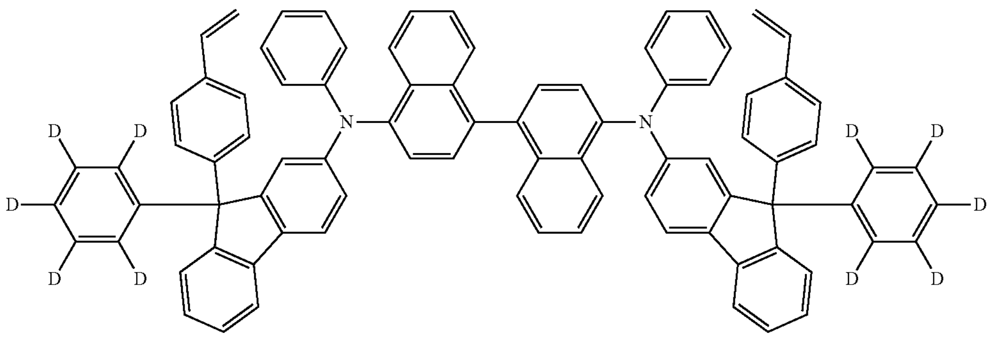
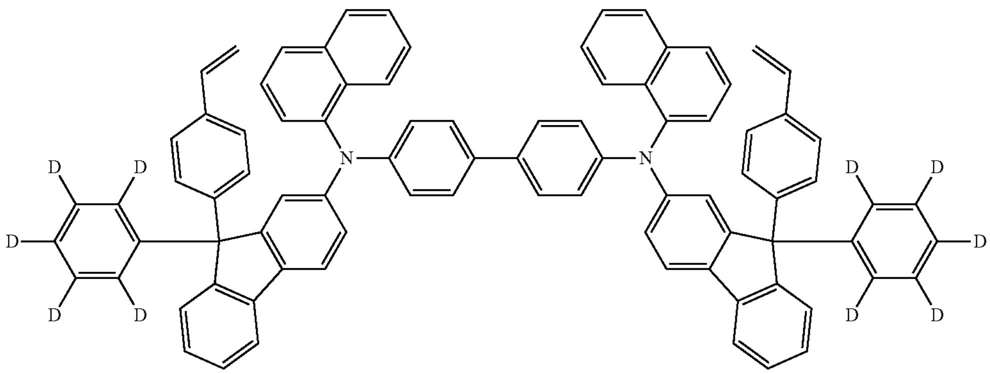
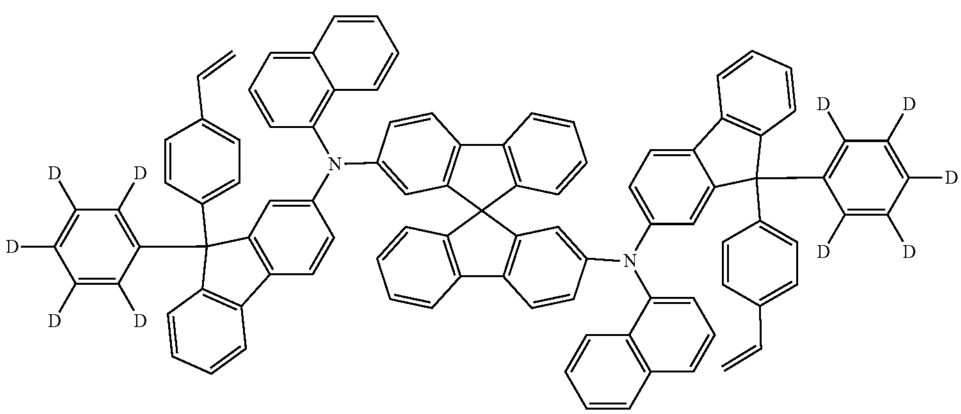
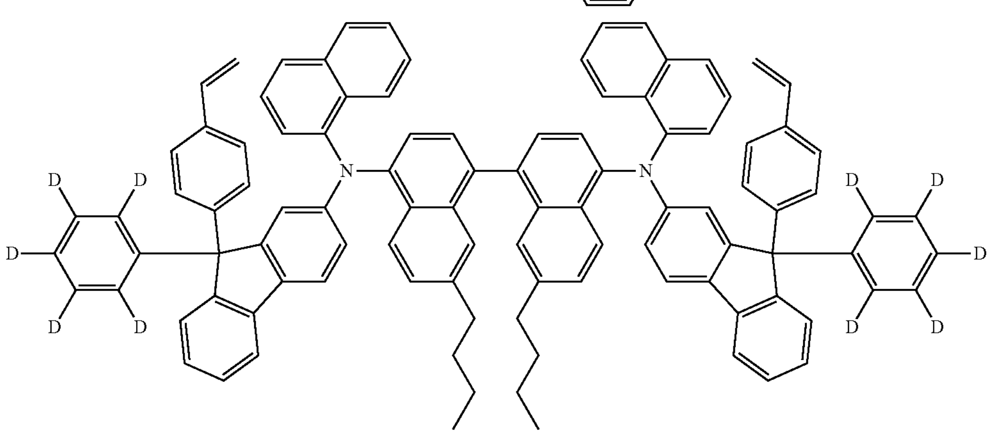

-continued
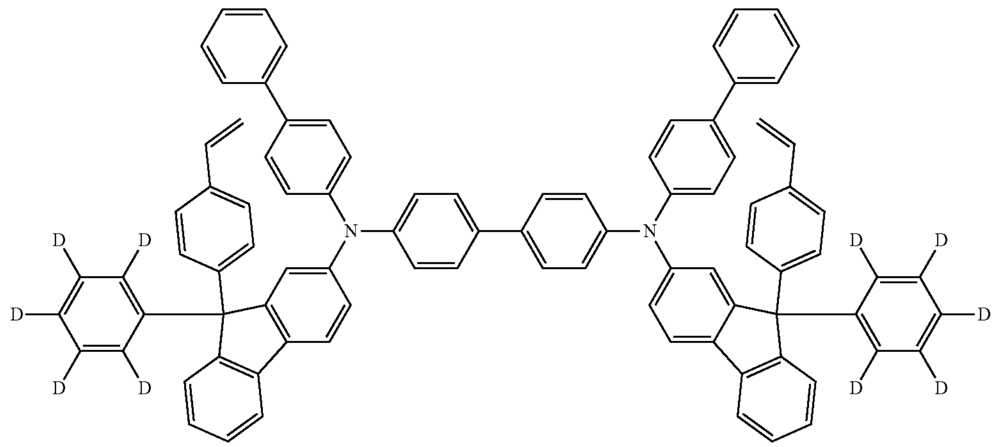
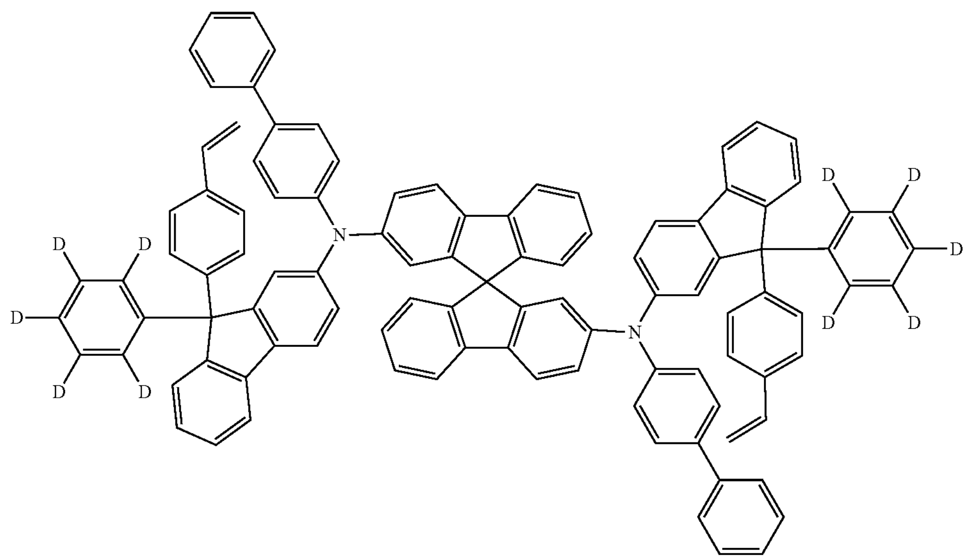
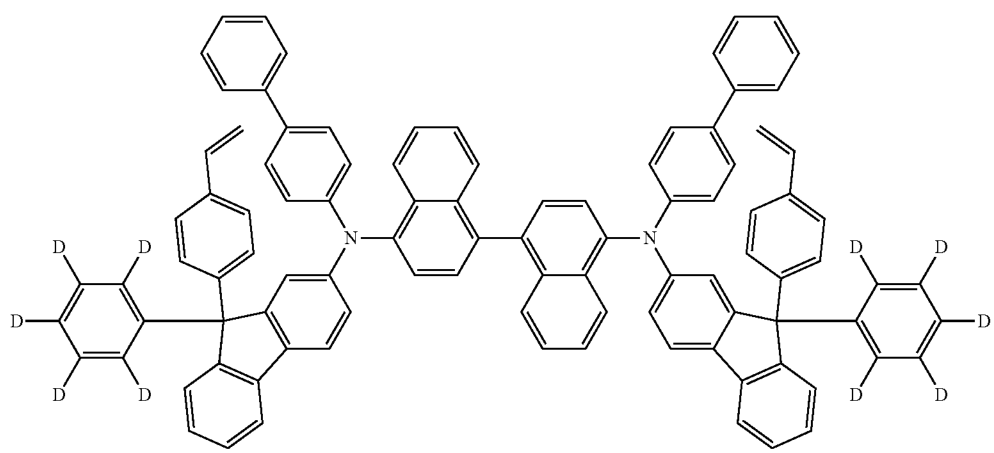

-continued
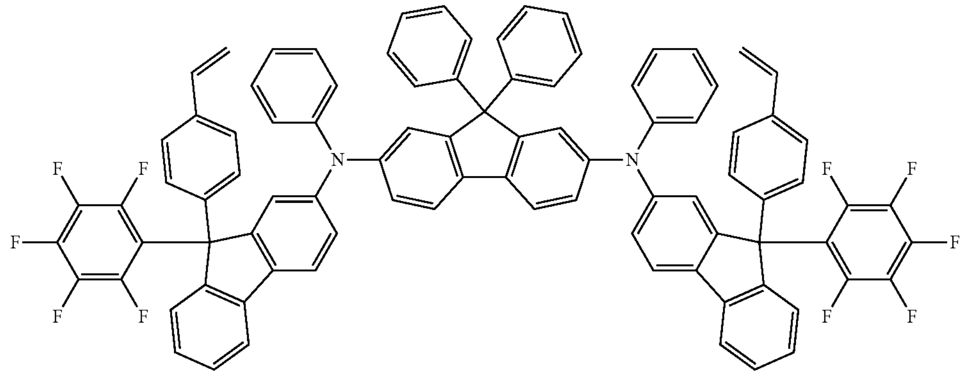
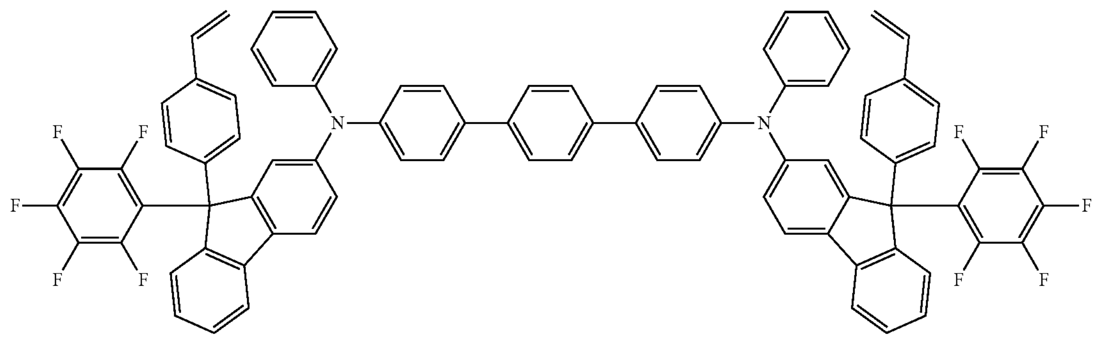
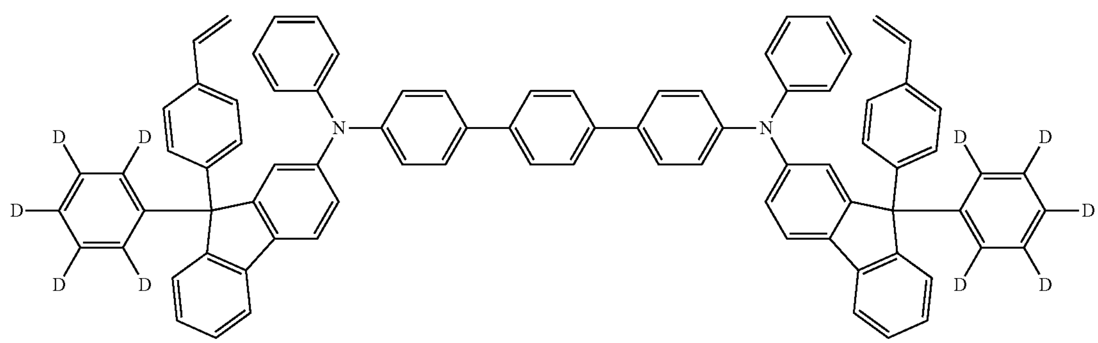
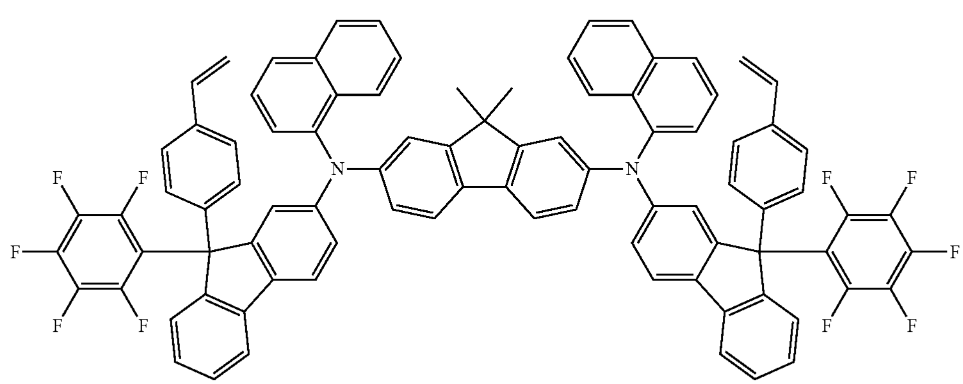

-continued
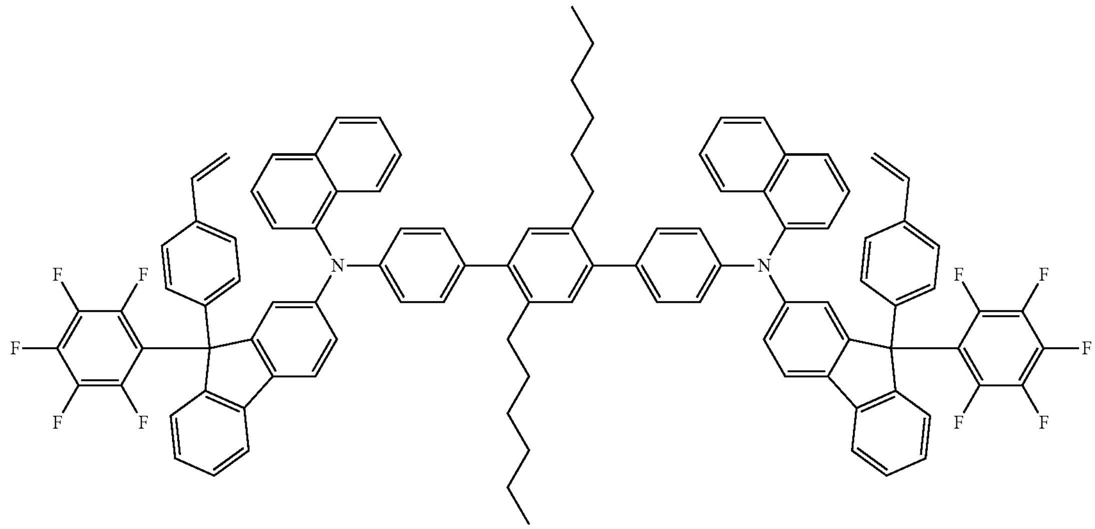
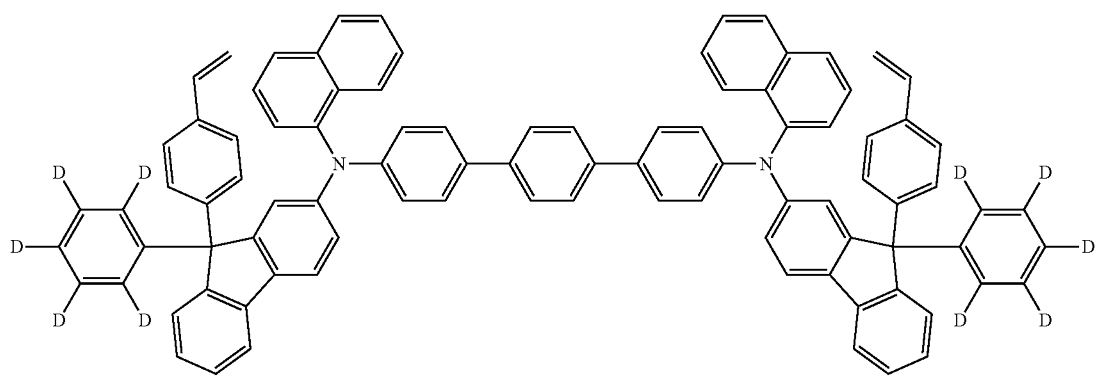
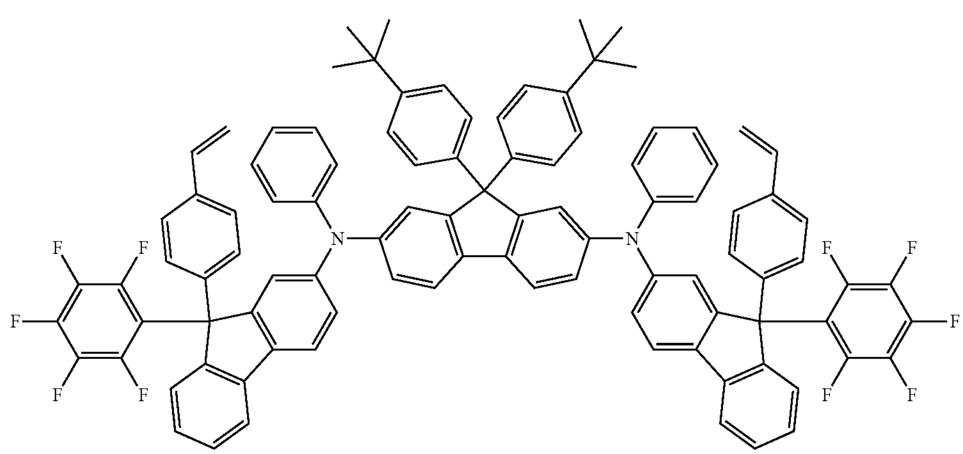

-continued
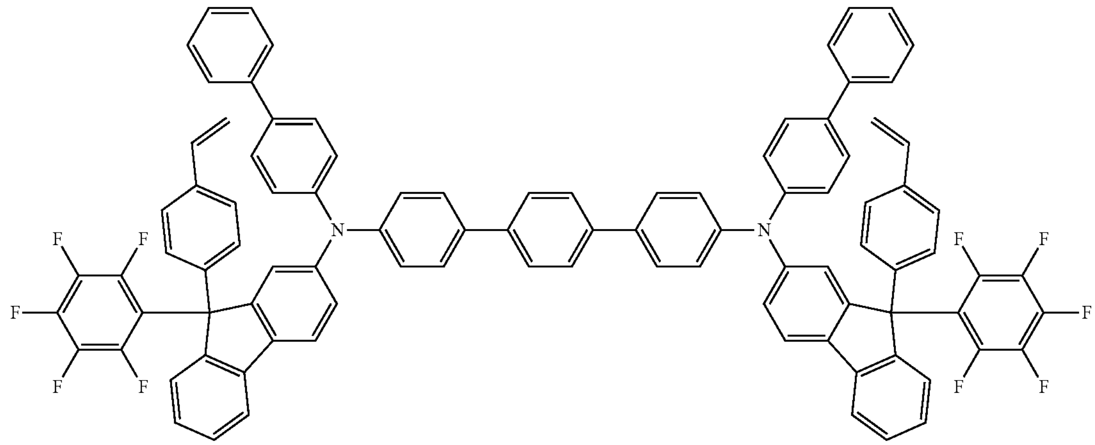
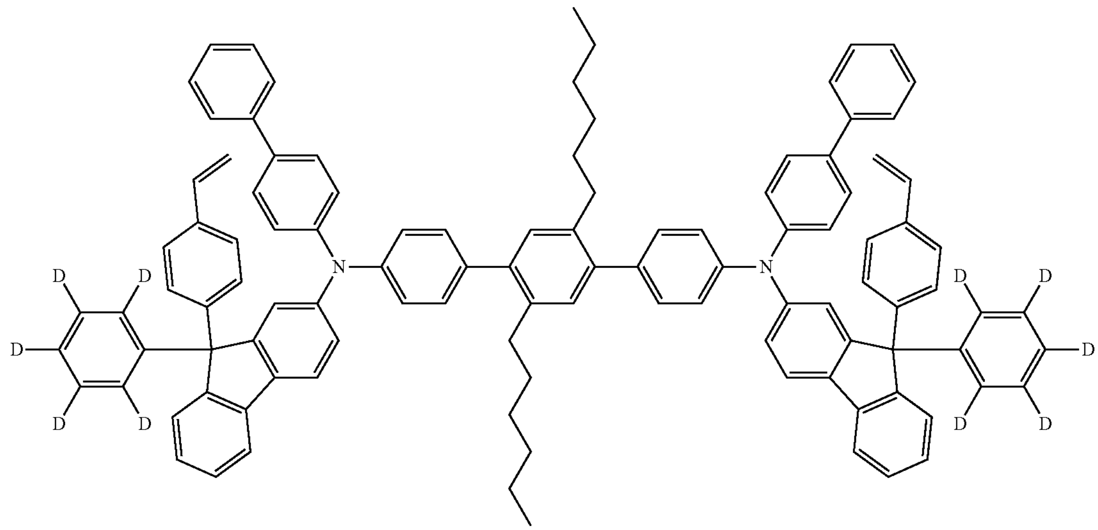
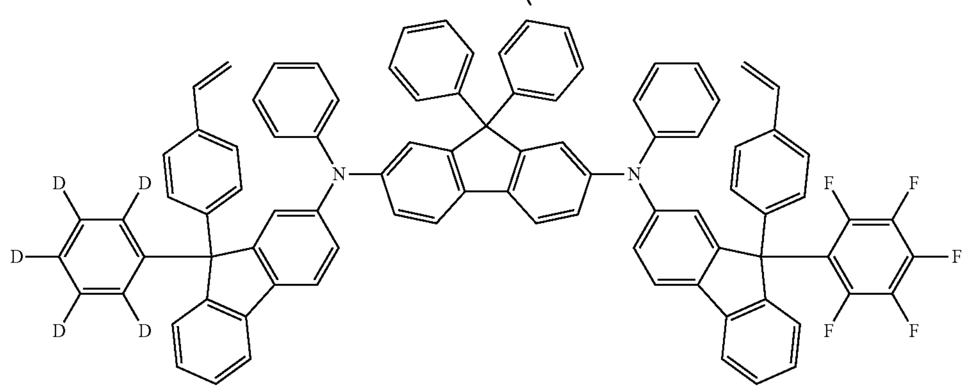
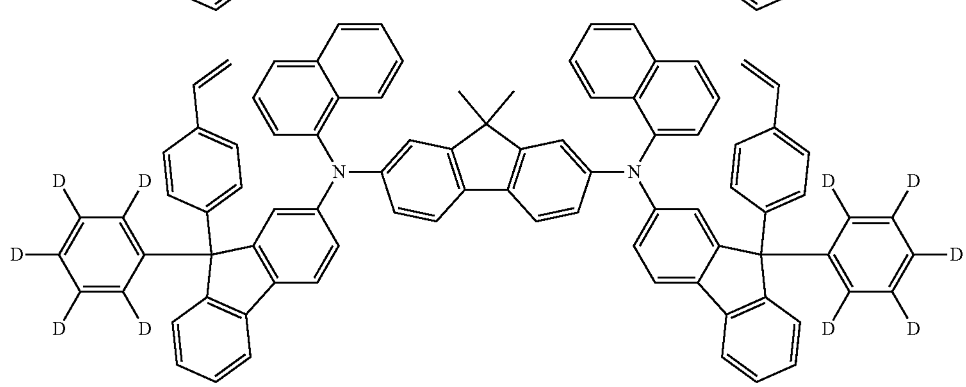

-continued
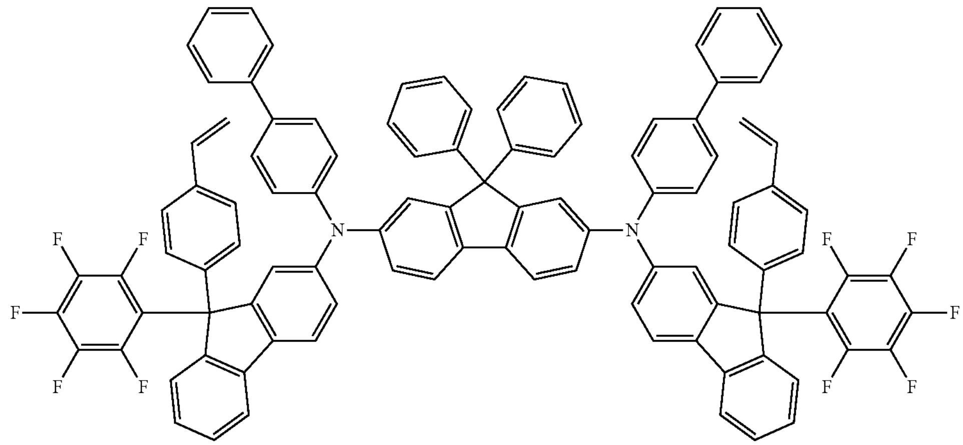
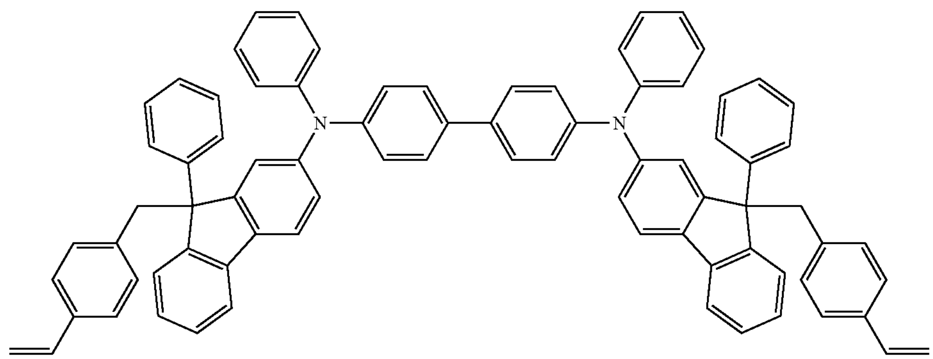
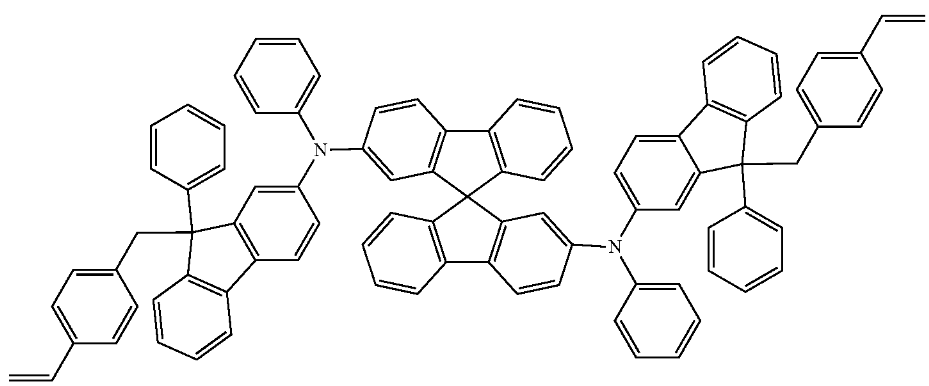
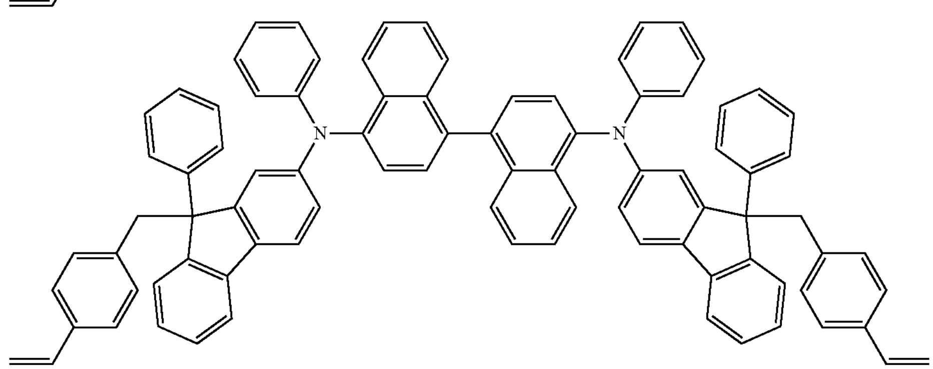

-continued
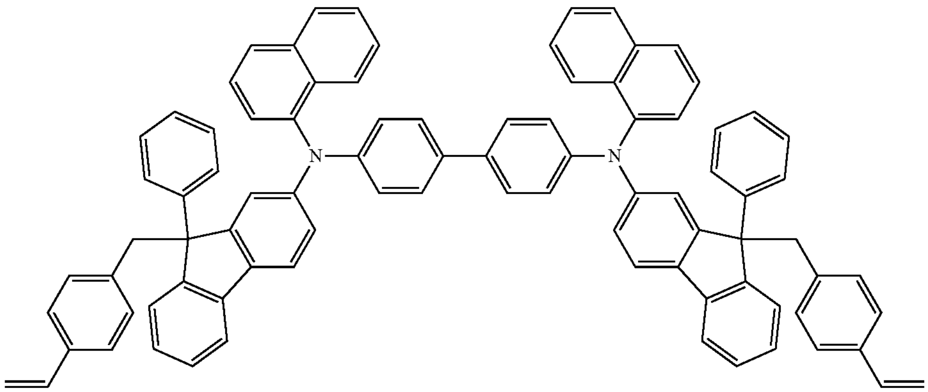
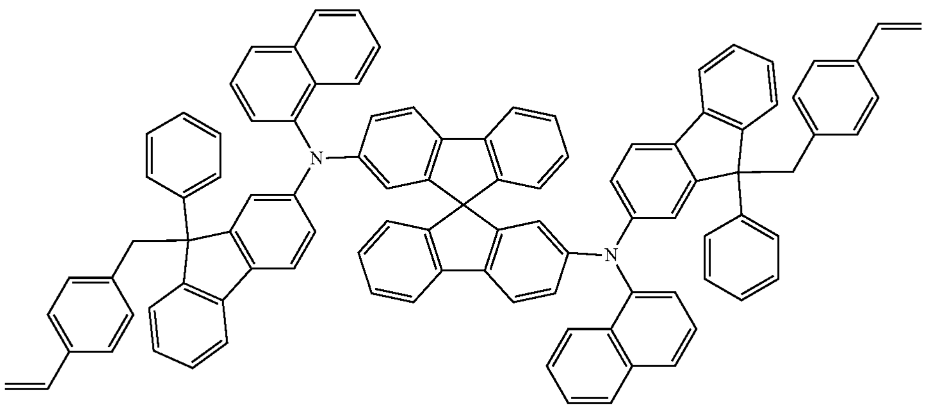
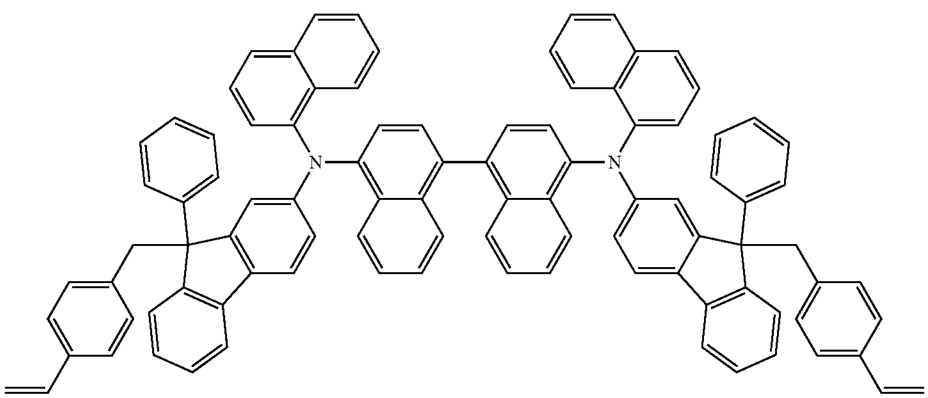
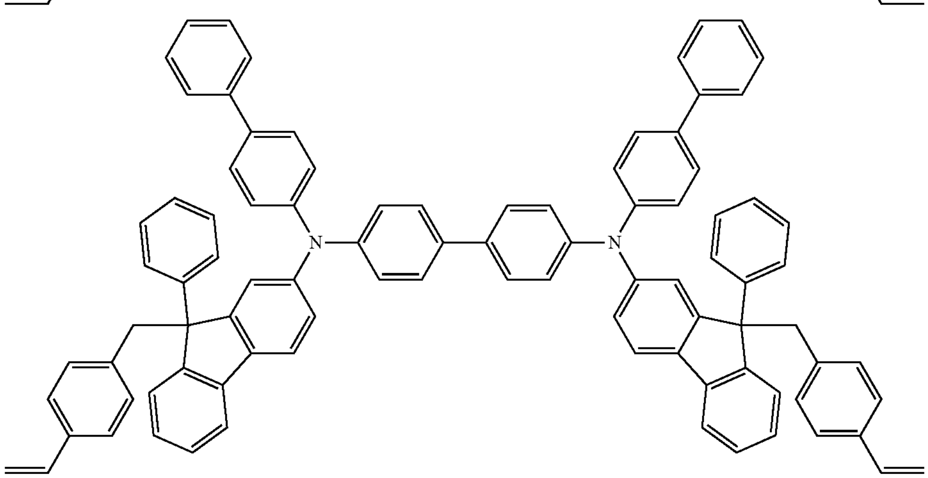

-continued
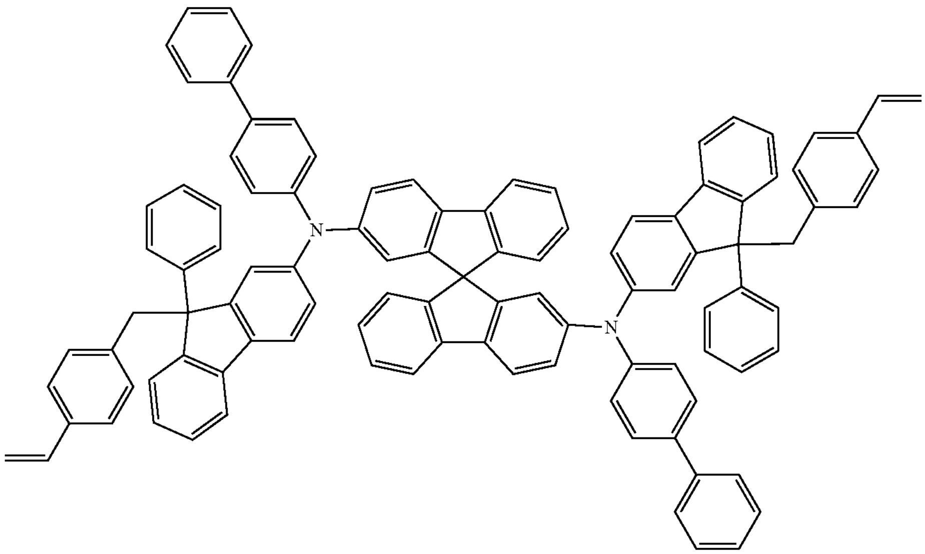
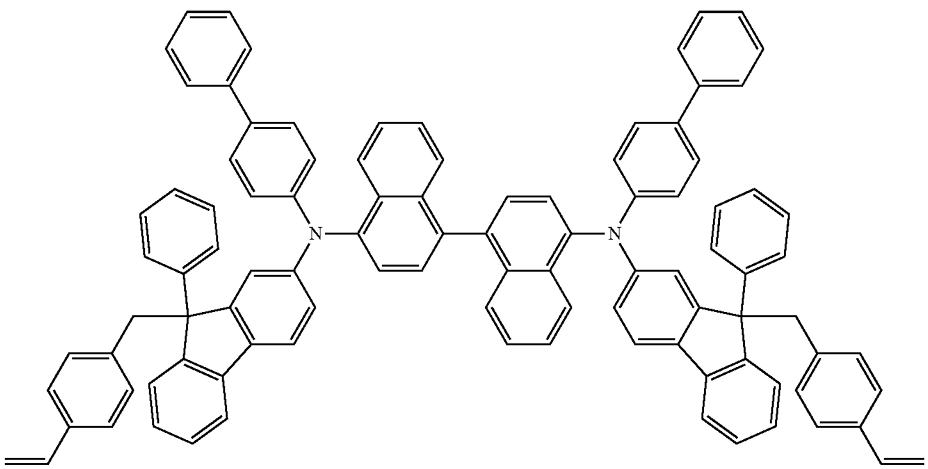
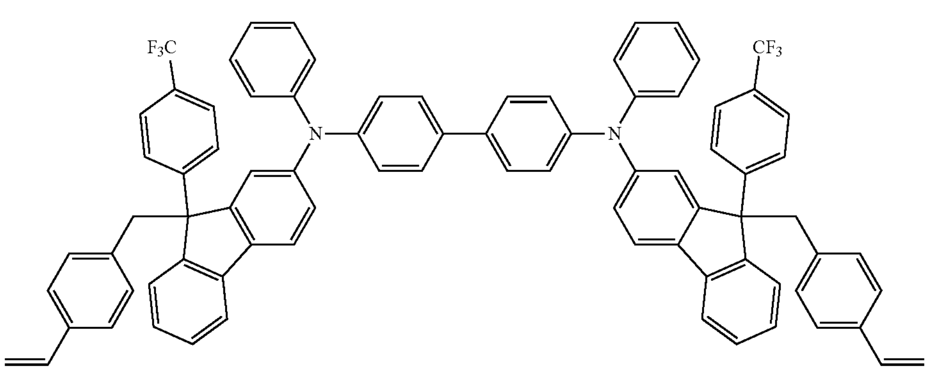

-continued
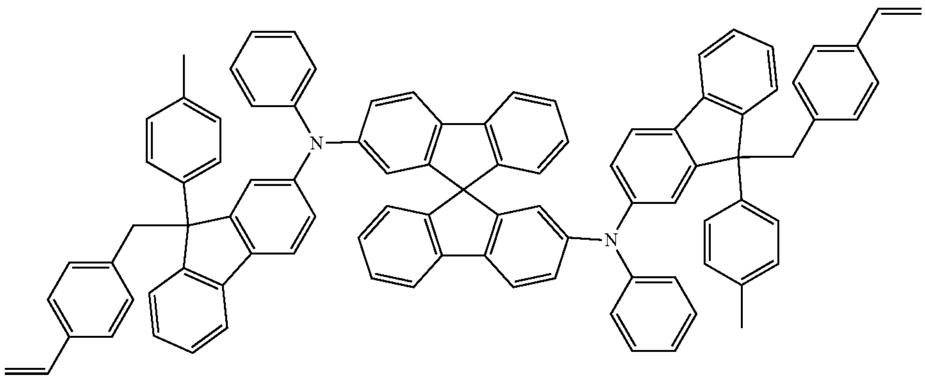
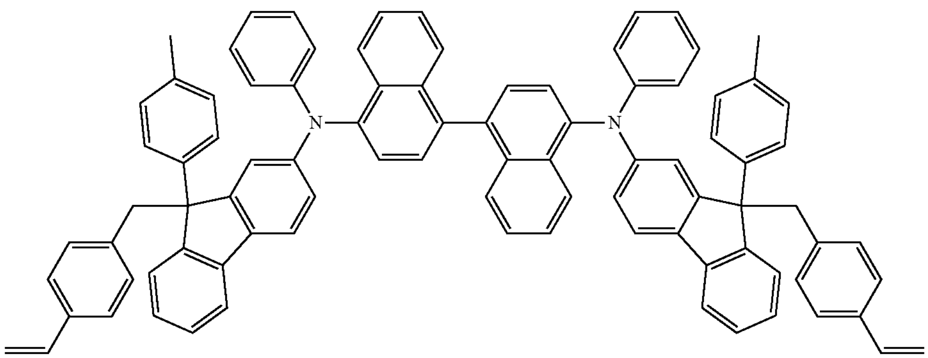
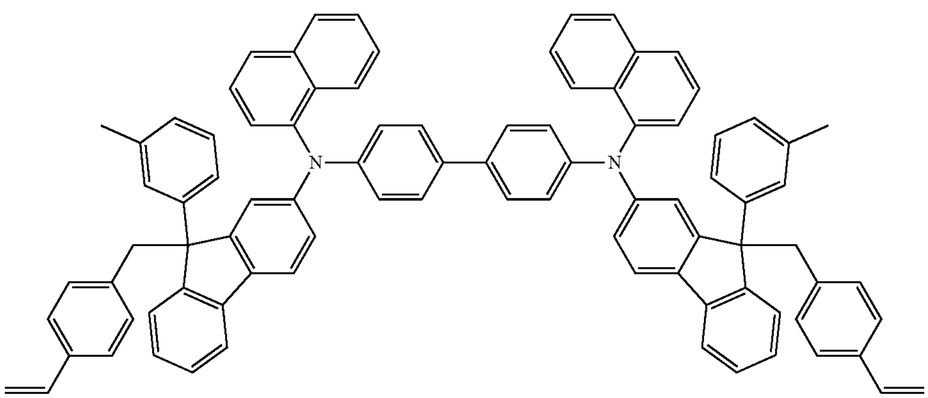
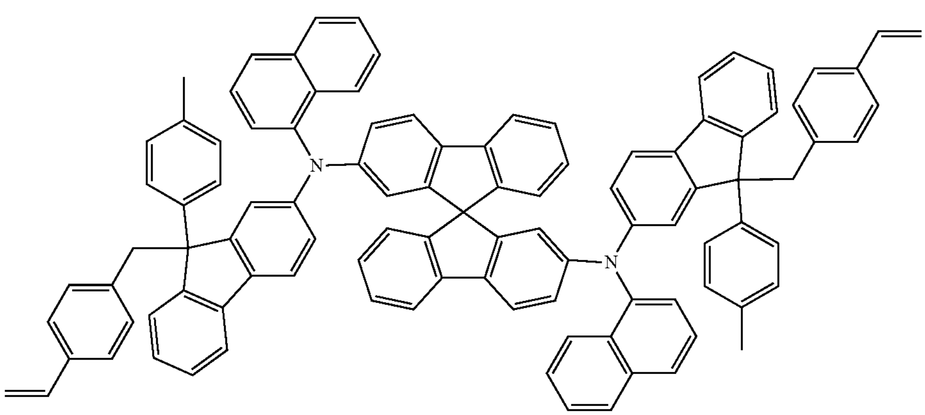

-continued
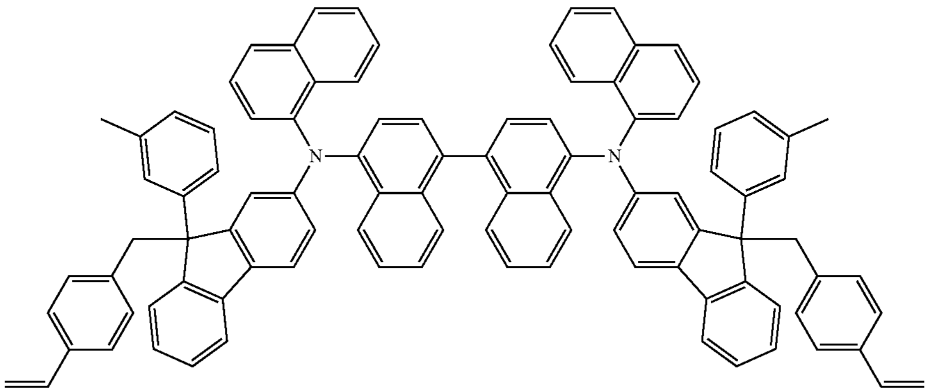
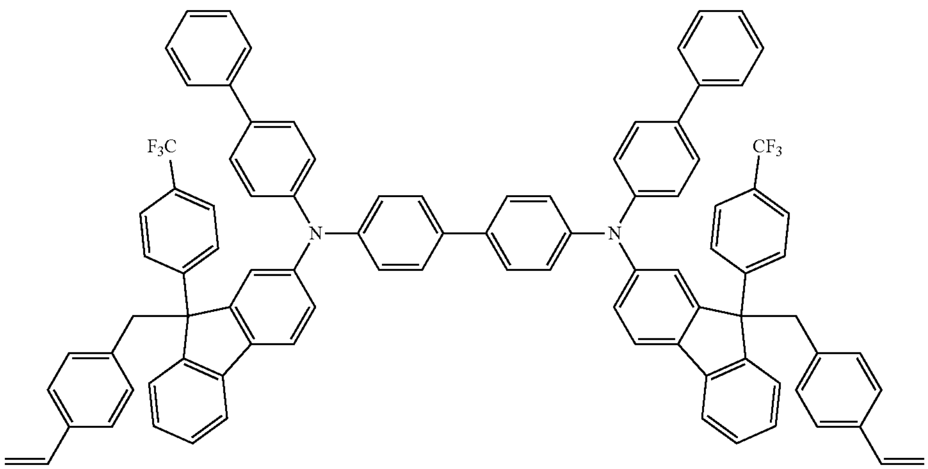
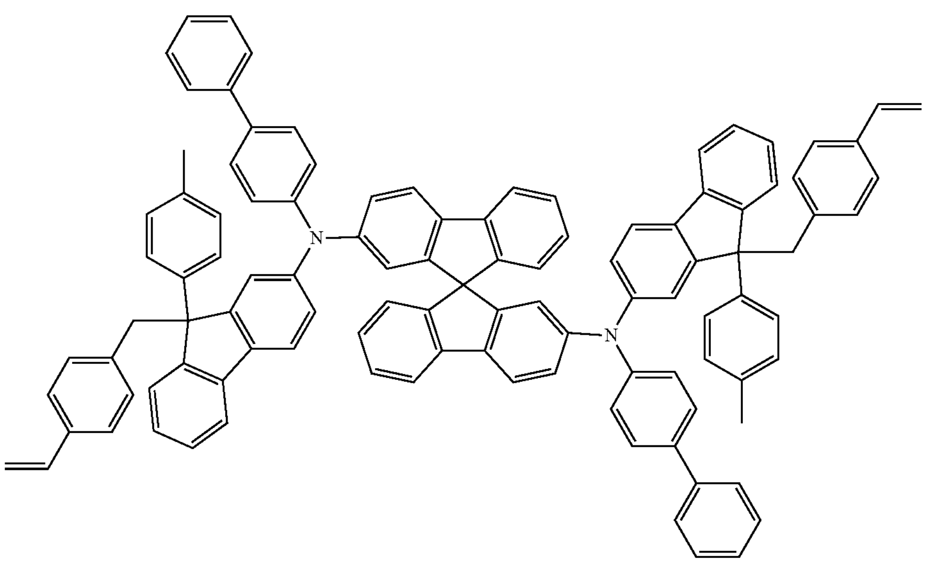

-continued
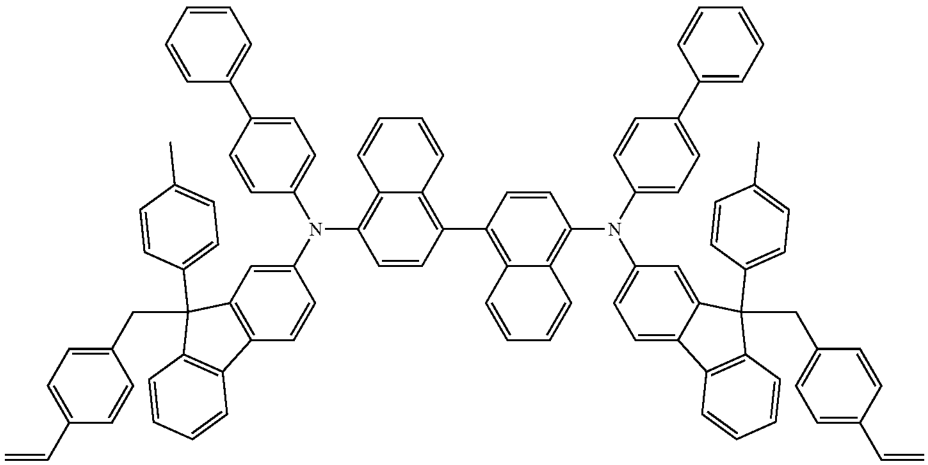
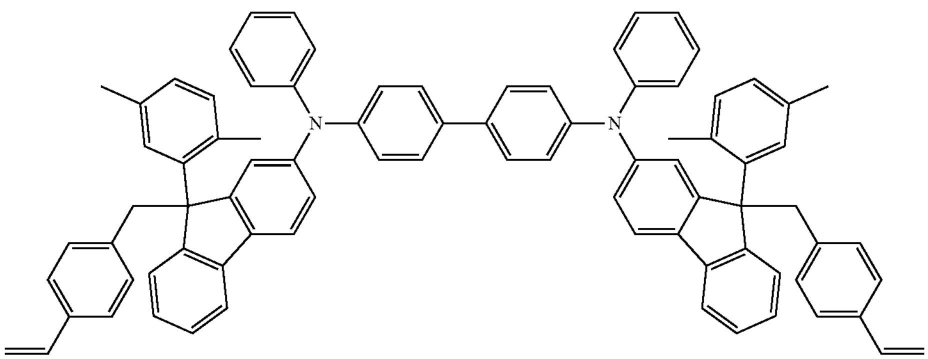
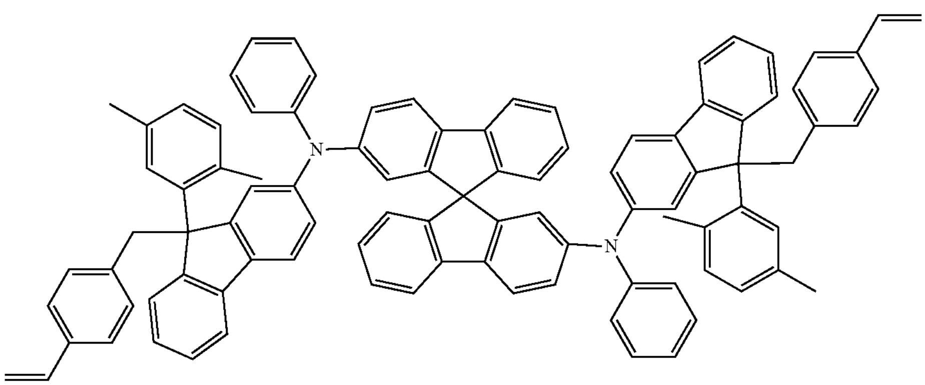
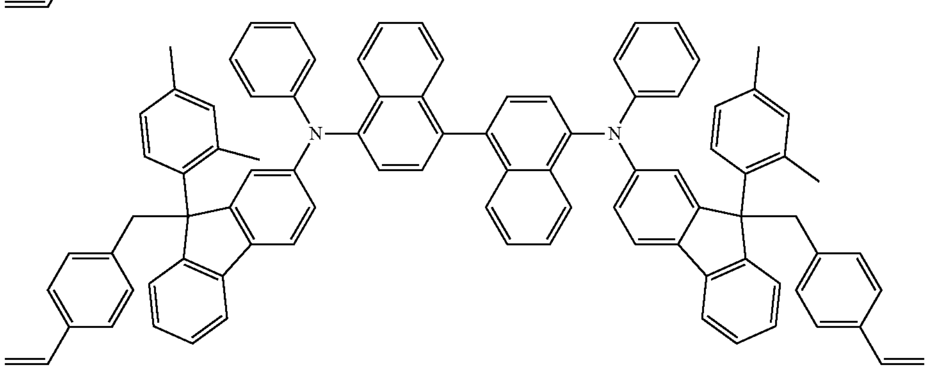

-continued
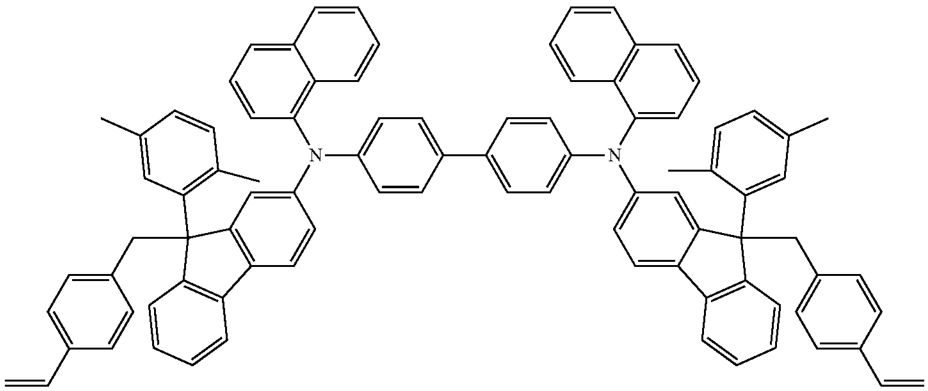
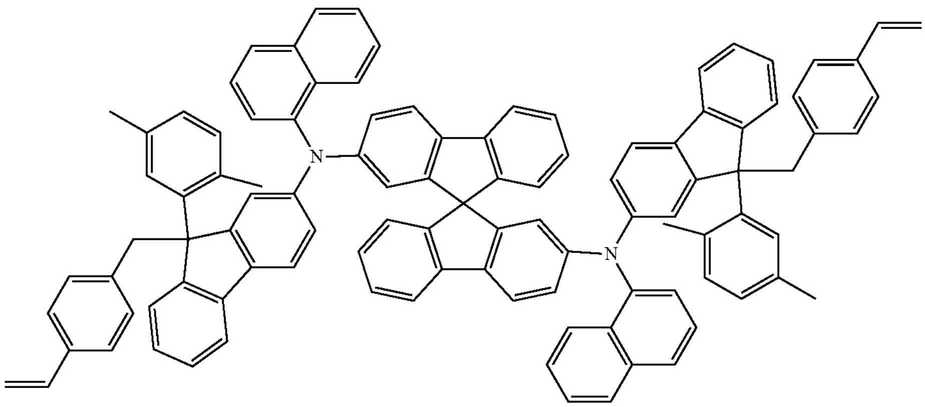
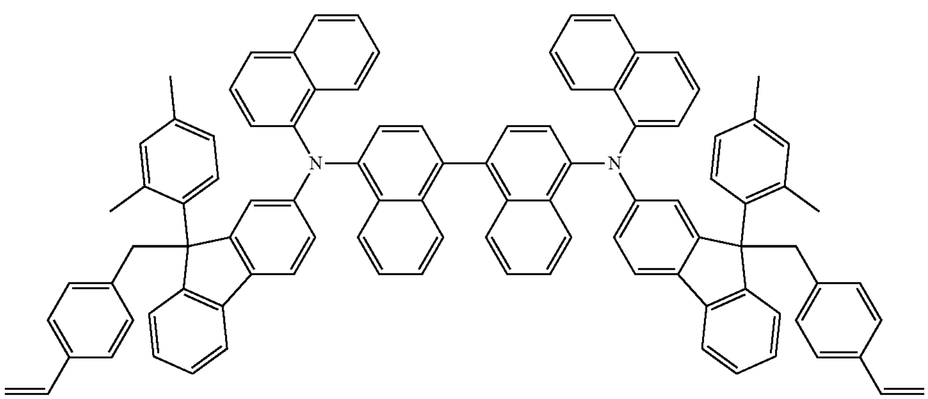
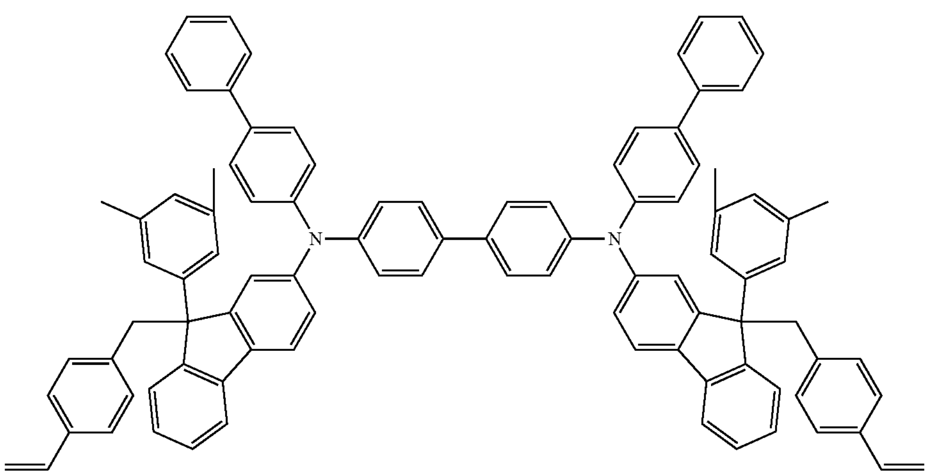

-continued
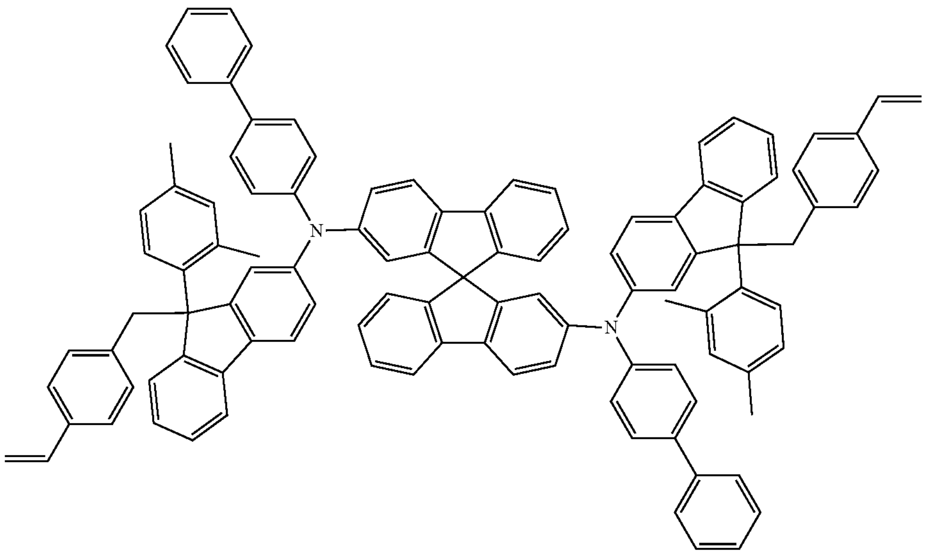
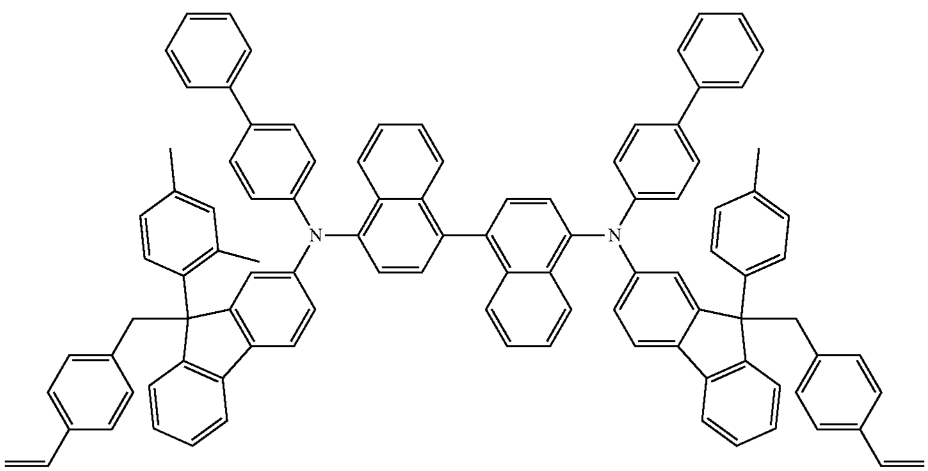
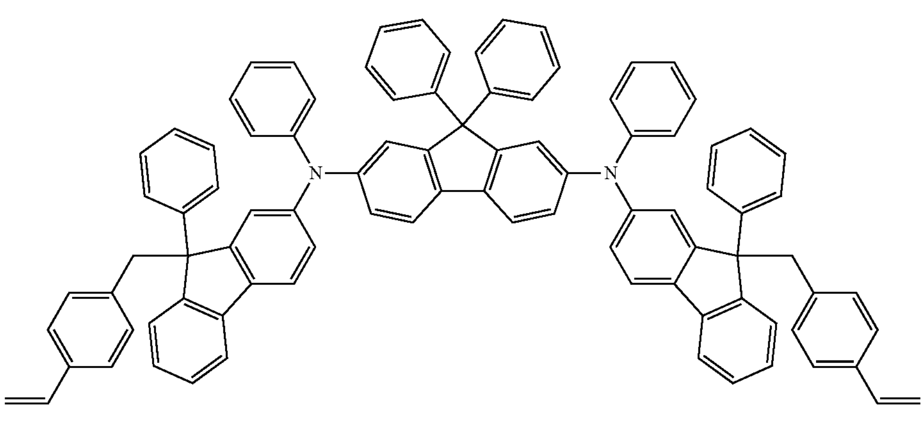

-continued
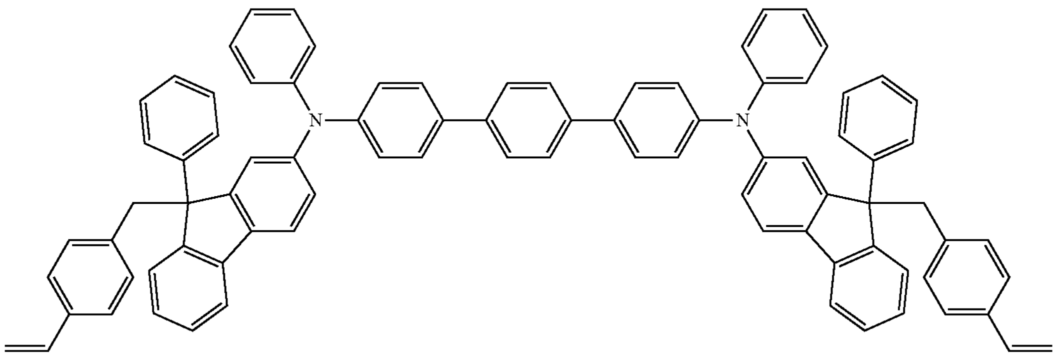
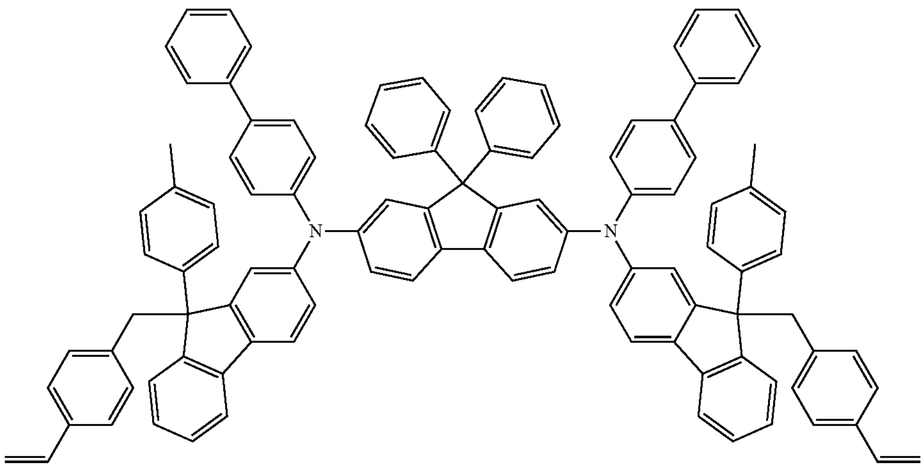
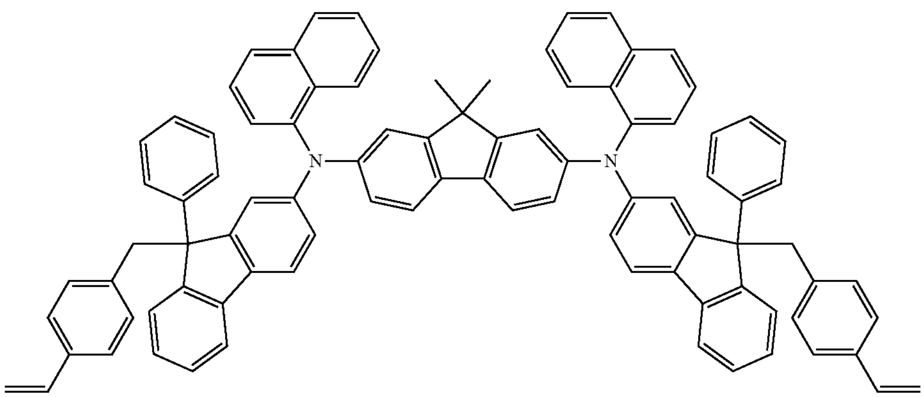
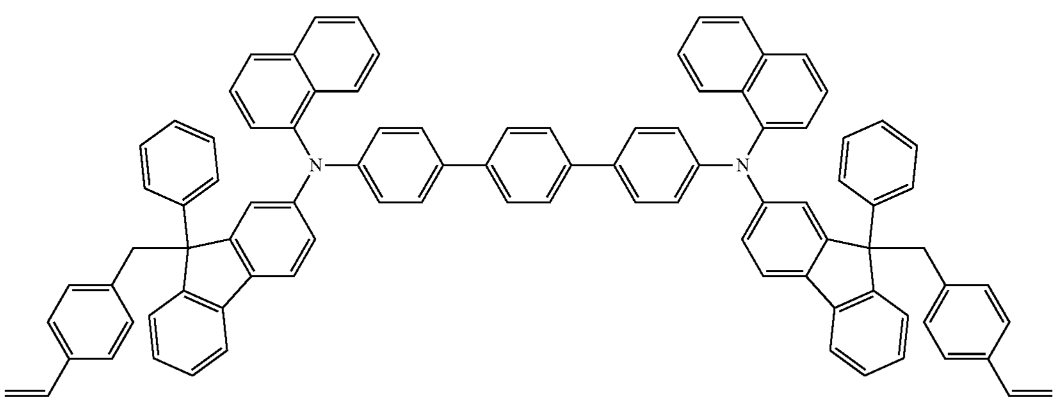

-continued
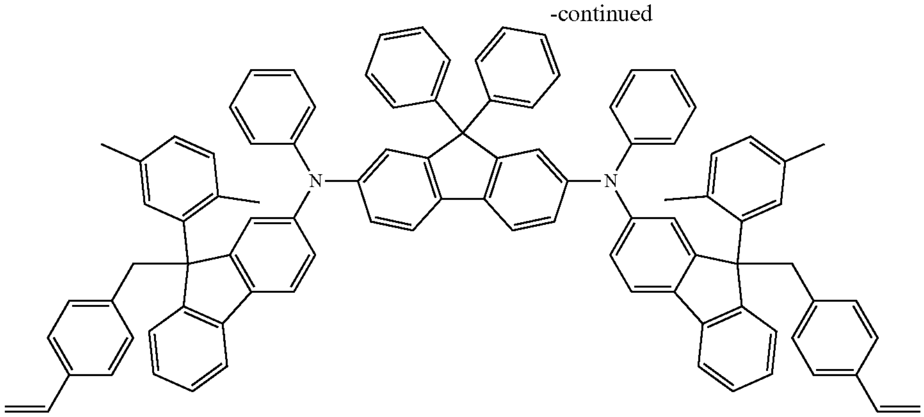
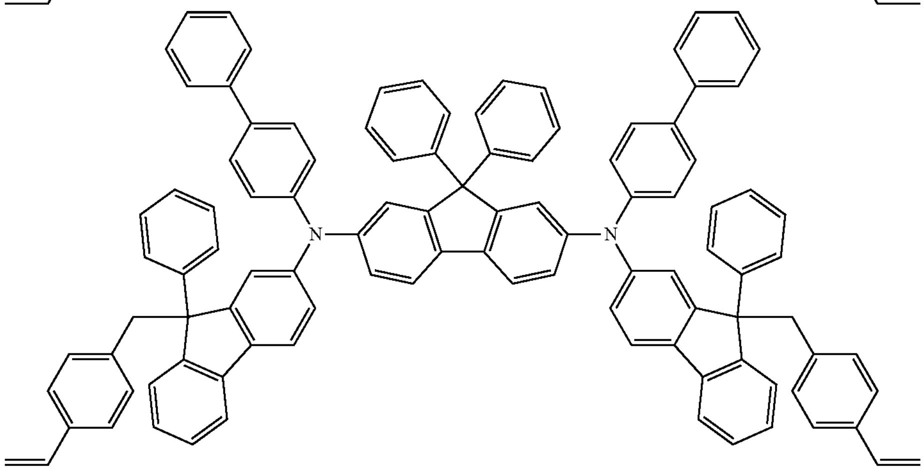
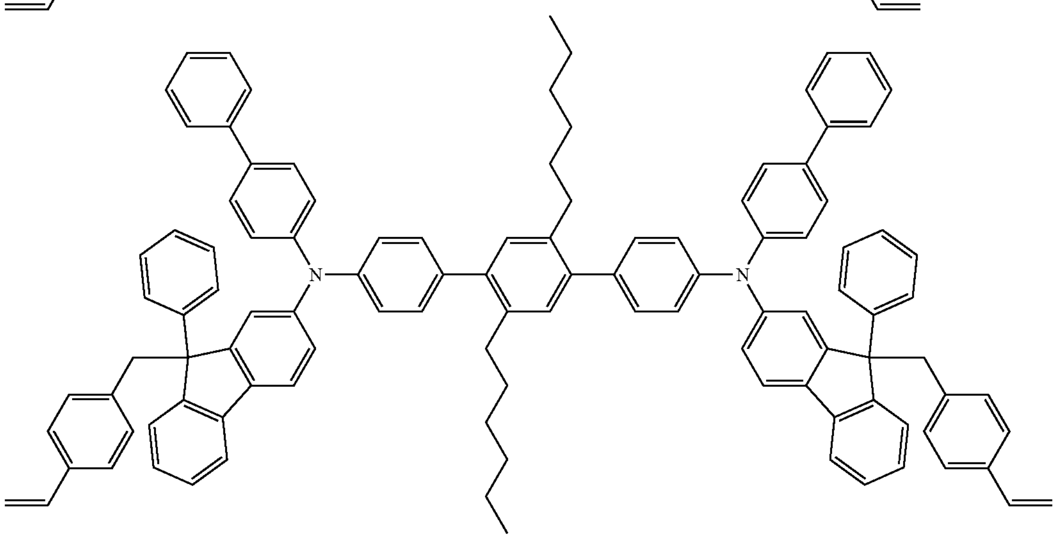
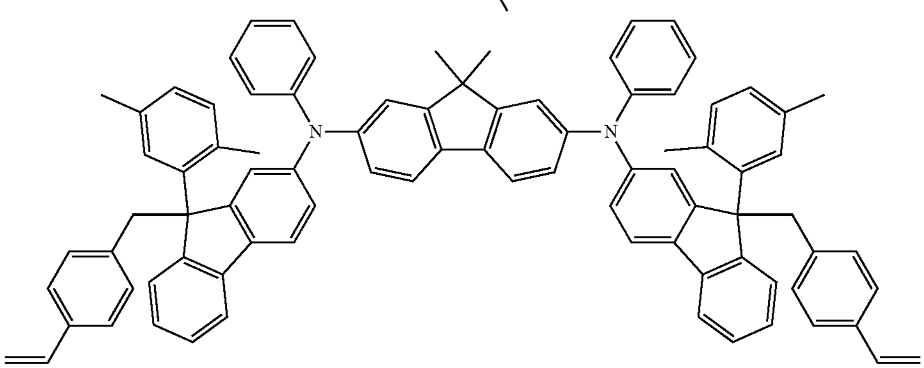

-continued
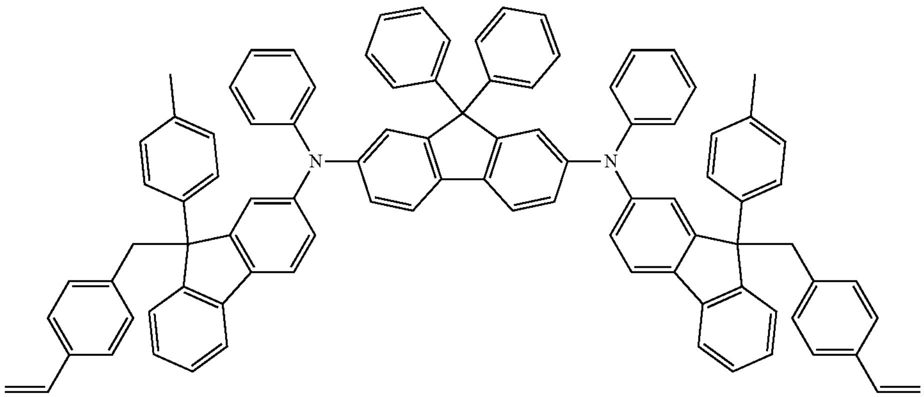
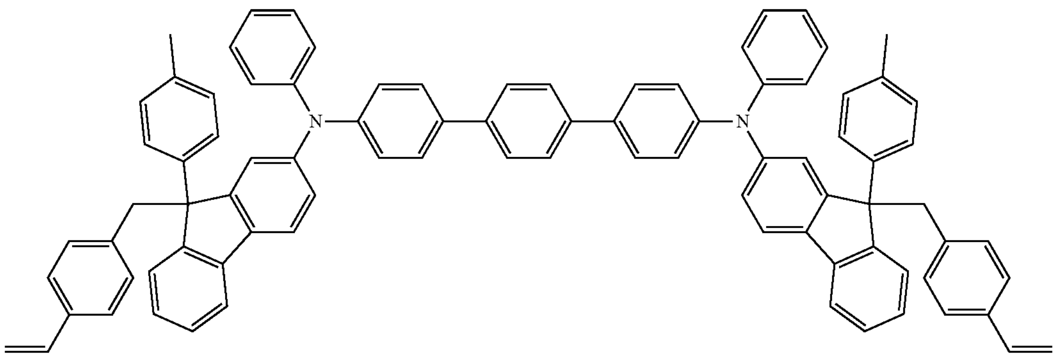
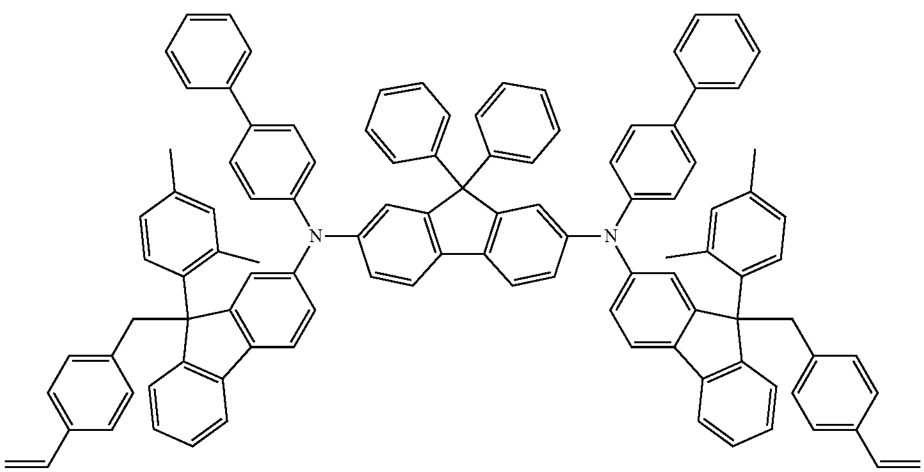
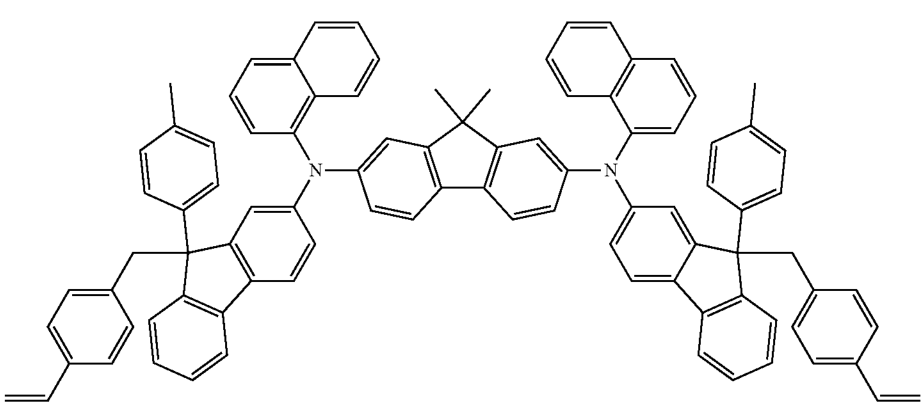

-continued
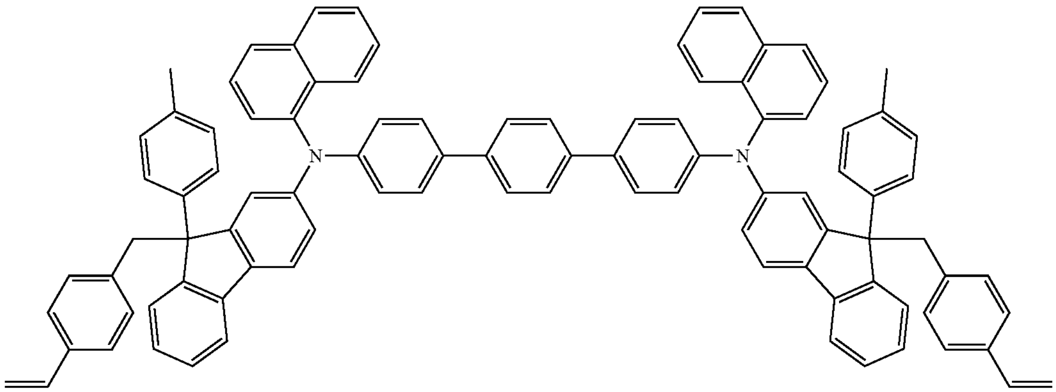
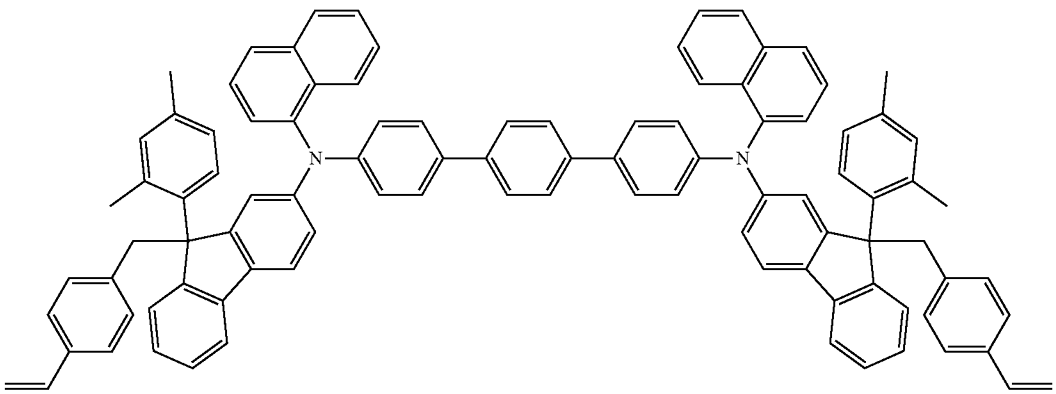
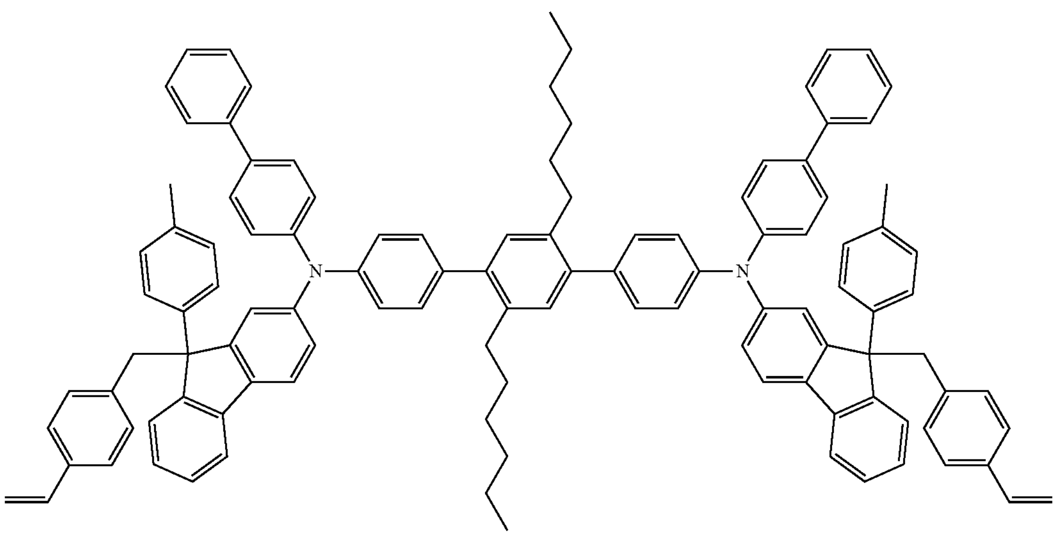
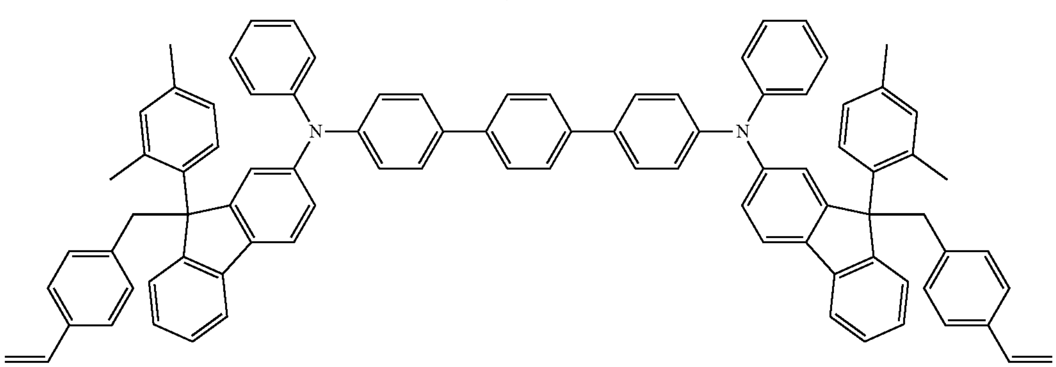

-continued
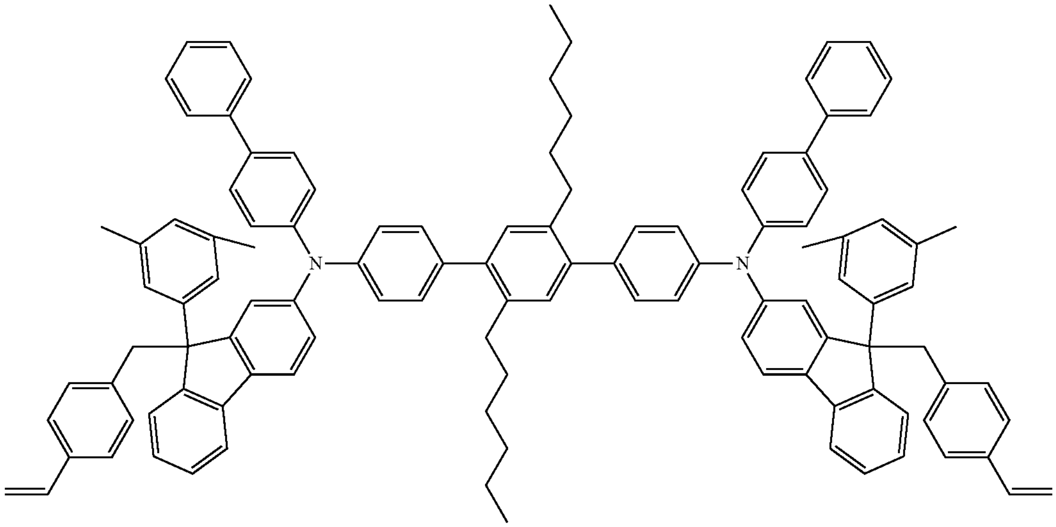
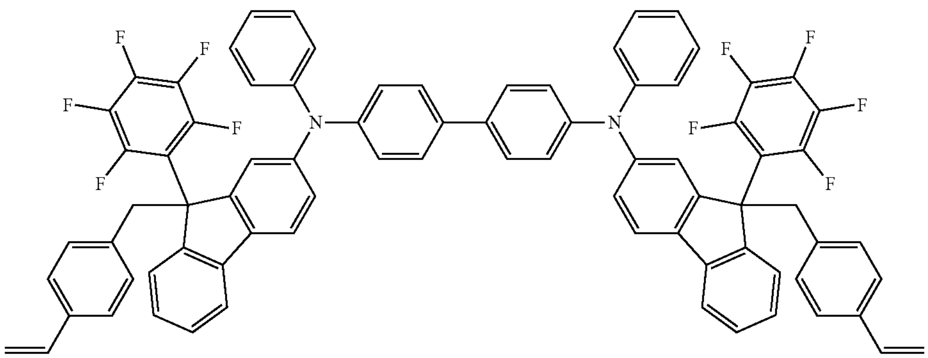
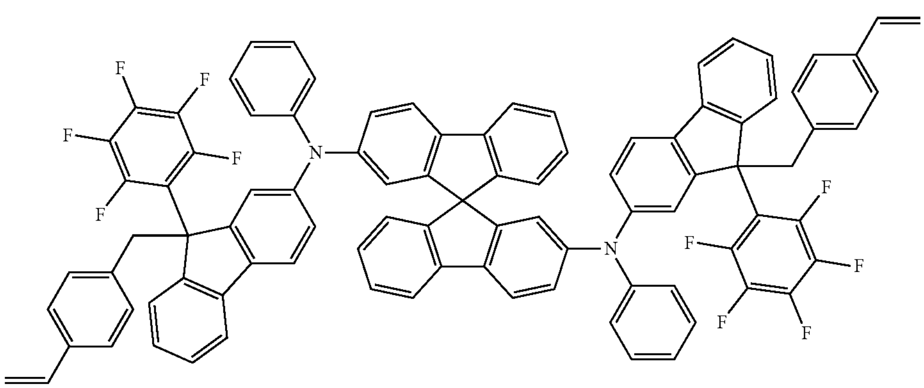
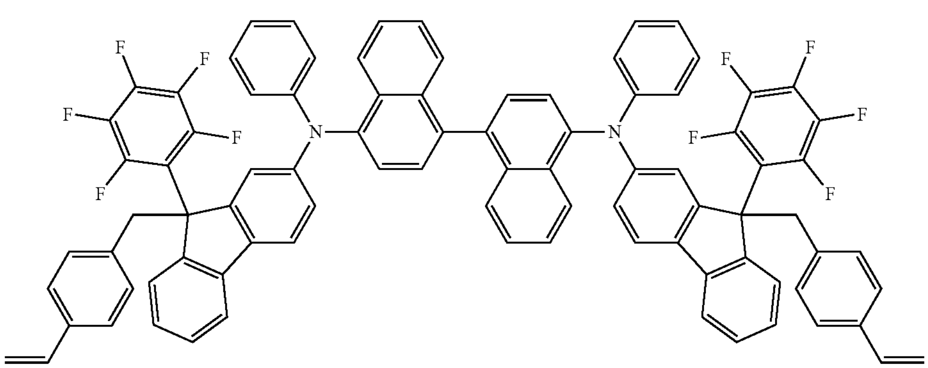

-continued
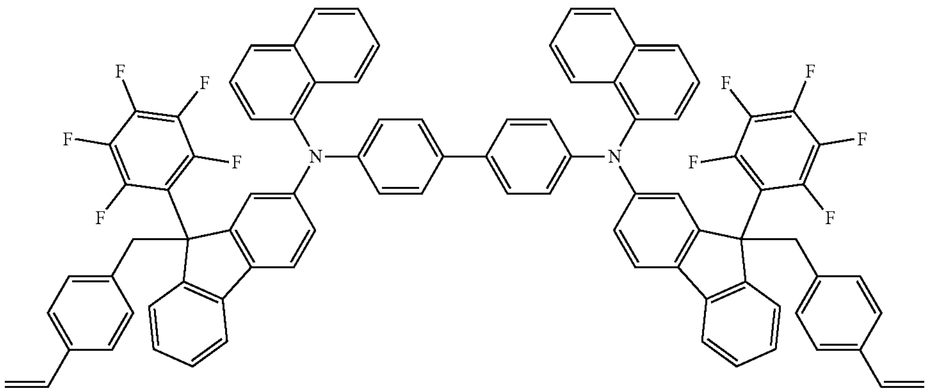
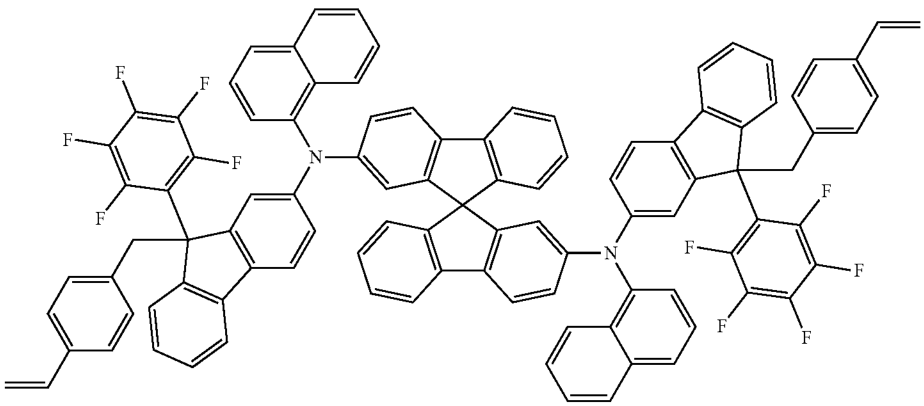
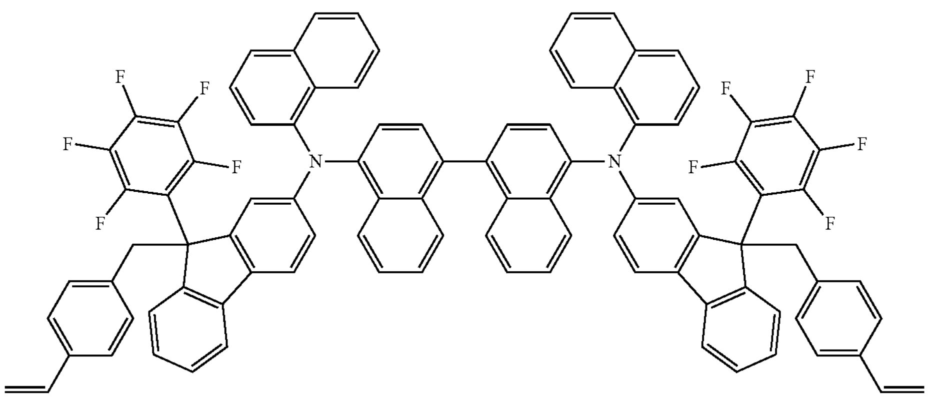
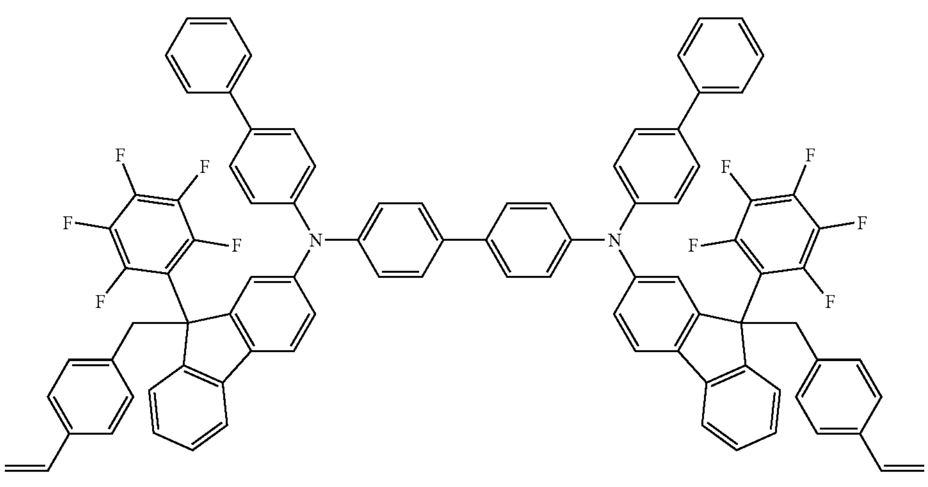

-continued
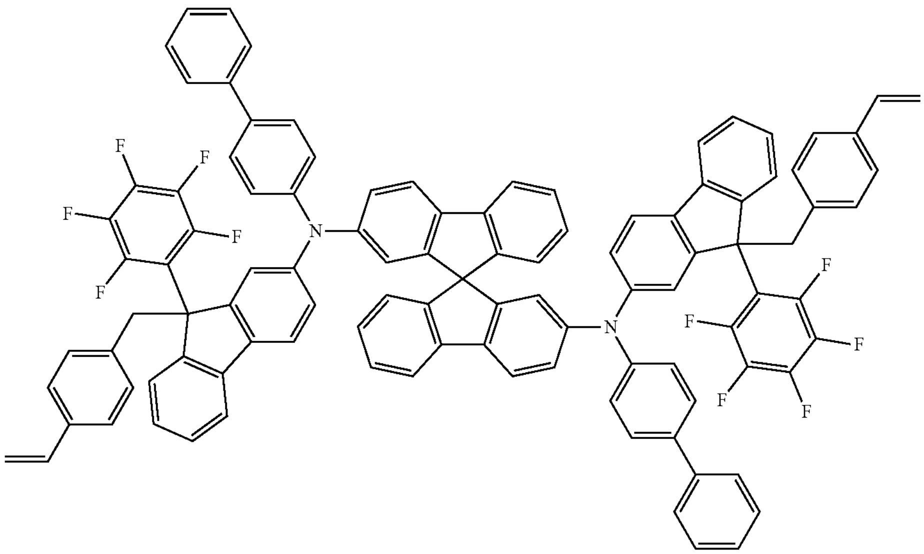
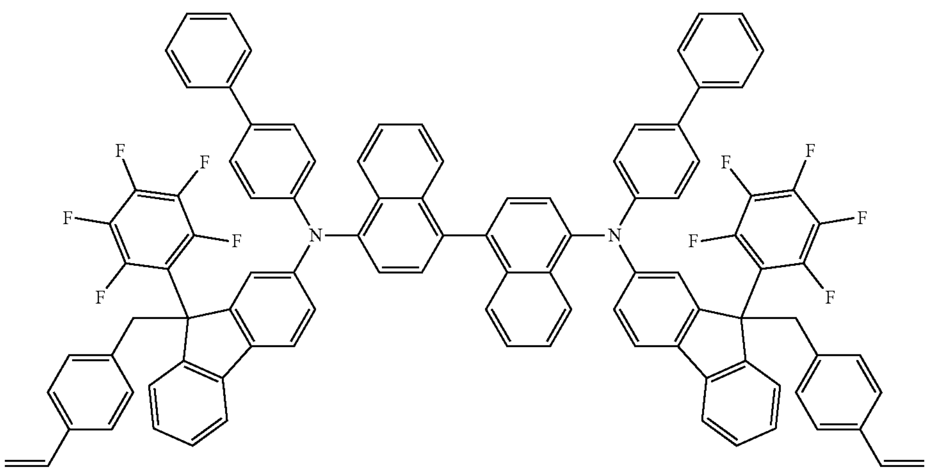
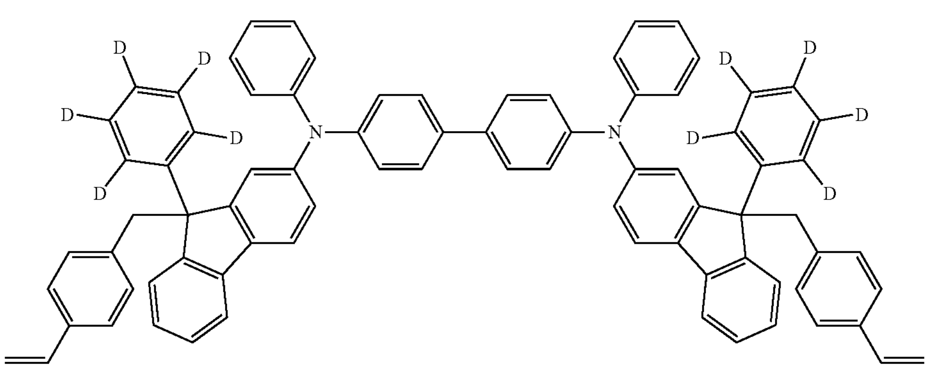

-continued
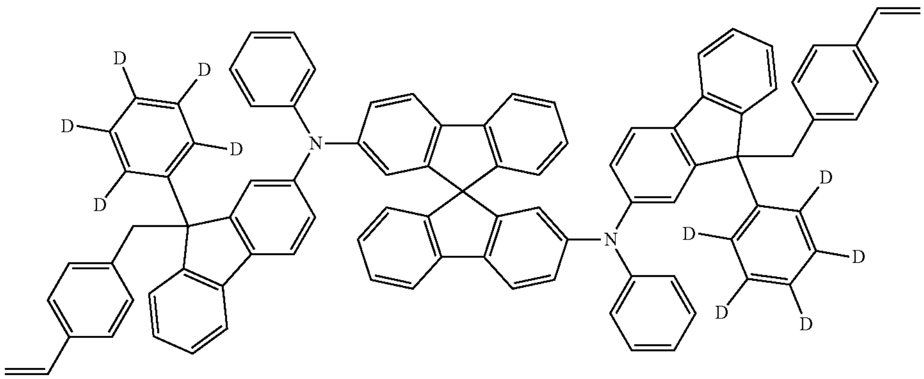
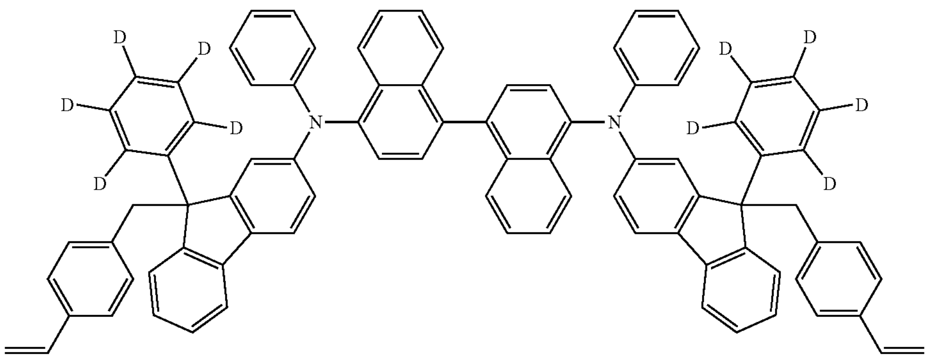
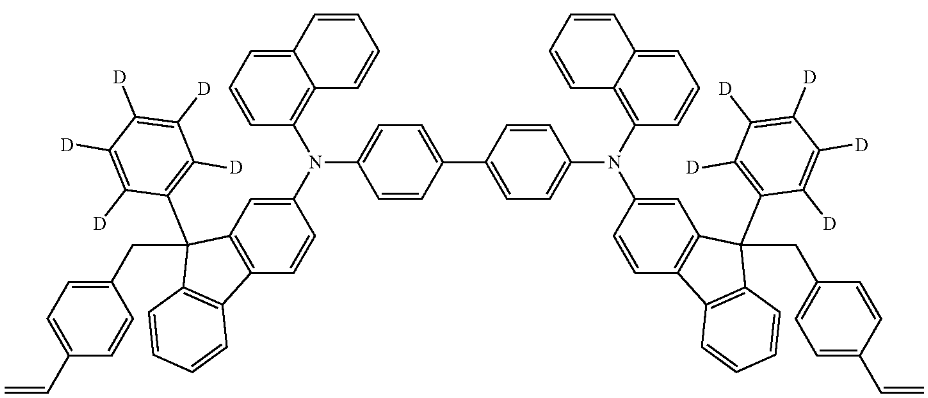
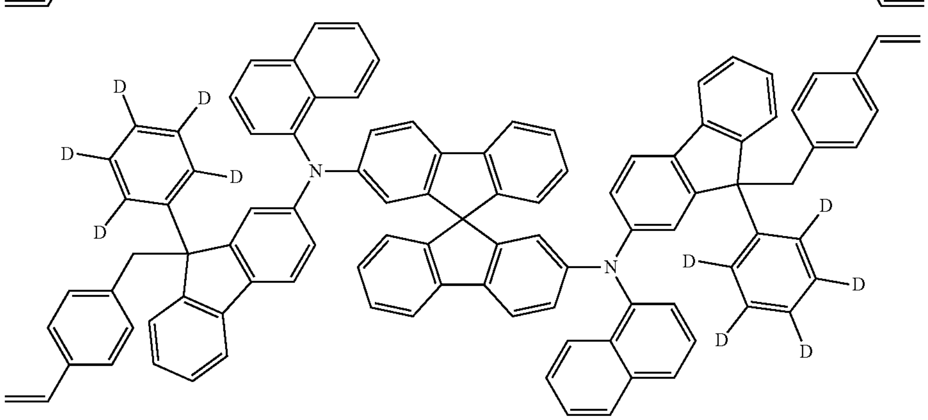

-continued
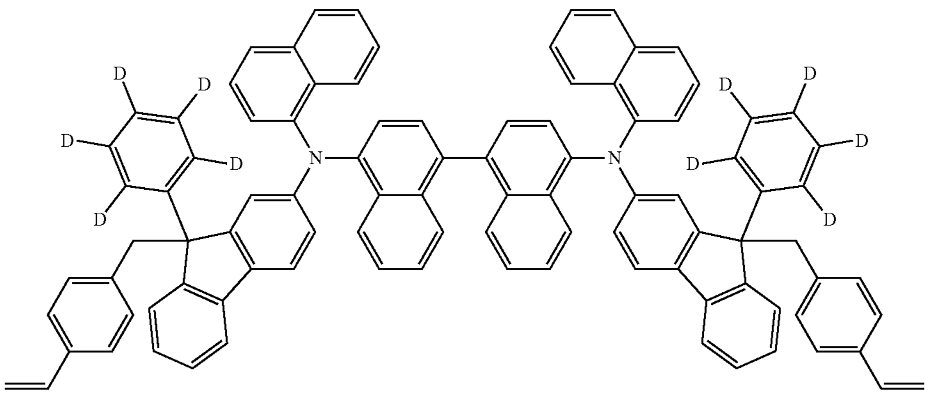
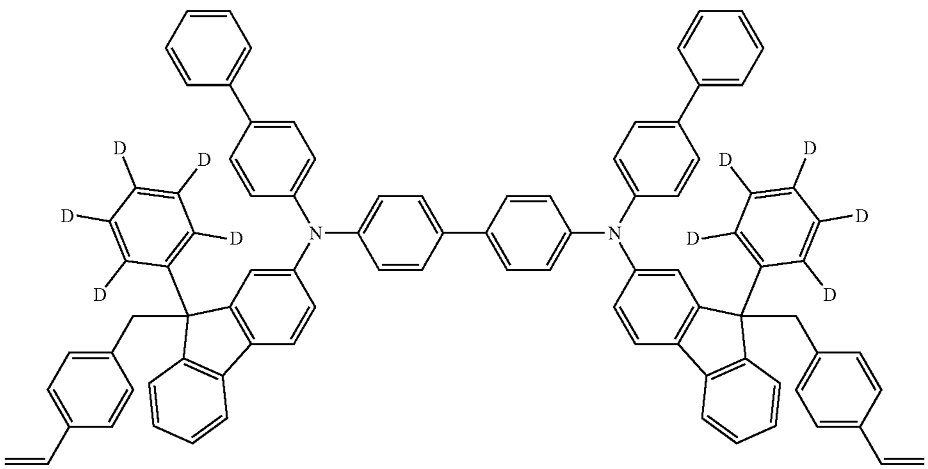
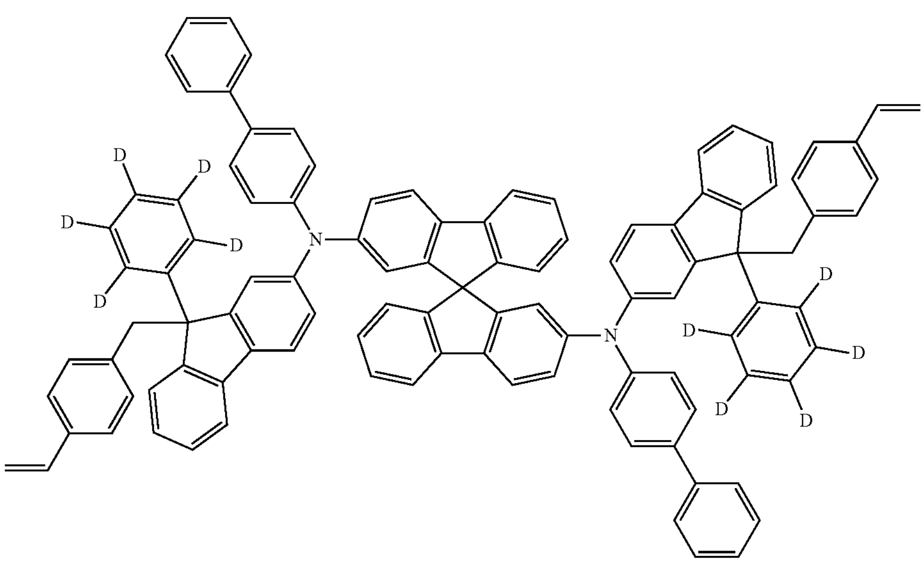

-continued
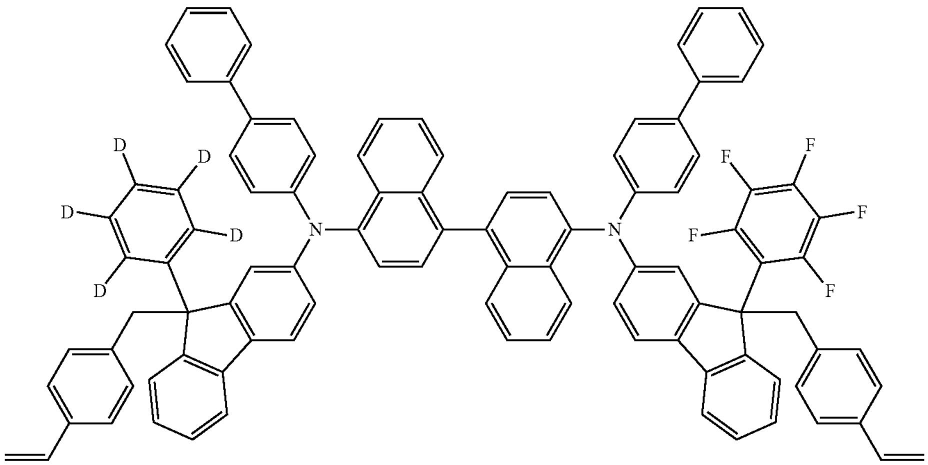
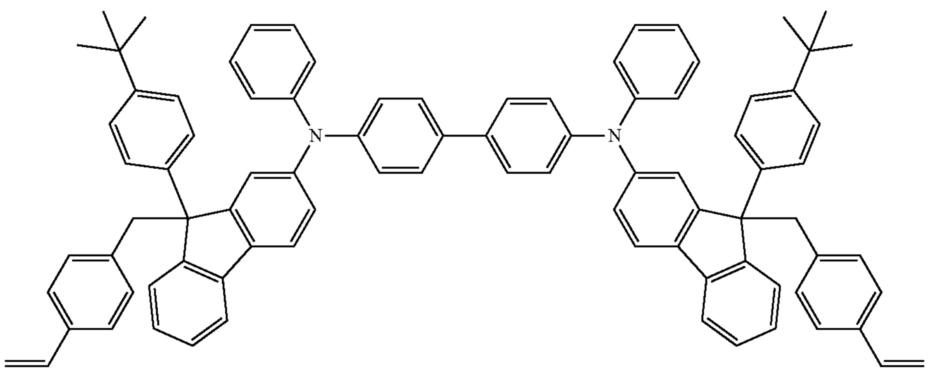
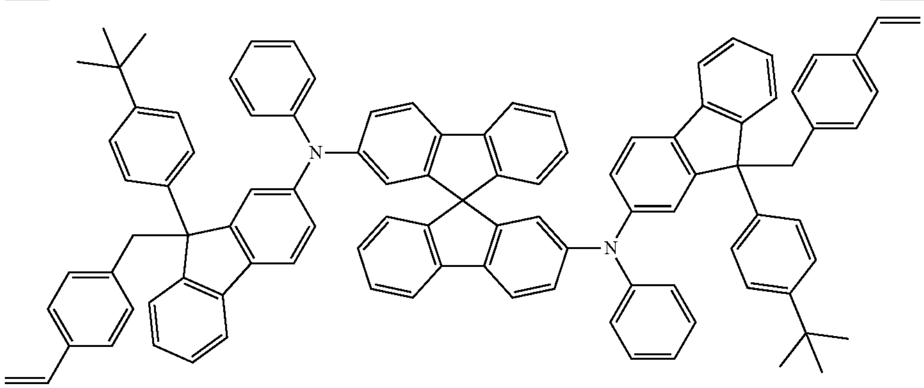
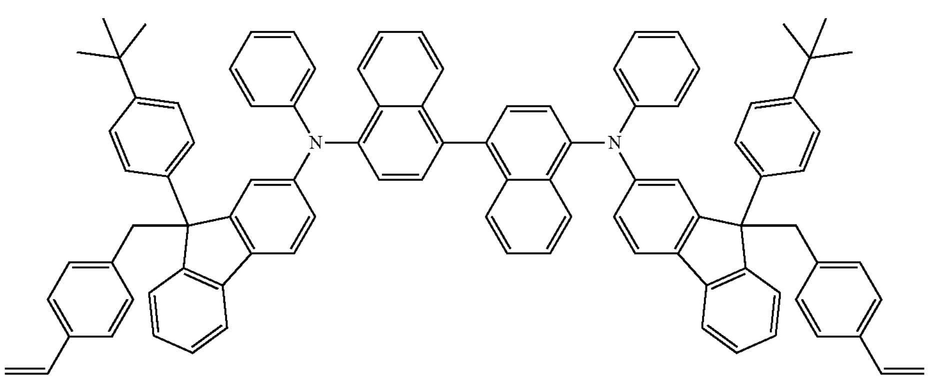

-continued
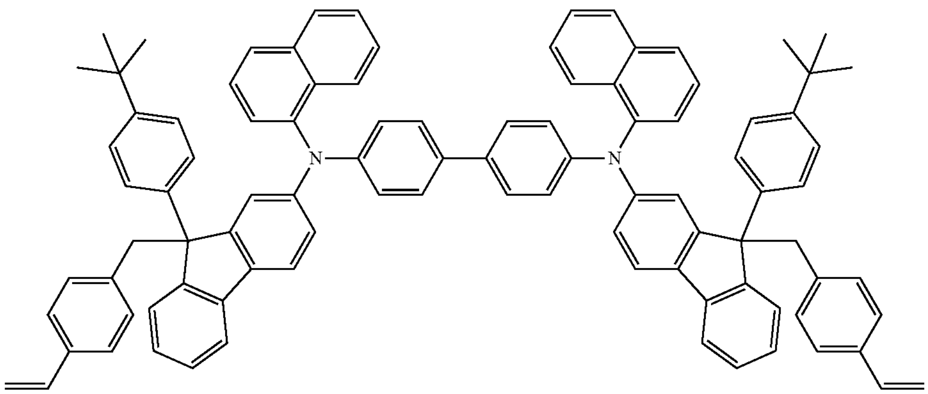
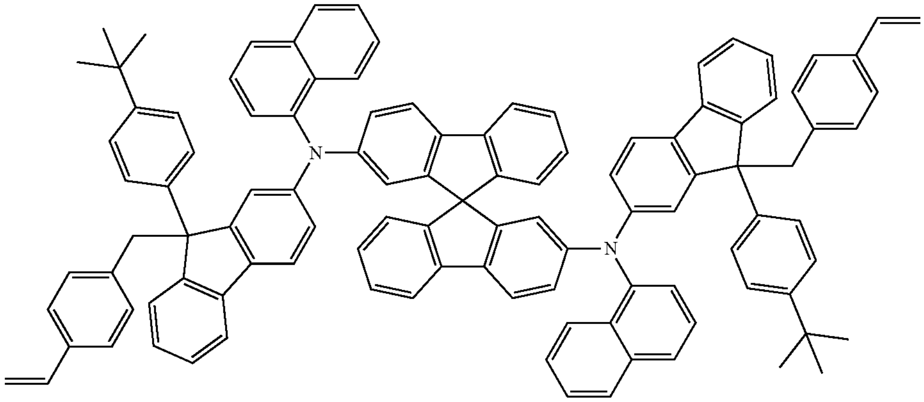
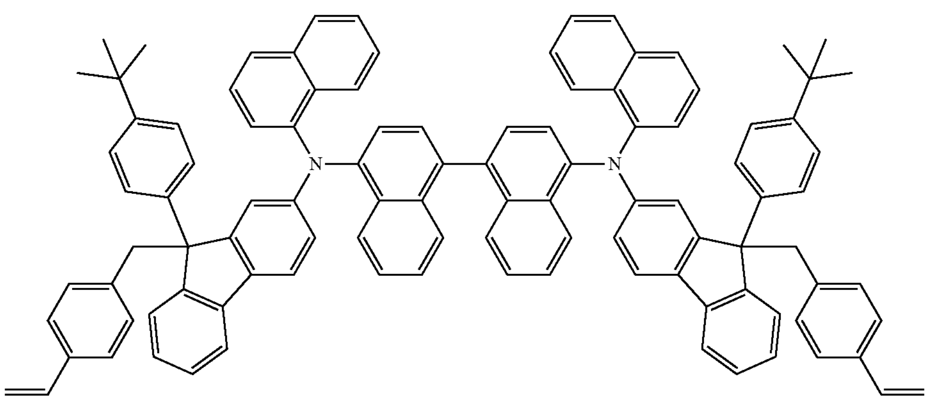
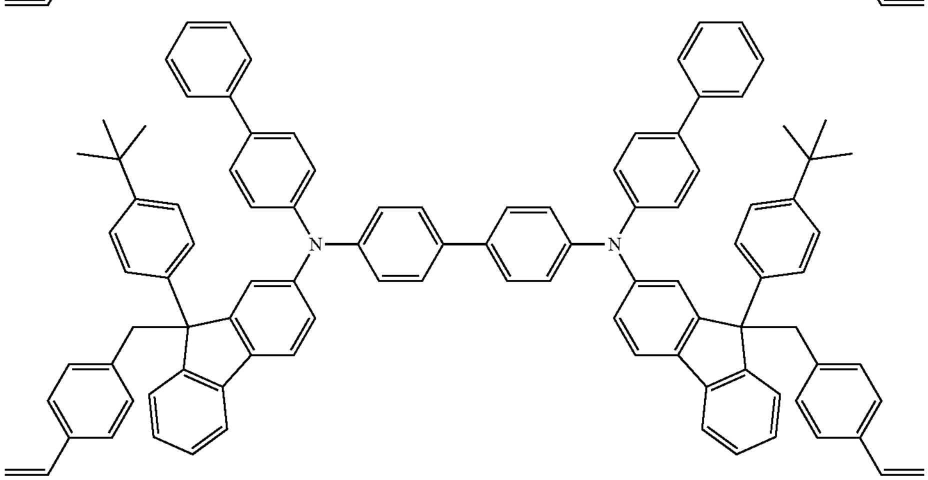

-continued
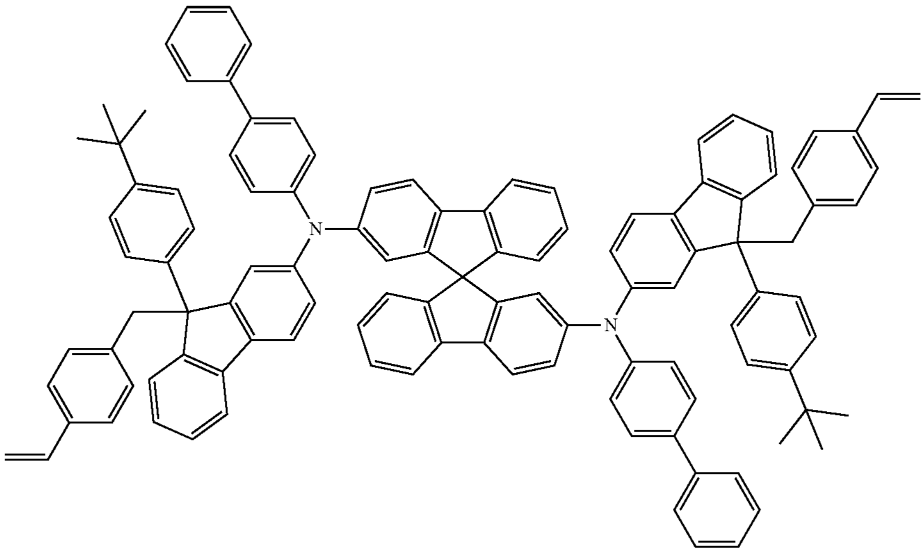
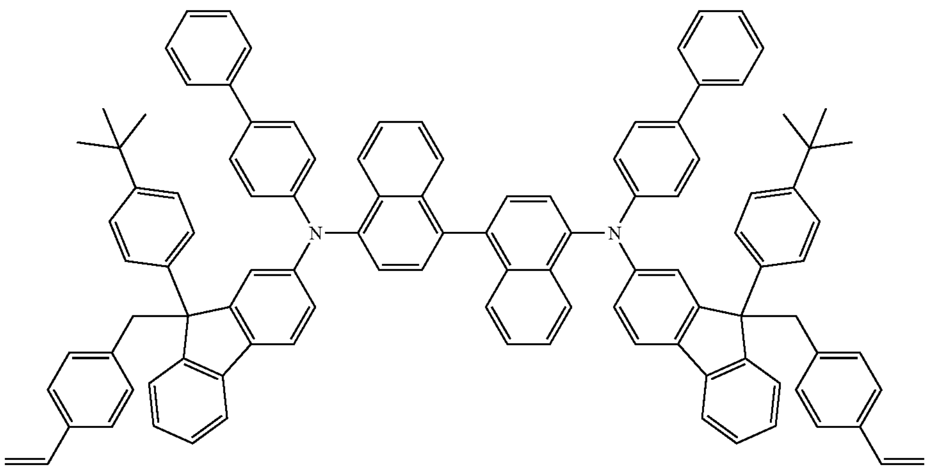
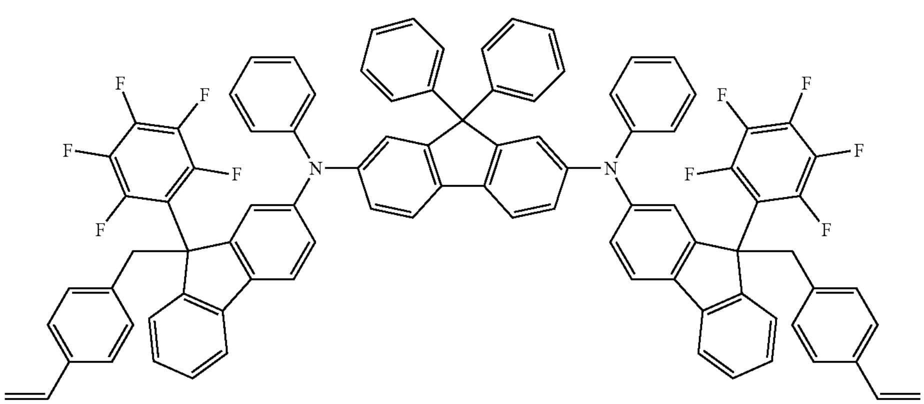

-continued
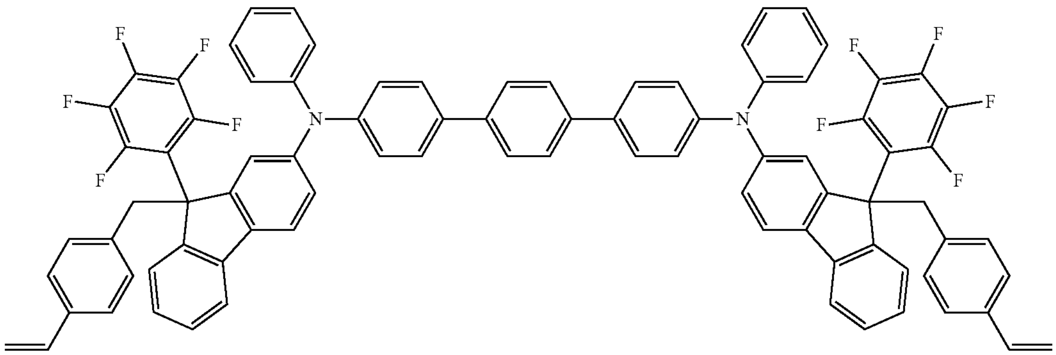
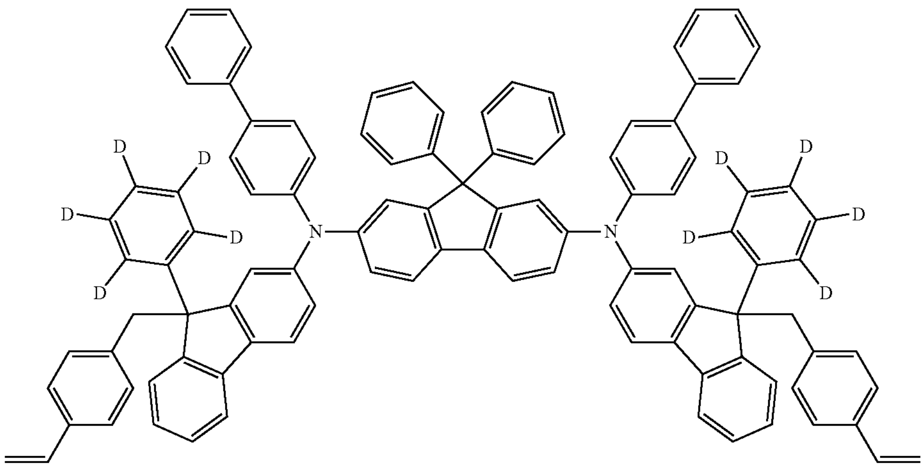
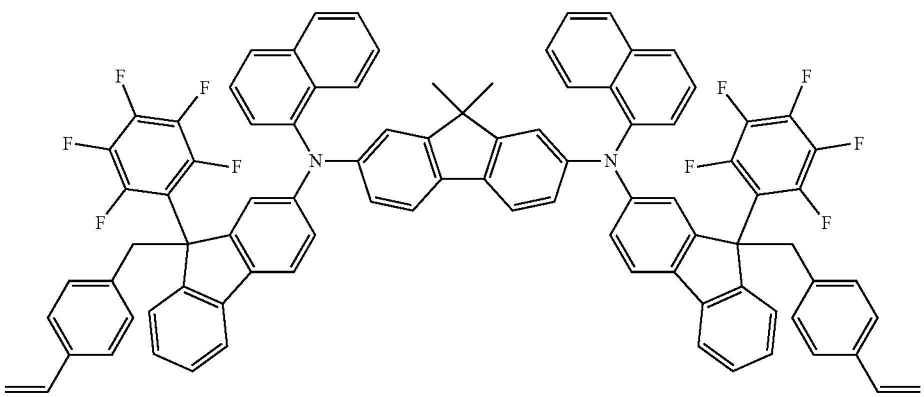
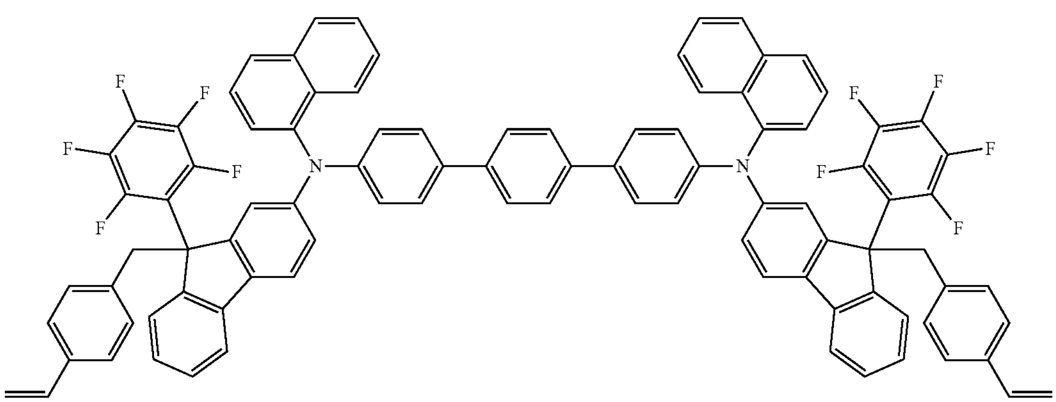

-continued
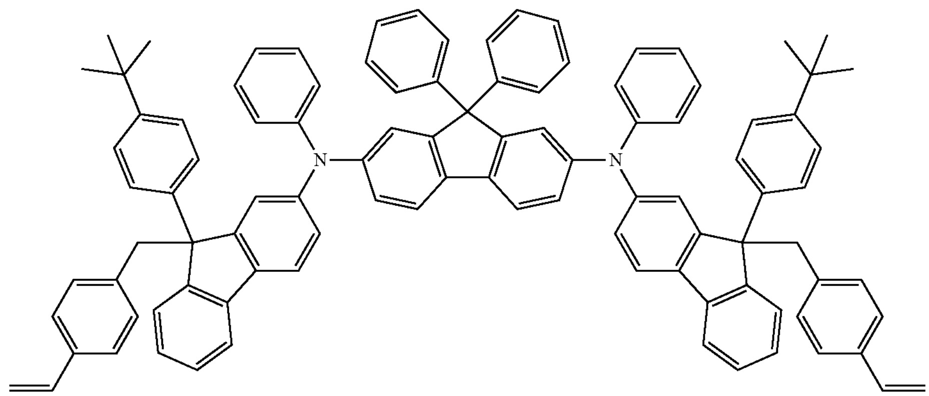
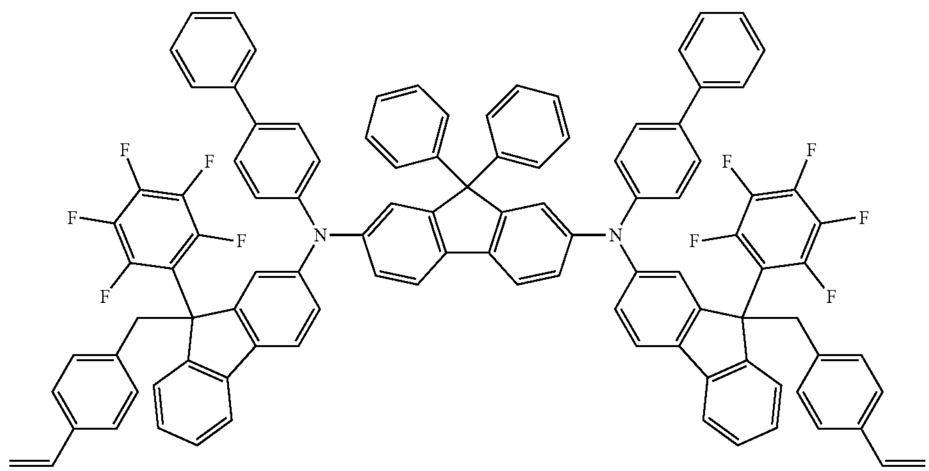
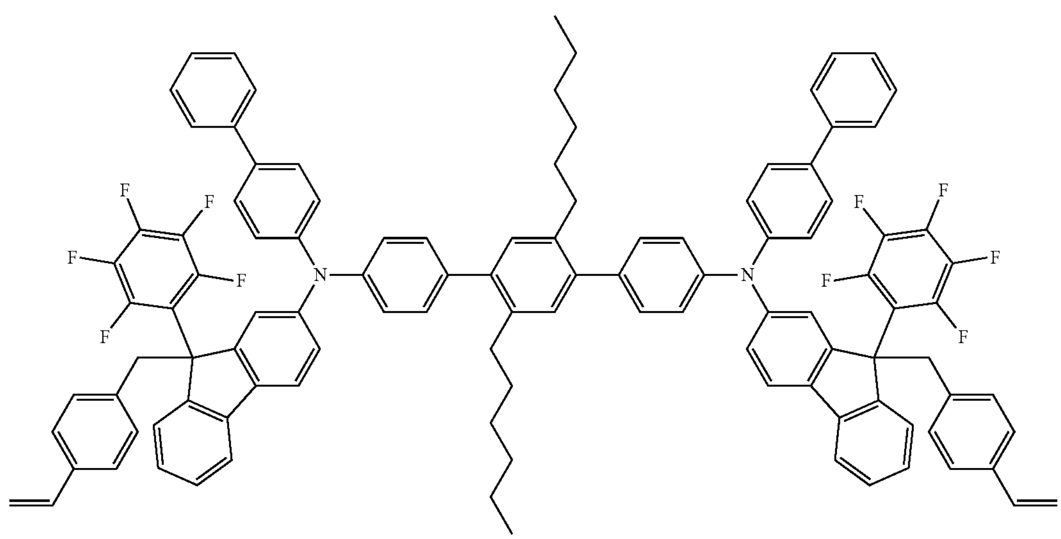

-continued
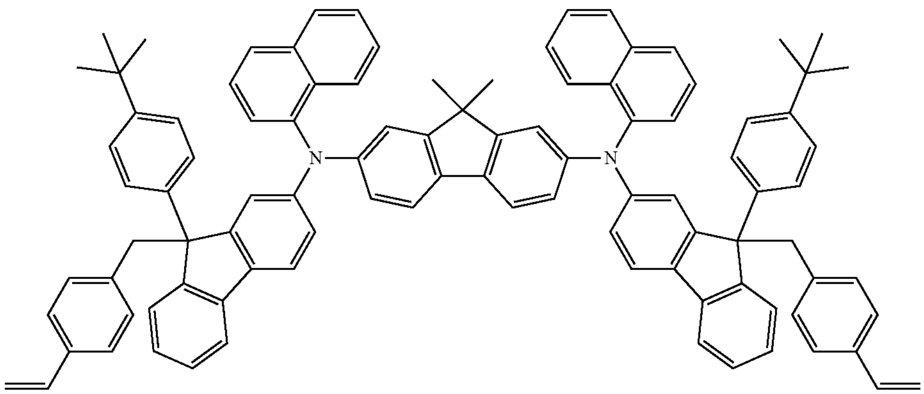
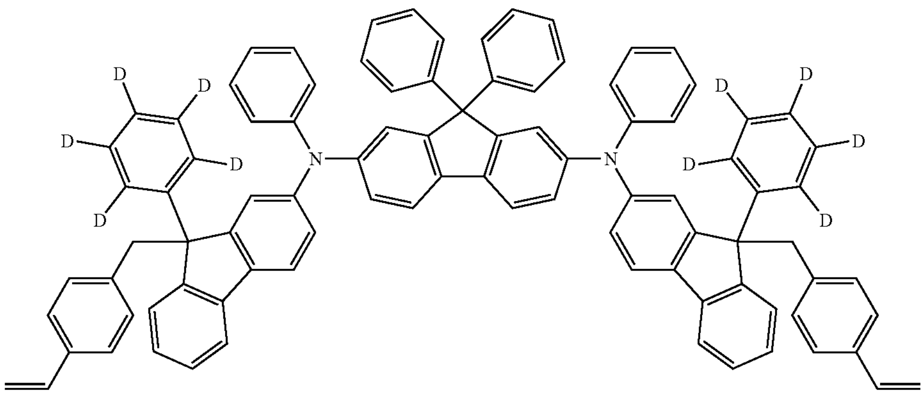
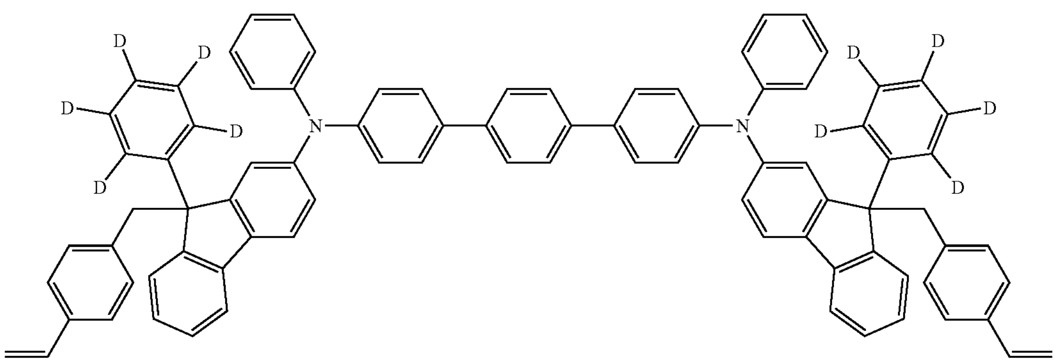
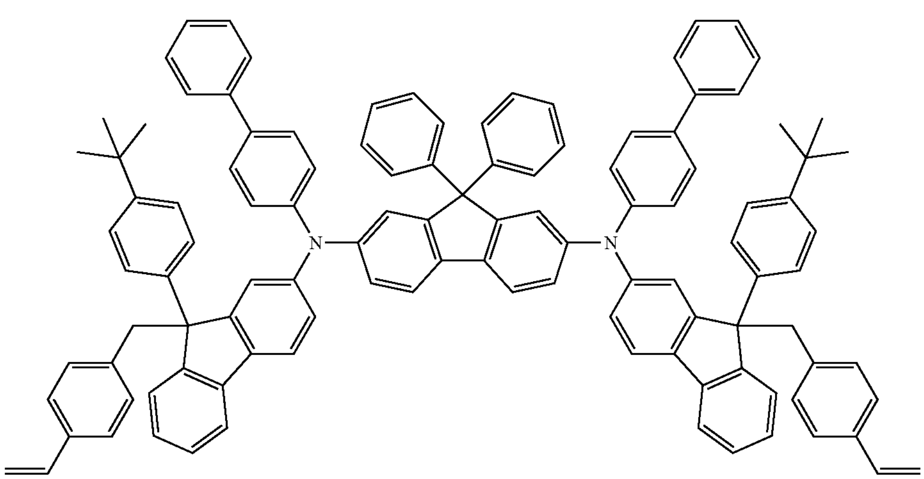

-continued
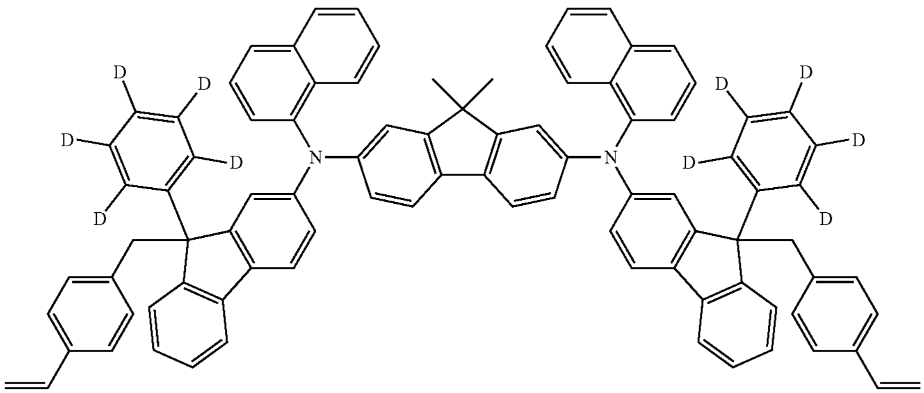
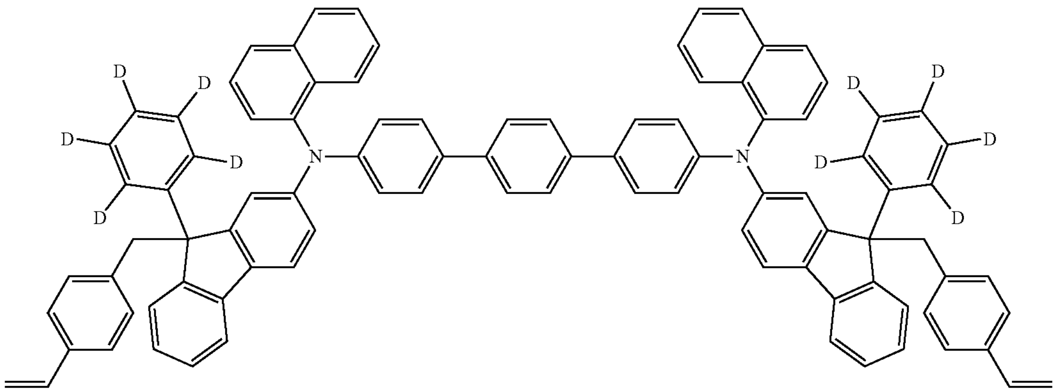
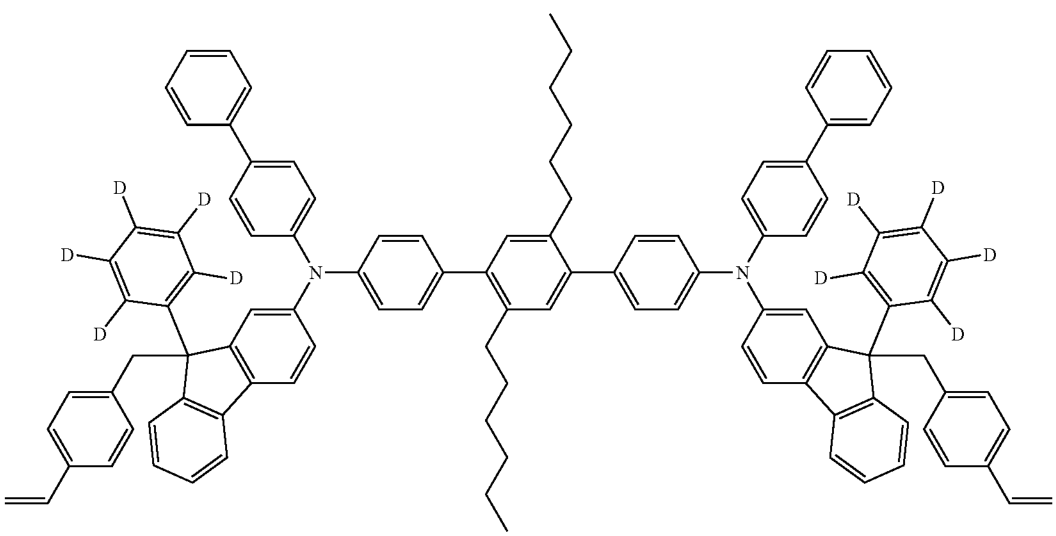
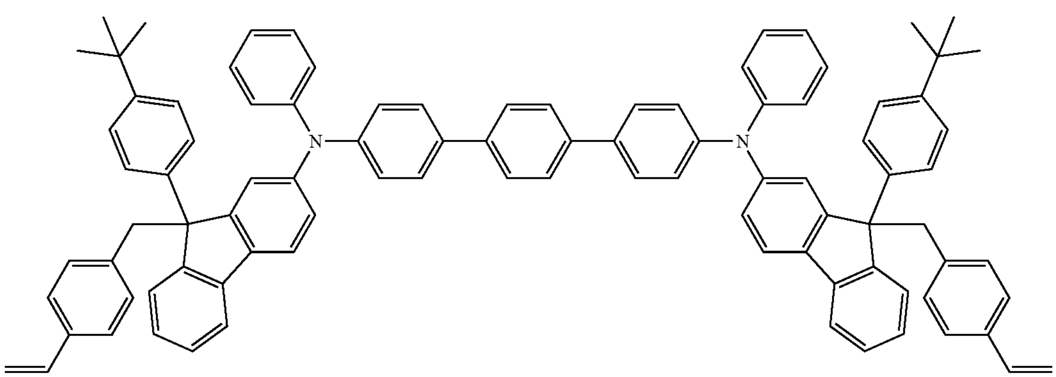

-continued
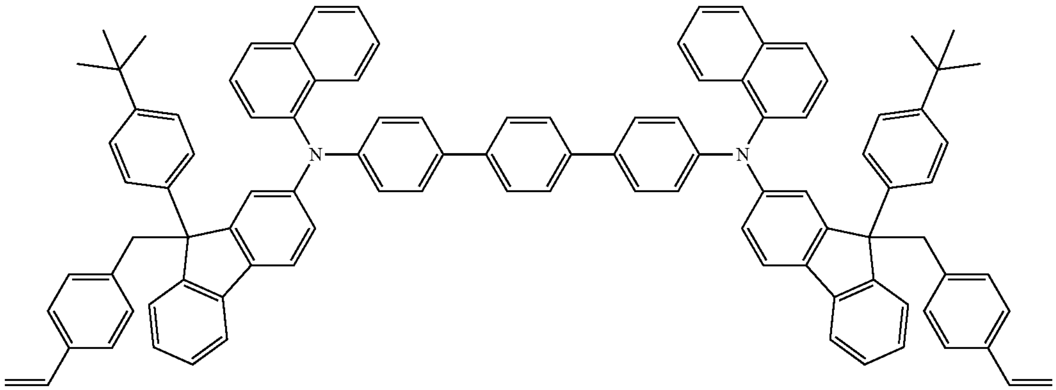
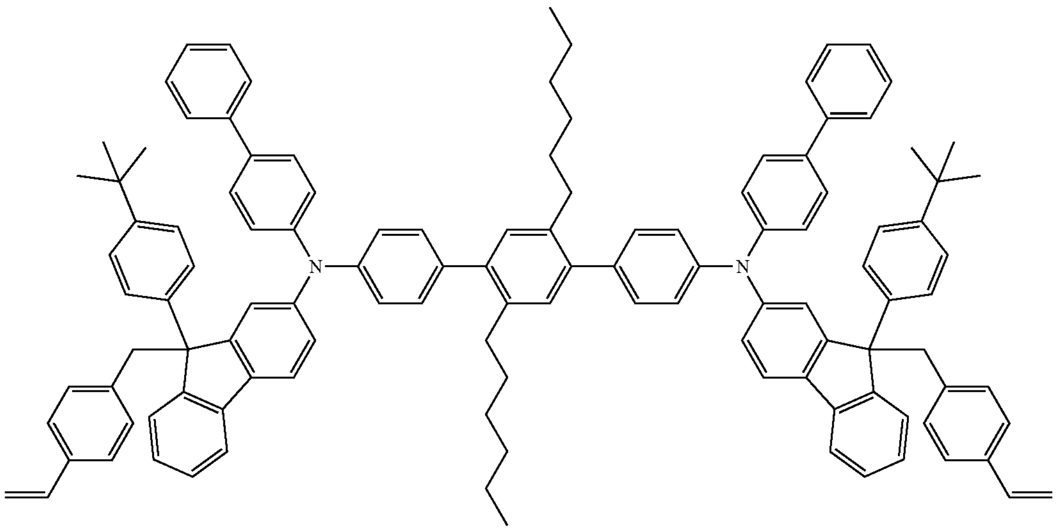
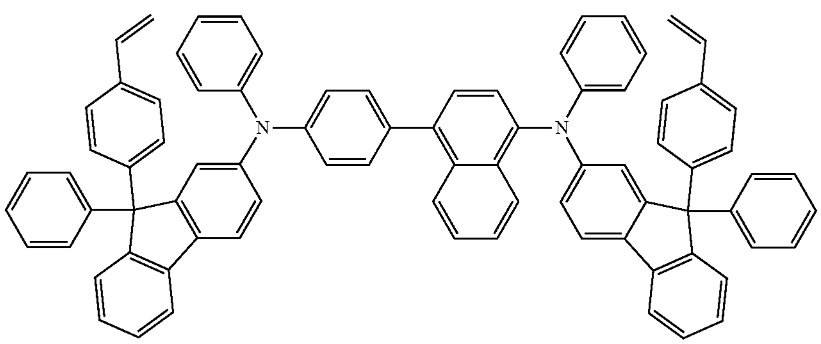
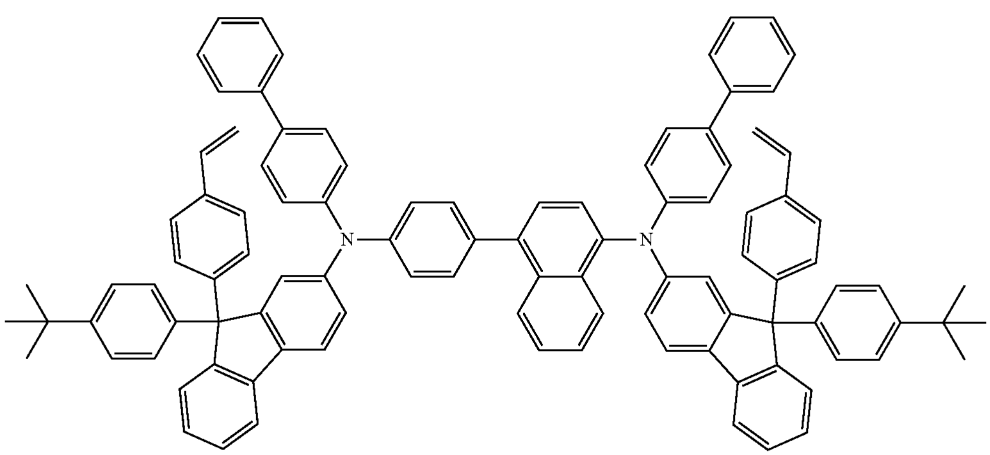

-continued
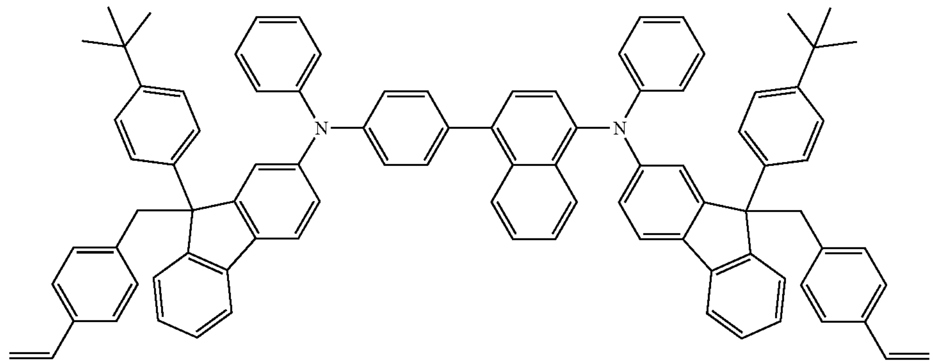
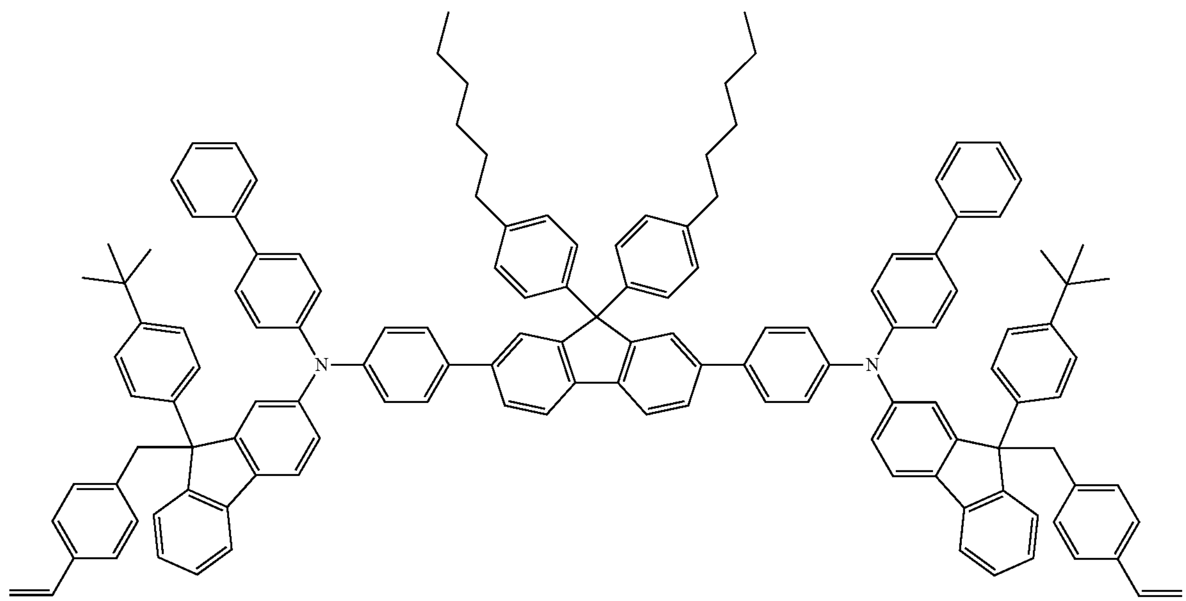
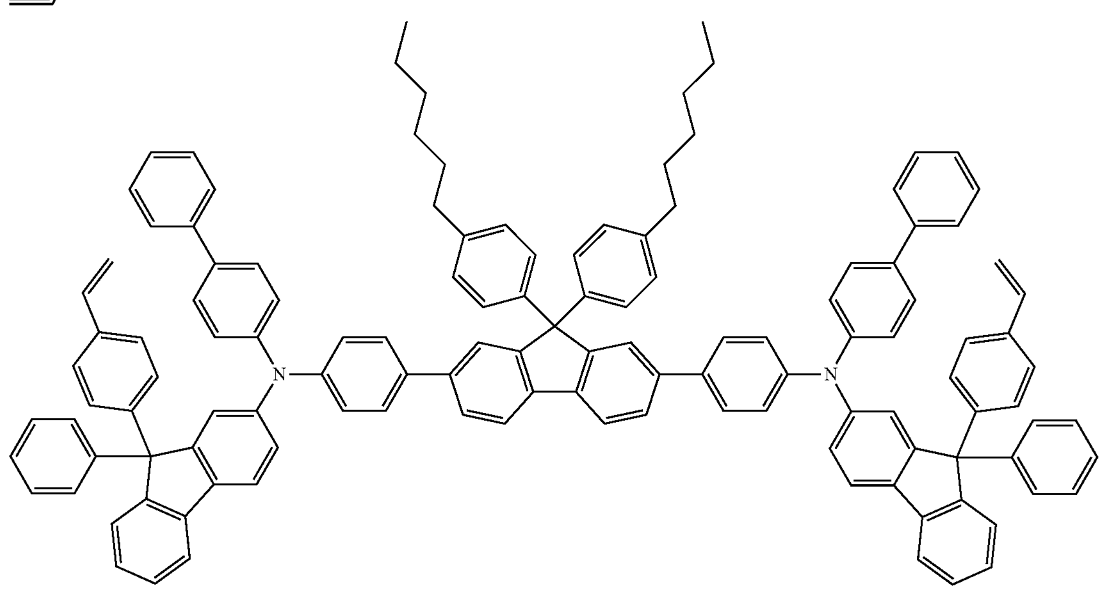

-continued
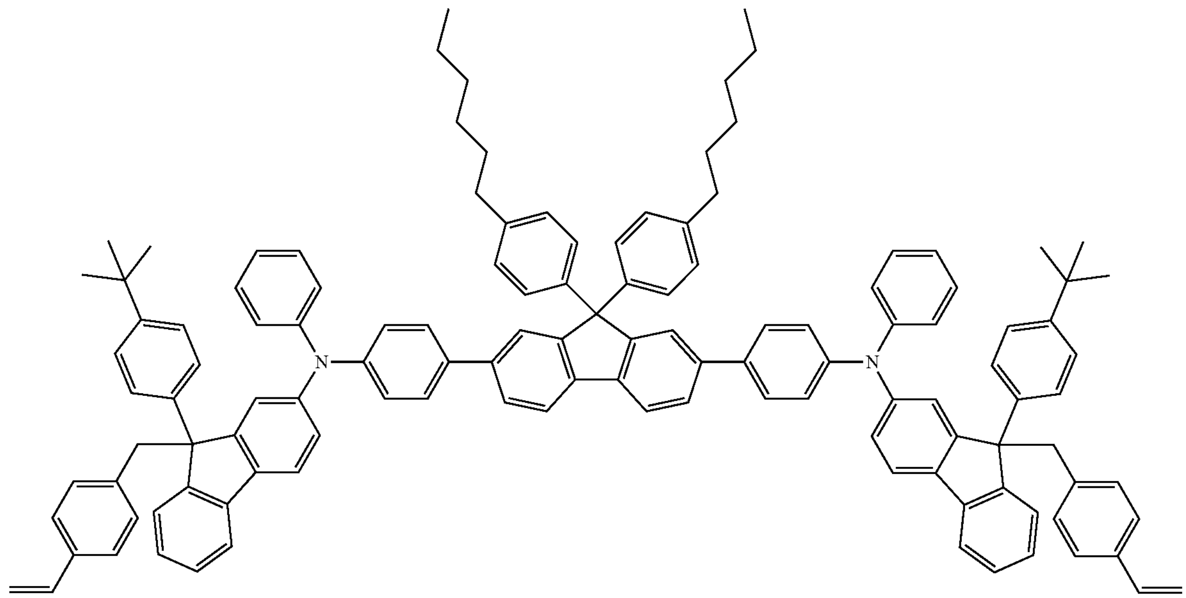
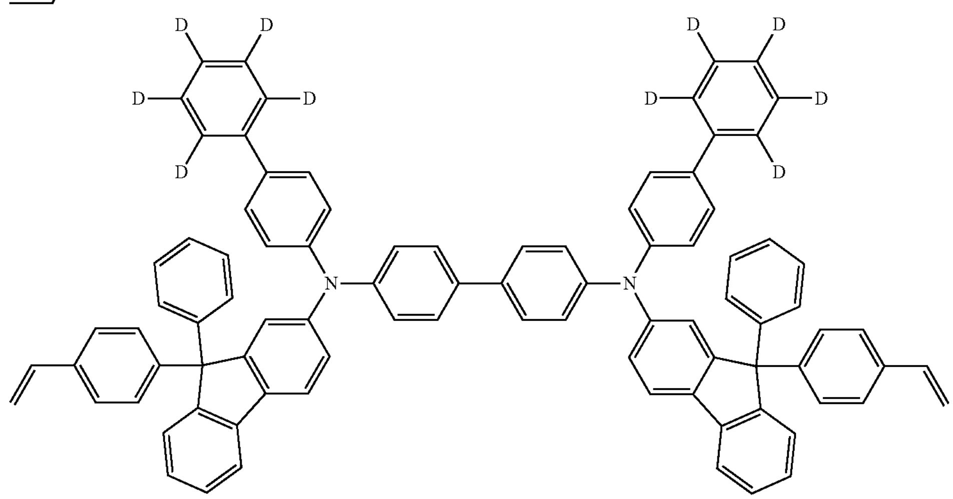
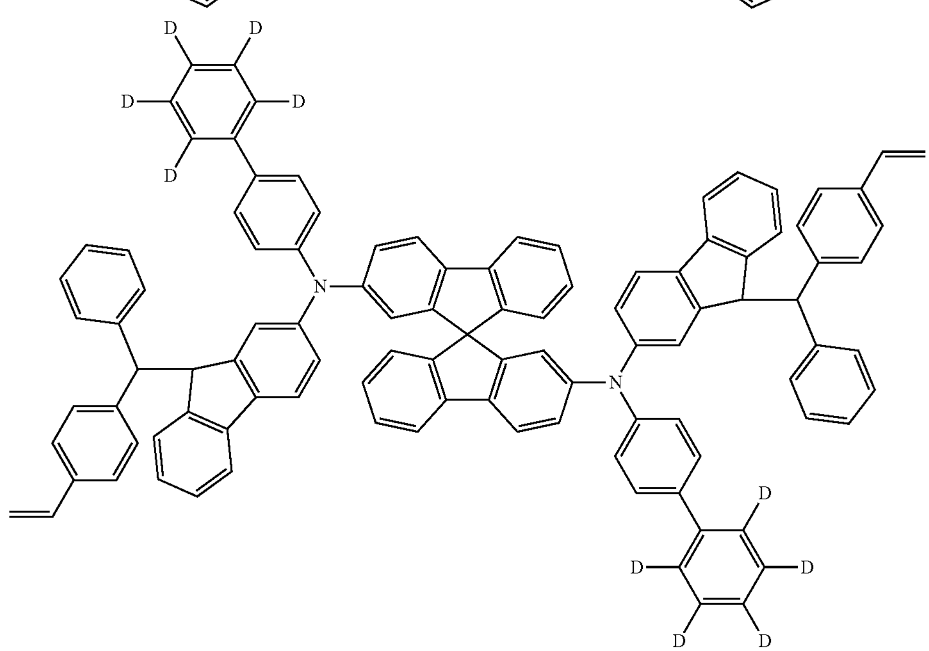

-continued
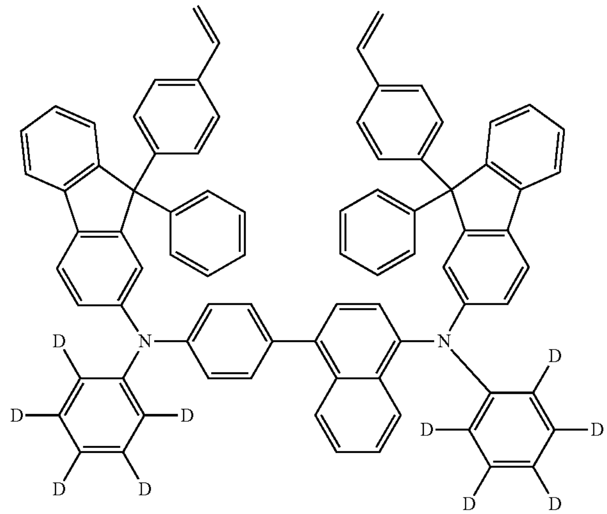
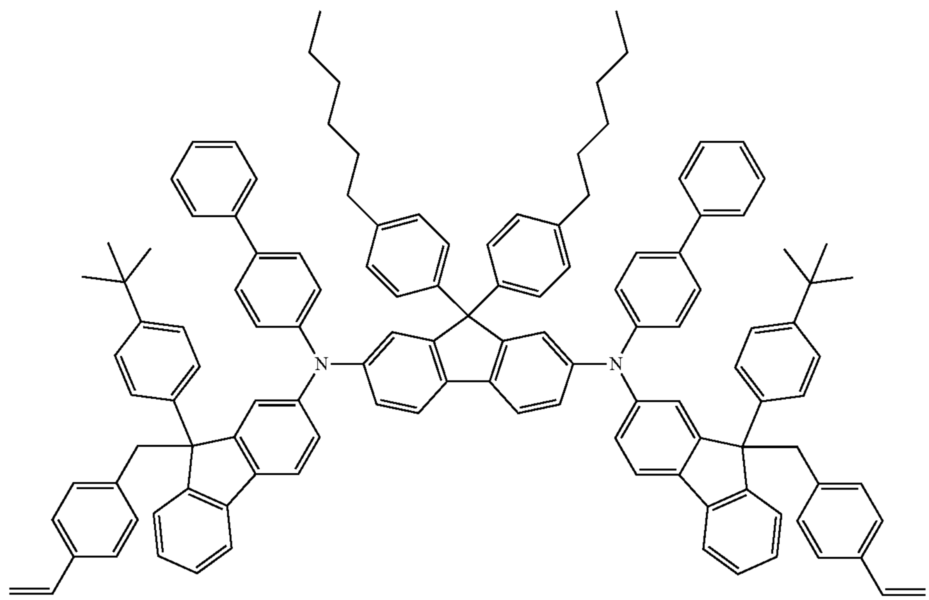
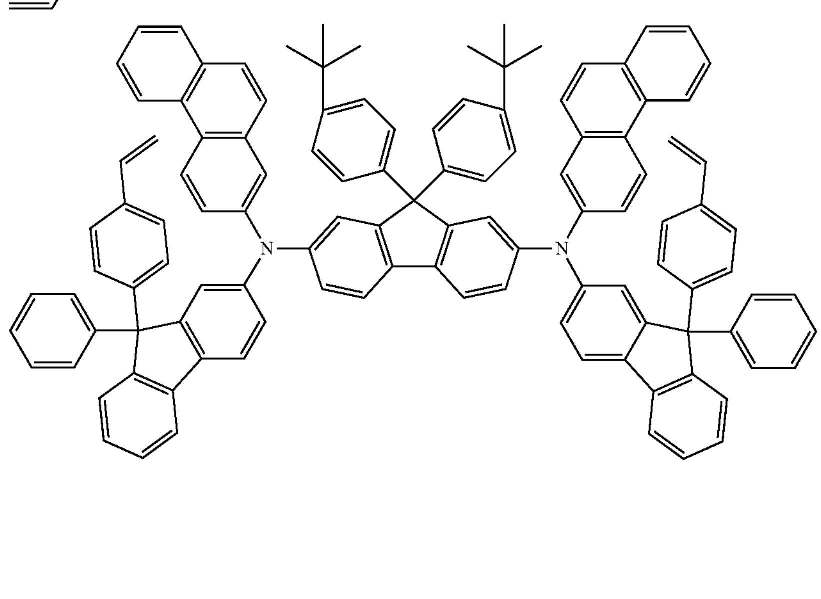

-continued

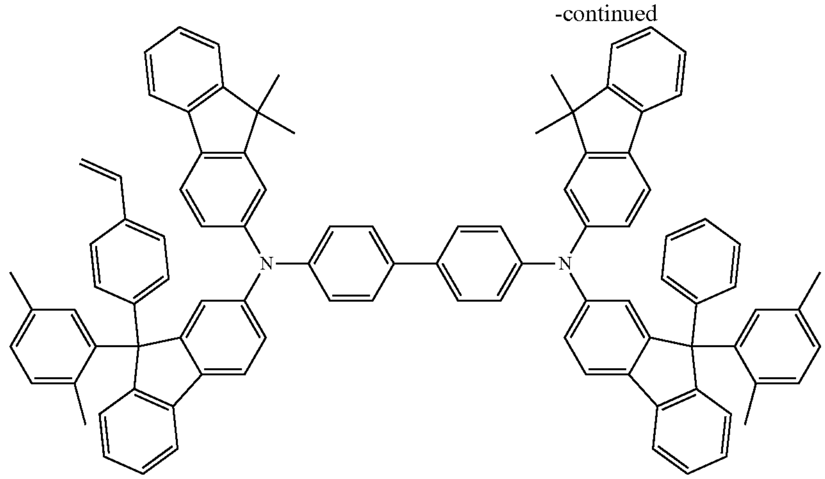

10. The organic light emitting device according to claim 1, wherein x:y is 0.5 to 0.99:0.01 to 0.5.

11. The organic light emitting device according to claim 1, wherein $L'_1$ is phenylene, -(phenylene)O(phenylene)-, -(phenylene)$(CH_2)_6$(phenylene)-; -(phenylene)$O(CH_2)_6O$—; or -(phenylene)$CH_2OCH_2$(phenylene)-.

12. The organic light emitting device according to claim 1, wherein $L'_2$ and $L'_3$ are each independently a single bond or phenylene.

13. The organic light emitting device according to claim 1, wherein $Ar'_1$ to $Ar'_4$ are each independently any one selected from the group consisting of the following:

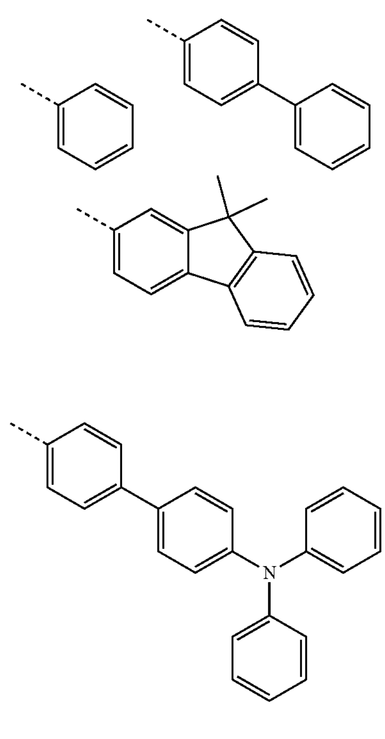

or $Ar'_1$ and $Ar'_2$, or $Ar'_3$ and $Ar'_4$ are bonded to each other, and together with N to which they are attached to form

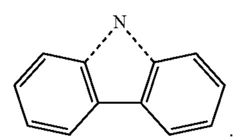

14. The organic light emitting device according to claim 1, wherein the Chemical Formula 2-1 is any one selected from the group consisting of repeating units represented by the following formulas:

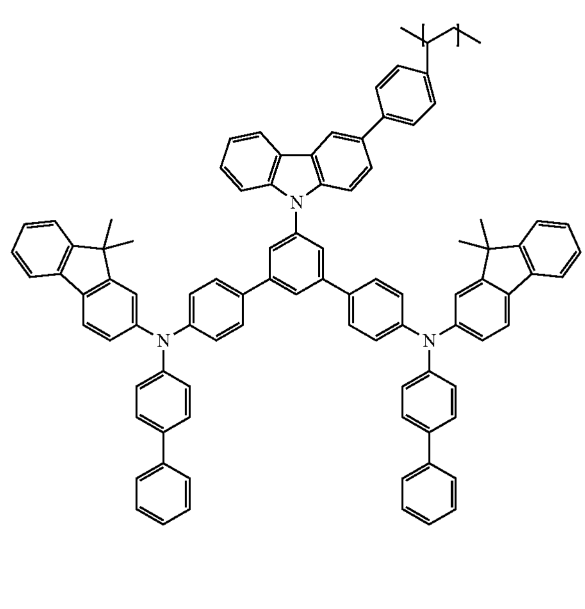

-continued
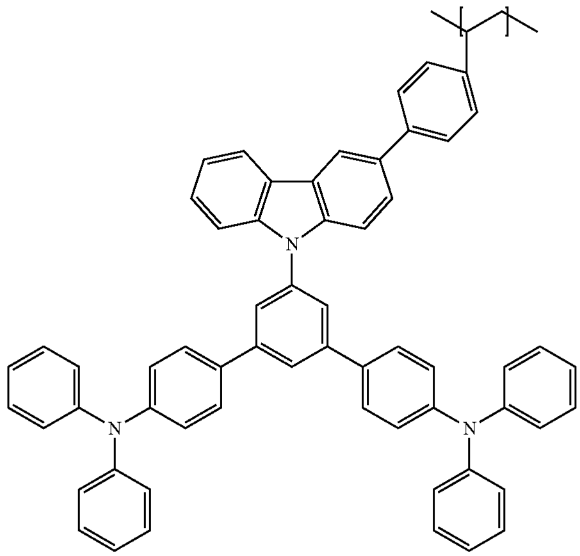
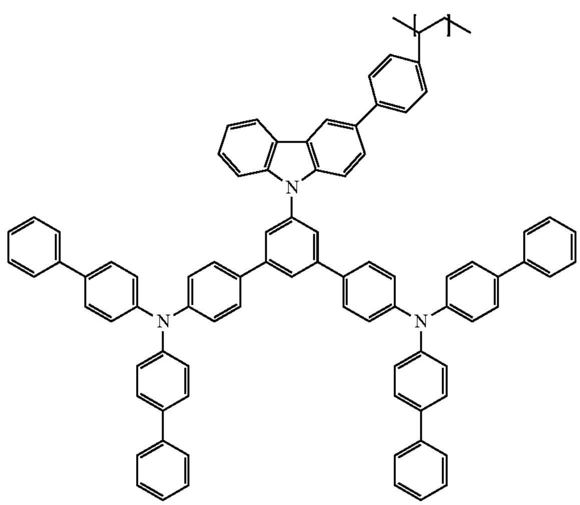
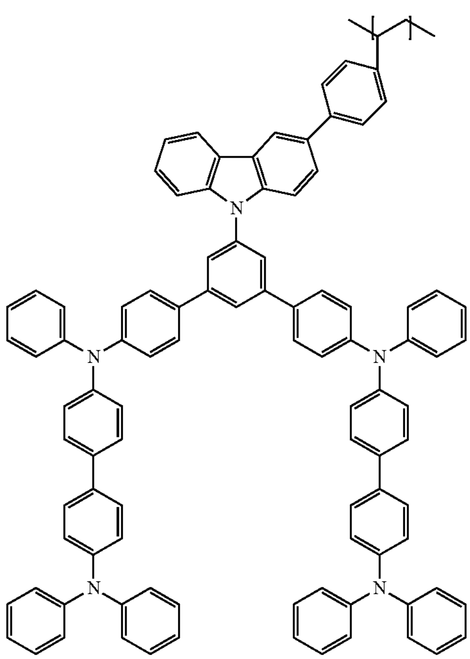
-continued
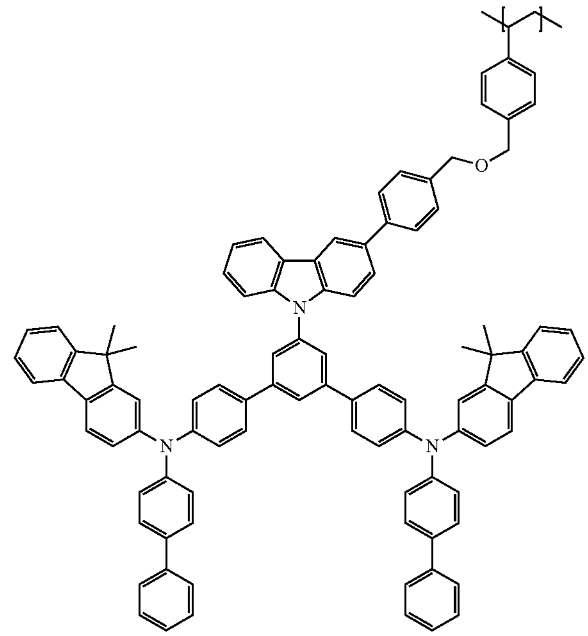
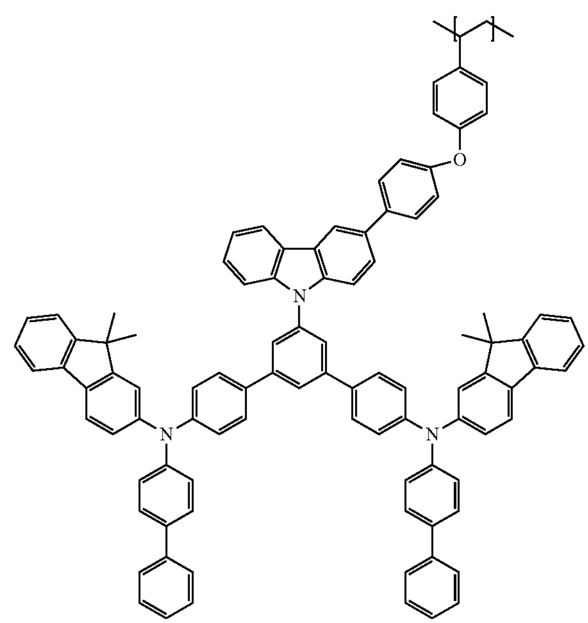

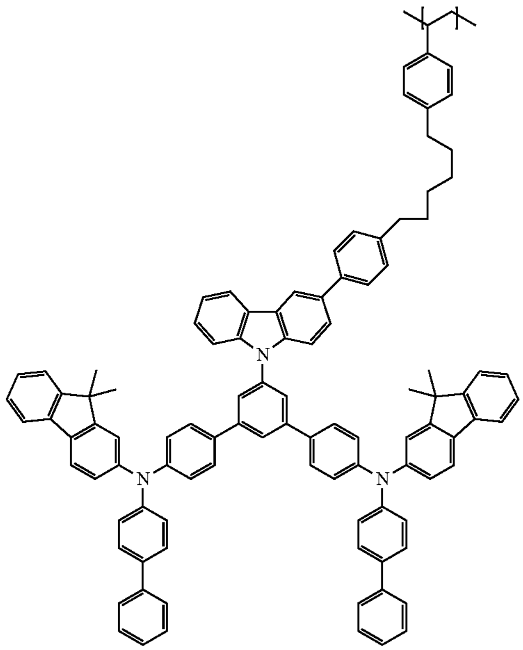
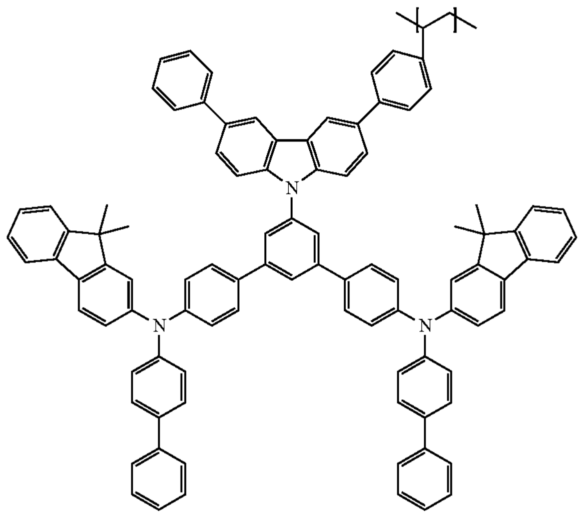
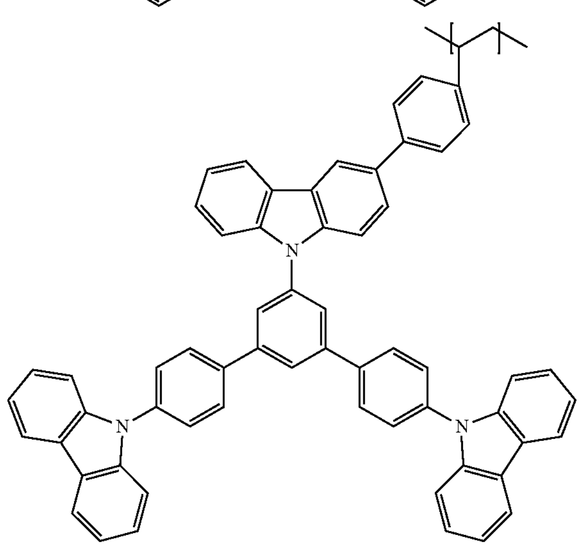
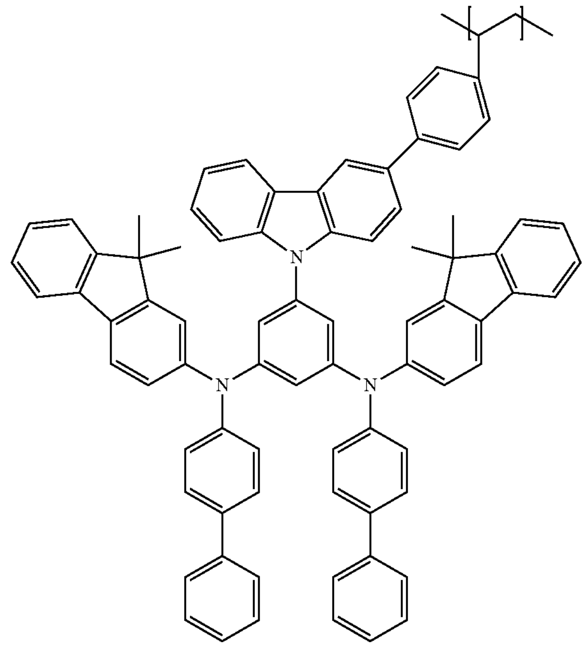
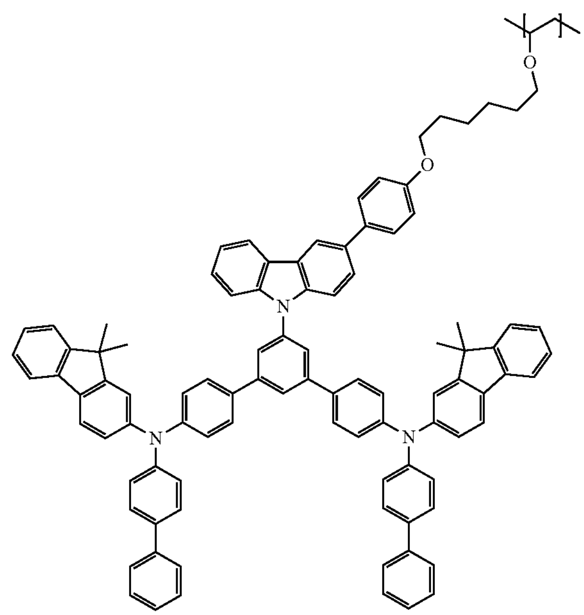

-continued

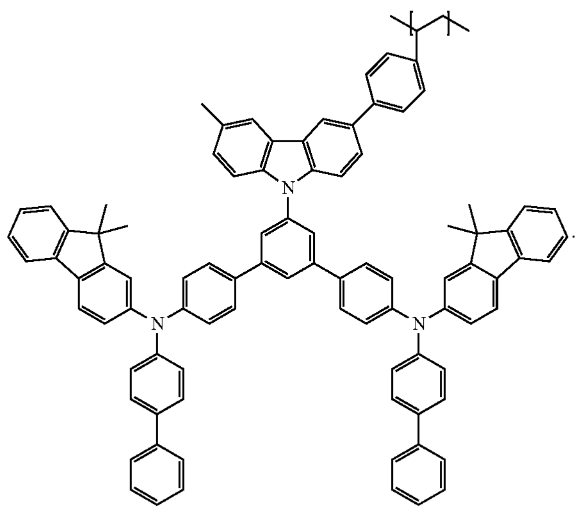

15. The organic light emitting device according to claim 1, wherein $L'_4$ is a single bond or phenylene.

16. The organic light emitting device according to claim 1, wherein the Chemical Formula 2-2 is any one selected from the group consisting of repeating units represented by the following formulas:

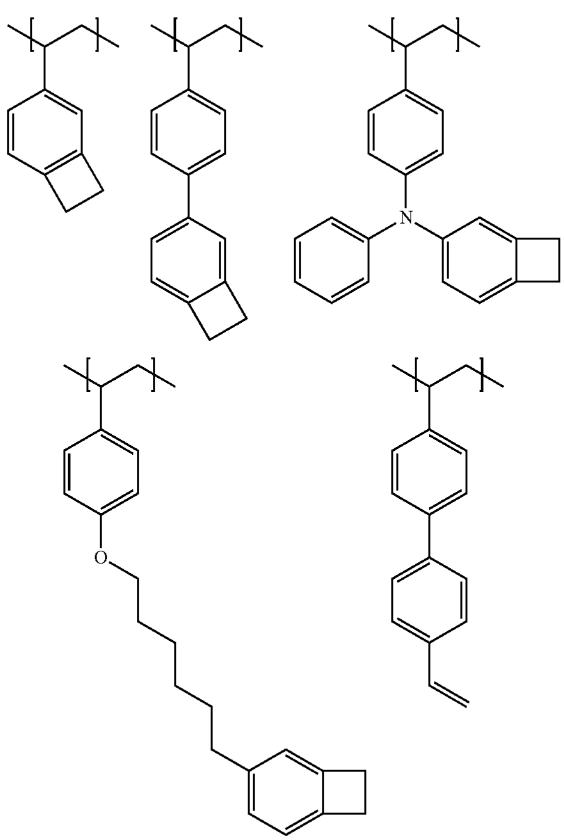

-continued

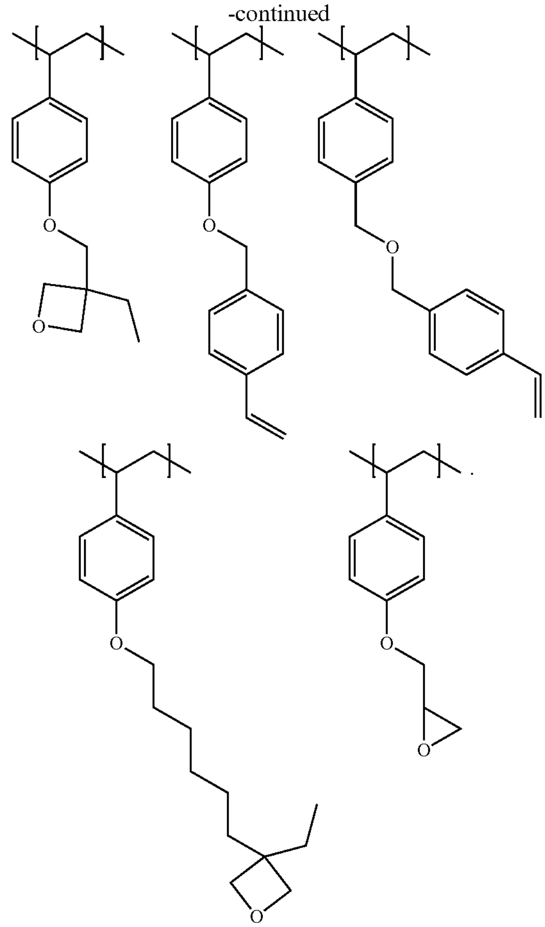

17. The organic light emitting device according to claim 1, wherein a weight average molecular weight of the polymer is 5,000 to 1,000,000 g/mol.

18. The organic light emitting device according to claim 1, wherein the hole injection layer further includes a compound represented by the following Chemical Formula 3:

[Chemical Formula 3]

$$(Ar''_1)_{n1}—\overset{\ominus}{B}—(Ar''_2)_{n2}$$

in the Chemical Formula 3, n1 and n2 are each independently an integer of 1 to 3, provided that n1+n2 is 4, $Ar''_1$ is

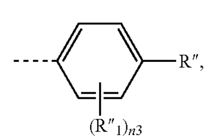

R'' is a photocurable group; or a thermosetting group, $R''_1$ is each independently halogen, or $C_{1-60}$ haloalkyl, n3 is an integer of 1 to 4, Ar''$_2$ is
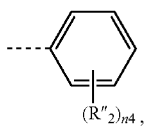
R''$_2$ is each independently halogen, $C_{1-60}$ haloalkyl, a photocurable group, or a thermosetting group, and
n4 is an integer of 1 to 5.
19. The organic light emitting device according to claim 18,
wherein the compound represented by Chemical Formula 3 is any one selected from the group consisting of the following:
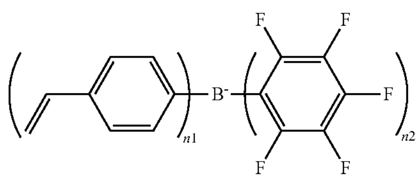
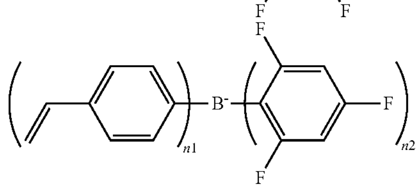
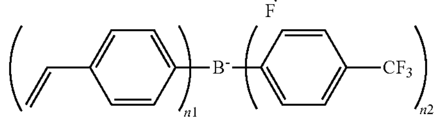
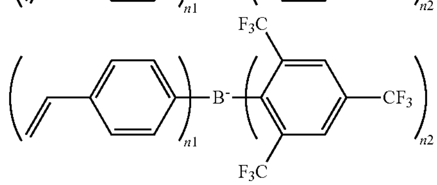
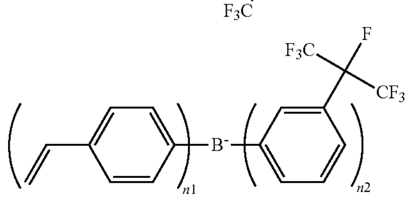
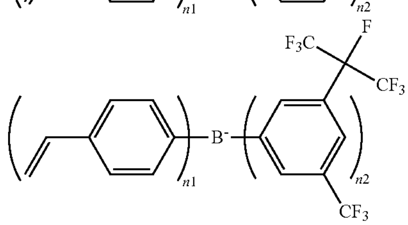
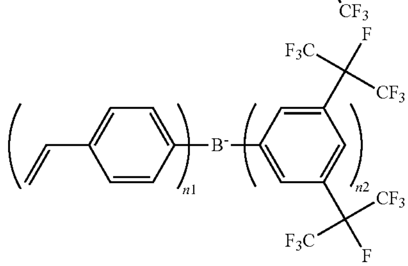
-continued
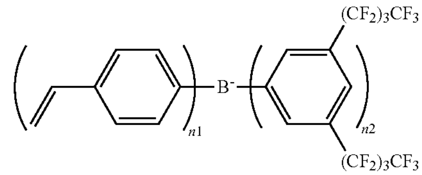
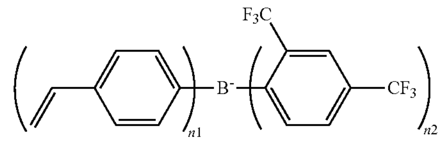
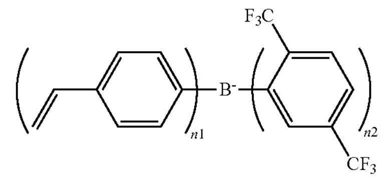
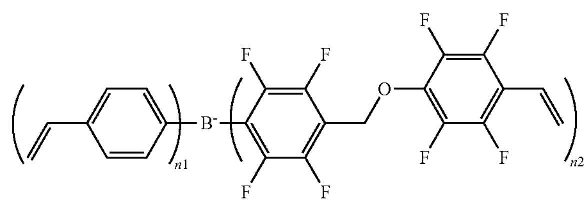
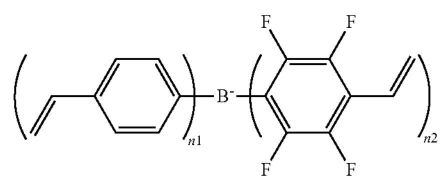
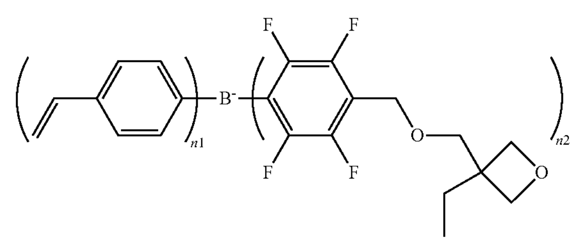
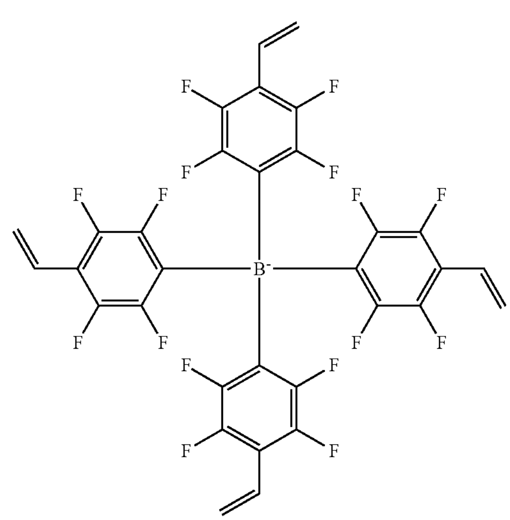

-continued
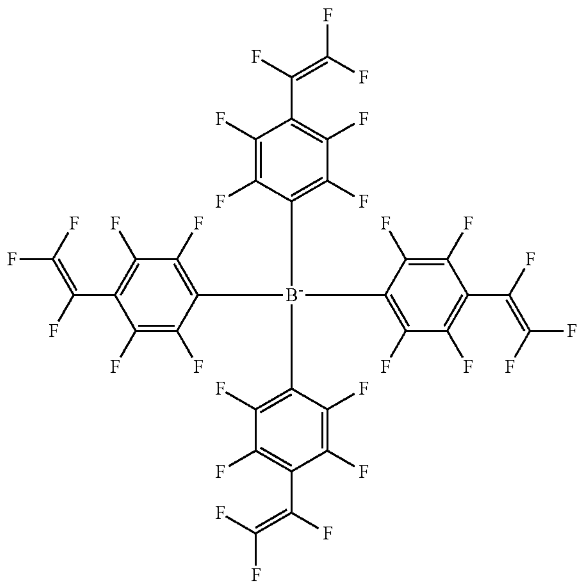
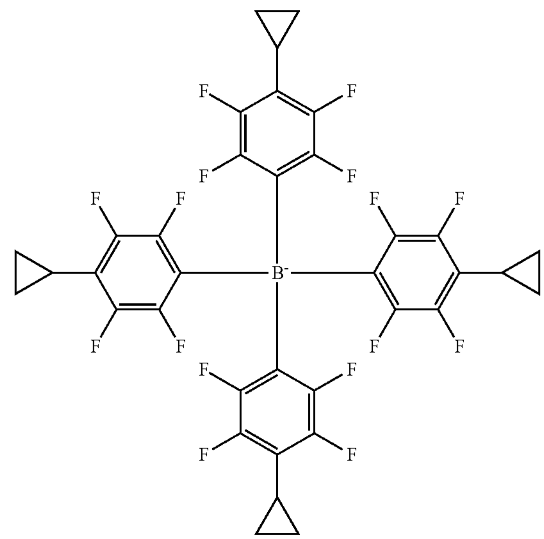
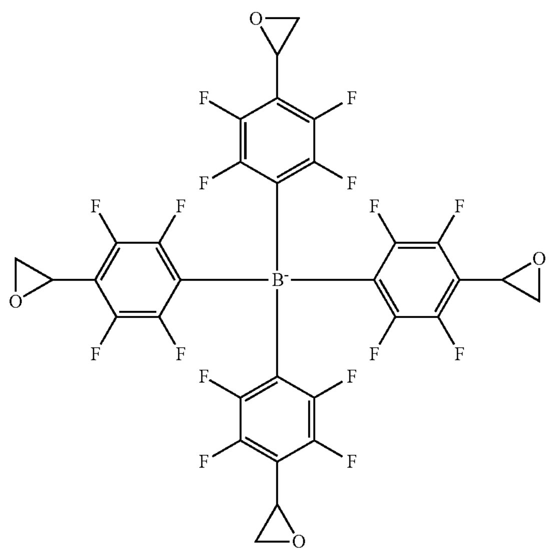
-continued
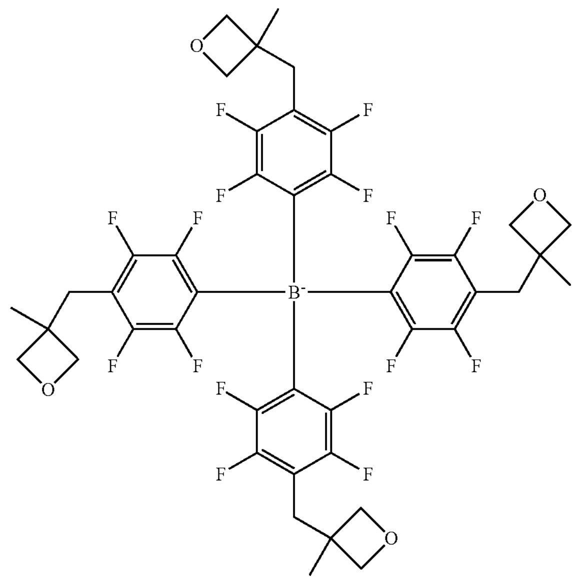
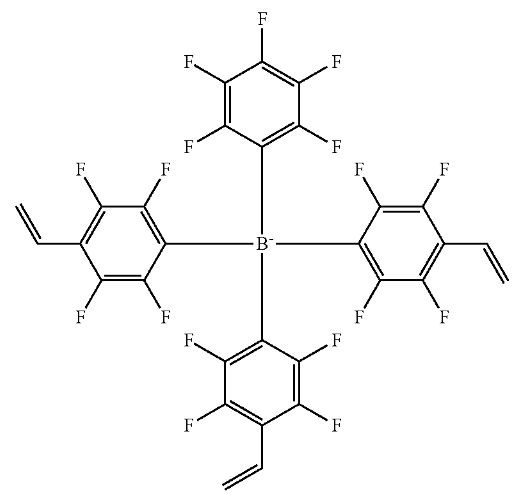
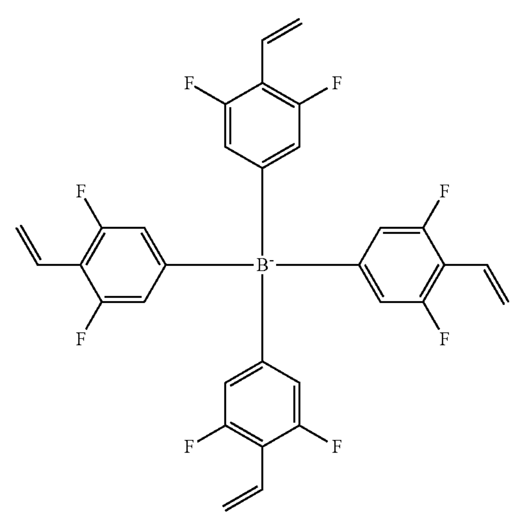

-continued
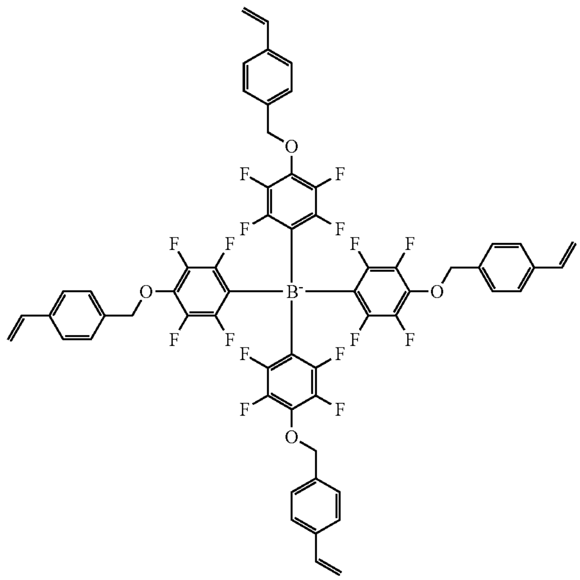
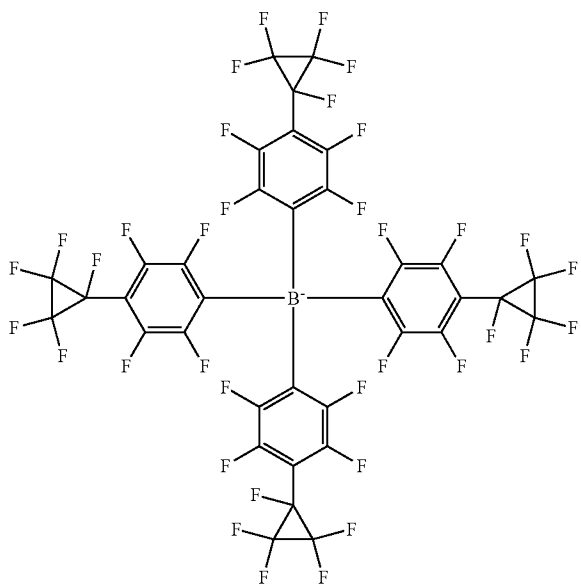
-continued
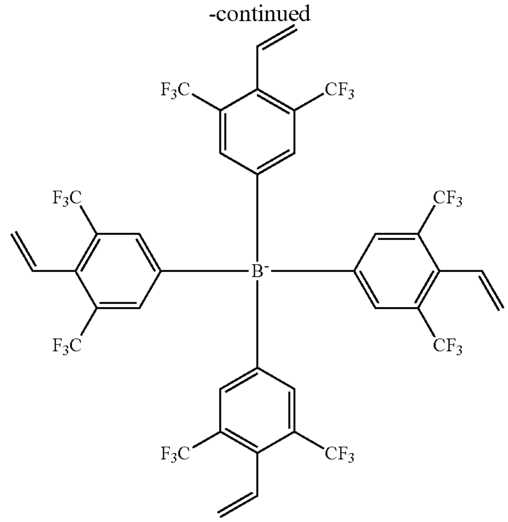
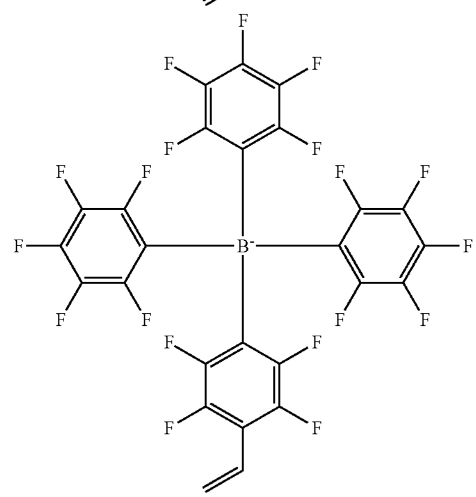
in the above group,
n1 and n2 are as defined in claim 18.
20. The organic light emitting device according to claim 1,
wherein at least one of the Chemical Formula 1, the Chemical Formula 2-1, or the Chemical Formula 2-2 is at least 10% deuterated.
* * * * *